(12) United States Patent
Bishop et al.

(10) Patent No.: US 11,926,528 B2
(45) Date of Patent: Mar. 12, 2024

(54) SYNTHESIS OF ANTHRACITIC NETWORKS AND AMBIENT SUPERCONDUCTORS

(71) Applicant: DICKINSON CORPORATION, Novato, CA (US)

(72) Inventors: Matthew Bishop, Novato, CA (US); Abhay Thomas, Mill Valley, CA (US)

(73) Assignee: Dickinson Corporation, Novato, CA (US)

( * ) Notice: Subject to any disclaimer, the term of this patent is extended or adjusted under 35 U.S.C. 154(b) by 0 days.

(21) Appl. No.: 18/067,480

(22) Filed: Dec. 16, 2022

(65) Prior Publication Data

US 2023/0271839 A1 Aug. 31, 2023

Related U.S. Application Data

(63) Continuation of application No. PCT/US2021/037435, filed on Jun. 15, 2021.

(60) Provisional application No. 63/039,525, filed on Jun. 16, 2020.

(51) Int. Cl.
| | | |
|---|---|---|
| *C01B 32/184* | (2017.01) | |
| *C01B 21/064* | (2006.01) | |
| *C01B 21/082* | (2006.01) | |
| *C01B 32/05* | (2017.01) | |
| *C01B 32/186* | (2017.01) | |
| *C01B 32/196* | (2017.01) | |

(52) U.S. Cl.
CPC .......... *C01B 32/184* (2017.08); *C01B 21/064* (2013.01); *C01B 21/0828* (2013.01); *C01B 32/05* (2017.08); *C01B 32/186* (2017.08); *C01B 32/196* (2017.08); *C01B 2204/22* (2013.01); *C01B 2204/32* (2013.01); *C01P 2002/72* (2013.01); *C01P 2002/74* (2013.01); *C01P 2002/76* (2013.01); *C01P 2002/77* (2013.01); *C01P 2002/78* (2013.01); *C01P 2002/82* (2013.01); *C01P 2002/88* (2013.01); *C01P 2004/03* (2013.01); *C01P 2004/04* (2013.01); *C01P 2006/12* (2013.01); *C01P 2006/14* (2013.01); *C01P 2006/40* (2013.01)

(58) Field of Classification Search
CPC ... C01B 32/186; C01B 32/196; C01B 21/064; C01B 21/0828; C01P 2002/72; C01P 2002/82; C01P 2004/03; C01P 2004/04; C01P 2006/12; C01P 2006/40

See application file for complete search history.

(56) References Cited

U.S. PATENT DOCUMENTS

| | | |
|---|---|---|
| 2014/0313636 A1 | 10/2014 | Tour et al. |
| 2017/0298191 A1 | 10/2017 | Bullock et al. |

OTHER PUBLICATIONS

Davydov, S. Yu, et al. "Preparation of a platelike carbon nanomaterial using MgO as a template." Inorganic Materials 48 (2012): 244-248.*

(Continued)

*Primary Examiner* — Richard M Rump
(74) *Attorney, Agent, or Firm* — Calfee, Halter & Griswold LLP

(57) ABSTRACT

Several variations of synthetic carbon materials are disclosed. The materials can assume a variety of properties, including high electrical conductivity. The materials also can have favorable structural and mechanical properties. They can form gas impenetrable barriers, form insulating structures, and can have unique optical properties.

20 Claims, 198 Drawing Sheets

(56) References Cited

OTHER PUBLICATIONS

Ruffieux, Pascal, et al. "On-surface synthesis of graphene nanoribbons with zigzag edge topology." Nature 531.7595 (2016): 489-492.*

Misra, Abha, et al. "Hexagonal diamond synthesis on h-GaN strained films." Applied physics letters 89.7 (2006).

Nestler, Klaus, et al. "Thermogravimetric and Raman spectroscopic investigations on different coals in comparison to dispersed anthracite found in permineralized tree fern Psaronius sp." Journal of Molecular Structure 661 (2003): 357-362.

Reilly, Peter TA, and William B. Whitten. "The role of free radical condensates in the production of carbon nanotubes during the hydrocarbon CVD process." Carbon 44.9 (2006): 1653-1660.

Zhao, Jin, et al. "Synthesis of large-scale undoped and nitrogen-doped amorphous graphene on MgO substrate by chemical vapor deposition." Journal of Materials Chemistry 22.37 (2012): 19679-19683.

Li, Xing-ao, et al. "Chemical vapor deposition of amorphous graphene on ZnO film." Synthetic Metals 174 (2013): 50-53.

Huang, Mingyuan, et al. "Raman spectroscopy of graphene under uniaxial stress: Phonon softening and determination of the crystallographic orientation.".

Liu, DeHan, et al. "Sample maturation calculated using Raman spectroscopic parameters for solid organics: Methodology and geological applications." Chinese Science Bulletin 58.11 (2013): 1285-1298.

Sun, Yanqiu, et al. "Structural dislocations in anthracite." The Journal of Physical Chemistry Letters 2.20 (2011): 2521-2524.

Ferrari, Andrea C., and John Robertson. "Interpretation of Raman spectra of disordered and amorphous carbon." Physical review B 61.20 (2000): 14095.

Robertson AW, Bachmatiuk A, Wu YA, Schaffel F, Rellinghaus B, Buchner B, Rummeli MH, Warner JH. Atomic structure of interconnected few-layer graphene domains. ACS nano. Aug. 5, 2011;5(8):6610-8.

Chung, De-Hua, Ta-Hui Lin, and Shuhn-Shyurng Hou. "Flame synthesis of carbon nano-onions enhanced by acoustic modulation." Nanotechnology 21.43 (2010): 435604.

Pawan, et al. "A simple "nano-templating" method using zeolite Y toward the formation of carbon schwarzites." Frontiers in Materials 6 (2019): 104.

Cui, Chaojie, et al. "Highly electroconductive mesoporous graphene nanofibers and their capacitance performance at 4 V." Journal of the American Chemical Society 136.6 (2014): 2256-2259.

Cui, Chaojie, et al. Highly electroconductive mesoporous graphene nanofibers and their capacitance performance at 4 V [Supplemental Information]. Journal of the American Chemical Society 136.6 (2014): 2256-2259.

\* cited by examiner 100 mm section of quartz tube

Clamshell-style tube furnace

Gas feed assembly

Concave surface extending across facet

460°C　　　　　　400°C

| Peak pos. (cm⁻¹) | Region 1 | | | | Region 2 | | | |
|---|---|---|---|---|---|---|---|---|
| | 880 | 855 | 842 | 748 | 3030 | 2960 | 2922 | 2850 |
| | X | X | X | X | X | X | X | X |
| Peak Assignment | geminal disub alkene | sp2 CH bend for aromatics | | mono/orthodi-sub aromatic | sp2 C-H stretch | sp3 C-H stretch | | |
| | | sp2 CH bend for alkenes | | | | | | |

FIG. 46B

Dense, macroscopic granules

Smaller agglomerates

SYNTHESIS OF ANTHRACITIC NETWORKS AND AMBIENT SUPERCONDUCTORS

CROSS-REFERENCE TO RELATED APPLICATIONS

This application is a bypass continuation of PCT/US2021/037435, filed on Jun. 15, 2021, which claims priority to U.S. Provisional Application No. 63/039,525, filed on filed on Jun. 16, 2020, the entire disclosure is incorporated by reference. The following applications are hereby incorporated by reference in their entirety for all purposes: U.S. Provisional Patent Application 63/039,525 (the '525 Application); U.S. Provisional Patent Application 63/129,154 (the '154 Application); U.S. Provisional Patent Application 63/075,918 (the '918 Application); U.S. Provisional Patent Application 63/806,760 (the '760 Application); U.S. Provisional Patent Application 63/121,308 (the '308 Application); U.S. Utility application Ser. No. 16/758,580 (the '580 Application); U.S. Utility application Ser. No. 16/493,473 (the '473 Application); PCT/US17/17537 (the '17537 Application); and U.S. Pat. No. 10,717,843 B2 (the '843B2 Patent).

FIELD OF DISCLOSURE

This disclosure relates to novel methods for constructing a microscopic or macroscopic object from an anthracitic network exhibiting molecular-scale two-dimensionality. In particular, the disclosure relates to novel methods for constructing anthracitic networks from different types of two-dimensional building blocks, including carbonaceous and non-carbonaceous types.

The disclosure also relates to novel, synthetic anthracitic networks that are crosslinked by structural dislocations. In particular, the disclosure relates to perimorphic materials and frameworks comprising synthetic anthracitic networks that obtain hierarchical crosslinking via structural dislocations.

Lastly, the disclosure also relates to novel methods for inducing superconducting states in materials under ambient conditions and to novel ambient superconductors.

BACKGROUND

Structures that are two-dimensional at the molecular scale, such as graphenic carbon, have been demonstrated to possess outstanding properties. However, to facilitate the practical use of these two-dimensional structures in many macroscopic or even microscopic applications, it is necessary to use them to build hierarchical materials that are three-dimensional at larger scales. Constructing these hierarchical materials that are simultaneously two-dimensional at the molecular scale and three-dimensional at higher scales has proven challenging.

The usual approach to constructing larger-scale systems is to bring two-dimensional lattices—often graphenic lattices—into contact with one another and to cohere them into a system comprising multiple lattices. This type of system, comprising a plural membership of distinct two-dimensional lattices, is described in the present disclosure as an "assembly." Macroscopic, three-dimensional assemblies can be readily constructed from two-dimensional lattices.

In assembly-type systems, the two-dimensional lattice members are typically cohered to one another at areas where they come into overlapping van der Waals ("vdW") contact. Such systems are principally cohered via intermolecular attractions at these contacts. We describe this type of assembly, in which the principal mechanism of cohesion is intermolecular attractions between members in vdW contact, as a "vdW assembly." VdW assemblies, irrespective of their physical architecture, share the common attribute of covalent disconnectedness at the system level.

Intermolecular attractions are weaker than covalent bonds, and weak cohesion enables the overlapping members of vdW assemblies to slide over one another. This tendency to shear-yield limits the modulus of graphitic carbons and softens them. Since the intermolecular attraction between two lattices is a function of their contact area and contact distance, vdW assemblies of small lattice members are often especially weak.

In other assemblies, multiple two-dimensional lattice members may be principally cohered to one another via chemical bonds. In this sort of bonded assembly, chemical bonds between the individual lattice members may inhibit shear-yielding and render the assembly more robust than a vdW assembly cohered only via intermolecular forces. In the prior art, bonded assemblies have been formed by chemically altering the surfaces of graphenic lattices, for instance via grafting chains to them that may then be used to crosslink them to other lattices. While this may represent an improvement over vdW assemblies, the junctions between bonded lattice members still limits the realization of universal two-dimensional molecular structuring.

In principle, some limitations of assemblies might be overcome by constructing a "graphenic network," which herein describes a structure with a two-dimensional molecular-scale geometry that is at some scale three-dimensionally crosslinked. As a function of a graphenic network's crosslinking and network geometry, it cannot be broken without breaking some portion of its two-dimensional molecular structure. Intuitively, this should be the best way to construct ordinary objects, usually macroscopic in size, that exhibit properties similar to two-dimensional structures. Such objects would benefit if the network geometry could be architected rationally.

One source of inspiration for how a graphenic network might be constructed is anthracite, a naturally occurring, mature coal that comprises an "anthracitic network," which herein describes a layered graphenic network that is three-dimensionally crosslinked via certain characteristic dislocations ("anthracitic dislocations") and in which z-adjacent layers are nematically aligned. These three-dimensionally crosslinked anthracitic networks are created when organic matter is exposed to high temperatures and pressures over geologic periods of time. As the organic matter matures, its carbon content increases, and its molecular structure becomes increasingly dominated by two-dimensional, polycyclic arrangements of carbon that eventually coalesce upon evolving structural dislocations that provide polycyclic crosslinks between these polycyclic arrangements (thereby creating a unified polycyclic network).

There are a few types of anthracitic dislocations that serve to crosslink an anthracitic network. One type is described herein as a "Y-dislocation." Briefly, a Y-dislocation is formed when an atomic monolayer bifurcates into an atomic bilayer, with the intersection comprising a polycyclic line of rings (what we describe as a polycyclic line of rings may comprise multiple orbital hybridization states despite the term "polycyclic" commonly being applied to purely $sp^2$-hybridized polycyclic structures). A second type of anthracitic dislocation is a screw dislocation, comprising a multilayer helicoidal arrangement of an atomic monolayer. Other anthracitic dislocations may have elements of both a Y-dislocation and a screw dislocation. All of these dislocations have the common effect of forming lateral and vertical, polycyclic, molecular-scale crosslinks between two-dimensional molecular structures. This molecular-scale three-dimensional crosslinking has a hardening and rigidifying effect on anthracitic networks, which is why anthracite is sometimes called "hard coal."

While its crosslinking makes it an interesting example of a macroscopic graphenic network, natural anthracite has practical limitations. Due to its geologic formation, organic and inorganic inclusions may be embedded as secondary phases. No engineering control is exercised during formation, so imperfections cannot be prevented, and rational design principles cannot be applied. These shortcomings mostly limit anthracite's usefulness to fuel applications but could potentially be overcome if synthetic anthracitic networks could be made. Exemplary synthetic methods are detailed in the '760 and '918 Applications, in which template-directed chemical vapor deposition ("CVD") or what we describe in those applications as "surface replication" is used to synthesize perimorphic frameworks. If rationally designed perimorphic frameworks crosslinked via anthracitic dislocations could be constructed, these synthetic, geomimetic architectures would represent an improvement over natural anthracite.

Non-anthracitic graphenic networks constructed from two-dimensional materials have arguably been demonstrated via surface replication in the prior art. Small schwarzite-like graphenic networks appear to have been synthesized using CVD deposition on Zeolite Y template particles. Zeolite Y is considered a large-pore zeolite with a supercage diameter of approximately 13 Å. While its larger pore structure offers improved internal gas diffusion compared to smaller-pore zeolites, it appears that Zeolite Y's micropores are still small enough that spatial confinement effects cause growing graphenic lattices to coalesce into a single, continuous graphenic network that is three-dimensionally crosslinked, but not by anthracitic dislocations.

Spatial confinement in small zeolite pores appears to force lattices to coalesce but also creates significant challenges. One problem is the tendency for deposited carbon to occlude the zeolite template's pores, thereby prematurely terminating deposition in the template's interior. As a result, zeolite-templated carbons are seldom complete. Another problem is the extremely slow, diffusion-limited deposition kinetics throughout the microporous template's interior. The maximum template depth over which a substantially complete schwarzite network has arguably been demonstrated (as evidenced by an average of 72 carbon atoms per zeolite supercage) is only about 20 nm. Obtaining completion at even this shallow depth required 6 hours of deposition on Zeolite Y nanoparticles.

In addition to these challenges, there is potentially another fundamental shortcoming of schwarzites, which is their approximation of a Schwarz minimal surface geometry. While theoretical work has supported the goal of creating graphenic networks modeled on these surfaces due to their minimal nature, we make the case herein that minimal surface geometries may not be as desirable as the denser, layered architecture of anthracitic networks. Namely, we find that schwarzite's geometry may limit or effectively eliminate the interlayer vdW interactions that would contribute to system cohesion in layered anthracitic networks. For this reason, rather than sacrificing vdW cohesion to obtain molecular-scale density reduction, our preference is to obtain density reduction via hierarchical, larger-scale pore engineering, as demonstrated by the tunable mesoporous or macroporous perimorphic frameworks described in the '760 and '918 Applications.

Besides schwarzite-like networks, we speculate that the prior art may include heretofore unrecognized instances of synthesizing graphenic networks. This speculation is based on the analysis and concepts developed and advanced in the present disclosure, and the analysis is discussed in more detail below.

In one instance, based on our own ex post facto analysis, we find evidence that a graphenic network was constructed on a magnesium oxide (MgO) template by grafting together the edges of graphenic domains grown over the MgO templating surface [1]. Prior to extraction of the endomorphic MgO, the perimorphic carbon phase formed over the MgO comprised an atomic monolayer. Because anthracitic dislocations comprise interlayer crosslinks of multiple z-adjacent layers, they cannot be present in a monolayer, and our ex post facto analysis finds that this network lacked anthracitic dislocations on the strength of its characterization as a monolayer perimorphic phase on the templating surface. Accordingly, its molecular-scale crosslinking was only lateral, or intralayer, and this anisotropy prevented the framework from realizing some of the basic benefits (e.g. hardness and structural rigidity) associated with more three-dimensional molecular-scale crosslinking. Consequently, upon extraction of the endomorphic template and drying of the perimorphic framework, the pores within the framework collapses, resulting in an as-dried graphenic network with bilayer structuring but without the interlayer, molecular-scale crosslinking of these bilayers that anthracitic dislocations would have provided.

In another instance, we find evidence that nano-onions grown with metallic catalysts comprise a graphenic network in which z-adjacent graphenic layers with substantially parallel alignment (i.e. more ordered alignment than the nematic alignment found in anthracitic networks) are vertically crosslinked via anthracitic dislocations but typically over lateral intervals measuring no smaller than 5 nm. These large intervals of nanocrystalline graphitic order make these graphenic networks' molecular-scale crosslinking so anisotropic and lateralized that they resemble graphite more so than anthracite. We therefore describe these graphite-like networks as "graphitic networks" and differentiate them from anthracitic networks. Like the graphenic networks we speculate are present in the first instance of prior art mentioned above, these graphitic networks exhibit anisotropic, lateralized molecular-scale crosslinking.

SUMMARY OF THE PRESENT DISCLOSURE

The present disclosure demonstrates methods for synthesizing microscopic or macroscopic anthracitic networks by grafting together two-dimensional molecular building blocks. In particular, the methods may be used to synthesize "x-carbon" and "z-carbon," two classes of anthracitic networks with properties described in more detail in the body of this application, as well as other novel graphenic networks. The methods may optionally comprise synthesizing anthracitic networks possessing non-carbonaceous chemical compositions or comprising compounds. The methods may also optionally comprise synthesizing anthracitic networks possessing templated structural features, hierarchical morphology, controllable crosslinking density, and porosity.

The present disclosure also demonstrates materials comprising synthetic anthracitic networks. These materials include x-carbon and z-carbon. These materials also include synthetic anthracitic networks comprising two-dimensional forms of light elements and two-dimensional forms of compounds comprising light elements. In particular, these materials include BN and $BC_xN$. These materials include anthracitic networks of any morphology, and particularly of a templated morphology. The present disclosure also pertains to derivatives of these novel materials, such as chemically or physically modified derivatives.

The present disclosure also demonstrates methods for inducing superconducting states in materials and objects at ambient conditions. In particular, these methods may include techniques for shielding materials and objects comprising two-dimensional molecular structures from the collisions of gas molecules, including forming an impermeable barrier phase around the materials and objects while maintaining an evacuated state. Optionally, these methods may include placing the materials and objects in a vacuum.

The present disclosure also demonstrates ambient, highly correlated materials or objects, including ambient superconductors, which are described in more detail in the body of this application. These ambient superconductors may include materials or objects comprising two-dimensional molecular structures. These ambient superconductors may be nanoscopic, microscopic or macroscopic. Optionally, they may comprise synthetic anthracitic networks. In general, they may comprise materials or objects evacuated of liquid- or gas-phase molecules. In particular, they may comprise materials or objects comprising a barrier phase and an internal phase, where the internal phase comprises a porous material shielded by the barrier phase from atomic or molecular collisions otherwise encountered in non-vacuum environments.

The present disclosure also demonstrates methods for synthesizing ambient, highly correlated materials or objects including ambient superconductors. These methods may include synthesizing materials or objects comprising two-dimensional molecular structures. In particular, the materials or objects may comprise anthracitic networks. The synthesis of these anthracitic networks may include joining smaller structures into an anthracitic network by grafting the smaller structures to one another. These smaller structures may optionally comprise carbon black or anthracitic networks.

BRIEF DESCRIPTION OF FIGURES

FIG. 46B is a chart indicating the assignment of FTIR peaks.

In FIG. 72B, the perimorphic wall is shown at higher magnification. It averages 2-3 layers and appears more kinked than thicker walls because of its increased flexibility.

DETAILED DESCRIPTION

Figure 1:
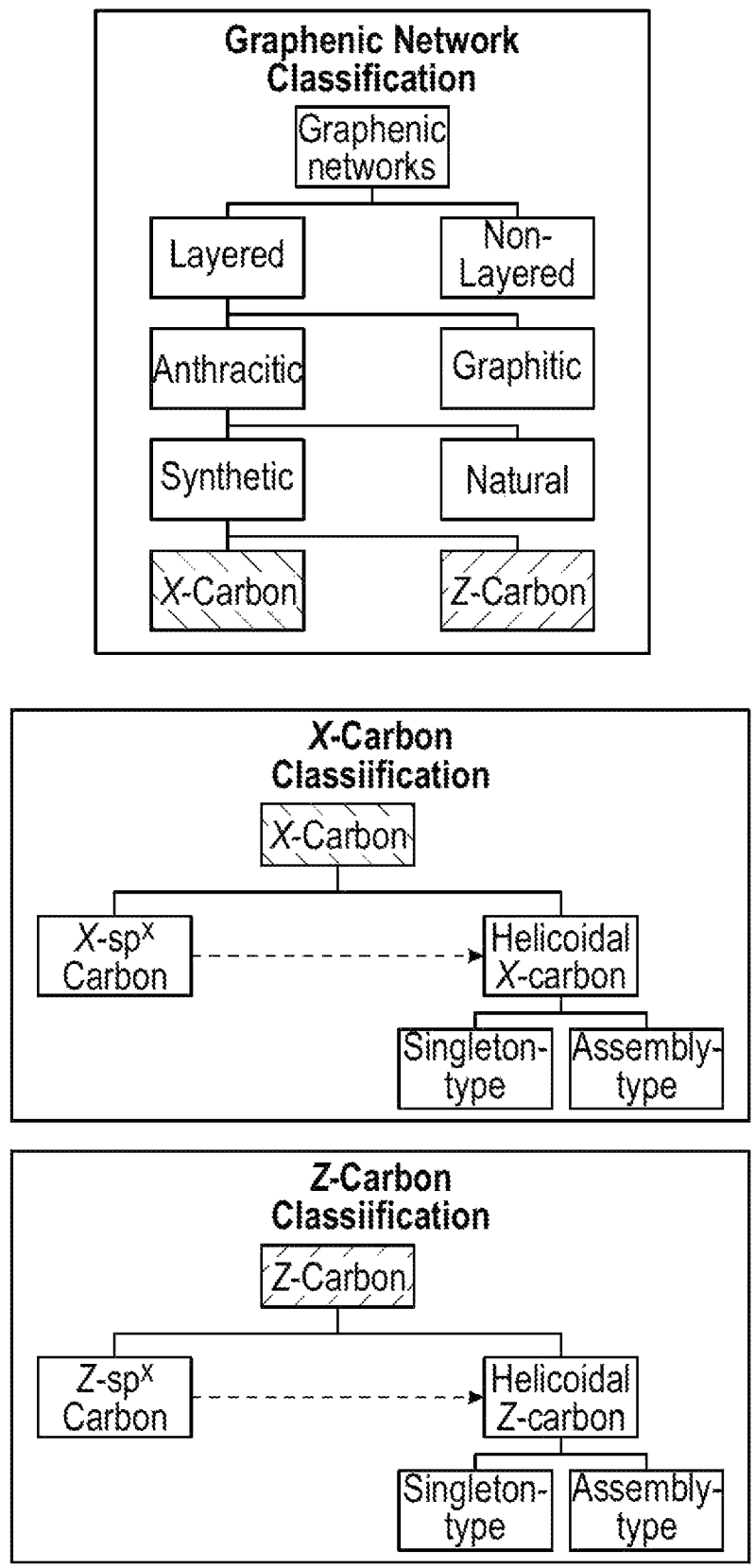
FIG. 1 is a classification chart showing how graphenic networks are classified in the current disclosure. Synthetic anthracitic networks comprising x-carbon and z-carbon are hatched. Each of these classes is subcategorized as either $sp^x$ networks, intermediate networks, or helicoidal networks, which are formed via maturation of $sp^x$ networks.

This section is organized according to the following outline:
I. Basic Terms & Concepts
   We provide basic definitions and establish foundational concepts for describing structures.
II. Surface Replication
   We introduce basic concepts related to templating, and in particular, related to surface replication. These concepts are handled more comprehensively in the '918 and '760 Applications.
III. Free Radical Condensate Growth & Tectonics
   We discuss how graphenic networks are nucleated and grown as free radical condensates. We discuss the tectonic interactions between graphenic domains during growth.
IV. Surfaces in Three Dimensions
   We discuss curved surfaces and establish certain conventions to orient ourselves when discussing complex structures in three-dimensional space.
V. Clarifying Examples
   We analyze and discuss exemplary structures in order to clarify definitions and foundational concepts.
VI. Notes on Metrology and Characterization
   We provide details on metrology employed in the present disclosure and discuss Raman spectral features of disordered carbons.
VII. Procedures
   We explain the detailed procedures used to synthesize carbon samples for Experiments A through G.
VIII. Study A—Analysis
   Study A includes: (i) synthesis of synthetic anthracitic networks; (ii) synthesis of $sp^x$ networks; (ii) modeling of $sp^2$ and $sp^3$ grafting; (iii) modeling of formation of diamondlike seams and chiral columns; (iv) modeling of multilayer growth; and (v) discussion of free radical condensates.
IX. Study B—Analysis
   Study B includes: (i) synthesis of $sp^x$ and x-$sp^x$ networks; (ii) modeling of various tectonic interfaces; (iii) ex post facto analysis of prior art and discussion of limitations.
X. Study C—Analysis
   Study C includes: (i) demonstration of incomplete dehydrogenation during free radical condensate growth; and (ii) spectral analysis of hydrogenated and dehydrogenated carbon phases.
XI. Study D—Analysis
   Study D includes a demonstration of improved grafting via increased hydrogen during free radical condensate growth.
XII. Study E—Analysis
   Study E includes: (i) maturation of x-$sp^x$ networks and z-$sp^x$ networks to form mature x-networks and mature z-networks; (ii) modeling of structural changes during maturation; and (iii) analysis of mature networks
XIII. Study F—Analysis and Discussion
   Study F includes: (i) demonstration of particle-to-particle crosslinking by maturation; (ii) demonstration of macroscopic sheet-like and block-like forms comprising mature x-networks and z-networks; and (iii) discussion of crosslinking by maturation
XIV. Study G—Analysis and Discussion
   Study G includes: (i) demonstration of microwave-induced resistive heating; (ii) demonstration of diamagnetism and room-temperature superconductivity in synthetic, anthracitic networks under reduced pressure; and (iii) demonstration of diamagnetism and room-temperature superconductivity in other disordered pyrolytic carbons under reduced pressure; and (iv) discussion of theoretical basis for observations.
XV. Study H—Analysis and Discussion
   Study H includes: (i) demonstration of ambient superconductivity in an evacuated anthracitic macroform; and (ii) discussion of theoretical basis for observations.
XVI. Other Anthracitic Networks
   We discuss synthetic anthracitic networks of non-carbon chemical compositions, including BN and $BC_xN$.

I. Basic Terms & Concepts

The term "graphenic," as used herein, describes a two-dimensional, polycyclic structure of $sp^2$-hybridized or $sp^3$-hybridized atoms. While graphene denotes a form of carbon, we utilize the term "graphenic" herein to describe a variety of graphene polymorphs (including known or theorized polymorphs such as graphene, amorphous graphene, phagraphene, haeckelites, etc.), as well as to describe other two-dimensional graphene analogues (e.g. atomic monolayers of BN, $BC_xN$, etc.) Hence, the term "graphenic" is intended to encompass any hypothetical polymorph meeting the basic criteria of two-dimensionality, polycyclic organization and $sp^2$ or $sp^3$ hybridization.

"Two-dimensional" herein describes a molecular-scale structure comprising a single layer of atoms. A two-dimensional structure may be embedded or immersed in a higher-dimensional space to form a larger-scale structure that, at this larger scale, might be described as a three-dimensional. For instance, a graphenic lattice of subnanoscopic thickness might curve through three-dimensional space to form the atomically thin wall of a nanoscopically three-dimensional cell. This cell would still be described two-dimensional at the molecular scale.

A "ring" is defined herein as a covalent chain of atoms that together comprise a closed, polyatomic polygon of fewer than 10 atomic vertices. Each of the cyclic structures in a polycyclic arrangement comprise a ring. Each of the atoms comprising a given ring may be described as an atomic member belonging to that ring, and the ring may be described accordingly (i.e. a "6-member" ring describes a hexagonal ring formed by 6 atomic members).

An "$sp^2$ ring" is herein defined as a ring comprising all $sp^2$-hybridized atomic members.

An "$sp^x$ ring" is herein defined as a ring comprising atomic members that do not all share the same orbital hybridization.

A "chiral ring" is defined herein as an $sp^x$ ring in which the covalent chain of atomic members comprises one or more chiral segments, wherein the two atomic termini of these chiral segments are $sp^3$-hybridized atoms connected to each other via $sp^3$-$sp^3$ bonds. Chiral rings occur at tectonic zone transitions.

A "chiral column" is defined herein as a series of z-adjacent chiral rings connected to one another via one or more z-directional chains of $sp^3$-$sp^3$ bonds. A chiral column tends to form over a base-layer chiral ring and represents the lateral terminus of a diamondlike seam. A chiral column may contain one or more $sp^x$ helices.

An "$sp^x$ helix" is defined herein as a type of helical, one-dimensional chain constructed from both $sp^2$-hybridized and $sp^3$-hybridized atomic members. The axis of an $sp^x$ helix is z-oriented.

An "$sp^x$ double helix" is defined herein as the structure formed by two $sp^x$ helices sharing the same chirality and the same axis.

An "$sp^2$ helix" is defined herein as a type of helical, one-dimensional chain constructed from only $sp^2$-hybridized atomic members. The axis of an $sp^x$ helix is z-oriented.

An "$sp^2$ double helix" is defined herein as the structure formed by two $sp^2$ helices sharing the same chirality and the same axis.

"Adjacent rings" herein describes two rings that have at least two common atomic members, and thus share at least one common side. In organic chemistry these rings might comprise fused or bridged rings, but not spirocyclic rings. Two adjacent rings may be described as "ring-adjacent."

"Ring-connected" herein describes a structure that is connected via a "ring pathway," or path of adjacent rings. We may speak of ring-connectedness according to two usages. In the first usage, we may say that one part of a structure is ring-connected to some other part of the structure. This means that there is a ring pathway that connects the two referenced parts. For example, a ring $R_1$ within a graphenic structure is ring-connected to another ring $R_2$ within the structure if there exists a path of adjacent rings starting at $R_1$ and ending at $R_2$. In the second usage, we may say that a referenced structure is itself ring-connected. This means that any part of the referenced structure can be reached from any other part via at least one ring pathway. We may also describe structures that are not ring-connected as ring-disconnected.

A "ring pathway" herein describes a pathway of adjacent rings that connects two referenced structures.

A "ring connection" herein describes a single ring that ring-connects two referenced structures.

"$Sp^2$ ring-connected" herein describes a structure that is connected via an "$sp^2$ ring pathway," or pathway of adjacent $sp^2$ rings. Like ring-connectedness, we may speak of $sp^2$ ring-connectedness according to two usages. In the first usage, we may say that one part of a structure is $sp^2$ ring-connected to some other part of the structure. This means that there is an $sp^2$ ring pathway that connects the two referenced parts. In the second usage, we may say that a referenced structure is itself $sp^2$ ring-connected. This means that any part of the referenced structure can be reached from any other part via at least one $sp^2$ ring pathway. Since $sp^2$ ring-connectedness is a specific case of ring-connectedness, it implies ring-connectedness, while ring-connectedness does not imply $sp^2$ ring-connectedness. In certain cases we may describe certain ring-connected structures as "$sp^2$ ring-disconnected," meaning that while they are ring-connected, they are not ring-connected by an $sp^2$ ring pathway.

An "edge atom" is defined as an atom that (i) belongs to a ring, and (ii) is not surrounded on all sides by rings. An edge atom always has multiple nearest neighbors that are also edge atoms, forming a chain.

An "edge" is defined as a chain of edge atoms. Starting from any given edge atom, it is possible to trace from this first atom a chain of nearest-neighbor edge atoms, wherein any given pair of nearest-neighbor edge atoms within the chain are co-members of exactly one ring. Some edges may form a closed circuit, where the first atom and last atom traced are nearest neighbors to each other.

An "edge segment" is defined as a chain of nearest-neighbor edge atoms contained within a larger edge.

An "interior atom" is defined herein as an atom that (i) belongs to a ring, and (ii) is surrounded on all sides by rings.

A "graphenic structure" is defined herein as a polycyclic, ring-connected group of two or more rings. Every ring in a graphenic structure is ring-connected to every other ring, although not necessarily $sp^2$ ring-connected. Each atom belonging to a graphenic structure may be classified as either an interior atom or an edge atom.

A "graphenic region" or "region" is herein defined as a subsidiary portion of some larger graphenic structure that itself fulfills all the requirements of a graphenic structure.

"Ring disorder" is herein defined as the presence of non-hexagonal rings in a graphenic structure. Ring-disordered graphenic structures include amorphous, haeckelite, pentagonal, or other molecular tilings. The presence of non-hexagonal rings creates regions of nonzero Gaussian curvature in ring-disordered graphenic structures. If inserted into a hexagonally tiled lattice, a 5-member ring incudes positive Gaussian curvature, while a 7-member ring induces negative Gaussian curvature. For example, a fullerene comprises a curved graphenic structure formed by 20 hexagons and 12 pentagons.

"Ring order" is herein defined as a substantially hexagonal molecular tiling. Ring-ordered graphenic structures may be flexed or wrinkled due to their low bending stiffness.

A "system" is herein defined as some polyatomic physical structure comprising a group of atoms cohered via either chemical bonds or van der Waals interactions. A system may contain any number of graphenic structures, including none. It is a general term for describing some physical structure under consideration.

A "graphenic system" is herein defined as a system consisting of one or more distinct graphenic structures. A graphenic structure belonging to a graphenic system may be described as a "graphenic member" or "member" of the graphenic system. A graphenic system does not include any elements other than its graphenic members.

A "graphenic singleton" or "singleton" is herein defined as a graphenic system comprising a single, distinct graphenic structure.

A "graphenic assembly" or "assembly" is herein defined as a graphenic system comprising two or more distinct graphenic structures.

A "van der Waals assembly," or "vdW assembly," is herein defined as a multilayer graphenic assembly in which the graphenic structures are cohered principally or substantially by intermolecular forces. The graphenic structures in a vdW assembly may also be cohered via other mechanisms.

A "double screw dislocation" is herein defined as a dislocation formed by two screw dislocations sharing the same chirality and the same dislocation line. A double screw dislocation in a graphenic system forms a graphenic double helicoid. The braid-like geometry of double helicoids may physically interlock the two helicoids.

A "multilayer" graphenic system is herein defined as a graphenic system comprising more than one layer in vdW contact, on average. A multilayer graphenic system may possess monolayer regions. Analytically, we may define a multilayer graphenic system as one possessing an average BET surface area no more than 2,300 m$^2$/g, as measured by N$_2$ adsorption.

A "Y-dislocation" is herein defined as a ring-connected, Y-shaped graphenic region formed by a layer's bifurcation into a laterally adjacent bilayer. The two "branches" of the Y-shaped region comprise z-adjacent sp$^x$ rings, which together comprise a diamondlike seam situated at the interface between the laterally adjacent layer and bilayer. The characteristic Y-shaped geometry is associated with a cross-sectional plane of the layers and the diamondlike seam.

A "diamondlike seam" or "seam" is herein defined as a two-dimensional sheet of z-adjacent sp$^x$ rings forming a z-oriented interface between xy-oriented layers to either side. A cubic diamondlike seam comprises chair conformations, while a hexagonal diamondlike seam comprises chair, boat, and potentially other conformations. A diamondlike seam may terminate in chiral columns.

A "bond line" is a linear arrangement of 2 or more side-by-side bonds possessing a generally parallel (but not necessarily a perfectly parallel) orientation.

A "graphenic network" herein describes a structure with a two-dimensional molecular-scale geometry that is at some larger scale three-dimensionally crosslinked. As a function of a graphenic network's crosslinking and network geometry, it cannot be broken without breaking some portion of its two-dimensional molecular structure. Graphenic networks comprise the broadest category of networks constructed from graphenic structures, as shown by this category's position at the apex of the classification chart in FIG. 1. The requirement of three-dimensional crosslinking over some scale of evaluation excludes from this definition graphenic systems that cannot be said to be three-dimensionally crosslinked at any scale (such as a simple polyaromatic hydrocarbon). In the present disclosure, the term "graphenic network" follows our usage of the term "graphenic" in that it will be used generally to apply to networks comprising two-dimensional molecular structures of various polymorphs and chemistries. In the specific case of carbon graphenic networks, we can further describe the network in terms of the anisotropy of its molecular-scale crosslinking:

"Highly anisotropic," if the average $I_{2D_u}/I_{G_u}$ ratio is higher than 0.40

"Moderately anisotropic," if the average $I_{2D_u}/I_{G_u}$ ratio is between 0.20 and 0.40

"Minimally anisotropic," if the average $I_{2D_u}/I_{G_u}$ ratio is below 0.20

Figure 2:
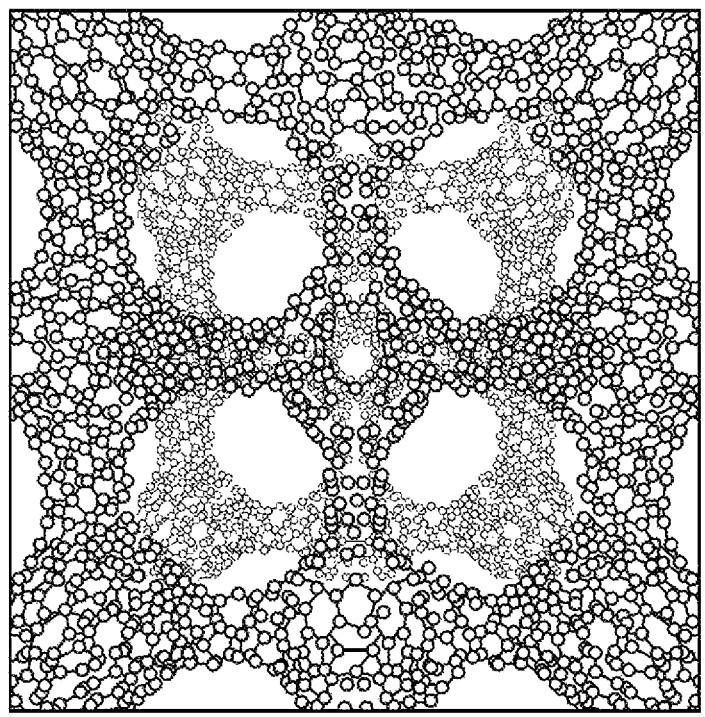
FIG. 2 is a model of a schwarzite network, which is an example of a non-layered graphenic network with a gyroidal geometry. The corresponding Schwarz surface is shown next to the model.
Figure 2:
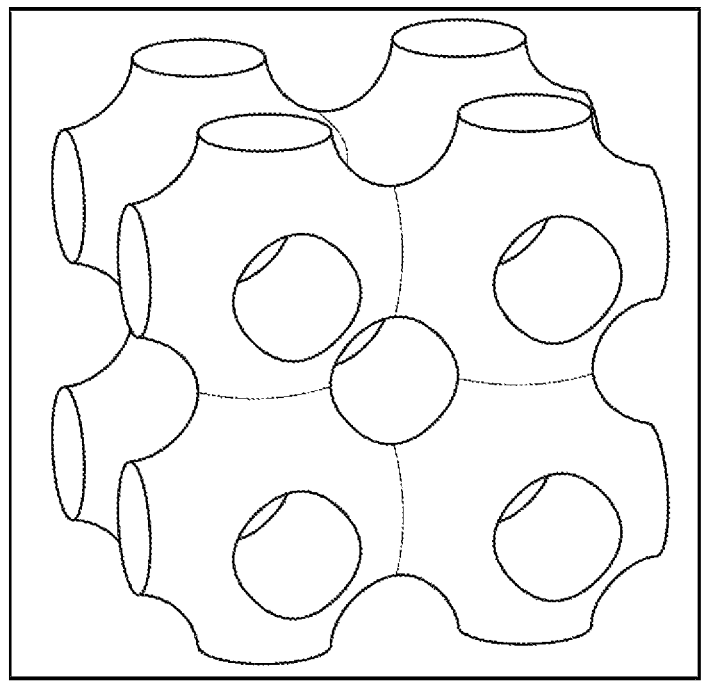

A "layered" network is herein defined as a multilayer graphenic network comprising z-adjacent layers with either graphitic or nematic xy-alignment. Layered graphenic networks are shown as a subcategory of graphenic networks in the classification chart in FIG. 1. Schwarzite, as shown in FIG. 2, does not comprise a layered graphenic network.

A "graphitic network" is herein defined as a type of layered graphenic network in which z-adjacent layers exhibit graphitic xy-alignment—i.e. they are substantially parallel. Graphitic networks may be characterized by an average <002> interlayer d-spacing of 3.45 Å or less, with no significant presence of interlayer spacings larger than 3.50 Å. Graphitic networks are shown as a subcategory of layered graphenic networks in the classification chart in FIG. 1.

An "anthracitic network" is herein defined as a type of layered graphenic network comprising two-dimensional molecular structures crosslinked via certain characteristic structural dislocations, described herein as "anthracitic dislocations," which include Y-dislocations, screw dislocations, and mixed dislocations having characteristics of both Y-dislocations and screw dislocations. Z-adjacent layers in anthracitic networks exhibit nematic alignment. Anthracitic networks may be characterized by a significant presence of <002> interlayer d-spacings larger than 3.50 Å. Anthracitic networks are shown as a subcategory of graphenic networks in the classification chart in FIG. 1 and may be further classified as natural (i.e. anthracite coal) vs. synthetic, with synthetic anthracitic networks being much more diverse in architecture and chemistry.

"Nematic alignment" is herein used to describe a molecular-scale, general xy-alignment between z-adjacent layers in a multilayer graphenic system. This term is typically used to denote a type of consistent but imperfect xy-alignment observed between liquid crystal layers, and we find it useful herein for describing the imperfect xy-alignment of z-adjacent layers in anthracitic networks. Nematic alignment may be characterized by a significant presence of <002> interlayer d-spacings larger than 3.50 Å.

An "sp$^x$ network" is herein defined as a type of synthetic anthracitic network comprising a single, continuous graphenic structure, wherein the network is laterally and vertically crosslinked via diamondlike seams and mixed dislocations (e.g. chiral columns). In the context of maturation processes, an sp$^x$ network may be described as an "sp$^x$ precursor."

Carbon sp$^x$ networks can be further classified based on the extent of their internal grafting, which can be determined by the prevalence of its sp$^2$-hybridized edge states prior to maturation. With respect to the extent of this grafting, a carbon sp$^x$ network can be described as:

"Minimally grafted" if (a) its average $D_u$ position is located above 1342 cm$^{-1}$, (b) its average $D_f$ peak position is located below 1342 cm$^{-1}$ and (c) no point spectra exhibit $D_u$ peak positions below 1342 cm$^{-1}$ "Partially grafted" if (a) its average $D_u$ peak position is located between 1332 cm$^{-1}$ and 1342 cm$^{-1}$ and (b) no point spectra reveal $D_u$ peak positions below 1332 cm$^{-1}$; or alternatively if (a) its average $D_u$ peak position is located above 1342 cm$^{-1}$ and (b) point spectra exhibit $D_u$ peak positions between 1332 cm$^{-1}$ and 1340 cm$^{-1}$.

"Highly grafted" if its average $D_u$ peak position is located below 1332 cm$^{-1}$, or alternatively if (a) its average $D_u$ peak position is located above 1332 cm$^{-1}$ and (b) some point spectra exhibit localized $D_u$ peak positions below 1332 cm$^{-1}$.

These conditionals are summarized in Table 1 below:

TABLE 1

| Minimally grafted z-sp$^x$ carbon | | | Partially grafted z-sp$^x$ carbon | | | Highly grafted z-sp$^x$ carbon | | |
|---|---|---|---|---|---|---|---|---|
| Spectral positions | Avg. | Pt. | Spectral positions | Avg. | Pt. | Spectral positions | Avg. | Pt. |
| 1342 cm$^{-1}$ < D$_u$ | ✓ | ✓ | 1342 cm$^{-1}$ < D$_u$ | x | x | 1332 cm$^{-1}$ < D$_u$ | x | x |
| D$_u$ < 1342 cm$^{-1}$ | x | x | 1332 cm$^{-1}$ < D$_u$ < 1342 cm$^{-1}$ | ✓ | ✓ | 1332 cm$^{-1}$ > D$_u$ | ✓ | ✓ |
| 1342 cm$^{-1}$ > D$_f$ | ✓ | ✓ | 1332 cm$^{-1}$ > D$_u$ | x | x | or | | |
| | | | or | | | 1332 cm$^{-1}$ > D$_u$ | ✓ | ✓ |
| | | | 1342 cm$^{-1}$ < D$_u$ | ✓ | ✓ | 1332 cm$^{-1}$ < D$_u$ | x | ✓ |
| | | | 1332 cm$^{-1}$ < D$_u$ < 1342 cm$^{-1}$ | x | ✓ | | | |
| | | | 1332 cm$^{-1}$ > D$_u$ | x | x | | | |

A "helicoidal network" is herein defined as a type of synthetic anthracitic network comprising screw dislocations. These screw dislocations may be formed via the maturation of chiral columns present in sp$^x$ networks. Hence, an sp$^x$ network may be described as an "sp$^x$ precursor" of a helicoidal network. The derivation of helicoidal networks from sp$^x$ precursors is indicated by the dotted arrow labeled "maturation" in the classification chart in FIG. 1.

"Maturation" is herein defined as a structural transformation that accompanies the sp$^3$-to-sp$^2$ rehybridization of sp$^3$-hybridized states in an sp$^x$ precursor. Maturation of an sp$^x$ precursor ultimately forms a helicoidal network; the extent of maturation is determined by the degree to which the sp$^3$-to-sp$^2$ rehybridization is completed. Maturation is progressive, so networks in intermediate states comprising both sp$^x$ and helicoidal network features may be formed. Additionally, maturation may be localized; for instance, heating certain locations of the network, such as by laser, might cause localized maturation of the affected area.

A "highly mature" carbon helicoidal network is defined herein as a carbon helicoidal network having an average D$_u$ peak position that is at least 1340 cm$^{-1}$ and is at least 8 cm$^{-1}$ higher than that of its sp$^x$ precursor.

An "x-carbon" is herein defined as a category of synthetic anthracitic networks constructed from graphene and comprising one of the following:
  an "x-sp$^x$ network," defined herein as a highly grafted sp$^x$ network
  a "helicoidal x-carbon" formed by maturing an x-sp$^x$ precursor to either an intermediate or highly mature state A "z-carbon" is herein defined as a category of synthetic anthracitic networks constructed from graphene and comprising one of the following:
  a "z-sp$^x$ network," defined as a minimally or partially grafted sp$^x$ network
  a "helicoidal z-carbon" formed by maturing a z-sp$^x$ precursor to either an intermediate or highly mature state.
When used in the context of identifying a z-carbon, the z-prefix does not relate to z-directionality.

A "helicoidal singleton" is herein defined as a singleton-type helicoidal network, wherein the helicoidal network comprises a single, ring-connected graphenic structure, and wherein the network is laterally and vertically crosslinked by screw dislocations.

A "helicoidal assembly" is herein defined as an assembly-type helicoidal network, wherein the helicoidal network comprises an assembly of multiple, helicoidal graphenic structures that are physically interlocked with one another via braid-like double helicoids (i.e. double screw dislocations).

An "sp$^x$ preform" is a macroscopic assembly of distinct, sp$^x$ precursors, referred to in this context as "sp$^x$ microforms." Various forming techniques may be used to impart a desired shape to an sp$^x$ preform, such as an elongated, flat, or equiaxed shape.

A "macroform" is herein defined as a macroscopic, cohesive structure.

A "singleton-to-singleton" maturation is herein defined as a maturation process in which an sp$^x$ precursor is matured to form a helicoidal singleton.

"A singleton-to-assembly" maturation is herein defined as a maturation process in which an sp$^x$ precursor is disintegrated into a helicoidal assembly.

"Disintegration" is herein defined as the division of a singleton-type graphenic network into two or more distinct, ring-disconnected graphenic structures.

A "primordial domain" is defined herein as a graphenic domain nucleated and grown over a substrate prior to any tectonic encounters. When primordial domains are grown over a common surface toward one another, their edges may have a tectonic encounter.

A "primordial region" is defined herein as a region of a graphenic network generally coinciding with the network's primordial domains. We generally refer to a primordial region when describing some region of a graphenic system that was originally a primordial domain.

A "tectonic encounter" is a state of lateral near-contact between two edge segments during growth of a two-dimensional lattice. A tectonic encounter creates a tectonic interface between the two participating edge segments. The numerous tectonic encounters that may occur during the nucleation and growth of a graphenic system may be described as "tectonic activity."

A "tectonic interface" is defined herein as the edge-to-edge interface formed by a tectonic encounter between two graphenic structures or regions.

A "zigzag-zigzag interface" is herein defined as a tectonic interface in which both of the edge segments are in the zigzag configuration.

A "zigzag-armchair interface" is herein defined as a tectonic interface in which one of the edge segments is in the zigzag configuration, while the other is in the armchair configuration.

An "offset zone" is herein defined as an interfacial zone within a tectonic interface in which one of the two participating edge segments are vertically offset—i.e. one of the edge segments is located above the other.

A "level zone" is herein defined as an interfacial zone within a tectonic interface in which the two participating edge segments are substantially level with each other and sufficiently aligned such that a bond line of two or more laterally adjacent $sp^2$-$sp^2$ bonds may be formed across the interface, resulting in one or more $sp^2$ ring-connections.

A "crossover point" is herein defined as a location in a tectonic interface where the two participating edge segments crisscross, and where their alignment is inadequate to form a bond line of two or more laterally adjacent $sp^2$-$sp^2$ bonds. This may be because the $2p_z$ orbitals of the opposing $sp^2$ edge atoms are too misaligned for $\pi$ bonds to form.

"$Sp^2$ grafting" is herein defined as the formation of a $sp^2$-$sp^2$ bond line between two edge atoms. $Sp^2$ grafting creates $sp^2$ ring-connections that may cause distinct graphenic structures to become ring-connected and coalesce into a larger graphenic structure. $Sp^2$ grafting across a tectonic interface is favored in level zones.

"$Sp^3$ grafting" is herein defined as the formation of $sp^3$-$sp^3$ bonds between two edge atoms. This may involve the $sp^2$-to-$sp^3$ rehybridization of $sp^2$ edge atoms. $Sp^3$ grafting creates $sp^x$ rings that may cause distinct graphenic structures to become ring-connected and coalesce into a larger graphenic structure. $Sp^3$ grafting across a tectonic interface is favored in offset zones.

A "base" or "base layer" is herein defined as the first graphenic layer formed by grafting across the tectonic interfaces between primordial domains during pyrolytic growth.

"Mesoscale" is used herein to describe a hierarchical level or feature (e.g. crosslinking, porosity) pertaining to a relatively larger size-scale than the molecular features. For example, a perimorphic framework's mesoscale crosslinking is a function of its crosslinking over size-scales more relevant to a discussion of its particle morphology than to a discussion of its molecular bonding structure.

A "micropore" is herein defined as a pore with a diameter of less than 2 nm, following IUPAC convention. A "microporous" structure or phase is characterized by the presence of micropores.

A "mesopore" is herein defined as a pore with a diameter between 2 nm and 50 nm, following IUPAC convention. A "mesoporous" structure or phase is characterized by the presence of mesopores.

A "macropore" is herein defined as a pore with a diameter of greater than 50 nm, following IUPAC convention. A "macroporous" structure or phase is characterized by the presence of macropores.

An "ambient superconductor" is herein defined as a material or article capable of entering a superconducting state at a temperature above 0° C. and an external pressure between 0 and 2 atm. "Ambient superconductivity" is herein defined as a superconducting state at a temperature above 0° C. and an external pressure between 0 and 2 atm.

II. Surface Replication

Pyrolysis involves the decomposition of a gas, liquid, or solid carbonaceous material and may be used to form graphenic structures. In some pyrolysis procedures, this decomposition occurs over a substrate surface. The substrate may comprise the simple, flat surface of a foil or the more complex surfaces of particles. The graphenic systems synthesized on particles may inherit some of the particles' morphological attributes. In the '918 and '760 Applications, we define a number of terms related to template-directed synthesis. These terms are defined below.

A "template," as defined herein, is a potentially sacrificial structure that imparts a desired morphology to another material formed in or on it. Of relevance for surface replication techniques are the template's surface (i.e. the "templating surface"), which is positively replicated, and its bulk phase (i.e. the "templating bulk"), which is negatively replicated. The template may also perform other roles, such as catalyzing the formation of the perimorphic material. A "templated" structure is one that replicates some feature of the template.

A "perimorph" or "perimorphic" material is a material formed in or on a solid-state or "hard" template material.

"Surface replication," as defined herein, comprises a templating technique in which a template's surface is used to direct the formation of a thin, perimorphic wall of adsorbed material, the wall substantially encapsulating and replicating the templating surface upon which it is formed. Subsequently, upon being displaced, the templating bulk is replicated, in negative, by an endocellular space within the perimorphic wall. Surface replication creates a perimorphic framework with a templated pore-and-wall architecture.

A "perimorphic framework" (or "framework"), as defined herein, is the nanostructured perimorph formed during surface replication. A perimorphic framework comprises a nanostructured "perimorphic wall" (or "wall") that may range from less than 1 nm to 100 nm in thickness but is preferably between 0.6 nm and 5 nm. Insomuch as it substantially encapsulates and replicates the templating surface, the perimorphic wall can be described as "conformal." Perimorphic frameworks may be made with diverse architectures, ranging from simple, hollow architectures formed on nonporous templates to labyrinthine architectures formed on porous templates. They may also comprise different chemical compositions. A typical framework may be constructed from carbon and may be referred to as a "carbon perimorphic framework."

An "endomorph," as defined herein, comprises a template as it exists within a substantially encapsulating perimorphic phase. Therefore, after the perimorphic phase has been formed around it, the template may be described as an endomorph, or as "endomorphic."

A "perimorphic composite," as defined herein, is a composite structure comprising an endomorph and a perimorph. A perimorphic composite material may be denoted x@y, where x is the perimorphic element or compound and y is the endomorphic element or compound. For example, a perimorphic composite comprising a carbon perimorph on an MgO endomorph might be denoted C@MgO.

Numerous template elements or compounds may be employed, including carbon, metal oxides, oxyanionic salts, boron nitride, metal halides, and more. In particular, magnesium oxide (MgO) templates are often employed in chemical vapor deposition ("CVD") processes due to their stability at high temperatures. Many of these templates are described in the '918 Application and the '154 Application. All that is required for many surface replication procedures involving CVD is a surface and the nucleation of a lattice that can be grown via autocatalysis or as a free radical condensate.

III. Free Radical Condensate Growth & Tectonics

In the free radical condensate theory of growth, a free radical condensate (i.e. "condensate" or "FRC") is formed during pyrolytic decomposition of a reactive vapor. A carbon FRC is a charged, hydrogenated precursor to the graphenic structure that can rapidly rearrange its carbon skeleton without breaking covalent bonds; hence it can be envisioned as a kind of charged, covalent liquid. A carbon FRC grows in the presence of a reactive vapor via radical addition reactions at its edges. As the condensate releases molecular hydrogen, its concentration of radicals diminishes, its self-rearrangement ceases, and it becomes an uncharged carbon structure. A gradual release of molecular hydrogen provides the FRC more time to rearrange itself into an energy-minimizing configuration—typically one that eliminates high-energy edge defects. This has been shown to promote edgeless graphenic structures like fullerenes. A sudden loss of hydrogen, by contrast, does not provide sufficient time for these energy-minimizing rearrangements to occur, which promotes the formation of graphenic structures with more edges.

Figure 5A:
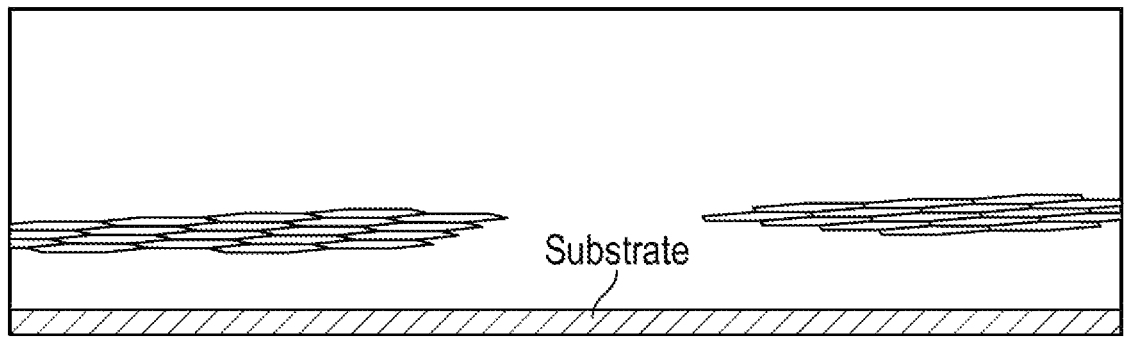
FIG. 5A illustrates a tectonic encounter between the two graphenic structures growing over a common substrate (hatched) as their edges approach one another laterally.

If grown over a common substrate surface, graphenic structures may come into lateral contact with one another. These tectonic encounters, and the underlying factors that determine how they are resolved, have been the subject of scant research. In one case we have found, researchers observing the growth of ring-ordered, crystalline graphenic structures on copper foil found that a tectonic encounter (as illustrated by the two graphenic structures approaching each other over a common substrate in FIG. 5A) could be resolved in one of two ways.

Figure 5B:
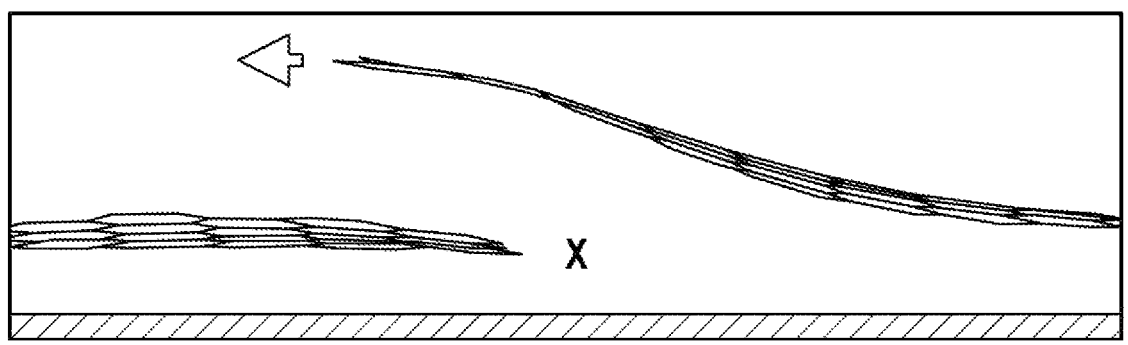
FIG. 5B illustrates a subduction event between the two graphenic structures, which results in an edge dislocation. The subducted structure's terminus is marked with an 'x'.

In the first scenario, the edge of one of the graphenic structures is subducted by the edge of the other—an event described herein as a "subduction event." A subduction event allows continued growth of the subducting region over the subducted region, as illustrated in FIG. 5B. The subducting region's continued growth is indicated by the black arrow in FIG. 5B, whereas the subducted region's growth is quenched due to its position between the substrate (hatched in FIG. 5B) and the subducting region. This quenching is indicated by the black "x" in FIG. 5B. A subduction event forms an edge dislocation comprising two overlapping, z-adjacent graphenic structures weakly cohered via van der Waals interactions.

Figure 5C:
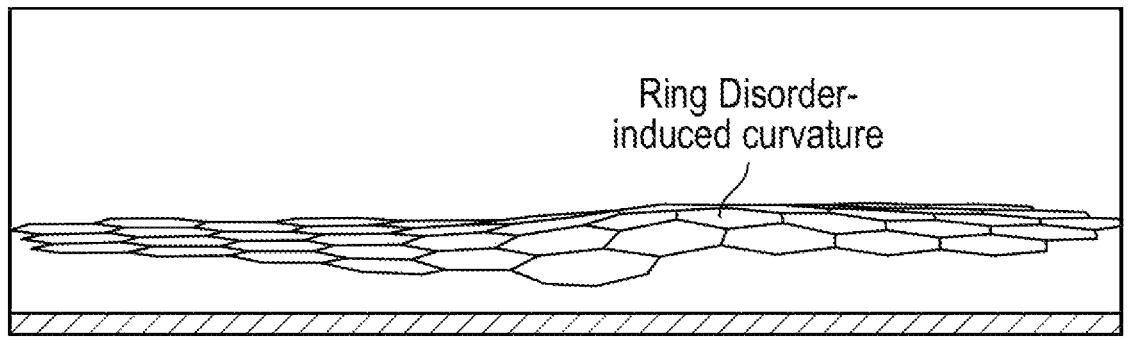
FIG. 5C illustrates an $sp^2$ grafting event between the two graphenic structures resulting in coalescence and a new graphenic structure, with some slight ring-disorder and curvature resulting from the $sp^2$ grafting.

In the second scenario described by the researchers, the edge of one of the graphenic structures may graft to the edge of the other via $sp^2$-$sp^2$ bond formation between the opposing edge atoms. This $sp^2$ grafting causes the two graphenic structures to coalesce to form a larger graphenic structure. The outcome of this event is illustrated in FIG. 5C. The researchers showed that $sp^2$ grafting between laterally or rotationally misaligned edges may result in the formation of non-hexagonal rings in the new graphenic structure. It follows that the regional presence of these non-hexagonal rings within the $sp^2$-grafted domain may induce local lattice curvature, as indicated in FIG. 5C. The underlying substrate is hatched in FIG. 5C.

The complexity of tectonics between graphenic structures is increased when the substrate surface becomes more topologically and topographically complex. It is further increased if we postulate edge disorder. We surmise herein that these factors are important in determining the outcomes of tectonic encounters. Lastly, it is increased if the tectonics occur in a substantially unconfined space, where steric effects of surrounding structures can be ignored. This may not be the case when pyrolysis occurs in certain microporous template particles, like Zeolite Y, where $sp^2$ grafting between graphenic structures (as opposed to subduction) may be forced due to the z-directional confinement in these templates' micropores—i.e. a lack of overhead clearance.

IV. Surfaces in Three Dimensions

Figure 3:
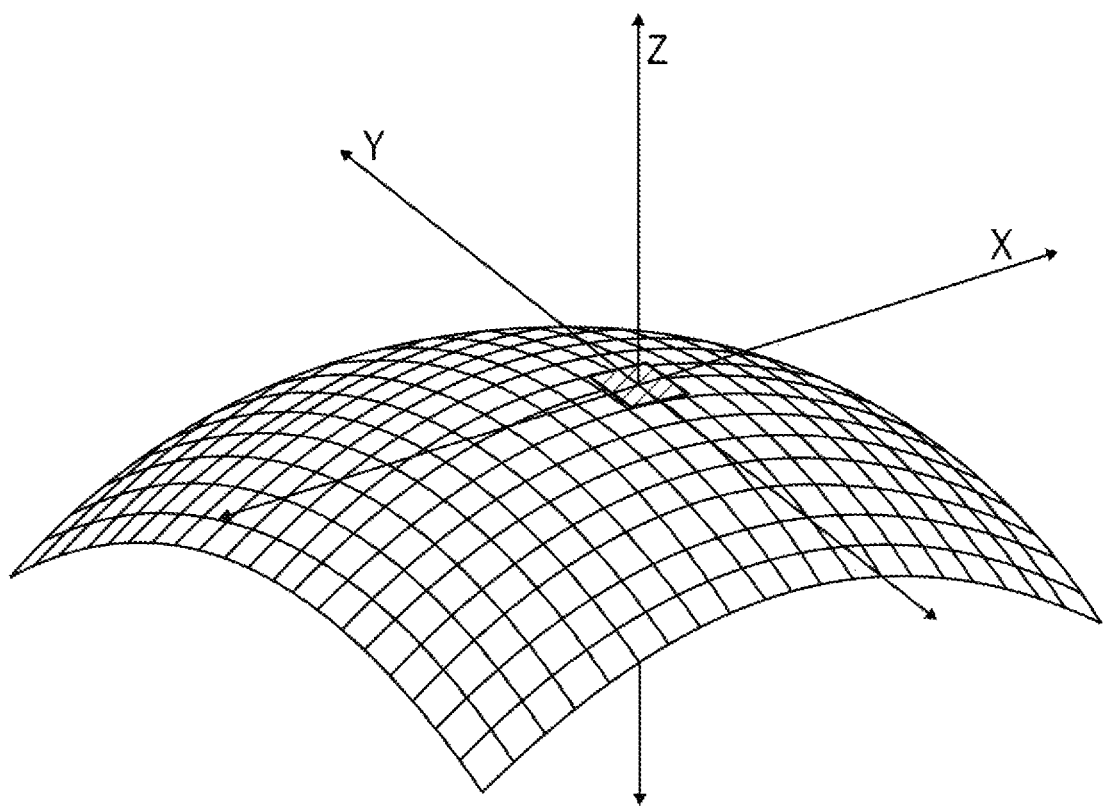
FIG. 3 illustrates a curved, two-dimensional surface a tangent xy-plane (hatched), and an orthogonal z-axis. The spaces above and below the curved surface comprises z-spaces.

To describe the local space around curved, two-dimensional graphenic structures, it is helpful to establish an intuitive orientation. On a curved surface, there exists some tangent plane at any given point that we can think of as an xy plane. FIG. 3 illustrates a hypothetical two-dimensional structure and a tangent plane, which is hatched in FIG. 3. Consistent with this, a z-axis normal to this xy-plane is also illustrated in FIG. 3. While the orientations of the tangent plane and z-axis will vary across a curved surface, we find it helpful to describe the local space generally above or below a graphenic region as the "z-space," and to describe the direction of the local z-space as "vertical." We also find it helpful to describe the direction perpendicular to the local z-axis as "lateral."

Figure 4:
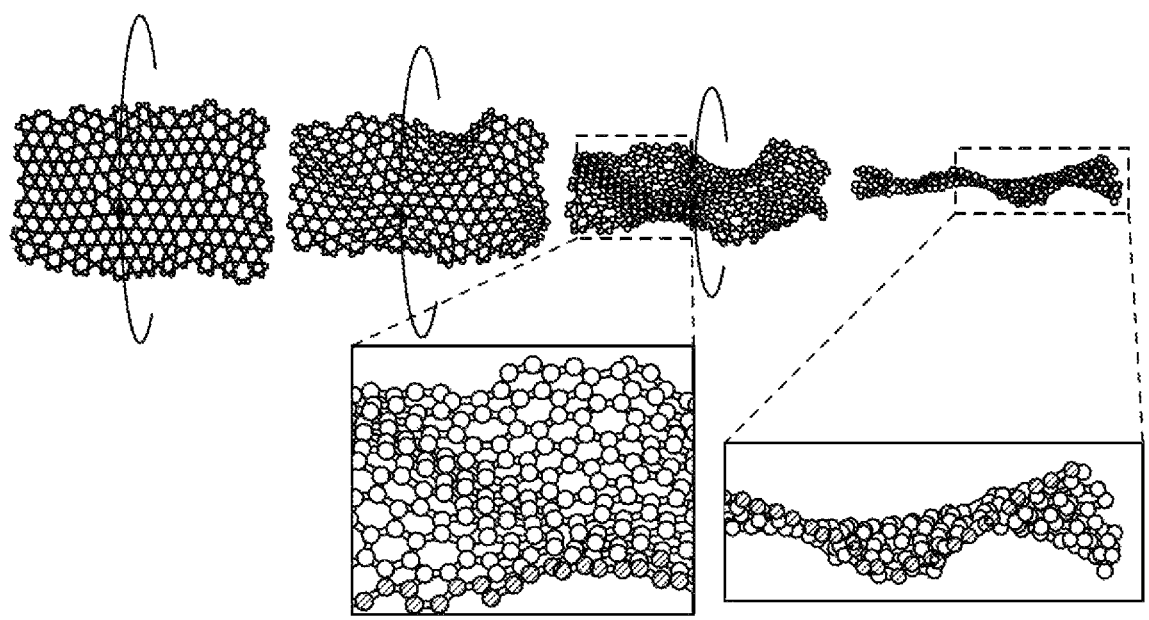
FIG. 4 is a molecular model of a curved, ring-disordered graphenic structure. The structure is rotated, as indicated by the arrows, in order to provide multiple perspectives. A magnified inset shows regions of positive and negative Gaussian curvature. The edge located in the foreground is hatched, and a magnified inset is shown of its undulating geometry.

An example of a ring-disordered graphenic domain with nonzero curvature is modeled in FIG. 4. This model was constructed using Avogadro 1.2.0 software and relaxed to obtain a rough approximation of the actual molecular geometry that might exist in free space. The resulting domain is rotated as indicated by the black arrows in FIG. 4 in order to facilitate visualization from different perspectives. One segment of its edge is hatched for orientation.

From the vertical perspective in FIG. 4, the ring disorder can be observed. The domain incorporates a randomized tiling of 5-member, 6-member, and 7-member rings. From the diagonal perspectives, regions possessing positive or negative curvature can be observed. From the horizontal perspective, we can trace the hatched edge, which provides a sense of the z-directional lattice deflections (i.e. "z-deflections") created by the ring disorder. The domain's z-deflections impart an undulating shape to the edge, which z-deflects alongside the local lattice. As ring disorder increases, the amplitude and frequency of the edge's z-deflections may increase.

V. Clarifying Examples

Analysis of exemplary systems may provide helpful clarification of these concepts. Unless stated otherwise, the models all depict $sp^2$-hybridized or $sp^3$-hybridized carbon atoms and do not show hydrogen atoms.

Figure 6A:
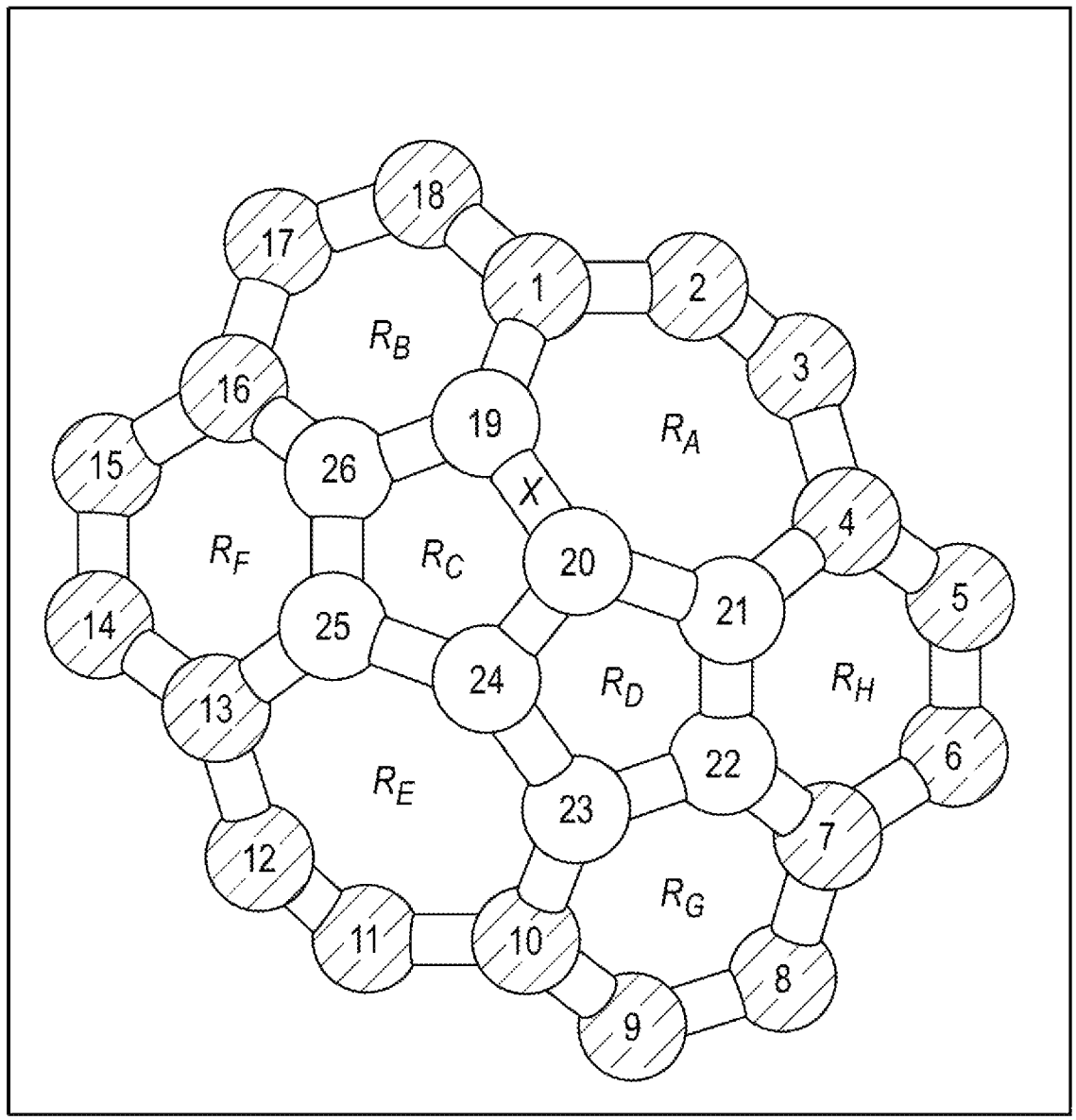
FIG. 6A is a molecular model used to clarify various definitions and concepts used in the present disclosure.

FIG. 6A is a system of 26 carbon atoms, each of which are numbered, and 8 cyclic structures labeled $R_A$, $R_B$, $R_C$, ..., $R_H$. The cyclic structure labeled $R_A$ consists of 7 carbon atoms (i.e. atoms 1, 2, 3, 4, 19, 20, and 21) bonded to one another in a covalent chain, together forming a closed heptagon. Hence, $R_A$ meets the definition of a ring. All of the other cyclic structures in the molecule in FIG. 6A also meet the definition of a ring and may be expressed as sets of their atomic members.

The side of $R_A$ labeled x in FIG. 6A is also shared by the pentagonal ring $R_C$. Because $R_A$ and $R_C$ share a common side, it is also true that they share at least two atomic members. Therefore, rings $R_A$ and $R_C$ meet the definition of adjacent rings.

In the system in FIG. 6A, every atom belongs to a ring, and every ring is path-connected to every other ring by at least one path of adjacent rings. For example, ring $R_A$ is connected to ring $R_E$ by many paths of adjacent rings (e.g. $R_A \rightarrow R_C \rightarrow R_E$, or $R_A \rightarrow R_H R_G \rightarrow R_E$). Therefore, the system may be described as ring-connected and as a graphenic structure.

Next, we evaluate the atoms of the graphenic structure in FIG. 6A to determine whether they are interior or edge atoms. Atom 19 belongs to rings $R_A$, $R_B$, and $R_C$, which surround it on all sides. Therefore, 19 meets the definition of an interior atom. Atoms 20 through 26 also meet this definition. Each interior atom is colored white in FIG. 6A.

Atom 1 belongs to rings $R_A$ and $R_B$, which do not completely surround it. Therefore, 1 meets the definition of an edge atom. Atoms 2 through 18 also meet this definition. All edge atoms are blue in FIG. 6A. Starting from any given edge atom, we can from this first atom trace a chain of nearest neighbors such that any two nearest neighbors within the chain are both edge atoms and also co-members of exactly one ring. By continuing this trace to its terminus, we define an edge.

For instance, starting from 1, we find that 2 is a nearest neighbor, an edge atom, and a co-member (along with 1) of exactly one ring ($R_A$). Continuing this trace from 2 to 18, a circuit is formed that is closed by the bond between 18, the last atom in the chain, and 1, its nearest neighbor and the first atom in the chain. Together, these atoms represent the edge of the graphenic structure.

Figure 6B:
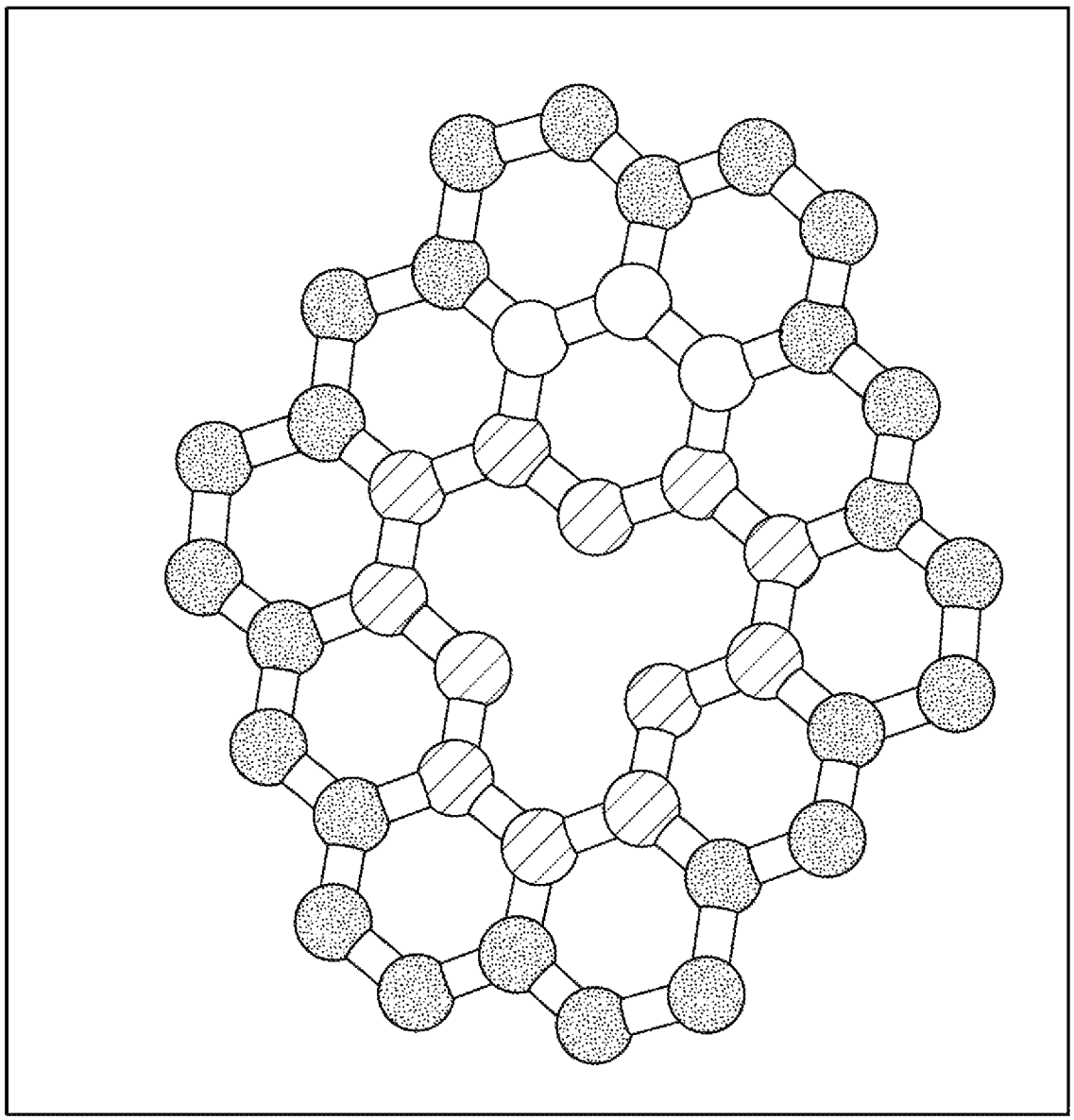
FIG. 6B is a second molecular model used to clarify various definitions and concepts used in the present disclosure.

In FIG. 6B, a system of 41 carbon atoms and 12 cyclic structures is illustrated. Rather than numbering all of the atoms, we characterize them as groups, based on their patterning in FIG. 6B speckled, hatched and white. Of the 12 cyclic structures, 11 meet the definition of rings; the cyclic structure formed by the 12 hatched atoms comprises more than 9 atomic members and therefore is not a ring. All 11 rings are ring-connected, and there are no atoms that are not members of a ring, so the entire system comprises a graphenic structure.

Next the atoms of the graphenic structure in FIG. 6B are analyzed. Only 3 atoms belong to a ring and are also surrounded by rings on all sides. These interior atoms are colored white in FIG. 6B. Since all of the remaining 38 atoms of the graphenic structure belong to a ring and are incompletely surrounded by rings, they are all edge atoms. Starting from any given edge atom, we trace a chain of nearest neighbors such that any two nearest neighbors within the chain are both edge atoms and co-members of exactly one ring. This results in a traced edge. Following this tracing rule, we find that we cannot perform a trace that includes all of the 38 edge atoms in the graphenic structure. So, once an edge has been traced, we select any edge atom that remains unassigned to an edge and trace a new edge, and this process is continued until all edge atoms have been assigned to an edge. Following this procedure for the system in FIG. 6B, we can trace exactly two edges. The edge atoms comprising the 12-member edge are hatched, and the edge atoms comprising the 26-member edge are speckled.

Figure 6C:
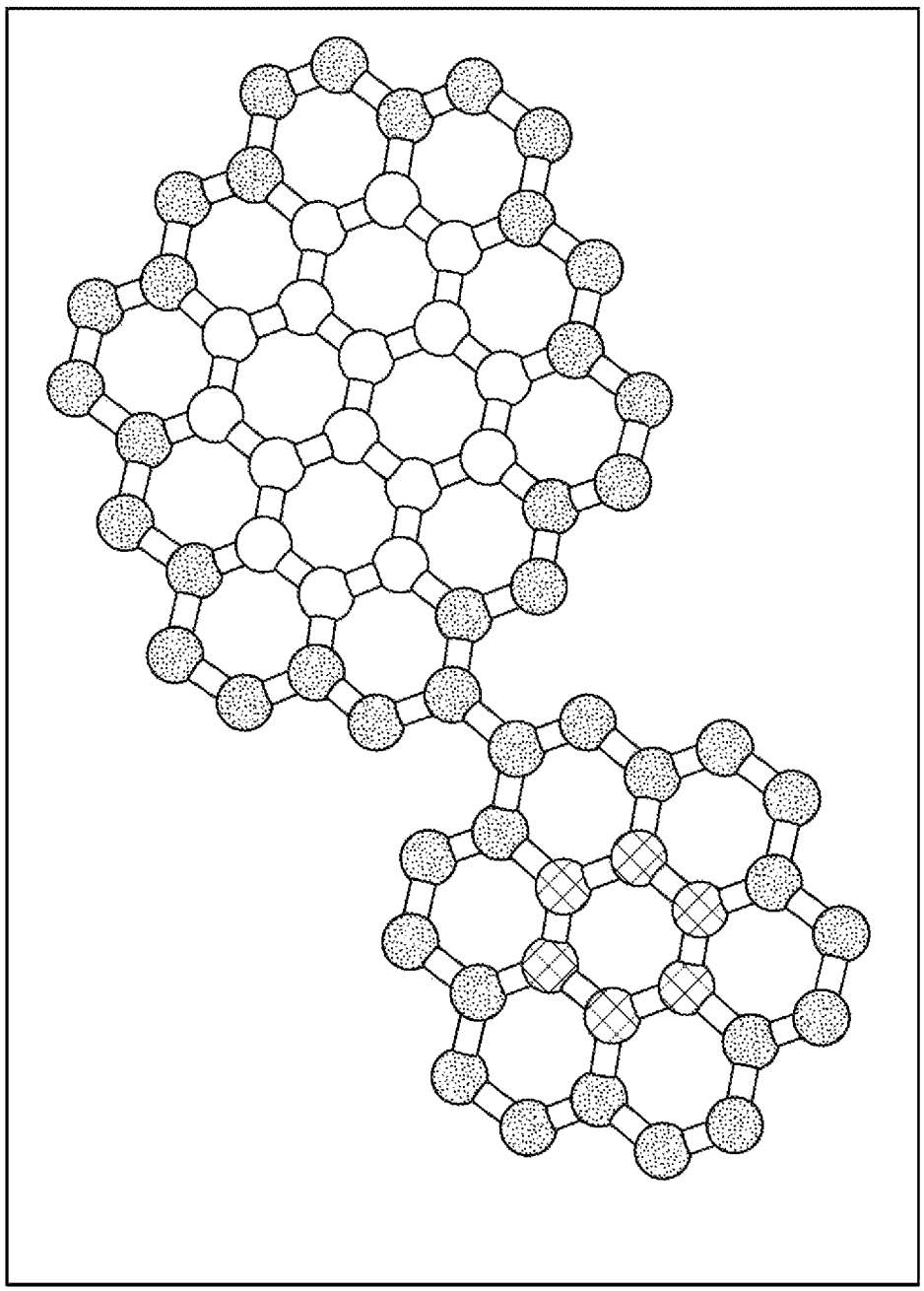
FIG. 6C is a third molecular model used to clarify various definitions and concepts used in the present disclosure.

In FIG. 6C, a system comprising 66 carbon atoms and 21 cyclic structures is illustrated. Rather than numbering all of the atoms, we characterize them as groups, based on their color coding—speckled, crosshatched, and white. All 21 cyclic structures are rings, but not all of the rings are ring-connected to all of the other rings. Instead, there is a first group of 14 ring-connected rings, and a second group of 7 ring-connected rings, but the first group and the second group are not ring-connected to each other.

Therefore, the system in FIG. 6C comprises a 42-member, ring-connected graphenic structure, as well as a separate 24-member graphenic structure. Edge atoms are represented as speckled, the interior atoms of the 42-member graphenic structure are represented as white, and the interior atoms of the 24-member graphenic structure are represented as crosshatched. Because all 66 atoms in the system in FIG. 6C are members of some graphenic structure, the whole system can be represented as a graphenic system, and because the system comprises two distinct graphenic member structures, it represents an assembly. Because the principal cohesion between the two members is provided by the covalent bond connecting them, the assembly comprises a bonded assembly.

Figure 6D:
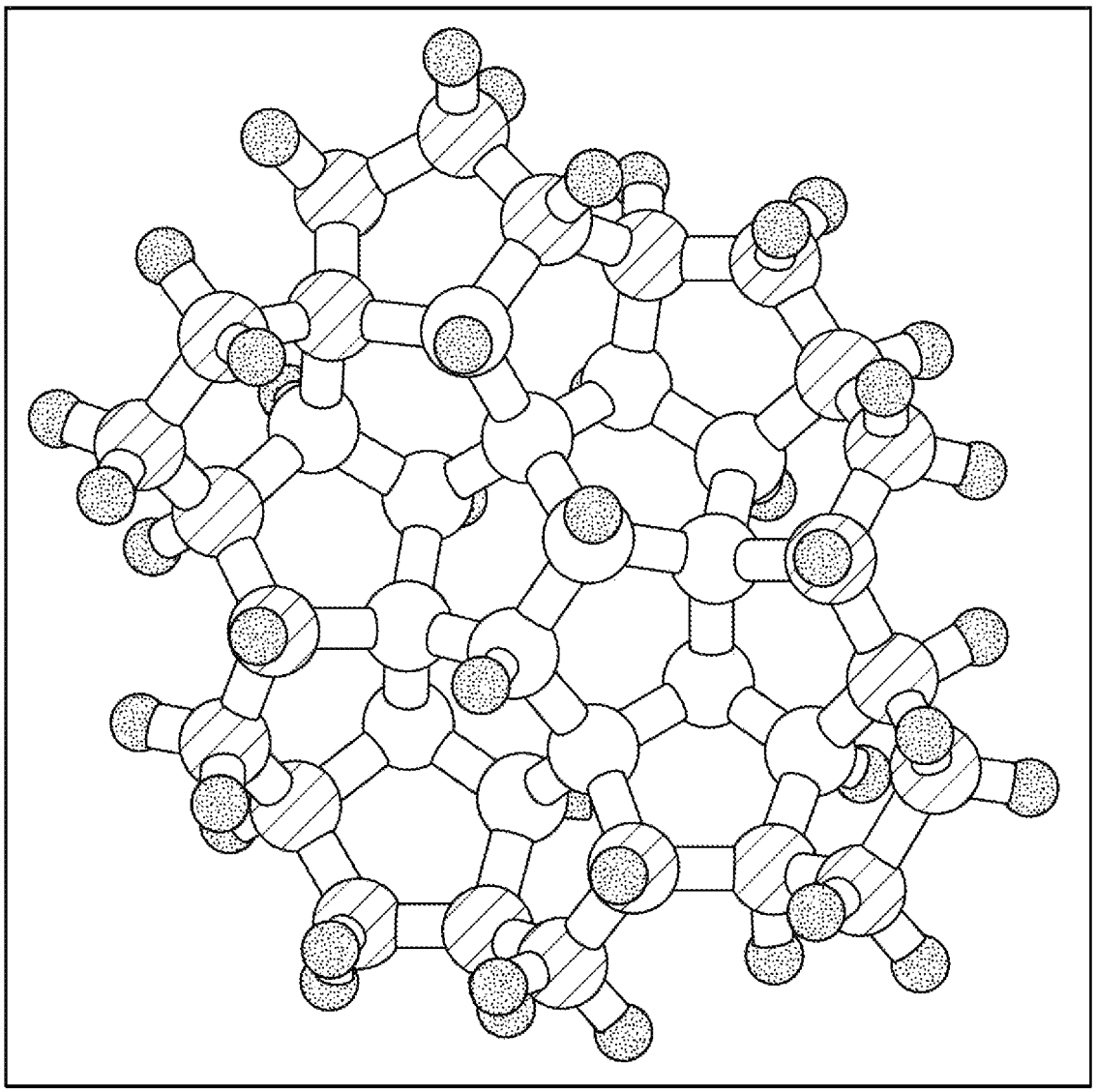
FIG. 6D is a fourth molecular model used to clarify various definitions and concepts used in the present disclosure.

In FIG. 6D, a system comprising 38 carbon atoms (all $sp^3$-hybridized), 44 hydrogen atoms, and 17 cyclic structures is illustrated. Rather than numbering all of the atoms, we characterize them as groups, based on their color coding—speckled, hatched, and white. All hydrogen atoms are represented as speckled and appear smaller than the carbon atoms. Each of the 17 cyclic structures comprises a 5-member ring, and all 38 carbon atoms are members of one of the 17 rings. Every 5-member ring is ring-connected to every other 5-member ring by a path of adjacent rings, making the group of 17 rings a ring-connected, graphenic structure.

Since the system in FIG. 6D includes atoms that are not members of rings, and a graphenic structure comprises polyatomic rings of carbon atoms, the system in its totality does not comprise a graphenic structure. However, the system contains a graphenic structure. Because most graphenic structures will be bonded to hydrogen, oxygen, or other atoms, most graphenic structures will be subsystems of larger systems that include non-graphenic structural elements. In the present disclosure, however, we mostly limit our consideration to the polycyclic carbon arrangements that define graphenic structures.

In FIG. 6D, the graphenic structure contains 15 carbon atoms that both belong to a ring and are surrounded by rings on all sides. These interior atoms are represented as white. The remaining 23 atoms within the graphenic structure belong to a ring and are incompletely surrounded by rings. These edge atoms, and the 23-member edge they comprise, are represented as hatched.

Figure 6E:
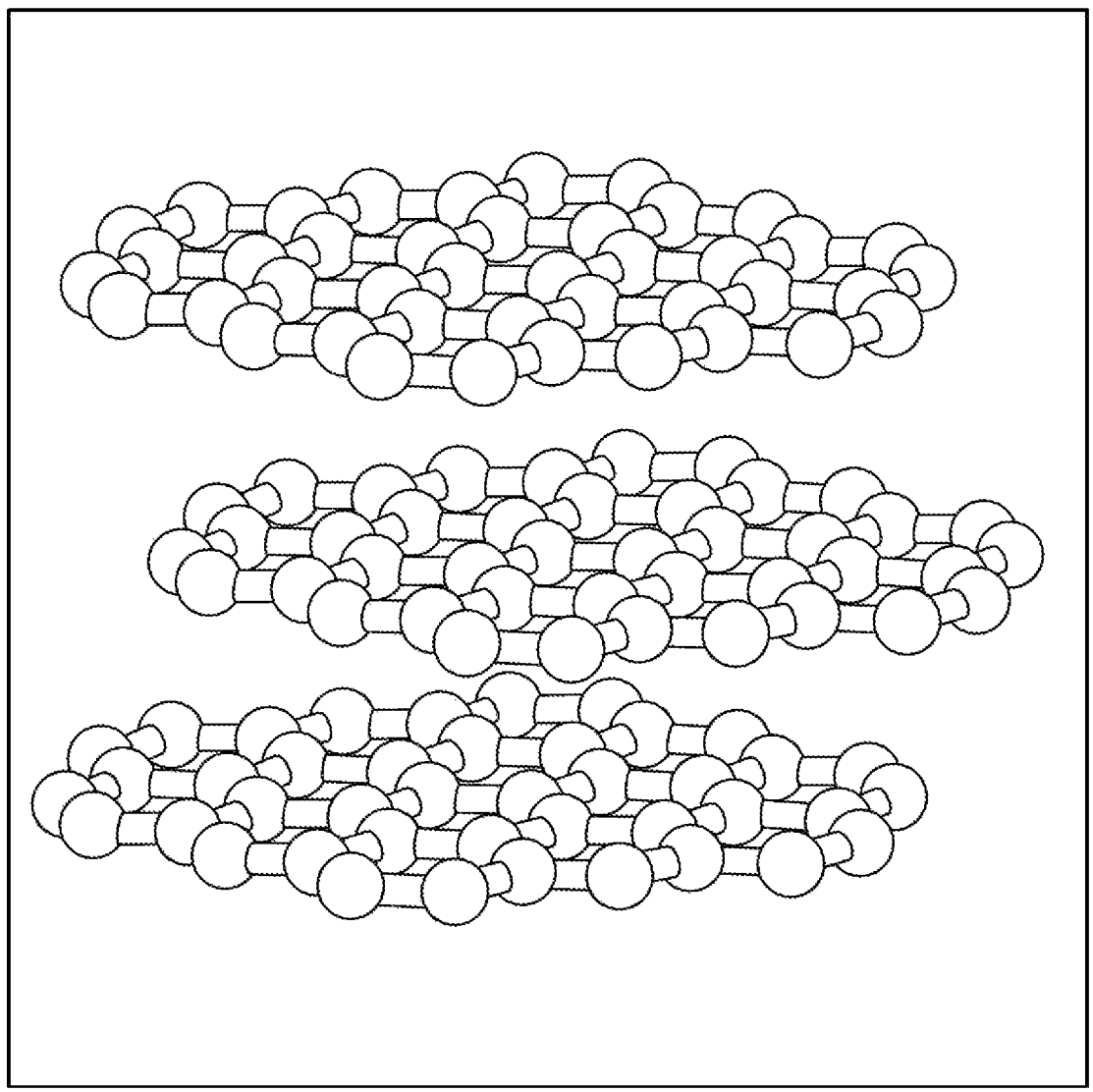
FIG. 6E is a fifth molecular model used to clarify various definitions and concepts used in the present disclosure.

In FIG. 6E, a graphenic system is illustrated. The graphenic system comprises 3 distinct, z-adjacent graphenic member structures. Each graphenic member structure is ring-disconnected with respect to the other two graphenic member structures but is cohered via interlayer vdW interactions. Therefore, the graphenic system in FIG. 6E represents a vdW assembly.

Figure 7A:
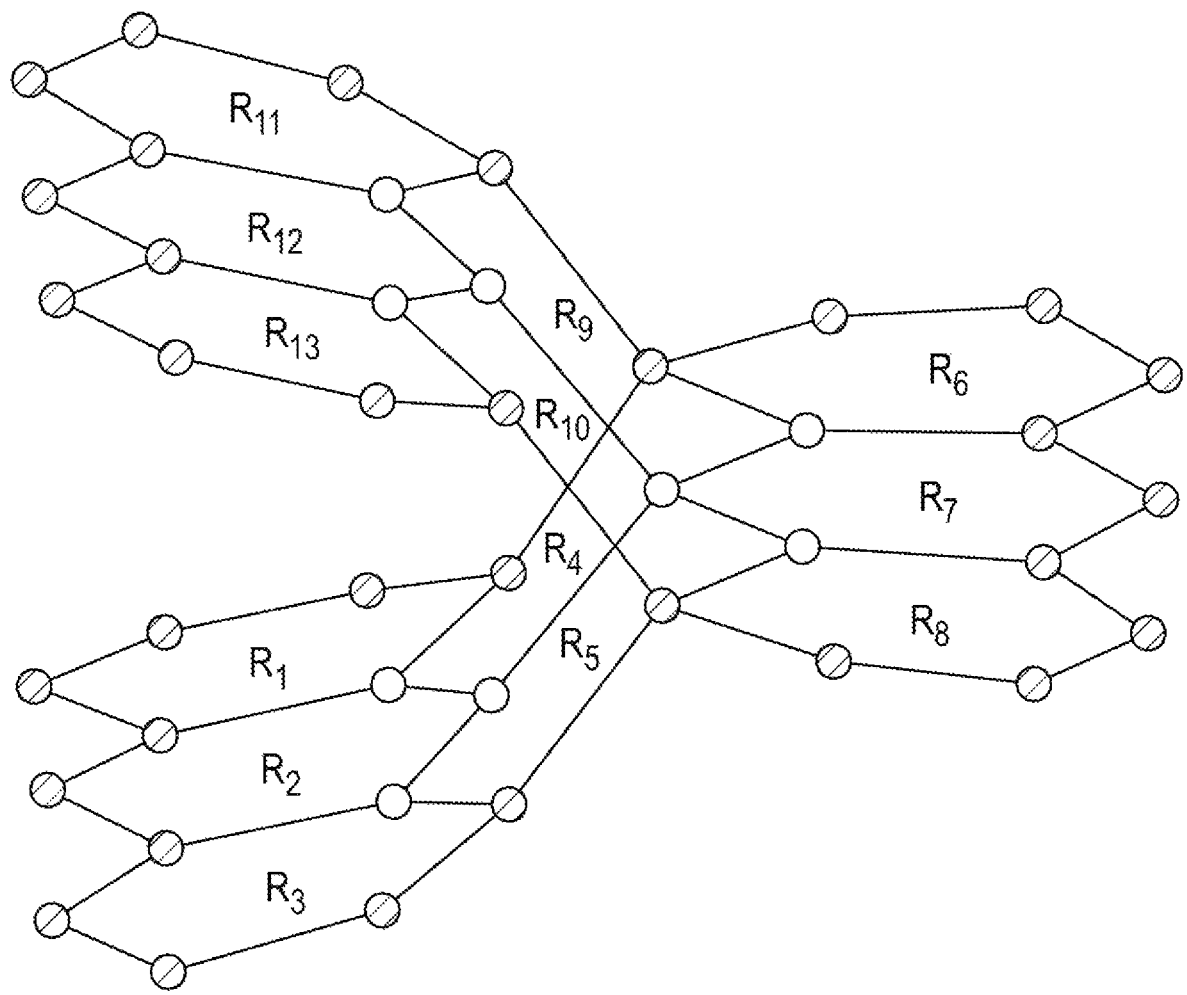
FIG. 7A is a molecular model used to clarify the concept of a Y-dislocation.
Figure 7B:
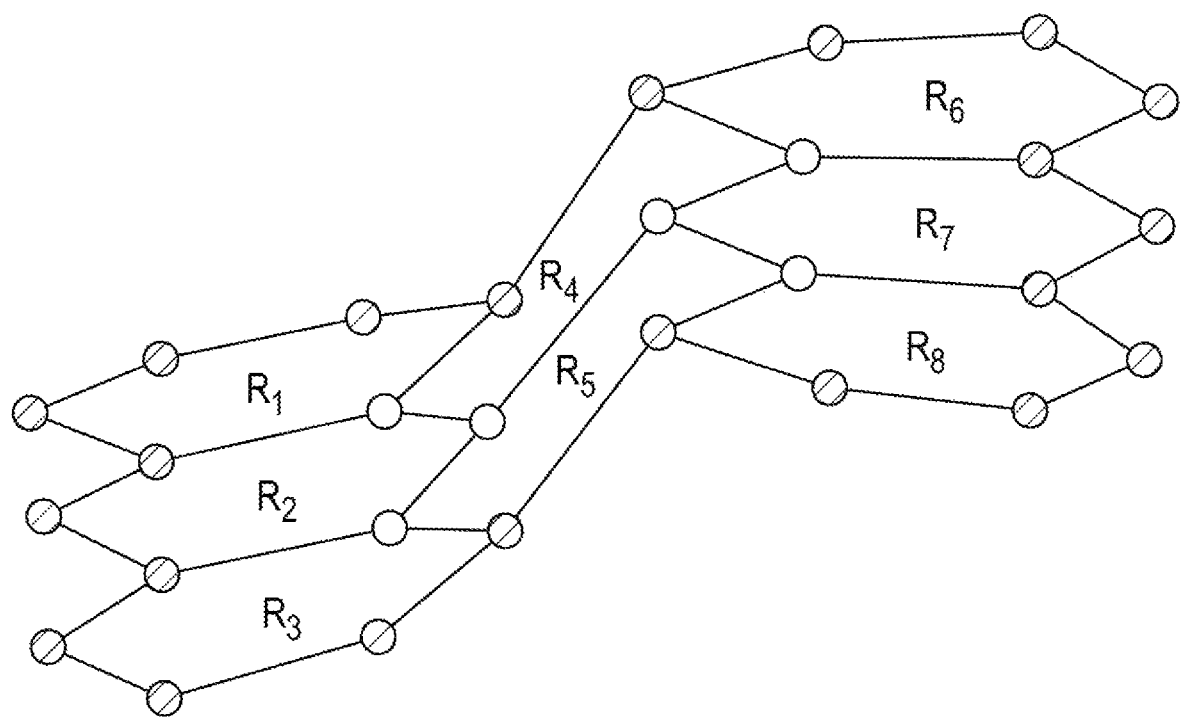
FIG. 7B illustrates a first portion of the molecular model illustrated in FIG. 7A.
Figure 7C:
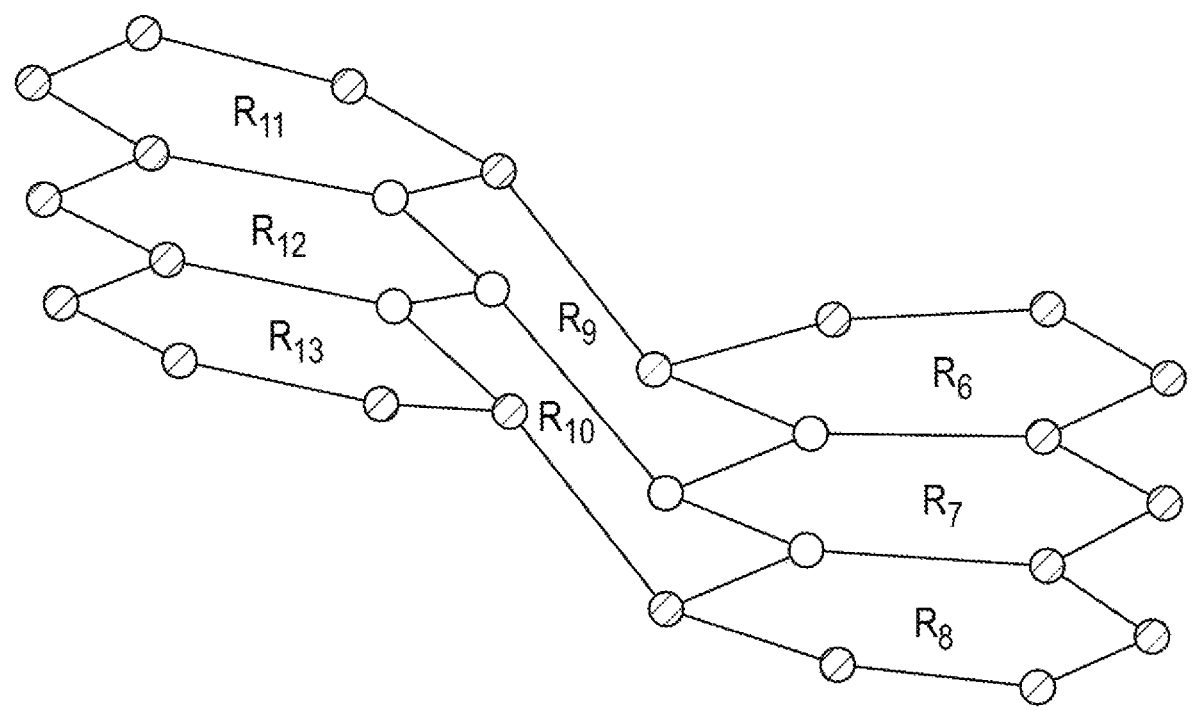
FIG. 7C illustrates a second portion of the molecular model illustrated in FIG. 7A.
Figure 7D:
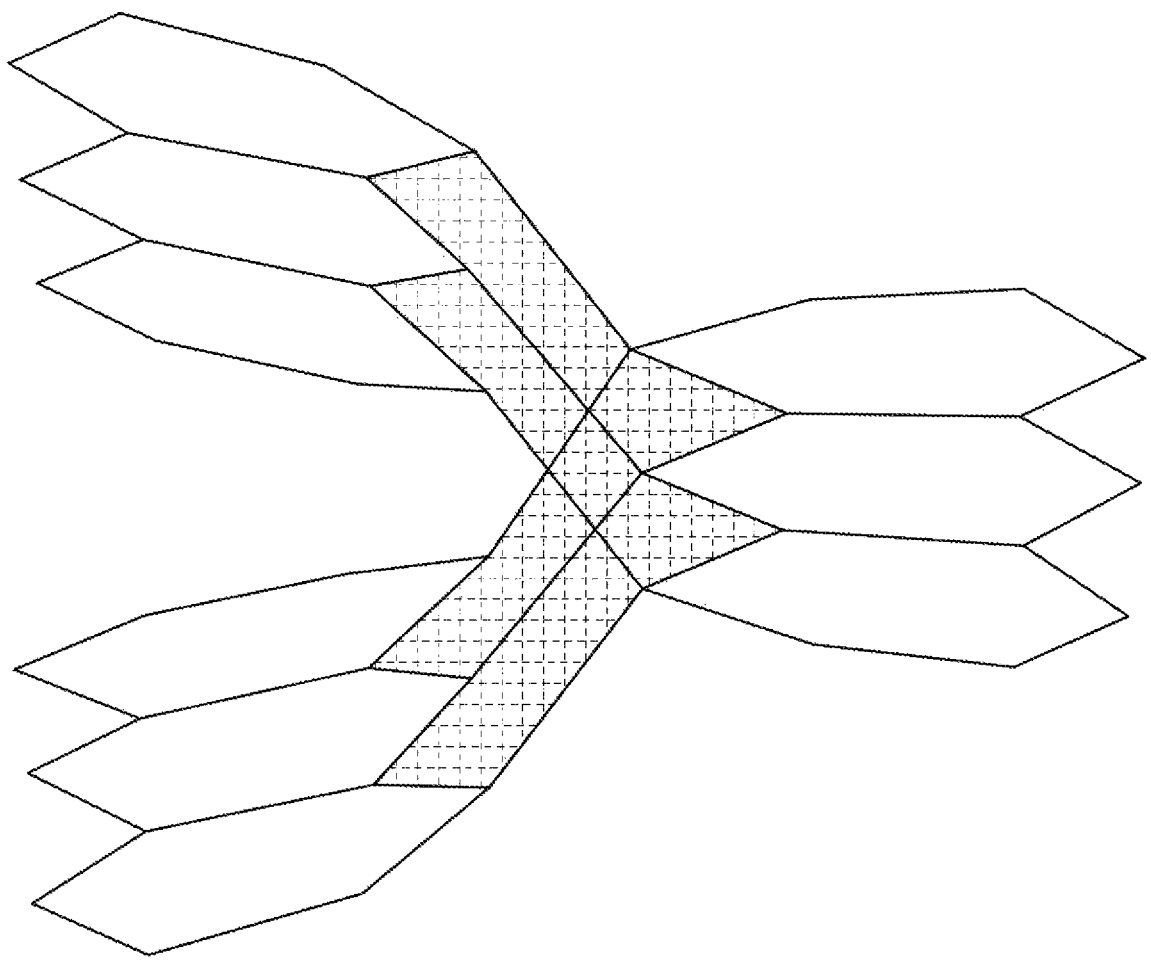
FIG. 7D illustrates a diamondlike seam (hatched) within the molecular model illustrated in FIG. 7A.

In FIG. 7A, a system comprising 42 carbon atoms and 15 cyclic structures is illustrated. Edge atoms and interior atoms are represented as hatched and white, respectively. FIG. 7B and FIG. 7C illustrate isolated portions of this same system. The 15 cyclic structures in the system comprise 13 6-member rings (designated as $R_1, R_2, R_3, \ldots, R_{13}$). All of the system's carbon atoms are members of rings, and all of the rings are path-connected to one another via at least one path of adjacent rings. Therefore, the entire 42-atom system comprises a single, ring-connected graphenic structure. This graphenic singleton includes a Y-dislocation, at the intersection of which is a cubic diamondlike seam that is crosshatched in FIG. 7D.

VI. Notes on Metrology & Characterization

A number of different instruments were employed to characterize the materials synthesized in the present disclosure. The following discussion provides information on these instruments and context for how we analyzed the related data.

All Raman spectroscopic characterization was performed using a ThermoFisher DXR Raman microscope equipped with a 532 nm excitation laser and Omnic profile-fitting software. Specific laser powers were used and are specified where applicable.

Raman spectroscopy is commonly used to characterize the molecular structure of carbon, and a prolific literature exists on this subject. Two main spectral features are typically associated with optical excitation of $sp^2$-hybridized carbon: the G band (typically exhibiting a peak intensity value at approximately 1580 $cm^{-1}$ to 1585 $cm^{-1}$ in graphitic $sp^2$ carbon), and the D band (exhibiting a peak intensity value at approximately 1350 $cm^{-1}$ under optical excitation). The "2D" band representing a second order of the D band is also observed in some graphitic carbons, and its peak intensity value is typically located at approximately 2700 $cm^{-1}$. The G band is assigned to the vibrations of $sp^2$-$sp^2$ bonds. The D band is assigned to the radial breathing mode of $sp^2$-hybridized carbon atoms arranged in rings, and for Raman observation this requires back-scattering of electrons at a defect site.

Researchers have described an amorphization trajectory in the spectra of graphitic carbon showing a progression in disorder from graphite to amorphous carbon that is helpful to understand the dynamics of the D band. In graphite, no D peak is present due to the absence of activating defects. In carbons comprising smaller graphenic domains, the density of edge states is increased, and as edge states increase the D peak is activated by backscattering at the edge defects. The D peak intensity increases toward a maximum, corresponding to a nanocrystalline graphite. Further amorphization in the form of ring disorder diminishes the intensity of the D peak. Lastly, the D peak disappears as further amorphization eliminates a polycyclic, $sp^2$-hybridized structure altogether.

The Raman spectral peaks associated with $sp^3$-hybridized carbon include a peak at 1306 $cm^{-1}$ (associated with hexagonal diamond), a peak at 1325 $cm^{-1}$ (associated with hexagonal diamond) and a peak at 1332 $cm^{-1}$ (associated with cubic diamond). Cubic diamond comprises 100% chair conformations, whereas hexagonal diamond comprises both chair conformations and boat conformations, giving it a lower Raman frequency and lower thermodynamic stability.

Raman-active phonons are known to be strain-dependent. Because the presence of strain within a lattice causes the lattice's vibrational frequencies to shift, Raman spectroscopy can be utilized to understand the strain states within a lattice. However, strain can also shift spectral peaks from their normally identified positions to new positions, making identification more ambiguous. The primary indicator of strain in a ring-ordered graphene structure is the position of the G peak and 2D peak, both of which are sensitive to tension and compression. The G peak has been shown to shift to lower frequencies (i.e. a "red-shift") when the $sp^2$-$sp^2$ bonds are stretched and to higher frequencies (i.e. a "blue-shift") when they are compressed. In graphenic structures with non-uniform strain fields, multiple modes of the G band may be present.

In disordered carbons, several Raman spectral features have been observed in addition to the D peak. A broad Raman peak (sometimes referred to as D") often fitted between 1500 $cm^{-1}$ and 1550 $cm^{-1}$ in amorphous $sp^2$-hybridized carbons is generally observed to increase with ring disorder. It is herein attributed to low-correlation, red-shifted modes of the G band associated with stretched, weakened $sp^2$-$sp^2$ bonds, which proliferate as ring disorder and lattice distortion increase in $sp^2$-hybridized graphenic structures. Ferrari & Robertson have shown that the G peak red-shifts into this range in Stage II of the amorphization trajectory. In graphene oxide, this red-shifted mode of the G peak may be found alongside the normal G peak, indicating the presence of weaker $sp^2$ bonds alongside normal $sp^2$ bonds within the lattice. This is in good agreement with the customary interpretation of graphene oxide as a non-uniform lattice with both ring-disordered and ring-ordered regions.

Another feature (referred to as the D' peak) observed in disordered carbons is fitted at 1620 $cm^{-1}$, where it may appear as a shoulder on the G peak. This feature is often observed to accompany the D peak in $sp^2$-hybridized carbons with a high density of edge states, and its intensity relative to the D peak has been shown to increase in proximity to lattice edges.

Another feature observed in disordered carbons, sometimes referred to as the D* peak, is a broad band fitted between 1100 $cm^{-1}$ and 1200 $cm^{-1}$. A peak intensity value at 1175 $cm^{-1}$ within this range has been attributed to the $sp^2$-$sp^3$ bonds formed between $sp^2$ and $sp^3$ atoms at the transitions between $sp^2$ and $sp^3$ networks found within soot. It has also been attributed to hexagonal diamond. The assignment of this peak to $sp^3$ carbon in nanodiamond and diamondlike materials by some researchers has been disputed by Ferrari & Robertson, who provided evidence that it should be assigned, along with a broad peak at ~1240 $cm^{-1}$, to trans-polyacetylene, a protonated aliphatic $sp^2$ chain arguably present in those carbons.

In the present disclosure, Raman spectral analysis may involve reference to unfitted or fitted spectral features. "Unfitted" spectral features pertain to spectral features apparent prior to deconvolution via profile-fitting software. Unfitted features may therefore represent a convolution of multiple underlying features, but their positions are not subjective. "Fitted" spectral features pertain to the spectral features assigned by profile-fitting software. Imperfect profile fitting indicates the potential presence of other underlying features that have not been deconvoluted.

For clarity, features pertaining to the unfitted Raman profile are labeled with a subscript "u"—e.g. the "$G_u$" band. In the present disclosure, profile fitting is performed using OMNIC Peak Resolve software to deconvolute features contributing to the overall spectral profile. These fitted features are labeled with an "f"—e.g. the "$D_f$" band. The software's Gaussian-Lorentzian lineshape setting was used by default, allowing a fitted band to adopt a Gaussian and Lorentzian character, with the fractional Gaussian character being determined by the software in order to optimize the fit. Other profile-fitting methods may change the locations, intensities, and trends of fitted peaks.

An additional unfitted feature defined within the present disclosure is the trough ("Tr"), a region of lower Raman intensity values located between the $D_u$ and $G_u$ bands in the overall spectral profile. The $Tr_u$ intensity is defined as the minimum intensity value occurring between the $D_u$ peak and the $G_u$ peak. The trough intensity value indicates underlying spectral dynamics such as red-shifting of the G band corresponding to ring disorder and lattice distortion and can be analyzed without resorting to subjective profile-fitting judgments, making it a practically useful feature.

Averaged Raman spectra, where utilized herein, represent the average of multipoint spectral measurements made of the sample over a rectangular grid. The distinct point spectra are normalized and then averaged to create a composite spectrum.

X-Ray Diffraction of the carbon powders was performed by EAG Laboratories. XRD data was collected by a coupled Theta:2-Theta scan on a Rigaku Ultima-III diffractometer equipped with copper x-ray tube with Ni beta filter, parafocusing optics, computer-controlled slits, and a D/teX Ultra 1D strip detector. Profile fitting software was used to determine the peak positions and widths.

Thermogravimetric (TGA) analysis of the carbon powders was performed on a TA Instruments Q600 TGA/DSC. Thermal oxidation studies were performed by heating the powder samples in air.

Transmission Electron Microscope (TEM) imaging was performed on an FEI Tecnai F20 operated at 200 kV. A 300 mesh Copper Grid with lacey carbon was used. All samples were prepared in ethanol and allowed to dry at room temperature.

Gas adsorption data may be collected by a Micromeritics Tristar II Plus, measuring nitrogen adsorption at 77 K between pressures of $$0.005 < \frac{p}{p^0} < 0.30,$$

with increments ranging from $$\frac{p}{p^0} = 0.009 \text{ up to } \frac{p}{p^0} = 0.05.$$

Micromeritics MicroActive software may be used to calculate the BET specific surface area, derived from the BET monolayer capacity assuming the cross-sectional area of $0.162 \text{ mm}^2$. All samples were preconditioned by degassing with continuously flowing dry nitrogen gas at 100° C. prior to analysis except samples F2 and F3 which were degassed at 200° C. prior to analysis.

The pore size distribution (PSD) and cumulative volume of pores is another technique that may be performed from gas adsorption data to lend insight into the sintering behavior of particles. The data was collected by a Micromeritics Tristar II Plus, measuring nitrogen adsorption and desorption at 77 K between pressures of $$0.009 < \frac{p}{p^0} < 0.99,$$

with increments ranging from $$\frac{p}{p^0} = 0.009 \text{ up to } \frac{p}{p^0} = 0.05.$$

samples were preconditioned by degassing with continuously flowing dry nitrogen gas at 100° C. prior to analysis.

Micromeritics MicroActive software may be used to calculate adsorption-desorption PSD and cumulative volume of pores by applying the Barrett, Joyner and Halenda (BJH) method. This method provides a comparative assessment of mesopore size distributions for gas adsorption data. For all BJH data, the Faas correction and Harkins and Jura thickness curve may be applied. The cumulative volume of pores may be measured for both adsorption and desorption portions of the isotherm.

VII. Procedures

The following discussion summarizes the procedures used to complete each study (i.e. Study A through Study G). We generally endeavor to label samples according to the Study with which they are most associated—i.e. Sample A1 is the first sample associated with Study A. Within a single experiment, multiple samples may be evaluated, and multiple procedures may have been performed to create the samples. The procedures and samples are labeled the same—e.g. "Sample B2" is made via "Procedure B2".

The present disclosure employs exemplary procedure. Other procedures, including those employing pyrolysis of alternative solid- or liquid-state carbonaceous precursor materials, the use of alternative substrates or catalysts, or other basic parameters, might be used as substitutes for those described herein without deviating from the inventive concept. In order to establish the versatility of the method, the mechanics of synthesis, and certain observable trends that might be exploited, a number of exemplary x-carbon synthesis procedures have been performed.

Procedures—Study A

Figure 8A:
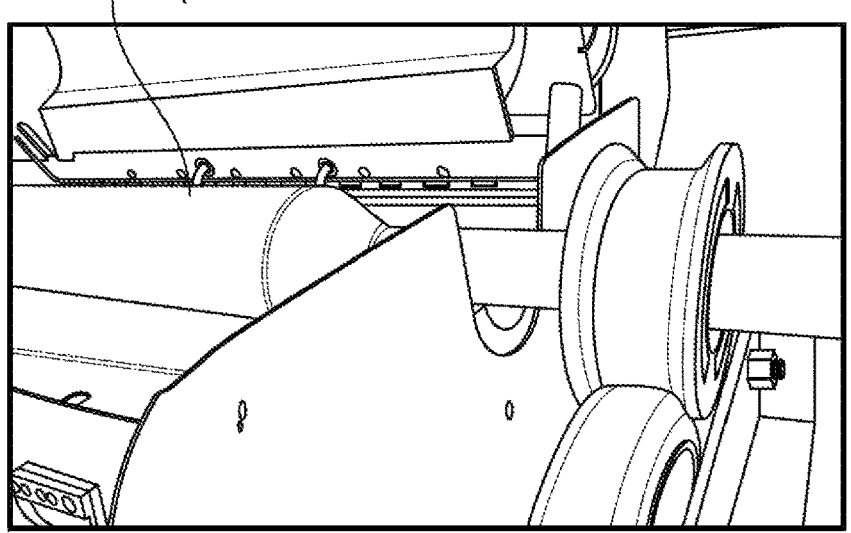
FIG. 8A includes drawings of a rotating tube furnace assembly utilized to produce materials described in the present disclosure.
Figure 8A:
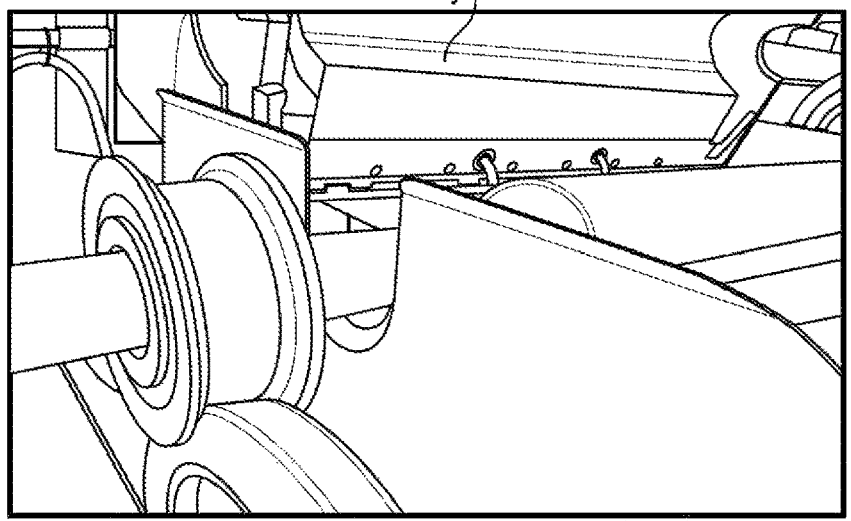
Figure 8A:
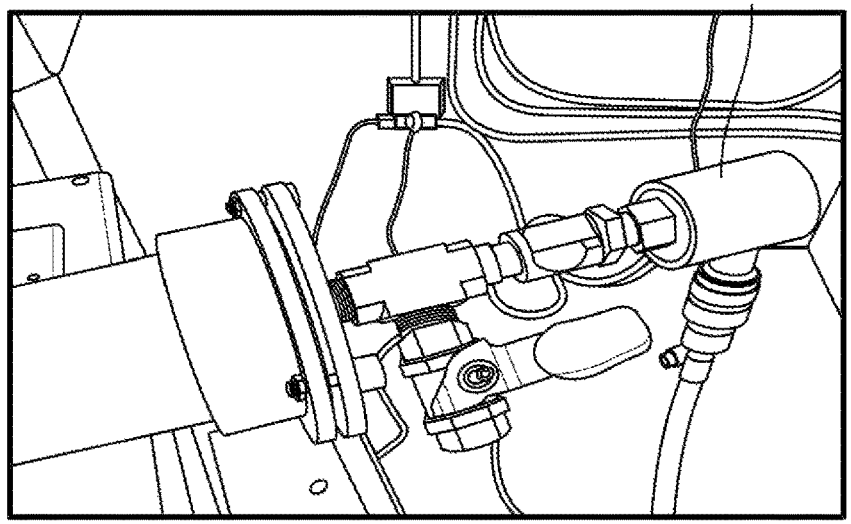

For Procedures A1, A2, and A3, a rotary tube furnace may be employed with a quartz tube. The quartz tube may be a 60 mm OD quartz tube containing a middle 12" section of 100 mm OD tube (the "belly") positioned within the furnace's heating zone as shown in FIG. 8A. Quartz baffles inside the belly may facilitate agitation of the powder. The furnace may be kept level (i.e. not tilted). Ceramic blocks may be inserted on each side of the furnace's heating zone (with the powder sample being placed between the blocks and inside the heating zone). Glass wool may be used to fix the position of the ceramic blocks. The powder sample may be placed in the tube without the use of ceramic boats. The tube may be fitted with two stainless steel flanges. Gas may be flowed in through a gas inlet on one flange and out through a gas outlet in the other flange.

For Procedures A4 and A5, a tube furnace may be employed with a quartz tube. The quartz tube may be a 60 mm OD tube. The furnace may be kept level (i.e. not tilted). Ceramic blocks may be inserted on each side of the furnace's heating zone (with the powder sample being placed between the blocks and inside the heating zone). The powder sample may be placed in open ceramic boats inside the tube. The tube may be fitted with two stainless steel flanges. Gas may be flowed in through a gas inlet on one flange and out through a gas outlet in the other flange.

Using the furnace configurations described above, five carbon samples may be synthesized utilizing the following procedures:

Procedure A1: A 500 g sample of "Elastomag 170" (a commercial magnesia powder supplied by Akrochem) magnesium oxide template precursor powder may be loaded into the quartz tube inside the tube furnace's heating zone. The rotary tube furnace may be set to a non-rotating mode. While under 500 sccm flow of argon (Ar) gas, the furnace may be heated from room temperature to a temperature setting of 1,050° C. over 50 minutes. Under sustained Ar gas flow, the furnace may then be allowed to cool to 750° C. over the next 30 minutes. During this period, the MgO template precursor morphology may be changed due to calcination into the desired template morphology. This condition may be held for an additional 30 minutes, after which a 250 sccm flow of propylene ($C_3H_6$) gas may be initiated, while holding the Ar flow unchanged, and this condition may be held for 60 minutes. The C3H6 flow may then be discontinued and the furnace allowed to cool to room temperature under sustained Ar flow. At this point, the C@MgO perimorphic composite powder as synthesized may be analyzed via Raman spectroscopy or thermogravimetric analysis (TGA). The MgO template may then be selectively extracted from the C@MgO perimorphic composite powder by acid-etching with hydrochloric acid (HCl) under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample A1."

Procedure A2: A 500 g sample of Elastomag 170 (a commercial magnesia powder supplied by Akrochem) magnesium oxide (MgO) template precursor powder may be loaded into the quartz tube inside the tube furnace's heating zone. The rotary tube furnace may be set to a non-rotating mode. While under 500 sccm flow of Ar gas, the furnace may be heated from room temperature to a temperature setting of 1,050° C. over 50 minutes, and then held at this condition for 30 minutes. During this period, the MgO template precursor morphology may be changed due to calcination into the template morphology desired. Next, a 500 sccm flow of methane ($CH_4$) gas may be initiated while holding Ar flow unchanged, and this condition may be held for 30 minutes. The $CH_4$ flow may then be discontinued and the furnace allowed to cool to room temperature under sustained Ar flow. At this point in the procedure, the C@MgO perimorphic composite powder as synthesized may be analyzed via Raman spectroscopy or thermogravimetric analysis (TGA). The MgO template may then be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample A2."

Procedure A3: An MgO powder may be generated by calcining Light Magnesium Carbonate (a commercial hydromagnesite powder supplied by Akrochem) for 2 hours at a temperature of 1,050° C. for 2 hours. A 300 g sample of the pre-calcined powder may be loaded into the quartz tube inside the tube furnace's heating zone. The rotary tube furnace may be set to rotate at 2.5 RPM. While under 500 sccm flow of Ar gas, the furnace may be heated from room temperature to a temperature setting of 650° C. over 30 minutes, and then held at this condition for 30 minutes. Next, a 270 sccm flow of C3H6 gas may be initiated while holding Ar flow unchanged, and this condition may be held for 60 minutes. The C3H6 flow may then be discontinued and the furnace allowed to cool to room temperature under sustained Ar flow. At this point in the procedure, the C@MgO perimorphic composite powder as synthesized may be analyzed via Raman spectroscopy or thermogravimetric analysis (TGA). The MgO template may then be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample A3."

Procedures—Study B

For Procedures B1-B3, an MgO powder may be generated by calcining a template precursor powder comprising rhombohedral magnesite ($MgCO_3$) crystals. The precursor powder may be calcined in a Vulcan 3-550 Muffle Furnace at a temperature of 580° C. for an hour followed by 1,050° C. for 3 hours with heating ramp rates of 5° C./min.

For Procedure B4, an MgO powder may be generated by calcining a template precursor powder comprising light magnesium carbonate crystals. The precursor powder may be calcined in a Vulcan 3-550 Muffle Furnace at a temperature of 750° C. for an hour with a heating ramp rate of 5° C./min.

For Procedures B1-B3, an MTI rotary tube furnace may be employed with a quartz tube. The quartz tube may be a 60 mm OD quartz tube containing a middle 12" section of 100 mm OD tube (the "belly") positioned within the furnace's heating zone as shown in FIG. 8A. Quartz baffles inside the belly may facilitate agitation of the powder. The furnace may be kept level (i.e. not tilted). Ceramic blocks may be inserted on each side of the furnace's heating zone (with the powder sample being placed between the blocks and inside the heating zone). Glass wool may be used to fix the position of the ceramic blocks. The powder sample may be placed in the tube without the use of ceramic boats. The tube may be fitted with two stainless steel flanges. Gas may flowed in through a gas inlet on one flange and out through a gas outlet in the other flange.

For Procedure B4, a tube furnace may be employed with a quartz tube. The quartz tube may be a 60 mm OD tube. The furnace may be kept level (i.e. not tilted). Ceramic blocks may be inserted on each side of the furnace's heating zone (with the powder sample being placed between the blocks and inside the heating zone). The powder sample may be placed in open ceramic boats inside the tube. The tube may be fitted with two stainless steel flanges. Gas may be flowed in through a gas inlet on one flange and out through a gas outlet in the other flange.

Procedure B1: The CVD procedure may be performed for 16 hours at a temperature of 640° C. under flowing gas conditions. The flowing gas may comprise 1,220 sccm $CO_2$ and 127 sccm $C_3H_6$. The quartz tube may be rotated at 1 rpm. After cooling the resulting C@MgO powder to room temperature under flowing $CO_2$, the MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample B1."

Procedure B2: The CVD procedure may be performed for 20 hours at a temperature of 580° C. under flowing gas conditions. The flowing gas may comprise 1,220 sccm $CO_2$ and 127 sccm $C_3H_6$. The quartz tube may be rotated at 1 rpm. After cooling the resulting C@MgO powder to room temperature under flowing $CO_2$, the MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample B2."

Procedure B3: The CVD procedure may be performed for 32.5 hours at a temperature of 540° C. under flowing gas conditions. The flowing gas may comprise 1,220 sccm $CO_2$ and 127 sccm $C_3H_6$. The quartz tube may be rotated at 1 rpm. After cooling the resulting C@MgO powder to room temperature under flowing $CO_2$, the MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample B3."

Procedure B4: The CVD procedure may be performed for 1 hour at a temperature of 580° C. under flowing gas conditions. The flowing gas may comprise 1,138 sccm $CO_2$ and 276 sccm $C_2H_2$. After cooling the resulting C@MgO powder to room temperature under flowing $CO_2$, the MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample B4."

Procedures—Study C

For Procedures C1 and C2, an MgO powder may be generated by treating a template precursor powder comprising sodium doped elongated nesquehonite template precursor crystals. The sodium doped nesquehonite template precursor may be precipitated from a solution stock of magnesium bicarbonate solution. First, in a 57 liter pressure vessel a mixture of concentration 0.62 mol $kg^{-1}$ Mg comprised of magnesium hydroxide (Akrochem Versamag) and deionized water may be prepared. This mixture may be recirculated while carbonated with $CO_2$ up to 60 psig to form a solution stock of magnesium bicarbonate ($Mg(HCO_3)_2$). After approximately 22 hours, the solution may be filtered to remove undissolved solids. The resulting solution stock may have a concentration of 0.29 mol $kg^{-1}$ Mg. Then, sodium bicarbonate ($NaHCO_3$) may be added to the solution stock to bring the concentration of sodium in the system to $1.7 \cdot 10^{-3}$ mol $kg^{-1}$ Na. Additional $CO_2$ may be added to the vessel for 20 minutes to digest any unwanted precipitant. The system may be heated up to 34° C. and depressurized to allow for crystallization over 25.5 hours. The mixture generated from crystallization of sodium doped elongated nesquehonite template precursor crystals may then be filtered, rinsed with deionized water and acetone, and dried in a 45° C. in a forced air recirculation oven. The template precursor may be used as is in the CVD Replication step and conversion to MgO occurs in-situ during the heating ramp stage.

For Procedures C1 and C2, a tube furnace may be employed with a quartz tube. The quartz tube may be a 60 mm OD tube. The furnace may be kept level (i.e. not tilted). Ceramic blocks may be inserted on each side of the furnace's heating zone (with the powder sample being placed between the blocks and inside the heating zone). The powder sample may be placed in open ceramic boats inside the tube. The tube may be fitted with two stainless steel flanges. Gas may be flowed in through a gas inlet on one flange and out through a gas outlet in the other flange.

Procedure C1

A 1.6 g sample of sodium doped elongated nesquehonite template precursor may be loaded into the quartz tube inside a tube furnace's heating zone. While under 1271 sccm flow of Ar gas, the furnace may be heated from room temperature to a temperature setting of 460° C. over 20 minutes, and then held at this condition for 15 minutes to equilibrate. Next, a 42 sccm flow of $C_2H_2$ gas may be initiated while holding Ar flow unchanged, and this condition may be held for 3 hours. The $C_2H_2$ flow may then be discontinued and the furnace allowed to cool to room temperature under sustained Ar flow with the resulting C@MgO powder may be collected. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample C1."

Procedure C2

A 1.9 g sample of sodium doped elongated nesquehonite template precursor may be loaded into the quartz tube inside a tube furnace's heating zone. While under 1,271 sccm flow of Ar gas, the furnace may be heated from room temperature to a temperature setting of 400° C. over 20 minutes, and then held at this condition for 15 minutes to equilibrate. Next, a 105 sccm flow of $C_2H_2$ gas may be initiated while holding Ar flow unchanged, and this condition may be held for 3 hours. The $C_2H_2$ flow may then be discontinued and the furnace allowed to cool to room temperature under sustained Ar flow with the resulting C@MgO powder may be collected. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample C2."

Procedures—Study D

For Procedures D1 and D2, an MgO powder may be generated by calcining a template precursor powder comprising light magnesium carbonate crystals. The precursor powder may be calcined in a Vulcan 3-550 Muffle Furnace at a temperature of 750° C. for an hour with a heating ramp rate of 5° C./min.

For Procedures D1 and D2, a tube furnace may be employed with a quartz tube. The quartz tube may be a 60 mm OD tube. The furnace may be kept level (i.e. not tilted). Ceramic blocks may be inserted on each side of the furnace's heating zone (with the powder sample being placed between the blocks and inside the heating zone). The powder sample may be placed in open ceramic boats inside the tube. The tube may be fitted with two stainless steel flanges. Gas may be flowed in through a gas inlet on one flange and out through a gas outlet in the other flange.

Procedure D1

A 0.9 g sample of a magnesium oxide template precursor may be loaded into the quartz tube inside a tube furnace's heating zone. While under 1,271 sccm flow of Ar gas, the furnace may be heated from room temperature to a temperature setting of 700° C. over 30 minutes, and then held at this condition for 15 minutes to equilibrate. Next, a 20 sccm flow of C3H6 gas may be initiated while holding Ar flow unchanged, and this condition may be held for 30 minutes. The C3H6 flow may then be discontinued and the furnace allowed to cool to room temperature under sustained Ar flow with the resulting C@MgO powder may be collected. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample D1."

Procedure D2

A 0.9 g sample of a magnesium oxide template precursor may be loaded into the quartz tube inside a tube furnace's heating zone. While under 1,271 sccm flow of argon (Ar) gas, the furnace may be heated from room temperature to a temperature setting of 700° C. over 30 minutes, and then held at this condition for 15 minutes to equilibrate. Next, a combination of 20 sccm flow of propylene ($C_3H_6$) gas along with 60 sccm of hydrogen ($H_2$) gas may be initiated while holding Ar flow unchanged, and this condition may be held for 30 minutes. The $C_3H_6$ flow may then be discontinued and the furnace allowed to cool to 150° C. under sustained Ar and $H_2$ flow. The $H_2$ flow may be discontinued below 150° C. and the furnace was allowed to cool to room temperature and the resulting C@MgO powder may be collected. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample D2."

Procedures—Study E

Figure 8B:
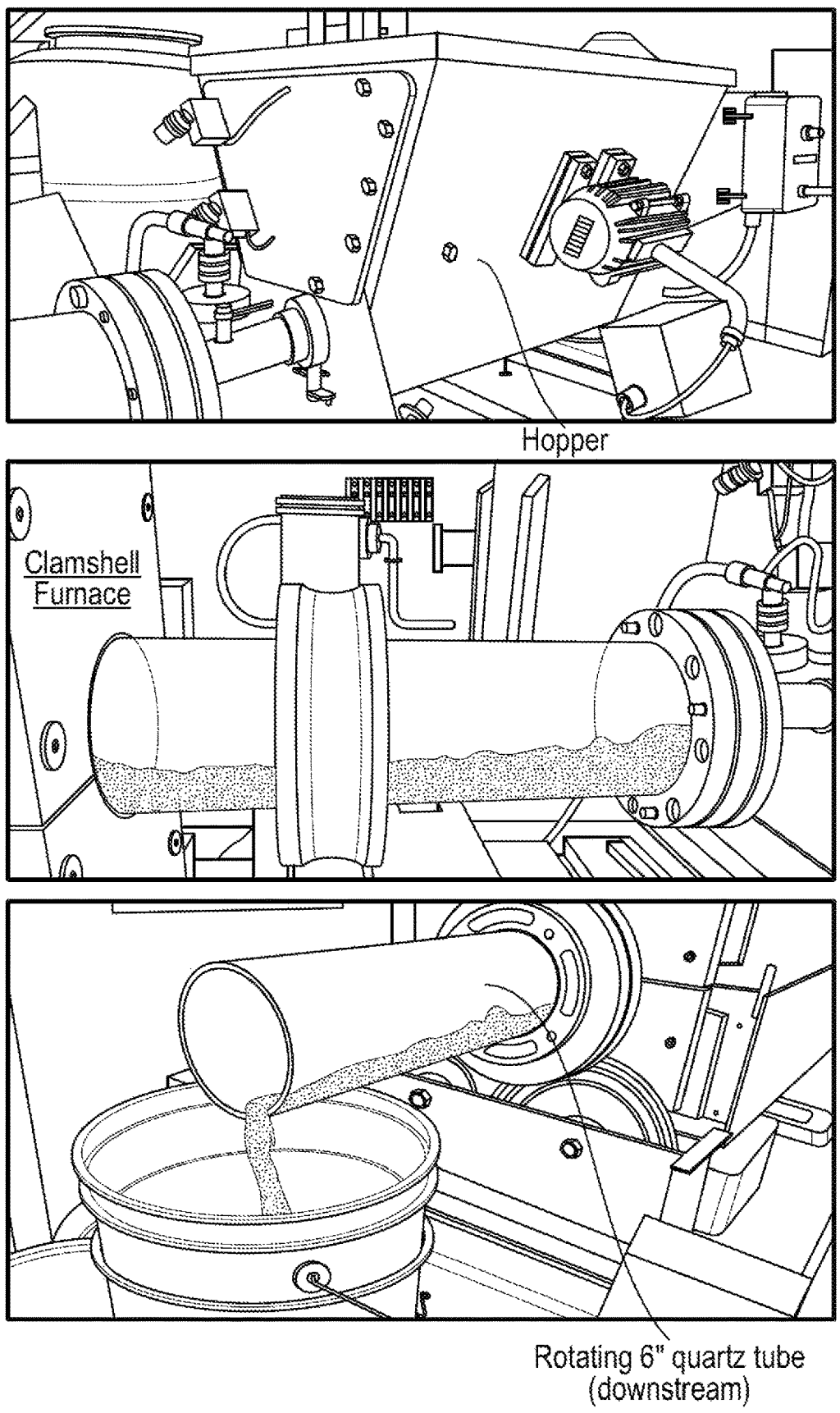
FIG. 8B includes drawings of another rotating tube furnace assembly utilized to produce materials described in the present disclosure.

For Procedures E1 and E2 an MgO powder may be generated by calcining Light Magnesium Carbonate (a commercial hydromagnesite powder supplied by Akrochem) in a rotating kiln in 2 stages in an air atmosphere as shown in FIG. 8B. The first stage of thermal treatment may be performed at 400° C. for a powder residence time of 9 minutes followed by a second stage thermal treatment at 750° C. at a powder residence time of 3 minutes.

For Procedures E1A and E2A a tube furnace may be employed with a quartz tube. An MTI rotary tube furnace with a 60 mm OD quartz tube may be employed for CVD. The furnace may be kept level (i.e. not tilted). Ceramic blocks may be inserted on each side of the furnace's heating zone (with the powder sample being placed between the blocks and inside the heating zone). Glass wool may be used to fix the position of the ceramic blocks. The tube may be fitted with two stainless steel flanges. Gas may be flowed in through a gas inlet on one flange and out through a gas outlet in the other flange. Powder samples may be placed in ceramic boats, and the boats may be placed in the heating zone prior to initiating the procedure. For Procedures E2 and E4 a similar setup may be employed with minor modifications to allow rapid heating and/or cooling of the samples. These modifications will be described in their respective exemplary procedures.

Procedure E1: A 50 mm OD quartz tube, serving as a boat, containing 62 grams of this pre-calcined MgO powder may be loaded into the tube. After initiating a 2,000 sccm flow of Ar gas, the furnace may be heated from room temperature to a temperature setting of 700° C. over 20 minutes and held at this condition for 15 minutes. Next, a 1,274 sccm flow of $C_3H_6$ gas may be initiated while maintaining Ar flow, and this condition may be held for 30 minutes. The $C_3H_6$ flow may then be discontinued and the furnace allowed to cool to room temperature under sustained Ar flow. The C@MgO perimorphic composite powder may be collected.

The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample E1."

Procedure E1A: This procedure involves rapidly heating and cooling a perimorphic composite material from room temperature to the desired temperature setting. In a ceramic boat, a 3.0 g quantity of the perimorphic composite powder described in Procedure E1 may be loaded and placed in a quartz tube outside the heated zone of the furnace. After initiating a 4,000 sccm flow of Ar gas, the furnace may be heated from room temperature to a temperature setting of 900° C. over 45 minutes and held at this condition for 15 minutes. Until the temperature setting has been achieved the sample may be kept outside the heat zone. Once the desired temperature has been attained the boat is pushed in with the introduction of minimal additional air and left in the heat zone for 30 minutes followed by moving it back outside the heat zone in the quartz tube. This may serve to expose the sample to the desired temperature only for a short period of time. The furnace may be allowed to cool to room temperature under sustained Ar flow. The C@MgO perimorphic composite powder may be collected at room temperature.

The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample E1A."

Procedure E2: A 50 mm OD quartz tube, serving as a boat, containing 74 grams of this pre-calcined MgO powder may be loaded into the tube. After initiating a 2,000 sccm flow of Ar gas, the furnace may be heated from room temperature to a temperature setting of 580° C. over 20 minutes and held at this condition for 15 minutes. Next, a 1,274 sccm flow of $C_3H_6$ gas may be initiated while maintaining Ar flow, and this condition may be held for 3 hours. The $C_3H_6$ flow may then be discontinued and the furnace allowed to cool to room temperature under sustained Ar flow. The C@MgO perimorphic composite powder may be collected.

The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample E2."

Procedure E2A: This procedure involves gradually heating and rapidly cooling a perimorphic composite material from room temperature to the desired temperature setting and back to room temperature again. In a ceramic boat, a 3.0 g quantity of the perimorphic composite powder described in Procedure E3 may be loaded and placed in a quartz tube in the heated zone of the furnace. After initiating a 4,000 sccm flow of Ar gas, the furnace may be heated from room temperature to a temperature setting of 1,050° C. over 50 minutes and held at this condition for 15 minutes. The furnace may be held at this temperature for an hour. The furnace may then be allowed to start to cool under sustained Ar flow and the ceramic boat may be pulled out of the heat zone as soon as the heaters power off. The C@MgO perimorphic composite powder post may be collected once at room temperature.

The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, and dried to form a carbon powder. A carbon powder made via such a procedure is herein referred to as "Sample E2A."

Procedures—Study F

For Procedures F1, an MgO powder may be generated by calcining a template precursor powder comprising light magnesium carbonate crystals. The precursor powder may be calcined in a Vulcan 3-550 Muffle Furnace at a temperature of 750° C. for an hour with a heating ramp rate of 5° C./min.

For Procedure F1, a Thermcraft tube furnace modified to be a rotary furnace may be employed with a quartz tube. The quartz tube may be a 60 mm OD quartz tube containing an expanded middle 577 mm section of 130 mm OD tube (the "belly") positioned within the furnace's heating zone. Quartz baffles inside the belly may facilitate agitation of the powder. The furnace may be kept level (i.e. not tilted). The template sample may be placed inside the belly in the heating zone, with ceramic blocks inserted outside the belly on each side of the furnace's heating zone. Glass wool may be used to fix the position of the ceramic blocks. The template sample may be placed in the tube without the use of ceramic boats such that it allowed to rotate freely within the belly. The tube may be fitted with two stainless steel flanges. Gas may be flowed in through a gas inlet on one flange and out through a gas outlet in the other flange.

For Procedures F2, F3, F4, F5, F6 and F7 a tube furnace may be employed with a quartz tube. An MTI rotary tube furnace with a 60 mm OD quartz tube may be employed for CVD. The furnace may be kept level (i.e. not tilted). Ceramic blocks may be inserted on each side of the furnace's heating zone (with the powder sample being placed between the blocks and inside the heating zone). Glass wool may be used to fix the position of the ceramic blocks. The tube may be fitted with two stainless steel flanges. Gas may be flowed in through a gas inlet on one flange and out through a gas outlet in the other flange. Powder samples may be placed in ceramic boats, and the boats may be placed in the heating zone prior to initiating the procedure.

Procedure F1 and F2: A 150 g quantity of a magnesium oxide template powder maybe loaded into the belly of the quartz tube. After initiating a 1,379 sccm flow of $CO_2$ gas and a tube rotation speed of 1 RPM, the furnace may be heated from room temperature to a temperature setting of 580° C. at a ramp-rate of 20° C./min and held at this condition for 15 minutes. Next, a 276 sccm flow of $C_2H_2$ gas may be initiated while maintaining $CO_2$ flow, and this condition may be held for 180 minutes. The $C_2H_2$ flow may then be discontinued and the furnace allowed to cool to room temperature under sustained $CO_2$ flow. The powder may be collected. The C@MgO perimorphic composite powder may be further processed to create a carbon powder. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times, further rinsed with ethanol three times and dried to obtain a carbon powder herein referred to as "Sample F1".

A 50 mg quantity of the Sample F1 carbon powder may be compacted in a 7 mm die set (Pike Technologies 161-1010) under 105 ksi hydraulic pressure. Under pressure the carbon may form a pellet herein referred to as "Sample F2" that may be stable enough to handle.

Procedure F3: Sample F2 may be placed in a ceramic boat and loaded into the quartz tube of a furnace. After initiating a 4,000 sccm flow of Ar gas, the furnace may be heated from room temperature to a temperature setting of 1,050° C. over 50 minutes and held at this condition for 30 minutes. The furnace may then be allowed to cool to room temperature under sustained Ar flow. The pellet may be collected once at room temperature and is herein referred to as "Sample F3".

Procedure F4: A 100 mg quantity of Sample F1 powder may be placed in a ceramic boat and loaded into the quartz tube of a furnace. After initiating a 4,000 sccm flow of Ar gas, the furnace may be heated from room temperature to a temperature setting of 1050° C. over 50 minutes and held at this condition for 30 minutes. The furnace may then be allowed to cool to room temperature under sustained Ar flow. The powder may be collected once at room temperature.

A 50 mg quantity of this powder may then be compacted in a 7 mm die set (Pike Technologies 161-1010) under 105 ksi hydraulic pressure. Under pressure the perimorphic carbon frameworks do not form a pellet and remain a powder, herein referred to as Sample F4.

Procedure F5: A potassium carbonate ($K_2CO_3$) template precursor may be spray dried using an Sinoped LPG-5 spray dryer. A room temperature solution composed of 250.35 g of $K_2CO_3$ and 1,667.2 g of deionized water (DI) was pumped at a rate of 23 mL/min into a rotary atomizer set to 24,000 RPM. The inlet temperature of the spray dryer was set to 195° C., which produced an outlet temperature of 139° C. The powder collected after spray drying was a $K_2CO_3$ template precursor.

A 100 g quantity of this $K_2CO_3$ template precursor powder may be loaded into a ceramic boat and placed in a quartz tube to generate a perimorphic composite powder using an MTI tube furnace. After initiating a 1,220 sccm flow of $CO_2$ gas, the furnace may be heated from room temperature to a temperature setting of 640° C. at a ramp-rate of 20° C./min and held at this condition for 15 minutes. Next, a 162 sccm flow of $C_3H_6$ gas may be initiated while maintaining $CO_2$ flow, and this condition may be held for 2 minutes. The $C_3H_6$ flow may then be discontinued and the furnace allowed to purge with Ar at a flow rate of 2,000 sccm for 30 minutes to clear all the $CO_2$ present in the tube. The furnace may then be cooled to room temperature under sustained Ar flow. The powder may be collected. The C@$K_2CO_3$ perimorphic composite powder may be further processed to create a carbon powder. The $K_2CO_3$ template may be selectively extracted from the C@$K_2CO_3$ perimorphic composite powder by acid-etching with HCl under magnetic stirring conditions, resulting in a mixture of carbon in an aqueous $KCl_2$ solution. The carbon may then be filtered from the solution, rinsed with deionized water three times to obtain an aqueous paste. This paste may be rinsed three times with ethanol to obtain an ethanol paste.

An ethanol paste of this carbon may be diluted with additional ethanol to create a very dilute mixture of 0.003 wt % carbon. This mixture may then be agitated with a high shear rotor stator homogenization processor, IKA T-25 digital Ultra-Turrax (UT), run at 12,000 RPM for 5 minutes. The mixture after agitation may be immediately poured over a glass frit vacuum filtration setup having a 47 mm diameter nylon filter (0.45 µm pore size) as the filtration medium. The vacuum filtration may be allowed to proceed undisturbed until all the liquid has been drained out. The vacuum is turned off and the filter with carbon may be dried in air in the vacuum filtration setup itself. Once dry, a flexible vdW assembly may release itself from the filter. This vdW assembly is herein referred to as "Sample F5".

Procedure F6: Sample F5 may be placed in a ceramic boat and loaded into the quartz tube of a furnace. After initiating a 4,000 sccm flow of Ar gas, the furnace may be heated from room temperature to a temperature setting of 1,050° C. over 50 minutes and held at this condition for 30 minutes. The furnace may then be allowed to cool to room temperature under sustained Ar flow. The assembly may be collected once at room temperature and is herein referred to as "Sample F6".

Procedure F7: Nesquehonite ($MgCO_3 \cdot 3H_2O$) may be precipitated from lansfordite ($MgCO_3 \cdot 5H_2O$) to produce elongated particles. A 45 g/L MgO equivalent magnesium bicarbonate ($Mg(HCO3)_2$) solution may be prepared by high pressure dissolution of magnesium hydroxide (Akrochem Versamag) in carbonic acid at 720 psig. Lansfordite may be precipitated from this magnesium bicarbonate solution in a continuously stirred tank reactor (CSTR). The solution may be chilled to ~14° C. and depressurized from 720 psig to 0 psig over 5 minutes while agitated at ~700 RPM with a down pumping marine style impeller. Air may be continuously purged through the headspace at 4 $SCFM_{air}$ while chilled to ~12° C. for 8 hrs. The solution may be allowed to stir at ~350 RPM for an additional 18.5 hrs. The CSTR may then be heated to 34.5° C. while stirred at ~720 RPM for 82 minutes. The solution may then be diluted with approximately 5 L of deionized water while continued heating to 43.8° C. for an additional 61 minutes. The contents of the CSTR may then by removed, filtered, and dried in a forced air circulation oven at 40° C. The resulting powder, identified herein as $N_2$, are acicular crystals of nesquehonite.

An MgO powder may be generated by calcining $N_2$ at 640° C. for 2 hours in an $N_2$ gas flow of 2,000 sccm with a heating ramp-rate of 5° C./min in an MTI tube furnace with a 60 mm dia. quartz tube. A 2.4 g quantity of this MgO powder maybe loaded into a ceramic boat and placed in the quartz tube to generate C@MgO using an MTI tube furnace. After initiating a 815 sccm flow of $CO_2$ gas, the furnace may be heated from room temperature to a temperature setting of 540° C. at a ramp-rate of 5° C./min and held at this condition for 15 minutes. Next, a 812 sccm flow of $C_2H_2$ gas may be initiated while maintaining $CO_2$ flow, and this condition may be held for 2 minutes. The $C_2H_2$ flow may then be discontinued and the furnace allowed to purge with Ar at a flow rate of 1,698 sccm for 30 minutes to clear all the $CO_2$ present in the tube. The furnace may then be heated to 900° C. at a ramp-rate of 20° C./min and held at this condition for 30 minutes. The furnace may then be cooled to room temperature under sustained Ar flow. The powder may be collected. The C@MgO perimorphic composite powder may be further processed to create a carbon powder. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times to obtain an aqueous paste. This paste may be rinsed three times with ethanol to obtain an ethanol paste.

An ethanol paste of this carbon may be diluted with additional ethanol to create a very dilute mixture of 0.003 wt % carbon. This mixture may then be agitated with a high shear rotor stator homogenization processor, IKA T-25 digital Ultra-Turrax (UT), run at 12,000 RPM for 5 minutes. The mixture after agitation may be immediately poured over a glass frit vacuum filtration setup having a 47 mm diameter nylon filter (0.45 μm pore size) as the filtration medium. The vacuum filtration may be allowed to proceed undisturbed until all the liquid has been drained out. The vacuum is turned off and the filter with carbon may be dried in air in the vacuum filtration setup itself. Once dry, a cohesive flexible buckypaper may release itself from the filter, herein referred to as "Sample F7."

Procedures—Study G

Procedure G1: Magnesite ($MgCO_3$) particles may be crystallized from a solution of magnesium bicarbonate to yield a powder of equiaxed template precursor particles.

An MTI rotary tube furnace may be employed with a quartz tube. The quartz tube may be a 60 mm OD quartz tube containing a middle 12" section of 100 mm OD tube positioned within the furnace's heating zone as shown in FIG. 8A. Quartz baffles inside the belly may facilitate agitation of the powder. The furnace may be kept level (i.e. not tilted). Ceramic blocks may be inserted on each side of the furnace's heating zone (with the powder sample being placed between the blocks and inside the heating zone). Glass wool may be used to fix the position of the ceramic blocks. The tube may be fitted with two stainless steel flanges. Gas may be flowed in through a gas inlet on one flange and out through a gas outlet in the other flange.

A 177 g quantity of the precipitated magnesite powder may be calcined to MgO at 640° C. for 10 min under Ar flow of 5 ft³/hr with heating ramp-rate of 20° C./min. The MgO powder already present in the quartz tube may be used to generate C@MgO using the furnace described. After initiating a 1,918 sccm flow of $CO_2$ gas and a tube rotation speed of 1 RPM, the furnace may be heated from room temperature to a temperature setting of 640° C. at a ramp-rate of 20° C./min and held at this condition for 15 minutes. Next, a 127 sccm flow of $C_3H_6$ gas may be initiated while maintaining $CO_2$ flow, and this condition may be held for 360 minutes. The $C_3H_6$ flow may then be discontinued and the furnace allowed to cool to room temperature under sustained $CO_2$ flow.

The C@MgO perimorphic composite powder may be placed back in the tube in the same identical furnace/tube configuration for a second growth cycle. After initiating a 1,918 sccm flow of $CO_2$ gas and a tube rotation speed of 1 RPM, the furnace may be heated from room temperature to a temperature setting of 640° C. at a ramp-rate of 20° C./min and held at this condition for 15 minutes. Next, a 127 sccm flow of $C_3H_6$ gas may be initiated while maintaining $CO_2$ flow, and this condition may be held for 120 minutes. The $C_3H_6$ flow may then be discontinued and the furnace allowed to cool to room temperature under sustained $CO_2$ flow.

The C@MgO perimorphic composite powder may be placed back in the tube in the same identical furnace/tube configuration for a third growth cycle. After initiating a 1,918 sccm flow of $CO_2$ gas and a tube rotation speed of 1 RPM, the furnace may be heated from room temperature to a temperature setting of 640° C. at a ramp-rate of 20° C./min and held at this condition for 15 minutes. Next, a 127 sccm flow of $C_3H_6$ gas may be initiated while maintaining $CO_2$ flow, and this condition may be held for 180 minutes. The $C_3H_6$ flow may then be discontinued and the furnace allowed to cool to room temperature under sustained $CO_2$ flow.

The powder may be collected. The C@MgO perimorphic composite powder may be further processed to create a carbon powder. The MgO template may be selectively extracted from the C@MgO perimorphic composite powder by acid-etching with HCl under magnetic stirring conditions, resulting in a mixture of carbon in an aqueous $MgCl_2$ solution. The carbon may then be filtered from the solution, rinsed with deionized water three times followed by a triple rinse with ethanol to obtain an ethanol paste. This paste may be dried to form a carbon powder.

This carbon powder may then be utilized for further CVD growth. An MTI rotary tube furnace may be employed with a quartz tube. The quartz tube may be a 60 mm OD quartz tube containing a middle 12" section of 100 mm OD tube positioned within the furnace's heating zone. Quartz baffles inside the belly may facilitate agitation of the carbon powder. The furnace may be kept level (i.e. not tilted). Ceramic blocks may be inserted on each side of the furnace's heating zone (with the powder sample being placed between the blocks and inside the heating zone). Glass wool may be used to fix the position of the ceramic blocks. The tube may be fitted with two stainless steel flanges. Gas may be flowed in through a gas inlet on one flange and out through a gas outlet in the other flange. This assembly is shown in FIG. 8A.

After initiating a 1,918 sccm flow of $CO_2$ gas and a tube rotation speed of 1 RPM, the furnace may be heated from room temperature to a temperature setting of 640° C. at a ramp-rate of 20° C./min and held at this condition for 15 minutes. Next, a 127 sccm flow of $C_3H_6$ gas may be initiated while maintaining $CO_2$ flow, and this condition may be held for 180 minutes. The $C_3H_6$ flow may then be discontinued and the furnace allowed to cool to room temperature under sustained $CO_2$ flow. The final mass of carbon powder collected, net of losses from migration into the glass wool, may be approximately 43.2 g. The carbon powder made via this procedure is herein referred to as "Sample G1."

Procedures—Study H

Procedure H: An aqueous $Mg(HCO_3)_2$ solution may be produced by mixing 16 kg deionized water and 1.39 kg of a commercial-grade MgO powder (Versamag) in a pressure vessel equipped with an overhead stirring system and gas-inducing impeller. The mixture may be mixed at 700 RPM and cooled to 5° C. while being fed $CO_2$ gas up to 850 psi for 2 hours. The resulting solution may be withdrawn from the pressure vessel at atmospheric pressure and fed at a rate of 56 mL/min into a BETE XA air atomizing nozzle comprising an FC7 Fluid Cap and AC1802 Air Cap. Compressed air for droplet atomization may be delivered into the nozzle at a flow rate of 5 SCFH air at 54 psi. The inlet temperature of the spray dryer may be set to 200° C., producing an outlet temperature ranging between 108° C. and 109° C. The ambient conditions during the spray drying process may be 28.4° C. and 48% RH. Approximately 1400 mL of solution may be sprayed, and 208 g of spray-dried, hydrous magnesium carbonate $(Mg(CO_3) \cdot xH_2O)$ template precursor powder with a hollow-spherical morphology may be collected via a cyclonic separator.

Next, the template precursor powder may be converted into a template via thermal treatment using a muffle furnace (Vulcan 3-550 Model, 1440 W max). Approximately 10 g of the template precursor powder may be placed in ceramic boats and heated to 580° C., then held at this temperature for 13.5 hours, followed by heating to 1050° C. and holding for another 1 hour to yield approximately 3.9 g of MgO powder. The heating ramp rates for both steps may be 5° C./min and the cool-down was allowed to happen naturally overnight over 8 hours. Approximately 0.47 g of the MgO powder may be pelletized in a 15.7 mm ID hydraulic press by applying 7.8 ksi of uniaxial compression for 1 minute. The resulting disc-shaped template may have a diameter of 15.7 mm and thickness of 2.5 mm.

Next, a Thermcraft tube furnace with a 60 mm OD quartz tube may be employed in a template-directed CVD procedure. The furnace may be kept level (i.e. not tilted), with the 0.47 g pelletized template sample being placed in a ceramic boat in the heating zone prior to initiating the procedure. Ceramic blocks may be inserted outside each side of the furnace's heating zone, and glass wool may be used to fix the position of the ceramic blocks. The tube may be fitted with two stainless steel flanges. Gas may be flowed in through a gas inlet on one flange and out through a gas outlet in the other flange. After initiating a 815 sccm flow of $CO_2$ gas, the furnace may be heated from room temperature to a temperature setting of 540° C. at a ramp-rate of 20° C./min and held at this condition for 5 minutes. Next, a 144 sccm flow of $C_2H_2$ gas may be initiated while maintaining $CO_2$ flow, and this condition may be held for 90 minutes. The $C_2H_2$ flow may then be discontinued, and the furnace allowed to cool to room temperature under sustained $CO_2$ flow. During cooling, the clam-shell furnace lid may be opened completely, exposing the quartz tube to the outside air. A perimorphic composite pellet obtained after cooling may be characterized. Finally, the same CVD growth procedure may be repeated twice more, with the pellet being again cooled, for a total of 3 CVD growth steps with the pellet being allowed to cool between each step. The resulting perimorphic composite pellet comprises a macroscopic, perimorphic carbon that may be tested for ambient superconductivity.

A vacuum chamber like the one associated with the Cober-Muegge microwave system utilized in Study G (FIG. 8C) may be utilized, but without any microwave irradiation. The vacuum chamber may be equipped with a 4-point probe (Lucas/SignatoneSP4-40045TFJ) for measuring sheet resistance without lead and contact resistance. The probe specifications may be 40 mil spacing between the Tungsten Carbide tips, a 5 mil tip radius, and a 45 gram spring pressure. The 4-point probe may be placed inside the vacuum chamber and wired to a Keithley Series 2400 Sourcemeter located outside the vacuum chamber. The Keithley Sourcemeter may be set to 4 wire mode with the auto-ohms method selected and operates as a conventional constant-current source ohmmeter with a starting current of 10 mA. The auto-range function was selected and the current stepped up to 100 mA if the measured resistance dropped below 20 Ohms/sq. The chamber pressure may be measured concurrently with the sheet resistance of the sample using a convection-enhanced Pirani vacuum gauge module (CVM201 Super Bee) capable of reading down to 0.1 mTorr with an accuracy of 0.1 mTorr resolution and a repeatability of 2% of the reading. Lastly, the chamber may be equipped with a vacuum pump. This setup should enable the vacuum chamber to be pumped down while the chamber pressure and sheet resistance are read concurrently.

The points of the 4-point probe may be placed into static contact with the flat surface of the macroform as lightly and delicately as possible to obtain a steady, continuous sheet resistance reading. This delicate placement should be done to avoid compressing the macroform surface with the probe tips, which may be necessary due to the apparent pressure-sensitivity of the $sp^x$ macroforms we tested. We theorize that this pressure-sensitivity is attributable to localized mechanical compression reducing the interlayer distance and thereby inducing interlayer electronic coupling near the voltage-sensing points of contact. Additionally, a soft, non-conductive backing underneath the carbon macroform may be utilized in order to minimize local compression. To make contact, the Sourcemeter may be turned on to get an initial reading at ambient conditions, and the chamber may then be closed and evacuated. During the evacuation of the chamber, readings of the chamber pressure and the sample's sheet resistance may be noted.

VIII. Study A—Analysis

Figure 9:
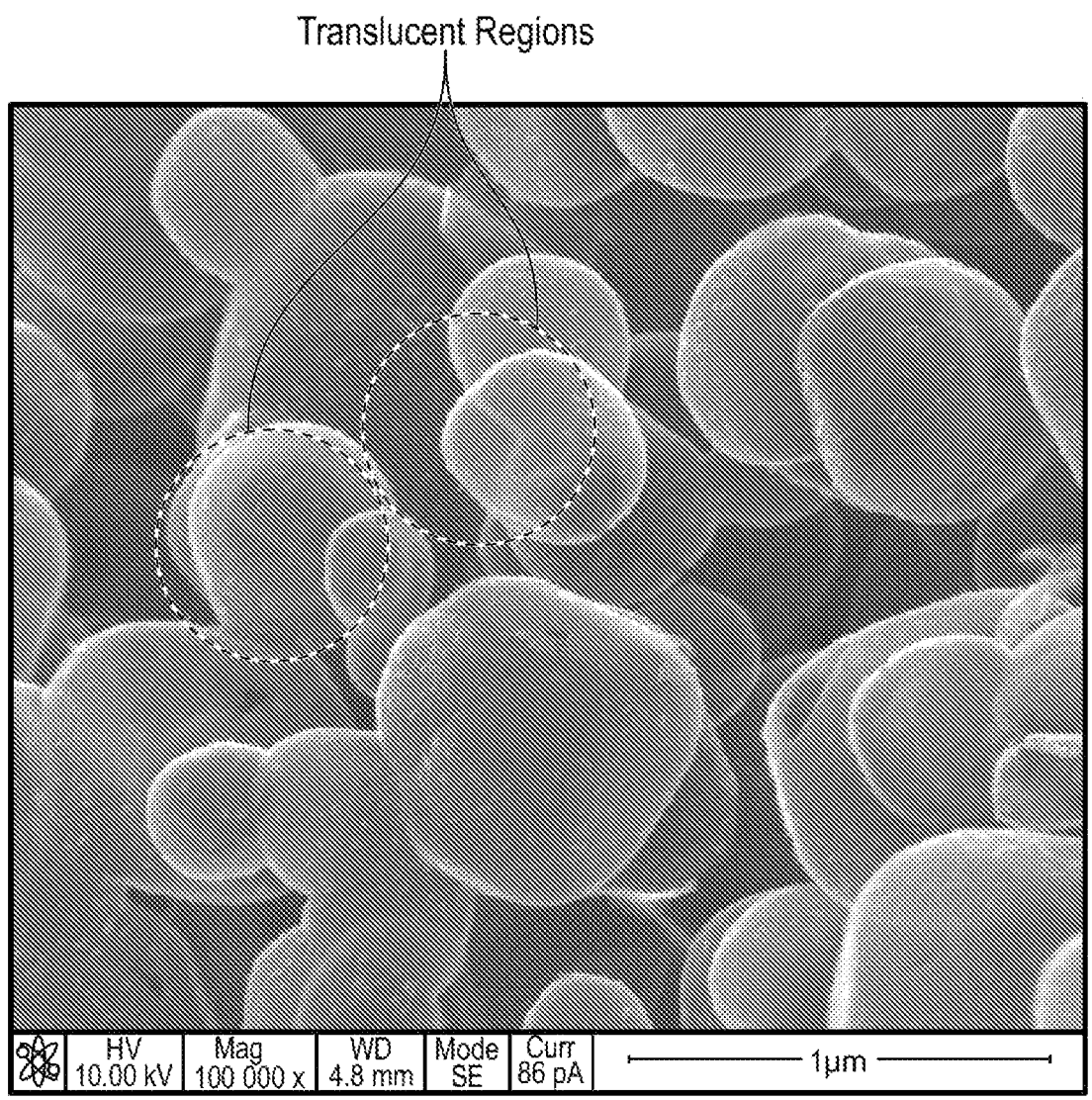
FIG. 9 is an SEM micrograph of the perimorphic frameworks of Sample A1. Translucent regions of the perimorphic wall are indicated.
Figure 20:
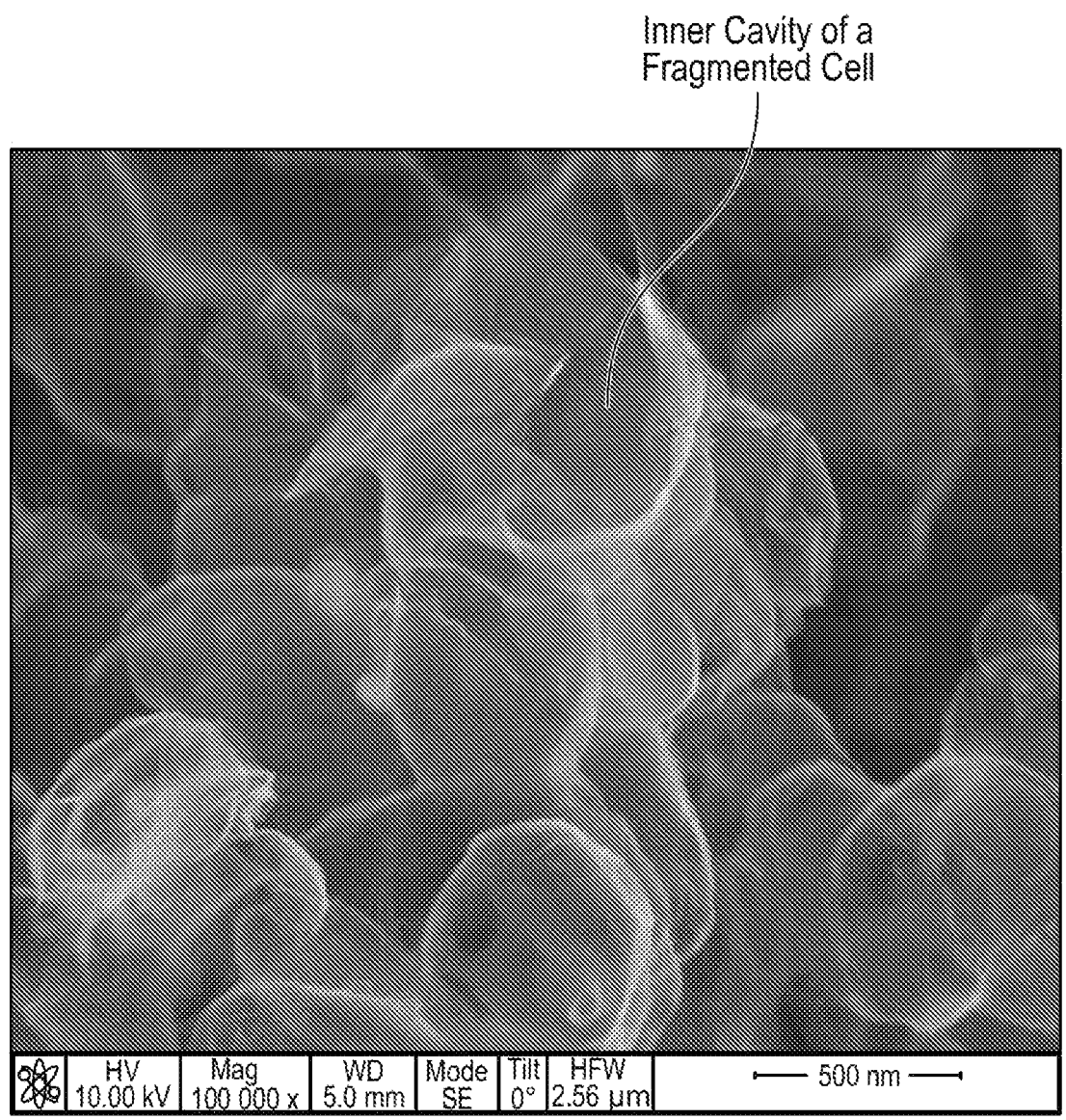
FIG. 20 is an SEM micrograph of Sample A2 showing perimorphic frameworks that appear to be fragmented and damaged during processing.
Figure 21A:
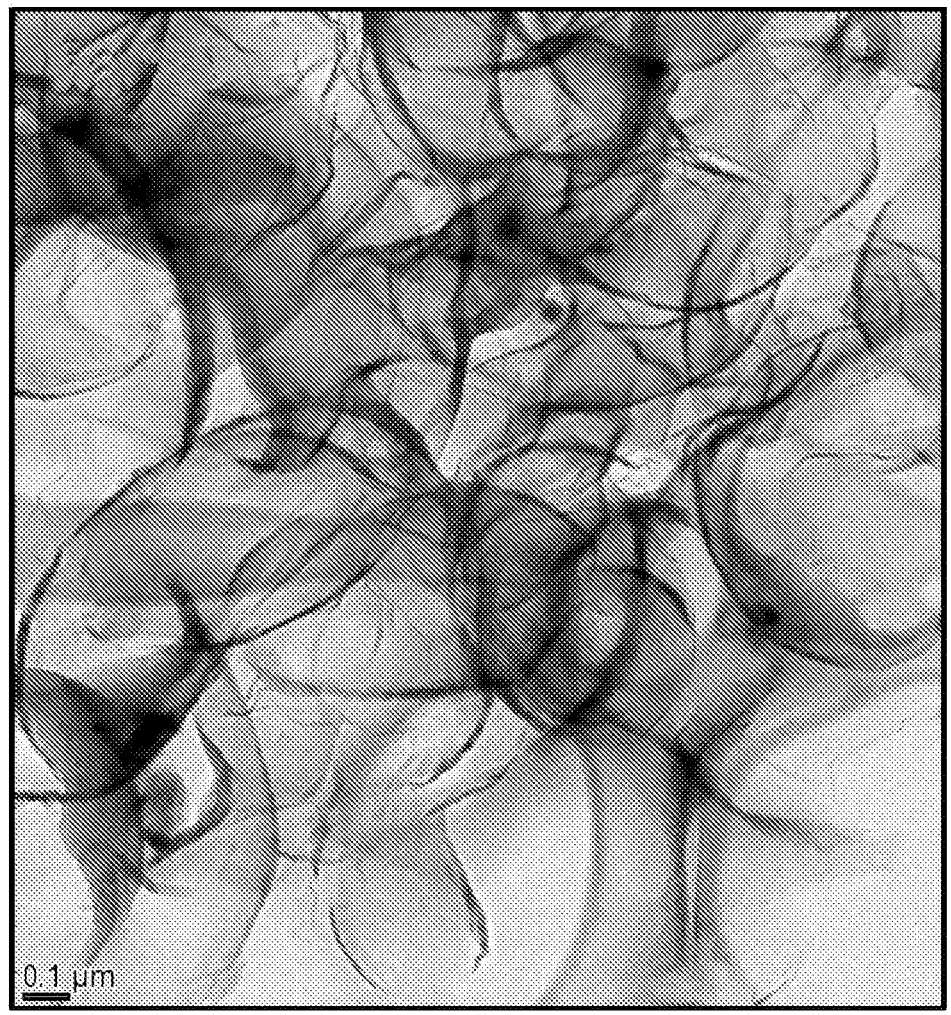
FIG. 21A is a TEM micrograph of Sample A2 showing fragments of perimorphic frameworks.

SEM images of Sample A1 confirms the presence of perimorphic frameworks. FIG. 9 is an SEM micrograph of Sample A1 after removal of the endomorphic phase of the perimorphic composite powder. It is unclear if there is one or more distinct perimorphic frameworks in this SEM micrograph. The morphology appears to consist of conjoined, macroporous subunits. This mirrors the template, which was a partially sintered powder. Unlike the frameworks that will be studied in Sample A2, which appeared fragmented and deformed (as shown in FIGS. 20 and 21A) after liquid-phase processing and evaporative drying, the frameworks in FIG. 9 appear largely intact and mostly unaffected by the processing and drying. This shows that the perimorphic walls in Sample A1 were better able to withstand the stresses encountered during processing.

Figure 10A:
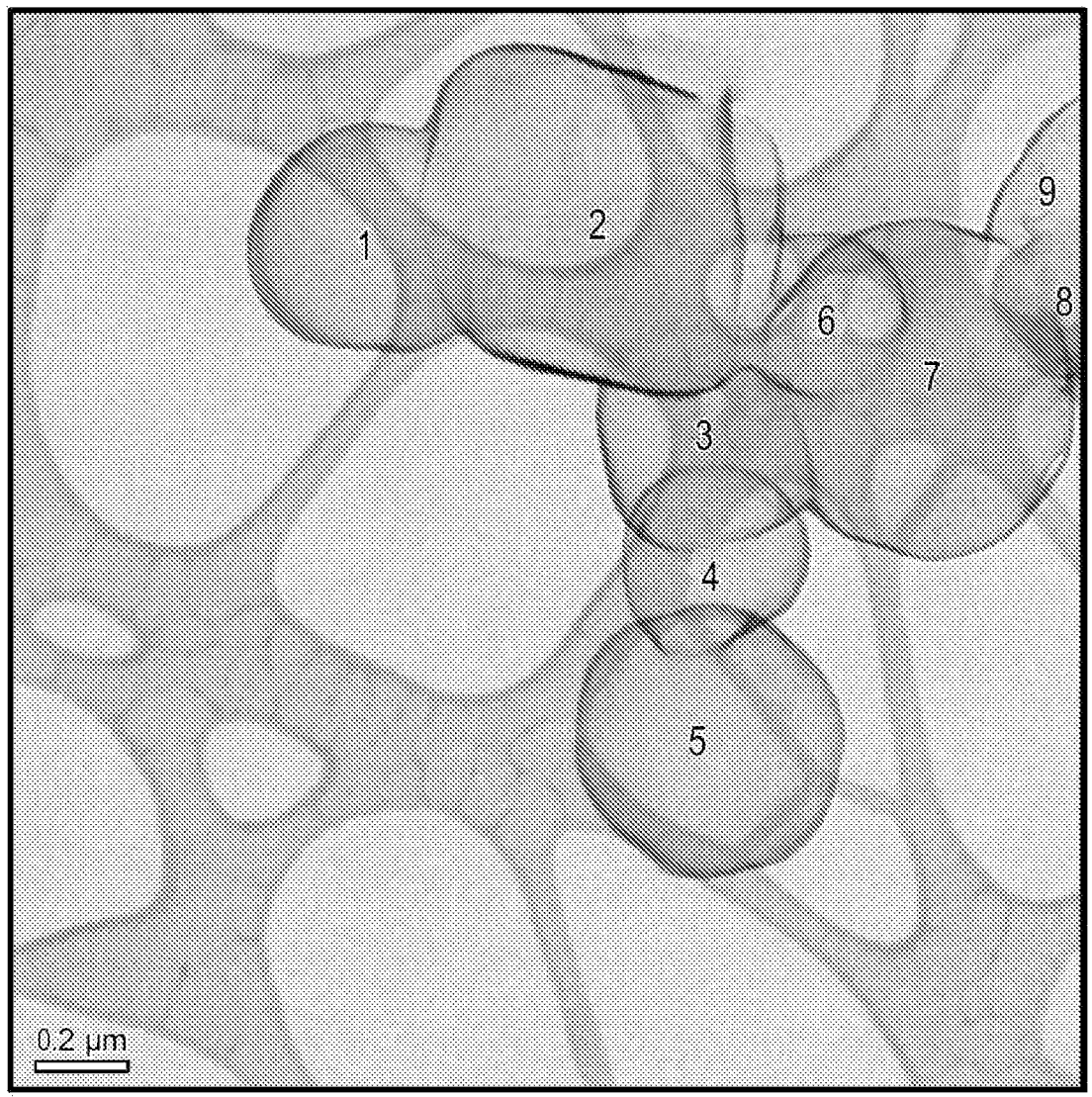
FIG. 10A is a TEM micrographs of material found in Sample A1. Macroporous subunits are numbered.

To achieve better transparency, and to study the smaller-scale structure of the perimorphic wall in Sample A1, TEM analysis was also performed. FIG. 10A is a TEM micrograph in which we can observe a typical framework against the background grid of lacy carbon (this grid is used to support TEM samples and is not the carbon of interest). The framework in this micrograph appears to comprise at least 9 macroporous subunits, which are numbered in FIG. 10A. The cavities match the morphology of the displaced endomorph (not imaged) in both size and shape. No signs of buckling or wrinkling are present within the wall.

Figure 10B:
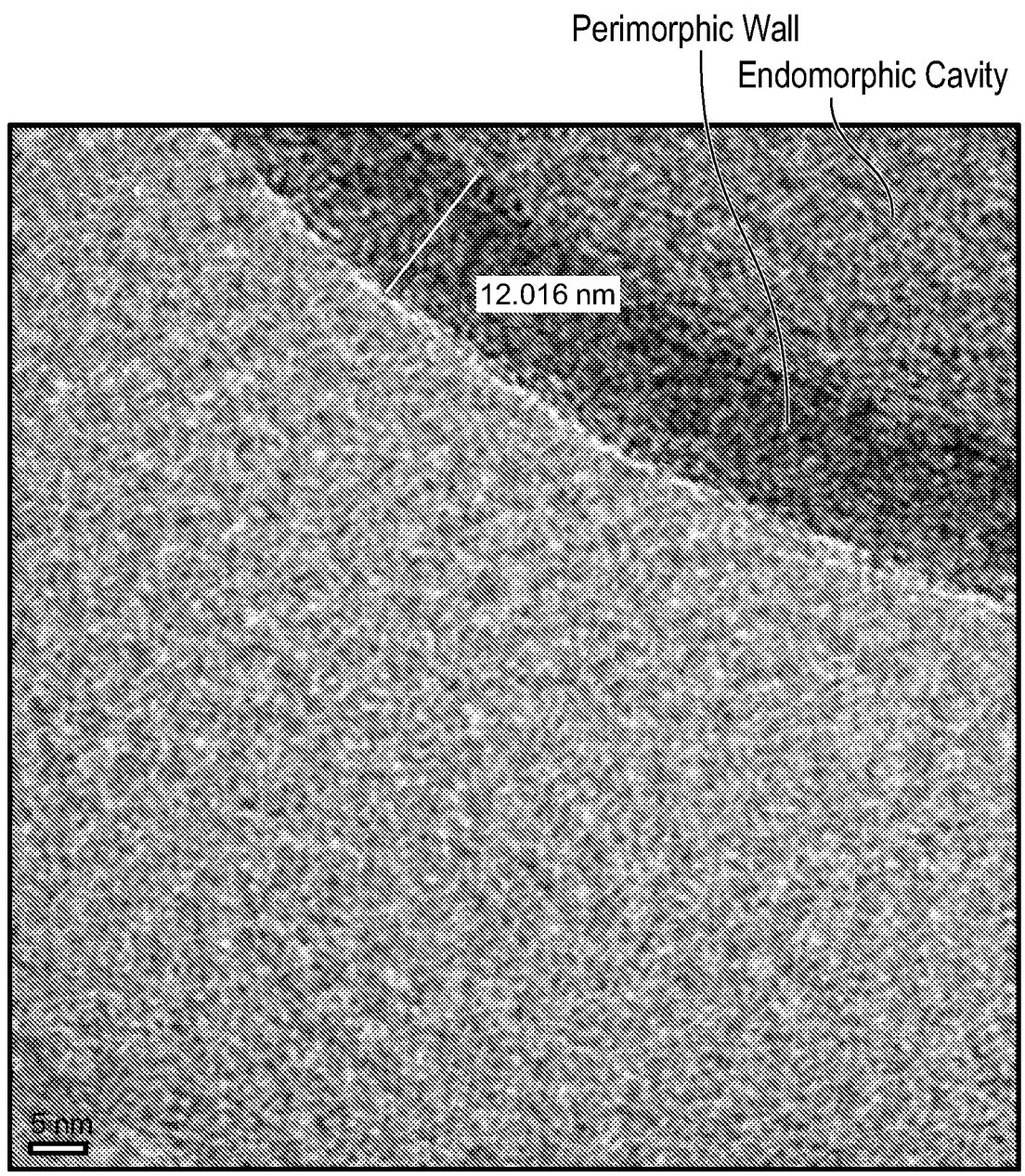
FIG. 10B is TEM micrograph taken at higher magnification of the material shown in FIG. 10A. A cell wall and cell cavity are indicated.

Closer examination of the perimorphic wall is possible in a higher-magnification view, shown in FIG. 10B. This image shows a cross-section of the perimorphic wall and endomorphic cavity. Some walls observed in Sample A1 were consistently as thick as ~12 nm (or ~30-35 layers), indicating that the growth of graphenic structures was not terminated by occlusion of the catalytic template surface, but rather by cessation of CVD. This is evidence of the contribution of an autocatalyzed growth mechanism, without which we could not expect so many layers, no matter how long CVD might be continued. $N_2$ gas adsorption was performed to obtain the BET surface area of 142 $m^2g^{-1}$ and BJH porosity of 0.35 $cm^3g^{-1}$. This BJH porosity value was undoubtedly less than the real specific porosity given the inability to measure larger macropores using the $N_2$ adsorption method.

Figure 10C:
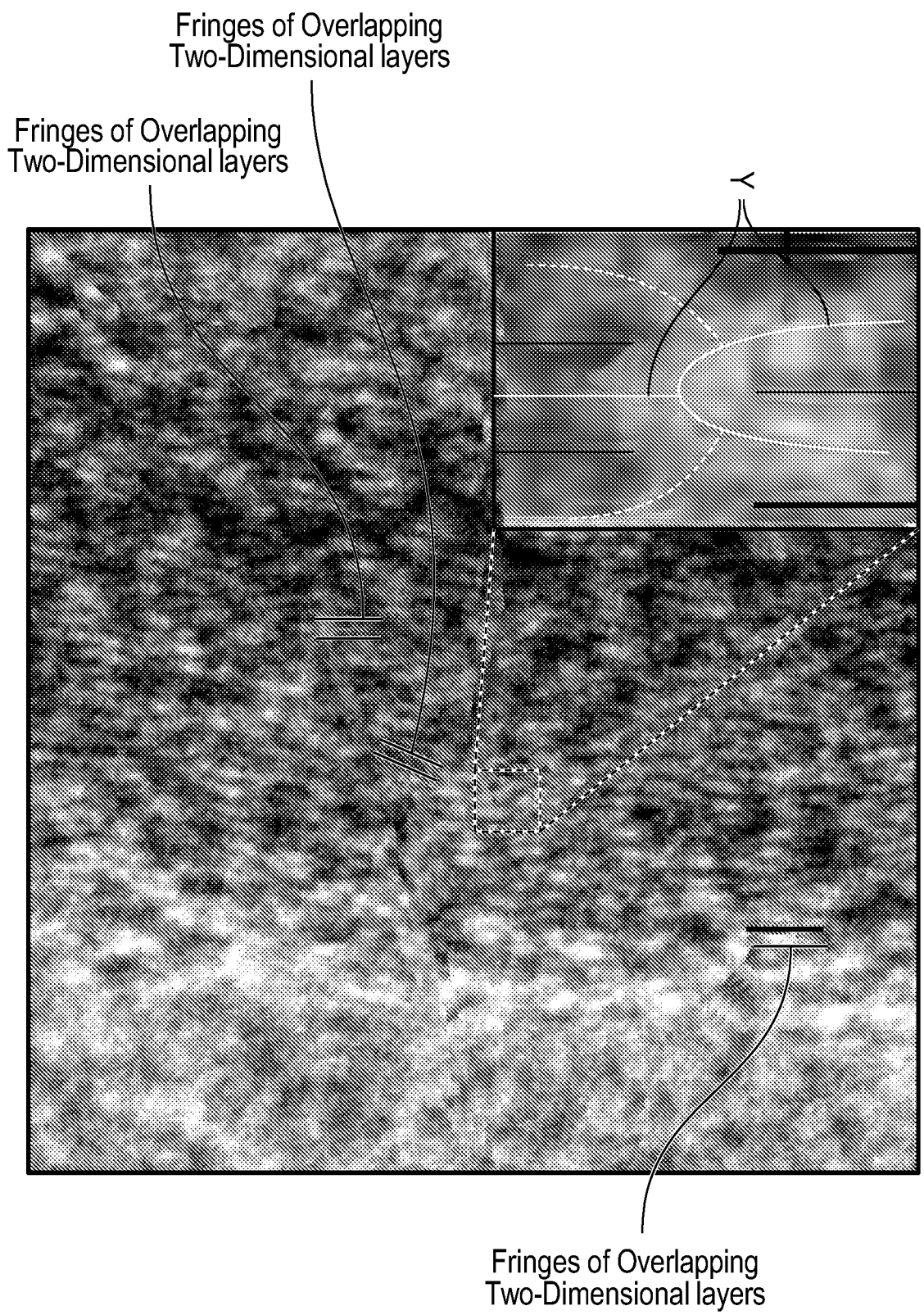
FIG. 10C shows, the nematic alignment of layers within the perimorphic wall Black and white lines trace nematically aligned layers. The magnified inset in FIG. 10C traces a Y-dislocation.

In the highest magnification view, shown in FIG. 10C, the perimorphic wall's layered structure can be discerned. It comprises a multilayer stack of overlapping, z-adjacent graphenic regions, which are evidenced by the alternating dark and bright fringes. Each fringe line either represents a two-dimensional graphenic region or the z-interval between two z-adjacent regions.

Care must be taken during HRTEM analysis that the fringe lines corresponding to the actual positions of the graphenic layers are not confused with the fringe lines corresponding to the z-intervals between these layers. Depending on the defocus value, the fringes associated with the actual atomic positions may be either dark or bright. Whichever color they are, the lines associated with the z-intervals will be the opposite color. In the literature, we can find examples of either dark or bright fringes being associated with graphenic layers. In order to make a confident assignment of the exact atomic positions in HRTEM images, it helps to have corroborating information about the actual molecular structure.

The presence of fringe lines indicates that this section of the perimorphic wall in Sample A1 comprises a stacked arrangement of z-adjacent graphenic regions. In the main frame of FIG. 10C, a few dark fringe lines are traced. While z-adjacent fringe lines appear to be generally xy-aligned over distances up to several nanometers, the fringe lines are not parallel throughout the entire perimorphic wall. Due to the local xy-alignment of z-adjacent graphenic regions, however, the wall in FIG. 10C exhibits nematic alignment. The layers in all sections of the wall that were imaged exhibited nematic alignment.

An xy-alignment between z-adjacent graphenic regions allows smaller z-intervals and higher-density arrangements, which should in turn increase interlayer coupling and vdW cohesion. We consider this a desirable feature of a layered graphenic system as opposed to the lower-density, nonlayered network architecture exhibited by schwarzite. If density reduction is desired, this can be accomplished by introducing larger-scale modes of porosity (such as the macropores in Sample A1), while preserving a high-density layered organization at smaller scales.

Figure 11:
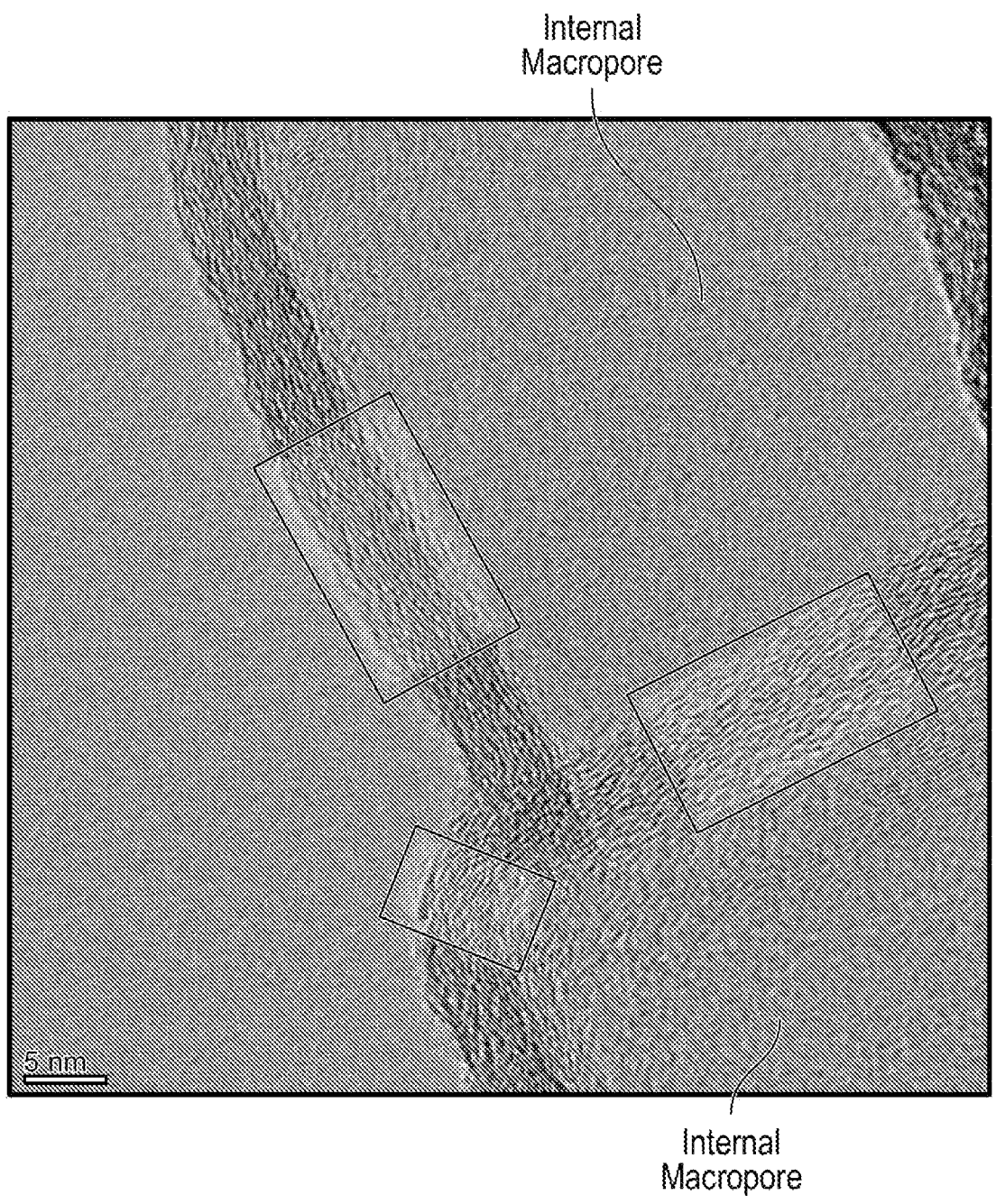
FIG. 11 is a TEM micrograph of another perimorphic framework to demonstrate further the concept of nematic alignment. Macropores are indicated.

Another helpful example of nematic alignment is shown in FIG. 11, which is an HRTEM image of a perimorphic wall with nematically aligned layers (from a different sample). We include this example here because the fringe lines were clearer in the HRTEM images taken of this sample. Different sections of the wall are highlighted in FIG. 11. In each highlighted region, the fringe pattern exhibits a nematic alignment with that section of the wall. This likely arises from the conformal growth of the graphenic structures over the templating surface and then over each other.

While the layers throughout Sample A1 are nematically aligned, it is visually difficult to trace dark fringe lines in FIG. 10C for more than a few nanometers. An exemplary portion of the perimorphic wall is magnified in FIG. 10C's inset. While the diffraction contrast and focus of this image are not sharp, the fringe lines can be discerned and traced. The dark fringe lines from the HRTEM micrograph are traced with black lines. The bright fringe lines from the HRTEM micrograph are traced with solid white lines.

In addition to the z-intervals between the white line segments in the magnified inset of FIG. 10C, there appear to be lateral discontinuities separating them. This pattern could be observed throughout the HRTEM images of Sample A1. If the red tracing within the magnified inset represented the location of the graphenic regions, then each lateral discontinuity in the black tracing would indicate an edge. If this interpretation were correct (we shall demonstrate that it is not), the ubiquitousness of this fringe pattern throughout the perimorphic wall would suggest that the wall comprises a vdW assembly of small graphenic domains—no larger than 3 nm on average, perhaps, since these lateral discontinuities were frequent. Additionally, if this interpretation were correct, we would have to conclude that the graphenic edges of z-adjacent layers were aligned. This might be explained if the edges were caused by a fracture; however, this possible explanation is implausible based on the ubiquitousness of the fringe pattern throughout the wall.

The alternative (and correct) explanation is that the bright fringes (corresponding to the white tracing in the magnified inset of FIG. 10C) represent the actual atomic positions. The solid white lines in the center of the inset form a distinct, horizontal "Y" shape, as labeled by the horizontal Y in FIG. 10C. This bright Y indicates that the bilayer on the branched side of the Y and the graphenic monolayer on the stem side of the Y were just different regions of the same ring-connected graphenic structure. Additionally, in this scenario, the bright fringes traced with the dashed white line, while lower in diffraction contrast than the fringes traced with the solid white line, also indicate some presence of atoms. Together, these solid and dashed white tracings indicate ring-connectedness throughout the magnified region—the opposite of the disconnectedness that would be indicated by the black tracings.

This observation has a precedent in the anthracite literature. HRTEM fringes of anthracite have been analyzed by researchers to generate a model of anthracite's structural dislocations. FIGS. 12A-12D are borrowed from this HRTEM analysis. Each figure contains a model representing a structural dislocation found in anthracite and, below the model, the simulated HRTEM fringe pattern associated with it. These simulated fringe patterns are consistent with the actual fringe patterns observed in anthracite, validating the dislocation models. In each simulated fringe pattern, the bright fringe lines represent the graphenic regions, and the dark fringe lines represent the space between layers.

Figure 12A:
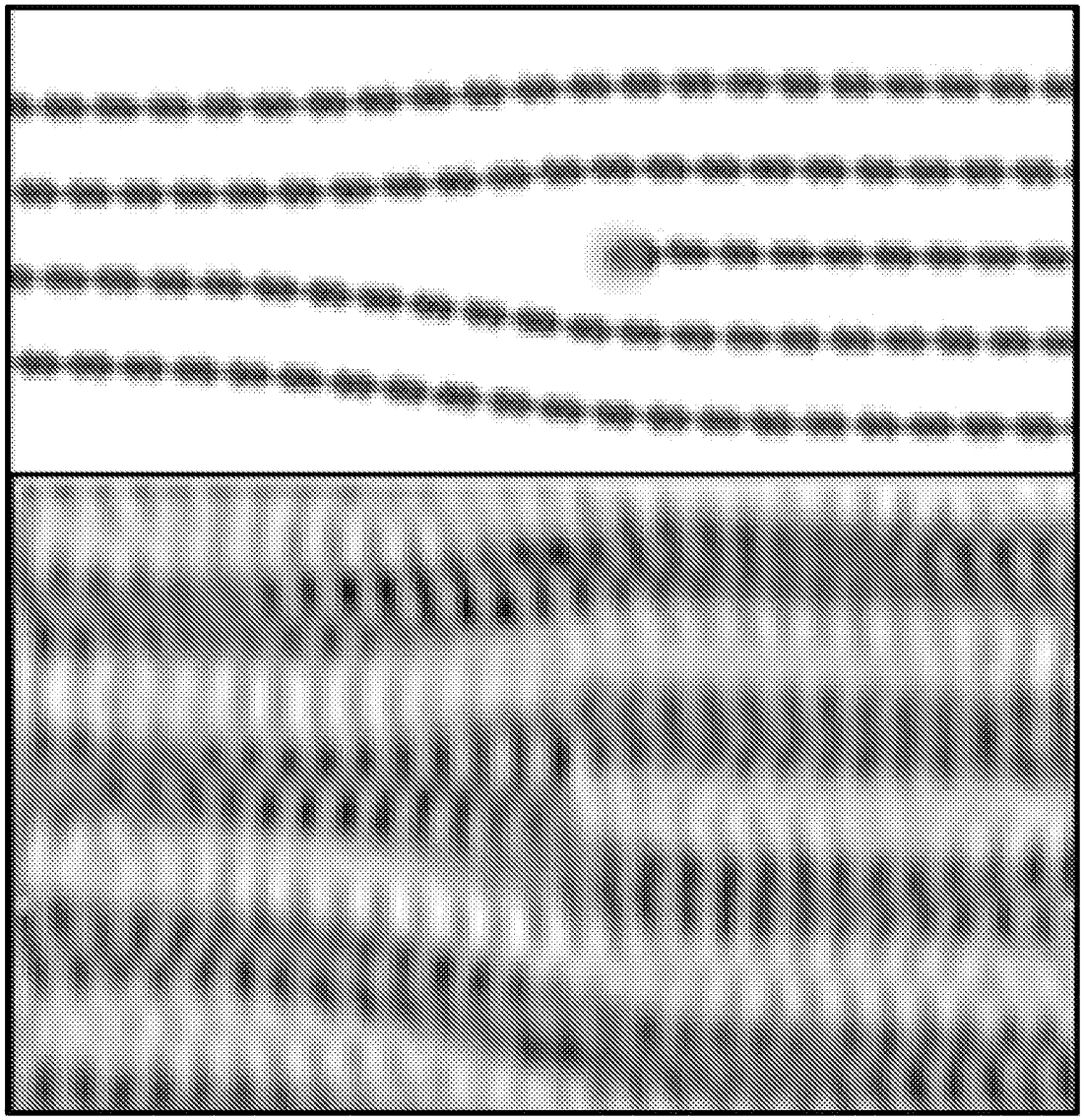
FIG. 12A is an illustration of an edge dislocation in anthracite and its simulated appearance in a high-resolution TEM micrograph.

FIG. 12A is an illustration, drawn from the anthracite literature, of an edge dislocation, wherein a graphenic region is trapped between two z-adjacent regions—one above and one below. The edge of the trapped region represents the local terminus of some graphenic structure, and its members may comprise $sp^2$ radicals. In a van der Waals assembly formed primarily by subduction events (typical of carbons formed by template-directed CVD), the edge of a subducted region—and the z-adjacent regions between which it is trapped—together comprise an edge dislocation. The simulated HRTEM fringe pattern formed by an edge dislocation is also shown in FIG. 12A. The pattern is characterized by a bright fringe line, representing the position of the trapped region, terminating between a dark, Y-shaped fringe line, which represents the interlayer spacing.

Figure 12B:
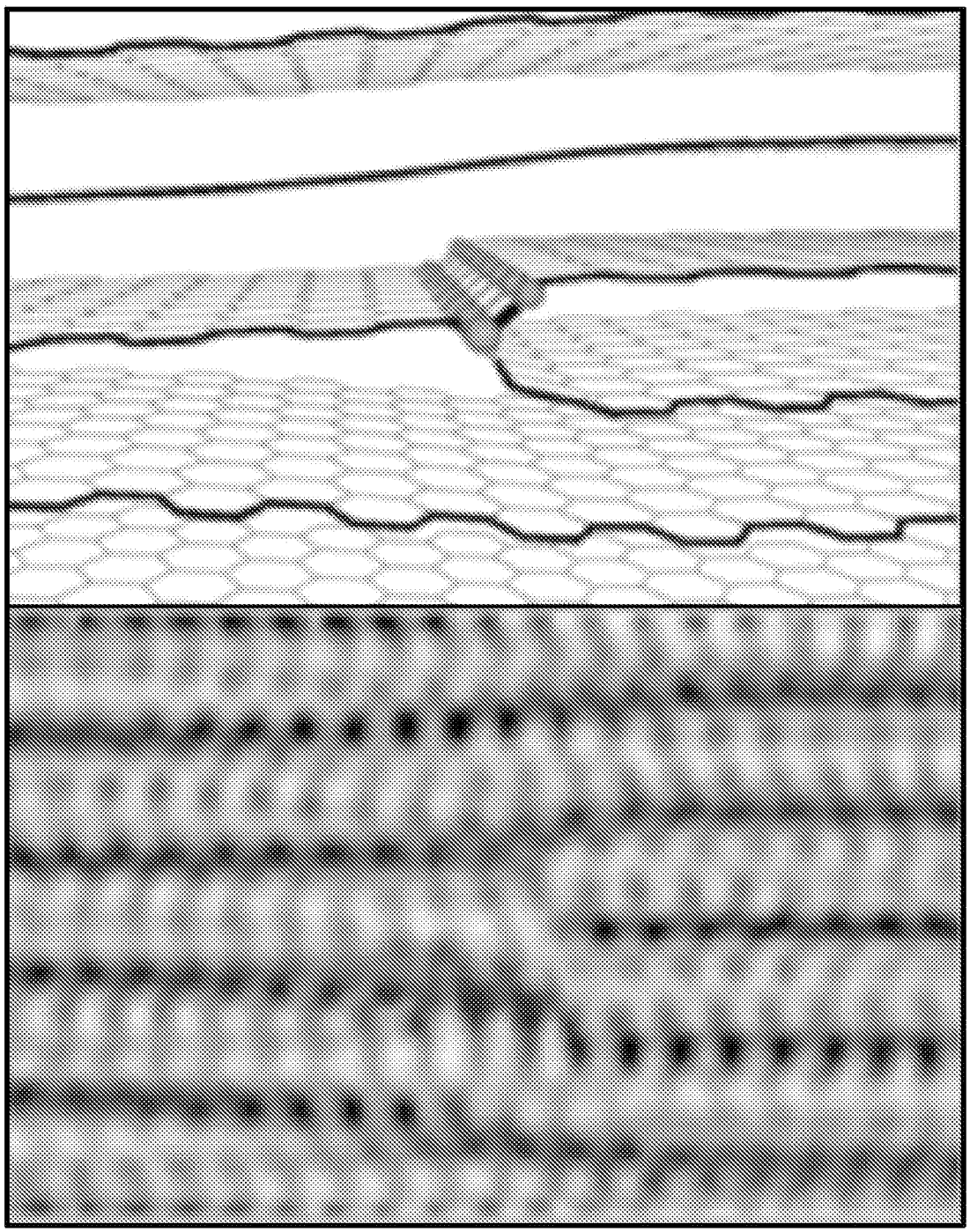
FIG. 12B is an illustration of a Y-dislocation in anthracite and its simulated appearance in a high-resolution TEM micrograph.
Figure 12C:
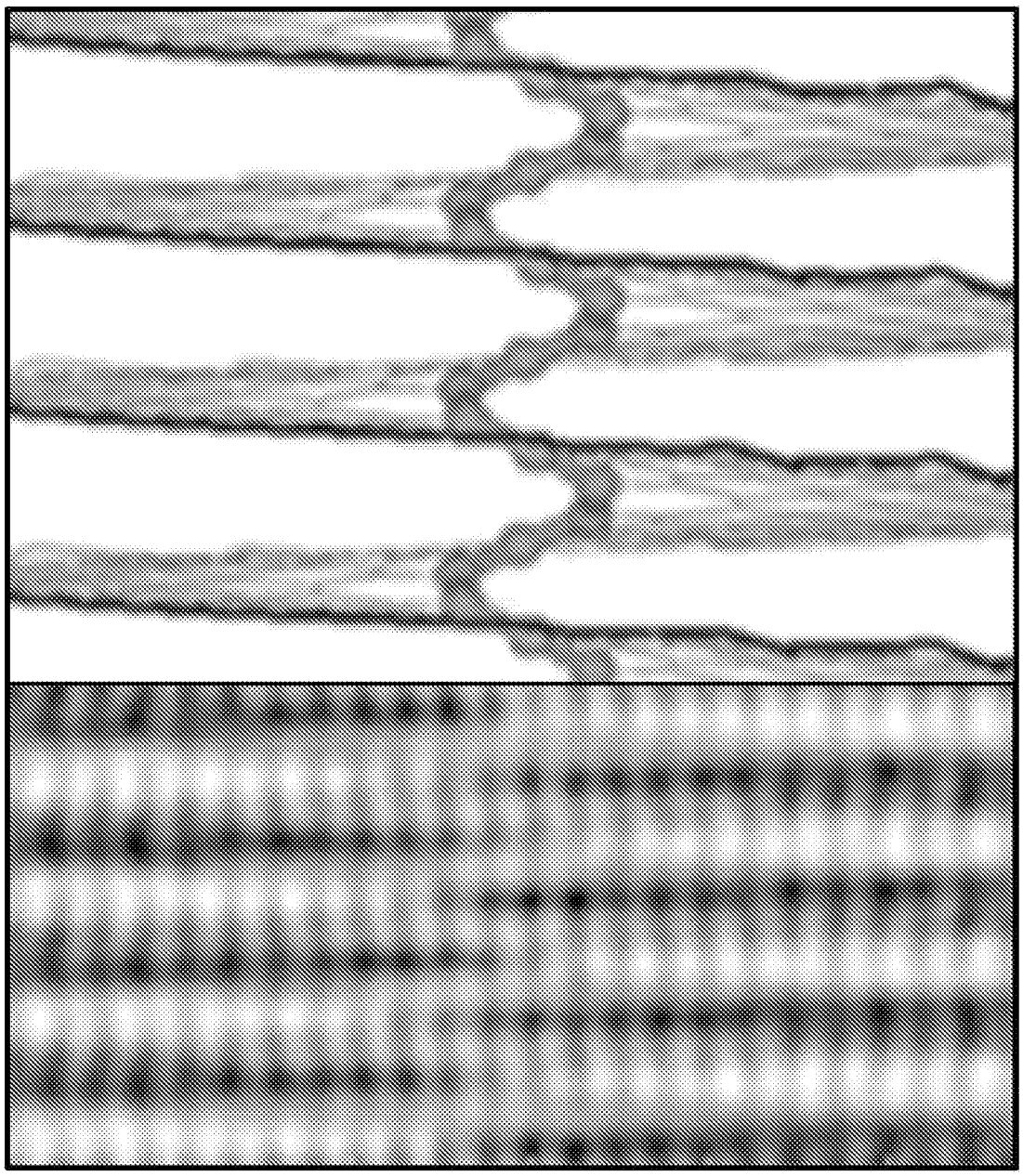
FIG. 12C is an illustration of a screw dislocation in anthracite and its simulated appearance in a high-resolution TEM micrograph.
Figure 12D:
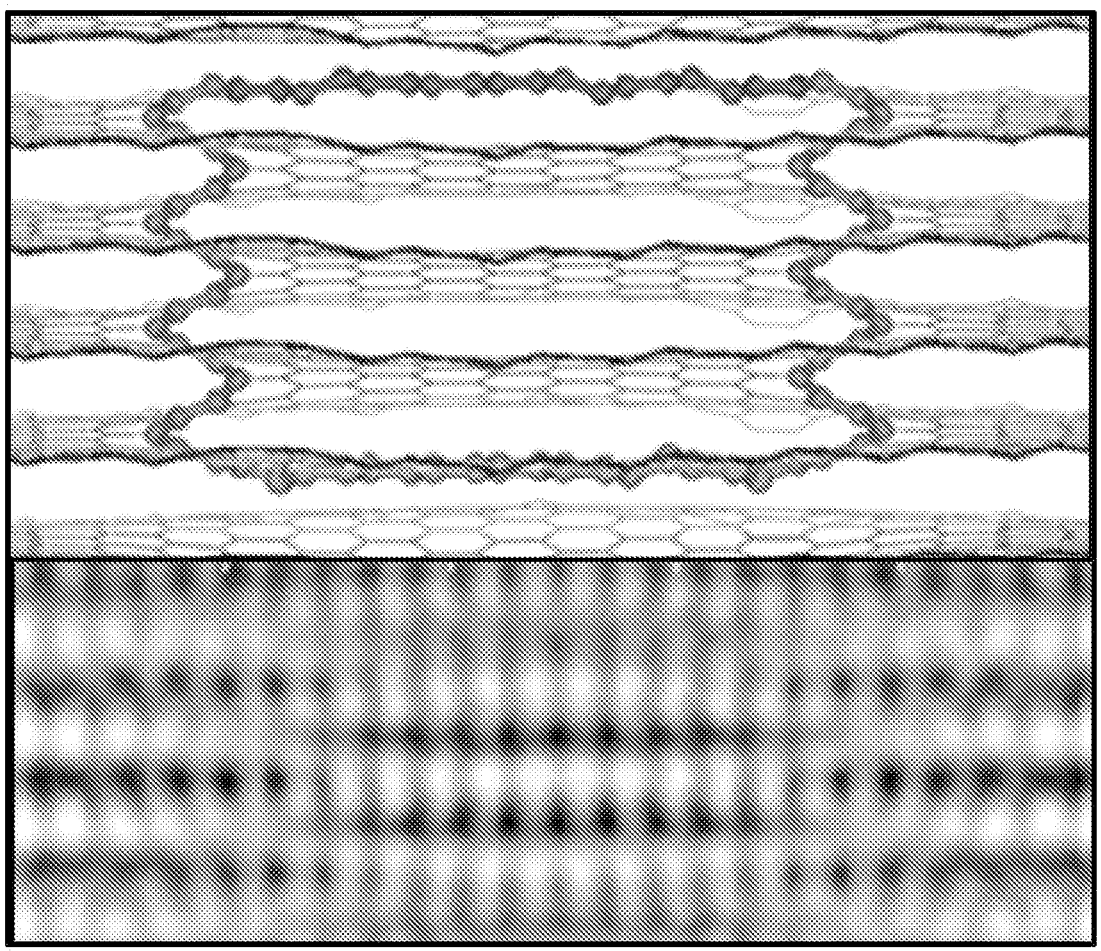
FIG. 12D is an illustration of a screw dislocation loop in anthracite and its simulated appearance in high-resolution TEM micrograph.

FIG. 12B is an illustration, drawn from the anthracite literature, of a Y-dislocation, which can be thought of as the horizontal Y-shaped structure that would be formed if the edge atoms of the trapped graphenic region in FIG. 12A were bonded covalently to one of the z-adjacent regions. The geological conversion of an edge dislocation (e.g. FIG. 12A) into a Y-dislocation (e.g. FIG. 12B) reduces the dislocation energy. This would occur via a radical addition reaction that results in a line of $sp^3$ atoms at the junction between the three layers in the Y-dislocation. It has been suggested by researchers that anthracite's Y-dislocations are evolved in this way.

The simulated HRTEM fringe pattern formed by a Y-dislocation is shown below the dislocation in FIG. 12B. The pattern is the inverse of the simulated pattern in FIG. 12A—i.e. a dark fringe line terminates between a bright, Y-shaped fringe line. The bright, Y-shaped fringe line represents the location of the Y-shaped graphenic structure, a small version of which was illustrated by the molecular model in FIG. 7D. The simulated fringe pattern looks very similar to the Y-shape traced in the magnified inset of FIG. 10C.

Geologically-formed anthracitic networks are a natural demonstration of how structural dislocations can create a three-dimensional graphenic network. Substantially all of the carbon atoms in anthracite are members of the graphenic network resulting from these crosslinking dislocations, with the exception of an occasional CH, $CH_2$ or $CH_3$ group (which solid state C NMR has indicated are present only in very small quantities) attached to a ring. It is this crosslinking of the graphenic network that lends anthracite its hardness and that prevents its exfoliation or solubilization. NMR spectroscopy has been used to show that dodecylation of anthracite only affects the edge atoms of this singleton, wherein "the graphenic layers appear to merge."

Returning to the fringe pattern shown in the magnified inset of FIG. 10C, we can conclude that this pattern is associated with crosslinking dislocations. The solid white tracing indicates a Y-dislocation. The lower-contrast fringes traced by the dashed white lines likely indicate Y-dislocations that are less in focus or more disordered. The segments traced by black lines represent the spaces between graphenic layers. Since Y-dislocations are constructed from a diamond-like seam that preserves lateral and vertical ring-connectedness, we can conclude that the magnified inset of FIG. 10C represents a ring-connected region within the perimorphic wall. Furthermore, the ubiquitous occurrence of Y-dislocations like this throughout the wall indicates that the perimorphic frameworks in Sample A1 comprise anthracitic networks.

The case for this is further reinforced by our comparative analysis of Samples A2 and A3. Namely, if the perimorphic frameworks in Sample A1 comprised vdW assemblies, the conspicuously superior robustness of Sample A1's less crystalline particles vs. Sample A2's more crystalline particles (their relative crystallinity being ascertained by HRTEM, Raman, and XRD analysis) would conflict with findings reported in the literature. Researchers have shown that vdW assemblies of small graphenic domains are more fragile—not more robust—than vdW assemblies of larger, more crystalline domains. For example, "amorphous graphene nanocages" that possess a similar morphology to the particles in Sample A1 and comprise assemblies of small, overlapping graphenic domains (often smaller than 10 nm), are easily broken and deformed. Their fragility is explained by the weakness of the vdW interactions between these assemblies' small graphenic domains, which are easily sheared apart. Researchers' side-by-side comparison of amorphous graphene nanocages with more crystalline graphene nanocages constructed from larger domains have demonstrated the superior cohesion of the latter. However, what we actually see is a dramatic improvement in mechanical robustness in every particle throughout Sample A1 compared to the more fragile, nanocrystalline particles found in Sample A2.

Based on this, we can state that the perimorphic framework in FIG. 10A comprises an anthracitic network of approximately 18.5 layers, on average (a figure arrived at by dividing the theoretical specific surface area of graphene, 2630 $m^2g^{-1}$, by the BET surface area of Sample A1, which was 142 $m^2g^{-1}$). The observable portion of the anthracitic network in FIG. 10A comprises 9 spheroidal, macroporous subunits. In total, this represents a graphenic network with a significant amount of lattice area in vdW contact. A conservative estimate of this area is 48 $\mu m^2$, which is arrived at based on the following. First, for this estimate, we ignore the $8^{th}$ and $9^{th}$ subunits that are only partially observable in FIG. 10A. The average radius of the remaining subunits, while difficult to calculate exactly, is definitely larger than 200 nm (for reference, spheroid #4 in FIG. 10A has a radius of approximately 200 nm, as indicated by the dotted black line), but we use this radius for our conservative estimate. The theoretical surface area of 7 spheres with a radius of 200 nm would be approximately $3.5\times10^6$ $nm^2$ (i.e. $7\times4\pi r^2$, where r=200 nm). We note that this would be reduced if the spheres were conjoined, as they are in FIG. 10A, so we reduce our theoretical surface area by 25%, resulting in a value of $2.6\times10^6$ $nm^2$. Lastly, based on the estimated average wall thickness at 18.5 layers, we might estimate the total lattice area throughout the wall as approximately $4.8\times10^7$ $nm^2$ (i.e. 18.5 layers×$2.64\times10^6$ $nm^2$), or 48 $\mu m^2$.

Since all of this networked lattice area is organized in nematically aligned layers, substantially all of this lattice area is subject to interlayer vdW interactions. For the same reason that crystalline graphene nanocages constructed from large-area domains exhibit better vdW cohesion relative to amorphous graphene nanocages constructed from small-area domains, we can infer that as we construct progressively larger anthracitic networks, we can begin to derive a considerable vdW contribution to system cohesion. This is one of the reasons that we find the anthracitic networks more appealing than schwarzite-like graphenic networks ((illustrated in FIG. 2) like those synthesized on zeolite templates. Shorter, more consistent z-intervals and better vdW cohesion may be obtained with a denser, layered architecture. The increased local density incurred may then be offset by introducing larger-scale modes of porosity, such as the templated pores in perimorphic frameworks.

Figure 13:
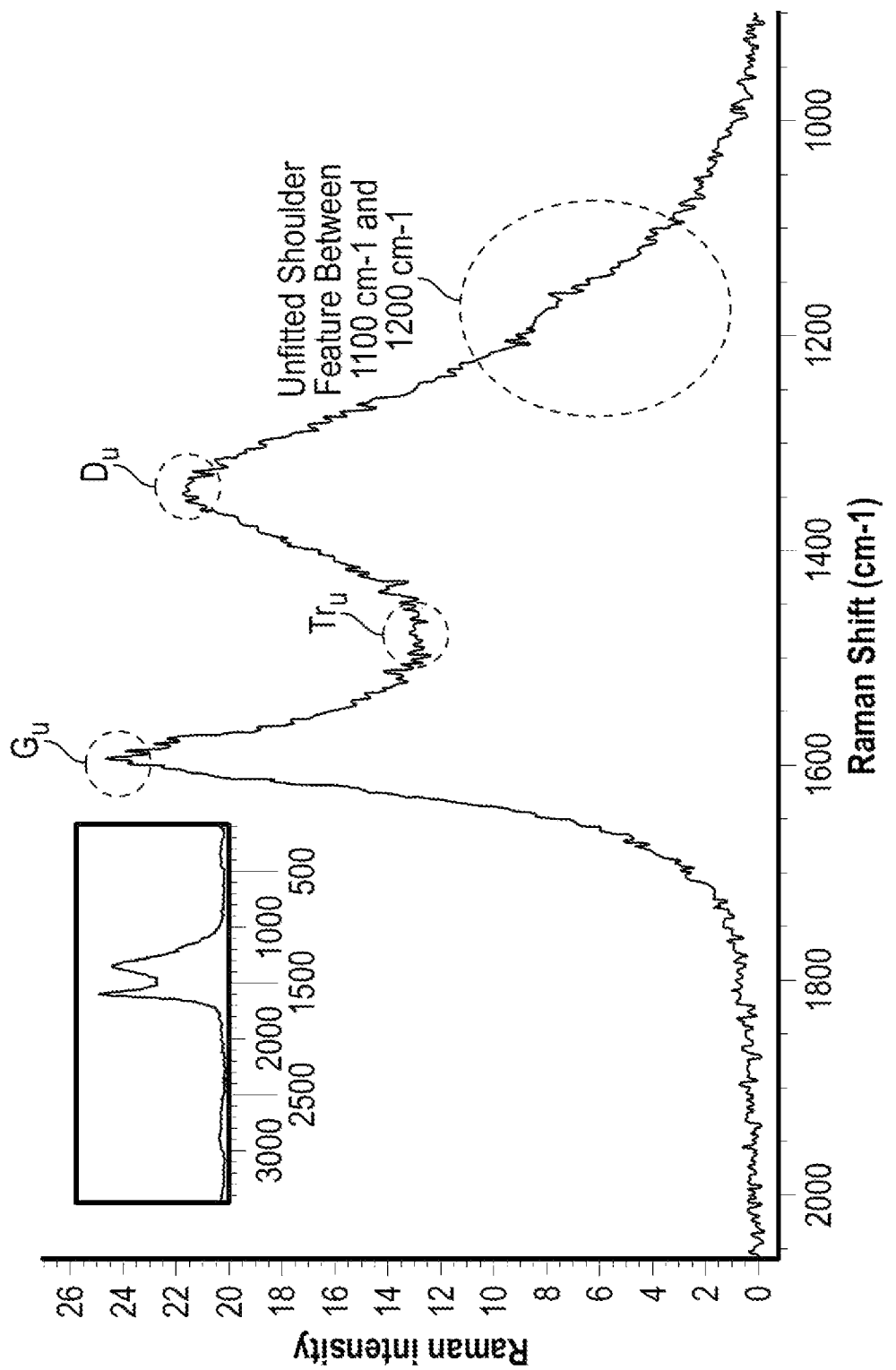
FIG. 13 shows a single-point Raman spectrum for sample A1 the unfitted G band ($G_u$), unfitted Tr band ($Tr_u$), unfitted D band ($D_u$) and the unfitted shoulder between 1100-1200 $cm^{-1}$ are indicated. The inset shows the entire Raman spectrum for sample A1. Spectrum was taken using 532 nm laser at 2 mW power setting.

More information about the bonding within the frameworks in Sample A1 can be derived from the sample's Raman spectrum. A single-point Raman spectrum, taken using a 532 nm laser at 2 mW power, is shown in FIG. 13. No smoothing has been performed. For reference, the full spectrum is shown in the inset of FIG. 13. The $D_u$ band appears centered between 1345 cm$^{-1}$ and 1350 cm$^{-1}$, which is typical for 532 nm (~2.33 eV) excitation. On this basis, The $G_u$ band is centered between 1590 cm$^{-1}$ and 1595 cm$^{-1}$, compared to the usual 1585 cm$^{-1}$, indicating the presence of some compressive strain in the sp$^2$ bonds. Additionally, there is a high $Tr_u$ peak between the $D_u$ and $G_u$ bands, corresponding to an $I_{Tr_u}/I_{G_u}$ peak intensity ratio of approximately 0.50 and indicating the possible presence of an underlying peak to be examined via profile fitting. The $I_{D_u}/I_{G_u}$ peak intensity ratio is less than 1.0.

Another unfitted peak that is apparent in FIG. 13 appears as a weak shoulder on the $D_u$ band located between 1100 cm$^{-1}$ and 1200 cm$^{-1}$. This feature's position coincides with the D* peak found in the 1150 to 1200 cm$^{-1}$ region. Researchers in the field have attributed this peak to sp$^2$-sp$^3$ bonds at the transitions between sp$^2$ and sp$^3$ regions in soot-like carbons. Such an assignment is therefore in good agreement with the sp$^x$ rings from which the diamondlike seams are constructed.

Figure 14:
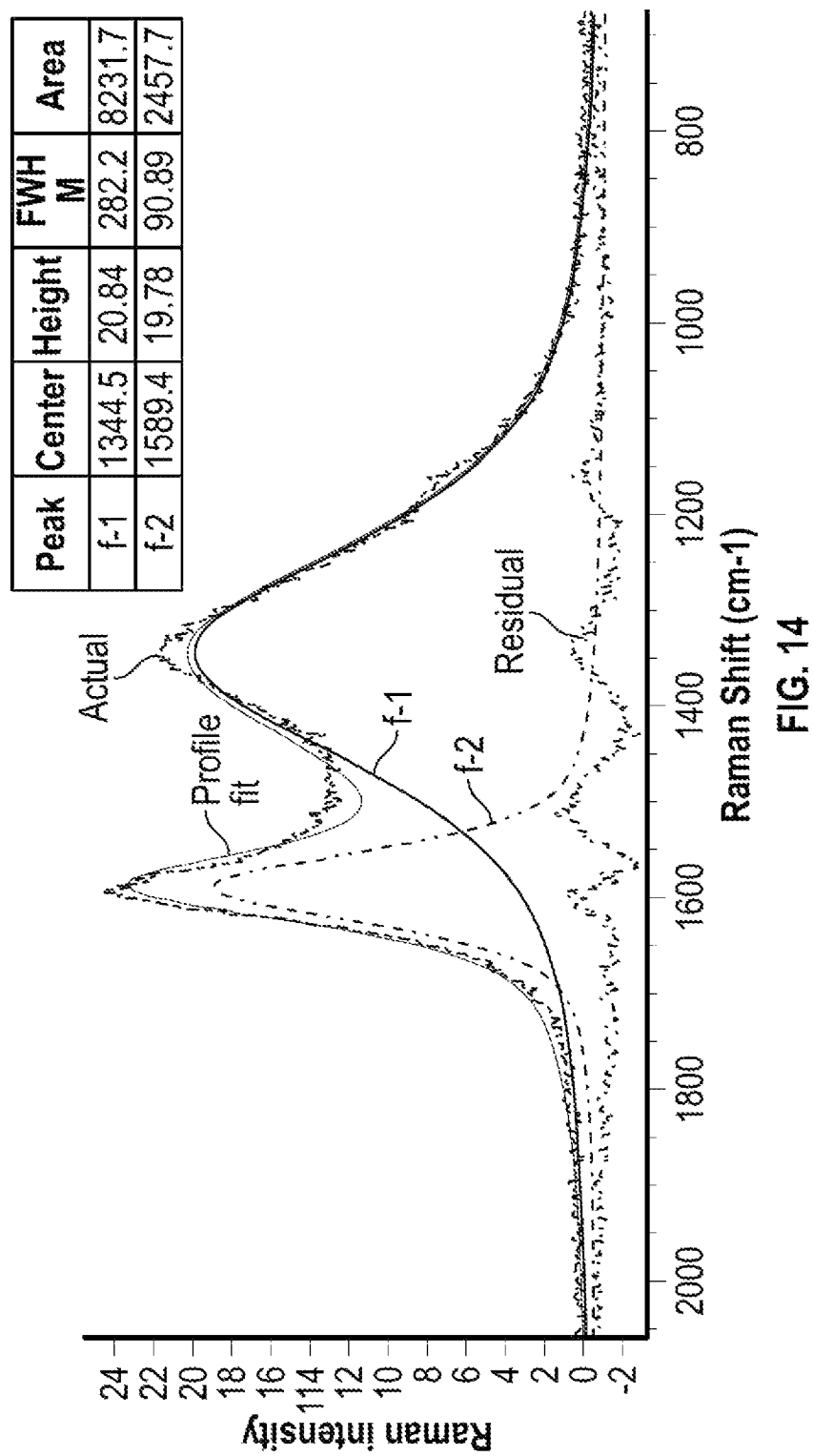
FIG. 14 shows the two fitted peaks (f-1, f-2), the fitted profile, the actual profile, and the residual representing the difference between the fitted profile and the actual profile for the Raman profile of Sample A1. Also shown in tabular form are the peak-type, peak position, peak height, peak FWHM and peak area for the fitted peaks.

In order to elucidate the underlying features of the Raman profile in FIG. 13, the OMNIC Peak Resolve software was used. Initially, the software was restricted to the use of only two peaks. FIG. 14 shows the two fitted peaks, the fitted profile, the actual profile, and the residual representing the difference between the fitted profile and the actual profile. The residual at the bottom of the chart indicates the ranges where the fitted profile deviates from the actual profile, and the magnitude of the deviations. A flat residual (taking into account that the noise in the unsmoothed actual will also be reflected in the residual) is indicative that the fitted profile is good and coincides with the actual profile. For only two peaks, the fitted profile is still poor, with large residuals occurring between approximately 1150 cm$^{-1}$ and 1650 cm$^{-1}$. Of note are the especially poor fits at the peaks, in the trough region, and at the shoulder around 1150 cm$^{-1}$.

Figure 15:
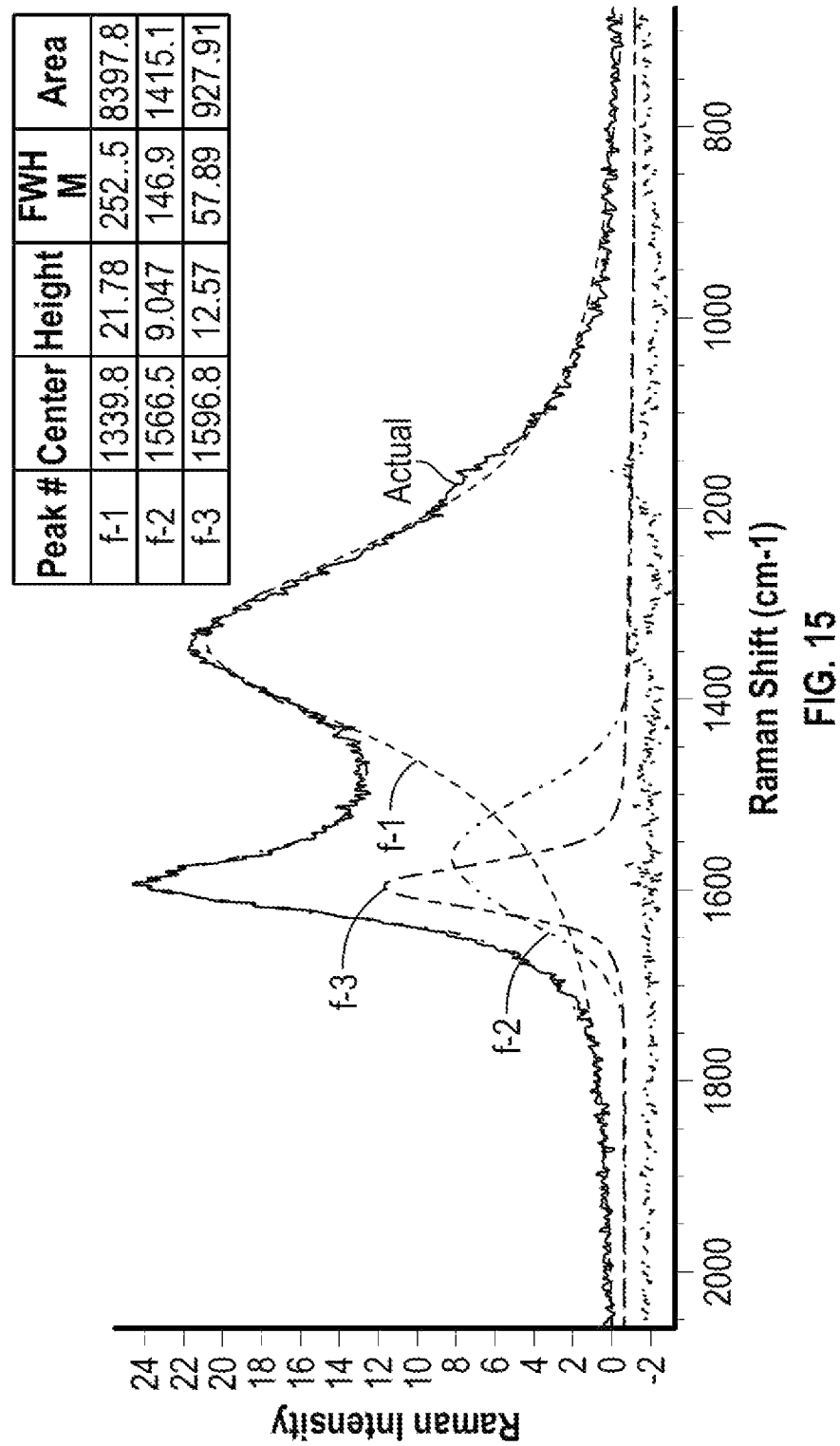
FIG. 15 shows the three fitted peaks (f-1, f-2, f-3), the fitted profile, the actual profile, and the residual representing the difference between the fitted profile and the actual profile for the Raman profile of Sample A1. Also shown in tabular form are the peak-type, peak position, peak height, peak FWHM and peak area for the fitted peaks.

Next, the OMNIC Peak Resolve software was allowed a third peak, which was manually placed at a starting position of 1500 cm$^{-1}$ prior to re-running the profile-fitting routine. FIG. 15 shows the three fitted peaks, the fitted profile, the actual profile, and the residual representing the difference between the fitted profile and the actual profile. This fitted profile, which incorporates a broad fitted peak at 1566 cm$^{-1}$, appears significantly better than the fit obtained with only two fitted peaks. However, a significant residual is still present between 1150 cm$^{-1}$ and 1200 cm$^{-1}$.

Figure 16:
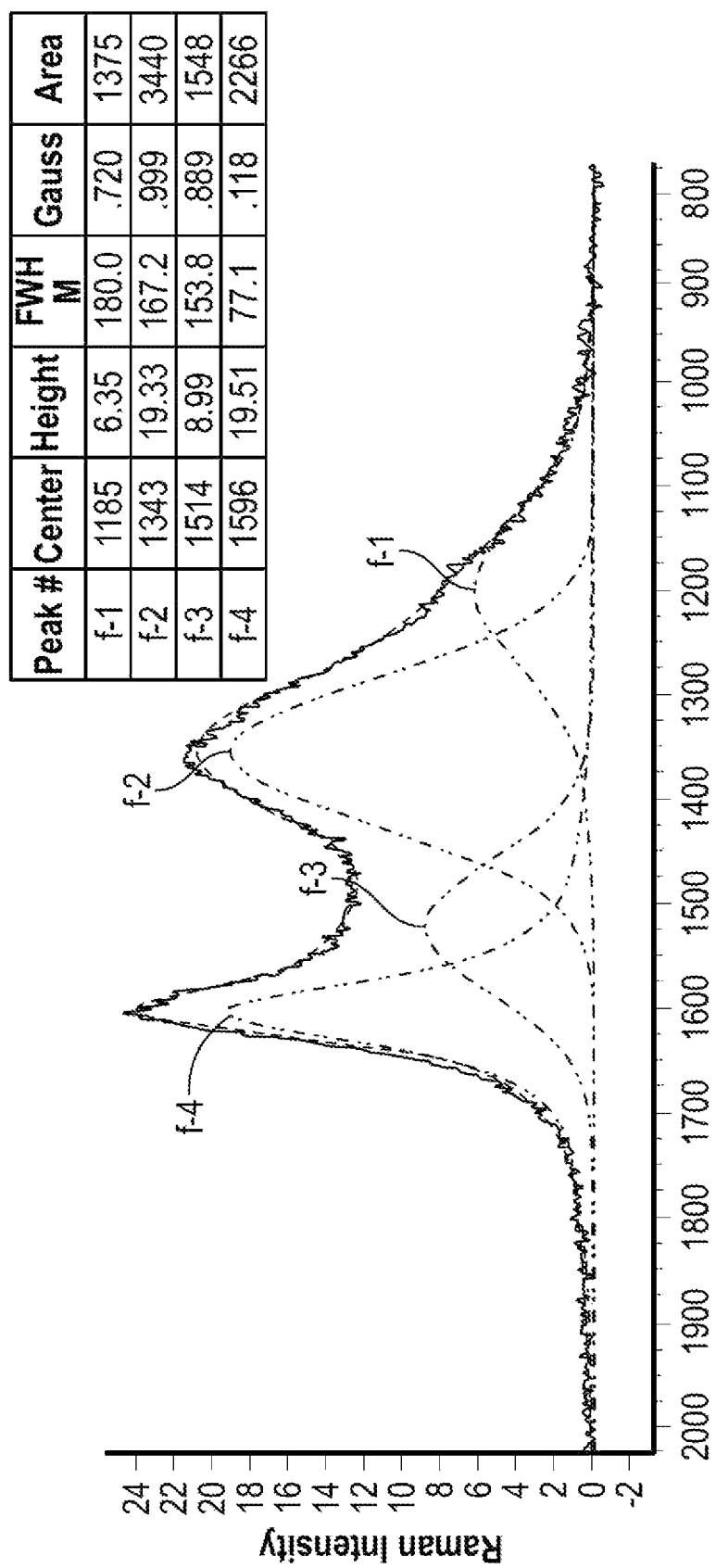
FIG. 16 shows the four fitted peaks (f-1, f-2, f-3, f-4), the fitted profile, the actual profile, and the residual representing the difference between the fitted profile and the actual profile for the Raman profile of Sample A1. Also shown in tabular form are the peak-type, peak position, peak height, peak FWHM and peak area for the fitted peaks.

Next, the OMNIC Peak Resolve software was allowed a fourth peak, which was manually placed at a starting position of 1150 cm$^{-1}$ prior to re-running the fitting routine. FIG. 16 shows the four fitted peaks (labeled f-1 through f-4). This fitted profile, which further incorporates a broad fitted peak at 1185 cm$^{-1}$, appears significantly better than the fitted profiles obtained with either two or three fitted peaks. The f-1 peak at 1185 cm$^{-1}$ reduces the residual associated with the shoulder feature in this range. With these 4 fitted peaks, a satisfactory fitted profile is obtained.

Analysis of the four fitted bands indicate a split in the G band (usually found at approximately 1585 cm$^{-1}$ in unstrained sp$^2$ lattices) into the f-4 peak at 1596 cm$^{-1}$ and a broad f-3 peak at 1514 cm$^{-1}$. The f-4 band represents a blue-shifted mode of the G band. The increased frequency of these blue-shifted phonons is caused by compressive strain in some sp$^2$-sp$^2$ bonds. The much broader f-3 peak at 1514 cm$^{-1}$ coincides with the D" peak found in graphene oxide and represents a red-shifted mode of the G band. The lower frequency of these red-shifted phonons is caused by the stretching and weakening of sp$^2$-sp$^2$ bonds in ring-disordered regions, as described by Ferrari & Robertson. In addition to inducing tensile strain, the ring disorder of these regions disallows a uniform strain field, which broadens the f-3 band. From the split of the G band into the f-3 and f-4 peaks, we can therefore discern the presence of certain regions of compressed sp$^2$-sp$^2$ bonds, and certain ring-disordered regions of stretched sp$^2$-sp$^2$ bonds.

A blue-shifted band like f-4 is not observed in graphene oxide, in which the G peak, in addition to its normal mode at 1585 cm$^{-1}$, is also present in the red-shifted mode (called the D" peak and characterized herein by the trough height). This, in conjunction with Sample A1's lack of oxygen moieties (evidenced by the near-zero rate of mass loss below 400 C in FIG. 20) and the layered architecture of its graphenic systems, establishes that its Raman spectrum arises from a different structure than graphene oxide.

Figure 17:
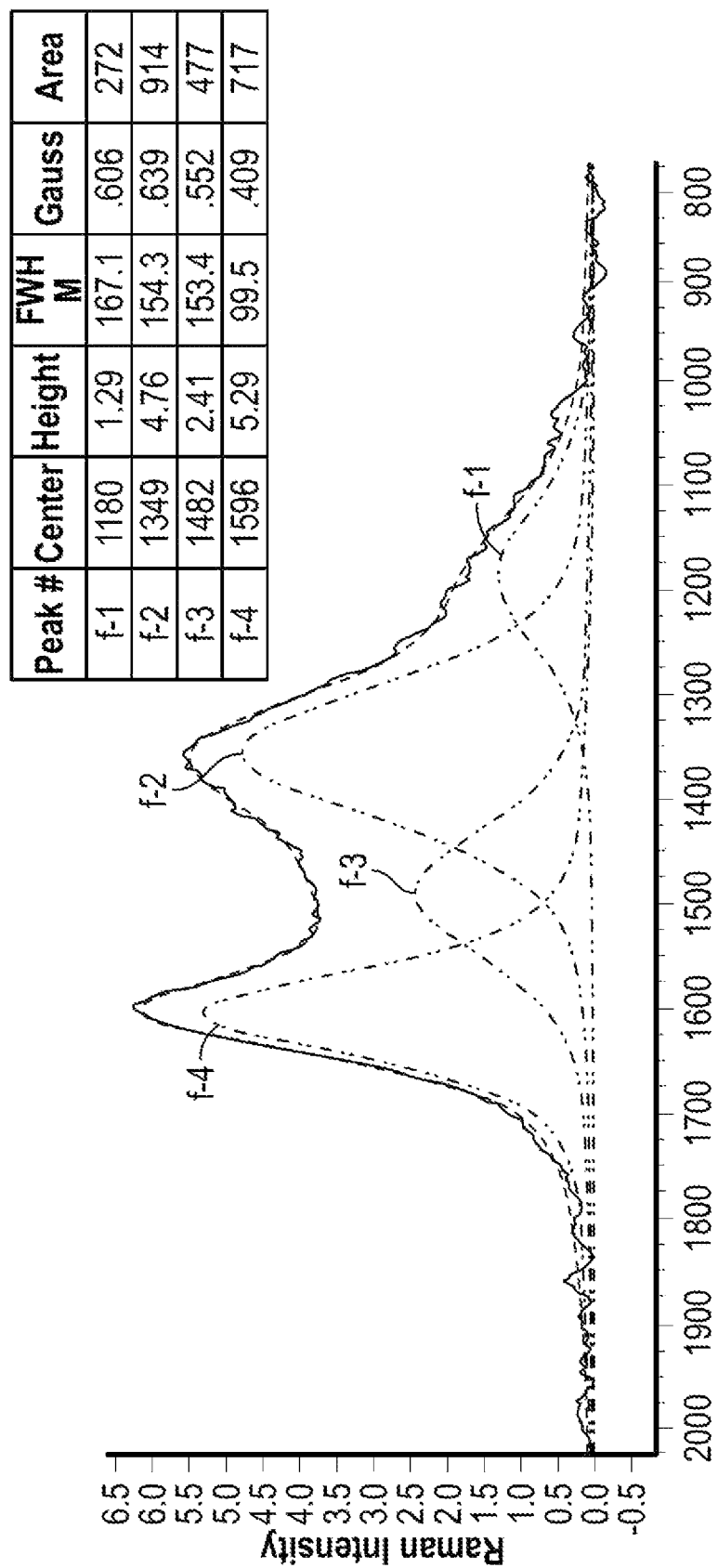
FIG. 17 shows the two fitted peaks (f-1, f-2, f-3, f-4), the fitted profile, the actual profile, and the residual representing the difference between the fitted profile and the actual profile for the Raman profile of Sample A1 after annealing. Also shown in tabular form are the peak-type, peak position, peak height, peak FWHM and peak area for the fitted peaks.

The f-2 peak in FIG. 17 represents a slightly red-shifted $D_f$ peak located at 1343 cm$^{-1}$. While the D band of sp$^2$ carbons is dispersive, and the D peak position can change based on excitation, 1343 cm$^{-1}$ is somewhat lower than the D peak position typically associated with sp$^2$ carbon under 532 nm excitation (around 1350 cm$^{-1}$). This red-shifting indicates some underlying interpolation of the sp$^2$ vibrational density of states (VDOS) with lower-frequency bands found in the sp$^3$ VDOS.

Interpolation of the VDOS in an alloy structure occurs when there is strong coupling between the phases. Interpolation between the D band (associated with sp$^2$ hybridization) and lower-frequency bands indicates the strong coupling of sp$^3$ states and sp$^2$ states in their immediate proximity. These regions of strong coupling activate the radial breathing mode ("RBM") phonons found throughout the graphenic system's entire sp$^2$ ring structure. Hence, even a trace-level presence of sp$^3$ carbon states can be discerned in the Raman spectrum due to their activation of RBM phonons that are found throughout the much larger sp$^2$ component. In other words, RBM phonons in grafted singletons are activated by backscattering from the sp$^3$ states in sp$^x$ rings, where the sp$^2$ and sp$^3$ phases are strongly coupled, and therefore the D band associated with RBM phonons is interpolated. Conversely, the preponderance of sp$^2$ states comprising the sp$^2$ layers between diamondlike seams are neither immediately proximal to the sp$^3$ states, nor strongly coupled to them, and accordingly the G band, associated with sp$^2$-sp$^2$ vibrations, is not interpolated. Based on this analysis, the red-shifted position of the f-2 (i.e. the $D_f$ peak) in FIG. 17 corroborates the observations of ubiquitous Y-dislocations throughout the anthracitic networks comprising Sample A1.

What dictates the degree of D band interpolation is not the fraction of sp$^3$ states within the graphenic systems, but instead the fraction of RBM phonons activated by sp$^3$ states vs. the fraction of RBM phonons activated by sp$^2$ edge states. Even a trace level of sp$^3$ states may activate a majority of the RBM phonons if there are even fewer sp$^2$ edge states. This may cause the D band to interpolate, and the degree of interpolation may be expected to increase with an increasing prevalence of sp$^3$ states and decreasing prevalence of sp$^2$ edge states. Of course, the respective prevalence of these two states is negatively correlated, since the sp$^x$ rings are formed by the conversion of sp$^2$ edges states into sp$^2$ interior states or sp$^3$ states.

Therefore, interpolation of the D band in Sample A1 can be viewed as evidence of the conversion of sp$^2$ edge states into sp$^3$ states associated with diamondlike seams. The conversion of the sp$^2$ edge states into sp$^3$ states associated with diamondlike seams also hints at a tectonic mechanism behind the formation of the seams, and this causal mechanism is explored further in connection with Sample A3 and the samples pertaining to Study B.

Outside of the f-2 peak position, another possible indication of the presence of sp$^3$ states in the Raman spectrum is the shoulder feature associated with the $D_u$ peak. This shoulder, which appears between 1100 cm$^{-1}$ and 1200 cm$^{-1}$ in FIG. 13, is fitted by the broad f-1 peak in FIG. 16 and is centered at 1185 cm$^{-1}$. A broad peak between 1150 cm$^{-1}$ and 1200 cm$^{-1}$ has been assigned by previous researchers to sp$^2$-sp$^3$ bonds and would therefore be consistent with the transitions that occur at diamondlike seams. To demonstrate that this feature was not related to trans-PA, we annealed Sample A1 at 1050° C. for 30 minutes. The fitted Raman spectrum of the sample after annealing is shown in FIG. 17 for comparison. The shoulder feature is reduced in intensity and shifted slightly from 1185 cm$^{-1}$ to 1180 cm$^{-1}$ but not eliminated. This shows that it is not trans-PA. However, the annealing has reduced the f-1 peak's area ratio (i.e. the ratio of its area vs. the total area of all 4 fitted peaks) from 0.16 to 0.11. This reduction indicates a reduction of sp$^2$-sp$^3$ bonding and likely a reduction of the sp$^3$ content. Hence, the f-1 peak may also corroborate the diamondlike seam in Sample A1.

A review of the anthracite literature shows red-shifted D bands in the optical Raman spectra in some grades of natural anthracite—unfitted D peaks can be occasionally found with positions below 1340 cm$^{-1}$—while in other less mature or more mature grades the D band appears un-interpolated. In the less mature grades, it may be reasoned that this is because diamondlike seams have not yet been geologically formed. In more mature grades (e.g. meta-anthracites), it may be reasoned that diamondlike seams have been formed and subsequently destabilized, eliminating sp$^3$ states and evolving screw dislocations.

To our knowledge, the basis for the D peak's occasional red-shift has neither been investigated, nor assigned to the diamondlike seams. In optical Raman, the $I_{D_u}/I_{G_u}$ ratio in anthracite tends to be below 1.0, like Sample A1's. Additionally, anthracite often exhibits a blue-shifted G peak, positioned between 1595 cm$^{-1}$ and 1605 cm$^{-1}$, as well as a broad underlying peak that can be fitted between 1500 cm$^{-1}$ to 1550 cm$^{-1}$, consistent with a red-shifted mode of the G peak. Additionally, some grades of anthracite exhibit a shoulder in the range of 1100 cm$^{-1}$ to 1200 cm$^{-1}$. Therefore, the spectrum of Sample A1, along with its HRTEM fringe patterns, are consistent with a synthetic anthracitic network.

Figure 18:
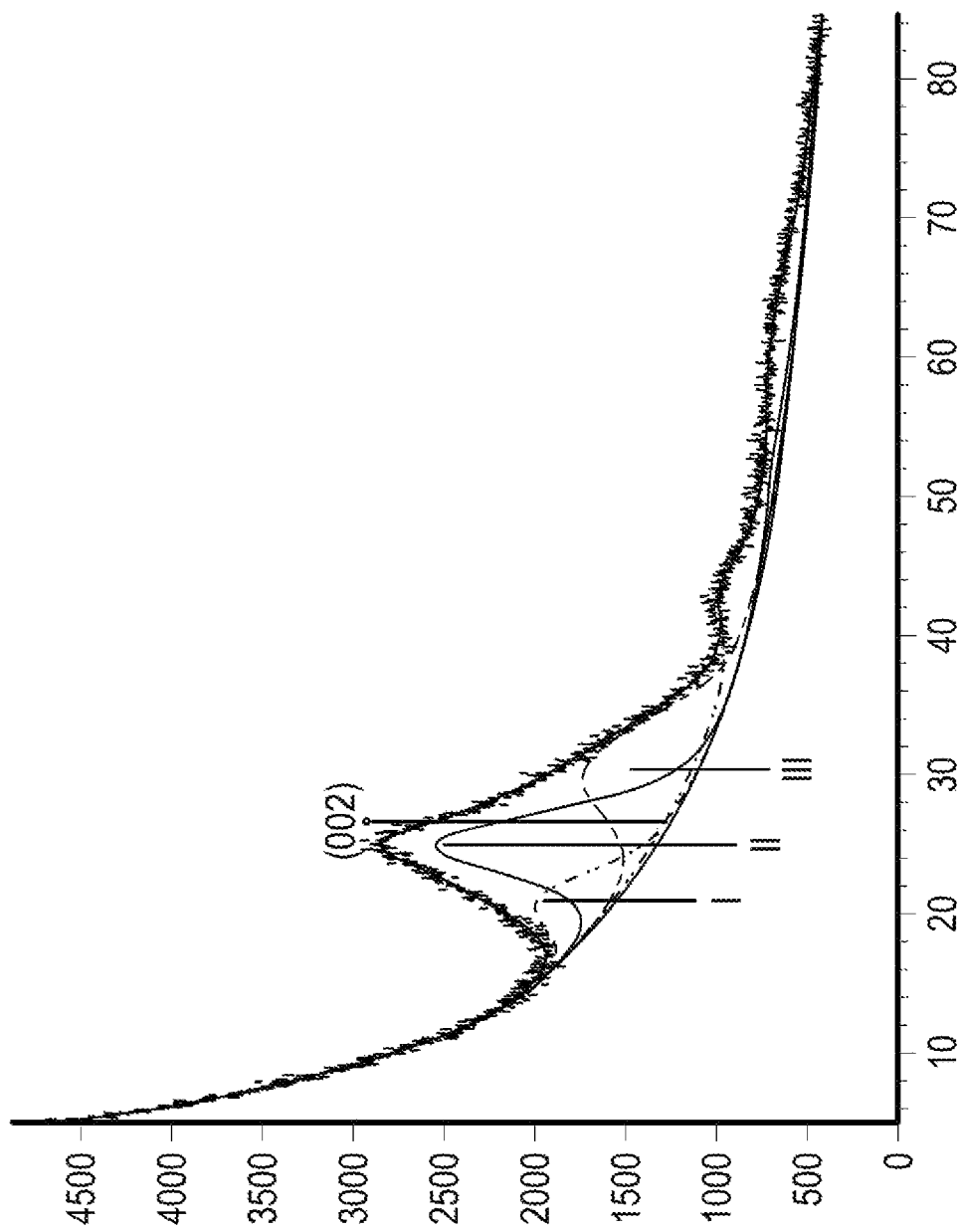
FIG. 18 is the XRD profile of Sample A1 with the three fitted peaks labelled I, II and III. Graphite's <002> peak is indicated for reference.

Further characterization of the anthracitic networks in Sample A1 was obtained via XRD analysis. XRD analysis was done for a sample synthesized using a procedure similar to Procedure A1, but from a magnesium carbonate feedstock powder. This feedstock powder was calcined to obtain an MgO powder with template particles indistinguishable from Sample A1's. As such, the XRD results from this carbon were analyzed to understand the crystal structure of anthracitic networks like Sample A1. FIG. 18 shows the overall XRD profile. Table 2 below contains the XRD peak angles, d-spacings, areas, area percentages (normalized to the area of the dominant peak at 2θ=25.044°), and full-width half max values (without correction for instrument broadening):

TABLE 2

| Peak Angle (°) | d(Å) | Height | Area (α1) | Area (α1)% | FWHM(°) |
|---|---|---|---|---|---|
| 20.995 | 4.2280 | 288.4 | 1519.1 | 32.0 | 4.865 |
| 25.044 | 3.5527 | 810.5 | 4748.2 | 100.0 | 5.237 |
| 30.401 | 2.9378 | 417.4 | 3792.4 | 79.9 | 8.304 |
| 43.282 | 2.0887 | 133.5 | 2168.3 | 45.7 | 8.503 |

Three peaks were fitted in the range of interlayer periodicities. The three fitted peaks are referred to as Peaks I, II, and III, and are labeled in FIG. 18. FIG. 18 also includes reference lines showing the 2θ values associated with graphite's <002>. For Sample A1, the largest fitted peak, as measured by the area under the peak, is Peak II. Peak II obtains a maximum height at 2θ=25.044°, corresponding to a d-spacing of 3.55 Å. The area under Peak II is set to a value of 100% for comparison with the other peak areas. Peak II's FWHM value is 5.237°, indicating a relatively broad range of interlayer spacings. The d-spacing and FWHM values of Peak II together indicate an interlayer spacing within Sample A1 that is more varied and larger than the interlayer spacing in graphitic carbon.

Peak I has a maximum height at 2θ=20.995°, equivalent to a d-spacing of 4.23 Å. Like Peak II, Peak I is also broad, with a FWHM value of 4.865°. The area under Peak I is 32% of the area under Peak II, making it a significant phase of interlayer spacing. A d-spacing of 4.23 Å is too large to be associated with the interlayer phase in graphitic carbon. This peak may reflect the presence of z-adjacent, curved graphenic regions where the curvature is not in phase. Out-of-phase z-deflections disrupt the uniformity of the interlayer spacing and create expanded spaces between the curved regions. This curvature is consistent with anthracitic networks.

Peak III indicates the presence of a phase of smaller interlayer spacing, as well. With a maximum height at 2θ=30.401°, equivalent to a d-spacing of 2.93 Å, the interlayer spacing represented by Peak III is smaller than any interlayer phase in a graphitic carbon. Like Peaks I and II, Peak III is broad, with a FWHM value of 8.304°. The area under Peak III is 80% of the area under Peak II, making it a nearly equivalent phase of interlayer spacing. D-spacing values in the range of 2.93 Å are not found in graphitic carbons, which typically have a <002> d-spacing value of 3.36 Å and no other d-spacings larger than graphite's <100> d-spacing value of 2.13 Å. Heated compression of glassy carbons causes buckling of sp$^2$ regions, sp$^2$-to-sp$^3$ rehybridization, and the formation of sp$^2$/sp$^3$ alloys with interlayer spacings between 2.8 Å and 3 Å. Sample A1's Peak III, with a d-spacing of 2.93 Å, is consistent with this, further corroborating the presence of sp$^3$ states in Sample A1.

Consistent with Sample A1's blue-shifted mode of the G peak, its XRD profile reflects <100> compression. In the intralayer peak range, a <100> fitted peak is fitted with a maximum height at 2θ=30.401°, equivalent to a d-spacing of 2.09 Å. The peak is broad, indicating a broad range of <100> d-spacing values. A <100> d-spacing of 2.09 Å represents a compressive strain of ~2% in the xy-plane compared to the 2.13 Å d-spacing of graphite.

Figure 19:
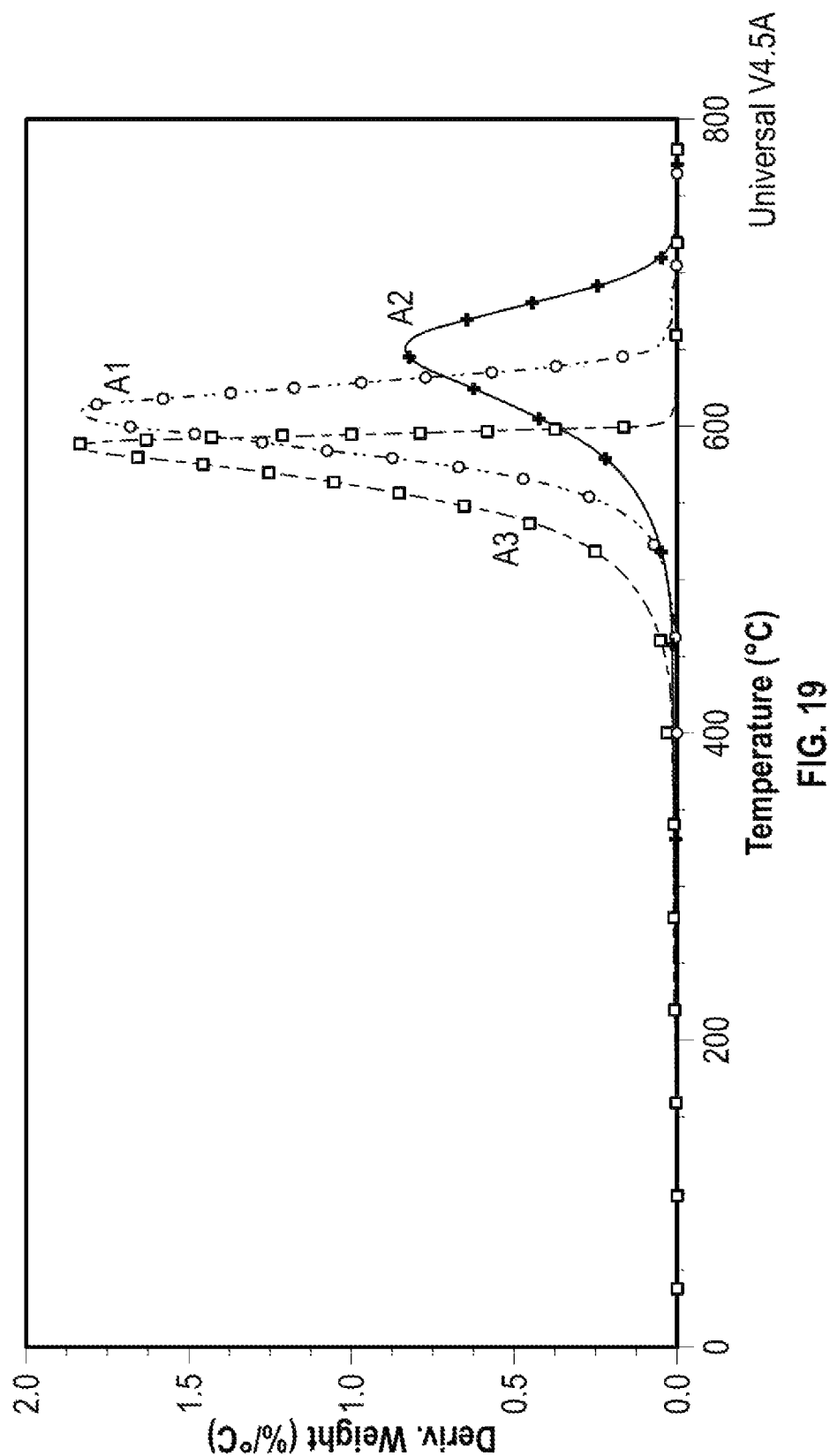
FIG. 19 is the thermal oxidation profile of Samples A1, A2 and A3 obtained from thermogravimetric analysis (TGA) run in air at heating ramp-rate of 20° C./min. The plot shows the derivative of the sample's mass loss with respect to temperature.

The thermal oxidation profile of Sample A1 is shown in FIG. 19. The derivative of the sample's mass loss with respect to temperature is plotted. Sample A1's onset of thermal oxidation occurs between 450 C and 500 C. This is higher than Sample A3, and approximately the same as Sample A2. This indicates that compared to oxidized carbons like graphene oxide, there is a negligible amount of labile mass in Sample A1. The temperature of peak mass loss, at roughly 608 C, is lower than Sample A2's and higher than Sample A3's. Overall, these results are consistent with the temperature at which the CVD was performed; higher-temperature pyrolysis processes will typically create carbons with higher-temperature onset of thermal oxidation and peak mass loss due to increased crystallinity. The only exception in the trend is the early onset of thermal oxidation for Sample A2, which can be attributed to a minor presence of soot that was observed in certain regions of the sample. This soot-like phase was non-conformal to the substrate and presumably formed via gas-phase pyrolysis in free space due to the higher-temperature pyrolysis in Procedure A2. The remainder of Sample A2 exhibits more thermal oxidation stability than other samples, leading to the highest temperature of peak mass loss of all three samples.

FIG. 20 is an SEM image of Sample A2. Analysis of the image reveals the presence of carbon particles that appear to be fragmented perimorphic frameworks. Like Sample A1, the frameworks' templated morphology is apparent, and the perimorphic walls appear to have encapsulated and replicated the templating surface. Unlike Sample A1, however, the frameworks appear broken and deformed in many cases. This loss of their native morphology evidences the perimorphic walls' diminished ability to withstand the mechanical stresses encountered during liquid-phase template extraction and drying. This breakage, in view of the mildness of the extraction procedure, which involved gentle stirring and subsequent drying, suggests that the perimorphic frameworks do not comprise complete anthracitic networks, but instead vdW assemblies that can be easily broken and deformed by shear-related failure.

Figure 21B:
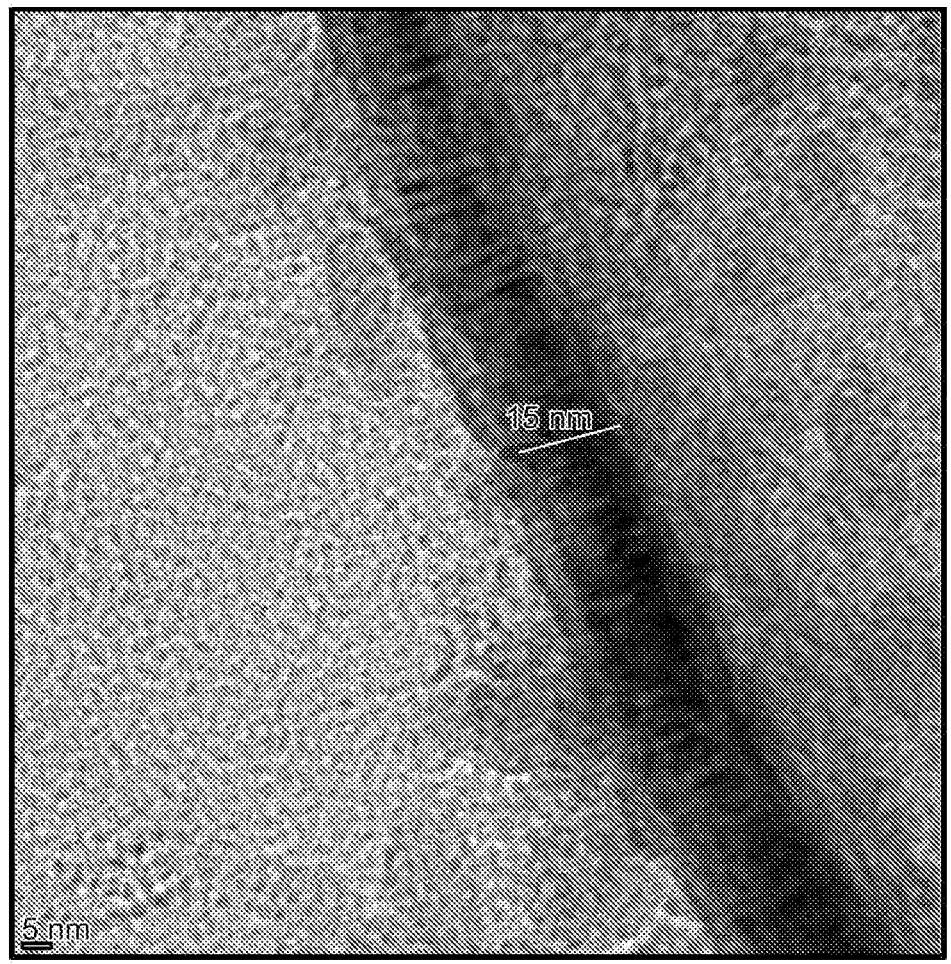
FIG. 21B is a TEM micrograph showing a section of a perimorphic wall in Sample A2.

TEM analysis of Sample A2 corroborates the deformed, fragmented appearance of the frameworks in the SEM imagery. FIG. 21A is a TEM image revealing the extent of the damage incurred during template extraction. The appearance is very different compared to the largely intact, undeformed particles observed in Sample A1 (as shown in FIG. 10A). In FIG. 21B, the perimorphic walls are revealed to be of comparable thickness to the walls of Sample A1. The BET specific surface area of Sample A2 was measured at 127 $m^2g^{-1}$, which was approximately 10% lower than Sample A1's (142 $m^2g^{-1}$), suggesting that Sample A2's average wall thickness is between 20 and 21 layers—slightly thicker than Sample A1. The BJH specific porosity of Sample A2, at 0.37 $cm^3g^{-1}$, was also similar to Sample A1's (0.35 $cm^3g^{-1}$), although we again note that this measurement underestimates the contribution of larger macropores.

Figure 21C:
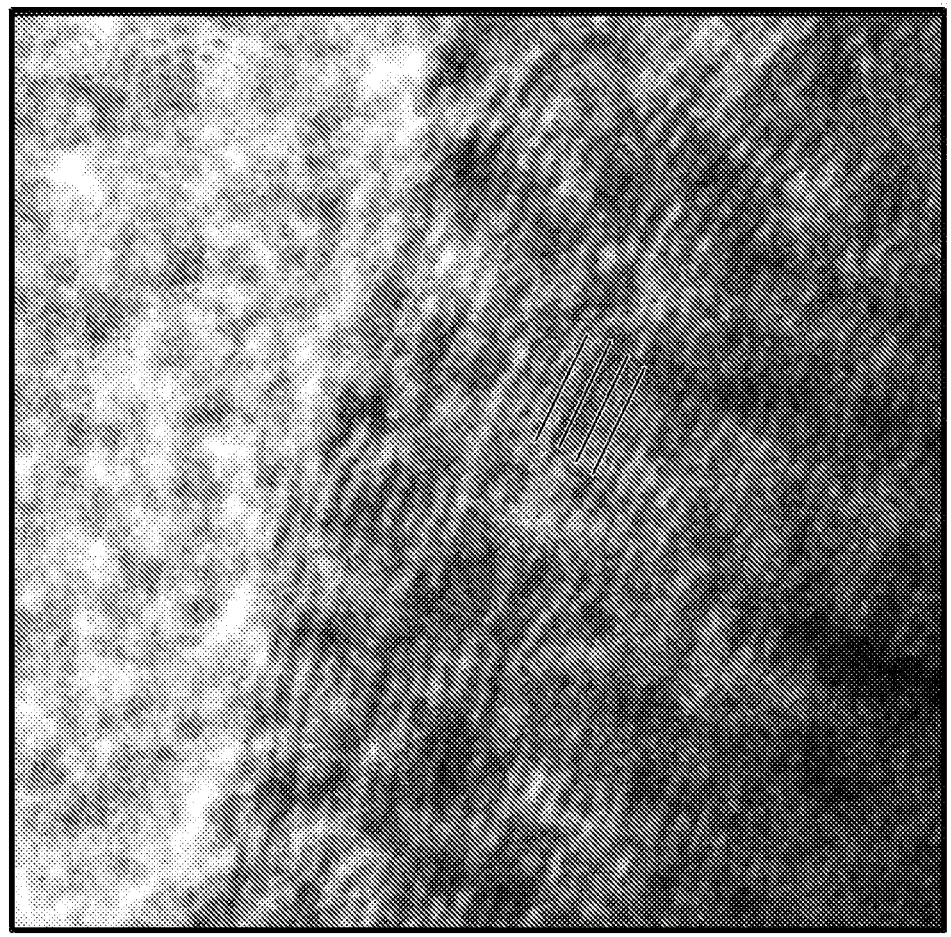
FIG. 21C is a TEM micrograph showing the perimorphic wall's graphitic layering dark fringe lines are traced in black and white lines.

In FIG. 21C, the fringe lines associated with the layered architecture can be observed. In spite of the long-range curvature of the perimorphic wall, both dark and bright fringe lines are generally linear. This indicates the reduced ring-disorder and curvature of these graphenic regions compared to the regions observed in Sample A1. The fringe lines, as shown by the tracing in FIG. 21C, are substantially parallel, and we can therefore describe the layers as nematically aligned. While a few potential instances of fringe patterns associated with crosslinking dislocations could be identified, these were considerably scarcer than in Sample A1. While occasional crosslinking dislocations are present in these perimorphs, they were insufficient to form an anthracitic network.

Figure 22:
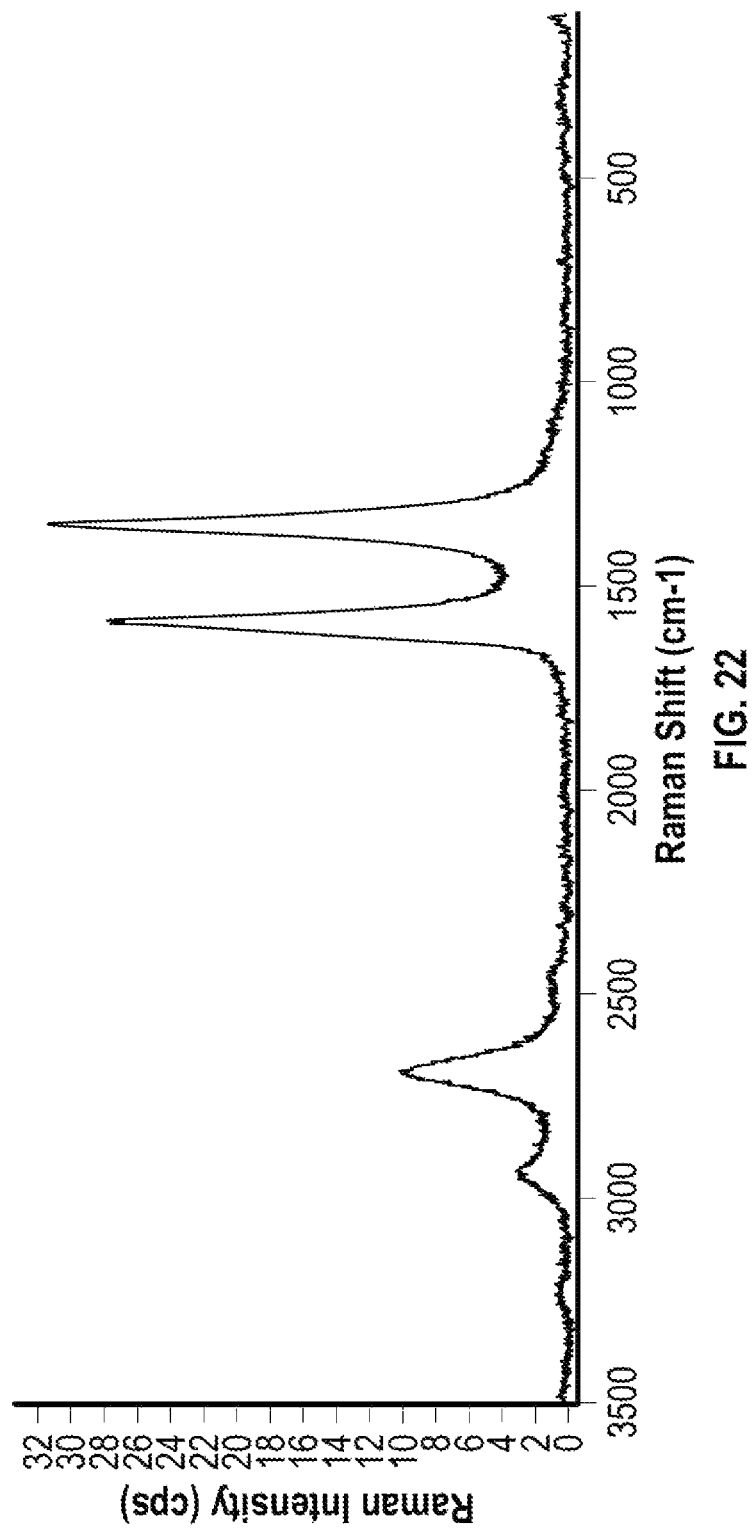
FIG. 22 shows a single point Raman spectrum for Sample A2 taken using 532 nm laser at 2 mW power setting.

More information about the bonding structure of Sample A2 can be derived from its Raman spectra. A single-point Raman spectrum, taken using a 532 nm laser at 2 mW power, is shown in FIG. 22. No smoothing has been performed. The three dominant features of the profile are the $D_u$ peak at approximately 1349 $cm^{-1}$, the $G_u$ peak at approximately 1587 $cm^{-1}$, and the $2D_u$ peak at approximately 2700 $cm^{-1}$.

Compared to Sample A1, Sample A2 has a much lower intensity $Tr_u$ feature, with an $I_{Tr_u}/I_{G_u}$ ratio of less than 0.15. This is consistent with less contribution from an underlying, red-shifted mode of the G peak and the absence of ring disorder-induced tensile strain. The lack of ring disorder and associated stretching is in good agreement with the observation of less curvature in FIG. 21C. Additionally, the $G_u$ peak's natural position at 1587 $cm^{-1}$ signifies an absence of the compressed regions that were present in Sample A1. The prominent presence of the $2D_u$ peak indicates a turbostratic stacking arrangement of hexagonally-tiled layers in Sample A2.

Compared to Sample A1's average $D_u$ peak, Sample A2's average $D_u$ peak exhibits a higher intensity, with an average $I_{Du}/I_{Gu}$ ratio is greater than 1.0. This, along with the emergence of a $2D_u$ peak (with an average $I_{2Du}/I_{Gu}$ ratio of 0.265) reflects the increased crystalline order of Sample A2 compared to Sample A1. While an increase in D band intensity in the spectrum of crystalline carbons corresponds to a decrease in crystallinity (e.g. in the amorphization of graphite to nanocrystalline graphite), Sample A1 is nanocrystalline, and so its higher D band intensity indicates increased crystalline order compared to Sample A2.

The $G_u$ peak is slightly asymmetrical due to the presence of a shoulder at approximately 1620 $cm^{-1}$. This originates from an underlying D' peak at 1620 $cm^{-1}$, which becomes conspicuous due to Sample A2's high density of $sp^2$ edge states. The prevalence of $sp^2$ edge states is also indicated by the narrow $D_u$ peak centered at 1349 $cm^{-1}$. This D band does not appear to be significantly interpolated with any lower-frequency $sp^3$ bands, indicating that most RBM phonons are being activated by $sp^2$ edge states, not by $sp^3$ states associated with diamondlike seams. The D* peak observed in Sample A1 is also absent or negligible.

Table 3 below contains the XRD peak angles, d-spacings, areas, area percentages (normalized to the area under the dominant peak at 2θ=25.8319°), and FWHM values (without correction for instrument broadening) for a sample synthesized using a procedure similar to Procedure A2, but from a magnesium carbonate feedstock powder. This powder was calcined to obtain an MgO powder with template particles indistinguishable from Sample A2's. As such, the XRD results from this carbon were analyzed to understand the crystal structure of assemblies like Sample A2.

TABLE 3

| Peak Angle (°) | d(Å) | Height | Area(α1) | Area(α1)% | FWHM(°) |
|---|---|---|---|---|---|
| 22.9703 | 3.86861 | 1547.6 | 11733.5 | 13 | 7.123 |
| 25.8319 | 3.44618 | 31354.2 | 90198.4 | 100 | 2.042 |
| 31.2063 | 2.86384 | 420.4 | 4622.9 | 5.1 | 10.333 |
| 42.6906 | 2.11627 | 2129.6 | 2995.2 | 3.3 | 1.073 |

Three peaks were fitted in the range of interlayer periodicities. The three fitted peaks are referred to as Peaks I, II, and III, where the ascending numbers correspond to the ascending 2θ values at which the peaks obtain their maximum intensity values. The largest fitted peak, as measured by the area under the peak, is Peak II, which obtains a maximum height at 2θ=25.8319° and a corresponding d-spacing of 3.45 Å. The area under Peak II is set at a value of 100%. The d-spacing value of Peak II is consistent with the <002> d-spacing of turbostratic graphitic carbon, and the peak is considerably sharper than Sample A1's Peak II.

Peak I has a maximum height at 2θ=22.9703°, equivalent to a d-spacing of 3.87 Å—a contraction from the corresponding d-spacing of 4.23 Å in Peak I of Sample A1. The area under Peak I is only 13% of the area under Peak II, making it a significant, but smaller phase, whereas the Peak I phase in Sample A1 was 32% of the area of Peak II. The presence of Peak I may reflect larger z-intervals at edge dislocations, or a reduced but not eliminated presence of non-hexagonal rings. The diminishing presence of large, irregular <002> d-spacings is again consistent with the appearance of Sample A2's more aligned, planar fringe lines, as shown in FIG. 21C.

Peak III indicates a minor presence of a contracted phase of interlayer spacing. With a maximum height at 2θ=31.2063°, equivalent to a d-spacing of 2.86 Å, the interlayer spacing represented by Peak III is significantly smaller than any interlayer spacing in a graphitic carbon. Peak III is also exceptionally broad, with a FWHM value of 10.33°. The area under Peak III is only 5.1% of the area under Peak II, making it a fairly insignificant phase. This is consistent with the scarcity of Y-dislocations observed in Sample A2.

Lastly, the intralayer periodicity at 2θ=42.6906° corresponds to a <100> d-spacing of 2.12 Å, which is close to the graphitic d-spacing of 2.13 Å. This corroborates the lack of compressive strain reflected in the $G_u$ peak's natural position at 1587 cm$^{-1}$. This may indicate that compressive strain is tied somehow to the formation of crosslinking dislocations and the xy-intervals over which they occur.

The thermal oxidation profile of Sample A2 is shown in FIG. 19. The derivative of the sample's mass loss with respect to temperature is plotted. The onset of thermal oxidation for Sample A2 occurs between 450° C. and 500° C., which is higher than Sample A3, and approximately the same as Sample A1. Sample A2's temperature of peak mass loss, at 650° C., is higher than both Sample A1's and Sample A3's, reflecting the increased stability of its nanocrystalline graphite structure. The greater breadth of temperature over which Sample A2 is thermally oxidized corresponds to the presence of easily oxidized soot, which causes an early onset of thermal oxidation.

A further practical demonstration of the degraded mechanical properties in Sample A2 vs. Sample A1 was obtain via a uniaxial compression test. In this test, the Sample A1 and Sample A2 powders were each uniaxially compressed to the same pressure. After compression, Sample A1 retained its powder form, suggesting a lack of compaction, while the Sample A2 powder was compacted into a firm, monolithic pellet.

Figure 23:
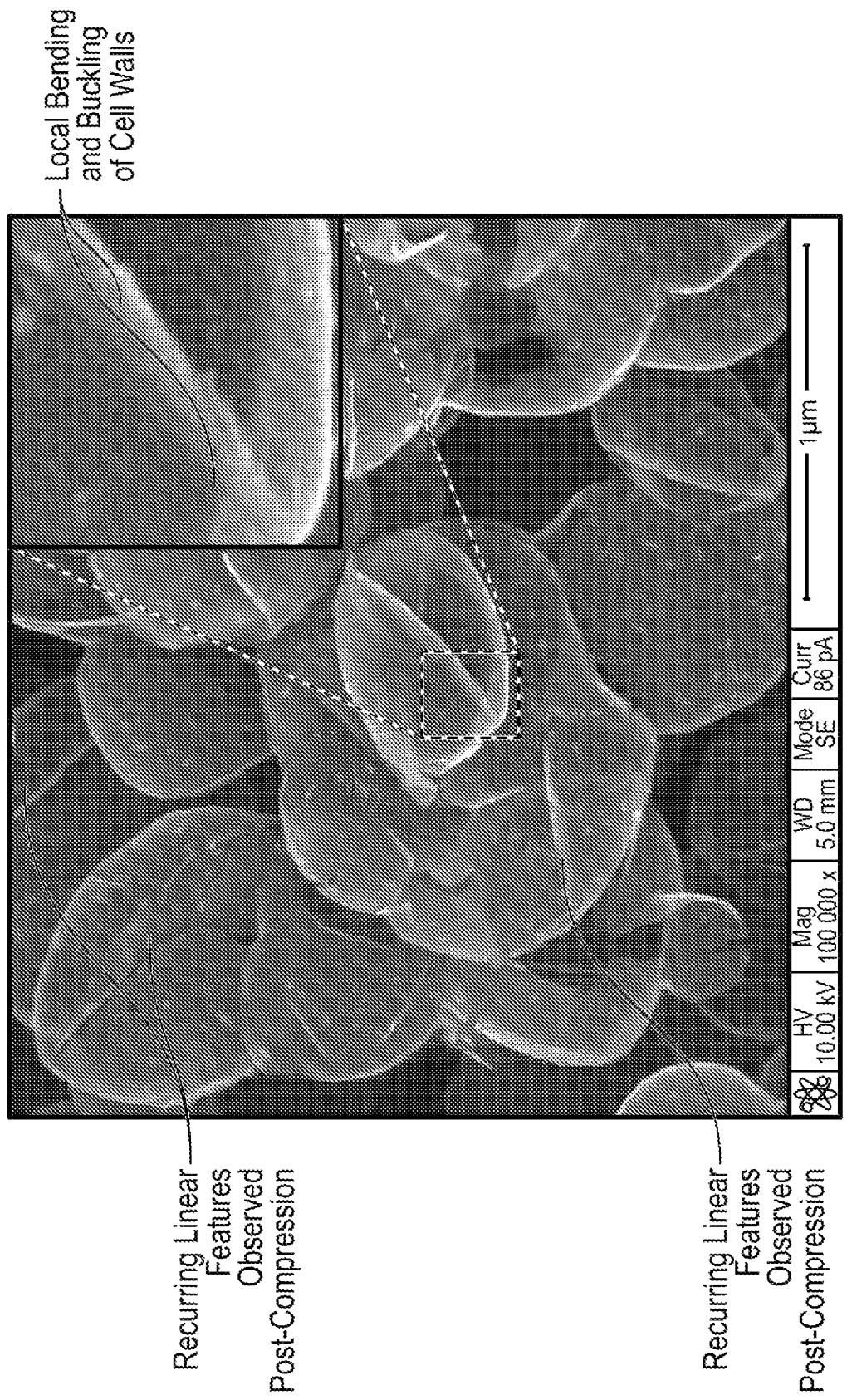
FIG. 23 is an SEM micrograph of Sample A1 post-compression, showing perimorphic frameworks retaining three-dimensional, macroporous morphology with linear features in the wall due to buckling. The magnified inset shows a buckled wall.

SEM was performed to obtain a better understanding of the powders under compression. FIG. 23 is an SEM image of the Sample A1 perimorphic frameworks post-compression. The frameworks can be observed to have retained their porous morphology. While breakage of the perimorphic wall can be observed in many of the particles, other perimorphic walls exhibit linear features that were not present prior to compression. These linear features are indicated in FIG. 23 and magnified in the inset. In the inset, the perimorphic wall can be observed to have buckled inward, creating an internal fold that results in a linear surface feature. Many of the Sample A1 particles after compression exhibit local buckling, indicating that their perimorphic walls were able to bend locally. The retention of the frameworks' porous morphology indicates the walls' ability to resist inelastic shear yielding and to store elastic potential energy, springing back upon release of the uniaxial compression. This elasticity, owing to the anthracitic networking within the walls, prevents the frameworks from compacting irreversibly into a paper-like pellet.

Figure 24:
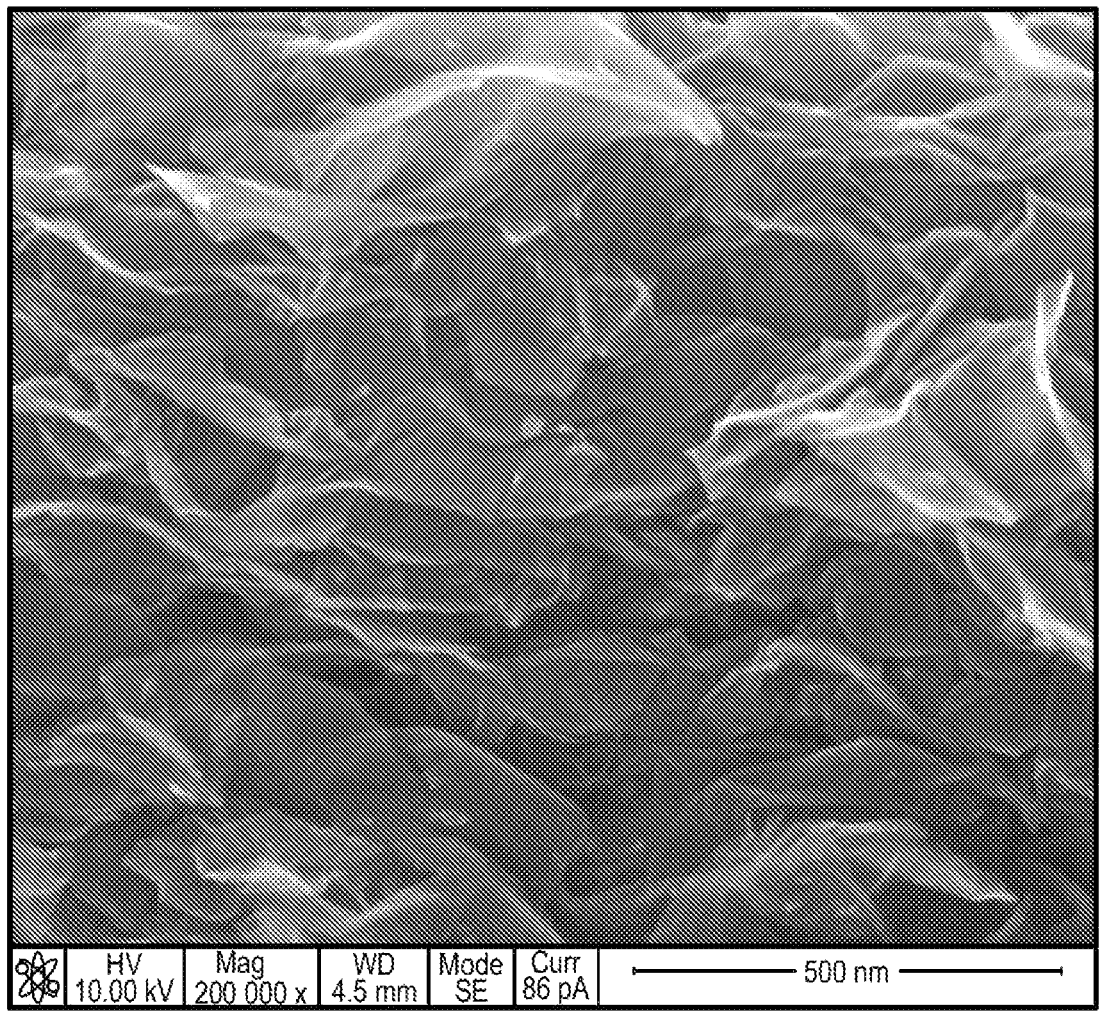
FIG. 24 is an SEM micrograph of Sample A2 post-compression, showing a paper-like assembly of broken, flattened frameworks.

By contrast, FIG. 24 is an SEM image of the Sample A2 perimorphic frameworks after compression. The porous morphology of the Sample A2 frameworks have been destroyed. The resulting paper-like assembly of sheets is consistent with the observation of these frameworks' increased tendency to deform plastically and fragment during liquid-phase processing and drying. During compression, the layers within the perimorphic walls are able to shear apart due to the lack of anthracitic networking. The frameworks' lost porosity and compaction into a laminated structure is what creates the pellet, which cannot spring back upon release of the uniaxial compression due to a lack of stored elastic potential energy. Hence, the lack of anthracitic networking in the walls prevents the perimorphic frameworks in Sample A1 from being able to rebound.

Figure 25A:
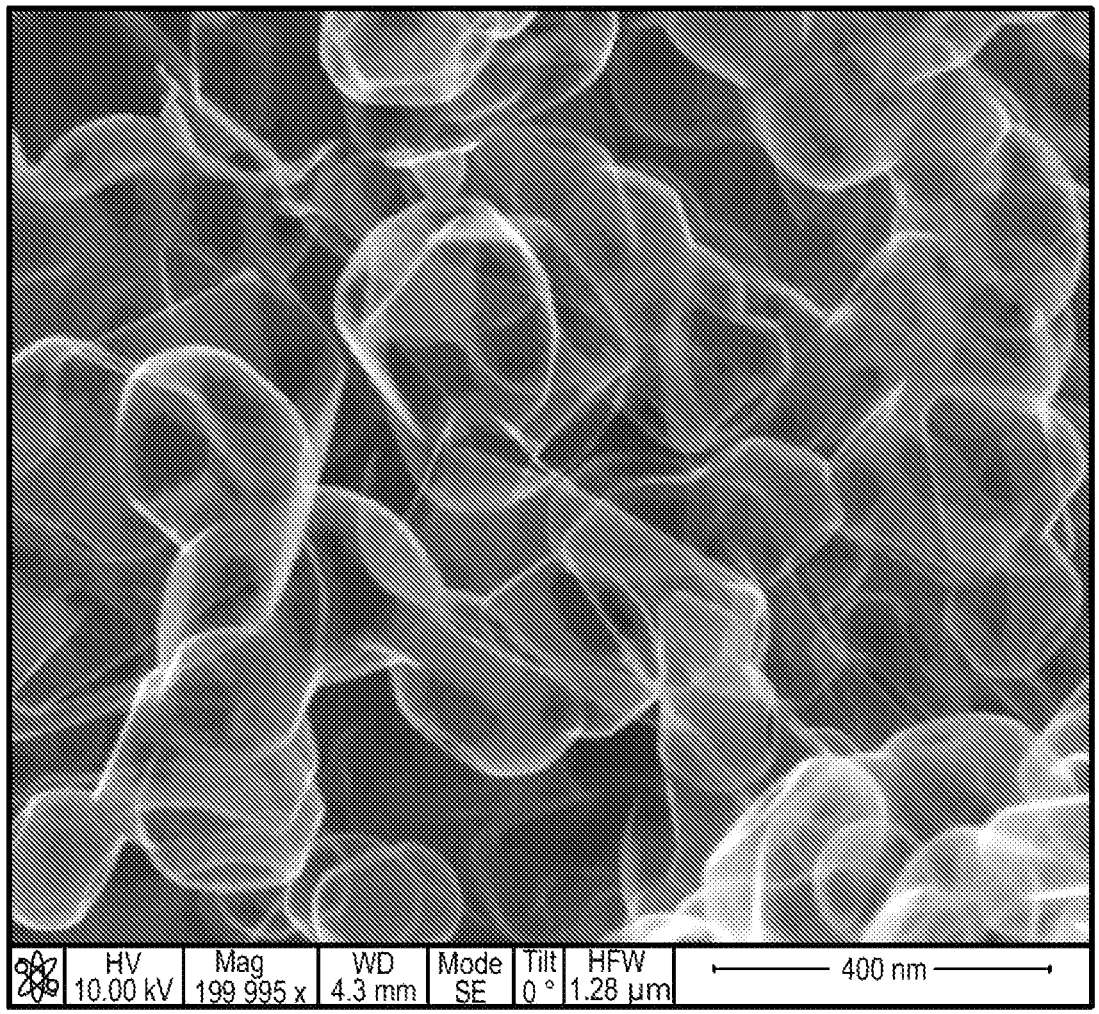
FIG. 25A is an SEM micrograph showings the polyhedral particle morphology and the large, flat facets of the perimorphic frameworks in Sample A3.
Figure 26:
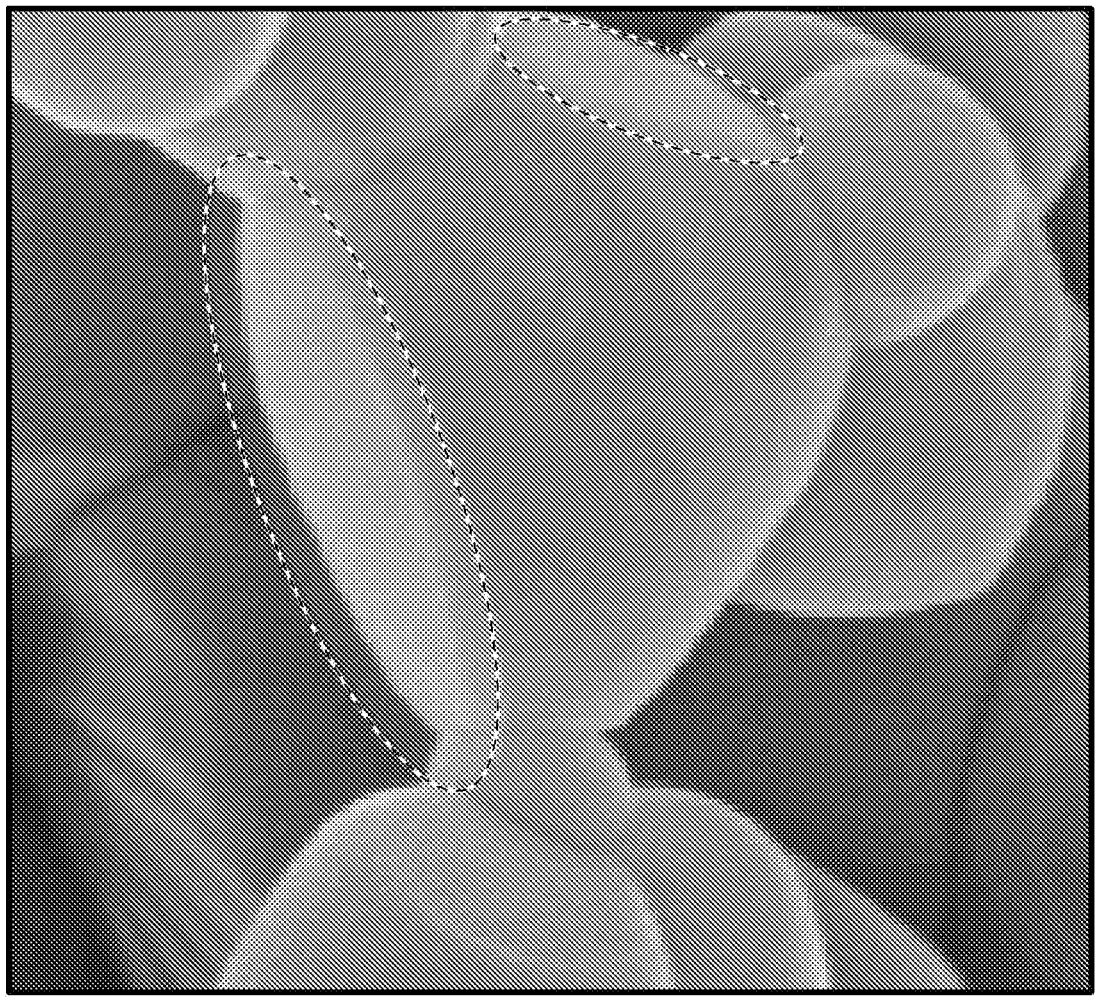
FIG. 26 is an SEM micrograph of the polyhedral MgO template used to generate Sample A3. Atomically flat templating facets are circled.

FIG. 25A is an SEM image of Sample A3. Like the particles in Samples A1, the perimorphic frameworks in Sample A3 retain their native pore-and-wall morphology without much sign of deformation. This morphology mirrors the template, which comprises a partially sintered powder of conjoined, polyhedral MgO crystals, as shown in FIG. 26. The conjoined subunits of the perimorphic frameworks possess large, flat facets and appear more polyhedral than those in Sample A1. In the SEM micrograph of FIG. 25A, it is unclear where individual frameworks begin or end, or how many distinct frameworks there might be in this image.

Figure 25B:
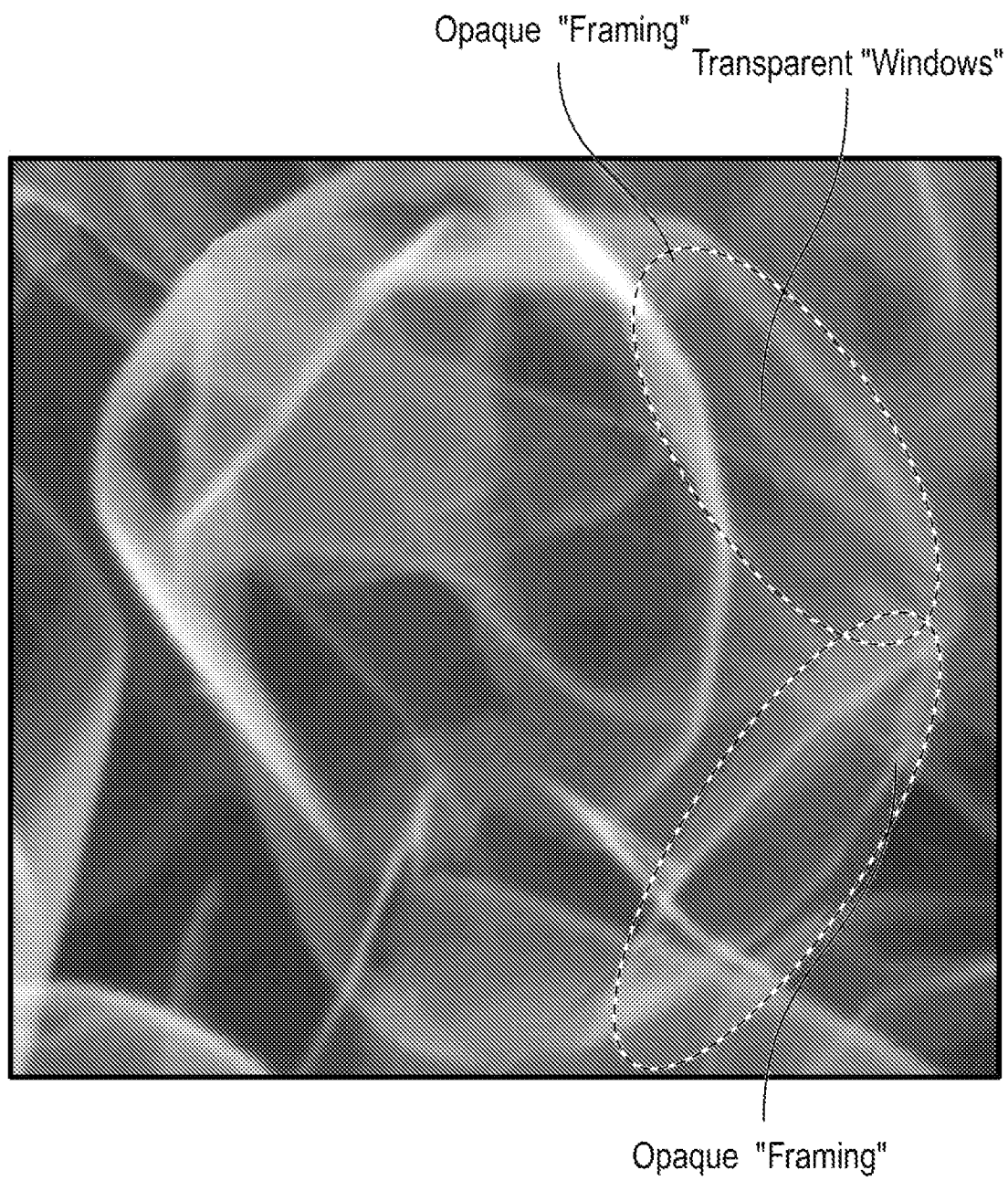
FIG. 25B is an SEM micrograph showing the frameworks' transparent windows and opaque framing. Two windows of the wall are circled.

Compared to the perimorphic walls in Samples A1 and A2, which exhibited a consistent appearance, the walls in Sample A3 have regions that are transparent and regions that are opaque. The transparent regions are found within the flat facets of the frameworks and at first glance appear to be holes in the perimorphic wall. FIG. 25B is a magnified view of a polyhedral, perimorphic structure present in FIG. 25A. Two transparent areas ("windows") are circled. The windows are located in the central area of flat facets, as labeled in FIG. 25B, and they are ringed by a narrow, more electron-opaque strip running around the perimeter of the facet. These strips are referred to herein as "framing," because they give the windows a framed appearance, as shown in FIG. 25B. The framing on a facet typically hugs the facet's edges, although occasional, more electron-opaque tendrils can be observed extending inward.

Figure 25C:
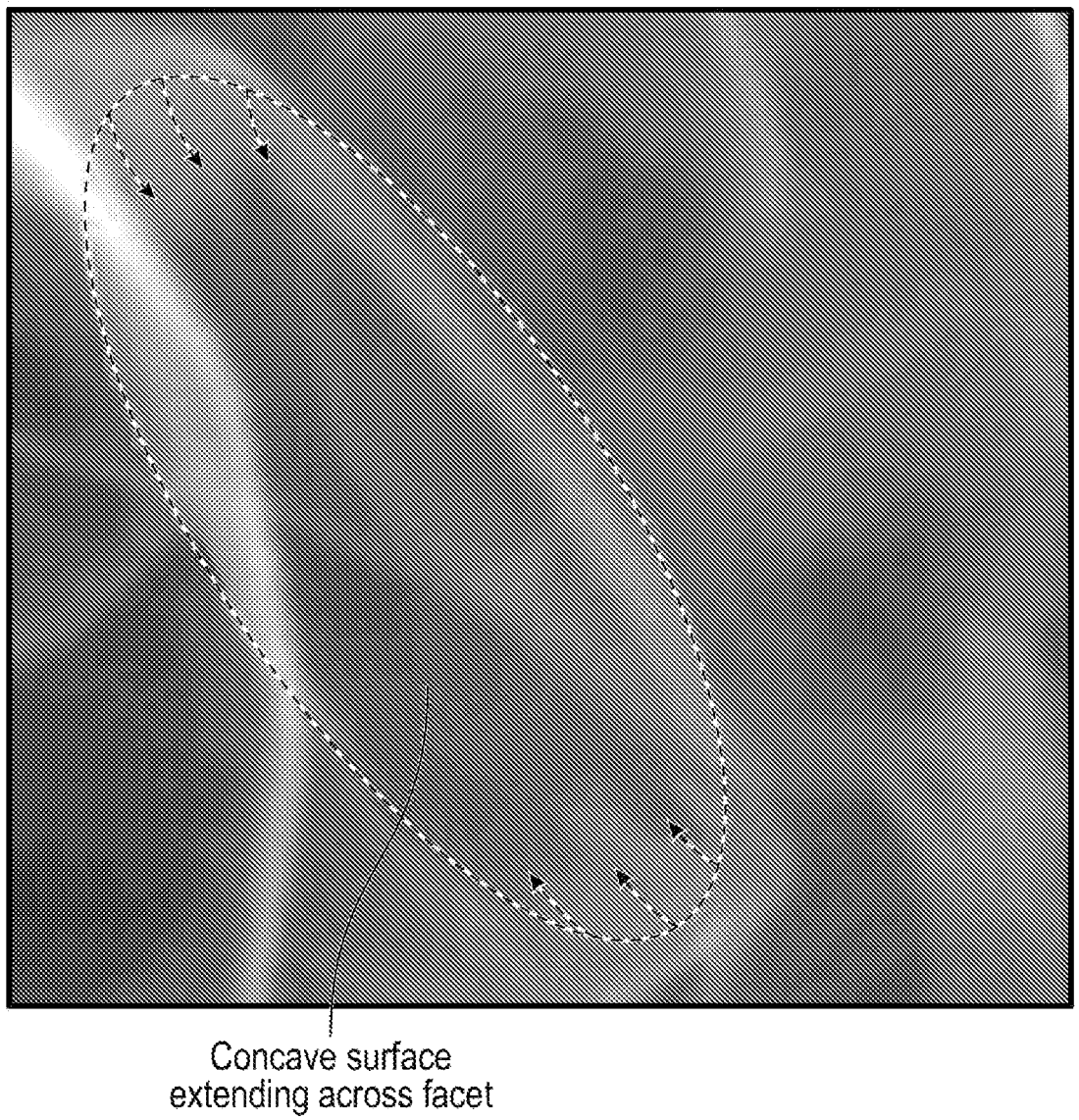
FIG. 25C is an SEM micrograph showing the concave curvature of the transparent window extending across the framing.

As shown by the arrows in FIG. 25C, the opaque framing around a window generally points across the window toward the framing on the opposing side, as though the framing were cohered to a transparent surface. In the facet shown in FIG. 25C, and in many other instances that were readily identified, the gentle, inward (i.e. toward the cell's interior) curvature of the framing could be extrapolated to extend across a slightly concave, transparent surface. This slight concavity is indicated by the curvature of the arrows. This is the first indication that the windows are not physical holes in the perimorphic walls.

If no such transparent surface were in fact present to guide the framing, we would expect to see it bent, frayed, or curled irregularly by the mechanical stresses of template removal and drying. These irregularities would not be expected, however, if the framing were supported by a transparent region of the wall stretching across the facet, like a connective tissue. Instead, it would indicate the geometry of the transparent surface, which might be expected to be slightly concave due to the inward pull of the receding water during evaporative drying of the framework, creating a slight concavity. Indeed, this was the appearance of all of the framing. The conclusion from SEM analysis is that the windows observed in Sample A3 are not holes, but a more electron-transparent phase of the wall.

A phase change in the carbon from the edges of a flat facet to the central area of the facet has been observed by previous researchers. When performing CVD growth of perimorphic frameworks on NaCl cubes, a distinct phase of the wall was identified at the edges and corners of the NaCl facets (where nucleation occurred due to localized melting of the NaCl in these areas). Based on Raman analysis, these regions comprised a multilayer vdW assembly of small graphenic domains. A second phase of larger, more crystalline domains within the perimorphic wall was found in the central area of each facet—i.e. the area where there was less melting and nucleation. These perimorphic walls were broken during dissolution of the template and drying, creating platelet-like fragments. The degeneration of these frameworks stands in contrast to the intactness of the perimorphic frameworks in Sample A3, where no observable platelet-like fragments were observed in the dried carbon powder. The observation that the windows in Sample A3 do not break away and become independent platelet-like particles is a compelling indication that the walls in Sample A3 comprise an anthracitic network rather than a vdW assembly.

Figure 27A:
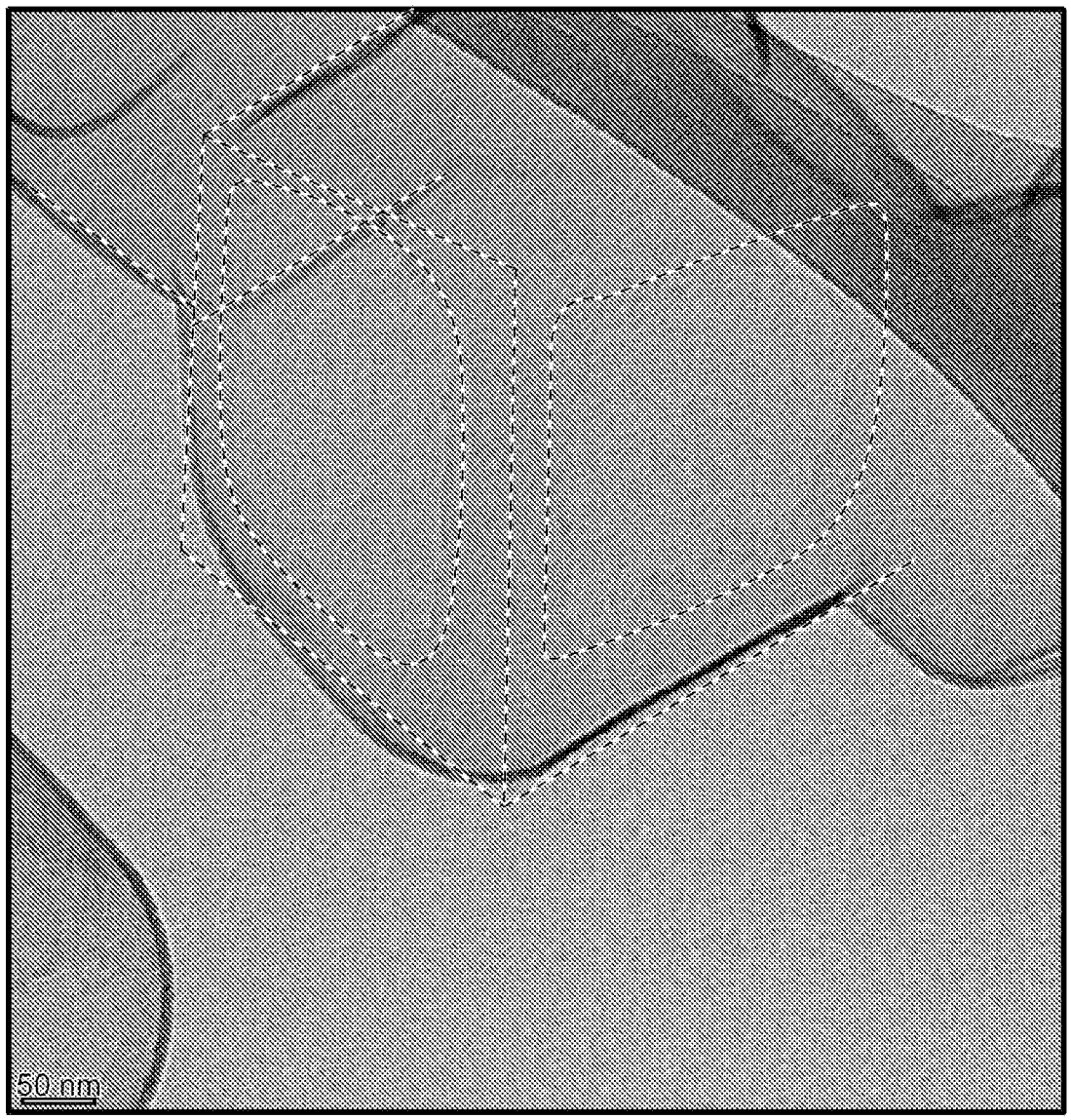
FIG. 27A is a TEM micrograph of a perimorphic framework in Sample A3. T the cuboidal shape of the framework's macroporous subunits is indicated via the dotted lines along the cube's edges. The dotted circles highlight the more electron-transparent windows.

FIG. 27A is an HRTEM image of Sample A3 that shows its overall microstructure. The macroporous subunits of the perimorphic framework shown in FIG. 27A are cuboidal, and dotted lines are used to facilitate a visualization of their cuboidal shape. The more electron-transparent windows on the flat facets of the subunits have been circled with dotted lines in FIG. 27A. Sintering of the MgO template crystals, upon displacement of the template, imparts the endocellular passages that can be observed between the subunits.

Figure 27B:
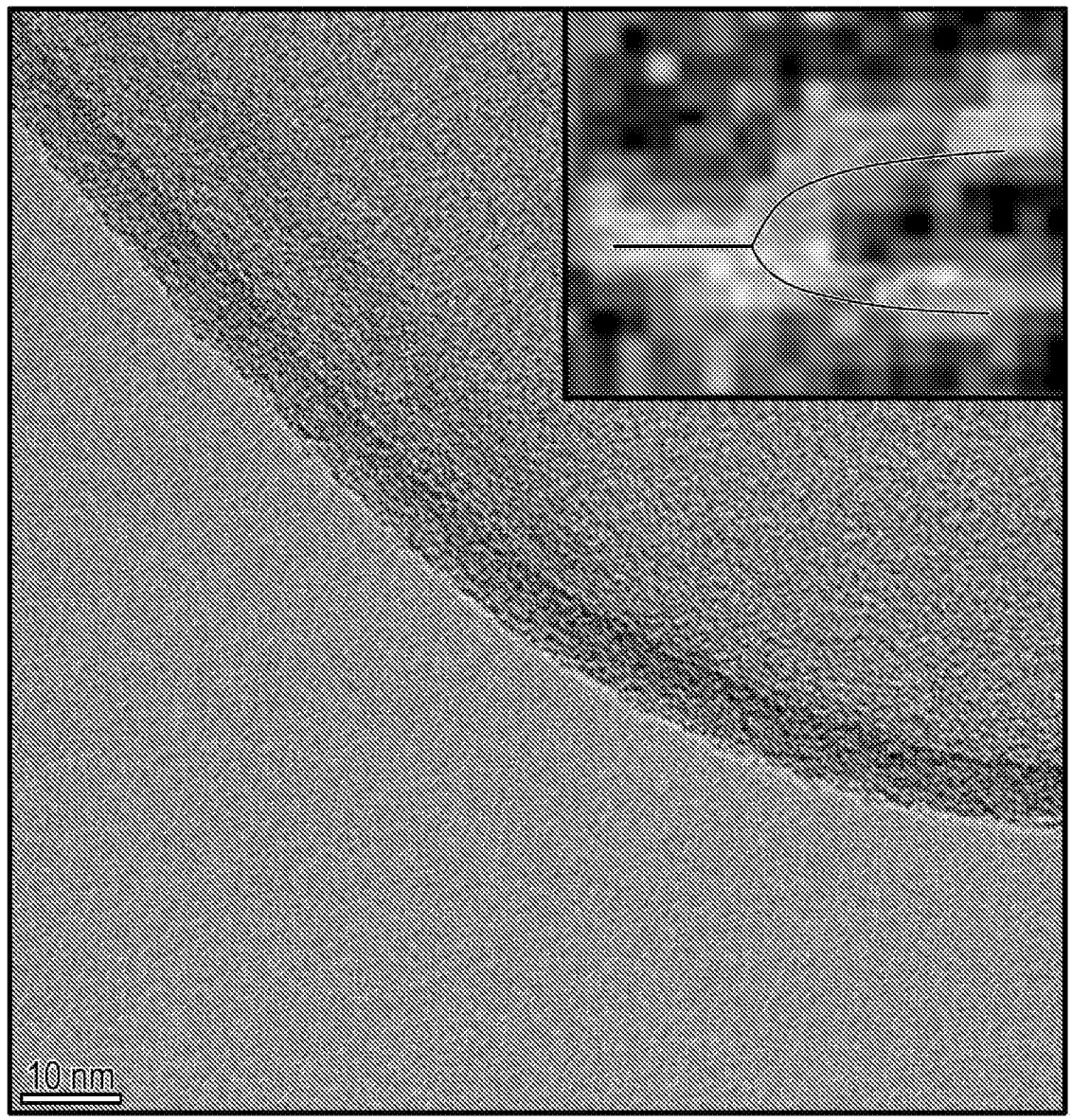
FIG. 27B is a higher-magnification TEM micrograph showing a section of the perimorphic wall. The inset in FIG. 27B shows an example of a Y-dislocation found within the fringes.
Figure 27C:
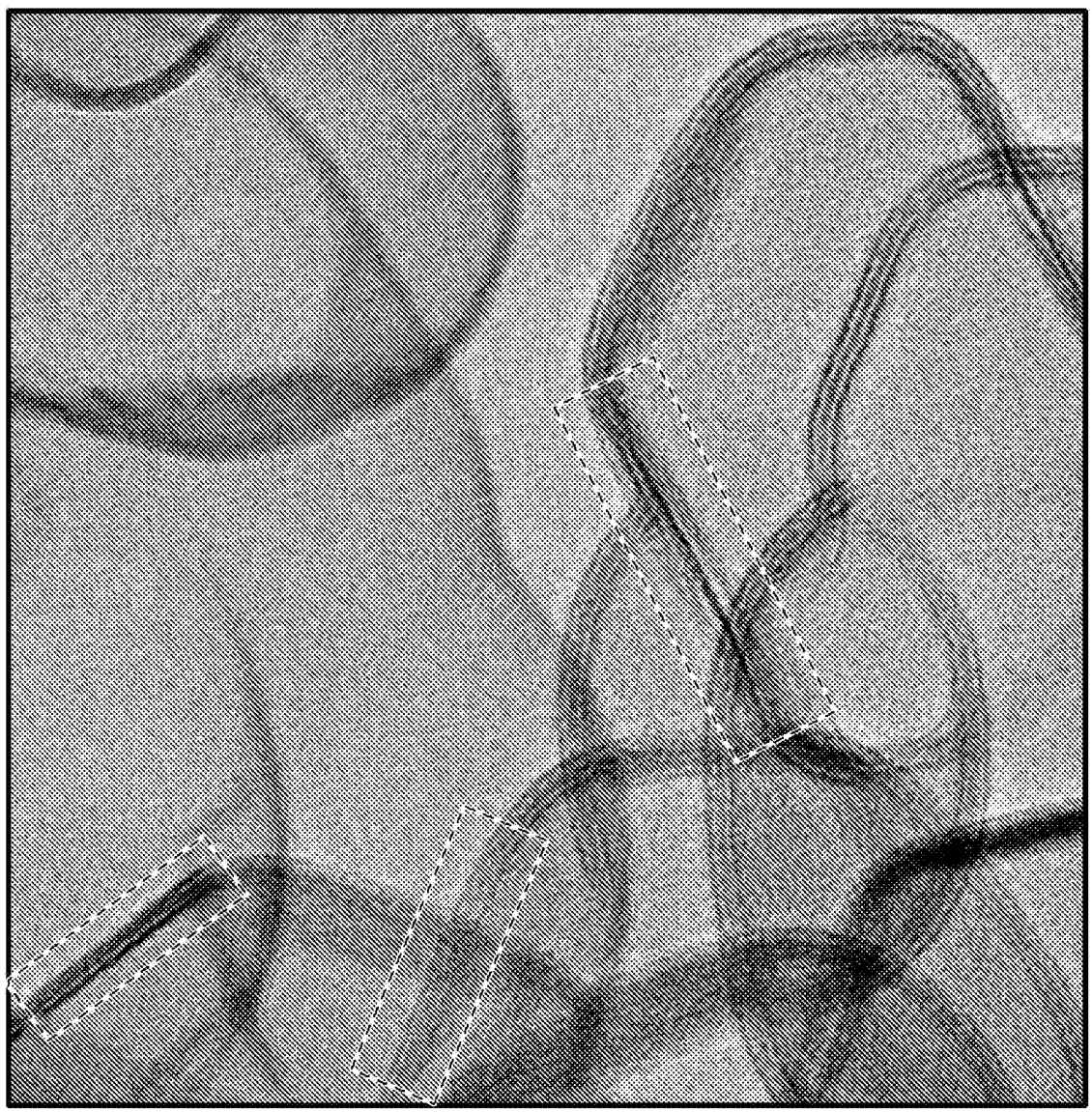
FIG. 27C is a TEM micrograph showing the uniformly thick walls even in the flat "window" regions, as indicated by the boxes. The uniform thickness in the regions indicates that the electron transparency in these regions is related to a lack of local $sp^3$ states.

The perimorphic walls in Sample A3 are somewhat thinner than the walls in Samples A1 and A2. Consistent with this, Sample A3 has a higher BET specific surface area of 328 $m^2g^{-1}$. This BET measurement suggests an average wall thickness of approximately 8 layers (2630 $m^2g^{-1}$/1328 $m^2g^{-1}$=8.0). Cross-sections of the perimorphic walls reveal that they are fairly uniform in thickness and do not exhibit any discontinuities, even in the central regions of flat facets. This is shown in FIG. 27C, where the cross-section of the cell wall across several flat facets (indicated by the dashed rectangles) is uniformly thick and uninterrupted. This was confirmed by observation of numerous facets from many different angles and is another indication that the windows are not holes, but simply transparent regions of the perimorphic wall.

Like Sample A1, Sample A3 exhibits numerous Y-dislocations. A typical fringe pattern drawn from Sample A3 and associated with a Y-dislocation is shown in the magnified inset of FIG. 27B. The ubiquitous presence of Y-dislocations is another indication of the anthracitic networking responsible for the robustness of the Sample A3 frameworks. Additionally, the layering within Sample A3's walls, like the layering in Sample A1's walls, exhibits nematic alignment. However, distinct fringe lines in Sample A3 are more difficult to trace visually over any distance greater than 1-2 nm, suggesting a more crosslinked anthracitic network.

Figure 28:
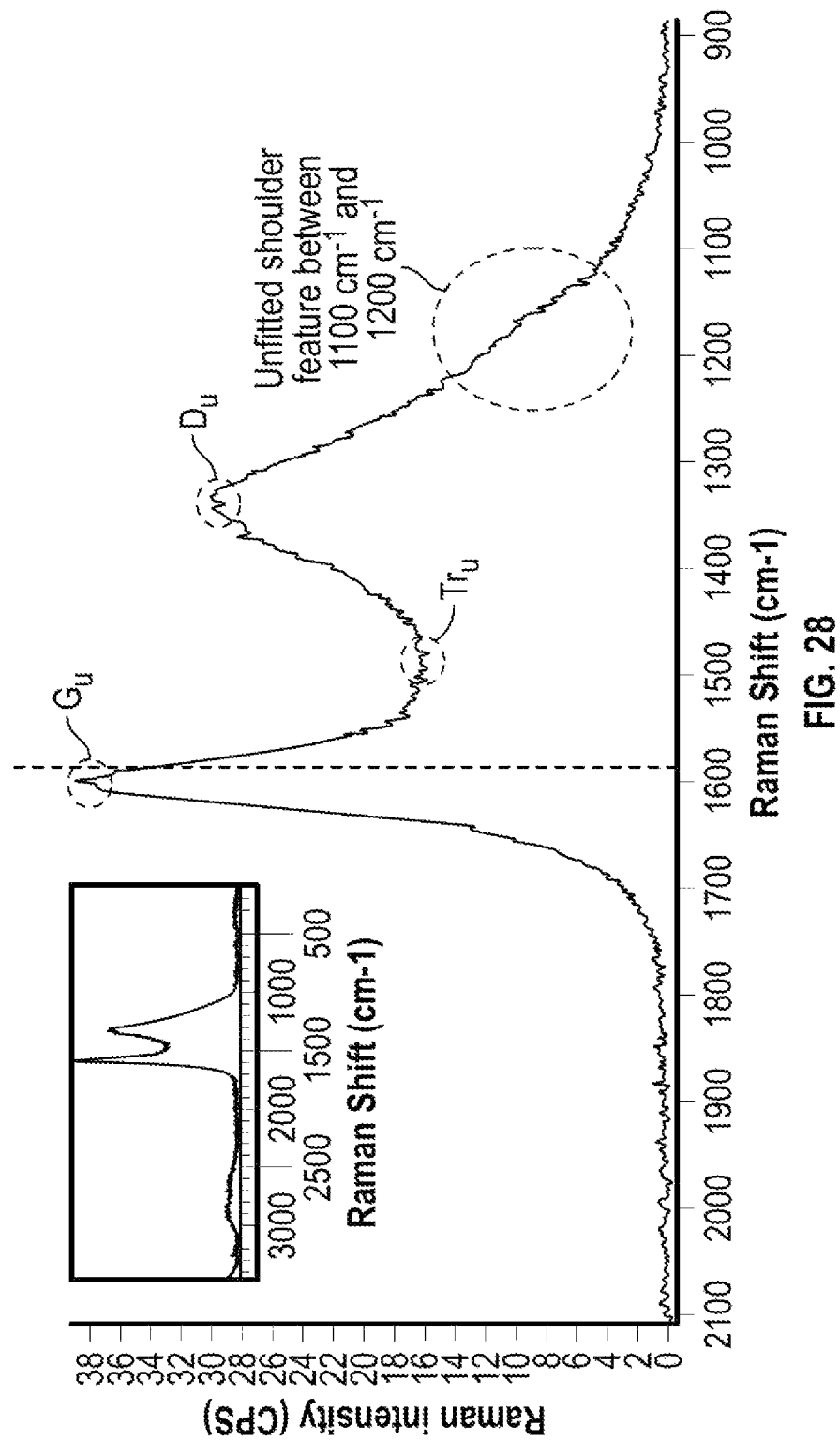
FIG. 28 shows a portion of a single point Raman spectrum for Sample A3. Features of interest are circled. Features include the unfitted G band ($G_u$), unfitted Tr feature ($Tr_u$), unfitted D band ($D_u$) and the unfitted shoulder between 1100-1200 $cm^{-1}$. The customary G peak position at 1585 $cm^{-1}$ is marked with a dotted line, revealing the blue-shifting of the $G_u$ peak for Sample A3. The inset shows the entire Raman spectrum for Sample A3. The spectrum was taken using 532 nm laser at 2 mW power setting.

These observations are corroborated by Sample A3's Raman spectra. A single-point Raman spectrum, taken using a 532 nm laser at 2 mW power, is shown in FIG. 28. No smoothing has been performed. For reference, the full spectrum is shown in the inset of FIG. 28. The overall Raman profile of Sample A3 looks similar to Sample A1 and to anthracite. No $2D_u$ peak is present. The $D_u$ peak is centered at approximately 1340 $cm^{-1}$, reflecting more D band interpolation than was observed in Sample A1 (A1's $D_u$ peak was centered between 1345 and 1350 $cm^{-1}$). This increased interpolation of the D band reflects an increasing prevalence of RBM phonons activated by $sp^3$ states vs. $sp^2$ edge states. Like Sample A1, Sample A3 has a shoulder between 1150 $cm^{-1}$ and 1200 $cm^{-1}$, indicating an underlying D* peak that is consistent with the transitions that occur at $sp^x$ diamondlike seams. This shoulder is labeled in FIG. 28.

Also similar to Sample A1, Sample A3 exhibits a relatively sharp, blue-shifted $G_u$ peak (the usual G peak position at 1585 $cm^{-1}$ is marked with a dashed line in FIG. 28). This blue-shifted mode implies compressive strain. Compared to Sample A1, Sample A2 exhibits a slightly lower trough ($I_{Tr_u}/I_{G_u}$ peak=0.40). However, the trough is still high enough to indicate the presence of a broad, underlying peak. We again assign this to a red-shifted mode of the G band, associated with the presence of ring-disordered regions.

The $I_{D_u}/I_{G_u}$ peak intensity ratio is approximately 0.77, indicating a lower $D_u$ peak intensity in Sample A3 compared to Sample A1. This downward trend in the $D_u$ peak intensity (A2>A1>A3) is positively correlated with the CVD temperature (1050° C.>750° C.>650° C.) and also positively correlated with D band interpolation (i.e. with the increasing prevalence of RBM phonons activated by $sp^3$ carbon). This decreasing $D_u$ peak intensity in disordered carbons is attributable to the progressive loss of $sp^2$ ring structure; in the case of Sample A3, this occurs as $sp^2$ rings are replaced with $sp^x$ rings. The D band's intensity falls as the density of diamondlike seams increases. Therefore, this is consistent with the appearance of a more crosslinked anthracitic network in HRTEM images of Sample A3.

From our characterizations of Samples A1, A2, and A3, we can deduce the tectonic pathway by which diamondlike seams are formed during growth. We begin this discussion with the observation that the window regions of the perimorphic wall are electron-transparent, whereas the surrounding framing, and curved regions of the perimorphic wall, are not. We then connect this to an analysis of nucleation and growth of primordial domains over a templating surface. Finally, we model tectonic encounters between these primordial domains, and show how, under the right circumstances, diamondlike seams are evolved from these encounters.

The non-uniformity of electron transparency in Sample A3, as shown in FIG. 25, arises due to different charging behaviors in different regions of the perimorphic wall. During imaging, more charging occurs in areas of the perimorphic wall that are more electrically insulating. This charging behavior is clearly tied to the geometry of the templating surface. The more conductive windows are associated with atomically flat templating surfaces, such as the facets labeled in FIG. 26, where nucleation of primordial domains was minimal or absent. The less conductive framing and rounded regions of the perimorphic wall are associated with more defective regions of the templating surface, where nucleation of primordial domains was comparatively dense.

Next, we recall that, based on the interpolation of Sample A3's $D_u$ peak, a significant fraction of Sample A3's RBM phonons are activated by $sp^3$ states, which we have associated with diamondlike seams throughout the anthracitic network. In regions of the wall with a greater density of diamondlike seams, and therefore a greater density of $sp^3$ states, we would expect charging to increase due to discontinuities in the π cloud, through which conduction occurs. In regions of the wall with a lesser density of diamondlike seams, and therefore a lesser density of $sp^3$ states, we would expect less charging should occur. Tying these observations together, it appears that regions of the perimorphic wall associated with higher nucleation density appear to charge more, and we attribute this to a greater density of $sp^3$ states associated with diamondlike seams. We further attribute the greater density of $sp^3$ states and diamondlike seam in these regions to their origin in the grafting that occurs at the tectonic interfaces of primordial domains growing over a common substrate surface. Dense, localized nucleation causes the primordial domains to proliferate, leading to increased tectonic interactions, more grafting, and therefore more $sp^3$ states and diamondlike seams.

Next, we analyze the tectonic encounters between these primordial domains. Ring-disordered lattices possess non-zero Gaussian curvature, and their edges have an undulating geometry determined by the local lattice curvature. The ring disorder of primordial domains grown via pyrolysis at temperatures below 900° C. has been evidenced by several examples in the prior art, including the growth of ring-disordered domains on single-crystal MgO <100> wafers and single-crystal germanium <100> wafers. When two such primordial domains are grown over a common substrate surface, a tectonic encounter may occur between their edges. Since the domains' local lattice curvatures and undulating edges are not in phase, this tectonic encounter creates a stochastic, incoherent tectonic interface between the nearby edge segments. Adding to this complexity, the edges of the primordial domains can be conceptualized as a constantly self-rearranging fluid of free radicals. The incoherence of the interface, where the edge atoms of one primordial domain are not consistently above, below, or level with the edge atoms of the other domain, prevents resolution via simple subduction or $sp^2$ grafting.

In FIGS. 29-36, we provide a stepwise illustration of how $sp^2$ and $sp^3$ grafting at an incoherent tectonic interface may lead to the $sp^3$ states and diamondlike seams that cause local charging in perimorphic regions associated with dense tectonic activity, as observed in Sample A3. In reference to the molecular models provided in these figures, and also in reference to all of the other molecular models that follow throughout the remainder of the disclosure, a few comments are in order. First, while we must represent these systems statically, our molecular models should be understood as static representations of dynamic, self-rearranging structures. Second, all such illustrations, which were made using molecular models constructed using Avogadro 1.2.0 software, should be considered as representing only rough, geometric approximations of actual systems. They are meant to provide a helpful, visual illustration of the phenomena described herein. Third, while we do not illustrate the substrates, the pyrolytic growth processes with which we are most concerned in the present disclosure are directed by substrates, and the absence of the substrate in the system is not intended to imply that no substrate is present. Fourth, we do not represent hydrogen atoms in these illustrations because our primary focus is on the evolution of the graphenic structures, which exclude hydrogen by definition. However, in actuality, we understand that hydrogenation and dehydrogenation of these graphenic structures is theorized to be occurring dynamically throughout pyrolytic carbon formation. Fifth, we provide multiple perspectives in order to facilitate visual inspection and understanding of these systems in three dimensions. An edge of the molecular model is traced with dashed tracing in both the V and H1 perspectives to help with orientation. Sixth, while for purposes of explanation we often represent a sequential evolution of the systems under consideration, we do not mean to imply that the sequences, as illustrated, are strict or universal. Seventh, what we intend to demonstrate is how diamondlike seams, chiral columns, and screw dislocations are derived from $sp^2$ grafting and $sp^3$ grafting across tectonic interfaces. We attempt to model how this happens using the simplest models possible for the purposes of communicating the basic concepts.

Figure 29:
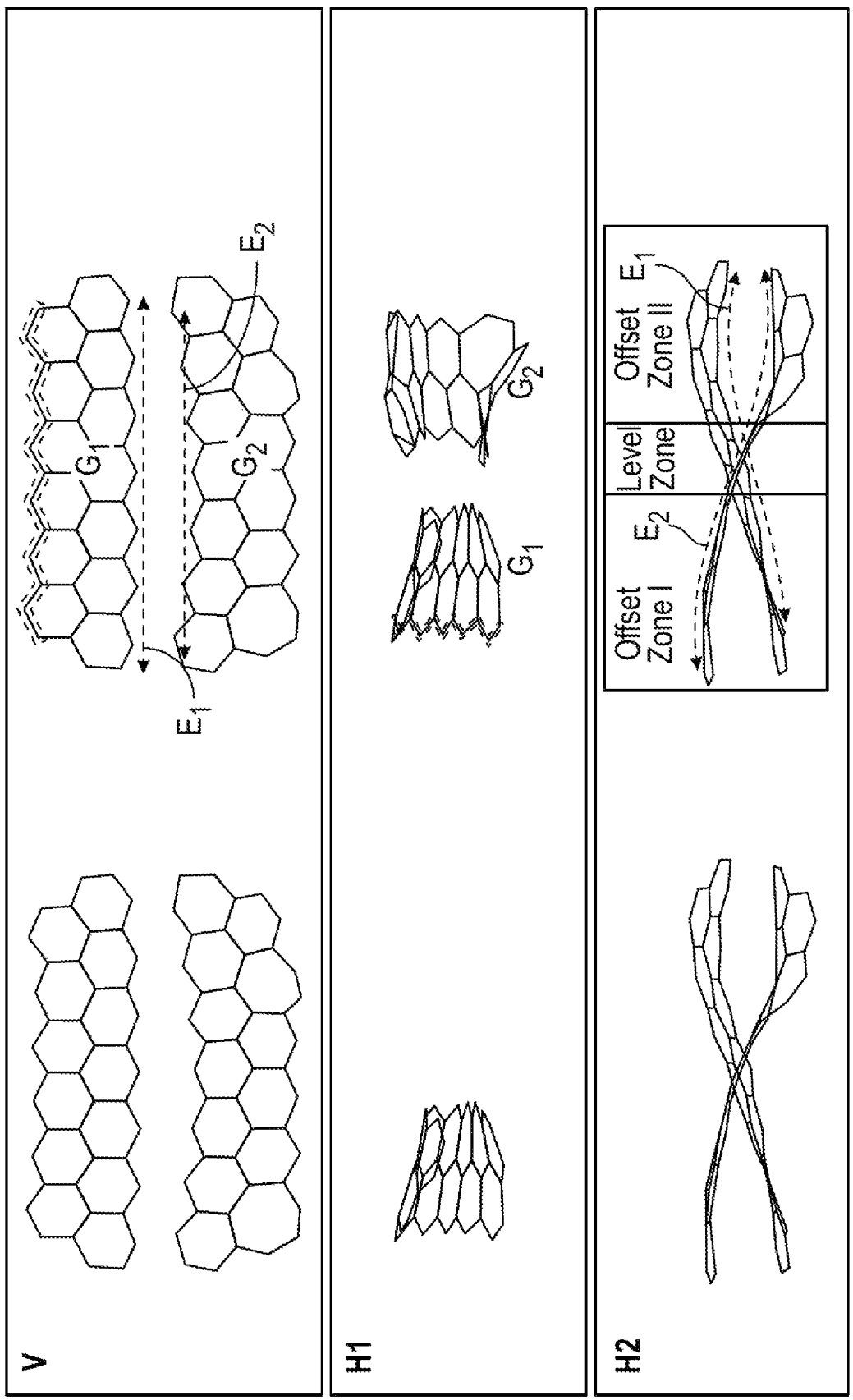
FIG. 29 is an illustration of a hypothetical zigzag-zigzag tectonic interface formed between two ring-disordered primordial domains ($G_1$ and $G_2$). The participating edge segments are labeled $E_1$ and $E_2$. The $E_1$-$E_2$ interface comprises three distinct interfacial zones—Offset Zone I, Offset Zone II and Level Zone. Labelled and unlabeled vertical (V) and horizontal (H1 and H2) perspectives are shown to facilitate visual inspection. In the H2 perspective edge with dashed tracing is in the background.

In the illustration of FIG. 29, an incoherent tectonic interface is shown. The interface is formed by the tectonic encounter between two edge segments ($E_1$ and $E_2$), each of these participating edge segments belonging to a different ring-disordered graphenic structure ($G_1$ and $G_2$, respectively). These edge segments and graphenic structures are labeled in FIG. 29. The tectonic interface between them is described as the $E_1$-$E_2$ interface. We can think of $G_1$ and $G_2$ as primordial domains nucleated on a common substrate surface.

The $E_1$-$E_2$ tectonic interface in FIG. 29 comprises a zigzag-zigzag interface—i.e. an interface in which both of the participating edge segments are in the zigzag orientation. This configuration may evolve as the growing, graphenic structures rearrange themselves, in keeping with free radical condensate growth. From the H2 perspective in FIG. 29, we can see that the primordial domains $G_1$ and $G_2$ are both curved. Accordingly, their edges have an undulating geometry. The incoherence of the edges' z-deflections at the tectonic interface results in three distinct interfacial zones—two offset zones, labeled as "Offset Zone I" and "Offset Zone II," which are located to the sides of the $E_1$-$E_2$ tectonic interface, and a level zone between them. These tectonic zones are labeled in FIG. 29.

The vertical offset within an offset zone is such that opposing edge atoms cannot form $sp^2$-$sp^2$ bonds to their counterparts without severe lattice distortion subduction. Subduction of one edge by the other is also unfavorable. In an offset zone, under the right pyrolytic conditions, edge atoms may undergo $sp^2$-to-$sp^3$ rehybridization and form a $sp^3$-$sp^3$ bond line, grafting the primordial domains together is edge-to-edge. The formation of $sp^3$ states to form bonds in offset zones is herein described as "$sp^3$ grafting."

In a level zone, the vertical offset between the two edges is small enough and the $2p_z$ orbitals of opposing $sp^2$ edge atoms are sufficiently aligned to allow $\pi$ bonds to be formed between the edge atoms. In these zones, under the right pyrolytic conditions, the edge atoms may form a line of $sp^2$-$sp^2$ bonds to one another. This is similar to the $sp^2$ grafting that has been observed between ring-ordered domains in the prior art, except that $sp^2$ grafting at incoherent interfaces is localized at level zones.

Figure 30:
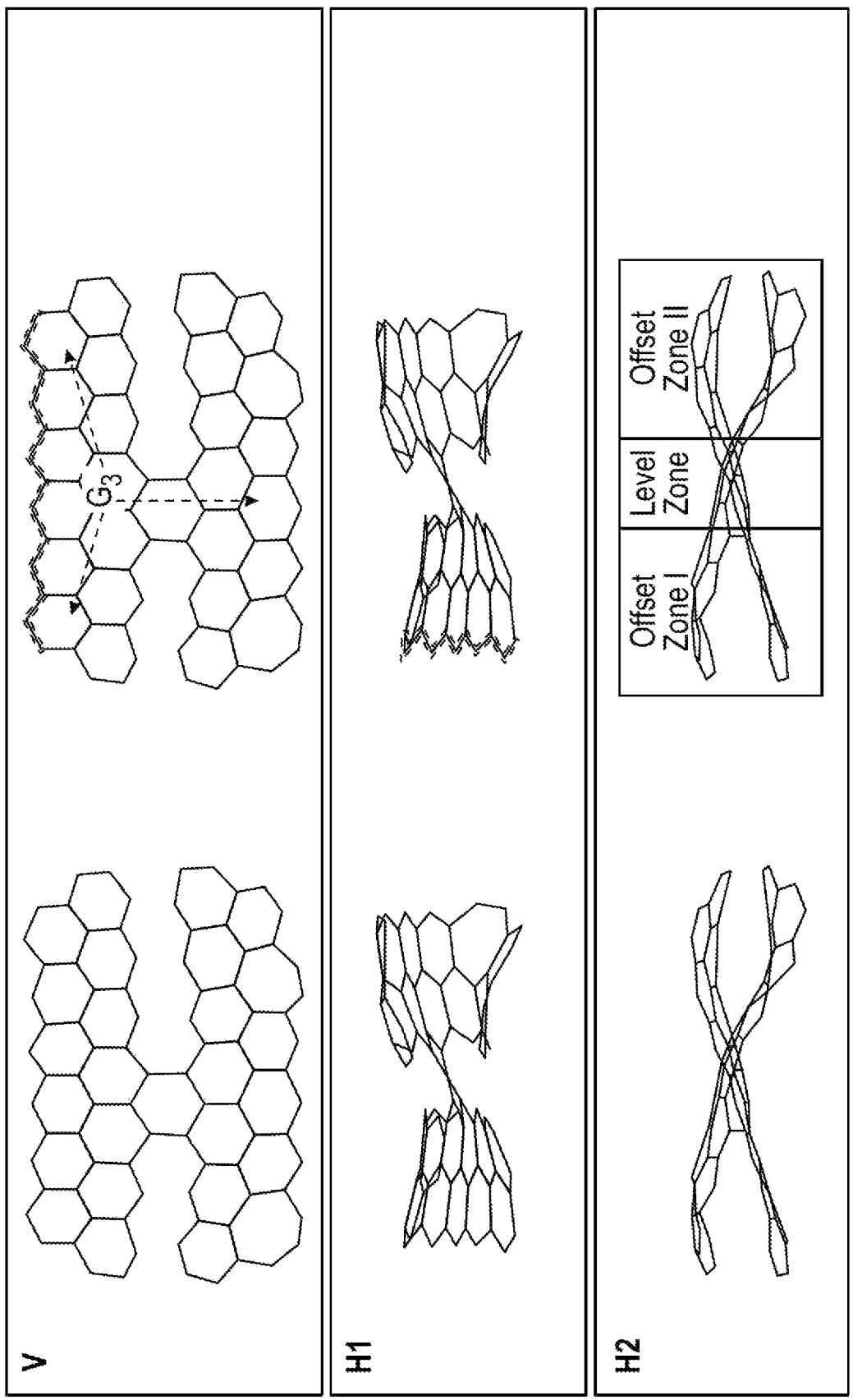
FIG. 30 illustrates $sp^2$ grafting across the level zone of the $E_1$-$E_2$ interface. The resulting $sp^2$ ring forms a ring-connection between $G_1$ and $G_2$, thus creating a new graphenic structure $G_3$. Labelled and unlabeled vertical (V) and horizontal (H1 and H2) perspectives are shown to facilitate visual inspection. In the H2 perspective the edge with dashed tracing is in the background.

In the illustration of FIG. 30, the system has been modified by $sp^2$ grafting within the level zone, which is premised upon the minimal vertical offset between opposing $sp^2$ atomic members of $E_1$ and $E_2$ and sufficient alignment of their $2p_z$ orbitals. The resulting line of 2 $sp^2$-$sp^2$ bonds forms a new 6-member ring that ring-connects the primordial domains $E_1$ and $E_2$, which thereby coalesce into a new graphenic structure, designated $G_3$. The new graphenic structure $G_3$ is labeled in the vertical perspective of FIG. 30. The formation of the new $sp^2$ ring, as represented in FIG. 30, causes some aligning distortion of the resulting $G_3$ domain. It is worth noting that in some cases, grafting events may distort the original interface, extending or shortening the interfacial zones dynamically.

Figure 31:
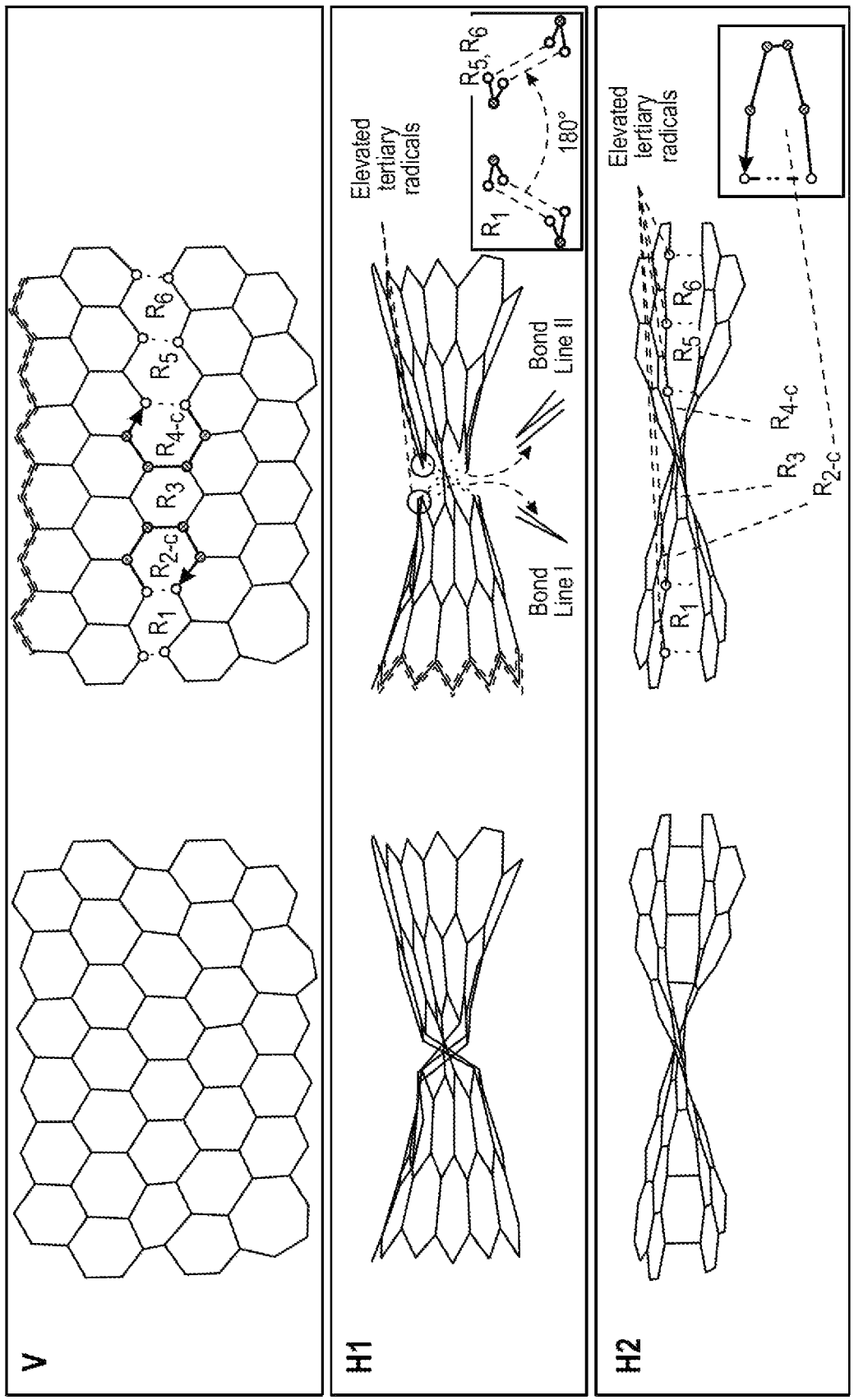
FIG. 31 illustrates $sp^3$ grafting across the offset zones of the $E_1$-$E_2$ interface. New $sp^2$ and $sp^3$ atoms are represented as crossshatched circles and white circles, respectively. The resulting $sp^x$ rings comprise 4 rings ($R_1$, $R_3$, $R_5$, $R_6$) in the chair conformation and 2 chiral rings ($R_{2-C}$, $R_{4-C}$) associated with the tectonic zone transitions. The chiral chains within the 2 chiral rings are indicated with black arrows, and the 5 $sp^3$-$sp^3$ bonds are indicated with dotted lines. The point-reflected orientation of the rings in the chair conformation and the 2 $sp^3$-$sp^3$ bond lines are shown. Elevated tertiary radicals created by $sp^3$ grafting across offset zones are labeled. The structure of the chiral ring $R_{2-C}$ is shown, with its chiral chain being indicated by a solid line and its $sp^3$-$sp^3$ bond indicated by a dotted line. Labelled and unlabeled vertical (V) and horizontal (H1 and H2) perspectives are shown for ease of visual inspection. In the H2 perspective the edge with dashed tracing is in the background.

In the illustration of FIG. 31, the graphenic structure $G_3$ illustrated in FIG. 30 has been structurally modified by $sp^3$ grafting within the 2 offset zones, which is premised upon the substantial vertical offset between the edge atoms in these zones. This involves the $sp^2$-to-$sp^3$ rehybridization of 10 $B_3$ edge atoms and the associated formation of 5 $sp^3$-$sp^3$ bonds (represented by dotted lines in FIG. 31), which are organized into 2 distinct $sp^3$-$sp^3$ bond lines. From the vertical perspective, we can see that the formation of the 5 $sp^3$-$sp^3$ bonds create 5 new $sp^x$ rings across the original $E_1$-$E_2$ tectonic interface. From the H1 perspective, we can see that the 2 $sp^3$-$sp^3$ bond lines (Bond line I, corresponding to Offset Zone I, and Bond line II, corresponding to Offset Zone II) have opposite orientations. New $sp^2$ atoms and new $sp^3$ atoms are represented as crosshatched circles and white circles, respectively.

The 6 rings formed via $sp^2$ grafting and $sp^3$ grafting are labeled in FIG. 31. On each side of the 6-member $sp^2$ ring associated with the level zone (designated $R_3$), there is a 6-member $sp^x$ ring (designated $R_{2-C}$ and $R_{4-C}$). In both $R_{2-C}$ and $R_{4-C}$, the 6-member $sp^x$ ring contains a chiral chain. The chiral chain contains the $sp^x$ ring's 4 $sp^2$ atoms and is terminated at each end by the ring's 2 $sp^3$-hybridized atoms. These $sp^3$ sites are bonded to each other via a $sp^3$-$sp^3$ bond, closing the ring. This is diagrammed in the H2 perspective of FIG. 31, where $R_{2-C}$'s chiral chain is highlighted with a black arrow, where the direction of the black arrow coincides with the direction of increasing z-directional elevation. The $sp^2$ atoms within the chiral chain are represented as crosshatched circles, whereas the $sp^3$ atoms at the chiral chain's termini are represented as white circles. The $sp^3$-$sp^3$ bond between these two terminal $sp^2$ atoms is represented by the dashed/dotted line. These two $sp^x$ rings containing chiral segments represent chiral rings and are designated $R_{2-C}$ and $R_{4-C}$ in FIG. 31.

Due to the chiral geometry imposed by their chiral chains, the $sp^x$ rings $R_{2-C}$ and $R_{4-C}$ represent chiral rings. Both of these chiral rings in FIG. 31 are formed at a transition between a level zone and a laterally adjacent offset zone. It is this tectonic zone transition, and the associated change in edge elevations, that creates the chiral chain. Consequently, chiral rings are formed at interfacial zone transitions, and their chirality is determined by the zone transitions where they are formed.

In FIG. 31, the remaining 3 $sp^x$ rings ($R_1$, $R_5$, and $R_6$) are in the chair conformation. They exhibit two distinct orientations, as diagrammed in the H1 perspective of FIG. 31. Each orientation represents a point reflection of the other orientation in the xy-plane. These orientations are predetermined based on the geometry of the offset zones in which $R_1$, $R_5$, and $R_6$ are formed. $R_1$ was formed by grafting across Offset Zone I, where $E_2$ was elevated over $E_1$; therefore, $R_1$ is elevated on what was originally the $E_2$ side. On the other hand, $R_5$ and $R_6$ were formed by grafting across Offset Zone II, where $E_1$ was elevated over $E_2$; therefore, $R_5$ and $R_6$ are elevated on what was originally the $E_1$ side. This reversal in edge elevation is the reason for the point-reflected orientations of these $sp^x$ rings (and the opposite orientations of the two $sp^3$-$sp^3$ bond lines).

The inversion of the edge elevations between the two offset zones also imposes the same chirality on the chiral rings $R_{2-C}$ and $R_{4-C}$ formed at the zone transitions to either side of the level zone. If the edge elevations had not been inverted between Offset Zone I and Offset Zone II, $R_{2-C}$ and $R_{4-C}$ would have had opposite chirality. This alternative scenario is illustrated in Frame II of FIG. 60.

Following $sp^3$ grafting within the offset zones, the $sp^3$ atoms in FIG. 31 are only threefold-coordinated and represent tertiary radicals. Associated with the 5 $sp^3$-$sp^3$ bonds in FIG. 31 are 5 $sp^3$ atoms that represent elevated tertiary radicals. These elevated tertiary radicals are circled in the H1 perspective of FIG. 31 and are indicated in the H2 perspective by white circles.

The graphenic structure $G_3$ shown in FIG. 31 represents a "base"—i.e. a base-layer formed by the grafting of primordial domains during pyrolytic growth. After grafting, a base may exhibit tertiary radical sites, such as those in FIG. 31, extending into the z-space. Formation of the base eliminates the $sp^2$ edge states associated with the disconnected primordial domains. In regions of the base corresponding to offset zones, the primordial domains'$sp^2$ edge atoms are transformed into $sp^3$ interior atoms. In regions of the base corresponding to level zones, the $sp^2$ edge atoms are replaced with $sp^2$ interior atoms. These replacements change the Raman spectrum of the base—specifically, there are fewer $sp^2$ edge atoms to activate RMB phonons, while $sp^3$ states proliferate.

Figure 32:
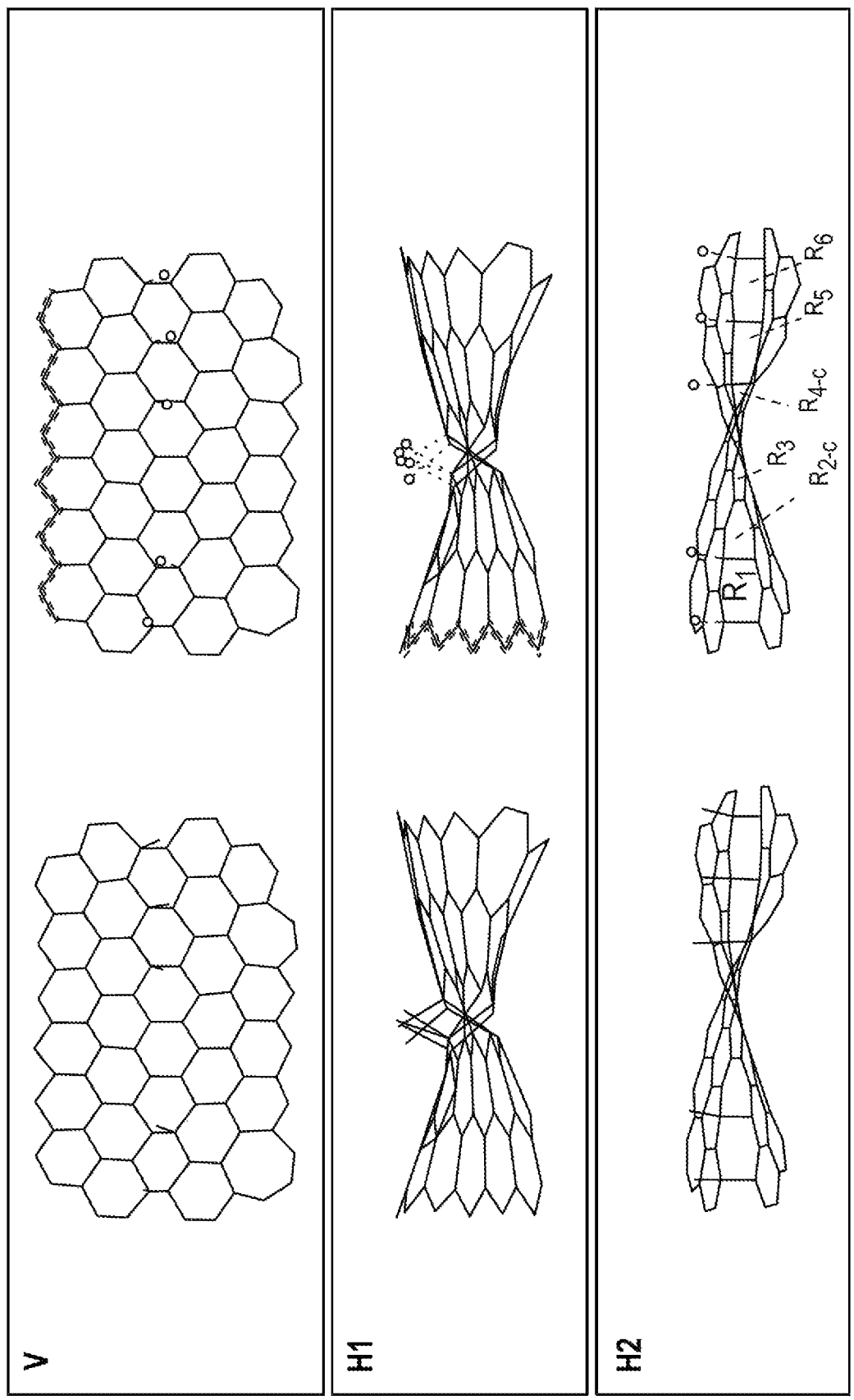
FIG. 32 is an illustration of the continued z-directional growth that occurs at the 5 elevated tertiary radicals from FIG. 32. New $sp^3$ atoms are represented as white circles. The 4 rings ($R_1$, $R_3$, $R_5$, $R_6$) in the chair conformation and 2 chiral rings ($R_{2-C}$, $R_{4-C}$) are labeled. A second tier of $sp^3$-$sp^3$ bonds created are represented by dotted lines. Labeled and unlabeled vertical (V) and horizontal (H1 and H2) perspectives are shown to facilitate visual inspection. In the H2 perspective the edge with dashed tracing is in the background.

In the illustration of FIG. 32, radical addition reactions at the 5 elevated tertiary radicals of the base $G_3$ have occurred, bonding 5 z-adjacent $sp^3$ carbon atoms to $G_3$. The 5 z-adjacent $sp^3$ atoms are represented by white circles in FIG. 32. Their addition creates a second tier of $sp^3$-$sp^3$ bond lines above the base-layer tier (i.e. Bone Lines I and II). These new $sp^3$-$sp^3$ bonds are indicated by dotted lines in FIG. 32.

Figure 33:
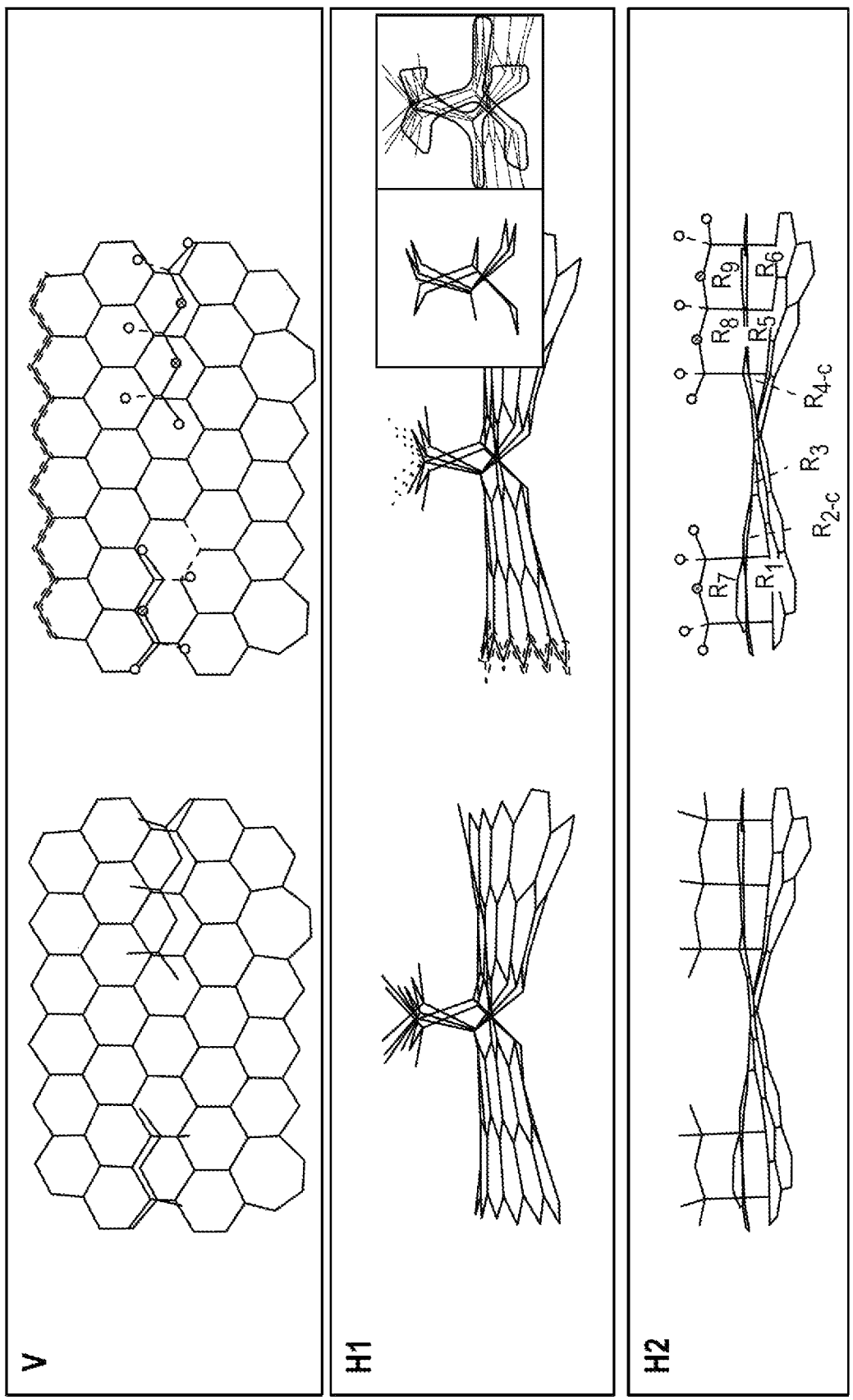
FIG. 33 is an illustration after continued radical addition over the base layer. New $sp^2$ and $sp^3$ atoms are represented as crosshatched circles and white circles, respectively. There are 3 new $sp^x$ rings ($R_7$, $R_8$, $R_9$) in the chair conformation and 2 chiral rings ($R_{2-C}$, $R_{4-C}$) are labeled. The addition of the $sp^x$ rings in the chair conformation has created 2 diamondlike seams, as shown in isolation in the inset of the H1 perspective. These 2 diamondlike seams form the intersection of 2 Y-dislocations, as shown by the circled Y-shapes in the inset of the H1 perspective. Labelled and unlabeled vertical (V) and horizontal (H1 and H2) perspectives are shown to facilitate visual inspection. In the H2 perspective the edge with dashed tracing is in the background.

In the illustration in FIG. 33, continued radical addition reactions above the base have resulted in the addition of 9 $sp^3$ atoms (indicated by white circles in the V and H2 perspectives of FIG. 33) and 3 $sp^2$ atoms (indicated by the crosshatched in the V and H2 perspectives of FIG. 33). These atomic additions result in the formation of a third tier of $sp^3$-$sp^3$ bond lines (indicated by dotted lines in the V and H2 perspectives of FIG. 33.) above the second tier of $sp^3$-$sp^3$ bond lines. We note now that the orientations of each successive tier of $sp^3$-$sp^3$ bond lines is a point-reflection of the orientations in the tier above or below.

The addition reactions also result in the formation of 3 additional 6-member $sp^x$ rings (designated as $R_7$, $R_8$, and $R_9$ and labeled in FIG. 33) located z-adjacent to the 3 $sp^x$ rings $R_1$, $R_5$, and $R_6$, respectively. Because each of the new $sp^x$ rings shares more than 1 atomic member with an $sp^x$ ring in the base below it, each of these $sp^x$ rings is ring-adjacent to the $sp^x$ ring below it. A new, augmented graphenic structure is created by the vertical addition of these 3 $sp^x$ rings; we can designate this new graphenic structure as $G_4$.

Like the $sp^x$ rings $R_1$, $R_5$, and $R_6$ located below them, the $sp^x$ rings $R_7$, $R_8$, and $R_9$ are in the chair conformation, and each has an orientation representing a point-reflection of the $sp^x$ ring below it. Together, the z-adjacent $sp^x$ rings $R_1$ and $R_7$ comprise a first diamondlike seam, and the other 4 $sp^x$ rings ($R_5$, $R_6$, $R_8$, and $R_9$) comprise a second, distinct diamondlike seam, with the 2 diamondlike seams (isolated in the first magnified inset of the H1 perspective of FIG. 33) creating nascent Y-dislocations oriented in opposite directions (as indicated by the circled Y-dislocations in the second magnified inset of the H1 perspective). The diamondlike seams terminate internally with chiral rings (or, as the seams expand vertically, in chiral columns). In the H2 perspective of FIG. 33, we can see that the chiral rings $R_{2-C}$ and $R_{4-C}$ are located at the inner termini of the diamondlike seams.

Figure 34:
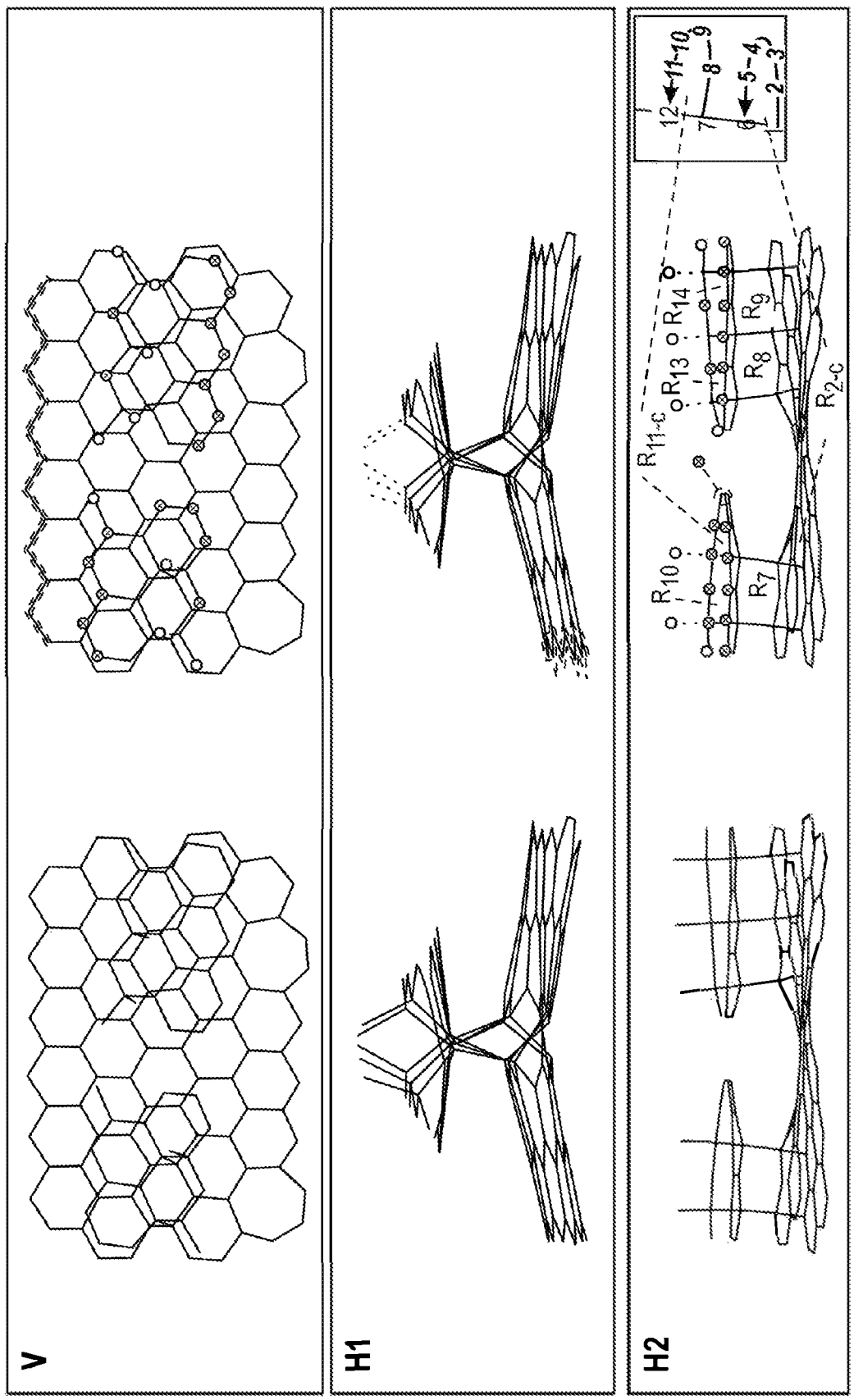
FIG. 34 is an illustration after continued radical addition over the base layer. New $sp^2$ and $sp^3$ atoms are represented as crosshatched circles and white circles, respectively. A third tier of $sp^3$-$sp^3$ bonds are represented by dotted lines. There are 3 new $sp^x$ rings ($R_{10}$, $R_{13}$, $R_{14}$) in the chair conformation and 1 new chiral ring ($R_{11\text{-}C}$) that have been labeled. The chiral ring $R_{11\text{-}C}$ is located over the chiral ring $R_{4\text{-}C}$, creating a chiral column. The chiral column is illustrated in isolation. The chiral chains 1 to 6 and 7 to 12 are indicated with bold black arrows. Labeled and unlabeled vertical (V) and horizontal (H1 and H2) perspectives are shown to facilitate visual inspection. In the H2 perspective the edge with dashed tracing is in the background.

In the illustration of FIG. 34, continued radical addition reactions above the base have resulted in the addition of 9 $sp^3$ atoms (indicated by the—white circles in the V and H2 perspectives of FIG. 34) and 18 $sp^2$ atoms (indicated by the crosshatched circles in the V and H2 perspectives of FIG. 34). Meanwhile, some primary carbon atoms from the previous stage have become three-fold coordinated $sp^2$ atoms. In this illustration, we begin to see that continued radical addition reactions are driving both vertical sp³ growth and lateral sp² growth above the base. A fourth tier of sp³-sp³ bond lines above the third tier of sp³-sp³ bonds are indicated by dotted lines in the V and H2 perspectives of FIG. 33.

Located directly above and ring-adjacent to the 3 sp$^x$ rings $R_7$, $R_8$, and $R_9$ in FIG. 34 are 3 new 6-member sp$^x$ rings, designated as $R_{10}$, $R_{13}$, and $R_{14}$. Located above the chiral ring $R_{2-C}$ is a new 6-member chiral ring, designated $R_{11-C}$. This new chiral ring is labeled in the H2 perspective. To facilitate visual discernment of the z-adjacent chiral rings $R_{2-C}$ and $R_{11-C}$, they are isolated in the magnified inset in the H2 perspective. The atomic members of $R_{2-C}$ and $R_{11-C}$ are labeled 1, 2, 3, . . . , 6 and 7, 8, 9, . . . , 12, respectively, with sp² members being depicted with bold numbers and sp³ members being depicted with normal numbers. From this, we can see that, like $R_{2-C}$, $R_{11-C}$ contains a chiral chain. The chiral chains of both rings are highlighted by arrows in the magnified inset of the H2 perspective in FIG. 34, where the direction of the arrows coincide with increasing elevation in the z-direction. The chiral chain of $R_{2-C}$ includes the atoms 1 through 6, where the atomic termini 1 and 6 comprise sp³ atoms connected to each other via a sp³-sp³ bond. The chiral chain of $R_{11-C}$ includes the atoms 7 through 12, where the atomic termini 7 and 12 comprise sp³ atoms connected to each other via a sp³-sp³ bond.

These 2 z-adjacent chiral rings are connected via a z-directional chain of sp³-sp³ bonds (comprising the sp³ member atoms labeled 1, 6, 7, and 12). Together, the chiral rings and the z-directional chain of sp³-sp³ bonds comprise a chiral column. Chiral columns, like chiral rings, are found at the inner termini of diamondlike seams in anthracitic networks. The basic architecture of a chiral column may be elucidated by comparing the magnified inset of the H2 perspective in FIG. 34, in which the $R_{2-C}$-$R_{11-C}$ chiral column is isolated, with the diagram of a chiral column in FIG. 37B. Within the chiral column is a helical, one-dimensional chain of sp² and sp³ atoms (i.e. an "sp$^x$ helix") comprising atoms 1 through 12. The basic architecture of an sp$^x$ helix is diagrammed in FIG. 37C.

Figure 35:
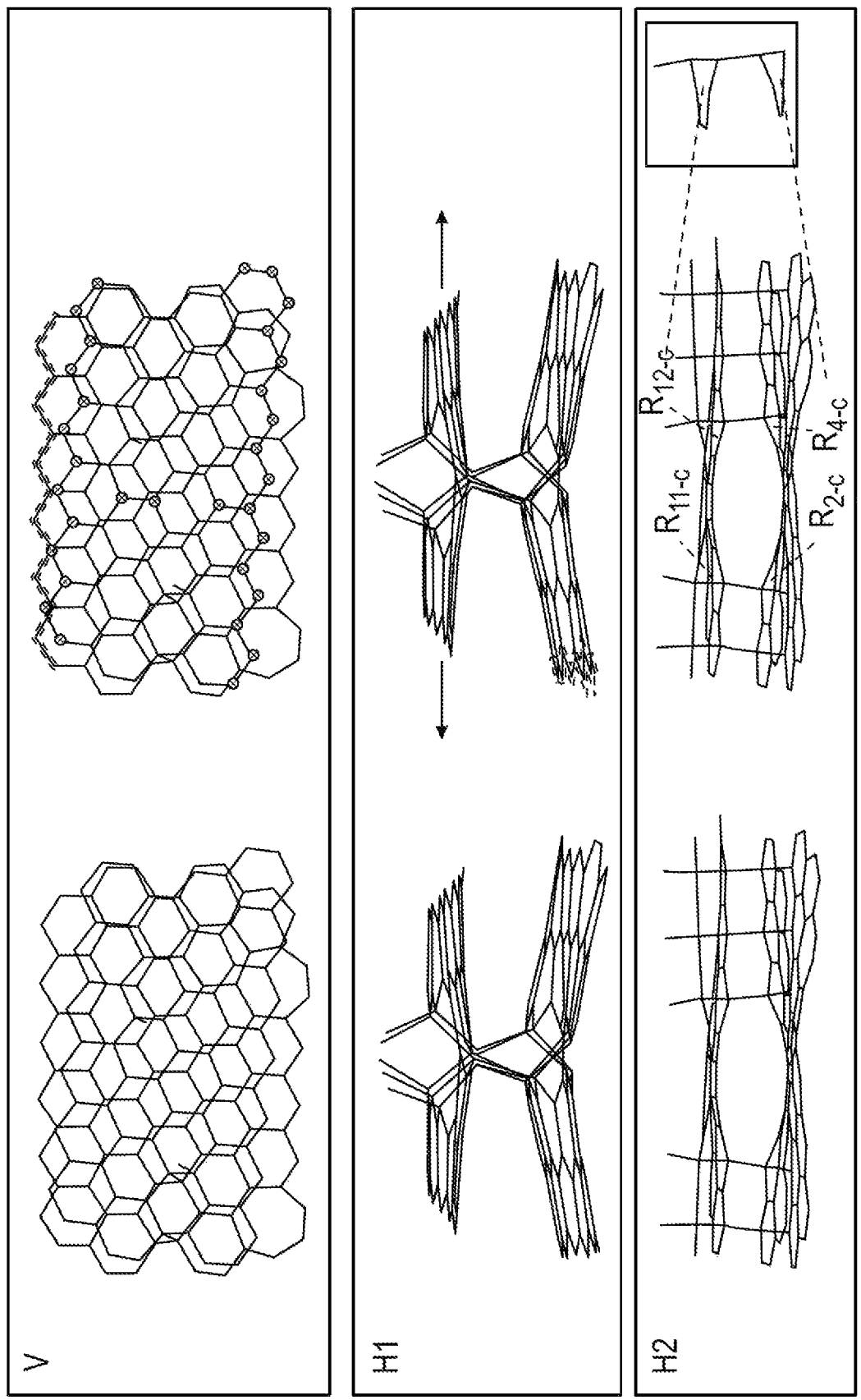
FIG. 35 is an illustration after continued radical addition over the base layer. The rings above the base have coalesced, and a second layer has been nucleated. There are now 4 chiral rings ($R_{2\text{-}C}$, $R_{4\text{-}C}$, $R_{11\text{-}C}$, $R_{12\text{-}C}$), comprising 2 chiral columns. Labelled and unlabeled vertical (V) and horizontal (H1 and H2) perspectives are shown to facilitate visual inspection. In the H2 perspective the edge with dashed tracing is in the background.

In the illustration of FIG. 35, continued growth above the base had resulted in the addition of 32 new sp² atoms (indicated by the crosshatched circles in the V and H2 perspectives of FIG. 35). Meanwhile, some primary carbon atoms from the previous stage have become three-fold coordinated sp² atoms. In this illustration, we see that the rings above the base have coalesced into a second-layer nucleus that is substantially xy-aligned with the base and has zigzag edge segments substantially parallel to the original tectonic interface. Further sp² growth can proceed laterally from this higher-layer nucleus, as indicated by the black arrows in the H1 perspective of FIG. 35. From the vertical perspective of FIG. 35, we can see that the second layer is slightly twisted with respect to the first. This is known as Eshelby twist and is produced by chiral defects, such as chiral columns.

The continued growth reflected in FIG. 35 has formed another chiral ring, $R_{12-C}$, above the base-layer chiral ring, $R_{4-C}$. As shown in the magnified inset of the H2 perspective in FIG. 35, these two z-adjacent chiral rings are connected via a z-directional chain of sp³-sp³ bonds, creating a second chiral column (and within it, a second sp$^x$ helix). Because of the common chirality of the chiral chains in the base-layer rings $R_{2-C}$ and $R_{4-C}$, the two chiral columns formed above $R_{2-C}$ and $R_{4-C}$ also have a common chirality. The common chirality of these two chiral columns increases the angle of Eshelby twist.

The multilayer graphenic system illustrated in FIG. 35 is classified herein as an anthracitic network. Laterally and vertically crosslinked by Y-dislocations and chiral columns constructed from sp$^x$ rings, the entire anthracitic network comprises a single, ring-connected graphenic structure and is described herein as an "sp$^x$ network." We can begin to see that as sp$^x$ networks grow, sp³ states are continually proliferated.

Figure 36:
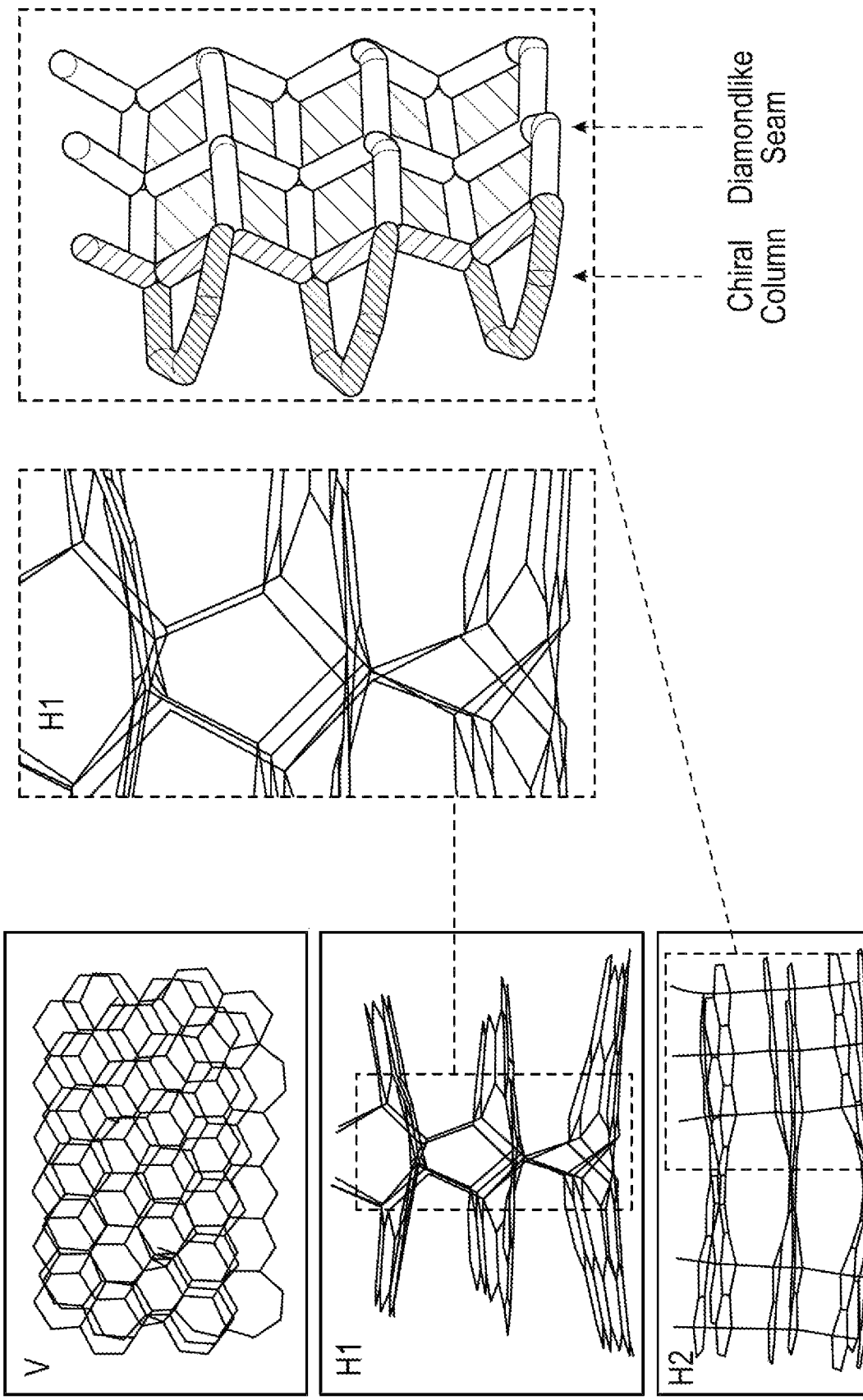
FIG. 36 is an illustration after continued radical addition over the base layer. A third layer has been nucleated. One of the cubic diamondlike seams is shown in a first magnified inset. The other cubic diamondlike seam is shown in a second magnified inset, where the chiral column representing the lateral terminus of the seam consists of densely hatched chiral chains and a lightly-hatched z-directional $sp^3$-$sp^3$ chain. A vertical (V) and 2 horizontal (H1 and H2) perspectives are shown to facilitate visual inspection.
Figure 37A:
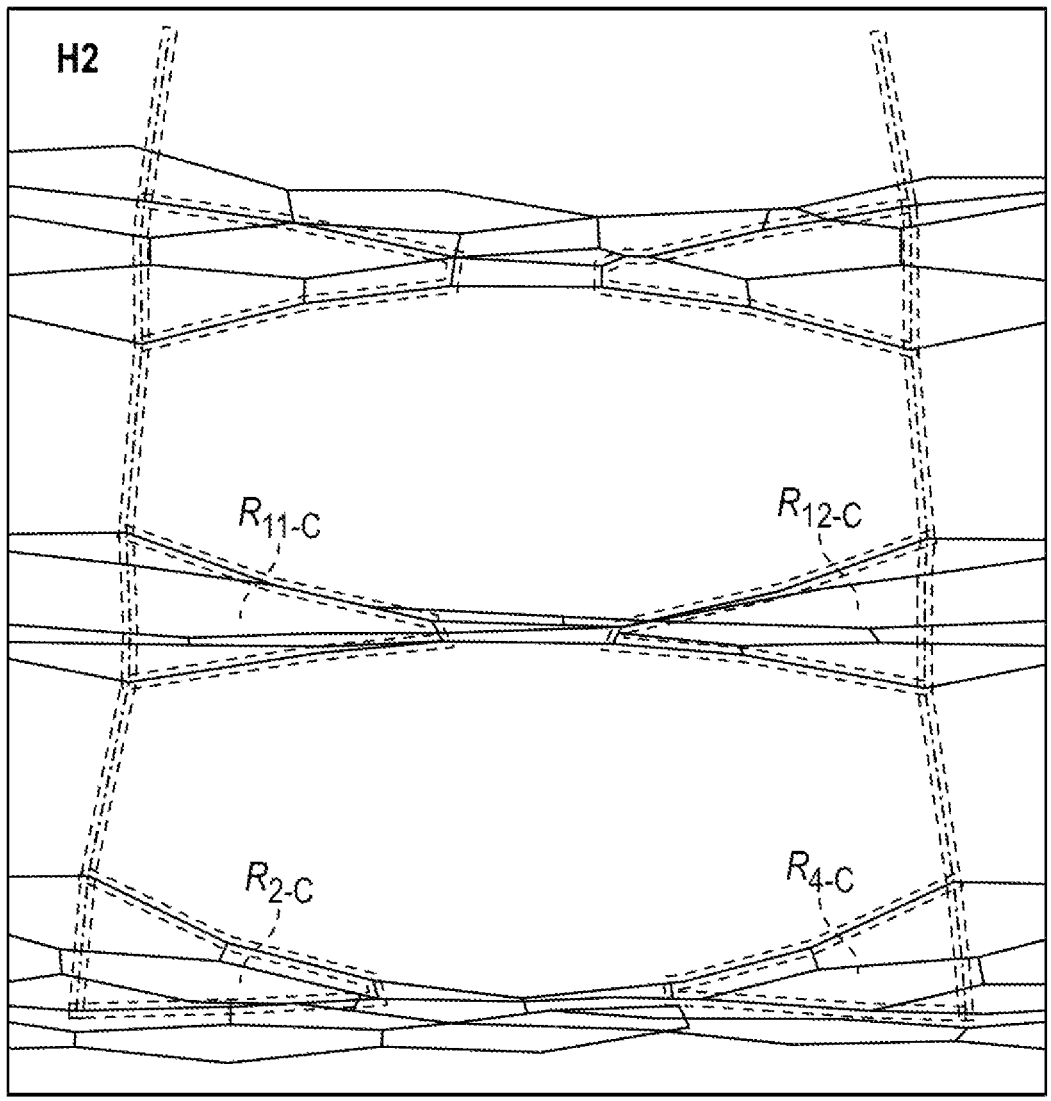
FIG. 37A is the magnification of the horizontal perspective (H2) of FIG. 36. The showing the chiral columns are indicated with tracing. The chiral chains in the chiral rings are represented by solid lines with dashed tracing, while the z-directional chains of $sp^3$-$sp^3$ bonds connecting the z-adjacent chiral rings are represented by dotted lines with dashed tracing.
Figure 37B:
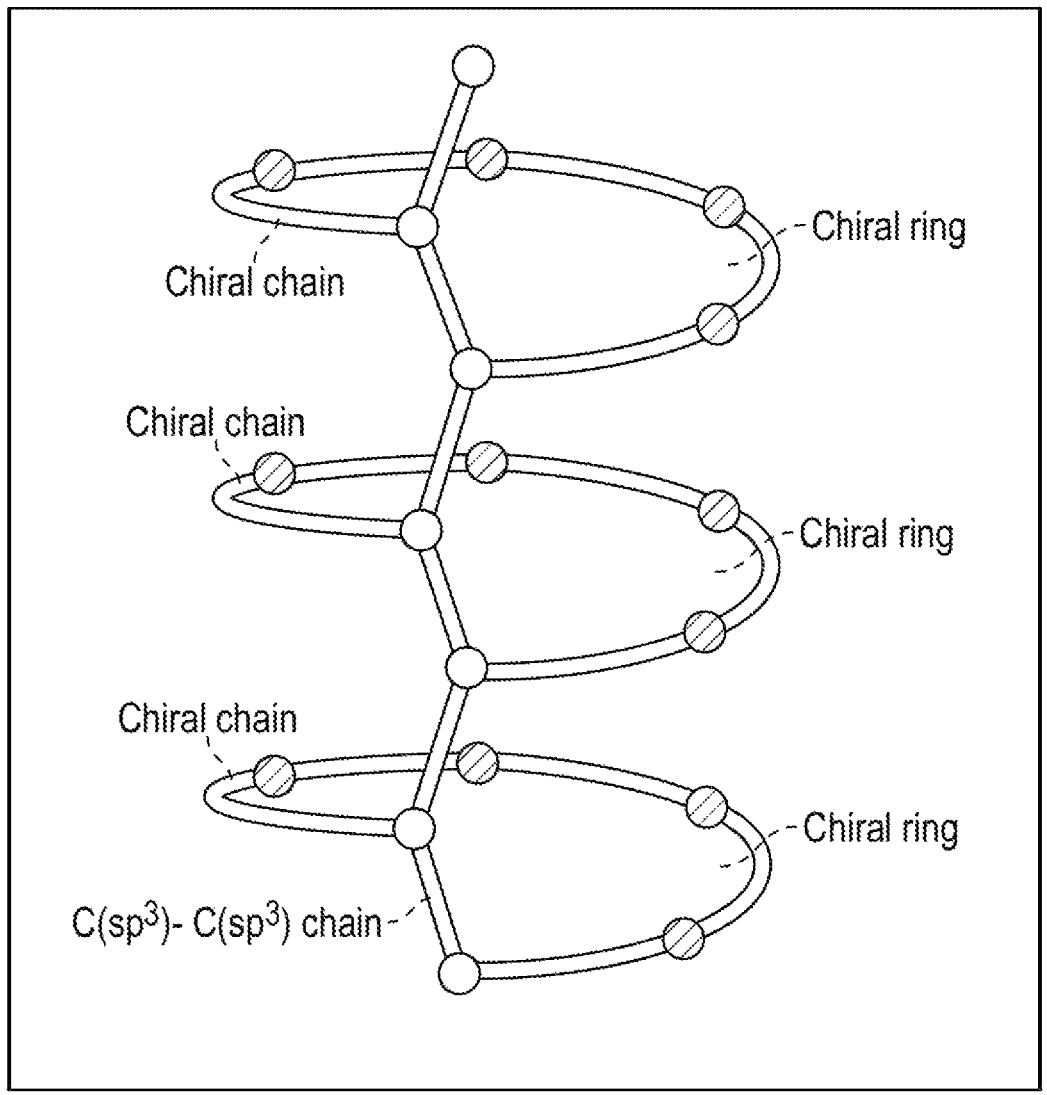
In FIG. 37B, the chiral column structure is represented in simplified, diagrammatic form. $Sp^2$ and $sp^3$ atoms are represented as hatched circles and white circles, respectively.

In the illustration of FIG. 36, continued growth above the original G3 base has added a third layer to the sp$^x$ network. As illustrated in the vertical perspective, the third layer exhibits the same Eshelby twist as the second. So long as the chiral columns continue to propagate vertically, each higher layer formed will be rotationally misaligned with the z-adjacent layers above or below it. In FIG. 37A, which is a magnification of the H2 perspective from FIG. 37, we can see that each higher-layer region continues the chiral columns. In FIG. 37A, the chiral chains in chiral rings are represented by solid lines with dashed tracing, while the z-directional chains of sp³-sp³ bonds connecting z-adjacent chiral rings are indicated by dashed/dotted lines with dashed tracing. A simplified representation of each chiral column of z-adjacent chiral rings is illustrated in FIG. 37B. The sp$^x$ helix within each of these chiral columns is isolated in FIG. 37C.

Figure 37C:
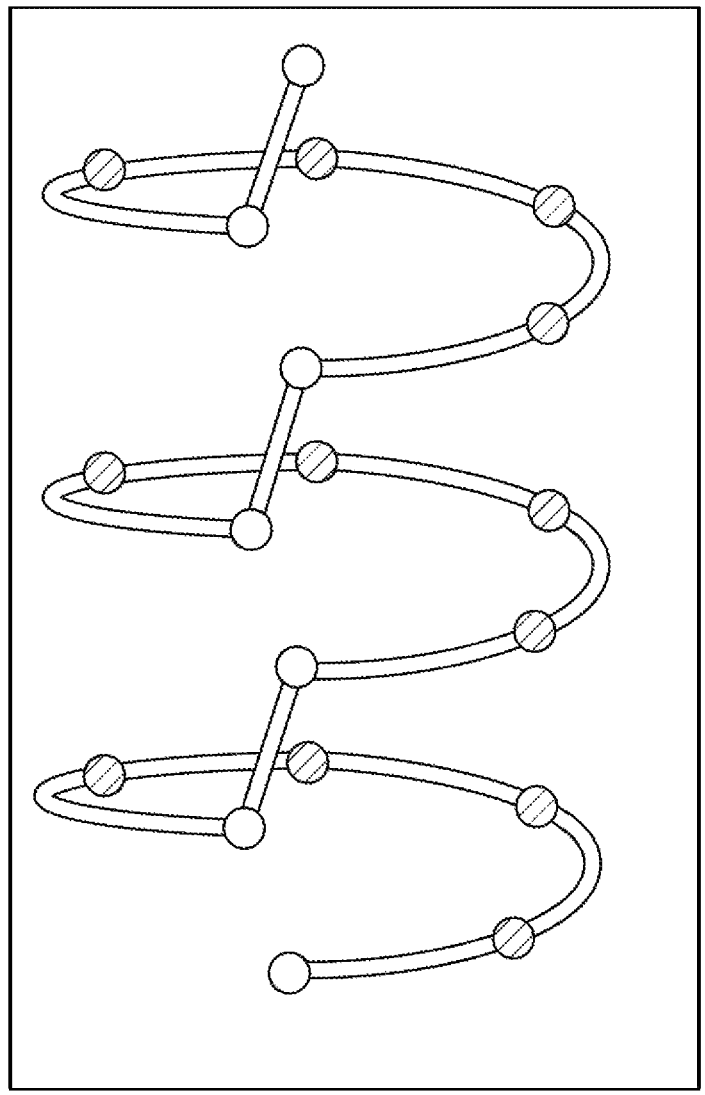
In FIG. 37C, the $sp^x$ helix within each chiral column is isolated. $Sp^2$ and $sp^3$ atoms are represented as hatched circles and white circles, respectively.

We can see in FIG. 36 that continued growth above the original $G_3$ base has created two distinct diamondlike seams. One of these seams, comprising a two-dimensional ribbon of 4 z-adjacent sp$^x$ rings in the chair conformation, is shown on the right side of the magnified inset of the H1 perspective. The other seam, comprising a two-dimensional sheet of 10 z-adjacent sp$^x$ rings in the chair conformation, is hatched in the other diagrammatic inset of FIG. 36. Each of these seams comprise a two-dimensional cubic diamond surface running transverse with respect to the layers. These seams represent a laterally and vertically ring-connecting interface between the adjoining layers. Diamondlike seams in sp$^x$ networks are terminated to either side by chiral columns, as shown by the chiral column in the diagrammatic inset of FIG. 36, where the sp³-sp³ bonds are densely hatched and the chiral chains are lightly hatched. In FIG. 37A, both of the chiral columns from FIG. 36 are illustrated, where the sp³-sp³ bonds are again represented as dashed/dotted lines with dashed tracking and the chiral chains are represented as solid lines with dashed tracing. In FIG. 37B, a chiral column is diagrammed with sp³ atoms indicated by white circles and sp² atoms indicated by hatched circles. In FIG. 37C, the sp$^x$ helix within the chiral column of FIG. 37B is diagrammed.

The sp$^x$ network illustrated in FIG. 36 represents a singleton-type graphenic system. The only atoms not belonging to the singleton are the 5 primary carbon atoms in the z-space above the third layer. Since these atoms are not members of rings, they cannot be members of a graphenic structure or a graphenic system.

The pyrolytic growth sequence modeled in FIGS. 29-36 ties together all of our observations from Study A. First, the non-uniform charging observed in Sample A3's perimorphs (cf. FIGS. 25 and 27) is attributed to localization of sp³ grafting and diamondlike seams at tectonic interfaces. These interfaces are densest in areas of heavy nucleation, which correspond to rounded or near-defect regions of the templating surfaces. On the other hand, regions of the perimorphic walls formed on flatter templating surfaces exhibit fewer sp³ states and less charging. Second, because sp² and sp³ grafting across incoherent tectonic interfaces eliminates many sp² edge states, and because sp³ grafting leads to strong sp²-sp³ coupling at the defect sites that activate the RBM phonons throughout the $sp^2$ rings, $sp^3$ grafting leads to interpolation of the $sp^2$ Raman D band. Lastly, because the grafted base contains elevated radicals in $sp^3$-grafted regions, higher layers are readily nucleated without growth being quenched even when access to the template/substrate is unavailable. This forms a multilayer $sp^x$ network that comprises a ring-connected singleton, which exhibits superior mechanical robustness when compared to vdW assemblies.

In Study A, we observe that the Raman D band's interpolation increases as the temperature at which pyrolysis occurs is reduced. This is consistent with the slower release of hydrogen at lower temperatures, which gives the dynamic, self-rearranging condensate at tectonic interfaces more time to relax into an energy-minimizing configuration. $Sp^2$ or $sp^3$ grafting, which eliminates high-energy $sp^2$ edge states at the tectonic interfaces, is therefore promoted by lower temperatures.

In Procedure A1, the 750° C. CVD temperature allows gradual dehydrogenation and carbonization of the condensates. This facilitates some $sp^2$ and $sp^3$ grafting at tectonic interfaces, and as $sp^2$ edge states are eliminated via grafting, the D band begins to show underlying, interpolated modes, as evidenced by difference between its average $D_u$ peak, which is positioned above 1345 cm$^{-1}$, and its average $D_f$ peak, which positioned at 1343 cm$^{-1}$. On this basis, we classify the perimorphic frameworks in Sample A1 as minimally grafted z-$sp^x$ networks.

In Procedure A2, the 1050° C. CVD temperature accelerates dehydrogenation and carbonization of the condensates. High-energy edge dislocations get locked in, creating a vdW assembly. RBM phonons are activated by these $sp^2$ edge states, and the D band of Sample A2 is therefore not interpolated. On this basis, we classify the perimorphic frameworks in Sample A1 as vdW assemblies.

In Procedure A3, a further reduction in temperature to 650° C. allows the growing condensates more time to rearrange and relax into energy-minimizing, grafted configurations that eliminate $sp^2$ edge states. Consequently, Sample A3's $D_u$ peak, positioned at 1340 cm$^{-1}$ reflects the most D band interpolation of any of the samples in Study A, and is located between the $sp^2$ edge-activated D band at ~1350 cm$^{-1}$ and the cubic diamond peak at 1332 cm$^{-1}$. On this basis, we classify the perimorphic frameworks in Sample A3 as partially grafted z-$sp^x$ networks.

IX. Study B—Analysis

The samples produced and evaluated in Study B comprise perimorphic frameworks synthesized via surface replication on mesoporous or macroporous MgO templates. These samples, like Samples A1 and A3, exhibit superior mechanical properties and comprise anthracitic networks.

Figure 38A:
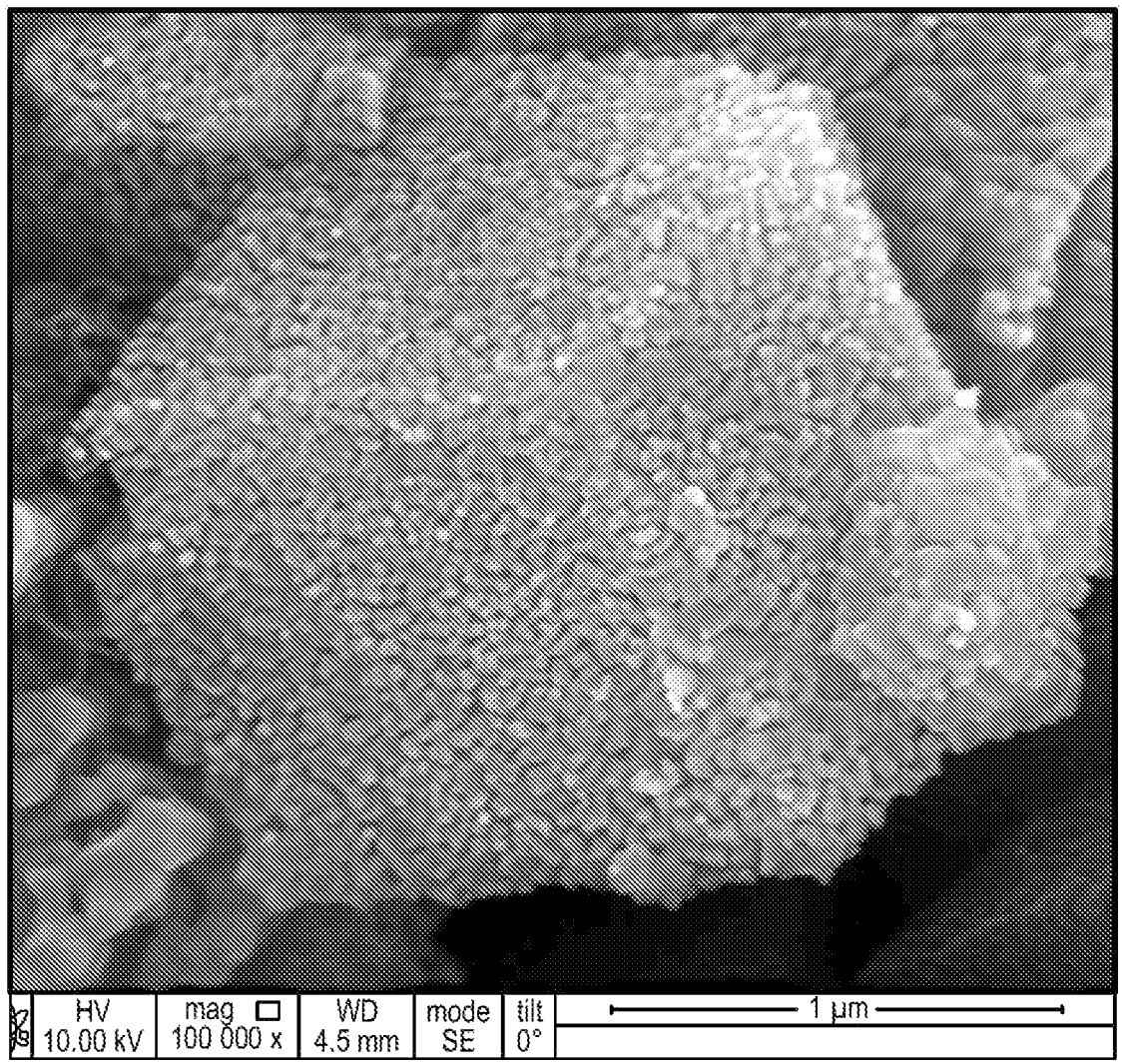
FIG. 38A is an SEM micrograph of the C@MgO perimorphic composite particles that are typical of Samples B1 to B3. The MgO can be observed as the bright, charged areas. In the SEM micrograph of FIG. 38B, the endomorphic MgO templates have been removed, leaving behind a perimorphic framework typical of Samples B1 to B3. In the SEM micrograph of FIG. 38C, the sheets-of-cells perimorphic frameworks typical of Sample B4 are shown.
Figure 38B:
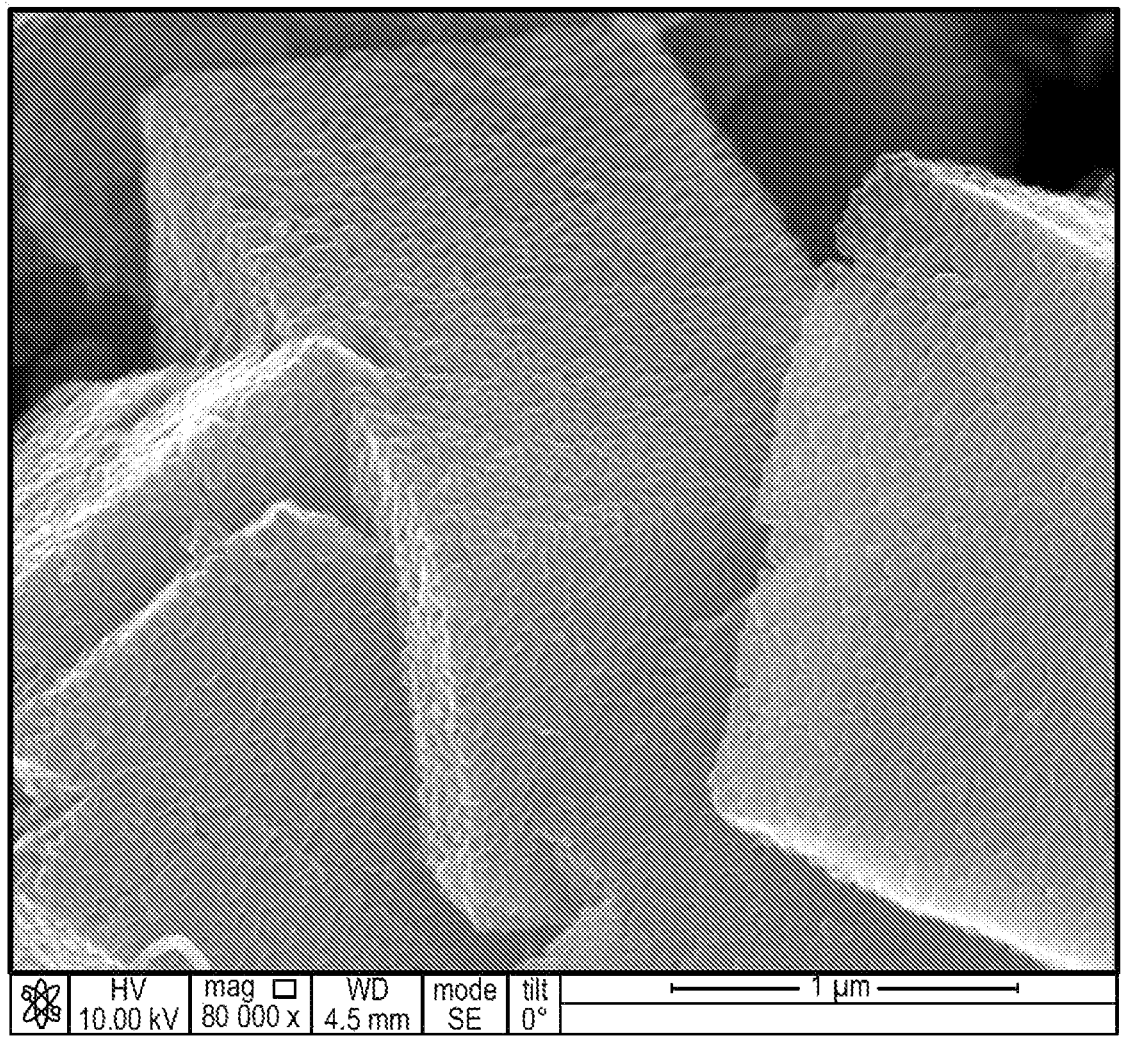

FIG. 38A is an SEM image of perimorphic composite material associated with Procedure B1 prior to extraction of the MgO template. Here, the endomorphic template can still be seen beneath the perimorphic framework. The template comprises equiaxed particles with a porous substructure of conjoined, nanocrystalline subunits formed from the thermal decomposition of a template precursor compound (magnesite, or $MgCO_3$). FIG. 38B is an SEM image of perimorphic frameworks from Sample B 1, which shows both the absence of the displaced template and the frameworks' retention of their native, templated morphology. The appearance of the frameworks shown in FIG. 38B is representative of the appearance of the frameworks found in Samples B2 and B3, which were made on similar template particles.

Figure 38C:
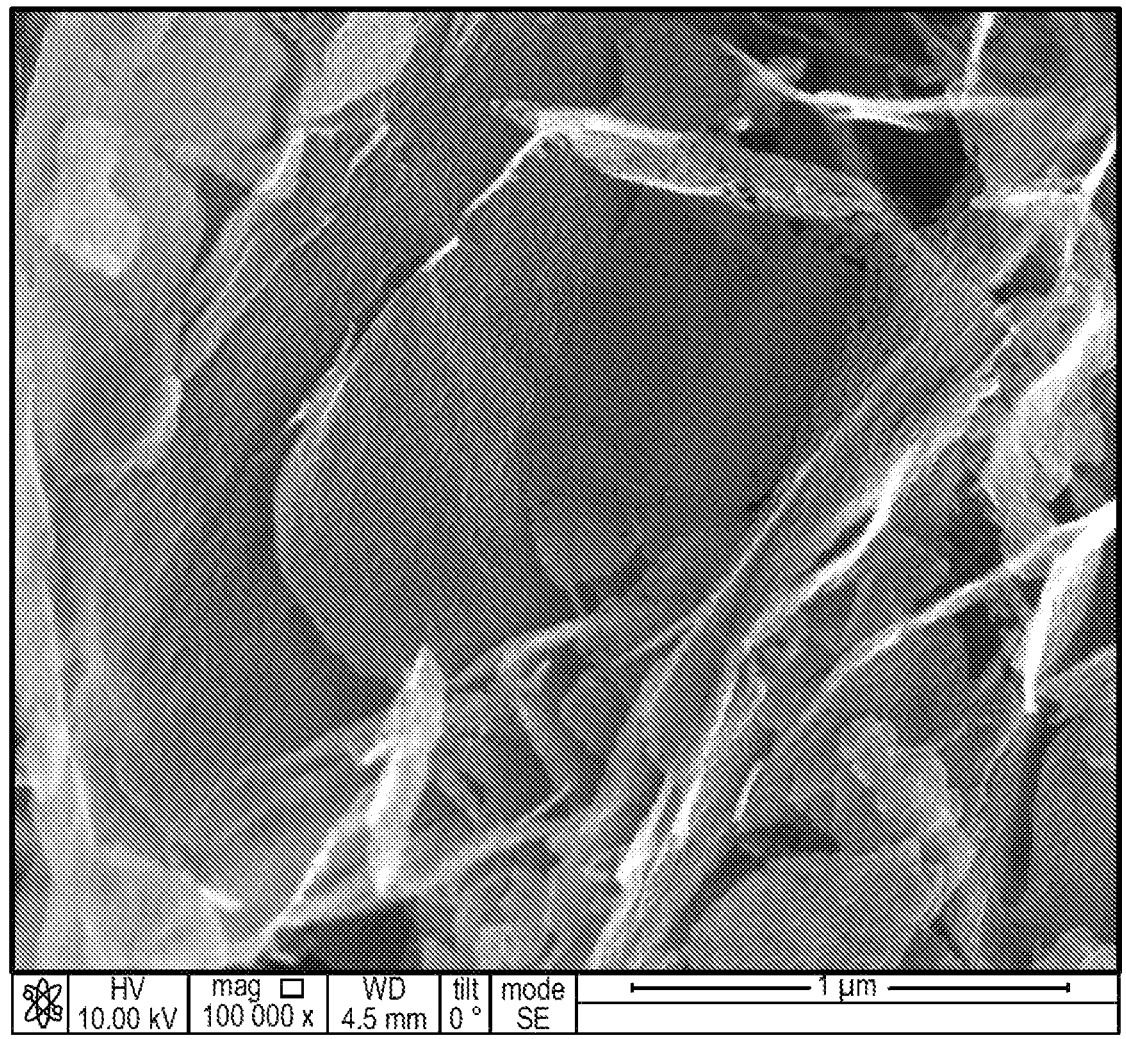

FIG. 38C is an SEM image of perimorphic frameworks from Sample B4. Sample B4 was synthesized via surface replication on a different template than Samples B1 through B3. This template comprised flat, plate-like particles with a porous substructure of conjoined, nanocrystalline subunits derived from the thermal decomposition of a hydromagnesite template precursor. Therefore, the perimorphic frameworks in Sample B4 exhibit a "sheet-of-cells" morphology—similar to the frameworks in Samples B1-B3 in terms of their porous substructure, but dissimilar in terms of their overall geometry.

In Study B, lower pyrolysis temperatures were explored to demonstrate the effects of slower dehydrogenation of the free radical condensates, which it was theorized might facilitate the condensates' ability to relax into energy-minimizing grafting configurations at tectonic interfaces. Based on Study A, it was expected that this would lead to fewer $sp^2$ edge states, which could be discerned spectroscopically via progressive interpolation of the D band. The temperature setting of the CVD furnace was varied between 640° C. and 540° C.

Table 4 below shows the sample, the pyrolysis temperature (i.e. the set point on the CVD furnace), the carbon source gas, the average $I_{D_u}/I_{G_u}$ and $I_{Tr_u}/I_{G_u}$ peak ratios, the average $G_u$ and $D_u$ peak positions, and the interval between the $G_u$ and $D_u$ peaks:

TABLE 4

| Sample | CVD Temp | Carbon Source | Laser power (mW) | $I_{Du}/I_{Gu}$ | $I_{Tru}/I_{Gu}$ | $G_u$ Peak Pos. | $D_u$ Peak Pos. | Interpeak Interval |
|---|---|---|---|---|---|---|---|---|
| B1 | 640° C. | $C_3H_6$ | 5 | 0.92 | 0.46 | 1592.0 | 1337.4 | 254.6 |
| B2 | 580° C. |  | 5 | 0.86 | 0.43 | 1593.0 | 1330.7 | 262.3 |
| B3 | 540° C. |  | 5 | 0.80 | 0.38 | 1596.6 | 1328.6 | 268.0 |
| B4 | 580° C. |  | 0.5 | 0.89 | 0.29 | 1603.3 | 1324.5 | 278.8 |

*Recurring point spectra were found between 1318 cm$^{-1}$ and 1320 cm$^{-1}$

The averages in Table 4 were derived from an average spectrum representing a composite of 9 point spectra. To generate the average, the raw data from each point spectrum was first smoothed using a moving average technique over a wavenumber interval of +/−5 cm$^{-1}$ in order to minimize noise. After smoothing, the intensity values from each point spectra were normalized to a common scale, and the normalized intensity values were then averaged to create an average intensity value for each wavenumber.

Figure 39A:
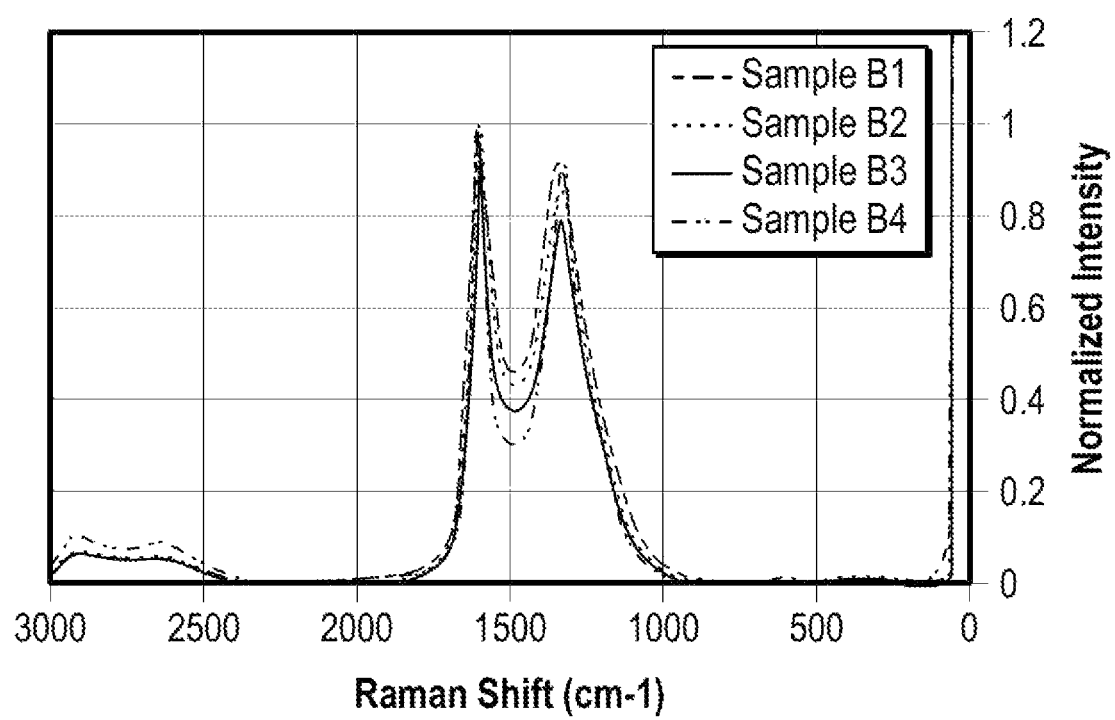
FIG. 39A is the Raman spectra for Samples B1-B4.
Figure 39B:
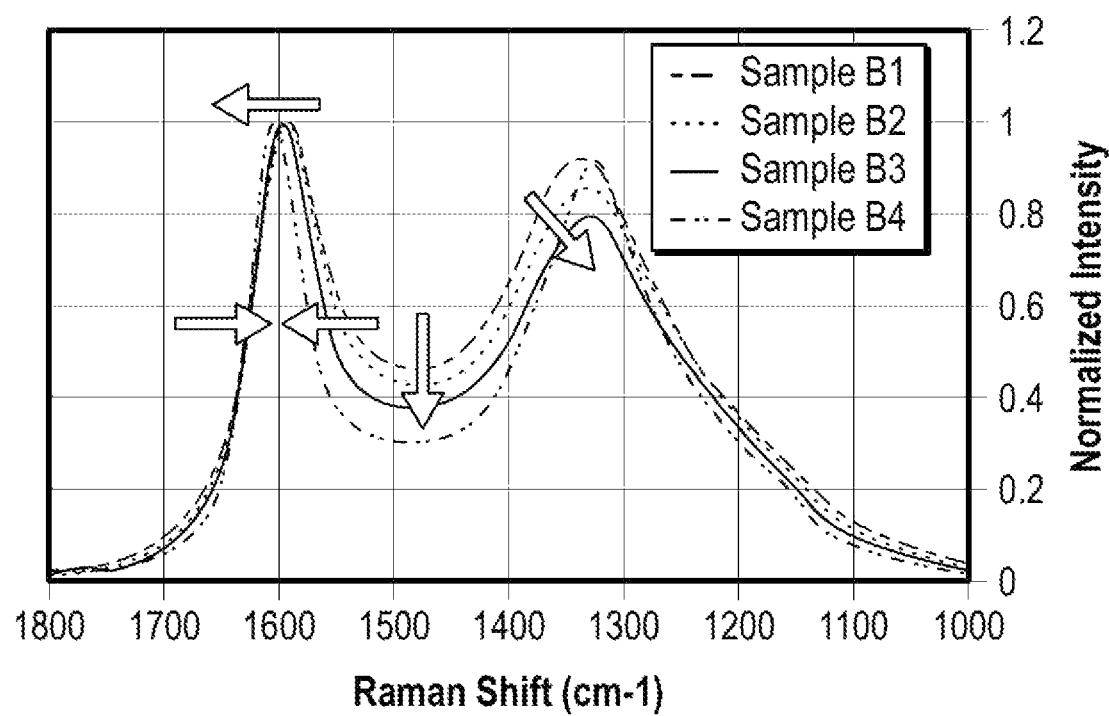
FIG. 39B indicates spectral trends observed with decreasing CVD temperature across Samples B1-B4.
Figure 39C:
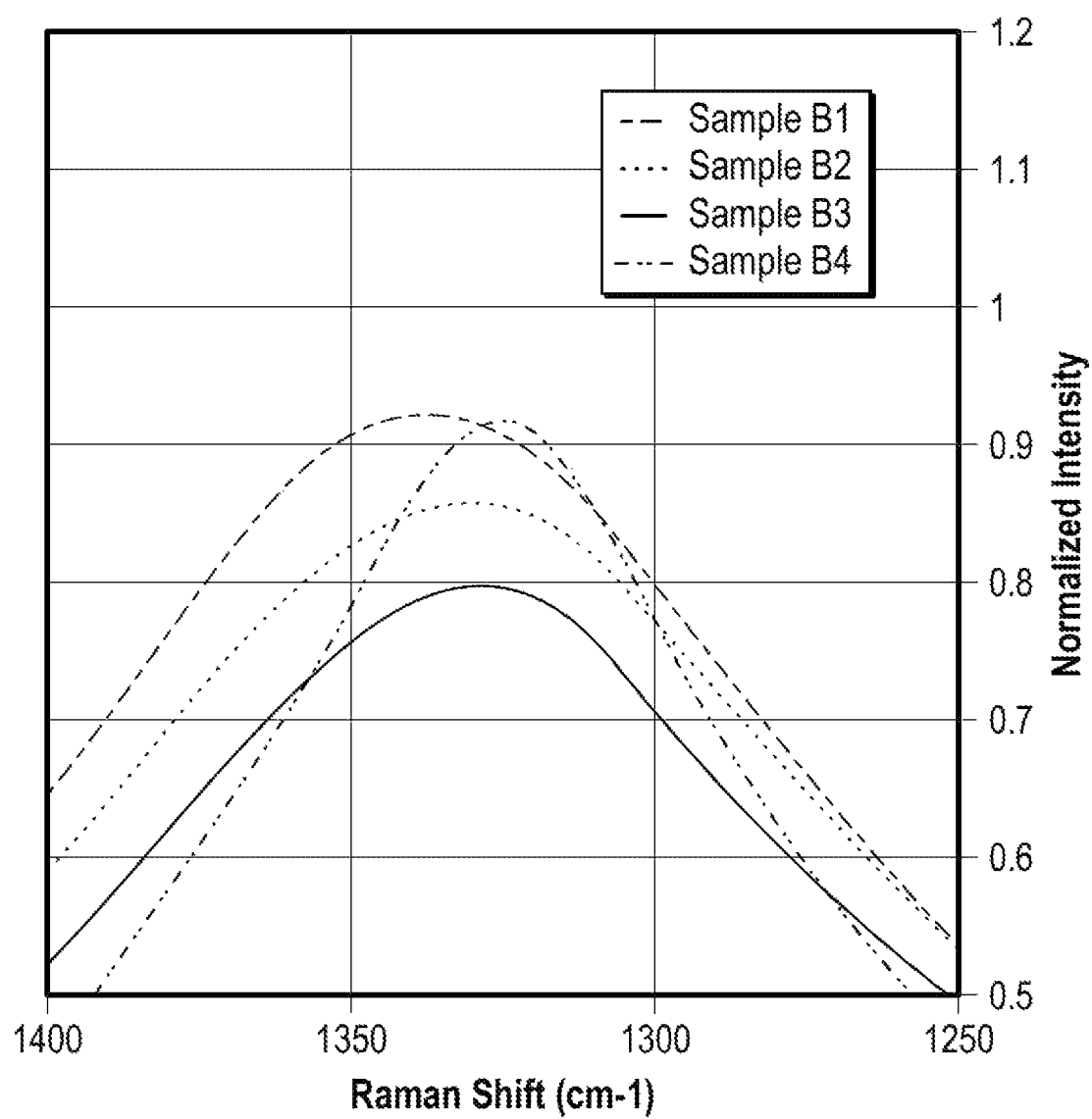
FIG. 39C is the Raman spectral D band of Samples B1-B4.
Figure 39D:
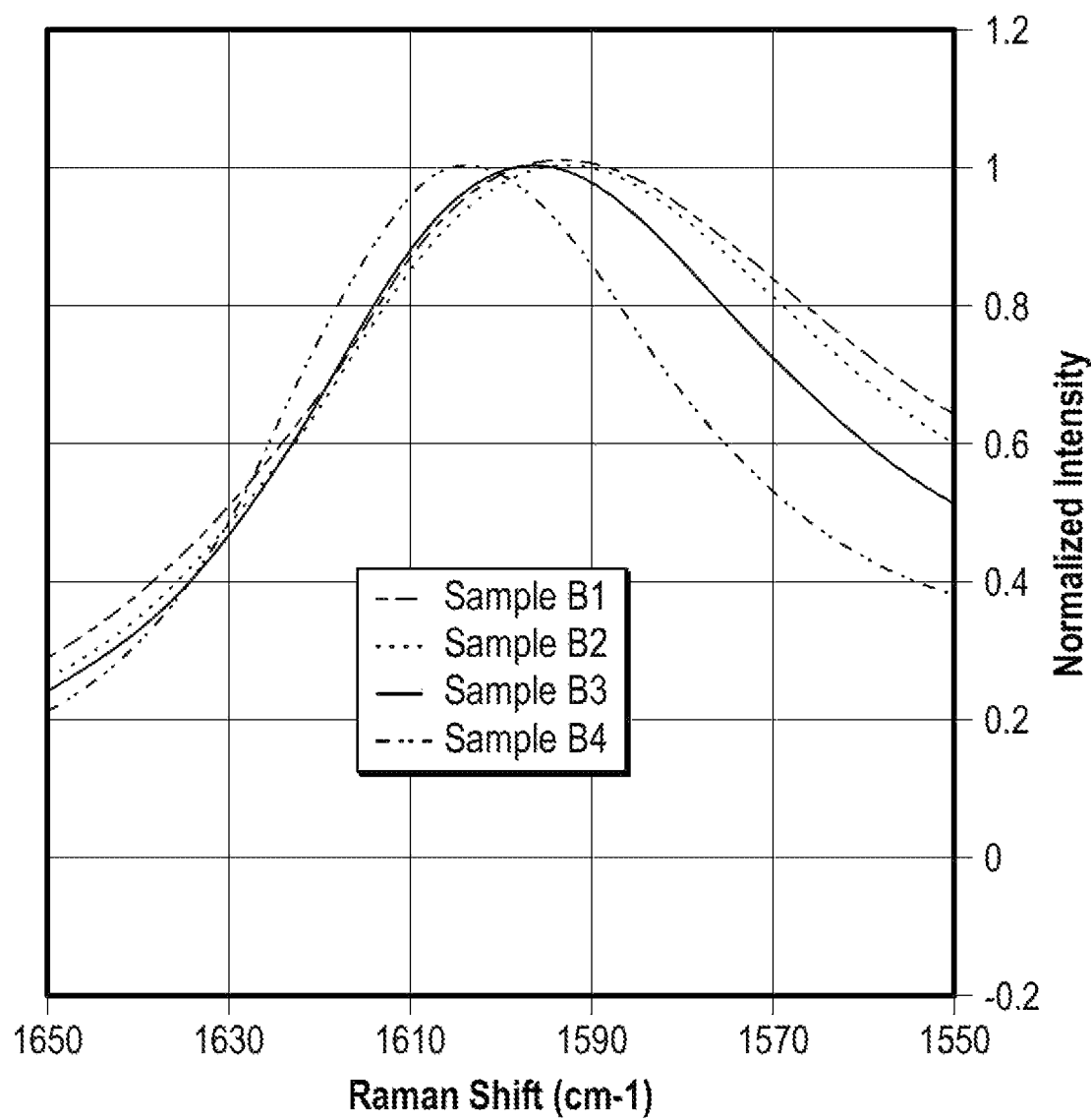
FIG. 39D is the Raman spectral G band of Samples B1-B4.

FIG. 39A shows the average Raman spectra of Samples B1 through B4. FIG. 39B shows a magnification of the averaged $D_u$, $Tr_u$, and $G_u$ features. The arrows in FIG. 39B indicate the direction of corresponding spectral trends as the CVD temperature is decreased for Procedures B1-B3. FIG. 39C shows a magnification of the $D_u$ peak, and FIG. 39D shows a magnification of the $G_u$ peak.

Evaluation of the Raman spectra of Samples B1-B3 indicates a downward tendency of the $D_u$ peak intensity (as well as the peak area) as the pyrolysis temperature is decreased. The peak FWHM does not appear drastically changed. This trend of reducing peak intensity and area signifies an overall reduction in the RBM phonons associated with $sp^2$ rings. This is known to occur as $sp^3$ content increases in disordered carbons—in diamondlike carbons with no $sp^2$ rings, the D feature disappears entirely. The decreasing $D_u$ peak intensities observed in Study B can therefore be assigned to a progressive decrease in the presence of $sp^2$ rings, which are transformed into $sp^x$ rings by the $sp^2$-to-$sp^3$ rehybridization associated with $sp^3$ grafting. As the pyrolysis temperature is reduced, not only do condensates have more time to relax into lower-energy $sp^3$-grafted configurations at tectonic interfaces, but the primordial domains' ring disorder is increased, which should promote offset zones at the expense of level zones. Both of these should increase $sp^3$ grafting and $sp^x$ rings.

Evaluation of Samples B1-B3 also shows that as the CVD temperature is reduced in Study B, the $D_u$ peak also becomes progressively more interpolated with lower-frequency $sp^3$ bands. This indicates a decreasing prevalence of $sp^2$ edge states. As discussed in Study A, this establishes that $sp^2$ edges are increasingly being eliminated at tectonic interfaces, consistent with the adoption of lower-energy, grafted configurations. Interestingly, the interpolation trend observed in Samples B1-B3 does not stop at the cubic diamond peak position of 1332 $cm^{-1}$ but progresses to even lower frequencies.

Surprisingly, as temperature drops and grafting is promoted, it also appears that the overall level of lattice distortion in $sp^2$ clusters is reduced. This is evidenced by the trend in the trough height for Samples B1-B3—a trend that was not observed in Study A, where it was found that Samples A1 and A3, while being synthesized at lower temperatures than Sample A2, exhibited higher troughs. This trend in Study B can potentially be explained by compression arising from the increasing prevalence of $sp^3$ grafting and, in particular, from the increasing prevalence of more strained $sp^x$ ring conformations, such as boat conformations.

Another trend observed in of Samples B1-B3 is that with decreasing pyrolysis temperatures, the $G_u$ peak position gradually blue-shifts from its usual position at 1585 $cm^{-1}$ up to 1596.6 $cm^{-1}$. This indicates an overall increase in the compressive strain of $sp^2$-$sp^2$ bonds, and this compression is also attributed to increasing grafting. Additionally, the G band becomes narrower, indicating less variance in the strain states. Hence, Study B corroborates the correlation observed in Study A of grafting and compression. This compression also helps to explain the declining height of the trough. We can see in FIG. 39B that as the $G_u$ peak position increases, the $I_{Tr_u}/I_{G_u}$ ratio decreases, indicating that tensile strain states are being reduced as the $sp^x$ networks become more compressed.

Another spectral observation in Study B is that the progressive interpolation of the $D_u$ peak position to below 1328.6 $cm^{-1}$ (in Sample B3) under 532 nm excitation. Because of the proximity of Sample B3's $D_u$ peak position of 1328.6 $cm^{-1}$ to the cubic diamond peak position at 1332 $cm^{-1}$, and because anthracitic networks are known to be prone to beam-induced heating, which could affect the $D_u$ peak position, Sample B4 was evaluated at a lower laser power setting of 0.5 mW. The Raman spectrum gathered for Sample B4 at the 0.5 mW laser power setting demonstrates conclusively that the D band is red-shifted below the 1332 $cm^{-1}$ cubic diamond peak position. This interpolation below 1332 $nm^{-1}$ indicates the presence of $sp^x$ rings in hexagonal diamond arrangements. Hexagonal diamond has been shown to have an intense Raman peak at 1324.4 $cm^{-1}$ by some workers, whereas in other instances it has been shown to have peaks between 1318 $cm^{-1}$ and 1325 $cm^{-1}$. Hence, Sample B4's average $D_u$ peak position of 1324.5 $cm^{-1}$, and multiple point spectra with $D_u$ peak positions between 1318 $cm^{-1}$ and 1320 $cm^{-1}$, is strong evidence of $sp^x$ rings in non-chair conformations.

In addition to its greater degree of interpolation, the $D_u$ band in Sample B4 is also conspicuously narrower than the $D_u$ bands in Samples B1-B3. This indicates that a higher fraction of its RBM phonons is being activated by backscattering at $sp^x$ interfaces, and that RBM phonons activated by backscattering at $sp^2$ edge states are being eliminated. The more these $sp^2$ edge atoms are eliminated, and the more highly grafted the $sp^x$ network becomes, the narrower this peak should become. This improvement in grafting in Sample B4 may be attributed to three factors: (i) the increased stability at lower pyrolysis temperatures of strained $sp^x$ conformations required for grafting across certain tectonic interfaces; (ii) slower dehydrogenation at lower pyrolysis temperatures, allowing condensates more time to finding grafting configurations; and (iii) the use of smaller, less sterically hindered $C_2H_2$ gas molecules.

We start with the first factor, which is premised upon the idea that certain tectonic interfaces may not allow chair conformations, i.e. cubic diamond. This premise would be consistent with previously published graphene-to-diamond bonding research. In this work, it was found that for a graphene domain's edge to bond to a diamond surface, it was necessary for the atomic positions of the graphene's dangling bonds to be matched as closely as possible to the atomic positions of some line of $sp^3$ atoms present on the diamond surface. For certain graphenic edge configurations, lonsdaleite (i.e. hexagonal diamond) surfaces offered a better-matching line of $sp^3$ atoms than cubic diamond surfaces.

In our discussion of FIGS. 29-36, we illustrated diamondlike seams comprising $sp^x$ rings in the chair conformation—i.e. cubic diamondlike seams. Extrapolating from the logic of the prior art, wherein graphene-diamond bonding required a match between a graphenic edge configuration and a line of $sp^3$ atoms on a diamond surface, we theorize that in order for two graphenic edges at a tectonic interface to be $sp^3$-grafted, each must be grafted to a matching line of $sp^3$ atoms, and then these two lines of $sp^3$ atoms must be sufficiently matched to form a $sp^3$-$sp^3$ bond line. Sometimes this requires a non-cubic polymorph of diamond.

In a hypothetical zigzag-zigzag interface in which the edges are sufficiently close to bond directly, such as the $E_1$-$E_2$ interface presented in FIG. 29, the two lines of $sp^3$ atoms can be generated via $sp^2$-to-$sp^3$ rehybridization of the graphenic edges themselves, which may then bond directly to each other due to their close proximity. This effectively matches each of the two graphenic structures to a line of $sp^3$ atoms, then forms a $sp^3$-$sp^3$ bond line between them, generating two-dimensional cubic diamondlike seams.

Figure 40:
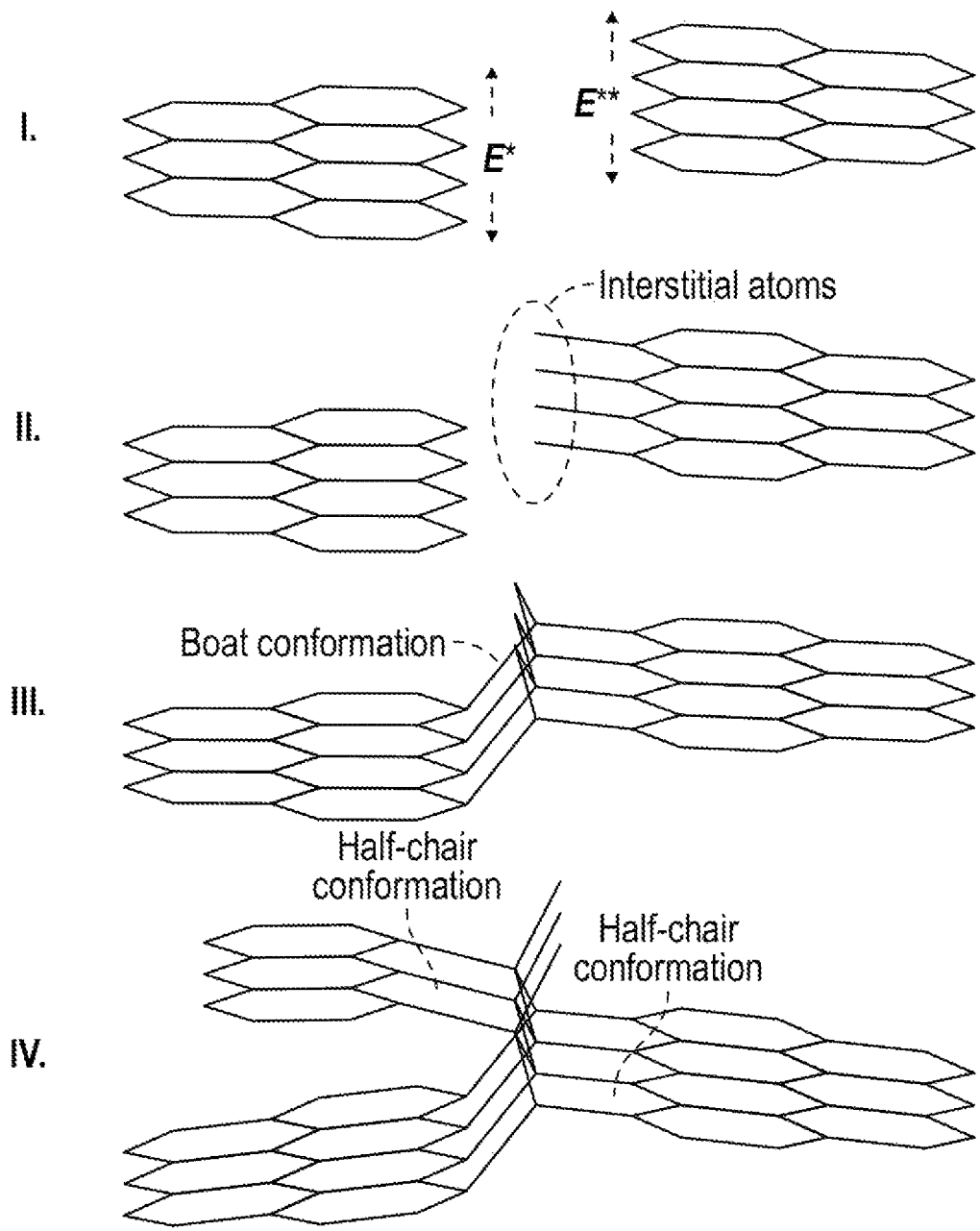
FIG. 40 illustrates a zigzag-zigzag tectonic interface that is grafted via an interstitial line of atoms, creating $sp^x$ rings in the boat conformation. The process is illustrated in 4-stages labeled I, II, III and IV.

Since the spacing between participating edge atoms in a tectonic interface is stochastic in nature, though, we must consider that in some interfaces, opposing edge atoms may be too far apart to bond directly to each other. To illustrate this, in Frame I of FIG. 40 we model an offset zone of a zigzag-zigzag tectonic interface involving two edges, E* and E, where E is elevated over E*. For simplicity, no hydrogen atoms are represented. The spacing between the $sp^2$ edge atoms in Frame I of FIG. 40 is too large for $sp^3$ grafting to occur. However, there is still room remaining between the edges for interstitial atoms to be inserted via continued radical addition.

In Frame II of FIG. 40, we insert a line of $sp^3$ interstitial atoms (circled in FIG. 40) at the elevated edge E. This line of $sp^3$ interstitial atoms is matched to the E edge and is close enough to the $sp^2$ edge atoms of E* for bonding, but the vertical offset inhibits $sp^2$ grafting.

In Frame III, the opposing line of $sp^2$ edge atoms in E* undergoes $sp^2$-to-$sp^3$ rehybridization, forming a line of $sp^3$ atoms, and these are bonded to the line of interstitial atoms via $sp^3$-$sp^3$ bonds, as illustrated in Frame III of FIG. 40. This line of $sp^3$-$sp^3$ bonds ring-connects the graphenic structures. The elevated $sp^3$ radicals on the E** side allow continued radical addition, resulting in the formation of $sp^x$ rings in the boat conformation (since chair conformations are geometrically disallowed). With continued growth, a seam may be evolved, as shown in Frame IV of FIG. 40. Such a seam will no longer comprise cubic diamond, but instead an amorphous, hexagonal diamond polymorph that can be expected to have lower-frequency Raman spectral peaks.

Hence, the lateral spacing at tectonic interfaces play an important role in determining the conformations of the $sp^x$ rings evolved by $sp^3$ grafting. If the spacing between zigzag edges is close enough, opposing $sp^2$ edge atoms may be able to rehybridize and $sp^3$-graft directly to each other, resulting in $sp^x$ rings in chair conformations. If the spacing between zigzag edges is too far, an interstitial line of atoms may be inserted, and $sp^2$ edge atoms may be rehybridized, forming two lines of $sp^3$ atoms that can then form a $sp^3$-$sp^3$ bond line. This will result in less thermodynamically stable conformations that may not be stable at higher temperatures, meaning that complete grafting of tectonic interfaces may not be possible at higher temperatures. We may confidently conclude that, based on the inevitability of these interfacial configurations and their necessitation of $sp^x$ rings in boat conformations, if an $sp^x$ network does not exhibit D peak interpolation with $sp^3$ modes below 1332 $cm^{-1}$, it is incompletely grafted.

The insertion of interstitial atoms, as modeled in FIG. 40, increases the local atomic packing density—in many interfaces, the interstitial atoms may be packed or wedged into an interface, compressing the $sp^2$ regions around the interface. The fineness of this spacing, and the need for molecular rearrangement during dissociative adsorption, suggests that smaller gas-phase species, like $C_2H_2$, will be less sterically hindered from reacting and inserting atoms at these interfaces, facilitating more grafting and compression. We suspect this is a major reason why, although produced at the same temperature of 580° C., Sample B4 (produced from $C_2H_2$ pyrolysis) had a significantly lower $D_u$ peak position than Sample B2 (produced from $C_3H_6$ pyrolysis).

The logic of tight atomic "packing" at tectonic interfaces applies not only to offset zones, where $sp^3$ grafting occurs, but also to level zones, where $sp^2$ grafting occurs. The insertion of interstitial atoms at tectonic interfaces explains the progressively higher G peak positions observed in Study B, with Sample B4 reaching an average position of 1603.3 $cm^{-1}$ and point positions of 1604.2 $cm^{-1}$. In procedures utilizing $C_2H_2$ feedgas at pyrolysis temperatures below 580° C., we have observed average $G_u$ peak positions of greater than 1606 $cm^{-1}$, with point positions of up to 1610 $cm^{-1}$.

Other stochastically-formed tectonic interfaces may easily be envisioned, and $sp^3$ grafting at these interfaces may evolve other $sp^x$ ring morphologies. These may include 5-member rings, 7-member rings, 9-member rings, and potentially others, all of which ring-connect the participating graphenic structure. Any $sp^3$ grafting event that evolves these $sp^x$ rings may, upon further addition, form a diamond-like seam.

Figure 41:
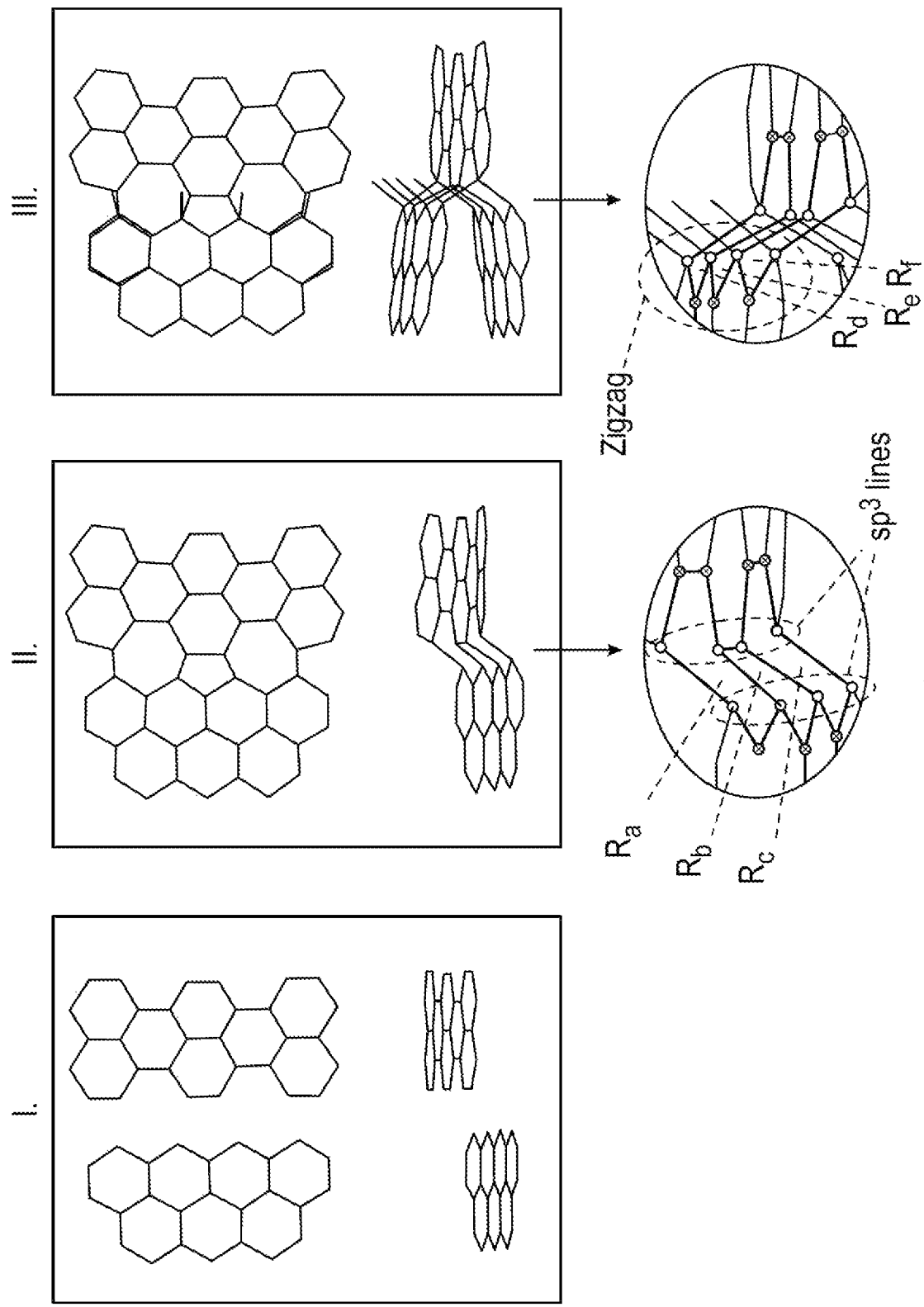
FIG. 41 illustrates a zigzag-armchair tectonic interface that is grafted via two z-adjacent lines of 5-member and 7-member $sp^x$ rings. $Sp^2$ and $sp^3$ atoms are represented as crosshatched circles and white circles, respectively. These 5-member and 7-member rings are bolded.

As an example of this, in Frame I of FIG. 41 we illustrate a tectonic interface formed by a zigzag edge segment and an armchair edge segment (i.e. a "zigzag-armchair" interface). Vertical and horizontal perspectives are shown. For simplicity, we illustrate only an offset zone of the zigzag-armchair interface, and hydrogen atoms are again excluded. In Frame I of FIG. 41, the interfacial spacing is such that opposing $sp^2$ edge atoms are close enough to graft directly but are vertically offset.

$Sp^3$ grafting therefore proceeds via $sp^2$-to-$sp^3$ rehybridization of these opposing $sp^2$ edge atoms, forming two lines of $sp^3$ atoms with atomic positions that allow the formation of a $sp^3$-$sp^3$ bond line between the two graphenic structures. This is illustrated in Frame II of FIG. 41, with $sp^2$ and $sp^3$ atoms being represented in the magnified inset by crosshatched circles and white circles, respectively. The $sp^3$-$sp^3$ bond line forms alternating 5-member and 7-member $sp^x$ rings (designated $R_a$, $R_b$, and $R_c$ and bolded in the magnified inset in Frame II of FIG. 41) that ring-connect the two graphenic structures.

As shown in Frame III of FIG. 41, continued pyrolytic growth from tertiary radicals may evolve a second, z-adjacent line of 5-member and 7-member rings (designated $R_d$, $R_e$, and $R_f$ in FIG. 41) and a third line of $sp^3$ atoms (indicated by white circles in the magnified inset of Frame III). The atomic positions within this line of $sp^3$ atoms, like the z-adjacent line of $sp^3$ atoms below it, can be incorporated in a zigzag edge of $sp^2$ and $sp^3$ atoms, which is circled in the magnified inset in Frame III of FIG. 41. In this way, a diamondlike seam is formed at the zigzag-armchair interface.

If the spacing of a zigzag-armchair interface is too large for bond formation between opposing edge atoms, interstitial atoms may need to be inserted. In such cases, $sp^3$ grafting may lead to the formation of boat and half-chair conformations—just as it does in zigzag-zigzag interfaces with interstitial atoms. In Frame I of FIG. 42, the edge atoms of the two domains are not sufficiently close to graft directly to one another, and a line of interstitial $sp^3$ atoms has been bonded to the armchair edge. The line of interstitial $sp^3$ atoms is close enough to the opposing $sp^2$ edge atoms to form bonds, but the vertical offset inhibits $sp^2$ grafting.

Figure 42:
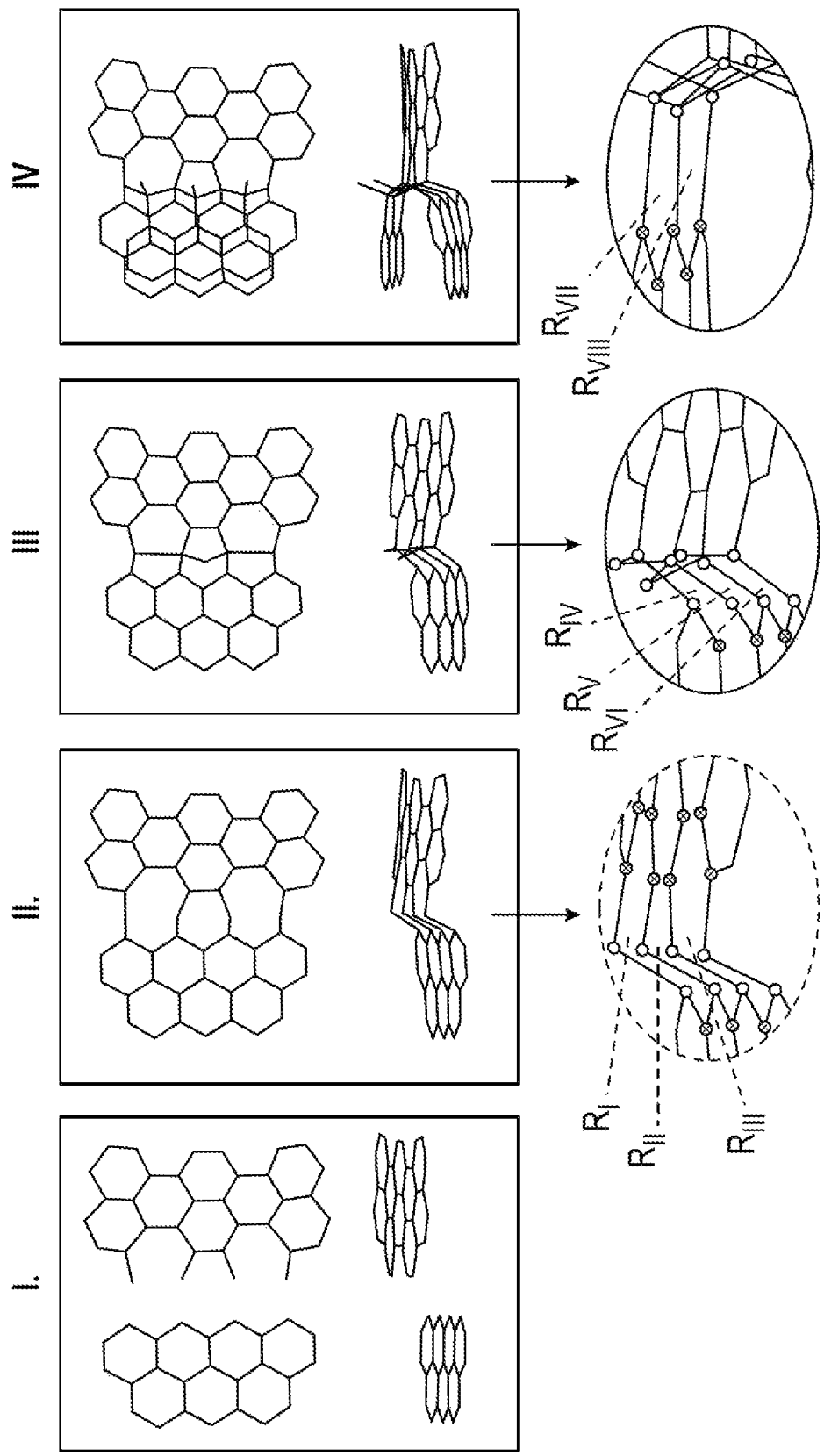
FIG. 42 illustrates a zigzag-armchair tectonic interface that is grafted via an interstitial line of atoms, creating $sp^x$ rings in the boat conformation. $Sp^2$ and $sp^3$ atoms are represented as crosshatched circles and white circles, respectively. These boat conformations are bolded.

In Frame II of FIG. 42, $sp^3$ grafting proceeds via $sp^2$-to-$sp^3$ rehybridization of the $sp^2$ edge atoms, creating a second line of $sp^3$ atoms across from the interstitial line, and the formation of a $sp^3$-$sp^3$ bond line between the two lines. $Sp^2$ and $sp^3$ atoms are represented in the magnified inset in Frame II of FIG. 42 by crosshatched circles and white circles, respectively. The $sp^3$-$sp^3$ bonds form alternating 7-member and 9-member $sp^x$ rings (designated $R_I$, $R_{II}$, and $R_{III}$ in Frame II of FIG. 42) that ring-connect the two domains.

As shown in Frame III of FIG. 42, continued pyrolytic growth may evolve a line of 6-member rings (designated $R_{IV}$, $R_V$, and $R_{VI}$ in Frame III) in the boat conformation. Further growth, as illustrated in Frame IV, may form a line of $sp^x$ rings in the half-chair conformation (designated $R_{VII}$, and $R_{VIII}$ in Frame IV of FIG. 42), creating a Y-dislocation. In this way, a Y-dislocation and hexagonal diamondlike seam are formed from the zigzag-armchair interface with interstitial atoms.

The stochastic nature of the processes makes it inevitable that there will be a variety of tectonic interfacial configurations, $sp^x$ rings, and diamondlike seams, but the exemplary models detailed herein suffice to illustrate the governing principles underlying these varied, specific scenarios. They also explain the observation of Raman spectral features that are consistent with cubic and hexagonal diamond motifs.

Next, we consider more broadly the tectonic interactions and pyrolytic growth of a larger population of primordial domains, which gives rise to higher-layer tectonic activity that we have not yet considered. To illustrate this, we diagram the formation of an $sp^x$ network over a substrate in FIG. 43. The diagram is drawn from a horizontal perspective. Growth is divided into three stages.

Figure 43:
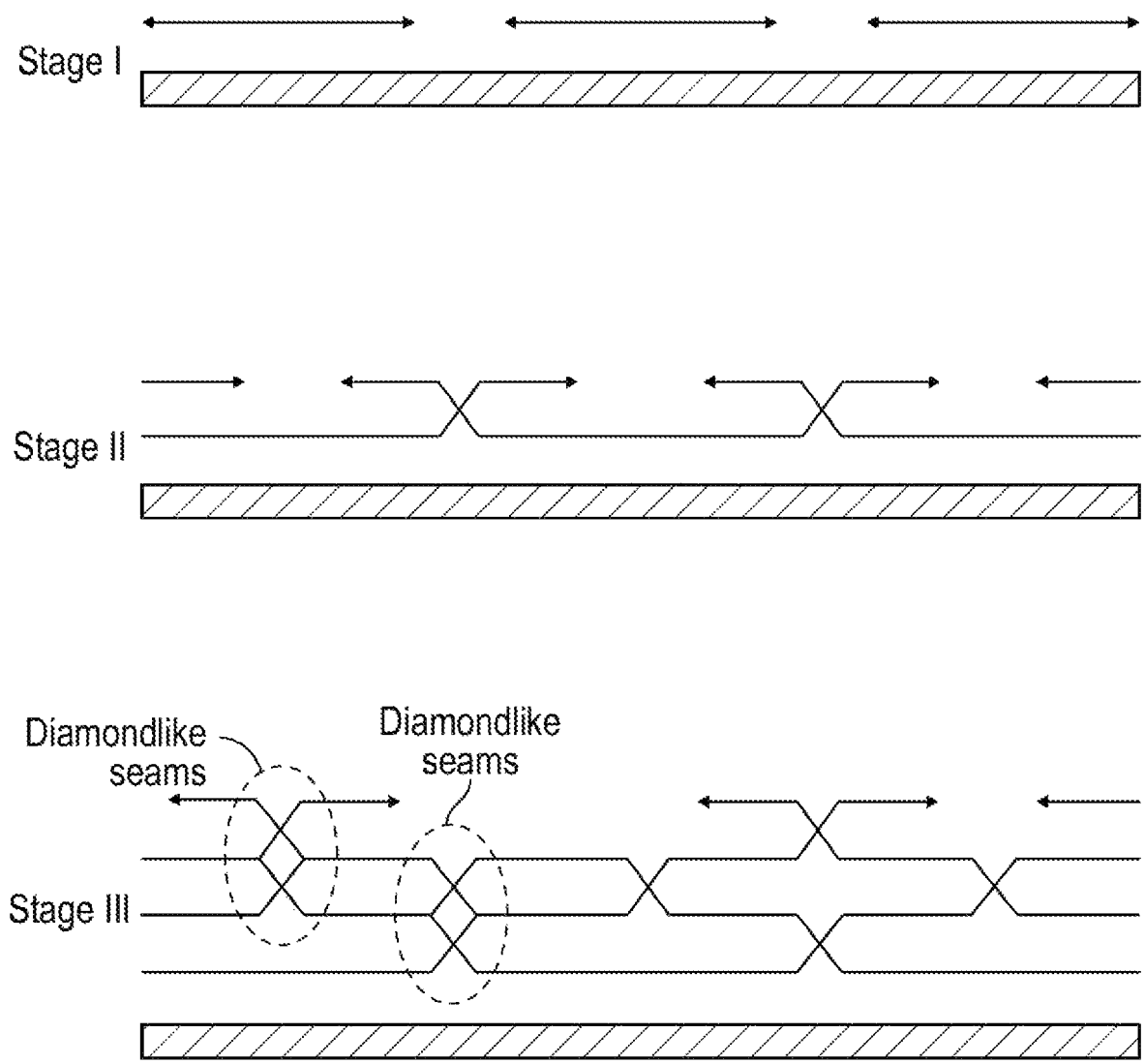
FIG. 43 is a diagram representing the growth of multiple primordial domains (double arrows) over a common substrate surface (hatched), their grafting, and the nucleation and growth of higher layers. The "X" structures represent diamondlike seams. Some diamondlike seams are propagated vertically, while others are not. New diamondlike seams are illustrated as being formed due to higher-layer tectonic activity.

In Stage I of FIG. 43, independently nucleated primordial domains grow toward one another over a common substrate. The substrate is hatched in FIG. 43, and the growing domains are represented by arrows. The arrows indicate that the primordial domains are growing radially outward based on radical addition at their edges. If growth is terminated during Stage I, before much grafting has occurred, the $sp^2$ radial breathing modes will be predominately activated by $sp^2$ edge states associated with these isolated, ring-disconnected domains.

In Stage II of FIG. 43, the domains are grafted to form the base and begin to nucleate higher layers over the base. Diamondlike seams (each seam is represented by an "X" in Stage II of FIG. 43) are formed, and associated with them, an anthracitic $sp^x$ network. The tectonic interfaces are stochastic and dynamic in nature, with the hydrogenated condensates self-rearranging and relaxing into energy-minimizing grafted configurations. Some tectonic interfaces allow opposing edge atoms to be directly grafted to one another, while others require the insertion of interstitial atoms (as illustrated in FIG. 40 and FIG. 42) to enable grafting. This increases the atomic packing and causes compression in the $sp^x$ network. If growth is terminated during Stage II, the activation of RBM phonons will occur via some concert of $sp^2$ edge states (left in place when growth is terminated) and $sp^3$ states. Therefore, we may expect some interpolation of the D band, and different modes of the D band.

In Stage III of FIG. 43, a steady state of vertical and lateral growth of the $sp^x$ network drives higher-layer tectonic encounters and associated grafting. As with the tectonic activity between primordial domains, this proceeds stochastically. Dislocations tend to replicate z-periodically, creating transverse diamondlike seams, but this z-periodicity is not deterministic. Meanwhile, new seams may be nucleated from higher-layer tectonic encounters, as these too can be expected to create incoherent interfaces. This may help to distribute the dislocations more evenly throughout the $sp^x$ network. If growth is terminated during Stage III of FIG. 43, the activation of RBM phonons may be dominated by $sp^3$ states (depending on the efficiency of grafting at interfaces), and we may see more interpolation of the D band than we would if growth were terminated in Stage I or II.

Our staged depictions of vertical and lateral growth in FIGS. 29-36 notwithstanding, lateral growth is expected to be far more rapid than vertical growth mode. In other words, nucleation of higher layers is likely rate-limiting. Since higher-layer nucleation occurs at tectonic interfaces, overall growth may be accelerated by measures that increase tectonic activity and $sp^3$ grafting. Faster lateral growth enables uniform coverage of the substrate and the formation of perimorphic walls of consistent thickness, so long as gas-phase species are abundant. This explains our observation in FIG. 27C of uniformly thick perimorphic walls—even in the "window" regions where nucleation of primordial domains would have been inhibited. We have seen signs that on many substrates, the carbon yielded over extended periods of time remains linear, indicating a steady-state of higher-layer nucleation. This "evergreen" kinetic model is a fundamental advantage of anthracitic networks over graphenic networks in which the only mode of growth is lateral.

The $G_u$ peak position (as a relative indicator of compressive strain), the $D_u$ peak position (as a relative indicator of the elimination of $sp^2$ edge states), and therefore the spectral interval between them (as an indicator of both compressive strain and the elimination of $sp^2$ edge states) may provide a useful metric for characterizing the extent to which different $sp^x$ networks have been able to form grafting bonds across the various stochastically-formed tectonic interfaces created during growth. This interpeak interval—defined herein as the distance in wavenumbers between the $G_u$ and $D_u$ peak positions—is commonly used in the anthracite literature to determine the vitrinite reflectance via the Raman spectrum. The vitrinite reflectance, in turn, is a measure of the maturity of a coal. As coal matures, its interpeak interval expands, corresponding to increasing vitrinite reflectance. For an immature to mature coal, using 532 nm excitation, previous workers have calculated the vitrinite reflectance as: $vR_0\% = 0.0537(G_u - D_u) - 11.21$, where $vR_0\%$ is the vitrinite reflectance (as calculated by Raman parameters).

In Sample B4, the interpeak interval is 278.8 cm$^{-1}$, corresponding to a vitrinite reflectance of 3.76. This vitrinite reflectance is typical of anthracite. Beyond this value, the interpeak interval saturates at approximately 280 cm$^{-1}$ (varying a bit with excitation due to dispersion of the D peak), whereupon the interval begins to shrink again as anthracite matures into meta-anthracite and finally graphite. As this maturation happens, the $I_{D_u}/I_{G_u}$ peak intensity ratio begins to increase, and the interpeak interval ceases to be useful for calculating vitrinite reflectance. For a mature anthracite or meta-anthracite, using 532 nm excitation, previous workers have calculated vitrinite reflection using the $I_{D_u}/I_{G_u}$ peak intensity ratio according to the equation $vR_0\% = 1.1659 (I_{D_u}/I_{G_u}) + 2.7588$.

Figure 44:
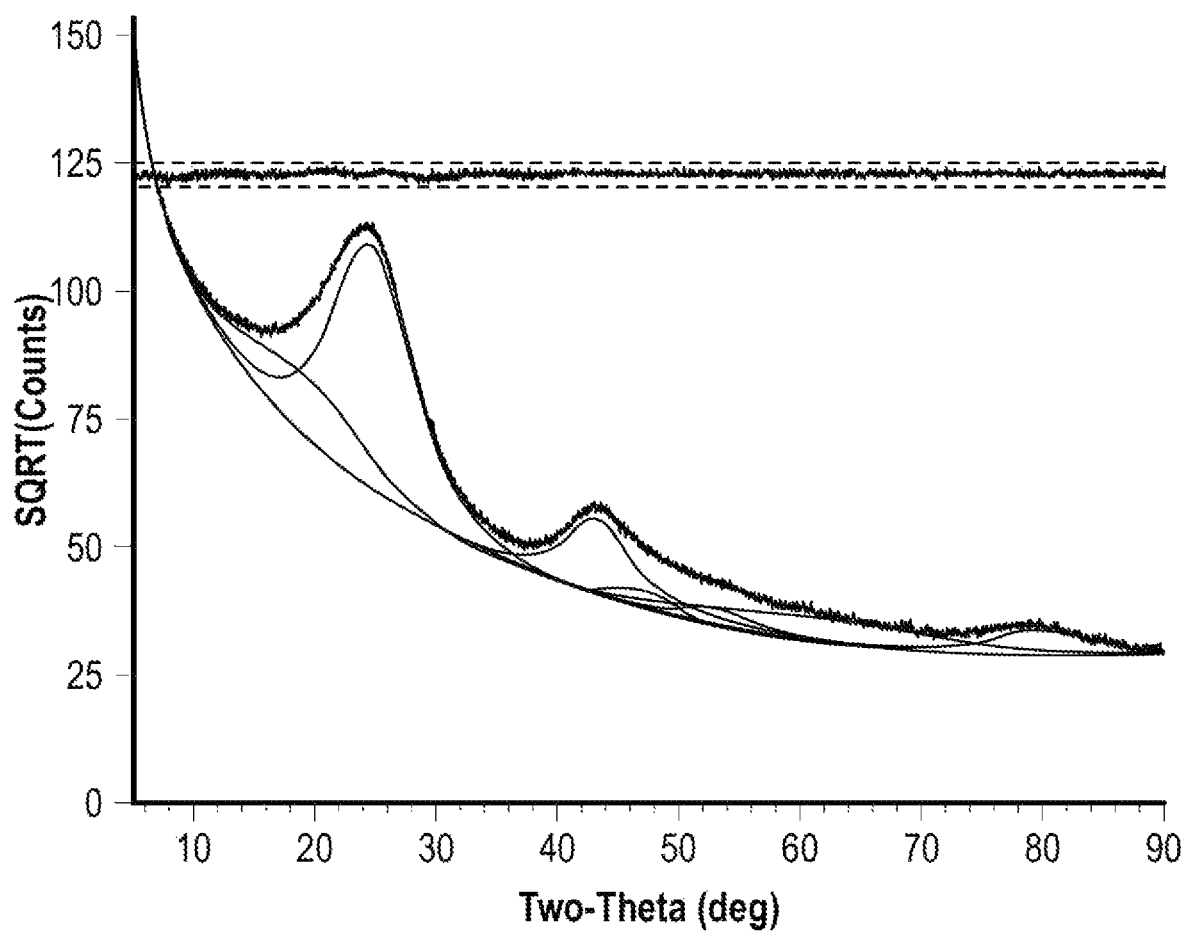
FIG. 44 is the XRD profile of Sample B4.

Next, we characterized Sample B4 via XRD analysis. FIG. 44 shows the overall XRD profile. Table 5 below contains the XRD peak angles, d-spacings, areas, area percentages (normalized to the area of the dominant peak at $2\theta = 24.489°$), and full-width half max values (without correction for instrument broadening).

TABLE 5

| # | Angle (°) | d(Å) | Height | Area(α1) | Area(α1)% | FWHM(°) |
|---|-----------|------|--------|----------|-----------|---------|
| 1 | 18.454 | 4.8041 | 1197.9 | 13842.4 | 30.4 | 10.835 |
| 2 | 24.489 | 3.6321 | 5357.7 | 45491 | 100 | 7.088 |
| 3 | 43.138 | 2.0954 | 971.8 | 8585.4 | 18.9 | 6.115 |
| 4 | 46.927 | 1.9346 | 206.5 | 1258 | 2.8 | 5.695 |
| 5 | 50.192 | 1.8162 | 52.1 | 199.2 | 0.4 | 3.583 |
| 6 | 53.208 | 1.7201 | 174.3 | 1755.3 | 3.9 | 6.699 |
| 7 | 59.671 | 1.5483 | 213.9 | 5712.9 | 12.6 | 23.714 |
| 8 | 79.501 | 1.2046 | 207.4 | 2196.6 | 4.8 | 9.257 |

The XRD profile of Sample B4 comprises broad peaks, indicating a range of interlayer and in-plane periodicities. In particular, we note the broad fitted peak at $2\theta = 43.138°$, which is equivalent to a <100> d-spacing of 2.095 Å. This reflects an average in-plane compressive strain of around 2% based on graphite's <100> d-spacing of 2.13 Å. We can also see signs of in-plane compressive strain at $2\theta = 79.501°$, which is equivalent to a <110> d-spacing of 1.21 Å. This again reflects a compressive strain of around 2% based on graphite's <110> d-spacing of 1.23 Å. This is in good agreement with the blue-shifted $G_u$ peak position exhibited by Sample B4.

The most prominent feature of the XRD profile of Sample B4 is its main peak at 2θ=24.489°, which reflects a <002> d-spacing of 3.63 Å. This is significantly larger than the 3.35 Å <002> d-spacing associated with AB-stacked graphite or the 3.45 Å <002> d-spacing associated with turbostratic graphite. We attribute this expansion to forced AA-stacking at a large number of the cubic diamondlike seams distributed throughout the $sp^x$ network. In AA-stacked regions, Pauli repulsion produced by alignment of the π electron orbitals can be expected to increase the minimum interlayer spacing. Indeed, the interlayer spacing of AA-stacked layers has been predicted to have 3.6-3.7 Å, which is in good agreement with the main interlayer peak at 2θ=18.454°. Additionally, we observe a related, minor <004> peak at 2θ=50.192°, reflecting a d-spacing of 1.82 Å—one-half of the <002> d-spacing of 3.63 Å.

A second interlayer peak is fitted at 2θ=18.454°, reflecting an interlayer d-spacing of 4.80 Å. These values, and the breadth of the peaks, indicate a broad range of large interlayer spacings—larger than we observed in Study A. This is explained as follows. Increased atomic packing as a result of grafting in a highly grafted $x-sp^x$ network causes in-plane compressive strain that exceeds the critical buckling strain. Regions that are compressed beyond this critical buckling strain are forced to buckle in the positive z-direction, this direction representing their only degree of freedom. For this to occur requires them to overcome their vdW attraction to the underlying layer. If they are sufficiently strained, this occurs, and they bow out from the z-adjacent layer below, reaching a maximum z-deflection amplitude somewhere near the geometric center between the lateral seams anchoring their periphery. This z-deflection relieves these regions' in-plane compressive strain but also increases their interlayer d-spacing. We would expect bowing to create a broad continuum of interlayer d-spacings, and this is exactly what we observe in Table 4 and FIG. 44, where the broad peak centered at 2θ=18.454° reflects a significant phase of interlayer d-spacings larger than 7 Å. Therefore, we assign this second interlayer peak at 2θ=18.454° to z-directional bowing of xy-compressed graphenic regions between the diamondlike seams that pin them peripherally.

With this association established, we can see signs of bowing even in the interlayer d-spacings of Sample A1 (a minimally grafted $z-sp^x$ network) and Sample A2 (a vdW assembly), and we can see that these samples also exhibit states of in-plane compression based on their <100> peaks, which indicate d-spacings below 2.13 Å. From this, we can that similar phenomena are occurring in these less-grafted systems. In Sample A2, specifically, it is likely that localized $sp^x$ networks are being constructed, but these do not extend throughout the whole perimorphic wall. In other words, the $sp^x$ networks formed within the perimorphic walls in Sample A2 are too poorly grafted to extend the ring-connected network throughout the whole perimorphic wall.

Based on our findings presented in Experiments A and B, it is possible to speculate ex post facto about instances within the prior art where $sp^2$ and $sp^3$ grafting may have occurred in graphitic networks.

In one such instance, Cui employed a template-directed CVD procedure using methane ($CH_4$) and MgO template particles at 950° C., which produced a monolayer graphenic structure that, as synthesized on the template, possessed a $D_u$ peak position of 1322 $cm^{-1}$ (under 633 nm excitation). Barring any interpolation of the D band, under 633 nm excitation we would have expected the $D_u$ peak of this graphenic monolayer to be found around 1332 $cm^{-1}$. As we have discussed, this would be consistent with $sp^3$ grafting and the formation of $sp^x$ rings in the chair conformation. Therefore, the reported D peak position of 1322 $cm^{-1}$ reported might represent a red-shift caused by interpolation.

However, we note a few points. First, in order to satisfy ourselves on whether or not Cui's procedure produced an $sp^3$-grafted system, we attempted to replicate the reported results. We were pleased by the close agreement in the BET and TGA characterizations of the replicated sample we were able to synthesize with these characterizations of the sample reported by Cui. Furthermore, our Raman spectral analysis (performed under 532 nm excitation) revealed a very similar Raman spectrum in terms of the $I_{D_u}/I_{G_u}$ peak intensity ratio. However, it did not reveal any obvious interpolation of the D peak position. Our attempt did not replicate the interpolation of the D peak.

Second, irrespective of the of the D band interpolation in the sample reported by Cui, the sample could not be described as an anthracitic network or an $sp^x$ network insomuch as the graphenic particles generated were natively monolayer, as synthesized on the template, and as such any crosslinking was lateral. The case for this was made convincingly in the prior art based on extensive BET, TGA, and XRD characterization. Hence, the vertical crosslinking between layers afforded by an anthracitic network was not realized, as these dislocations require a native, multilayer structure. It is true that the monolayer network, upon removal of the template, were reported to collapse into a bilayer structure. However, these bilayers would not have been crosslinked by dislocations, sacrificing this important third dimension of molecular-scale crosslinking present in anthracitic networks. The lack of dislocations was apparent in HRTEM imagery of the bilayers, where the fringe lines were uninterrupted, visually distinct and traceable over distances of 10 nm or more.

In another work within the prior art, Chung flame-synthesized carbon nano-onions at measured temperatures of 700° C. or less (the measured temperatures varied based on where measurements were taken). This process involved rapid chemical vapor deposition over metallic catalyst nanoparticles, creating graphitic carbon nano-onions via precipitation. Based on our ex post facto analysis, it appears that these graphitic carbon nano-onions comprised diamondlike seams. However, the mechanisms and patterns of crosslinking would have been different, given the graphitic alignment of the layers comprising the layered network (this graphitic alignment was evident in HRTEM analysis and also established by the reported <002> interlayer d-spacing of 3.45 Å). In particular, there would have been far fewer chiral rings and columns in these graphitic networks, due to the scarcity of zone transitions at tectonic interfaces between their highly ring-ordered domains. These transitions are directly related to the undulating edge geometry associated with ring-disordered domains grown via a free radical condensate growth mechanism. Additionally, these carbon nano-onions offer less versatility and diminished control over important morphological attributes compared to the growth procedures demonstrated herein. Nevertheless, it is foreseeable that certain aspects of this flame-synthesis process, such as partial oxidation, could be employed in tandem with the use of non-metallic catalysts and free radical condensate-based growth.

X. Study C—Analysis

In exploring other pyrolytic procedures capable of synthesizing $sp^x$ networks, we found that employing template-directed CVD temperatures similar to those employed in Study B, but at lower temperatures (between 325° C. and 500° C.), produced carbons with increasingly brown coloration. At 400° C. and below, incomplete dehydrogenation of the condensate during growth resulted in carbons possessing a bright brown coloration. At a temperature of 460° C., the carbons produced appeared gray with a faint brown hue.

Figure 45:
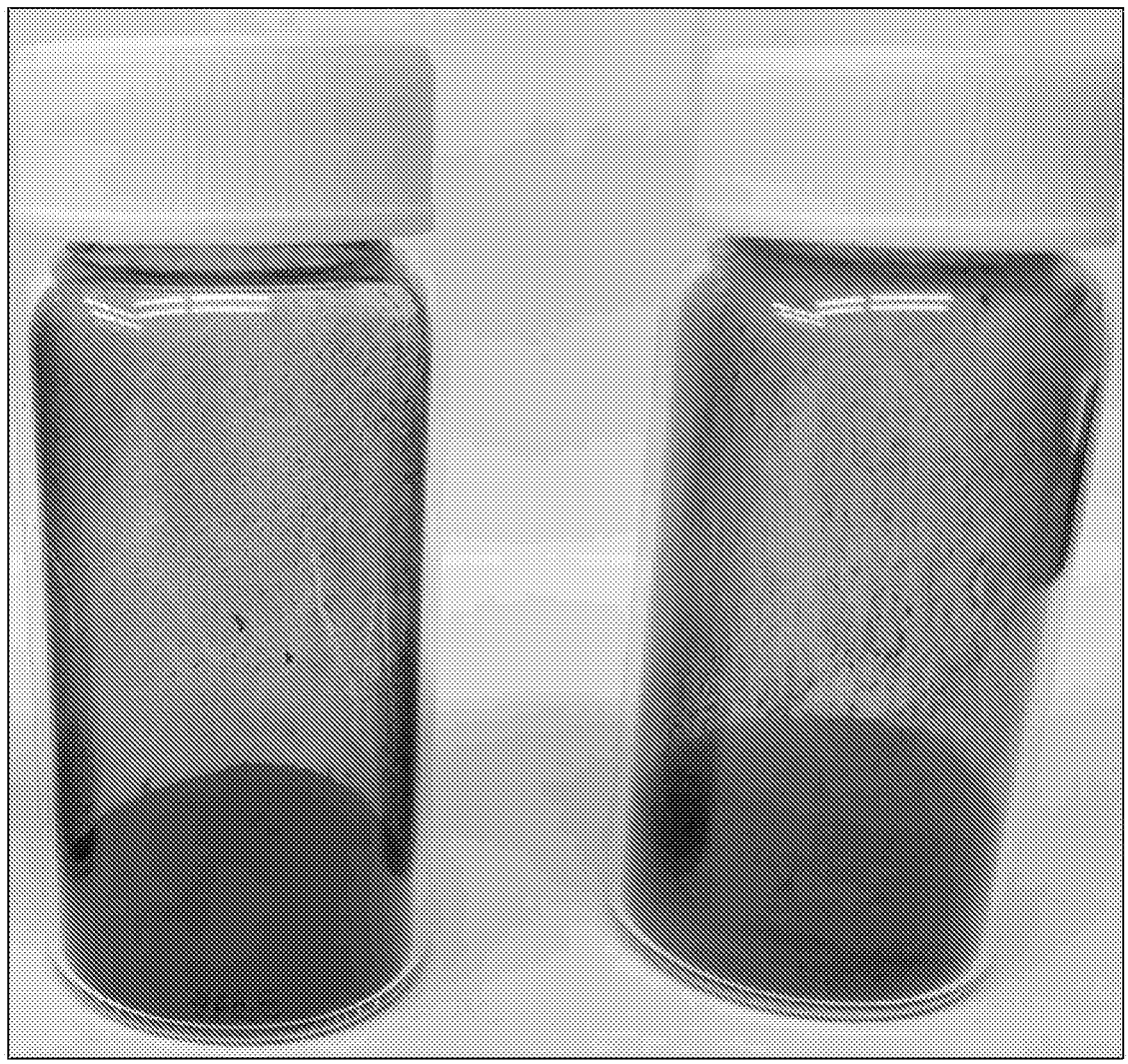
FIG. 45 is an image of the powders comprising Samples C1 and C2.
Figure 46A:
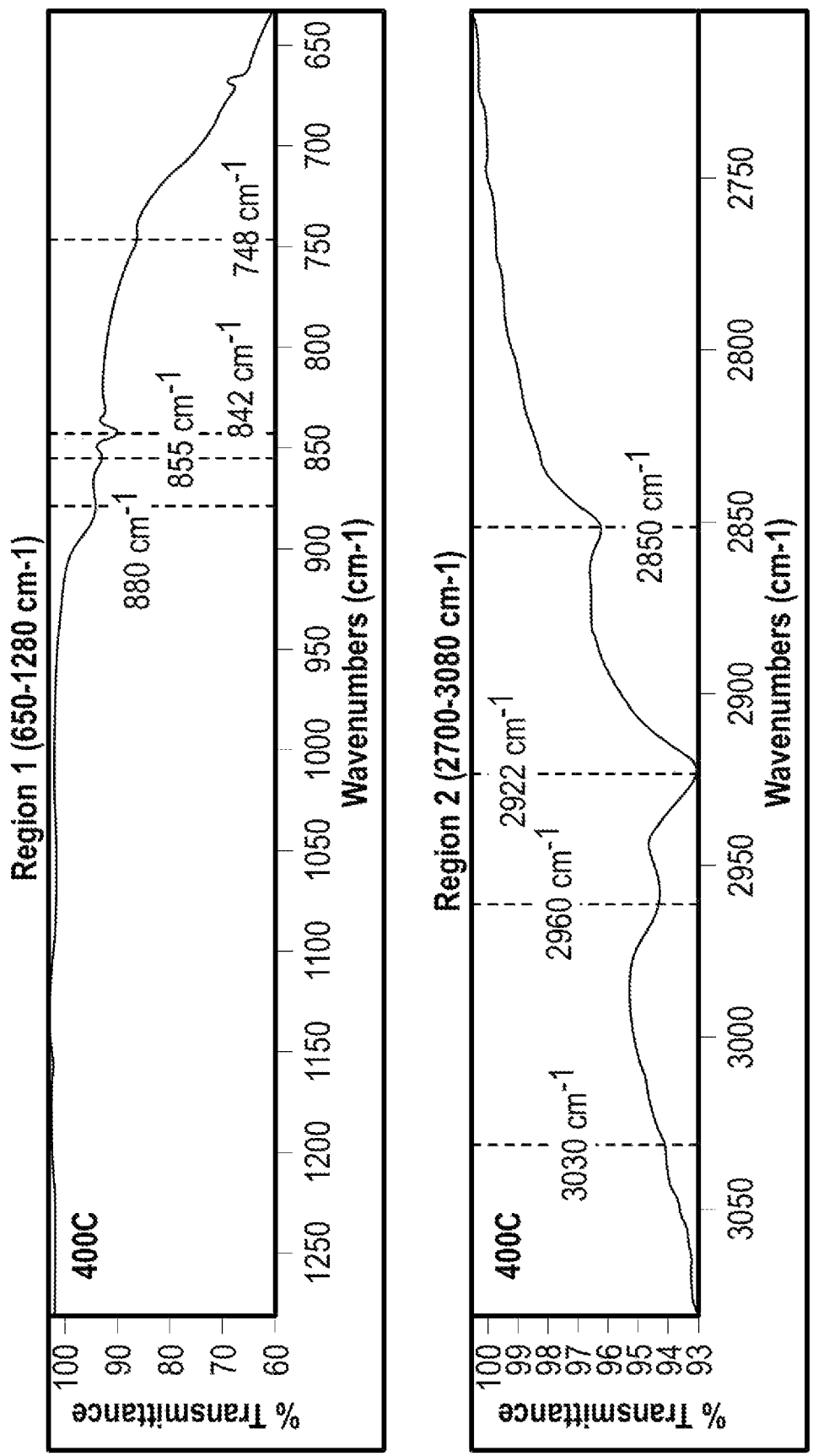
FIG. 46A is the FTIR of Sample C2 with peaks indicating the hydrogenation of this brown coal-like sample.

A comparison of two samples (Samples C1 and C2) synthesized 460° C. and 400° C. respectively is shown in FIG. 45 with the bright brown color of Sample C2 evident in FIG. 45 as a slightly lighter gray in the grayscale photograph. These powders' color differences are analogous to the difference between high-maturity coals (black coloration, low hydrogen) and low-maturity coals (brown coloration, high hydrogen). Residual hydrogen of the 400° C.-carbon sample shown in FIG. 45 was confirmed via FTIR analysis, as shown in FIG. 46.

Raman characterization of Samples C1 and C2 was performed using a 532 nm laser at 0.5 mW power under an Ar blanket. This lower laser power was deemed appropriate due to the thermal instability of the samples at higher power. Table 6 below shows the sample, the CVD temperature (i.e. the set point on the CVD furnace), the carbon source, the average $I_{D_u}/I_{G_u}$ and $I_{Tr_u}/I_{G_u}$ peak intensity ratios, the average $G_u$ and $D_u$ peak positions, and the interval between the $G_u$ and $D_u$ peak positions:

TABLE 6

| Sample | CVD Temp | Carbon Source | $I_{u-D}/I_{u-G}$ | $I_{u-Tr}/I_{u-G}$ | u-G Peak Pos. | u-D Peak Pos. | Interpeak Interval |
|---|---|---|---|---|---|---|---|
| C1 | 460° C. | $C_2H_2$ | 0.80 | 0.32 | 1601.6 | 1332.7 | 268.9 |
| C2 | 400° C. | $C_2H_2$ | 0.92 | 0.41 | 1597.5 | 1358.0 | 239.5 |

The Raman spectral data in Table 6 is derived from an average spectrum representing a composite of 16 point spectra. To generate the average, the raw data from each point spectrum was first smoothed using a moving average technique over an interval of +/−5 cm$^{-1}$. After smoothing, the intensity values from each point spectra were normalized to a common scale, and the normalized intensity values were then averaged to create an average intensity value for each wavenumber.

Samples C1 and C2 both exhibit a decreased interpeak interval compared to the samples in Study B, which is consistent with more hydrogenation and less grafting. In Sample C1, the $D_u$ peak was interpolated, as shown in Table 6, and based on its $D_u$ peak position at 1332.7 cm$^{-1}$, the particles in Sample C1 comprise partially grafted z-sp$^x$ networks. In Sample C2, the $D_u$ peak did not exhibit interpolation.

Figure 47:
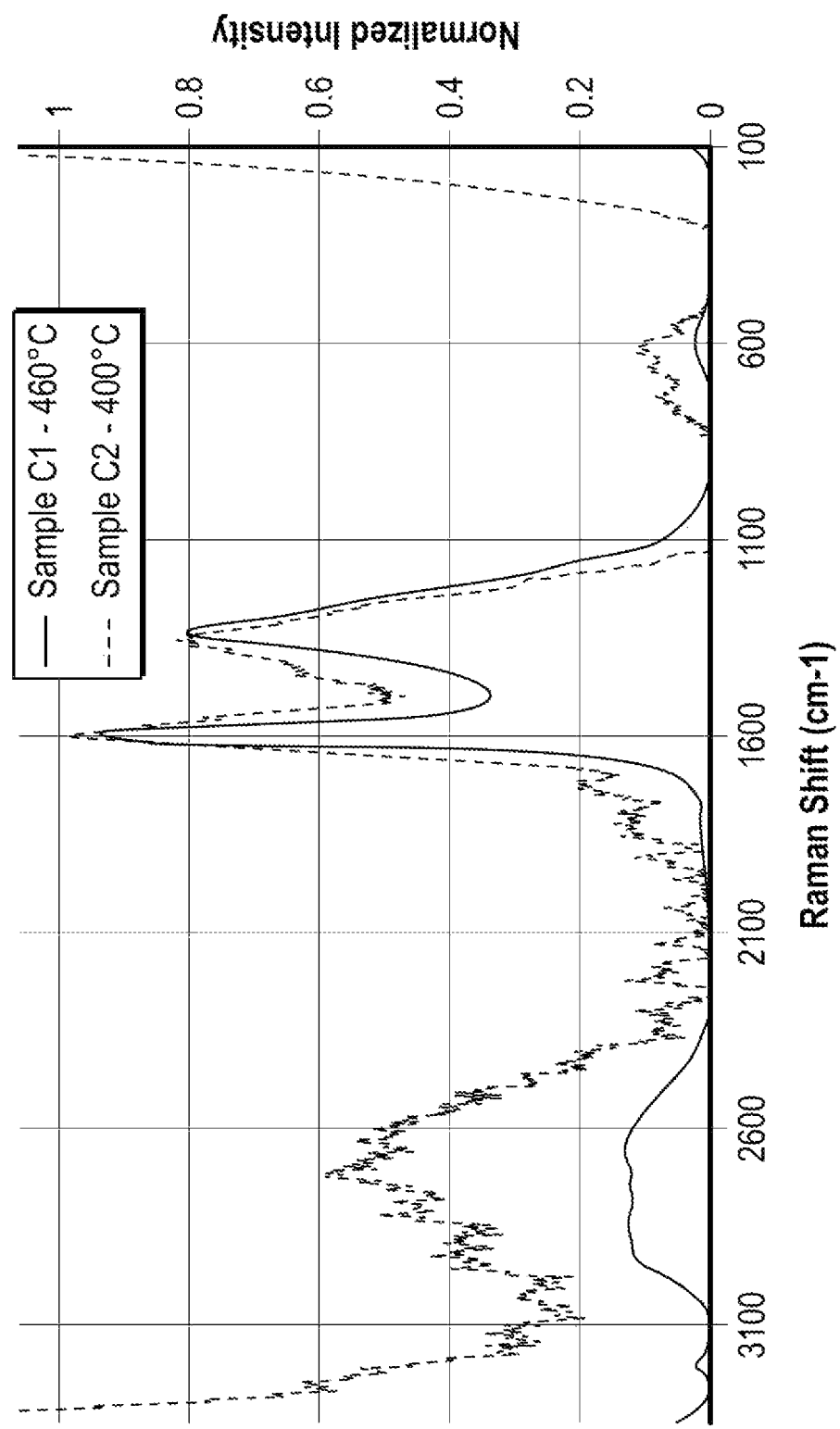
FIG. 47 is the Raman spectra of Samples C1 and C2. In each case, a minor peak at ~600 $cm^{-1}$ that has been attributed to non-hydrogenated nanodiamond is observed. This is an indication of a non-hydrogenated phase of Samples C1 and C2.

As shown in the averaged Raman spectra of FIG. 47, Samples C1 and C2 both exhibit a broad, weak peak at 600 cm$^{-1}$. This peak at 600 cm$^{-1}$ has been attributed to dehydrogenated nanodiamond-type carbons and was also present in Sample B4. Thus, in addition to the hydrogenated phases of Samples C1 and C2, which are associated with the decomposition products of an uncarbonized free radical condensate, there were signs of a non-hydrogenated, nanoscopic diamond phase.

The coexistence of hydrogenated and dehydrogenated phases may correspond to phases grown inside and outside of the porous template, respectively. Namely, in addition to the increased stability of C—H bonds at lower CVD temperatures, inside the porous template, where gas-exchange is diffusion-limited, we would expect an increased proportion of $H_2$. Unable to carbonize due to the inability to release molecular hydrogen, the free radical condensate in such regions would ultimately relax back into neutral, smaller molecular weight hydrocarbon species. Workers in the field of free radical condensates have shown this phenomenon via time-of-flight mass spectroscopy. To corroborate this, Sample C2 was immersed in ethanol under gentle stirring conditions. This created a stable, amber-colored dispersion that passes through filters, indicating the dissolution of an oily phase of hydrocarbons.

XI. Study D—Analysis

Study D was performed to confirm the role of $H_2$ gas in throttling the release of molecular hydrogen during free radical condensate growth. Procedures D1 and D2 were substantially the same, with the exception that in Procedure D1, only $C_3H_6$ and Ar were flowed into the reactor, whereas in Procedure D2, a low flow of $H_2$ was incorporated in addition to the $C_3H_6$ and Ar. It was hypothesized that the presence of $H_2$ should slow down the carbonization process and facilitate the condensate's relaxation into energy-minimizing, grafted configurations at tectonic interfaces. Raman analysis was performed using a 532 nm laser at 5 mW power. Table 7 below shows the Sample ID, Raman $D_u$ peak position, and the approximate yield of carbon in the C@MgO perimorphic composite powder:

TABLE 7

| Sample | $H_2$ flow | $C_3H_6$ flow | Ar flow | $D_u$ peak position | Yield (%) |
|---|---|---|---|---|---|
| D1 | 0 sccm | 20 sccm | 1270 sccm | 1341.9 cm$^{-1}$ | 8.2% |
| D2 | 60 sccm | 20 sccm | 1186 sccm | 1329.5 cm$^{-1}$ | 4.2% |

The increased interpolation of the $D_u$ peak position in Sample D2 confirms that increasing the presence of $H_2$ promoted the elimination of sp$^2$ edge states in Procedure D. Based on Sample D1's $D_u$ peak position of 1341.9 cm$^{-1}$, the perimorphic frameworks in Sample D1 comprise partially grafted z-sp$^x$ networks. Based on Sample D2's $D_u$ peak position of 1329.5 cm$^{-1}$, the perimorphic frameworks in Sample D2 comprise highly grafted x-sp$^x$ networks.

From the approximately 50% reduction in carbon growth, we can also see that by slowing the condensate's carbonization, the rate of carbon growth was slowed. Hence, we find that $H_2$ partial pressure may be used to throttle carbonization and to improve grafting—particularly at higher temperatures where carbonization is hastened. Based on this, we can infer that, in addition to the pyrolysis temperature, the C:H ratio of the carbon source gas, the rate of $H_2$ release and diffusion from growth, the presence of an $H_2$ feedgas, the morphology and pore structure of the substrate, the size of template particles, the activity of the substrate surface, the presence of $H_2$ scavenging species, and numerous other factors are significant insomuch as they will all affect the dynamic equilibrium of the free radical condensate's hydrogenation and dehydrogenation.

Understanding this may allow faster kinetics to be obtained by rationally balancing these many factors. As a simple example, we have observed that we could simultaneously achieve a lower $D_u$ peak position (consistent with better elimination of $sp^2$ edge states) and faster carbon growth kinetics when using a 700° C. CVD temperature and a 30 sccm of $H_2$ feedgas compared to when we used a 580° C. CVD temperature without H2 as a feedgas.

XII. Study E—Analysis

Study E was performed to demonstrate the formation of helicoidal x-networks and z-networks from $sp^x$ networks (in this context referred to as "$sp^x$ precursors"). Samples E1 and E2 were generated using the same template material and comprised the $sp^x$ precursors. Samples E1A and E2A were generated by maturing the Sample E1 and E2 $sp^x$ precursors, respectively. This maturation, or $sp^3$-to-$sp^2$ rehybridization-induced transformation, was obtained by annealing the $sp^x$ precursors prior to the removal of the MgO endomorphs—i.e. by annealing the C@MgO perimorphic composite.

Figure 48:
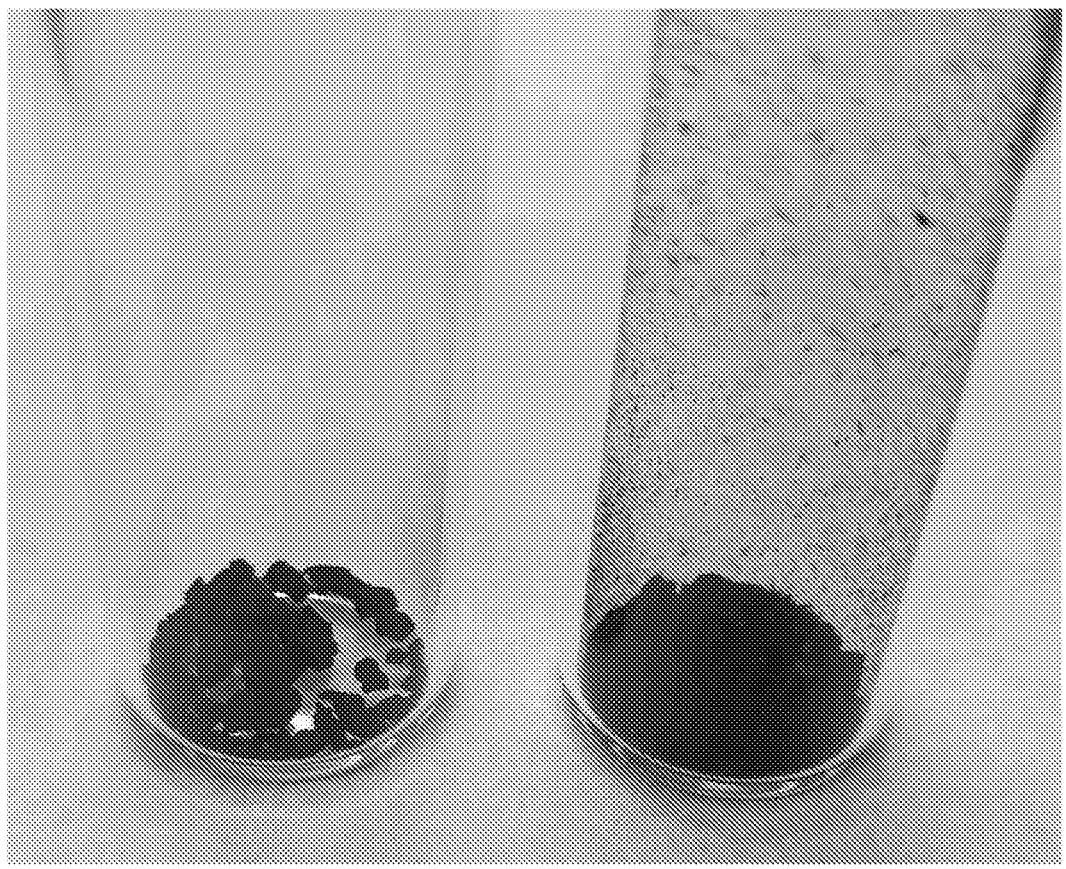
FIG. 48 is a photograph of equivalent masses of Samples E1 and E1A, demonstrating the more granular consistency of Sample E1 and the finer, more voluminous nature of Sample E1A.

Equivalent masses of the Sample E1 and E1A are shown side-by-side in FIG. 48, with Sample E1 on the left and Sample E2 on the right. Sample E1 consisted of large, hard granules, whereas Sample E1A had a finer, softer consistency. The Sample E1 granules occupied considerably less volume than the Sample E1A powder and clicked audibly against the glass walls of the vial when shaken, whereas the Sample E1A powder was silent when shaken. Sample E1A occupied a conspicuously larger volume.

Figure 49A:
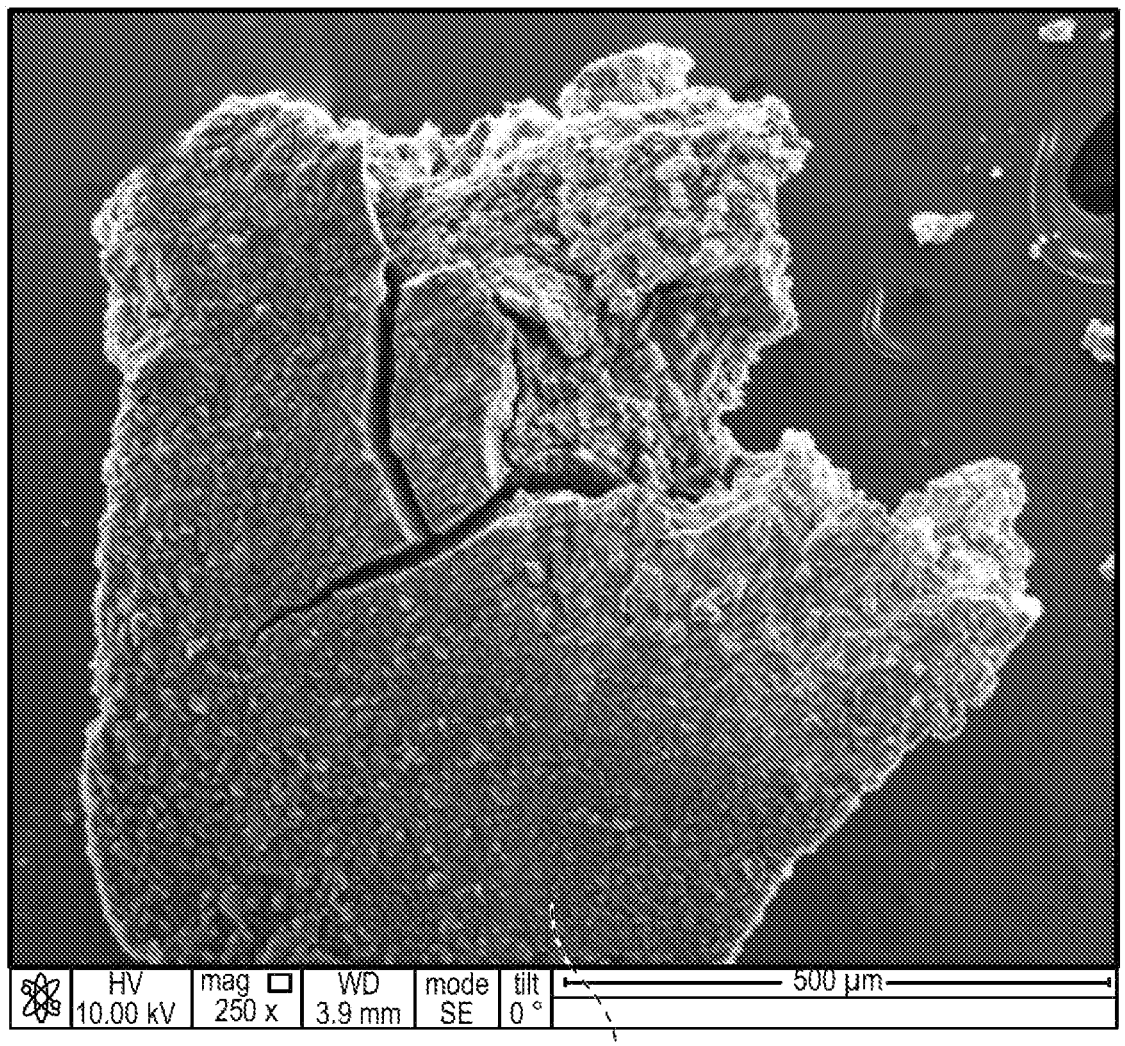
FIG. 49A is a first SEM micrograph of Sample E1, showing a macroscopic granule.
Figure 51:
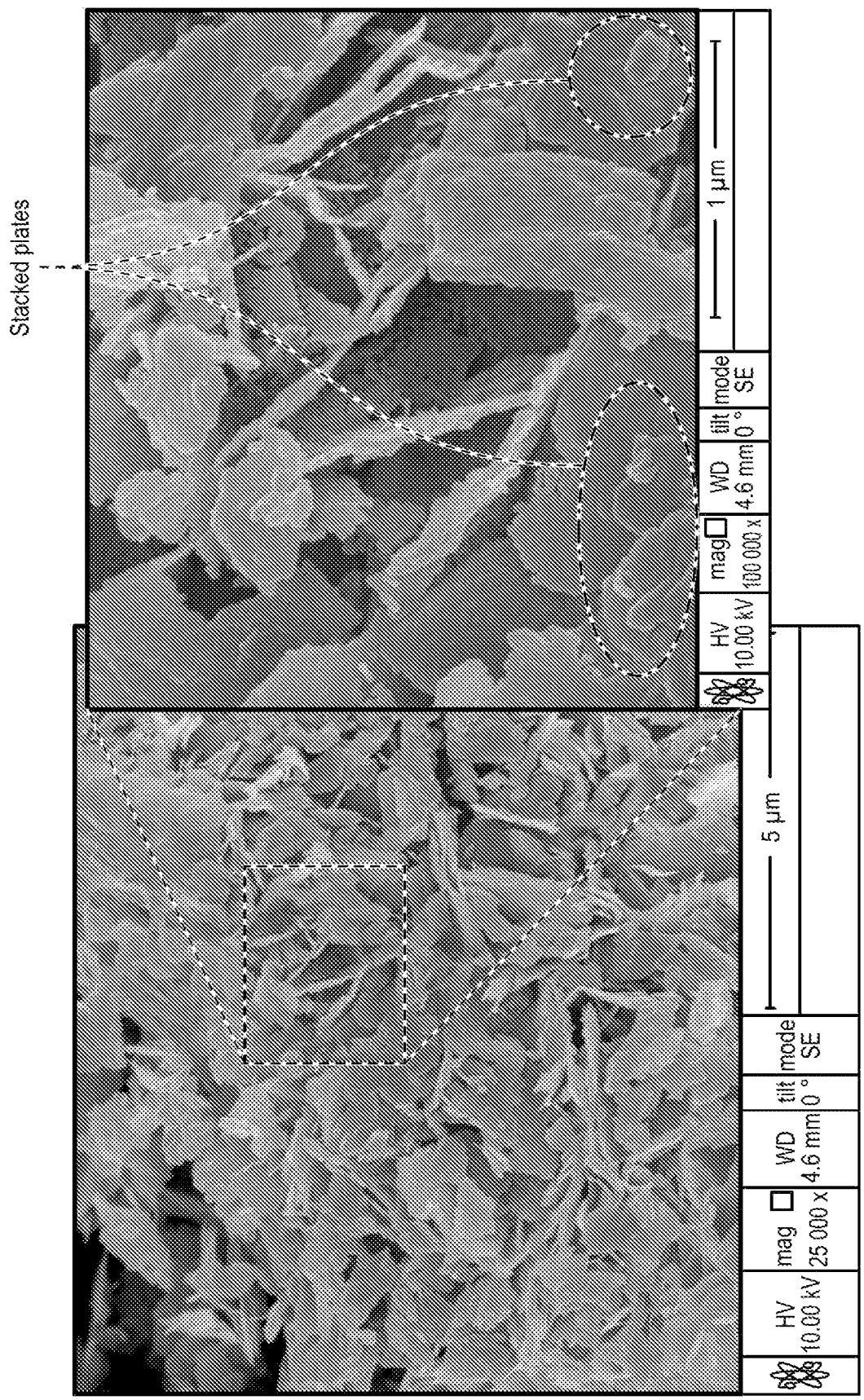
FIG. 51 is an SEM micrograph of the MgO template particles utilized to generate the sheets-of-cells frameworks utilized in Study E. The magnified inset indicates stacked particles.

FIG. 49A is an SEM image showing a granule from Sample E1. As shown at higher magnifications in FIGS. 49B and 49C, the individual perimorphs within the macroscopic granules in Sample E1 exhibit a sheet-of-cells morphology similar to Sample B4. The template utilized to generate the samples in Study E comprised flat, plate-like particles, as well as stacks of plate-like particles. The templates particles comprised a porous substructure of conjoined, nanocrystalline subunits derived from the thermal decomposition of a hydromagnesite template precursor. These template particles (coated with iridium for imaging) are shown in the SEM image of FIG. 51.

Figure 49B:
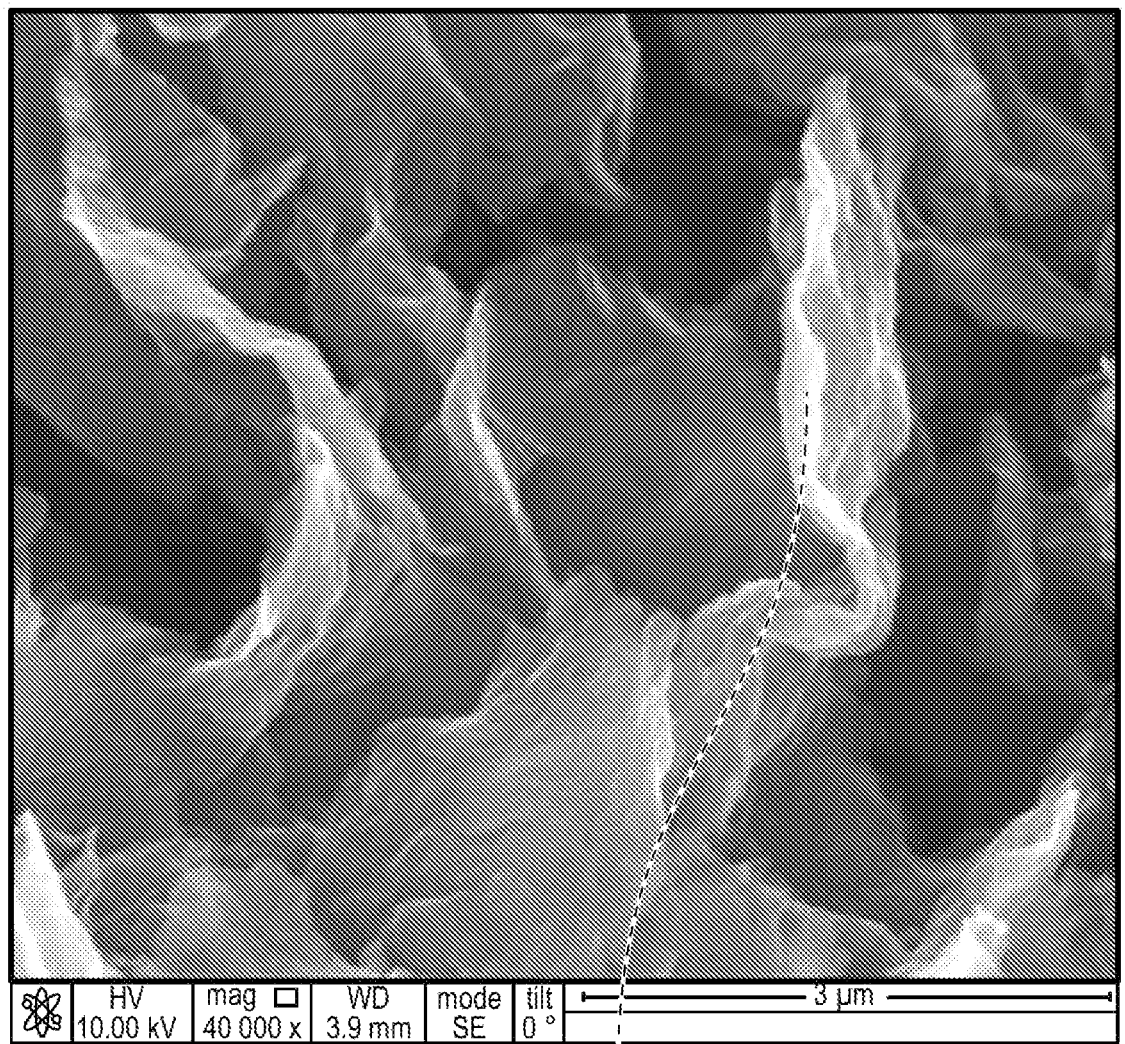
FIG. 49B is a second SEM micrograph of Sample E1, showing curved, tissue-like sheets-of-cells.
Figure 49C:
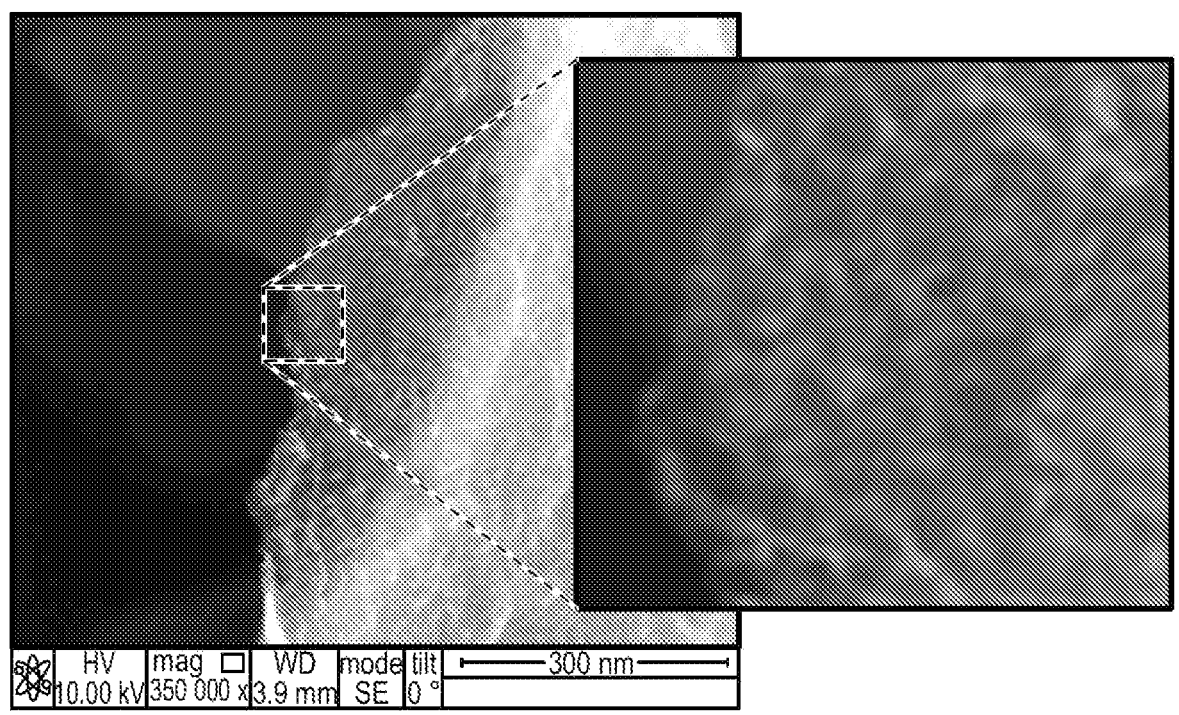
FIG. 49C is a third SEM micrograph of a sheet-of-cells in Sample E1, with a magnified inset showing the particle substructure.

The flexibility of the perimorphic walls in Sample E1 and the surface tension of the water during drying cause the endocellular pores to collapse, so that only the sheet-like superstructure, shown clearly in FIG. 49B, and an indistinct substructure, magnified in the inset of FIG. 49C, are apparent. The local flexibility of the perimorphic walls in Sample E1 renders the particles flexible, as shown in FIG. 49B, creating a wavy, tissue-like appearance. Visually tracing the edges of the sheet-like particles in the SEM images, it is difficult to find any straight lines. The flexibility of the perimorphic frameworks in Sample E1 allows particles to conform to one another, increasing their contact area and reducing the spacing between particles. It is the frameworks' flexibility and improved packing that forms the dense, hard granules during evaporative drying.

Figure 49D:
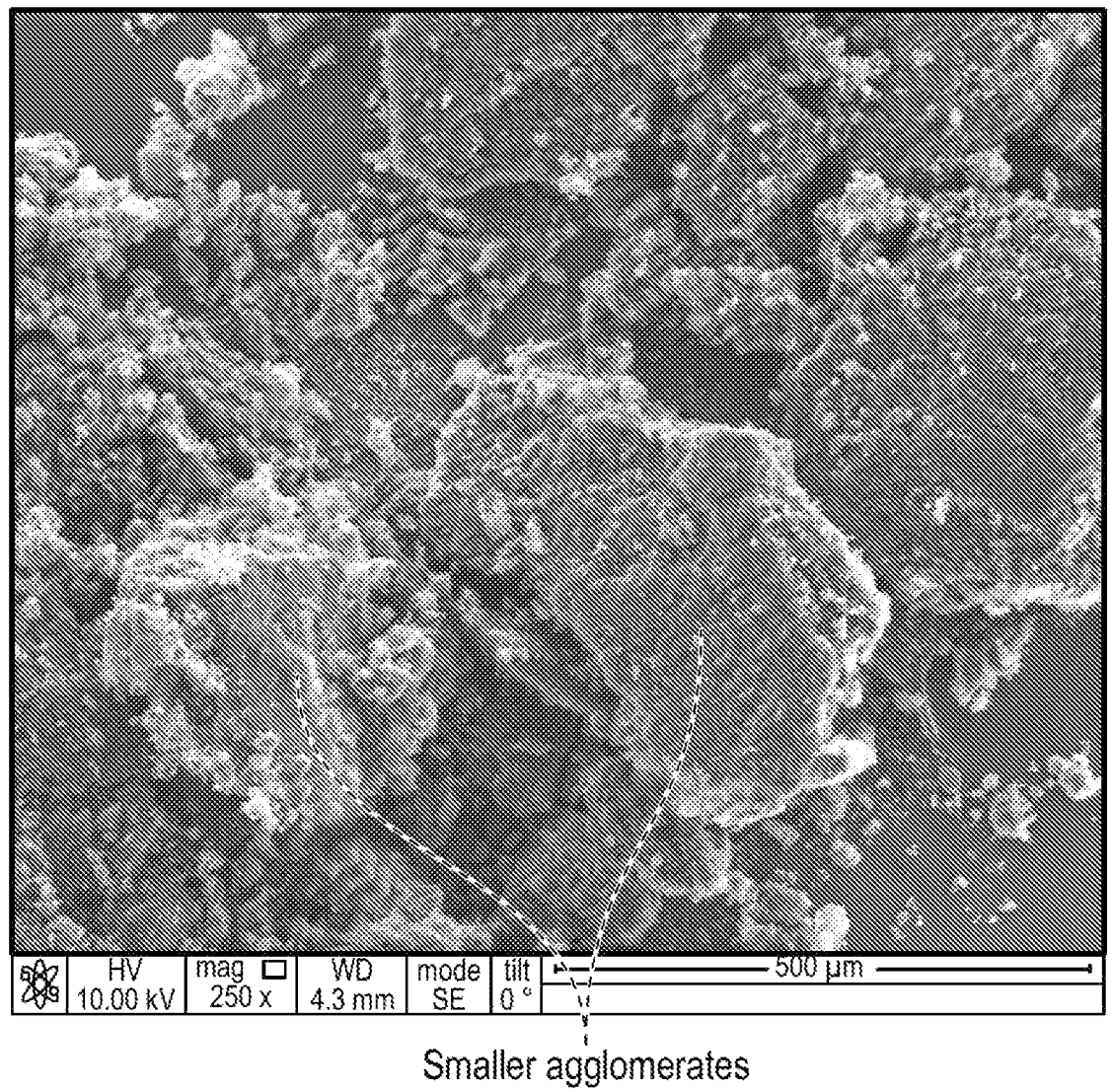
FIG. 49D is a first SEM-micrograph of Sample E1A, showing microscopic granules.
Figure 49E:
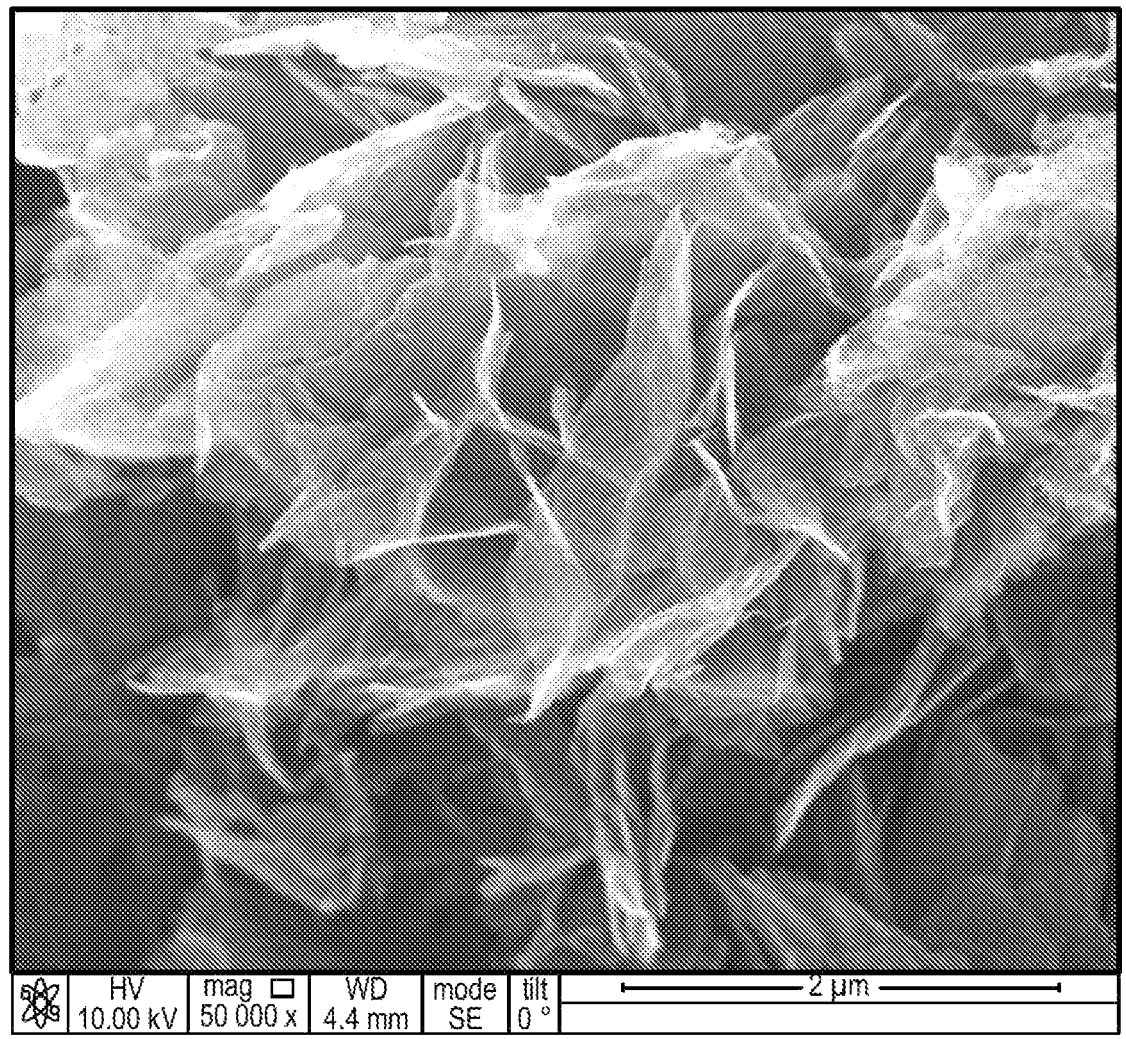
FIG. 49E is a second SEM micrograph of Sample E1A showing sheets-of-cells

FIG. 49D is an SEM showing the finer consistency of the Sample E1A powder compared to Sample E1. While agglomerates were still present in Sample E1A, they were not as dense or hard as the granules in Sample E1, and many smaller agglomerates were present. Comparison of FIG. 49E, which shows the particles in Sample E1A, and FIG. 49B, which shows the particles in Sample E1, reveals that significant changes have occurred. The particles in Sample E1A appear straighter than the wavy particles in Sample E1, indicating rigidification. Whereas the particles in Sample E1 appear tissue-like, the rigidified particles in Sample E1A are more angular, bending by buckling. This increased rigidity reduces the Sample E1A particles' ability to bend and conform to one another, thereby preventing the degree of densification exhibited by Sample E1.

Figure 49F:
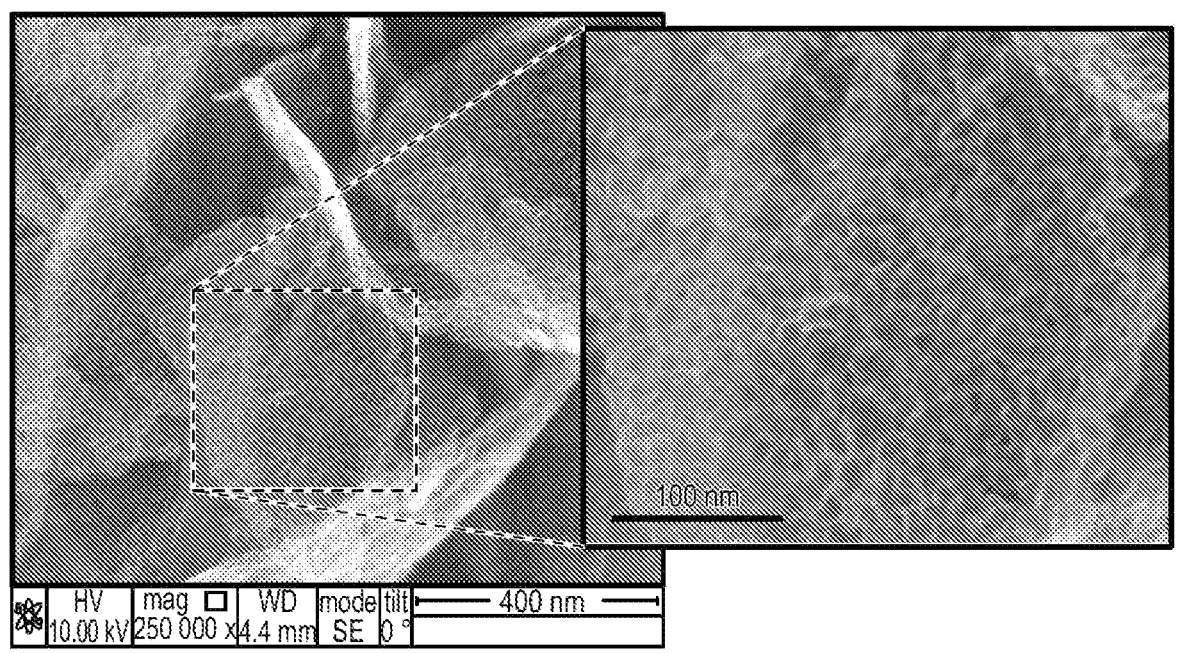
FIG. 49F is a third SEM micrograph of sheet-of-cells in Sample E1A, with a magnified inset showing the particle substructure.

We can see in the magnified inset of FIG. 49F that the rigidification of the Sample E1A particles is also clear at the local level, wherein the porous subunits have been preserved in their native morphology vs. collapsed. This renders the porous substructure of Sample E1A well-defined and recognizable in FIG. 49F—clearly more faithful to the native, templated morphology than the comparatively indistinct substructure of Sample E1 in FIG. 49C.

Figure 50A:
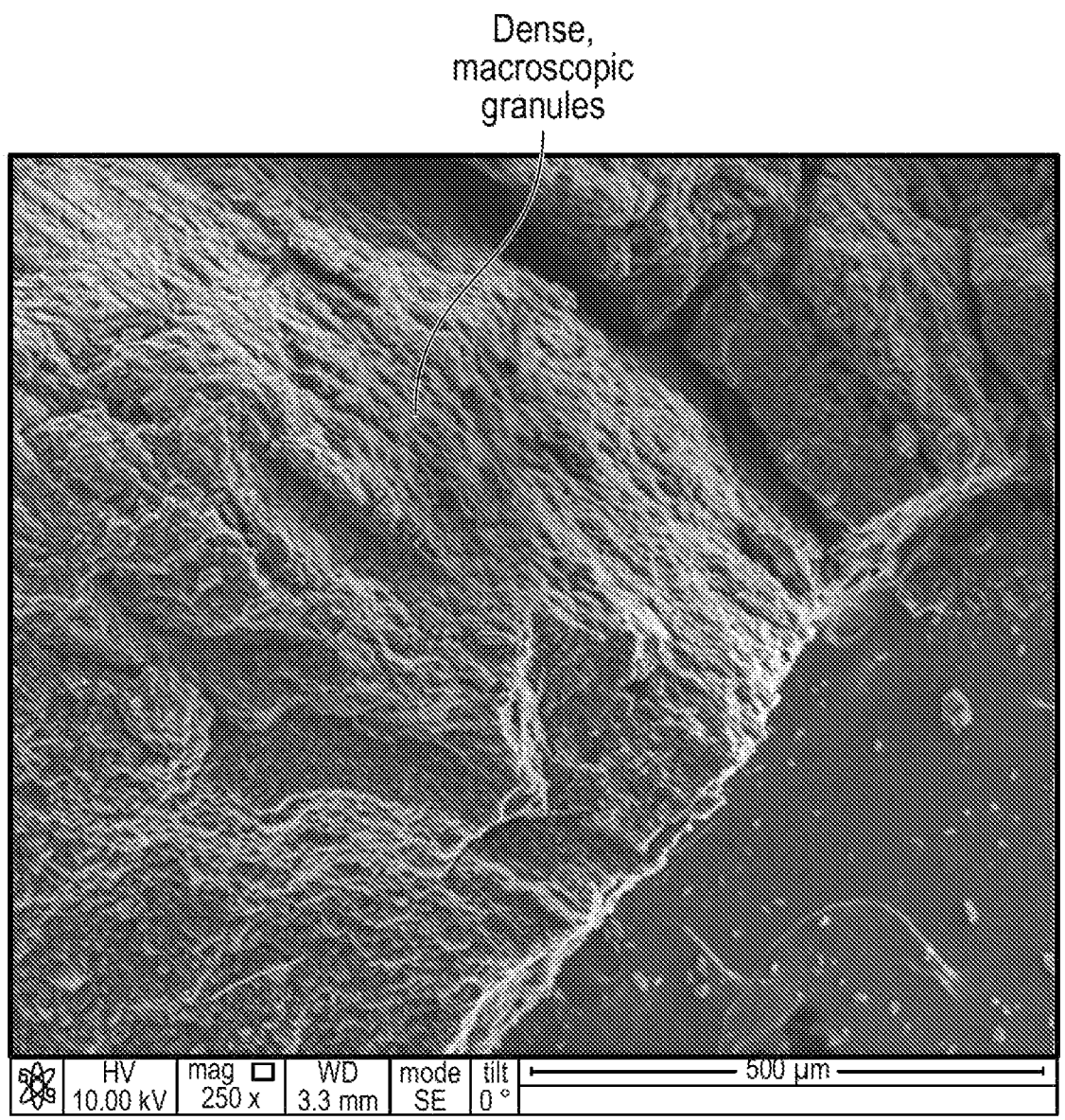
FIG. 50A is a SEM micrograph of Sample E2, showing a macroscopic granule.
Figure 50B:
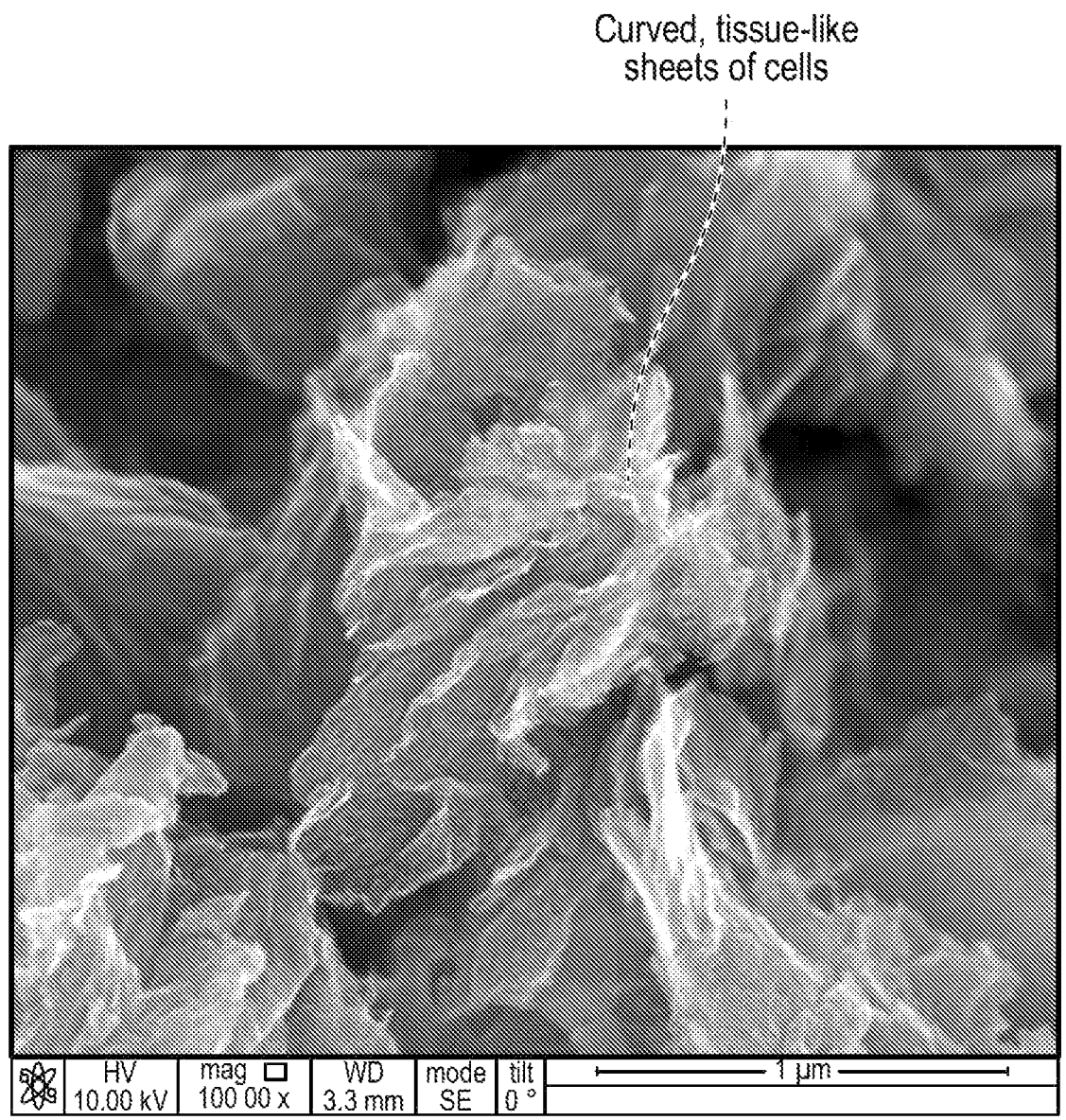
FIG. 50B is a second SEM micrograph of Sample E2, showing curved, tissue-like sheets-of-cells.
Figure 50C:
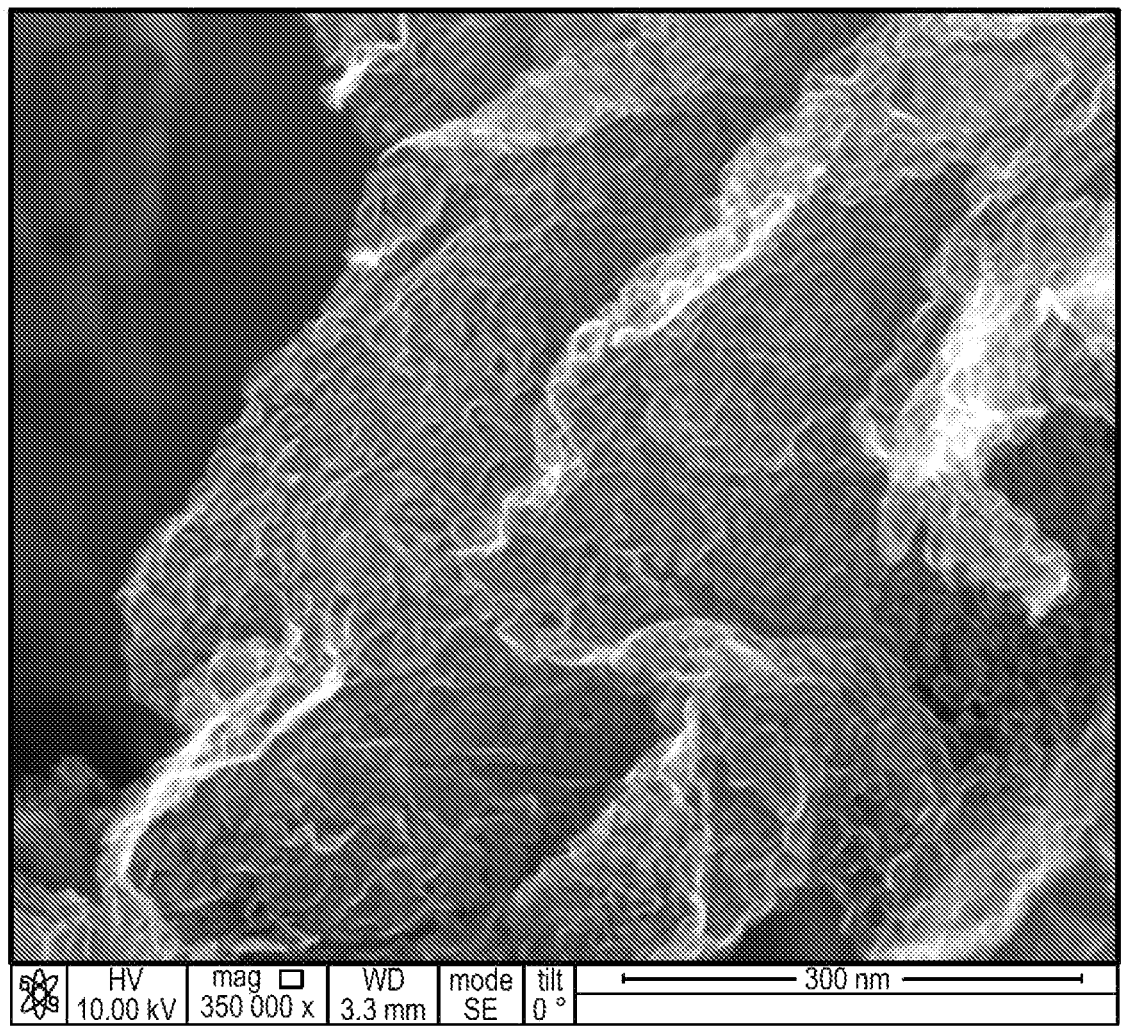
FIG. 50C is a third SEM micrograph of sheets-of-cells in Sample E2. The particle substructure can be discerned.

A similar comparison was made between Sample E2 and E2A. Like Sample E1, Sample E2 densified into hard, macroscopic granules, like the one shown in FIG. 50A. At higher magnifications, the Sample E2 particles can be seen within these granules. Like Sample E1's particles, Sample E2's particles appear wavy and flexible, as shown in FIGS. 50B and 50C.

Figure 50D:
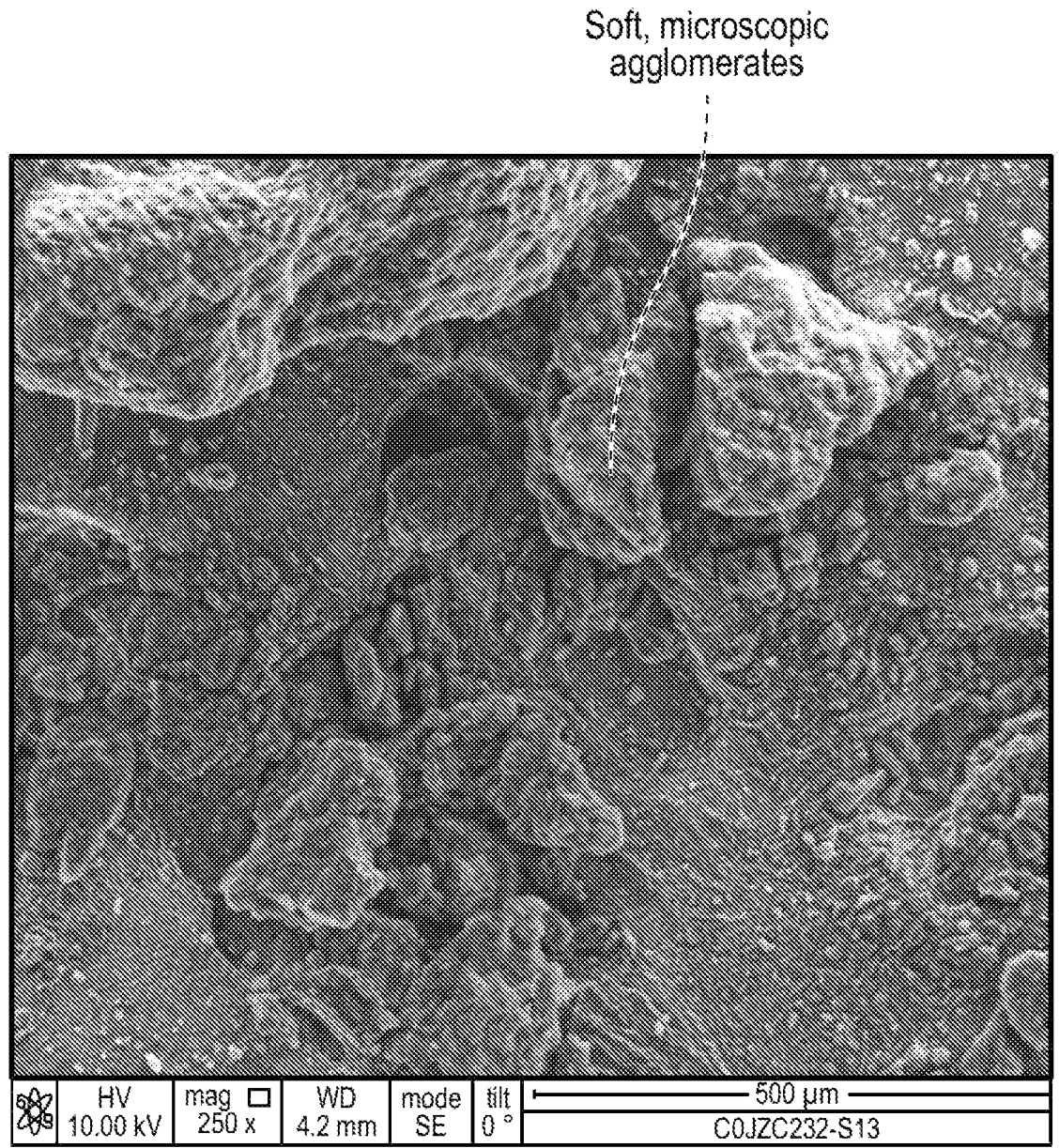
FIG. 50D is a first SEM micrograph of Sample E2A, showing microscopic granules.
Figure 50E:
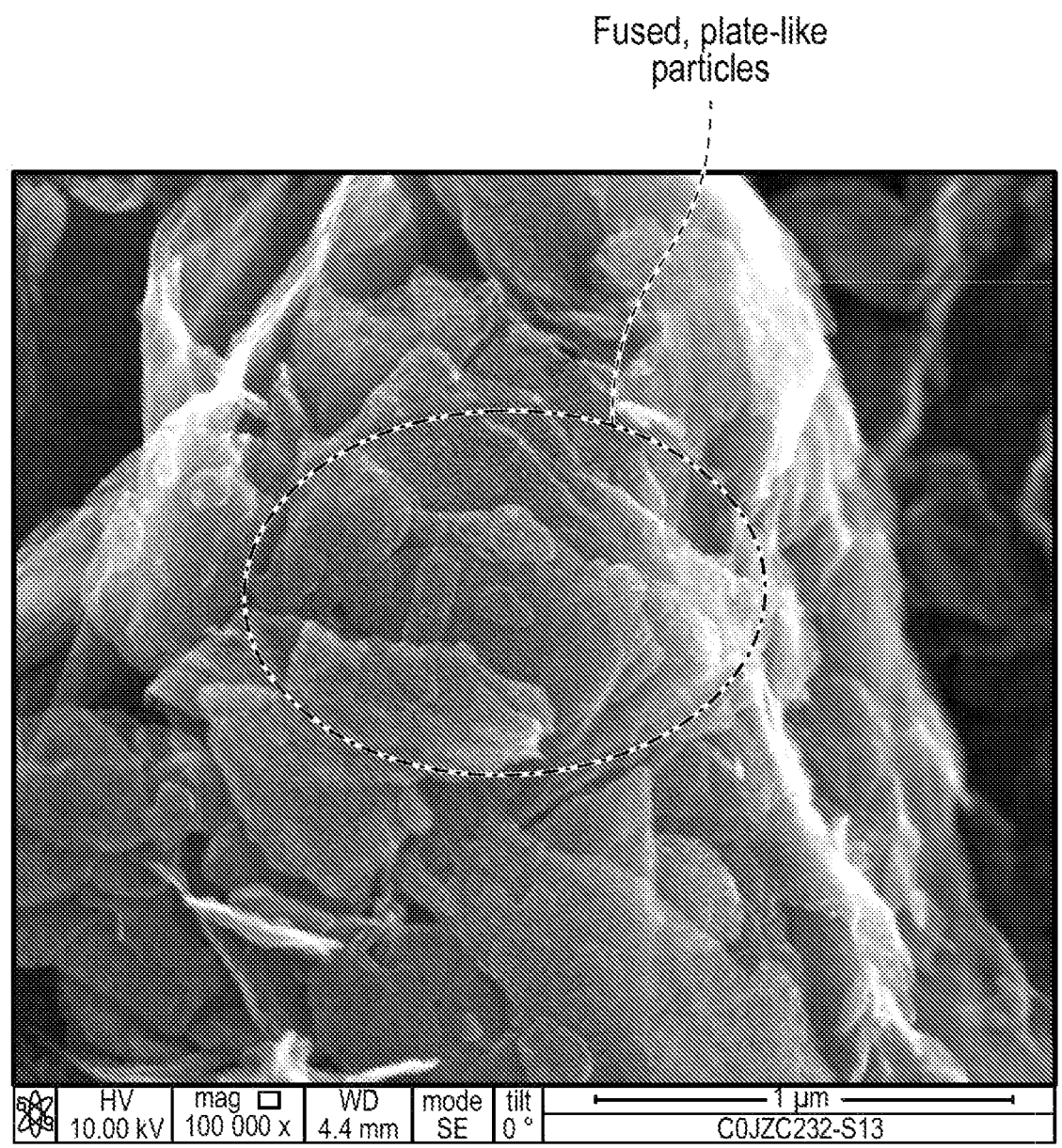
FIG. 50E is a second SEM micrograph of Sample E2A, showing fused, plate-like particles.
Figure 50F:
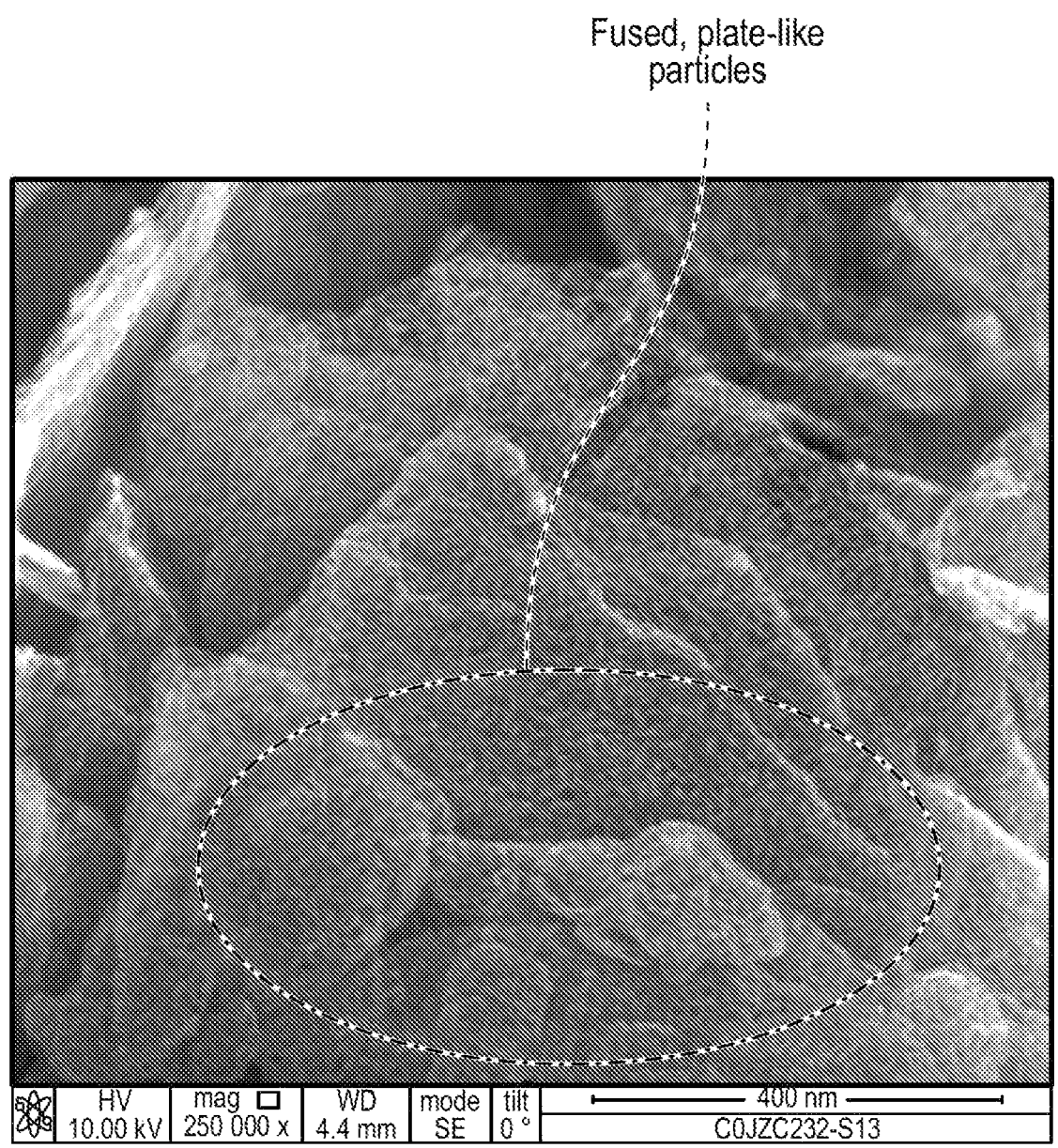
FIG. 50F is a third SEM micrograph of Sample E2A, showing fused, plate-like sheets-of-cells.

Sample E2A occupied a conspicuously larger volume and was finer in consistency than the Sample E2 powder. Compared to the larger, harder granules in Sample E2, the Sample E2A powder consisted of smaller, softer agglomerates, as shown in FIG. 50D. The annealed particles in Sample E2A again exhibited rigidification effects—both at the particle level and locally. The annealed Sample E2A particles were more rigid and straight than the unannealed particles in Sample E2, as shown in FIGS. 50E and 50F. Also, as shown in FIG. 50F, the flush plate-to-plate stacking observed in the template powder was retained in the Sample E2A powder, possibly indicating that the plate-like particles had fused together during annealing, such that they were not broken apart during liquid-phase extraction of the endomorph. Particle-to-particle fusing effects are discussed more in connection with Study F.

Figure 52:
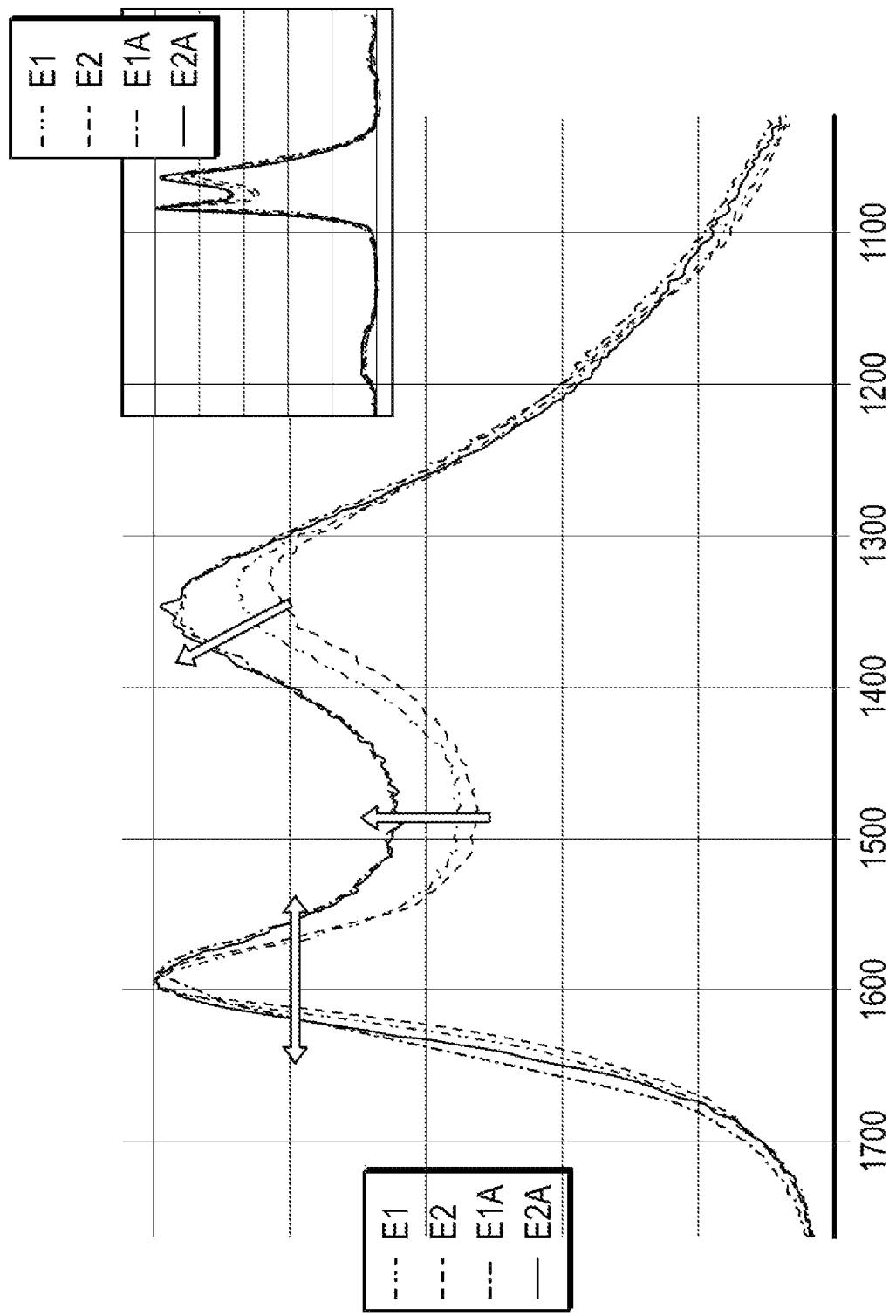
FIG. 52 illustrates the Raman spectral effects associated with maturation of Samples E1 and E2. The arrows indicate the changes to the spectrum with maturation.

To understand the changes in the bonding structure created by annealing, Raman analysis was performed using a 532 nm laser at 5 mW power. FIG. 52 shows the average spectra in the range of the $G_u$ and $D_u$ peaks, with the spectral changes associated with annealing indicated via black arrows. Table 8 below summarizes the average $I_{D_u}/I_{G_u}$ and $I_{Tr_u}/I_{G_u}$ peak intensity ratios, the average $G_u$ and $D_u$ peak positions, and the interval between the $G_u$ and $D_u$ peak positions:

TABLE 8

| Sample | $I_{Du}/I_{Gu}$ | $I_{Tru}/I_{Gu}$ | $G_u$ Peak Pos. | $D_u$ Peak Pos. | Interpeak Interval |
|---|---|---|---|---|---|
| E1 | 0.88 | 0.54 | 1594 | 1335 | 259 |
| E2 | 0.83 | 0.52 | 1593 | 1328 | 265 |
| E1A | 0.97 | 0.64 | 1592 | 1352 | 240 |
| E2A | 0.99 | 0.63 | 1594 | 1347 | 247 |

The interpolated $D_u$ peak positions in Samples E1 and E2 indicate the presence of $sp^3$ states associated with diamond-like seams. Based on Sample E1's $D_u$ peak position of 1335 $cm^{-1}$, a perimorphic framework from Sample E1 comprises a partially grafted z-$sp^x$ network. Based on Sample E2's $D_u$ peak position of 1328 $cm^{-1}$, a perimorphic framework from Sample E2 comprises a highly grafted x-$sp^x$ network. Their interpeak intervals are typical for anthracite.

By comparison, the $D_u$ peak positions of the matured Samples E1A and E2A are 1352 $cm^{-1}$ and 1347 $cm^{-1}$, respectively. These fall into the $sp^2$ D band's normal range under 532 nm Raman excitation; as such, maturation has eliminated the strong coupling of $sp^2$ and $sp^3$ phases in the perimorphic frameworks of Samples E1A and E2A. This indicates that the $sp^3$ states associated with diamondlike seams have been substantially reduced or eliminated in Samples E1A and E2A. Their increased $I_{D_u}/I_{G_u}$ peak intensity ratios and reduced interpeak intervals reflect the maturation of the anthracitic networks. Based on Sample E1A's $D_u$ peak position, its frameworks comprise highly matured, helicoidal z-carbons, and based on Sample E2A's $D_u$ peak position, its frameworks comprise highly mature, helicoidal x-carbons.

Given the elimination of diamondlike seams, which provide a crosslinking mechanism to the $sp^x$ networks in Samples E1 and E2, it is surprising that the particles and the perimorphic walls in the mature samples are rigidified. If these mature particles were not ring-connected, such thin-walled carbons should not have survived extraction of the templates, much less have been conspicuously rigidified compared to their $sp^x$ precursors. We can therefore conclude that the mature particles are crosslinked via crosslinking structures that are more rigid than the precursors' atomically thin diamondlike seams.

Aside from the reversion of their $D_u$ peaks back to the normal D band range, Samples E1A and E2A also exhibit increased $D_u$ and $Tr_u$ peak intensities (relative to their $G_u$ peak), as shown in FIG. 52. The increase in the $D_u$ peak intensity (and area) reflects a proliferation of $sp^2$ rings. The deinterpolation of the $D_u$ peak, together with the increased $sp^2$ ring structuring, evidence an $sp^3$-to-$sp^2$ rehybridization that transforms $sp^x$ rings into $sp^2$ rings. The increased trough heights of the annealed samples indicate a red-shifted mode of the G peak consistent with the creation of $sp^2$ lattice distortion. Taken together, the elimination of $sp^3$ states, the lattice distortion, and the increased rigidity of the particles' crosslinking, are evidence that $sp^3$-to-$sp^2$ rehybridization is eliminating diamondlike seams and forming $sp^2$-hybridized screw dislocations. These screw dislocations provide both vertical and lateral crosslinking and impose a helicoidal geometry on the mature network. This helicoidal network architecture can be conceptualized as a mesh formed by numerous screw dislocation loops like the one illustrated in FIG. 12D.

Figure 53:
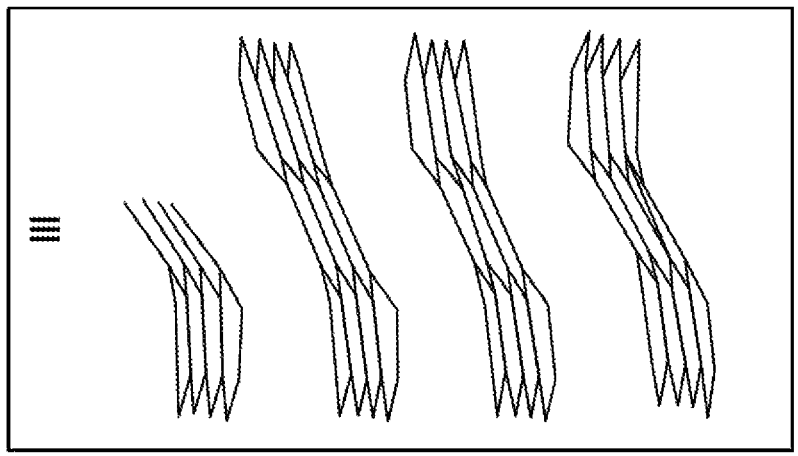
FIG. 53 illustrates the maturation-induced disintegration of a singleton structure comprising a cubic diamondlike seam. The process is illustrated in three stages (I, II, and III).
Figure 53:
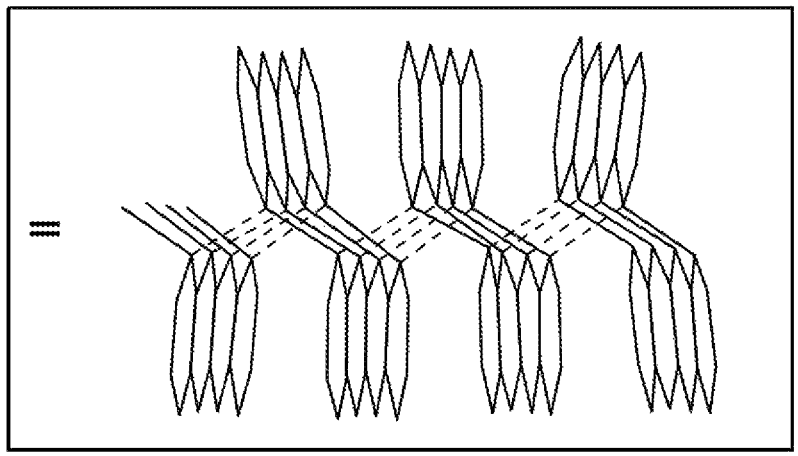
Figure 53:
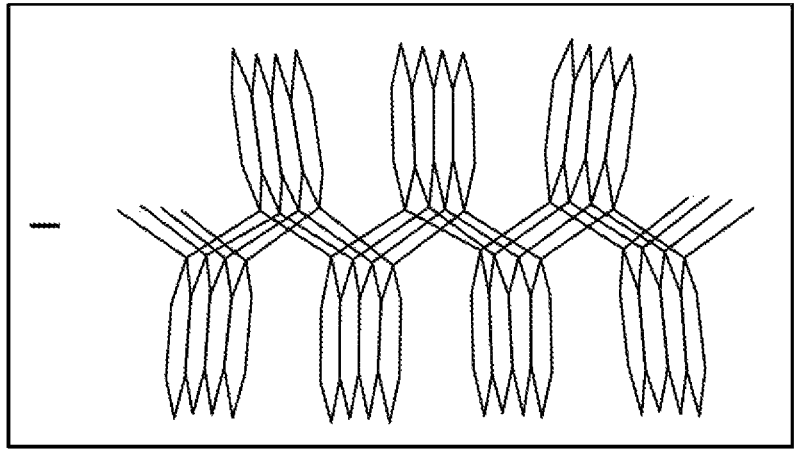

To demonstrate the maturation of the $sp^x$ precursor into a helicoidal network, we start by modeling the effect of $sp^3$-to-$sp^2$ rehybridization on diamondlike seams. Frame I of FIG. 53 illustrates a multilayer singleton traversed vertically by a cubic diamondlike seam. The illustrated system can be thought of as a small region within a much larger $sp^x$ precursor system. The seam comprises $sp^2$-$sp^3$ bonds, and $sp^3$-$sp^3$ bonds.

During annealing, as shown in Frame II of FIG. 53, the $sp^3$-to-$sp^2$ rehybridization of each of the structure's $sp^3$ members requires scission of one of its bonds. Two bonds cannot be broken without creating a high-energy $sp^2$ radical. The $sp^3$-$sp^3$ bonds are the least stable and are destabilized first during annealing (these broken bonds are indicated by dashed lines in Frame II of FIG. 53). Because the $sp^3$ atoms and the $sp^3$-$sp^3$ bond lines between them comprise lateral lines, the rehybridization of one $sp^3$ atom, and the scission of one of its $sp^3$-$sp^3$ bonds, destabilizes the xy-adjacent $sp^3$-$sp^3$ bonds along the bond line, resulting in a linear unzipping. The unzipping of entire lines leads to an ABAB pattern of scission and retention—if a $sp^3$-$sp^3$ bond line is broken, the two z-adjacent bond lines are preserved in order to avoid forming high-energy $sp^2$ radicals.

In this way, the diamondlike seams via lateral unzipping, and the associated ring-connections between z-adjacent layers are also eliminated. The singleton from Frame I of FIG. 53 is therefore disintegrated into a vdW assembly of distorted, disconnected layers. This is illustrated in Frame III of FIG. 53. This clarifies the diamondlike seams' role in laterally and vertically ring-connecting an $sp^x$ network. During scission, as illustrated in FIG. 53, the lateral mode of crosslinking is retained, but the vertical mode of crosslinking is eliminated. Based on this, we can conclude that the maturation of an $sp^x$ network eliminates the vertical crosslinking associated with diamondlike seams. If no other vertical crosslinking mechanism were present, maturation would transform the $sp^x$ precursor into a vdW assembly, which, deprived of vertical crosslinking, would be less rigid than its three-dimensionally crosslinked precursor.

Next, we consider the effects of maturing an $sp^x$ precursor with chiral rings and chiral columns. Since we already modeled the formation of such a system (cf. FIG. 36) in Study A, we appropriate this model as an exemplary $sp^x$ precursor. However, in order to improve visualization of its maturation, we consider only half of the system from FIG. 36, which is shown from two perpendicular horizontal perspectives (H1 and H2) in Frame I of FIG. 54. Similar to the precursor we modeled in FIG. 53, this new precursor in Frame I of FIG. 54 comprises a diamondlike seam. However, unlike the precursor modeled in FIG. 53, this precursor's diamondlike seam terminates in a chiral column. The chiral column is highlighted in the H2 perspective of Frame I of FIG. 54, with the chiral chains being indicated by dashed tracing and the $sp^3$-$sp^3$ bonds connecting the z-adjacent chiral chains being indicated by dashed/dotted tracing.

During maturation, $sp^3$-to-$sp^2$ rehybridization of the $sp^3$ sites results in bond scission. The $sp^3$-$sp^3$ bonds are the least stable and are destabilized first. The $sp^3$-$sp^3$ bonds between the two terminal atomic members of each chiral chain are broken. Each such bond represents the terminus of a lateral $sp^3$-$sp^3$ bond line, and its scission destabilizes the rest of the $sp^3$-$sp^3$ bond line. Accordingly, the linear unzipping of $sp^3$-$sp^3$ bond lines (previously illustrated in Frame II of FIG. 53) occurs in Frame II of FIG. 54. These broken bonds are indicated by dashed lines in Frame II of FIG. 54. To avoid the creation of high-energy $sp^2$ radicals, an ABAB pattern of $sp^3$-$sp^3$ bond scission and retention is formed.

Figure 54:
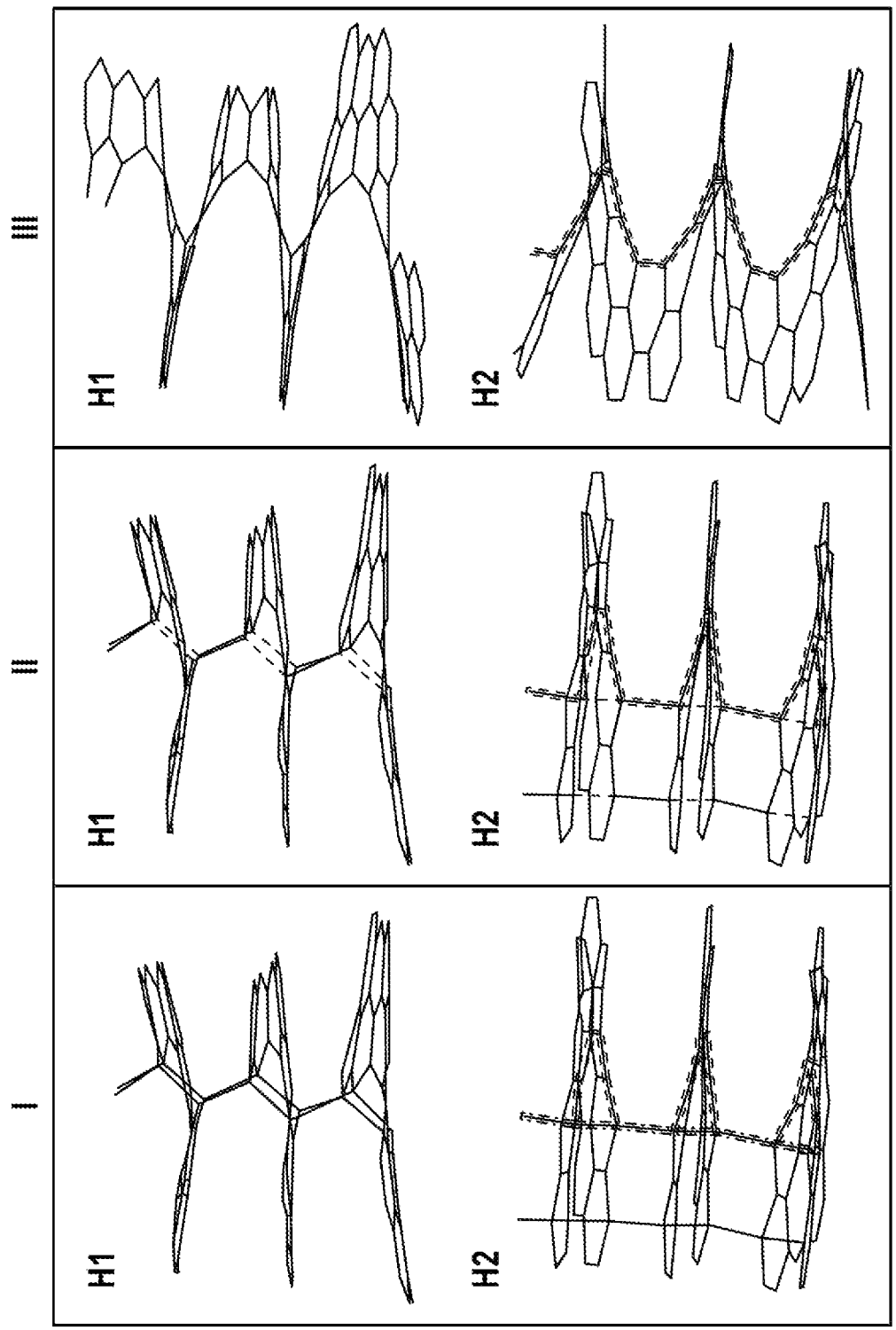
FIG. 54 illustrates the role of chiral rings and columns in preserving vertical crosslinking during maturation. The maturation process is illustrated in three stages (I, II, and III). Two horizontal perspectives (H1 and H2) are shown to facilitate visual inspection. In the H2 perspective, the chiral column and the helical product resulting from maturation are traced. Dashed lines in Stage II indicate bond scission during $sp^3$-to-$sp^2$ rehybridization.

In the H1 perspective of Frame II of FIG. 54, we can see that the system's diamondlike seams are eliminated as these $sp^3$-$sp^3$ bond lines are unzipped. As they are eliminated, the vertical crosslinking associated with them is also eliminated, while the lateral crosslinking remains. If there were no chiral rings or columns, this loss of vertical crosslinking would again result in a vdW assembly of disconnected z-adjacent layers, as it did in the system demonstrated in FIG. 53. However, in this case, a chiral column is present, and the ABAB scission leaves intact the bonds comprising the $sp^x$ helix within the chiral column. This occurs because, as the $sp^3$-$sp^3$ bonds between the terminal atomic members of each chiral chain are broken, the z-adjacent $sp^3$-$sp^3$ bonds between the chiral rings are retained, in keeping with the ABAB pattern of scission and retention. These retained bonds are transformed into $sp^2$-$sp^2$ bonds due to $sp^3$-to-$sp^2$ rehybridization. This transforms the one-dimensional $sp^x$ helix into a one-dimensional $sp^2$ helix comprising $sp^2$ atoms and $sp^2$-$sp^2$ bonds. These bonds are indicated by dashed tracing in the H2 perspective in Frame II of FIG. 54. Despite the loss of vertical crosslinking associated with diamondlike seams, the system retains vertical crosslinking associated with the chiral columns due to the retention of this $sp^2$ helix, which ring-connects the z-adjacent layers. Hence, both lateral and vertical crosslinking are retained during maturation. Chiral rings (and the associated chiral columns of connected chiral rings) are the key to the retention of vertical crosslinking during maturation.

This retention of lateral and vertical crosslinking is shown in Frame III of FIG. 54, which represents the relaxed system illustrated in Frame II. From Frame III, we can see that the helicoidal, ribbon-like graphenic structure formed by maturation has, at its center, a z-directional screw dislocation. The atoms in the central $sp^2$ helix are all members of a ring both before and after $sp^3$-to-$sp^2$ rehybridization. Because of this, the formation of an $sp^2$ helix during maturation is accompanied by the formation of a helicoidal path of adjacent $sp^2$ rings to which the $sp^2$ helix belongs as an edge segment. Therefore, from the formation of an $sp^2$ helix, we can infer the formation of a graphenic helicoid to which the $sp^2$ helix belongs, and from the retention of vertical crosslinking by virtue of the $sp^2$ helix, we can infer the retention of vertical ring-connectedness.

We can see from Frame III of FIG. 54 that, in order to preserve vertical ring-connectedness, the helicoidal graphenic structure must be distorted. Graphenic screw dislocations have been shown to exhibit torsional strain, and along with this torsional strain, we would expect to see a proliferation of lower-frequency, strain-induced phonon states. The higher troughs of Samples S1A and S2A are evidence of this lattice distortion caused by this helicoidal geometry. Additionally, we can see from Frame III of FIG. 54 that the $sp^3$ states are exchanged for $sp^2$ edge states. The elimination of $sp^3$ states and proliferation of $sp^2$ edge states is reflected by the deinterpolation of the $D_u$ peak position in Samples E1A and E2A. The proliferation of $sp^2$ rings associated with the conversion of $sp^x$ rings into $sp^2$ rings is reflected in the increased $D_u$ peak intensity in Samples E1A and E2A. Hence, the formation of helicoids around chiral columns explains a number of spectral changes associated with maturation.

The edge segment comprising the $sp^2$ helix represents an interesting structure. While it comprises a zigzag edge configuration, it is unique in that every atomic member of the segment is bonded to three nearest-neighbor carbon atoms, whereas in a normal zigzag edge configuration only half of the edge atoms are bonded to three carbon atoms. This unique attribute of a helical zigzag results from the fact that it represents the chain of atoms created by the broken-open polygon, in which the internal angles of the broken-open polygon are all less than 180°, and thus 3 carbon neighbors are allowed at every edge site (as opposed to a normal zigzag edge, which comprises reflex angles that prevent every edge site from being bonded to three carbon atoms). This novel edge configuration may yield novel electromagnetic and thermal properties, which are known to be dependent on edge configuration in graphenic nanoribbons.

Figure 55:
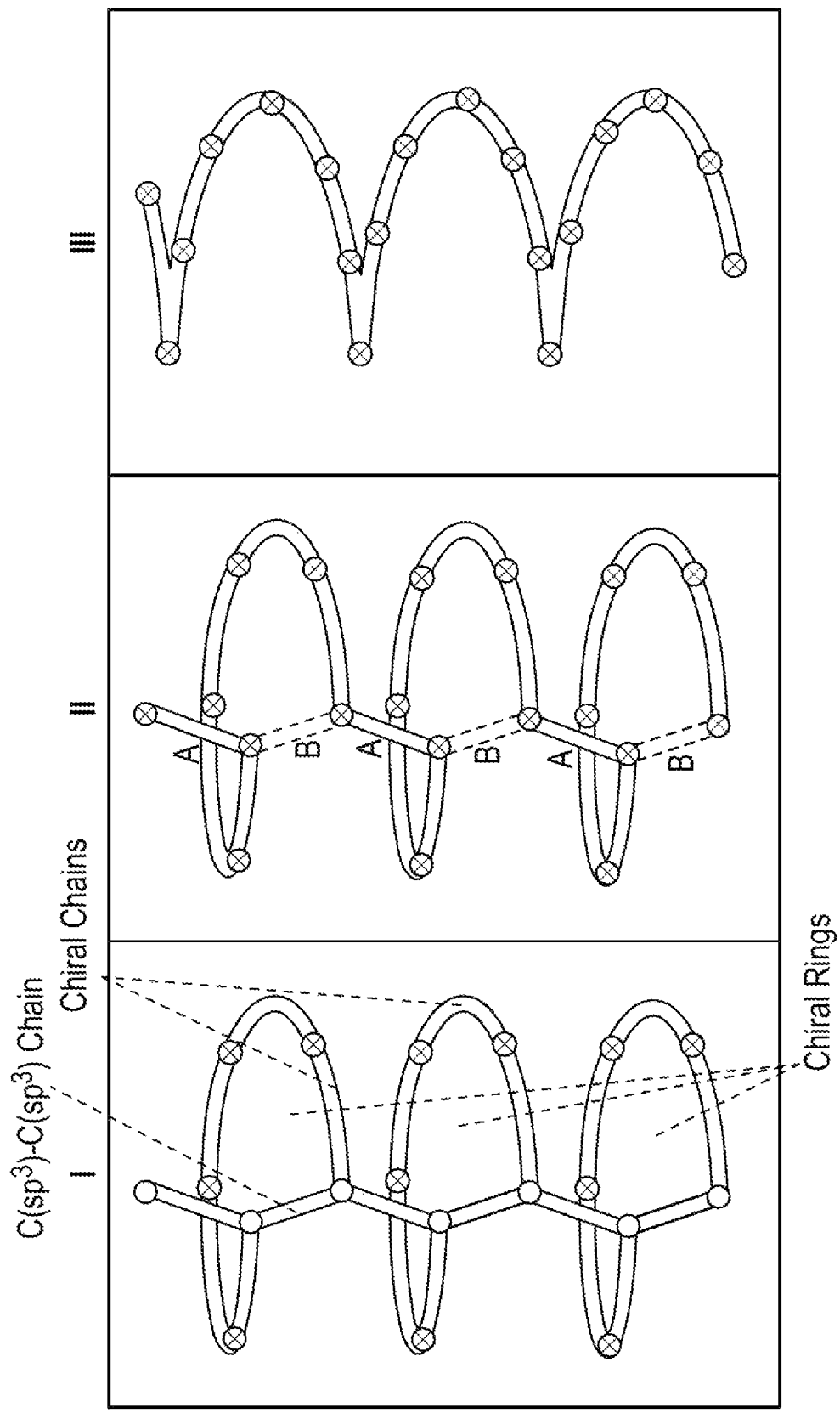
FIG. 55 is a diagram illustrating the transformation of an $sp^x$ helix into an $sp^2$ helix. The maturation process is illustrated in three stages (I, II, and III). $Sp^2$ and $sp^3$ atoms are represented as crosshatched circles and white circles, respectively. Dashed lines in Stage II indicate bonds severed during $sp^3$-to-$sp^2$ rehybridization. An ABAB pattern of preserved and severed bonds is indicated.

To further clarify the process by which an $sp^2$ helix is evolved from an $sp^x$ helix, we illustrate the transformation diagrammatically in FIG. 55. In Frame I of FIG. 55, a chiral column of 3 z-adjacent chiral rings is represented. Crosshatched circles in FIG. 55 represent $sp^2$ atoms, while $sp^3$ atoms are represented by white circles.

During maturation, the $sp^3$-$sp^3$ bond within each of the chiral rings is broken, as we previously discussed in connection with Frame II of FIG. 54, producing the ABAB pattern of $sp^3$-$sp^3$ bond scission and retention. The broken $sp^3$-$sp^3$ bonds, representing the "B" phase of the ABAB pattern, are represented as dashed lines and labeled "B" in Frame II of FIG. 55. Meanwhile, the retained $sp^3$-$sp^3$ bonds, representing the "A" phase of the ABAB pattern, are transformed via rehybridization into $sp^2$-$sp^2$ bonds, which are labeled "A" in Frame II of FIG. 55. The result is a one-dimensional, helical chain of $sp^2$ atoms connected via $sp^2$-$sp^2$ bonds. Upon relaxation, this $sp^2$ helix's curvature becomes more uniform, as shown in Frame III of FIG. 55.

Figure 56:
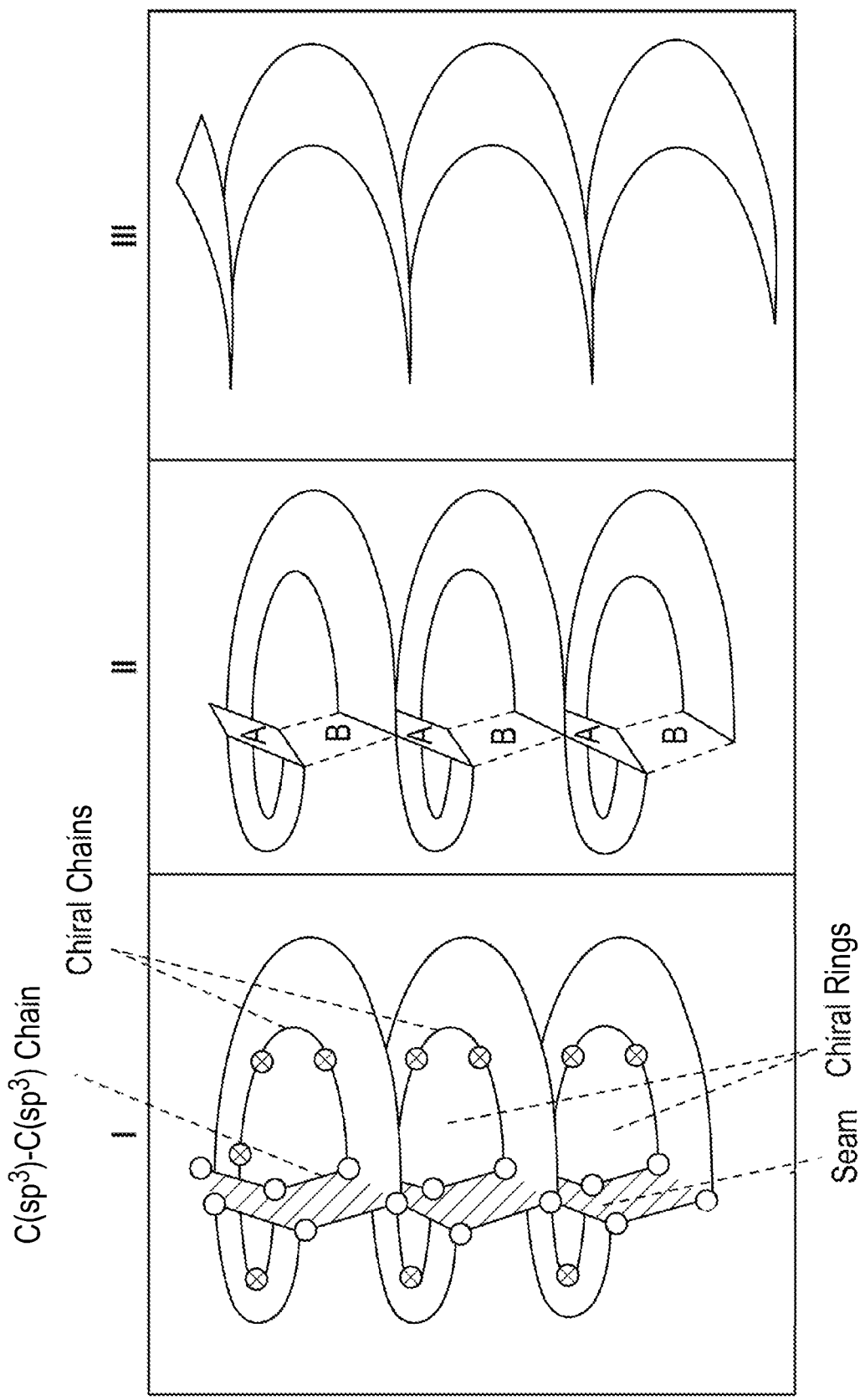
FIG. 56 is a diagram illustrating the formation of an $sp^2$ helicoid around an $sp^2$ helix. The maturation shown is illustrated in three stages (I, II, and III). $Sp^2$ and $sp^3$ atoms are represented as crosshatched circles and white circles, respectively. The 2D surface of the diamondlike seam is hatched. Dashed lines in Stage II indicate bonds severed during $sp^3$-to-$sp^3$ rehybridization. An ABAB pattern of preserved and severed bonds is indicated.

Next, we consider the transformation of the two-dimensional graphenic structure surrounding these one-dimensional helices. As we have established, the formation of an $sp^2$ helix is necessarily accompanied by the formation of a graphenic helicoid, within which the $sp^2$ helix represents an edge segment. The diagram in FIG. 56 mirrors the diagram of FIG. 55, except that in FIG. 56 we attempt to represent the ring-connected structure surrounding the $sp^x$ and $sp^2$ helices, such that we can diagram the formation of the helicoidal geometry. In Frame I of FIG. 56, we illustrate a diamondlike that terminates in the same chiral column we diagrammed in Frame I of FIG. 55. In keeping with our established convention, the crosshatched circles in Frame I of FIG. 56 represent $sp^2$ atoms and the black-and-white circles represent $sp^3$ atoms. The white space surrounding the chiral chains, represents a ring-connected $sp^2$ space surrounding the chiral chains. We can imagine this space extending into the foreground and into the background. The indicates the ring-connected $sp^3$ space associated with the diamondlike seam, and we can imagine this space extending into the foreground.

During maturation, the central $sp^x$ helix in Frame I of FIG. 56 undergoes the same transformation that we diagrammed in FIG. 55. Namely, the $sp^3$-$sp^3$ bond within each of the chiral rings is broken, and followed by this, as represented in Frame II of FIG. 56, the associated $sp^3$-$sp^3$ bond line is unzipped. This eliminates the fraction of ring-connected $sp^3$ space associated with the "B" phase of the ABAB pattern. In Frame II of FIG. 56, this eliminated space is indicated by dashed lines and labelled "B," and we can imagine the eliminated space extending into the foreground of the diagram, like the diamondlike seam illustrated in Frame I. Meanwhile, the retained $sp^3$-$sp^3$ bond line representing the "A" phase of the ABAB pattern is transformed via rehybridization into a $sp^2$-$sp^2$ bond line. This "A" phase of retained, ring-connected space is labeled "A" in Frame II of FIG. 56. We can also imagine it extending into the foreground of the diagram, like the diamondlike seam illustrated in Frame I.

Upon relaxation, a single, helicoidal graphenic structure is produced, as shown in Frame III of FIG. 56, with the same one-dimensional $sp^2$ helix (i.e. screw dislocation) from Frame III of FIG. 55 at its center.

These diagrams illustrate how maturation of an $sp^x$ network with diamondlike seams and chiral rings can generate a laterally and vertically ring-connected mature network. To illustrate the principles of this transformation, we utilized a simple $sp^x$ precursor comprising a single diamondlike seam and a single $sp^x$ helix. However, reasonably large $sp^x$ networks might comprise countless seams and chiral rings formed via tectonic interactions and grafting. In many cases, as we showed in FIG. 36, a single tectonic encounter between two edge segments may evolve multiple seams and chiral rings.

For this reason, it is desirable to model the transformation of a simple, exemplary $sp^x$ precursor that comprises multiple seams and chiral rings. Since we already modeled the formation of such a system (cf. FIG. 36) in Study A, we return to it for this present purpose. We derived this hypothetical $sp^x$ network from the tectonic encounter and subsequent pyrolytic growth that were illustrated in FIGS. 29-36. In order to facilitate visual evaluation of the system's transformation, we illustrate it from two perpendicular horizontal perspectives (H1 and H2) in FIG. 57.

Figure 57:
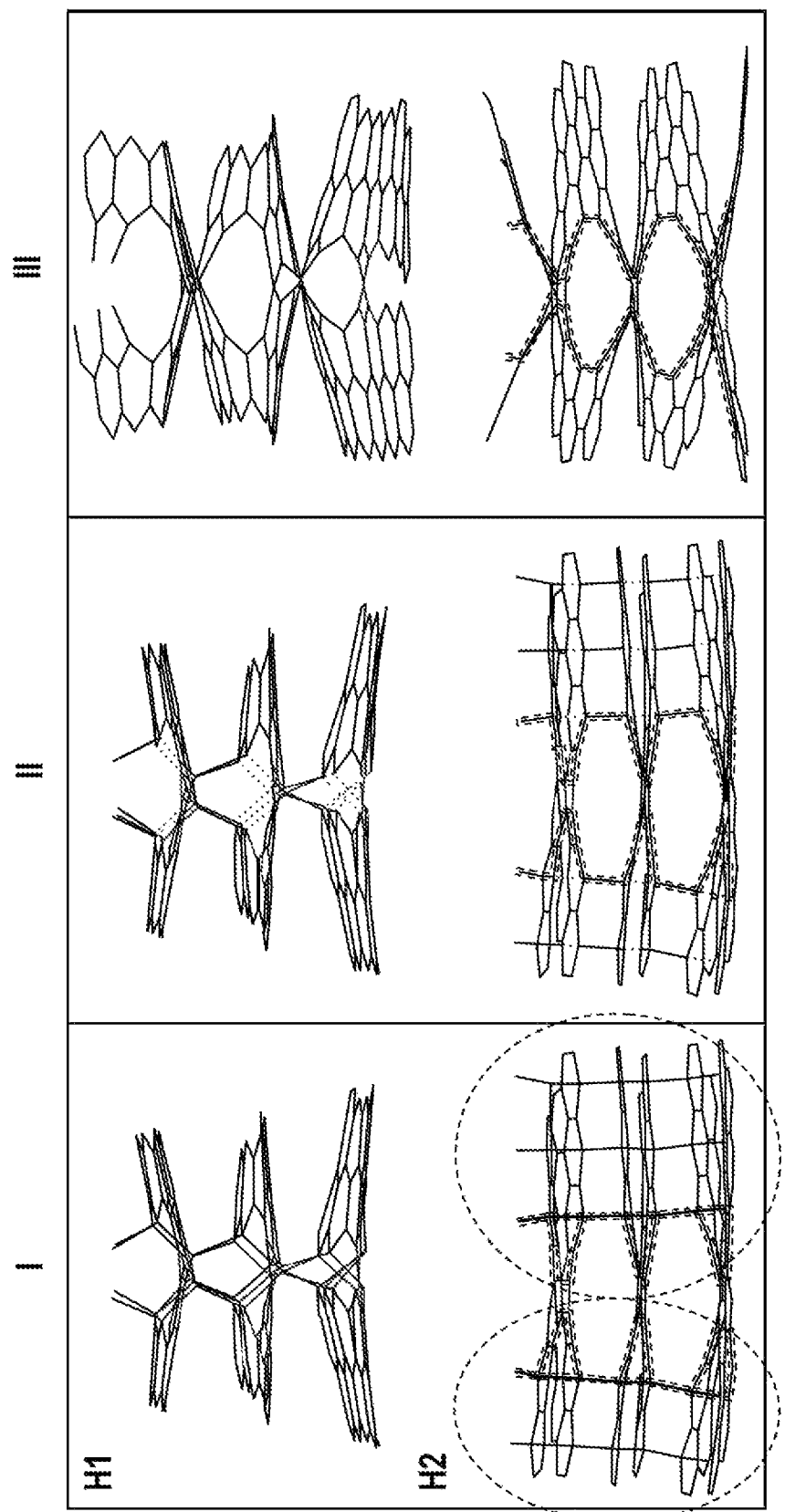
FIG. 57 illustrates the maturation of an $sp^x$ precursor of FIG. 36 into a helicoidal singleton. The maturation process shown is illustrated in three stages (I, II, and III). Two horizontal perspectives (H1 and H2) are shown to facilitate visual inspection. In the H2 perspective, the chiral columns and associated helical products resulting from maturation are indicated by dashed tracing. Dashed lines in Stage II indicate bonds severed during sp3-to-$sp^2$ rehybridization.

In Frame I of FIG. 57, we can see that the $sp^x$ precursor comprises two distinct diamondlike seams (each seam is circled in the H2 perspective), as well as chiral columns representing the lateral termini of those seams (in the H2 perspective of Frame I, the chiral columns are indicated by dashed tracing). During maturation, $sp^3$-to-$sp^2$ rehybridization leads to scission of the $sp^3$-$sp^3$ bond within each of the chiral rings, as discussed in connection with the transformation of the system in FIG. 54 (itself a subsystem of the system under consideration in FIG. 57, as may be recalled). This is illustrated in Frame II of FIG. 57, where dashed lines are again used to represent broken $sp^3$-$sp^3$ bonds. The ABAB pattern of scission and retention of $sp^3$-$sp^3$ bond lines proceeds according to the sequence already discussed in connection with the system transformation of FIG. 54. Retained bonds are transformed into $sp^2$-$sp^2$ bonds indicated with dashed tracing in Frame II of FIG. 57). The only significant difference between the transformations illustrated in FIGS. 54 and 57 is that the transformation in FIG. 57 extends across the larger $sp^x$ precursor's multiple seams and chiral rings.

Relaxation of the system illustrated in Frame II of FIG. 57 creates the helicoidal network illustrated in Frame III of FIG. 57. This singleton comprises a network of two conjoined helicoidal regions formed by the system's two distinct screw dislocations. The helicoidal regions are ring-connected to each other, although the horizontal perspectives in FIG. 57 are not ideal for visual discernment of the ring-connections (a better perspective for discerning the ring-connectedness is offered in FIG. 58). The two $sp^2$ helices associated with the screw dislocations are indicated with dashed tracing in Frame III of FIG. 57. Together, the two screw dislocations comprise a loop. Both of the screws have a common chirality.

Figure 58:
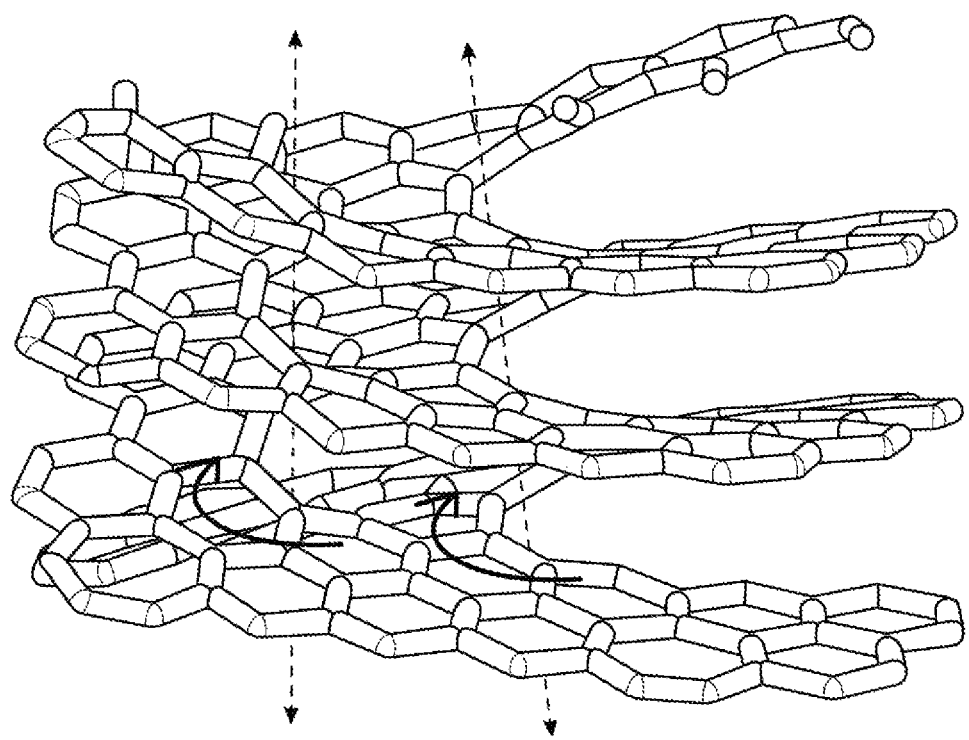
FIG. 58 provides another perspective to facilitate visual discernment of the ring-connectedness of the helicoidal singleton illustrated in FIG. 57. The arrows indicate the chirality of the two $sp^2$ helices.

To better observe the ring-connections between the two helicoids in Frame III of FIG. 57, FIG. 58 illustrates the singleton from a diagonal angle and uses a stick-model visualization to help with depth perception. The arrows highlight the common chirality of the two helicoids, while the black dashed arrows approximate the two helicoids' axes—i.e. the dislocation lines. The entire loop shown in FIG. 58 comprises a ring-connected singleton akin to the graphenic screw dislocation loops that have been observed in regions of anthracite (cf. FIG. 12D).

From these simple models, the spectral data from Study E, and the changes in mechanical behavior observed in Study E, we can conclude that the changes in bonding structure between Samples E1 and E1A, and between Samples E2 and E2A, are driven by $sp^3$-to-$sp^2$ rehybridization, which transforms $sp^x$ networks into helicoidal networks.

Figure 59:
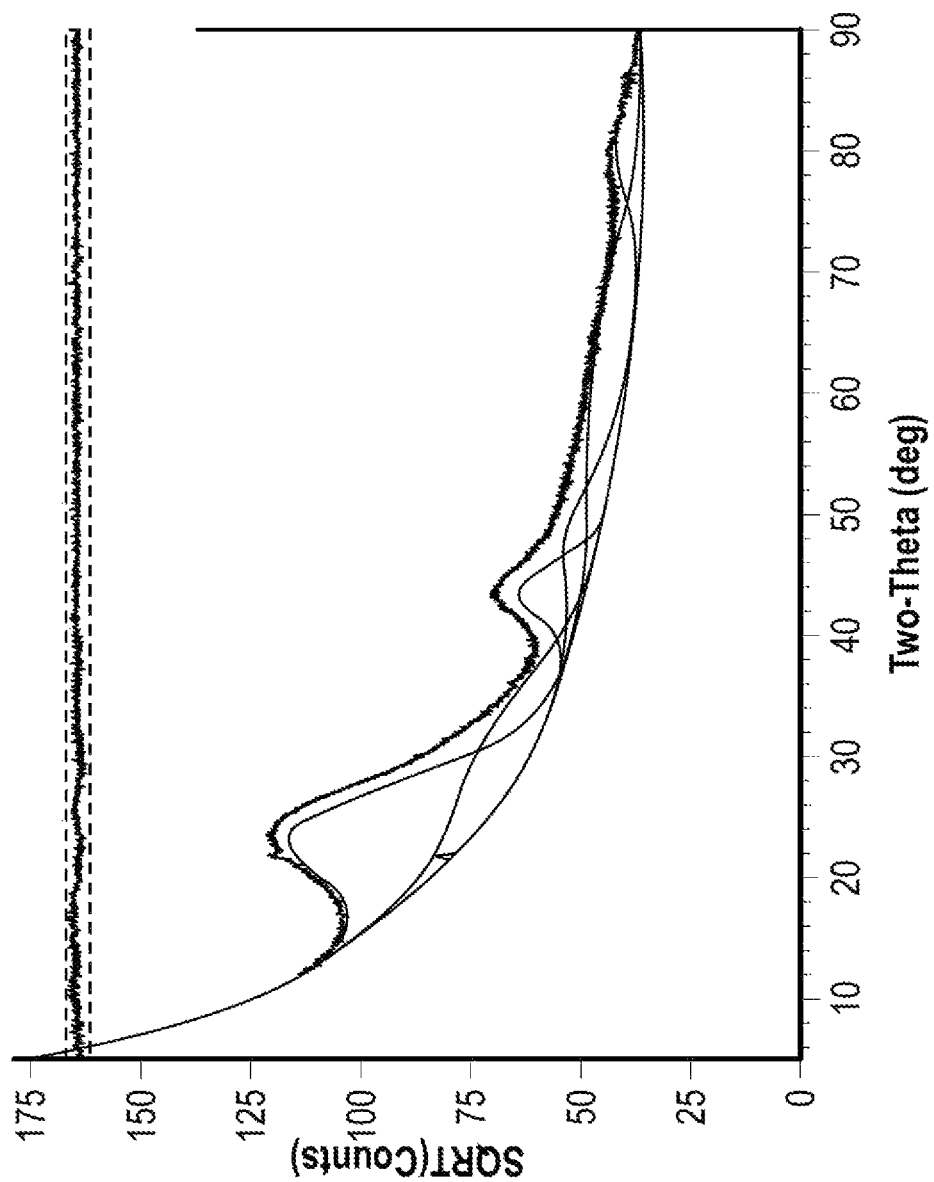
FIG. 59 is the XRD profile of Sample B4A. Profile-fitting peaks are shown.

This is further corroborated by XRD analysis. For this analysis, we annealed Sample B4, a powder of x-$sp^x$ networks, at a temperature of 1,050° C. for 30 minutes under flowing Ar, creating Sample B4A. This matured the x-$sp^x$ networks into helicoidal x-networks. FIG. 59 shows the overall XRD profile of Sample B4A. Table 9 below contains the XRD peak angles, d-spacings, areas, area percentages (normalized to the area of the dominant peak at 2θ=23.535°), and full-width half max values (without correction for instrument broadening):

TABLE 9

| # | Angle(°) | d(Å) | Height | Area (α1) | Area (α1)% | FWHM(°) |
|---|----------|------|--------|-----------|------------|---------|
| 1 | 21.660 | 4.0997 | 472 | 134.6 | 0.3 | 0.267 |
| 2 | 23.535 | 3.7771 | 5329.3 | 51104.9 | 100 | 8.653 |
| 3 | 29.489 | 3.0266 | 1136.7 | 16961.9 | 33.2 | 13.963 |
| 4 | 35.944 | 2.4965 | 83.5 | 30.8 | 0.1 | 0.336 |
| 5 | 43.396 | 2.0835 | 1187.5 | 6574.5 | 12.9 | 4.965 |
| 6 | 48.065 | 1.8914 | 524 | 6632.7 | 13.0 | 10.788 |
| 7 | 61.044 | 1.5167 | 518.5 | 12423.7 | 24.3 | 22.455 |
| 8 | 79.639 | 1.2029 | 306.3 | 3136.1 | 6.1 | 8.942 |

Sample B4A's XRD profile contains significant changes. First, the broad peak fitted at 2θ=18.454° in Sample B4, which accounted for 30.4%, is not fitted in this range in Sample B4A's profile. We attributed this peak in Sample B4 to a phase of expanded interlayer spacing caused by z-directional bowing of graphenic regions due to intralayer compression beyond their critical buckling strain. At the same time, in Sample B4A, we see the emergence of an even broader fitted peak at 2θ=29.489°, corresponding to a d-spacing of 3.03 Å, with a peak area of 33.2%. These spectral changes suggest an overall shift toward smaller interlayer d-spacings, and the peak center at 2θ=29.489° indicates potential interlayer compression.

Additionally, comparing Sample B4 to Sample B4A, we note a shift in the <100> peak from 2θ=43.138° to 2θ=43.396°, respectively, corresponding to a reduction in <100> d-spacing from 2.10 Å to 2.08 Å. We also see an increase in the main <002> peak at 2θ=23.535°, corresponding to an increase in the average interlayer d-spacing from 3.63 Å to 3.78 Å.

These changes are explained by the transformed cross-linking structure. The cross-section of a diamondlike seam in the <100> plane is a line (i.e. one-dimensional), whereas the cross-section of a screw dislocation in the <100> plane is a point (i.e. zero-dimensional). Therefore, the elimination of one-dimensional pins during maturation leaves only zero-dimensional pins coinciding with the endpoints of the eliminated one-dimensional pins. With the diamondlike seams unzipped, the bowed layers are only pinned at points, instead of along entire lines, and they have more freedom to relax.

The lateral relaxation of these bowed regions has the effect of reducing the amplitude of their z-deflections (thereby eliminating Sample B4's broad peak at 2θ=18.454°, which was attributed to bowing), but obtains this by distributing intralayer compressive strain and lattice distortion more globally. This increases the average interlayer d-spacing (the d-spacing associated with the main <002> peak increases from 3.78 Å to 3.63 Å). It also is reflected in the shift of the broad interlayer peak from 2θ=18.454° to 2θ=29.489°. We see increased compressive strain in the <100> peak, the d-spacing of which is reduced by maturation from 2.10 Å to 2.08 Å.

Unlike the other fitted peaks, which are broad and represent low correlations, the peaks at 2θ=21.660° and 2θ=35.944° are sharp, suggesting features with high periodicity. The most likely cause for these are interlayer periodicities that are consistently formed at the screw dislocation cores of the helicoids.

Having now explored the formation of $sp^x$ networks and their maturation into helicoidal networks and having understood the basic features of these anthracitic networks, we now turn to understanding tectonic zone transitions and their effect on mature, helicoidal networks, and we demonstrate how tectonic zone transitions can lead to the formation of structural variants, including $sp^x$ double helices, $sp^2$ double helices, and double helicoids.

First, we return to the helicoidal network illustrated in FIG. 58, wherein the two conjoined helicoids, and the screw dislocations from which they derive, have the same chirality. This reflects a preservation of the common chirality of the chiral chains within the two base-layer chiral rings ($R_{2-C}$ and $R_{4-C}$) formed at the $E_1$-$E_2$ tectonic interface that was modeled in FIG. 29. We previously attributed the common chirality of these chiral rings to the inversion of the edge elevations between Offset Zone I and Offset Zone II in the $E_1$-$E_2$ interface modeled in FIG. 29.

Figure 60:
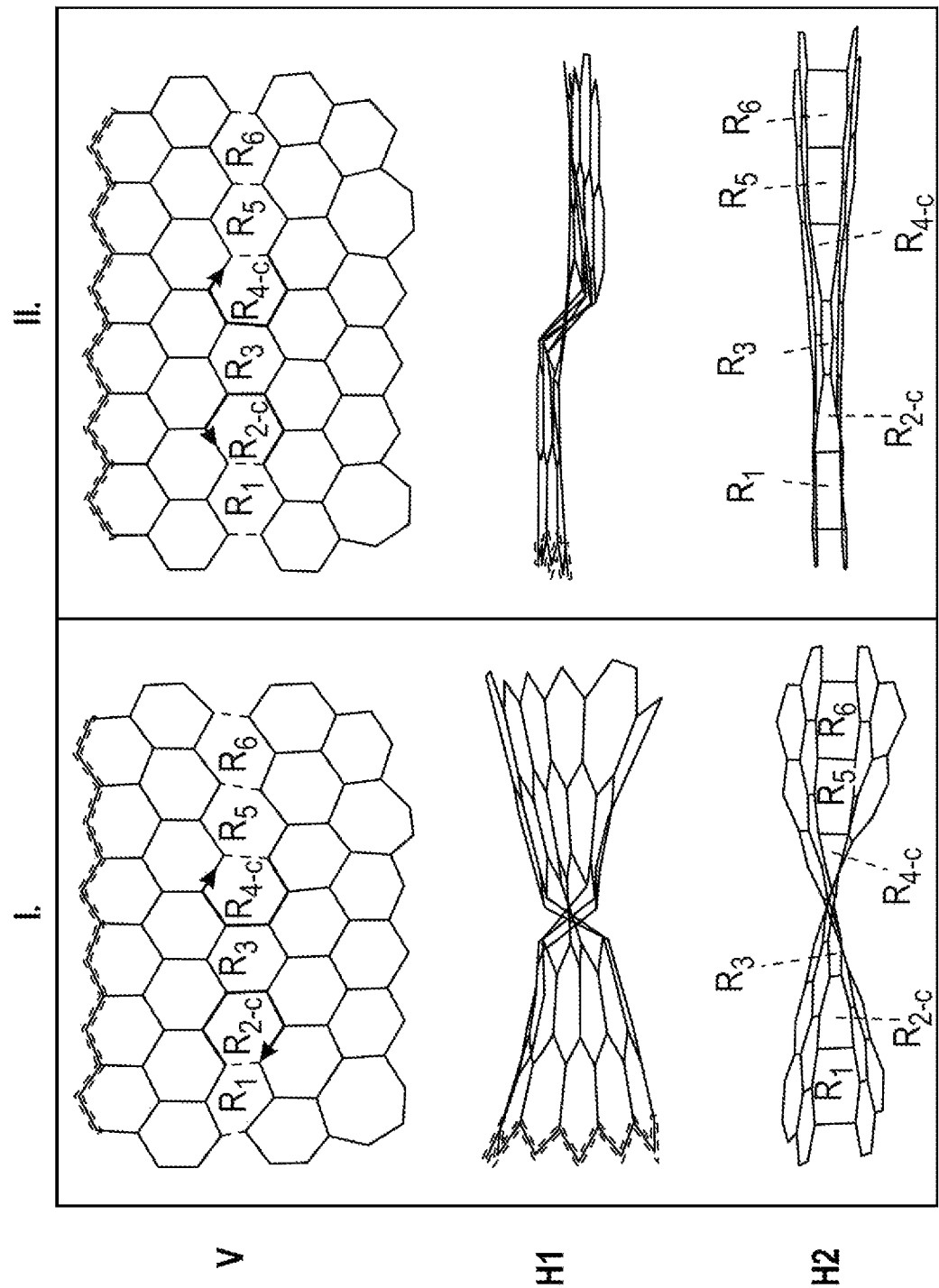
FIG. 60 illustrates two alternative scenarios (I and II) that differ based on whether the edges of $G_1$ and $G_2$ crisscross at the $E_1$-$E_2$ interface. In Scenario 1, where they crisscross, the chiral rings $R_{2-c}$ and $R_{4-c}$ have the same chirality, as indicated by the arrows. In Scenario II, where they do not crisscross, the chiral rings $R_{2-C}$ and $R_{4-C}$ have opposite chirality, as indicated by the arrows. A vertical (V) and two horizontal (H1 and H2) perspectives are shown to facilitate visual inspection.

In an alternative scenario, where the edge elevations between Offset Zone I and Offset Zone II are not inverted, the chiral chains in the two base-layer chiral rings possess opposite chirality. In FIG. 60, we compare the original scenario with this alternative scenario. In Frame I, corresponding to the original scenario, we show the base resulting from $sp^2$ and $sp^3$ grafting across an interface in which the edge elevations are inverted between Offset Zone I and Offset Zone II. In this scenario, we have already seen that the chiral rings $R_{2-C}$ and $R_{4-C}$ are formed at the transitions between each of the two offset zones and the level zone between them. The common chirality of the chiral chains is indicated by the blue arrows in the vertical perspective in Frame I of FIG. 60.

In Frame II of FIG. 60, corresponding to the new scenario, we show the base resulting from $sp^2$ and $sp^3$ grafting across an interface in which the edge elevations are not inverted between Offset Zone I and Offset Zone II. In this alternative scenario, the chiral rings $R_{2-C}$ and $R_{4-C}$ are still formed at the transitions between each of the two offset zones and the level zone between them. However, since the edges do not crisscross, and the edge elevations do not invert, the chiral chains have opposite chirality. This opposite chirality is indicated by the blue arrows in the vertical perspective in Frame II of FIG. 60.

If an $sp^x$ network were subsequently grown over this base, the $sp^x$ helices would have opposite chirality, and associated with this, less Eshelby twist between z-adjacent layers. If this singleton were then transformed into a helicoidal network via $sp^3$-to-$sp^2$ rehybridization, the screw dislocation loop formed by the two $sp^2$ helices of opposite chirality would be less strained. From initial formation of the base-layer chiral rings to the intermediate formation of an $sp^x$ network with mixed dislocations, to the ultimate formation of the helicoidal network, chirality is preserved. Anthracite researchers have observed that screw dislocation loops often involve two xy-adjacent screw dislocations with opposite chirality. We find that loops may also involve two nearby screw dislocations with common chirality.

Another potential interfacial configuration is created when the opposing edge segments crisscross without forming a level zone between the two offset zones to either side. This configuration may occur when, in spite of having similar elevations where the crisscrossing occurs, the $2p_z$ orbitals of opposing $sp^2$ edge atoms are too misaligned for $\pi$ bonds to form. The point at which the edges crisscross in this way is referred to as a "crossover point." Edge atoms at a crossover point may form $sp^3$-$sp^3$ bonds in order to eliminate high-energy $sp^2$ edge states, but they cannot form a $sp^2$-$sp^2$ bond line. We find that at these crossover points, $sp^3$ grafting leads to the formation of chiral columns comprising $sp^x$ double-helices, which upon maturation form $sp^2$ double helices associated with double helicoids.

Figure 61:
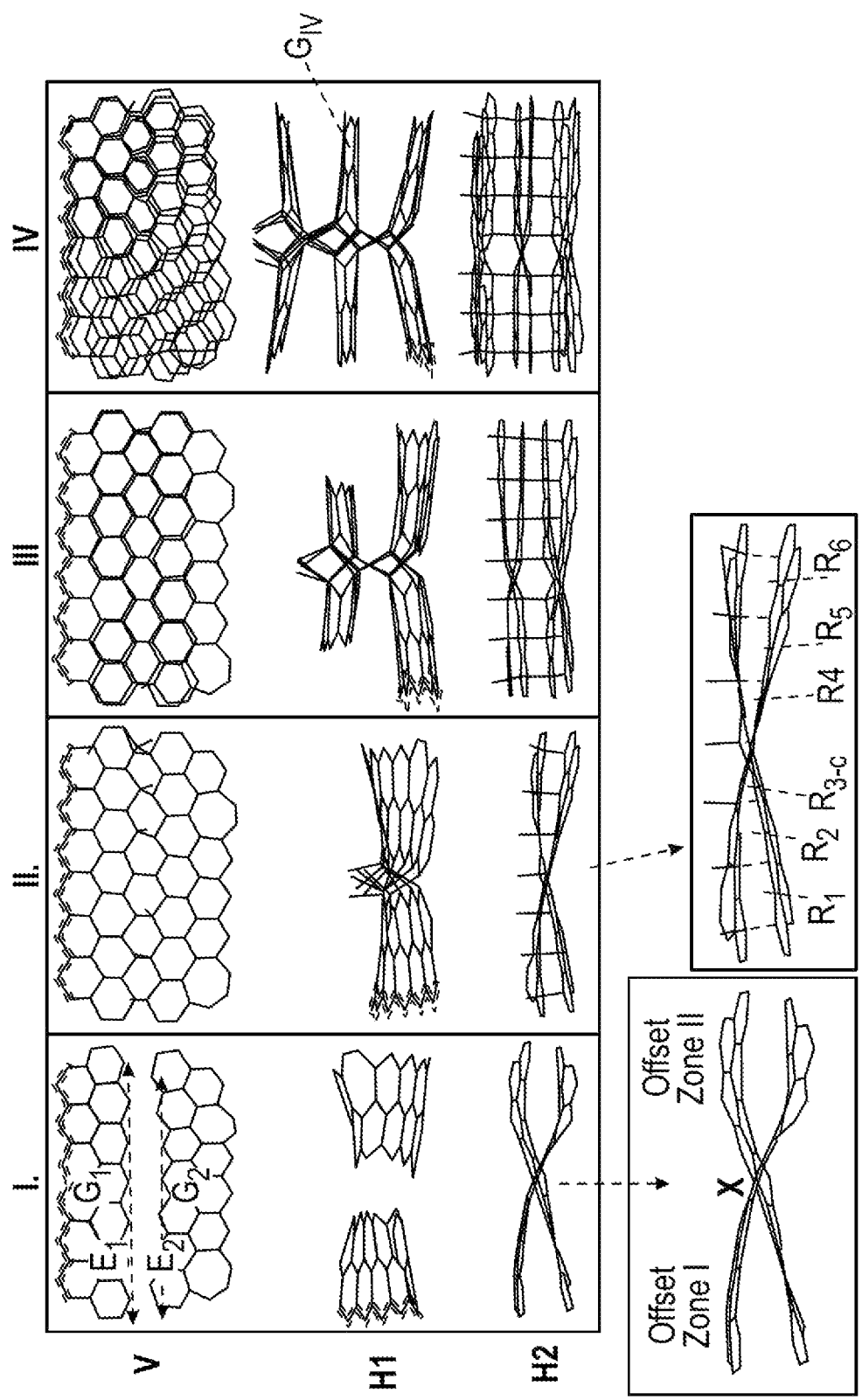
FIG. 61 illustrates the progressive growth of an $sp^x$ precursor over the $E_1$-$E_2^C$ tectonic interface, which mirrors the $E_1$-$E_2$ interface modeled in FIG. 29 but assumes that (a) no $sp^2$ grafting is possible, and that (b) instead of a level zone, the $E_1$-$E_2$ interface comprises a crossover point. Growth is represented at 4 stages (I, II, III, and IV). A vertical (V) and 2 horizontal (H1 and H2) perspectives are shown to facilitate visual inspection.

The pyrolytic synthesis of an $sp^x$ network over a tectonic interface with a crossover point is illustrated in FIG. 61. The sequence is broken into 4 stages in FIG. 61. In Stage I of FIG. 61, we illustrate the $E_1$-$E_2$ interface from FIG. 29, but in the current analysis, we will postulate that the edges' crisscrossing disallows $sp^2$ grafting—i.e. that there is a crossover point between Offset Zone I and Offset Zone II. Although the interface illustrated is unchanged, we will refer to it as the $E_1$-$E_2^c$ interface to indicate that, in lieu of the level zone, we have postulated a crossover point. In Stage I of FIG. 61, the interfacial zones associated with the $E_1$-$E_2^c$ interface are illustrated in the magnified inset of the H2 perspective. The adjacent offset zones are divided by a crossover point, indicated with an X in the magnified inset of Stage I in FIG. 61.

In Stage II of FIG. 61, we model the grafting of $G_1$ and $G_2$ and the nucleation of vertical growth via radical addition above the grafted base. The grafting and subsequent growth are consistent with the mechanisms previously discussed in connection with the pyrolytic growth modeled in FIGS. 29-36. However, in the current analysis, no $sp^2$ grafting of $E_1$ and $E_2$ occurs due to the misalignment of the edges. Instead, only $sp^3$ grafting occurs. The two $sp^3$-$sp^3$ bond lines across the $E_1$-$E_2^c$ interface are indicated by dashed lines in the magnified inset of Stage II of FIG. 61.

The two $sp^3$-$sp^3$ bond lines form 6 laterally adjacent $sp^x$ rings, each comprising 6 atomic members. Five of the $sp^x$ rings ($R_1$, $R_2$, $R_4$, $R_5$, and $R_6$) are in the chair conformation, with the orientation of $R_1$ and $R_2$ comprising a point reflection of the orientation of $R_4$, $R_5$, and $R_6$. As established in the analysis of FIGS. 29-36, this point reflection is due to the inversion of the edge elevations between the two offset zones. The other $sp^x$ ring ($R_{3-C}$) is a chiral ring established at the crossover point, in keeping with our previous finding that chiral rings form at interfacial zone transitions. However, we shall establish that chiral rings like $R_{3-C}$ that are formed at crossover points may incorporate 2 chiral chains, while chiral rings formed at tectonic zone transitions involving level zones incorporate only 1 chiral chain.

In Stages III and IV of FIG. 61, we model the formation of an $sp^x$ network by continued vertical and lateral growth. This proceeds according to the same principles and mechanisms previously established in the discussion and analysis of FIGS. 29-36. Ring-connectedness is extended laterally and vertically throughout the higher layers via diamondlike seams. Eshelby twist between each of the z-adjacent layers can be observed in the vertical perspective of both Stage III and IV. The $sp^x$ network ($G_{IV}$) modeled in Stage IV comprises two distinct diamondlike seams.

Figure 62:
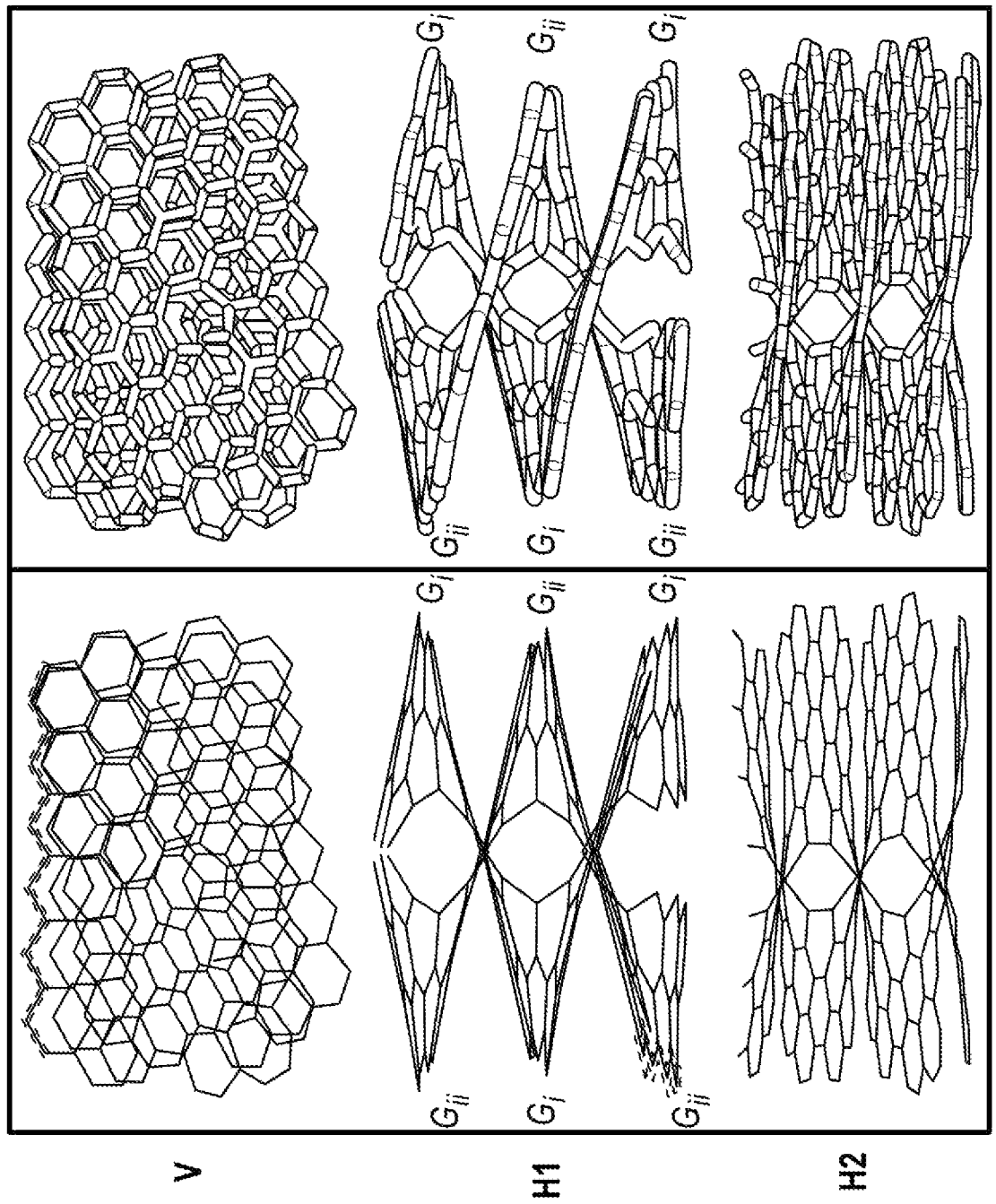
FIG. 62 illustrates the double helicoid formed by the disintegration of the $sp^x$ precursor constructed over the $E_1$-$E_2^C$ tectonic interface in FIG. 61. A vertical (V) and 2 horizontal (H1 and H2 perspectives are shown to facilitate visual inspection.

In FIG. 62, we model a double helicoid formed by the maturation of the $sp^x$ precursor $G_{IV}$. The double helicoid comprises two disconnected, helicoidal graphenic structures $G_i$ and $G_{ii}$ that are created by the maturation-driven disintegration of $G_{IV}$. Based on its plural membership of distinct graphenic structures, the double helicoid in FIG. 62 comprises an assembly-type system. This assembly is illustrated from a vertical perspective and two perpendicular horizontal perspectives, and using two molecular visualizations, in FIG. 62. The cause of disintegration is the ABAB pattern of bond scission and retention, arising from $sp^3$-to-$sp^2$ rehybridization. As previously established, the $sp^3$-$sp^3$ bonds in chiral rings are broken, causing lateral unzipping of the associated $sp^3$-$sp^3$ bond lines. At the center of the double helicoid is a double screw dislocation. Double screw dislocations have been observed in protein crystals and we find that the geometry of an interfacial crossover point may force their formation upon maturation.

The maturation of the $sp^x$ precursor $G_{IV}$ causes disintegration because its base is not $sp^2$ ring-connected. The $G_{IV}$ base is $sp^2$ ring-disconnected because of the absence of a level zone and $sp^2$ grafting across the $E_1$-$E_2^c$ interface from which the base was derived. Instead, only $sp^3$ grafting occurred across the $E_1$-$E_2^c$ interface, so the primordial domains $G_1$ and $G_2$ were only ring-connected by virtue of the $sp^x$ ring-connections ($R_1$, $R_2$, $R_{3-C}$, $R_4$, $R_5$ and $R_6$) formed from these $sp^3$-$sp^3$ bonds. After its formation, the base layer remains $sp^2$ ring-disconnected while $G_{IV}$ is constructed over it. As a result, during maturation, the base layer of $G_{IV}$ is completely unzipped along this $sp^3$-grafted interface, such that the primordial regions associated with $G_1$ and $G_2$ become once again disconnected at the base. For the system to remain ring-connected, these two primordial regions of the base must be ring-connected via some path of adjacent rings across the higher layers. However, each higher layer, like the base, is completely unzipped, eliminating any such path. The result is that the $sp^x$ precursor is completely disintegrated into two graphenic structures, $G_i$ and $G_{ii}$, where the primordial region $G_1$ is within $G_i$ and the primordial region $G_2$ is within $G_{ii}$.

Figure 63:
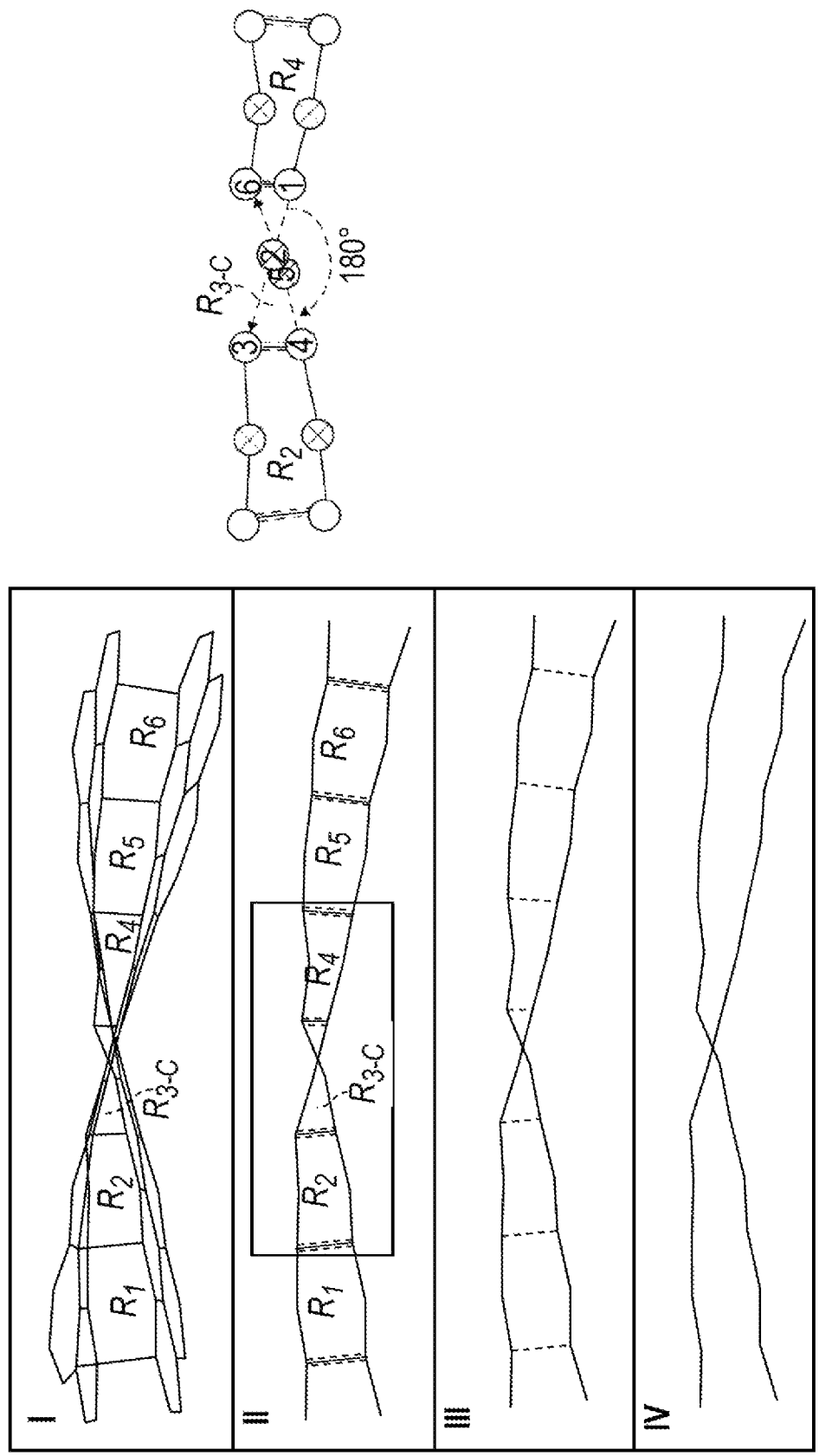
FIG. 63 demonstrates the complete unzipping of the base layer due to unzipping of the $sp^3$-$sp^3$ bond lines formed across the $E_1$-$E_2^C$ tectonic interface. The process is illustrated in 4 stages (I, II, III, and IV). The 2 chiral chains in the chiral ring $R_{3-C}$ are indicated with arrows in the magnified view of $R_2$, $R_{3-c}$, and $R_4$. The $sp^3$-$sp^3$ bonds are indicated by dashed tracing. $Sp^2$ and $sp^3$ atoms are represented as crosshatched circles and white circles, respectively. Severed bonds are indicated by dashed lines.

The unzipping of the $sp^2$ ring-disconnected base in FIG. 61 is more closely analyzed in FIG. 63. The base is illustrated in Frame I of FIG. 63. The $sp^x$ ring connections ($R_1$, $R_2$, $R_{3-C}$, $R_4$, $R_5$ and $R_6$) formed via $sp^3$ grafting are labeled. In Frame II of FIG. 63, we further isolate the portion of the base comprising the primordial E1 and E2 edge atoms from which the $sp^x$ ring connections are constructed. These atoms comprise a zigzag-zigzag interface, which is grafted via two $sp^3$-$sp^3$ bond lines indicated by dashed tracing in Frame II). Each of the 6 $sp^x$ rings comprises 2 $sp^3$-$sp^3$ bonds. In Frame II, we can see the crossover point, where the edge elevations invert, and corresponding with the crossover point, the chiral ring $R_{3-C}$. With the exception of the chiral ring $R_{3-C}$, the other $sp^x$ rings in FIG. 63 are in the chair conformation. As shown in the magnified diagram of Frame II, the rings in the chair conformation each comprise 4 $sp^3$ atoms (represented as white circles) and 2 $sp^2$ atoms (represented as crosshatched circles). In each of these rings, the 2 $sp^3$-$sp^3$ bonds have a common orientation.

Like the other $sp^x$ rings formed via $sp^3$ grafting, the chiral ring $R_{3-C}$ comprises 4 $sp^3$ members and 2 $sp^2$ members. In $R_{3-C}$, however, the 2 $sp^3$-$sp^3$ bonds are not parallel—instead, they are point-reflected with respect to each other. This point reflection is due to the inversion of edge elevations that happens at the crossover point where $R_{3-C}$ is located. The 6 atomic members of $R_{3-C}$ are labeled 1 through 6 in Frame II of FIG. 63. The ring's point-reflected $sp^3$-$sp^3$ bonds result in 2 distinct, point-reflected chiral chains comprising 1-2-3 and 4-5-6. In the magnified diagram in Frame II of FIG. 63, the 1-2-3 chiral chain in the foreground and the 4-5-6 chiral chain in the background are identified by dashed arrows. The direction of these arrows coincides with increasing elevation in the z-direction.

As with other chiral rings we have modeled, the termini of the chiral chains in the chiral ring $R_{3-C}$ are connected via $sp^3$-$sp^3$ bonds. In the magnified diagram in Frame II of FIG. 63, we can see that the termini of the 1-2-3 chiral chain (i.e. the terminal atoms 1 and 3) are connected to the termini of the 4-5-6 chiral chain (i.e. the terminal atoms 4 and 6) via the ring's 2 $sp^3$-$sp^3$ bonds (identified with dashed tracing). During $sp^3$-to-$sp^2$ rehybridization, these $sp^3$-$sp^3$ bonds in $R_{3-C}$ are broken. This destabilizes and unzips the two $sp^3$-$sp^3$ bond lines extending out laterally in either direction from $R_{3-C}$. The broken $sp^3$-$sp^3$ bonds are indicated by dashed lines in Frame III of FIG. 63. Their scission eliminates the $sp^x$ rings along the original $E_1$-$E_2^c$ interface from which the base was formed, leading to the base's complete unzipping along this interface, as illustrated in Frame IV of FIG. 63.

Next, we consider the effects of unzipping throughout the $sp^x$ precursor $G_{IV}$ built over this $sp^2$ ring-disconnected base. In Frame I of FIG. 64, we illustrate $G_{IV}$ from the H2 perspective (cf. the H2 perspective of Frame IV of FIG. 61). We have previously established (cf. FIG. 37) that chiral columns may be formed over chiral rings in the base. In Frame I of FIG. 64, we observe that $G_{IV}$ contains a chiral column of 3 z-adjacent chiral rings, including the base-layer chiral ring $R_{3-C}$ over which the column is constructed. Each of the chiral rings in the higher layers, like $R_{3-C}$, comprise 2 point-reflected chiral chains. The 3 z-adjacent chiral rings are connected via 2 z-oriented $sp^3$-$sp^3$ chains. In Frame I of FIG. 64, the chiral chains are represented by dashed lines, and the $sp^3$-$sp^3$ chains are represented by double dashed lines. We also illustrate the chiral column in isolation in Frame I, representing the $sp^3$ atoms as white circles and the $sp^2$ atoms as crosshatched circles.

Figure 64:
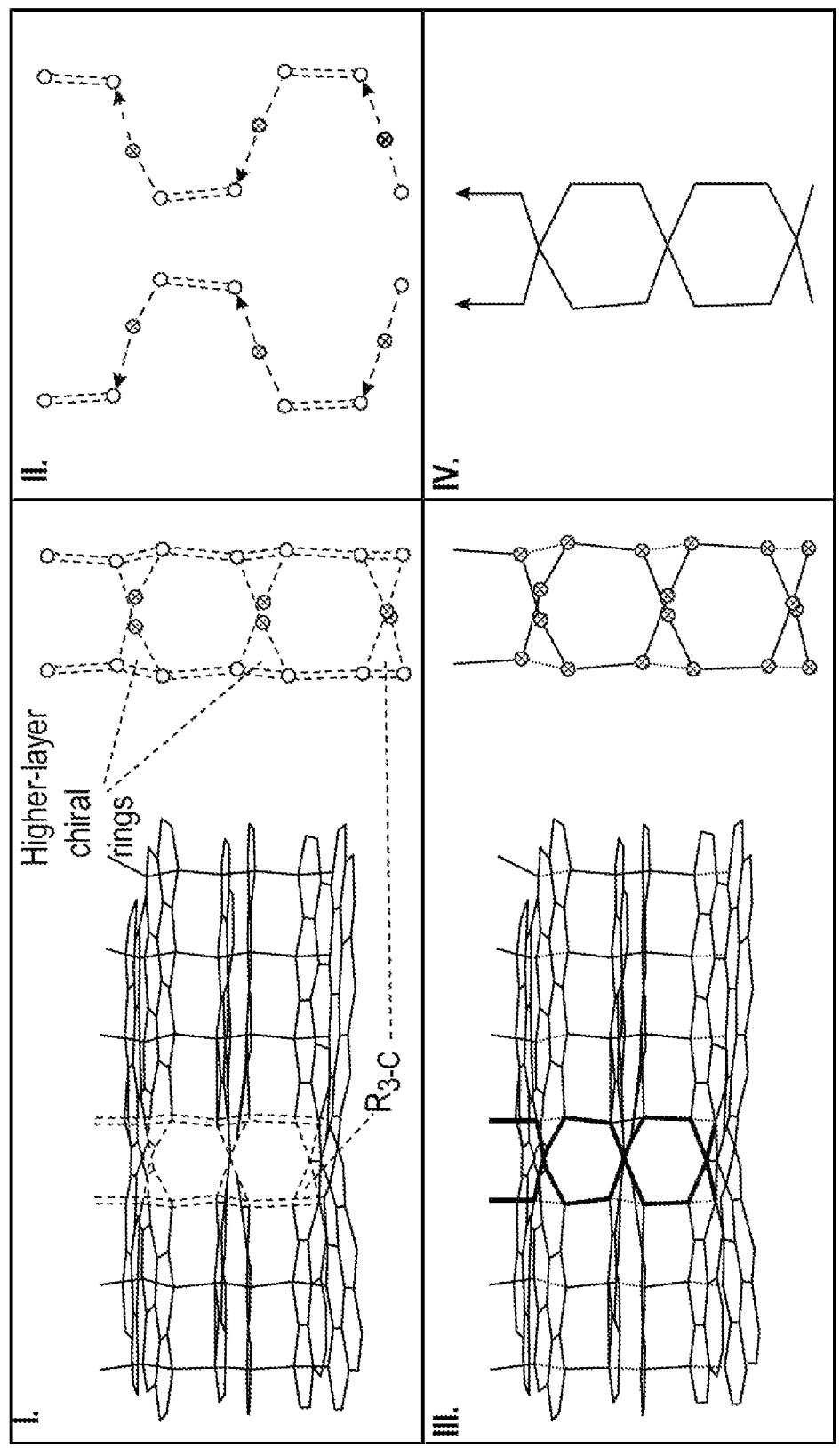
FIG. 64 demonstrates the formation of the double helicoid modeled in FIG. 62 and the maturation-induced disintegration of the $sp^x$ precursor constructed over the $E_1$-$E_2^C$ tectonic interface in FIG. 61. $Sp^2$ and $sp^3$ atoms are represented as crosshatched circles and white circles, respectively. In Frame 1, $sp^3$-$sp^2$ bonds within an $sp^x$ double helix are indicated by double dashed lines, and $sp^3$-$sp^2$ bonds are indicated by single dashed lines. In Frame II, the $sp^x$ double helix is represented in a diagram. In Frame III, the $sp^x$ double helix is bolded, and bonds severed during maturation are indicated by dashed lines. In Frame IV, the $s^2$ helix formed after maturation is illustrated.

In Frame II of FIG. 64, we illustrate how the column of chiral rings shown in Frame I comprises 2 distinct $sp^x$ helices spiraling around each other, together comprising an $sp^x$ double helix. Dashed lines indicate a chiral chains while double dashed lines indicate the $sp^3$-$sp^3$ bonds within the $sp^2$ helices. $Sp^2$ and $sp^3$ atoms are represented by crosshatched and white circles, respectively.

In Frame III of FIG. 64, we illustrate the systemwide unzipping associated with scission of the $sp^3$-$sp^3$ bonds in the 3 z-adjacent chiral rings. These broken bonds are indicated by dotted gray lines in the chiral column illustrated in Frame III. Following the ABAB pattern of bond scission and retention, the $sp^3$-$sp^3$ bonds that connect the z-adjacent chiral rings to one another are retained, being transformed into $sp^2$-$sp^2$ bonds as the $sp^3$ atoms undergo $sp^3$-to-$sp^2$ rehybridization (the resulting $sp^2$ atoms are represented as crosshatched circles in Frame III). As a result, the $sp^x$ double helix is transformed into an $sp^2$ double helix (as illustrated in Frame W of FIG. 64. Relaxation of the system in Frame III creates the double helicoid illustrated in FIG. 62.

Figure 65A:
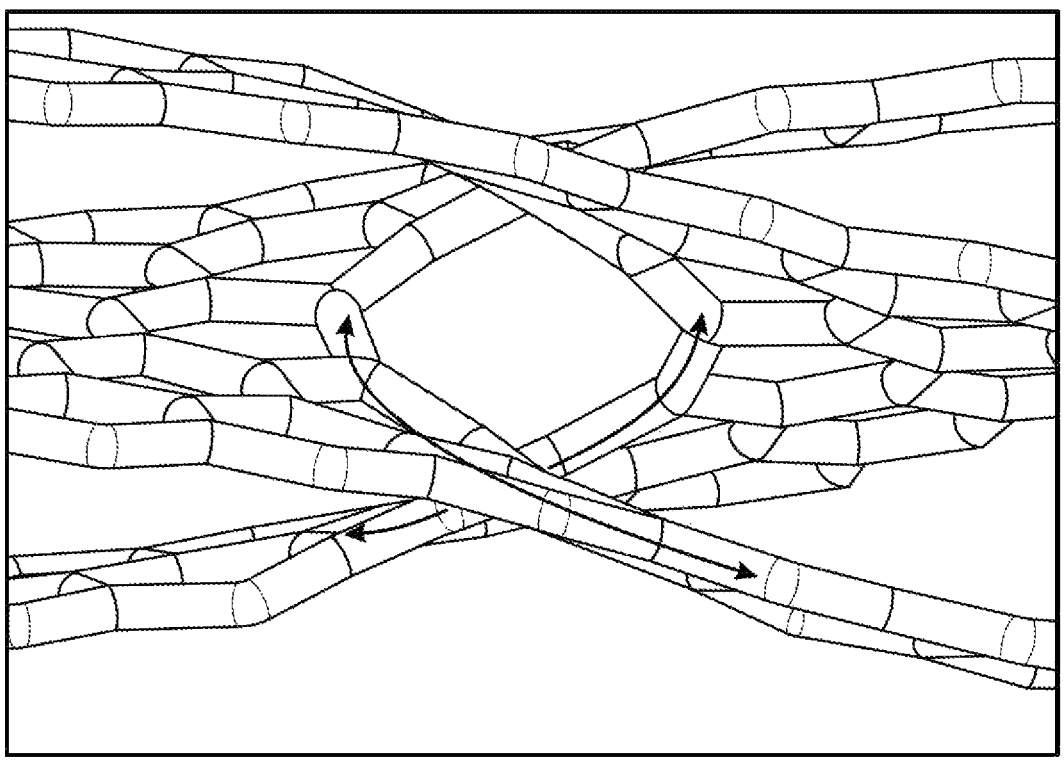
FIG. 65A illustrates a double helicoid. This type of structure is derived from a tectonic interface with no level zone and no $sp^2$ grafting.

Next, we illustrate the fundamental link between the interfacial zone transitions and the ultimate connectedness of a matured system. In FIG. 65A, a disconnected double-helicoid is shown. The two arrows trace the helical edges, and we can recognize in these arrows the crisscrossing of the primordial domains' edges at a crossover point. Without a level zone between the offset zones, only $sp^3$ grafting occurs, and the resulting $sp^3$-$sp^3$ bonds are unzipped during $sp^3$-to-$sp^2$ rehybridization. Hence, maturation results in a disconnected double helicoid in FIG. 65A.

Figure 65B:
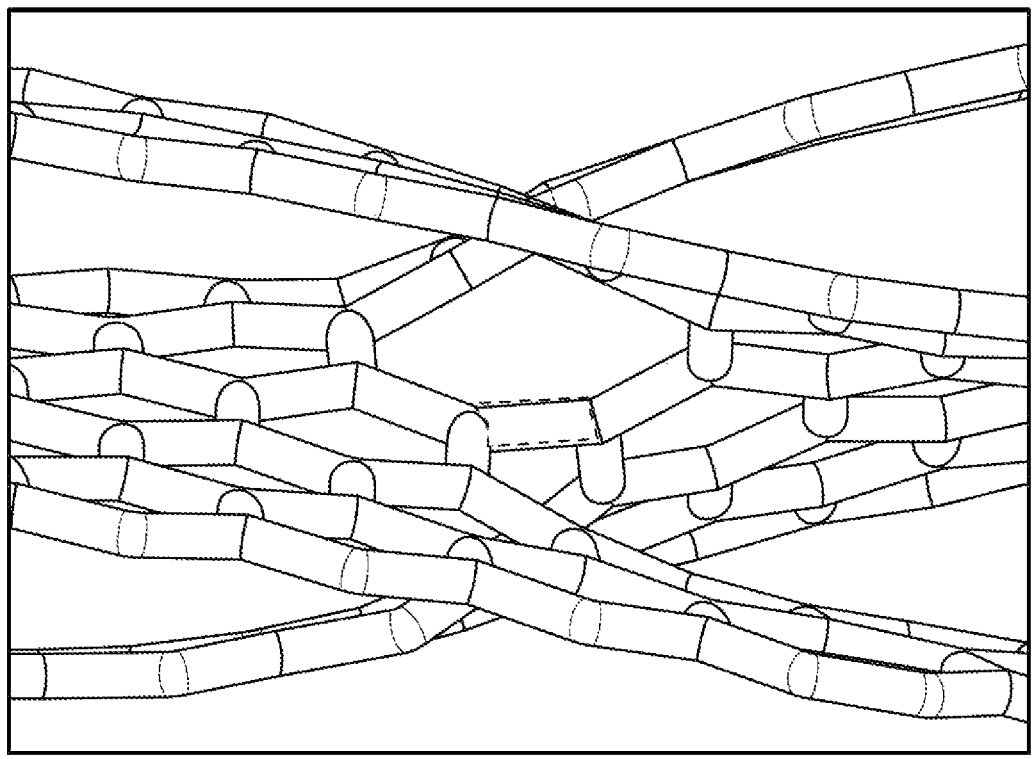
FIG. 65B illustrates a double helicoid where the helicoids are connected by a single $sp^2$ bond (dashed tracing).

In FIG. 65B, a covalently connected (but ring-disconnected) double-helicoid is shown. This variant might be expected if the crossover point allowed a single $sp^2$-$sp^2$ bond to form. If this strained $sp^2$-$sp^2$ bond (indicated by dashed tracing in FIG. 65B) is stable to be retained during maturation, it creates a lone covalent connection between the two helicoids.

Figure 65C:
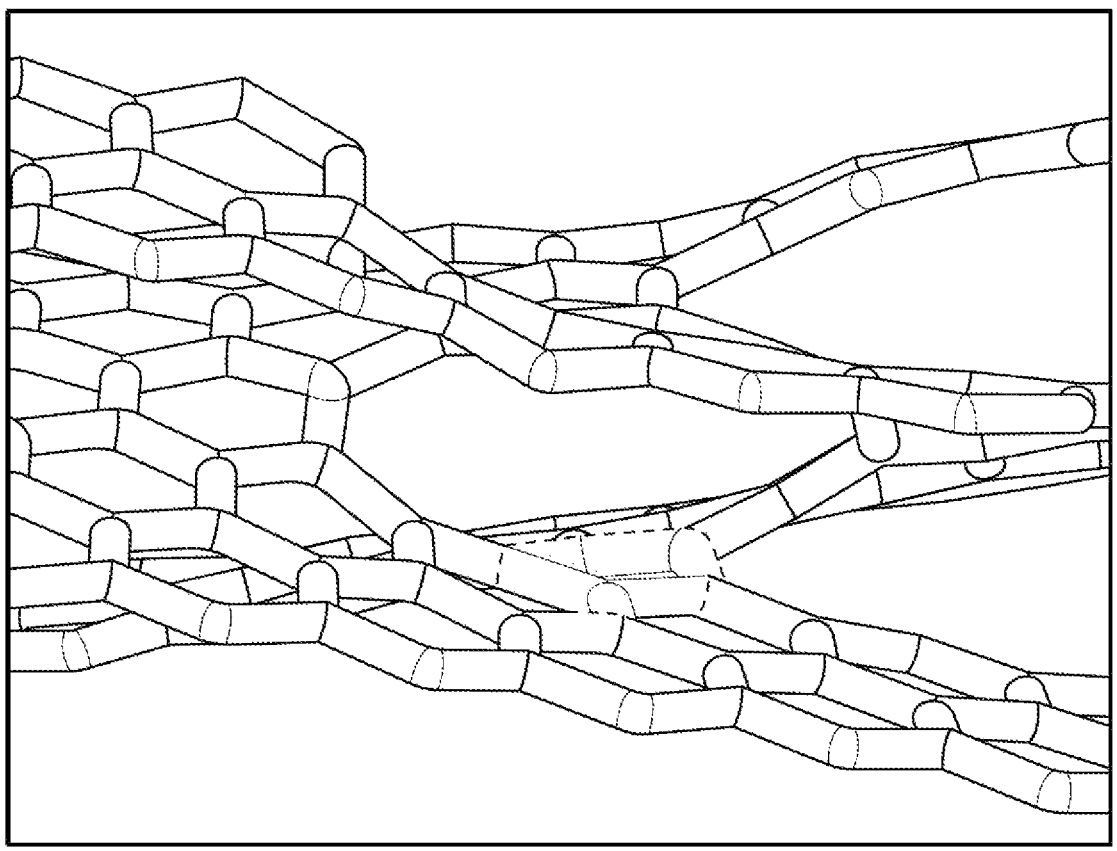
FIG. 65C illustrates a helicoidal system where two helicoids are ring-connected (the ring is dashed).

In FIG. 65C, a ring-connected helicoidal loop is shown. This variant might be expected if the hypothetical primordial interface included a level zone where a $sp^2$-$sp^2$ bond line comprising 2 adjacent bonds were formed. The two adjacent $sp^2$-$sp^2$ bonds form an $sp^2$ ring-connection (indicated by dashed tracing in FIG. 65C) between the primordial domains, resulting in an $sp^2$ ring-connected base. Retention of $sp^2$ rings during maturation results in an $sp^2$ ring-connection between the two primordial regions in the base. In addition to ring-connecting the two helicoids, $sp^2$ ring-connections spread the screw dislocations apart, forming a loop that gets progressively looser as the $sp^2$-$sp^2$ bond line between the offset zones is lengthened. The result of this $sp^2$ ring-connection between the primordial domains in the base of the $sp^x$ network is a helicoidal singleton.

Figure 66A:
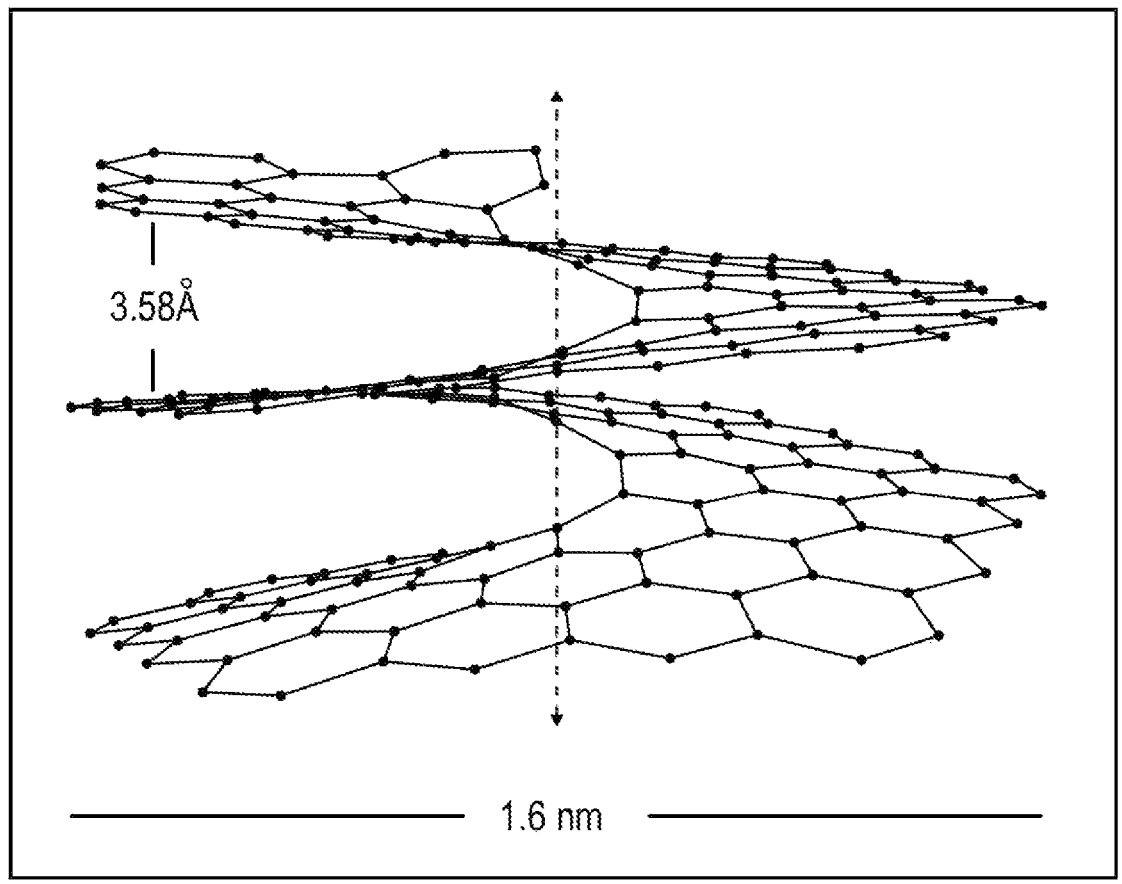
FIG. 66A illustrates a helicoid.
Figure 66B:
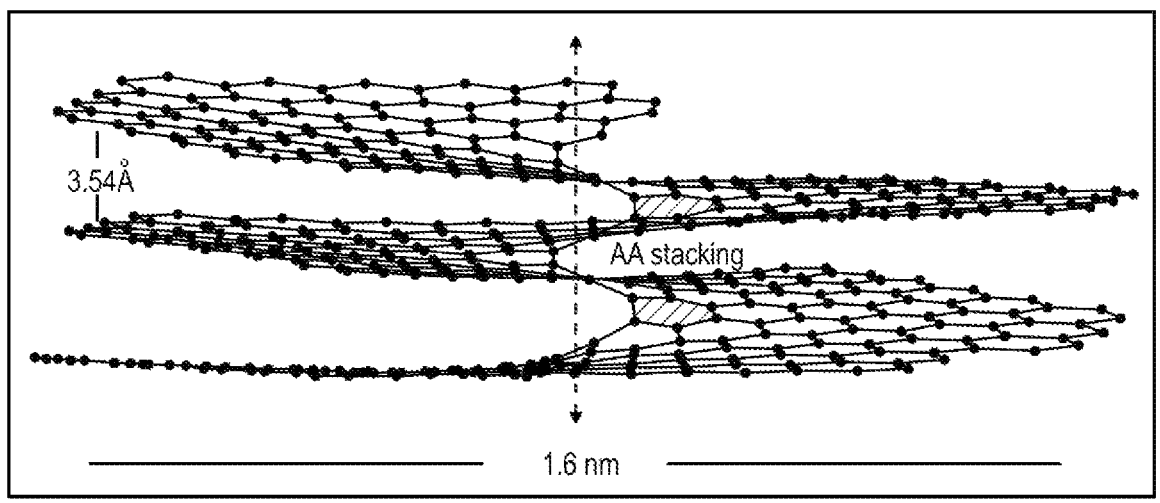
FIG. 66B illustrates a laterally larger helicoid and illustrates an AA stacking fault (AA-stacked rings are hatched) associated with screw dislocations.
Figure 66C:
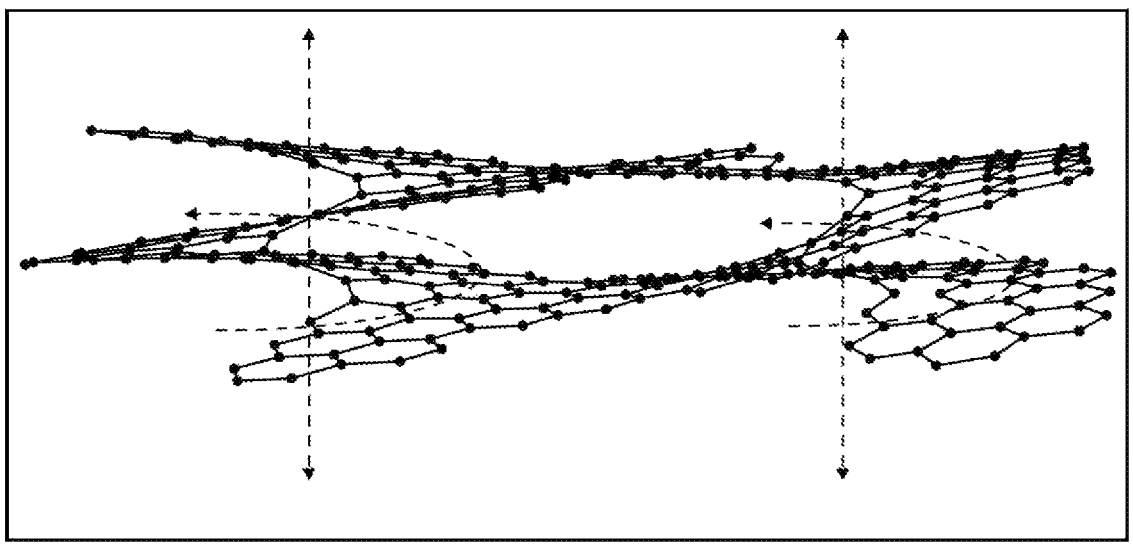
FIG. 66C illustrates conjoined helicoids of the same chirality.
Figure 66D:
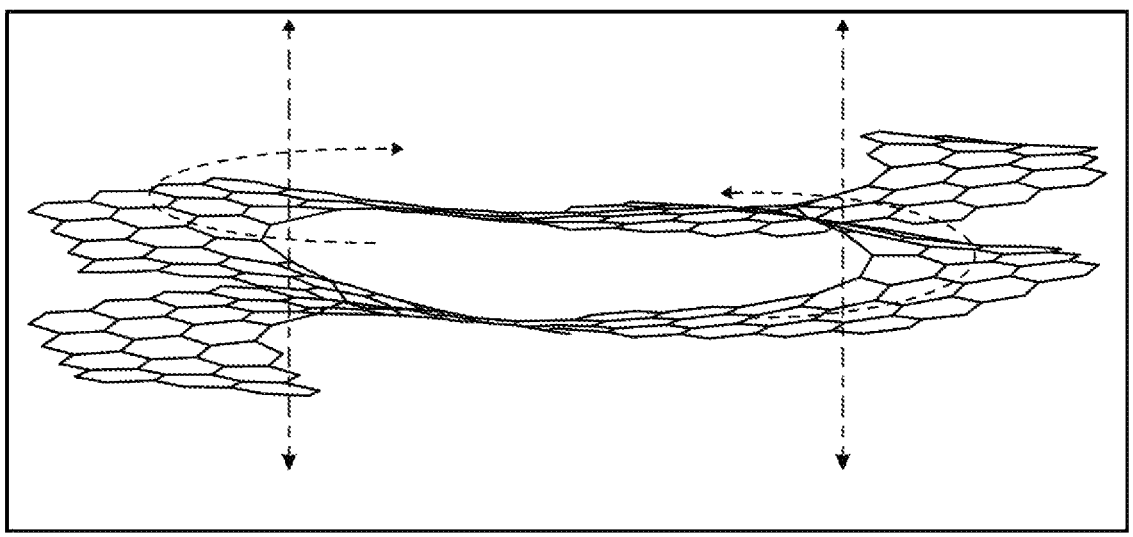
FIG. 66D illustrates conjoined helicoids of opposite chirality.

Lattice distortion in a helicoidal network is dependent upon distance from an $sp^2$ helix. This is illustrated by comparing the smaller and larger helicoidal the structures (FIG. 66A and FIG. 66B, respectively). Moving radially outward from the $sp^2$ helix at the center of the helicoid, the lattice becomes more planar. In helicoidal networks, the closer the $sp^2$ helices are to one another, the more overall lattice distortion the network will exhibit. In screw dislocation loops wherein two nearby $sp^2$ helices share a common chirality (illustrated in FIG. 66C, increased lattice distortion may be expected compared to screw dislocation loops wherein two nearby $sp^2$ helices have opposite chirality as illustrated in FIG. 66D).

Having established the phenomena associated with maturation using simple, small-scale conceptual models, we next extrapolate what happens during maturation of an arbitrarily large $sp^x$ precursor, which may be formed from numerous tectonic interfaces and grafting of numerous primordial domains. Grafting across these stochastic interfaces and subsequent higher-layer growth leads to the formation of complex, arbitrarily large $sp^x$ networks. Maturation of these $sp^x$ precursors forms helicoidal networks of comparable size, comprising numerous screw dislocations. The geometry of these mature networks can be intuited as networks of seamlessly conjoined helicoids—similar to a class of parametric surfaces that have been described as "rheotomic surfaces" in the field of architectural design.

A natural question to ask is whether or not a mature, screw-dislocation network comprises a singleton or an assembly—i.e. whether its membership of graphenic structures is singular or plural. This determination may be straightforward if the mature system is derived in silico from a small-scale, hypothetical precursor with a precisely defined molecular structure. However, to make this determination for a larger-scale, macromolecular precursor system would require mapping its exact molecular structure, which we cannot practically accomplish. What we can establish generally—i.e. for any real $sp^x$ precursor, without having mapped its exact molecular structure—is that its maturation will result in the formation of a helicoidal network comprising either a helicoidal singleton or a helicoidal assembly. We can also establish that each outcome is consistent with our empirical observations in Study E (i.e. observations of generalized, system-level rigidification and strengthening after maturation).

The first possibility is an outcome herein described as a "singleton-to-singleton" maturation. In this type of maturation, a $sp^x$ network, which comprises a singleton, is matured into a helicoidal singleton. This type of maturation would be consistent with the empirical observations in Study E (i.e. observations of increased system-level rigidity and strength after rehybridization). A singleton-to-singleton transformation is produced from $sp^x$ precursors constructed upon an $sp^2$ ring-connected base. To illustrate how a singleton-to-singleton maturation might occur in a reasonably large, complex system, we describe a first scenario in which this outcome is favored. We shall refer to this scenario as "Scenario A."

In Scenario A, we firstly postulate that, during pyrolytic nucleation and growth of an $sp^x$ precursor, a multitude of tectonic encounters occur between ring-disordered primordial domains, resulting in a multitude of tectonic interfaces. Due to the out-of-phase edge deflections of the ring-disordered primordial domains, the interfaces are incoherent and stochastic in nature. Wherever level zones occur between two primordial domains, $sp^2$ grafting creates $sp^2$ ring-connections between the participating domains, and wherever offset zones or crossover points occur between two primordial domains, $sp^3$ grafting creates $sp^x$ ring-connections between the participating domains.

In Scenario A, we secondly postulate that all tectonic interfaces include at least one level zone. From this it follows that, after grafting, all of the primordial domains under consideration will be $sp^2$ ring-connected to one another, such that there will exist a path of adjacent $sp^2$ rings connecting every primordial domain to every other primordial domain. Hence, the base itself will be $sp^2$ ring-connected. It also follows that any tectonic interfaces that include an offset zone in addition to the level zone(s) will comprise at least one interfacial zone transition where a chiral ring will be formed. Lastly, it follows that any higher layers grown over the base will also themselves be $sp^2$ ring-connected (by virtue of $sp^2$ grafting across higher-layer interfaces).

In Scenario A, we thirdly postulate that continued vertical and lateral growth over the base layer forms an $sp^x$ network comprising the base layer and some number of higher layers that are ring-connected to the base via diamondlike seams (formed over $sp^3$-grafted offset zones) and via chiral columns (formed over tectonic zone transitions between $sp^3$-grafted offset zones and $sp^2$-grafted level zones). As we have already established, these chiral columns formed over level-to-offset zone transitions will comprise a single $sp^x$ helix and will each be positioned at the terminus of a seam.

In instances consistent with Scenario A, we have already observed (cf. FIGS. 29-36 and FIG. 57) that, so long as the underlying base formed by grafting is $sp^2$ ring-connected, an $sp^x$ network constructed over it will not disintegrate into multiple distinct graphenic structures during maturation but will instead remain ring-connected. Since $sp^2$-$sp^2$ bonds (and therefore $sp^2$ rings) are retained during $sp^3$-to-$sp^2$ rehybridization, the $sp^2$ ring-connected base will remain $sp^2$ ring-connected via base-layer $sp^2$ ring pathways. Furthermore, any $sp^2$ ring-connected higher layers that are $sp^x$ ring-connected to the base via diamondlike seams and chiral columns will remain ring-connected to the base as the $sp^x$ helices within the chiral columns are transformed into $sp^2$ helices. Hence, higher layers will remain ring-connected with respect to the base layer, and the base layer will remain itself ring-connected, creating a helicoidal singleton.

The other possible type of maturation for a $sp^x$ precursor is a "singleton-to-assembly" maturation. In this type of maturation, the $sp^x$ precursor, which comprises a singleton, is matured into an assembly of multiple graphenic structures. A singleton-to-assembly maturation is associated with a ring-connected, $sp^2$ ring-disconnected base. To illustrate how a singleton-to-assembly maturation might occur in a reasonably large system, we describe a second scenario in which this outcome could theoretically occur. We shall refer to this scenario as "Scenario B."

In Scenario B, we firstly postulate that, during pyrolytic nucleation and growth of an $sp^x$ precursor, a multitude of tectonic encounters occur between ring-disordered primordial domains, resulting in a multitude of tectonic interfaces. Due to the out-of-phase edge deflections of the ring-disordered primordial domains, the interfaces are incoherent and stochastic in nature. Wherever level zones occur between two primordial domains, $sp^2$ grafting creates $sp^2$ ring-connections between the participating domains, and wherever offset zones or crossover points occur between two primordial domains, $sp^3$ grafting creates $sp^x$ ring-connections between the participating domains.

In Scenario B, we secondly postulate that none of the tectonic interfaces pertaining to some subset of primordial domains include a level zone. Instead, their tectonic interfaces include only offset zones and crossover points formed via the stochastic crisscrossing of the participating edges. During grafting, these primordial domains are only able to undergo $sp^3$ grafting due to the total absence of level zones in their tectonic interfaces. It follows that only $sp^x$ rings are formed at their interfaces and that this subset of domains is therefore $sp^2$ ring-disconnected with respect to the surrounding base, of which they are part. It also follows that the base itself is $sp^2$ ring-disconnected.

In Scenario B, we thirdly postulate that continued vertical and lateral growth over the base layer forms an $sp^x$ network comprising the base layer and some number of higher layers that are ring-connected to the base via diamondlike seams (formed over $sp^3$-grafted offset zones) and via chiral columns (formed over crossover points). As we have already established, these chiral columns formed over crossover points will each contain an $sp^x$ double helix and will each be positioned at the terminus of a seam.

In a scenario like Scenario B, we have already observed (cf. FIGS. 61-62) that if the underlying base form by grafting is $sp^2$ ring-disconnected, then it is possible for the base—and an $sp^x$ network constructed over it—to disintegrate into a helicoidal assembly during rehybridization. Specifically, it follows from our second postulate in Scenario B—i.e. that some subset of the primordial regions are exclusively grafted to the surrounding base layer via $sp^3$-$sp^3$ bonds—that $sp^3$-to-$sp^2$ rehybridization may lead to the complete unzipping of the $sp^3$-$sp^3$ bonds and severing of these primordial regions' $sp^x$ ring connections to the surrounding base. Additionally, as illustrated in FIGS. 61-62, this unzipping, extended into higher layers, may eliminate any higher-layer pathways that might preserve the ring-connectedness of the severed primordial regions, resulting in the singleton's disintegration into a helicoidal assembly comprising multiple, distinct graphenic structures.

Therefore, in Scenario B, where an $sp^x$ network is constructed over an $sp^2$ ring-disconnected base, it is theoretically possible for a singleton-to-assembly maturation to occur. However, for this outcome to be consistent with the empirical observations in Study E (i.e. observations of increased system-level rigidity and strength after rehybridization), the resulting assembly must be able to resist the shear failure observed in a typical vdW assembly. The creation of an assembly of disconnected members seems inconsistent with these observations. However, we can in fact conclude that even in the instance of a singleton-to-assembly maturation, resulting in disintegration, the resulting assembly will be interlocked so that it cannot shear apart.

This conclusion follows from our third postulate in Scenario B—i.e. that the $sp^x$ network comprises at least one higher layer. So long as an $sp^x$ network comprises at least one higher layer, even if a singleton-to-assembly maturation occurs, such that disintegration results in double helicoids of distinct graphenic members, the double helicoids will result in a where double helicoids are formed, even if disintegration occurs, the braid-like geometry of the double helicoids will create an open, interlocking chain preventing the individual, disconnected helicoids from being separated.

Figure 67:
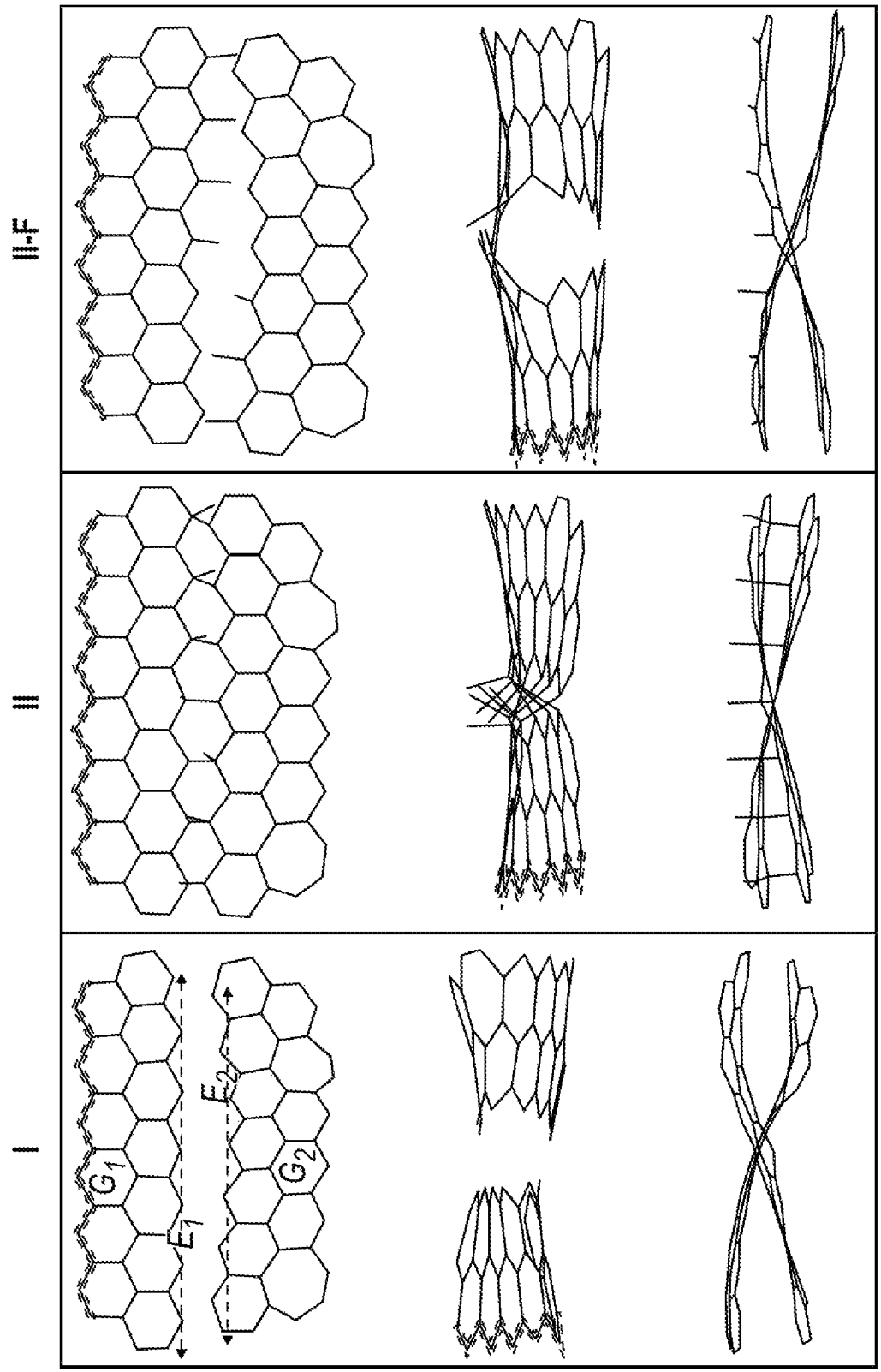
FIG. 67 illustrates how a monolayer precursor, if disintegrated during maturation, forms a truncated double helicoid that does not interlock. The process is illustrated in 3 stages (I, II and II-F0. In Frame I, two graphenic structures $G_1$ and $G_2$ form a tectonic interface at their respective edges E1 and E2. In Frame II, the coalesce via $sp^3$ grafting. In Frame II-F, disintegration occurs during maturation.

The dependency on this interlocking mechanism on the presence of higher layers is demonstrated in FIG. 67. In FIG. 67, for helpful reference, we show again Stages I and II of FIG. 61, wherein the hypothetical $E_1$-$E_2^c$ interface comprised a crossover point in the center, such that only $sp^3$ grafting occurred and an $sp^2$ ring-disconnected base was formed. In Stages III and IV of FIG. 61, we modeled the growth of a multilayer $sp^x$ network $G_{IV}$ over this base, and in FIG. 62, we modeled the singleton-to-assembly maturation associated with $G_{IV}$. In this maturation, the precursor $G_{IV}$ disintegrated into the two graphenic structures $G_i$ and $G_{ii}$, which together comprised a double helicoid possessing an interlocking, braid-like geometry.

In Frame II-F of FIG. 67, we illustrate what the final result would have been if the $sp^2$ ring-disconnected base in Frame II was matured prior to any further growth. As shown in Frame II-F, the unzipping of $sp^3$-$sp^3$ bonds along the original $E_1$-$E_2^c$ tectonic interface causes the base to disintegrate, but without any higher layers in the $sp^x$ precursor, the two resulting graphenic structures do not interlock with each other. Instead, the assembly comprises a truncated double-helicoid in which neither of the constituent helicoids complete a turn around the axis.

Figure 68:
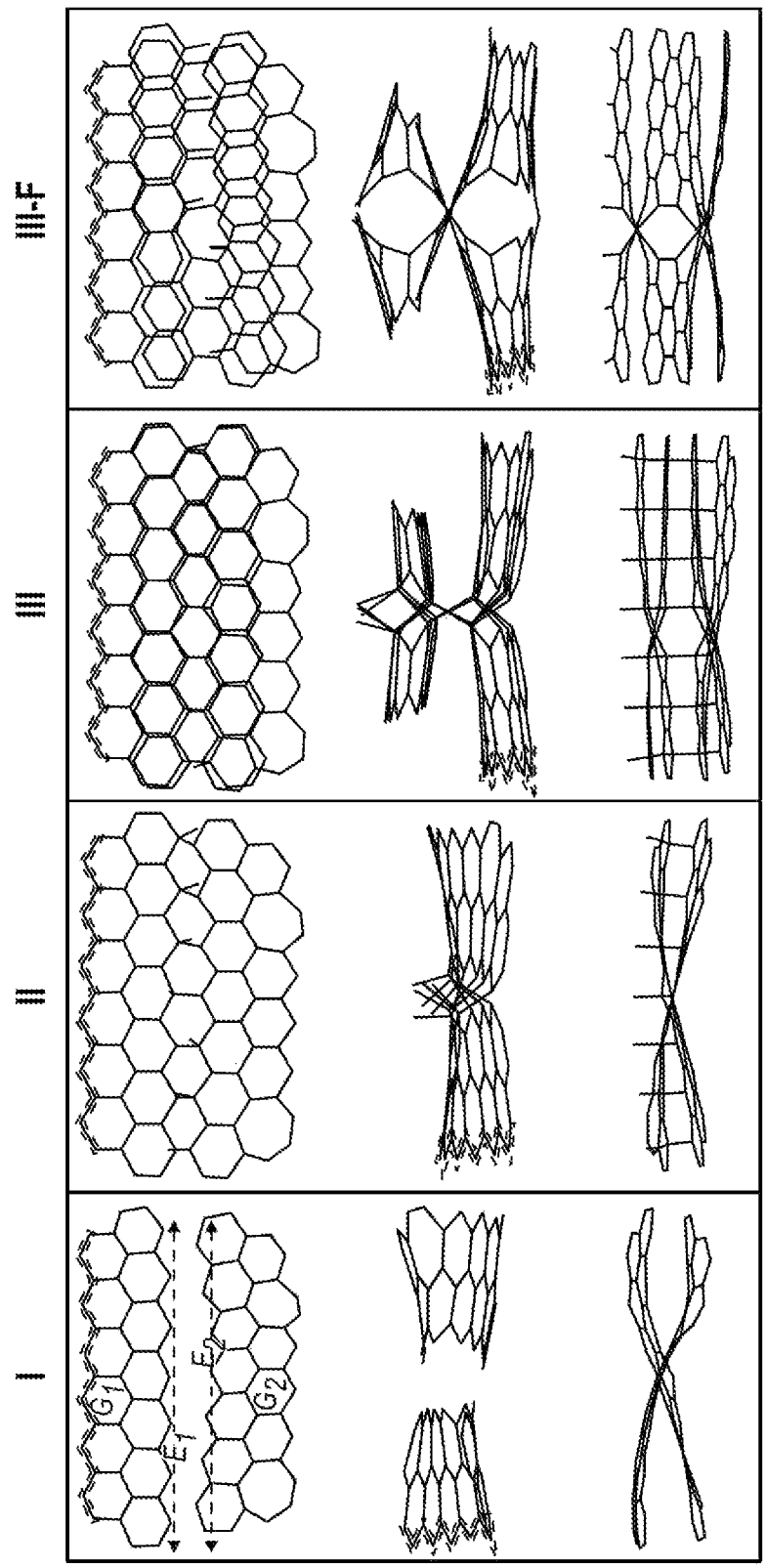
FIG. 68 illustrates how a bilayer precursor, if disintegrated during maturation, forms a sufficiently elongated double helicoid for the helicoids to be interlocked. The process is illustrated in 4 stages (I, II, III, and III-F). In Frame I, two graphenic structures $G_1$ and $G_2$ form a tectonic interface at their respective edges $E_1$ and $E_2$. In Frame II, they coalesce via $sp^3$ grafting. In Frame III, a second layer is nucleated. In Frame III-F, disintegration occurs during maturation and forms an interlocked double helicoid.

For interlocking to occur, at least one higher layer is needed in the $sp^x$ precursor, such that the double-helicoid formed during maturation is not so truncated. This is illustrated in FIG. 68, wherein Frames I, II and III from FIG. 61 are shown again for helpful reference. In Frame III, a $sp^x$ network comprising Y-dislocations and a nucleated second layer has been formed over the base. In Frame III-M of FIG. 68, we illustrate what the final result might have been if the $sp^x$ network in Frame III was matured. In this case, the double-helicoid is elongated enough for the two graphenic structures to form an interlocking braid. This demonstrates the need for higher layers above the tectonic interfaces of the base. A monolayer base, when matured, cannot form these interlocking braids.

While the graphenic structures in an individual double helicoid could theoretically shear apart via differential rotation around their common axis, this rotational mobility is impossible in a network of multiple double-helicoids. Returning to Scenario B, it follows from our postulates that the helicoidal assembly formed via a singleton-to-assembly maturation would comprise a network of many double-helicoids. Even those primordial domains postulated in Scenario B to be $sp^2$ ring-disconnected with respect to the surrounding base would have crossover points distributed along their incoherent tectonic interfaces—a feature that we have established would create double helicoids. These arrays of double helicoids lack the rotational mobility to be sheared apart, making it necessary to break a graphenic structure in order to break the assembly.

Scenarios A and B are not intended to be limiting, but rather to demonstrate the only two theoretically possible outcomes of $sp^3$-to-$sp^2$ rehybridization of an $sp^x$ precursor—i.e. a singleton-to-singleton maturation or a singleton-to-assembly maturation—and furthermore to demonstrate how, regardless of which outcome might pertain to a given precursor, the mature system evolved might be expected to exhibit increased rigidity and strength. Either outcome is accompanied by the formation of a helicoidal network that cannot fail via shear, but only via breakage of some graphenic region. This is consistent with our observations of the superior mechanical properties of the mature perimorphic frameworks in Samples E1A and E2A compared to the frameworks in Samples E1 and E2.

Figure 69A:
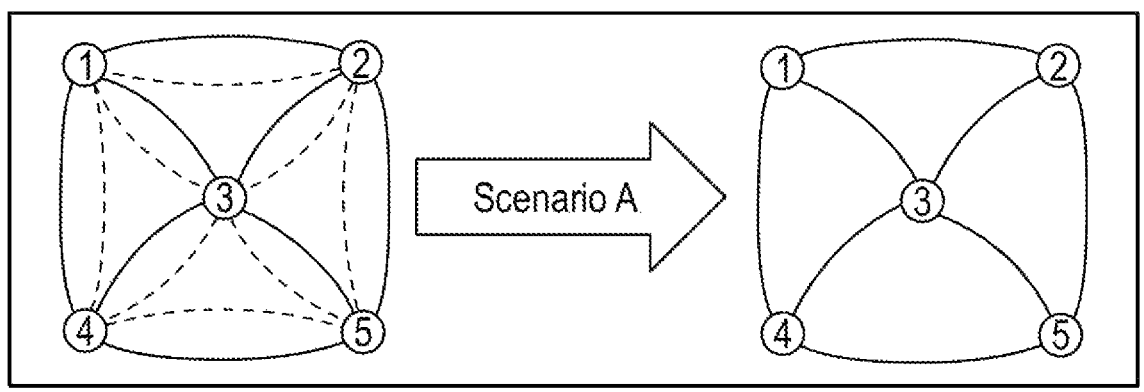
FIG. 69A is a graph theoretic representation of a singleton-to-singleton maturation.
Figure 69B:
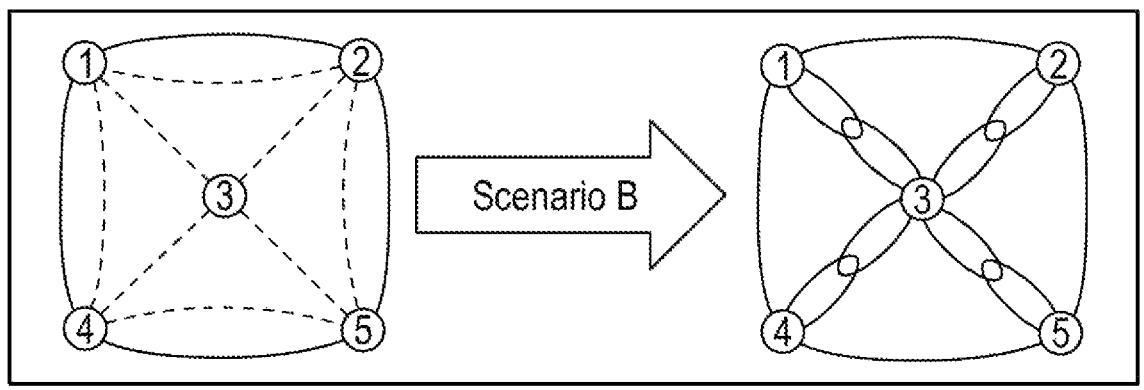
FIG. 69B is a graph theoretic representation of a singleton-to-assembly maturation.

To conclude our discussion of singleton-to-singleton and singleton-to-assembly maturations, in FIG. 69A and FIG. 69B we represent these potential outcomes with multigraphs that permit us to analyze ring-connectedness of the base before and after maturation. Each of the 5 nodes in one of these multigraphs represents a primordial domain, and the multigraph as a whole represents the base constructed from grafting between these 5 primordial domains (although the base in most real systems may comprise many more primordial domains). A link connecting two nodes indicates the ring-connectedness of the two associated primordial domains with respect to each other. The color of the link indicates the type of ring-connectedness. A solid link represents a path constructed exclusively from $sp^2$ rings. Two nodes that are reachable from each other by a path of one or more solid links are therefore $sp^2$ ring-connected with respect to each other. A dashed link represents a path that includes an $sp^x$ ring.

In FIG. 69A, we represent a singleton-to-singleton maturation. In the left-hand multigraph, the 5 nodes represent a hypothetical base formed via the grafting and coalescence of 5 primordial domains. Every node in the multigraph is reachable from every other node via a path of one or more solid links or, alternatively, a path of one or more dashed links. The reachability of any node from any other node via a path of solid links indicates that each of the 5 primordial domains that form the base are $sp^2$ ring-connected to one another. Therefore, the base itself is $sp^2$ ring-connected. The reachability of any node from any other node via a path of dashed links indicates that the 5 primordial domains are also ring-connected to one another via at least one path of adjacent rings that includes an $sp^x$ ring.

In the right-hand multigraph of FIG. 69A, we represent the base after the singleton-to-singleton maturation of the $sp^x$ network grown over the base. The elimination of $sp^x$ rings during $sp^3$-to-$sp^2$ rehybridization is indicated in this right-hand multigraph by the absence of dashed links between the nodes. This occurs because the $sp^x$ rings in the system are either eliminated or transformed into $sp^2$ rings during rehybridization. Every node remains reachable from every other node via a path of one or more solid links, indicating the persistence of the base's $sp^2$ rings, and therefore the retention of its $sp^2$ ring-connectedness. Any higher layers grown over this base become $sp^2$ ring-connected to it via conversion of $sp^x$ helices to $sp^2$ helices and the associated formation of helicoids. Therefore, by showing the retention of the base's $sp^2$ ring-connectedness, we show the $sp^2$ ring-connectedness of the mature network constructed on it. FIG. 69A therefore represents a singleton-to-singleton maturation.

In FIG. 69B, we represent a singleton-to-assembly maturation. In the left-hand multigraph, the 5 nodes represent a hypothetical base formed via the grafting and coalescence of 5 primordial domains. In this multigraph, every node is reachable from every other node via a path of links. This indicates that each of the 5 primordial domains are ring-connected to one another, and that the base itself is ring-connected. Additionally, four nodes (Nodes 1, 2, 4 and 5) are reachable from one another via a path of one or more solid links, indicating that these four primordial domains are $sp^2$ ring-connected with respect to one another. However, Node 3 is not reachable from the other nodes by a path of blue links. Node 3 therefore represents a primordial domain that is $sp^2$ ring-disconnected with respect to the other primordial domains. Accordingly, the base itself is $sp^2$ ring-disconnected.

In the right-hand multigraph of FIG. 69B, we represent the base after the singleton-to-assembly maturation of the $sp^x$ network grown over the base. The elimination of $sp^x$ rings during $sp^3$-to-$sp^2$ rehybridization is indicated in this right-hand multigraph by the absence of dashed links between the nodes. This occurs because the $sp^x$ rings in the system are either eliminated or transformed into $sp^2$ rings during rehybridization. Four nodes remain reachable from each other via a path of one or more solid links, indicating the persistence of $sp^2$ rings and therefore the retention of $sp^2$ ring-connectedness between the primordial domains that were $sp^2$ ring-connected prior to maturation. Node 3, however, is no longer linked to the surrounding nodes by either solid or dashed links, indicating that this primordial domain has been disconnected from the surrounding base, and that a disintegration into multiple distinct graphenic domains has occurred.

However, while the primordial domain associated with Node 3 is represented as disconnected in the right-hand multigraph of FIG. 69B, we know that, so long as a multilayer precursor was grown over the base, this primordial domain will be physically interlocked with the four other domains. This interlocking geometry is indicated by the solid links between the other nodes and Node 3. Each solid link represents the existence of at least one path of $sp^2$ rings extending from a primordial domain into higher layers and interlocking in a braidlike, open chain with an analogous, higher-layer path extending from Node 3. FIG. 69B therefore represents singleton-to-assembly maturation, wherein a disconnected region of the base may be physically interlocked with the surrounding regions of the base.

Figure 70:
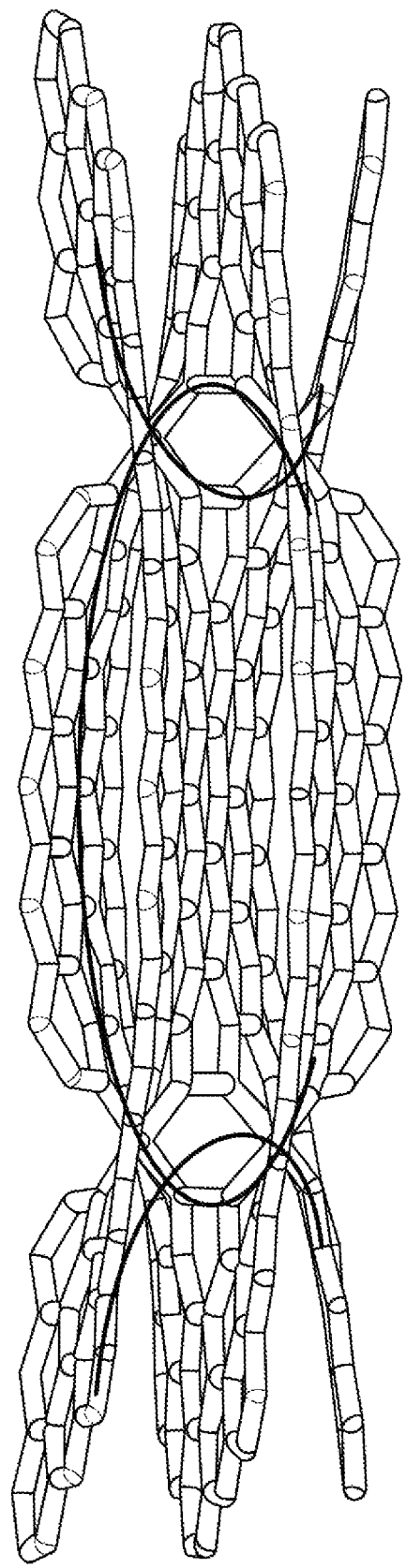
FIG. 70 illustrates how two higher-layer pathways extending up from a base layer may reconnect, forming a closed loop.

This concept is illustrated in FIG. 70, an helicoidal assembly of two graphenic structures comprising two double-helicoids. Two higher-layer paths of $sp^2$ rings extend up from the same base-layer region, connecting to form a closed loop. This closed loop formed by these paths is indicated by a solid line in FIG. 70. These higher-layer paths interlock with other higher-layer paths (also indicated by solid lines in FIG. 70) extending up from nearby regions. These other high-layer paths may also form closed loops.

Irrespective of whether the helicoidal network formed by maturation comprises a helicoidal singleton or a helicoidal assembly, the network geometry is analytically similar. Helicoidal networks produce very characteristic fringe patterns in HRTEM. FIG. 71A-71E are HRTEM micrographs of a helicoidal z-network synthesized by annealing a z-$sp^x$ precursor (similar to Sample A1: synthesized at 750° C. using $C_3H_6$ over a similar MgO template) at 1200° C. for 4 hours.

Figure 71A:
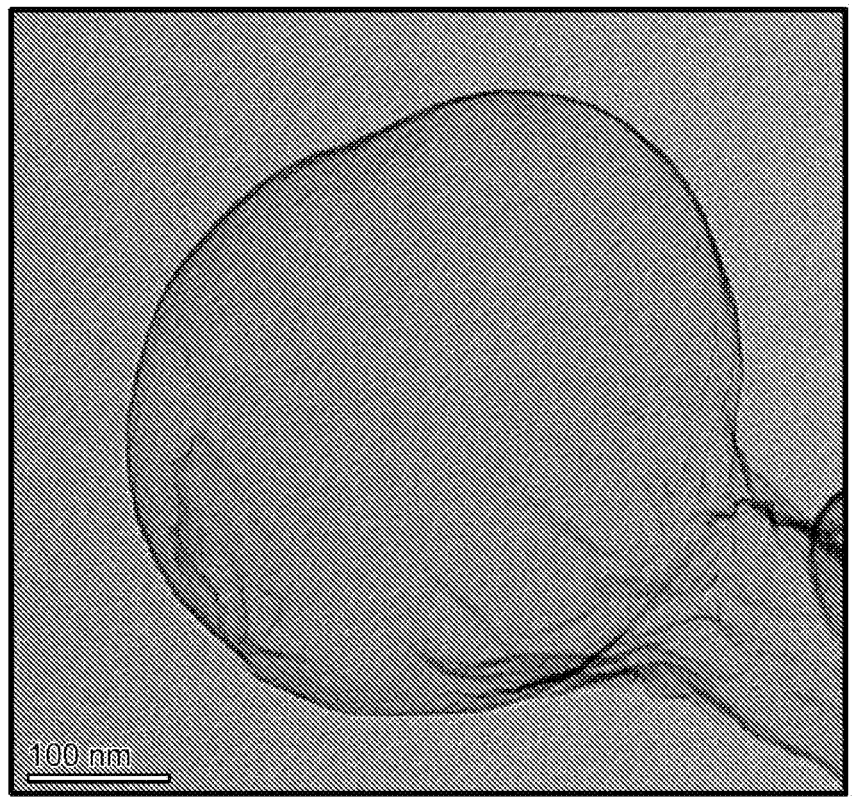
FIG. 71A is a TEM micrograph of a macroporous perimorphic framework from an annealed $sp^x$ precursor.
Figure 71B:
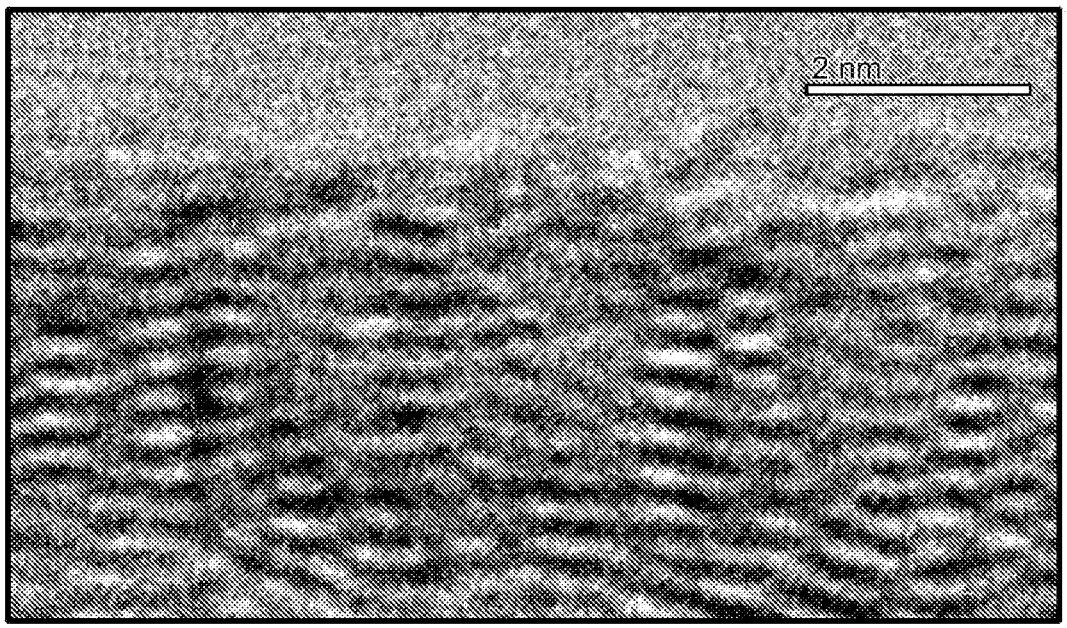
FIG. 71B is a TEM micrograph of the perimorphic wall. The fringe lines exhibit a distinctive "sliced" pattern, corresponding to the z-displacement of a helicoidal graphenic lattice over each 180° turn around the dislocation line.
Figure 71C:
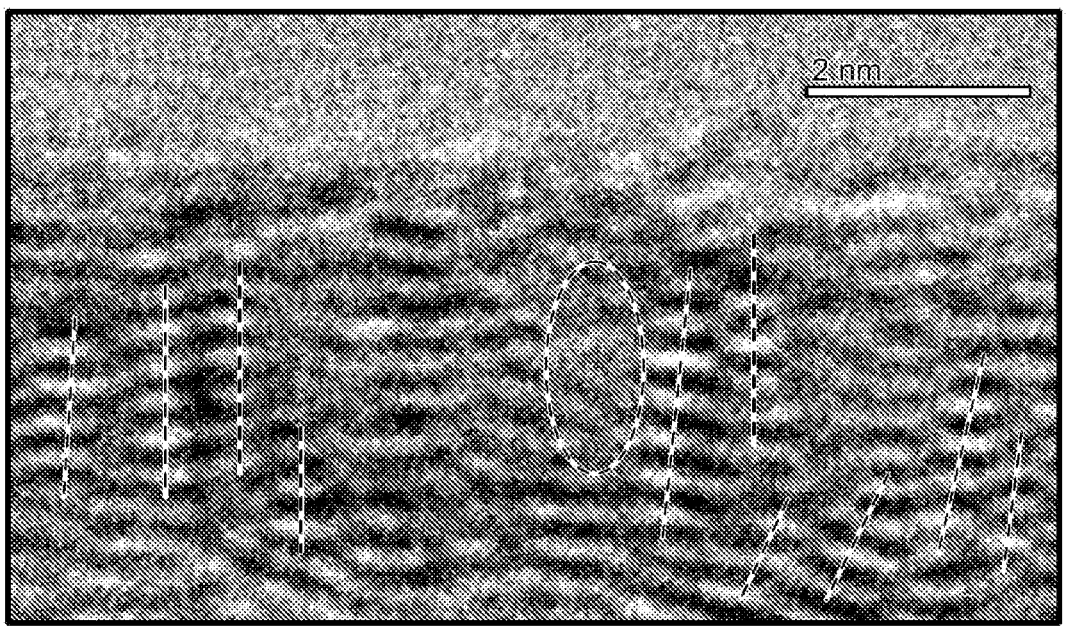
In FIG. 71C, several of the "slices" are indicated by dashed lines, while regions of indistinct layer structure are indicated by dashed circles.
Figure 71D:
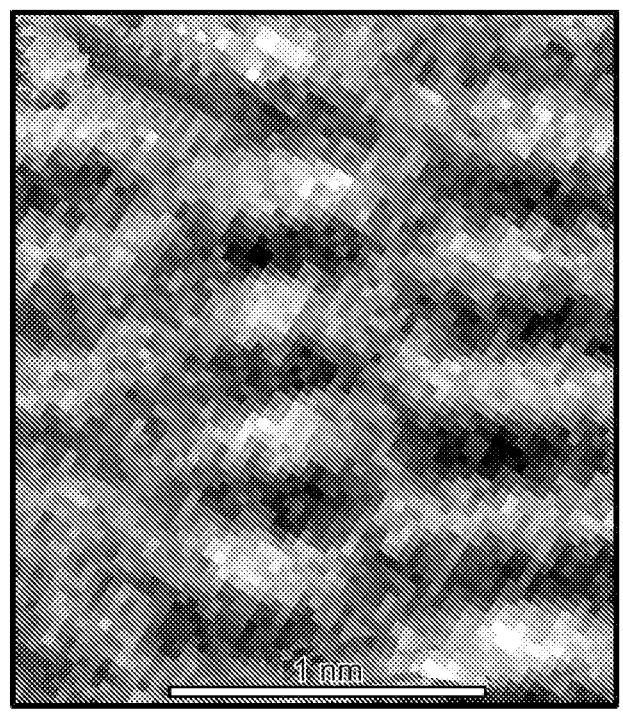
In FIG. 71D, a loop of conjoined helicoids from the cell wall is magnified. By analyzing the HRTEM image in FIG. 71D, we can see that the $sp^2$ helices at the centers of these two nearby helicoids were less than 1 nm apart.
Figure 71E:
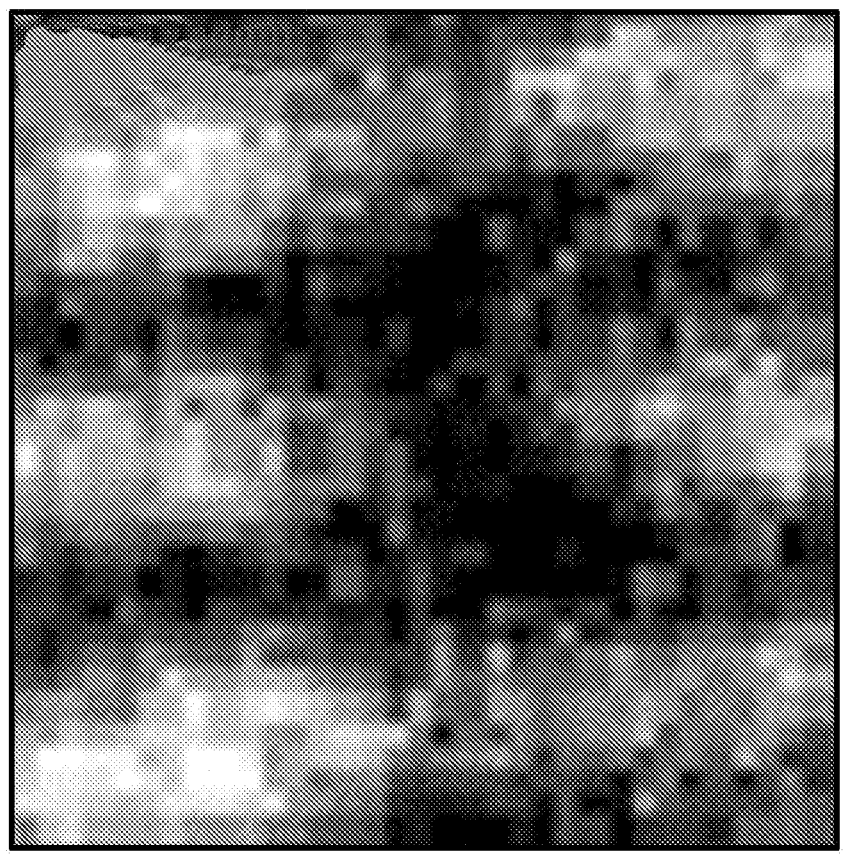
In FIG. 71E, a possible double helicoid is shown.

FIG. 71A shows a macroporous perimorphic framework from this sample. FIG. 71B shows a cross-section of the perimorphic wall. The fringe lines exhibit a distinctive "sliced" pattern, shown in FIG. 71B, with the slices cutting across the nematically aligned layers. Several "slices are indicated in FIG. 71C with a dashed line. This sliced appearance is due to a regular vertical offset in the positions of laterally adjacent fringe segments. The vertical offset corresponds to the z-displacement of a helicoidal graphenic lattice over each 180° turn around the dislocation line. In other locations, the fringe lines are blurred, as indicated by the circled region in FIG. 71C; these regions likely correspond to curved regions between screw dislocations. Some helicoid stretches across more than 10 layers of the helicoidal network. In FIG. 71D, a loop of conjoined helicoids from the cell wall is magnified. By analyzing the HRTEM image in FIG. 71D, we can see that the $sp^2$ helices at the centers of these two nearby helicoids were less than 1 nm apart. These images show that the screw dislocations at the center of the graphenic helicoids can extend across numerous layers, and that they can be arranged in xy-periodic, z-aligned arrays. Because the screw dislocations are formed from the chiral columns at the end of diamondlike seams, their density reflects the density of the diamondlike seams and the spacing between chiral columns.

Figure 72A:
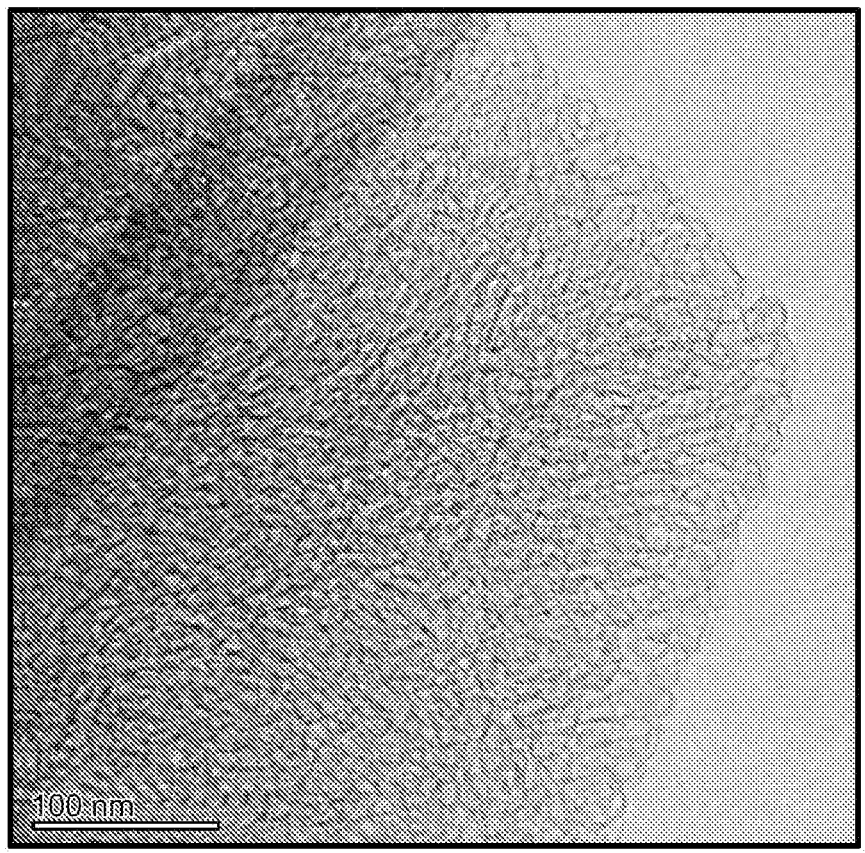
FIG. 72A is a TEM micrograph of a helicoidal x-network comprising a perimorphic framework with an equiaxed, cuboidal morphology.
Figure 72B:
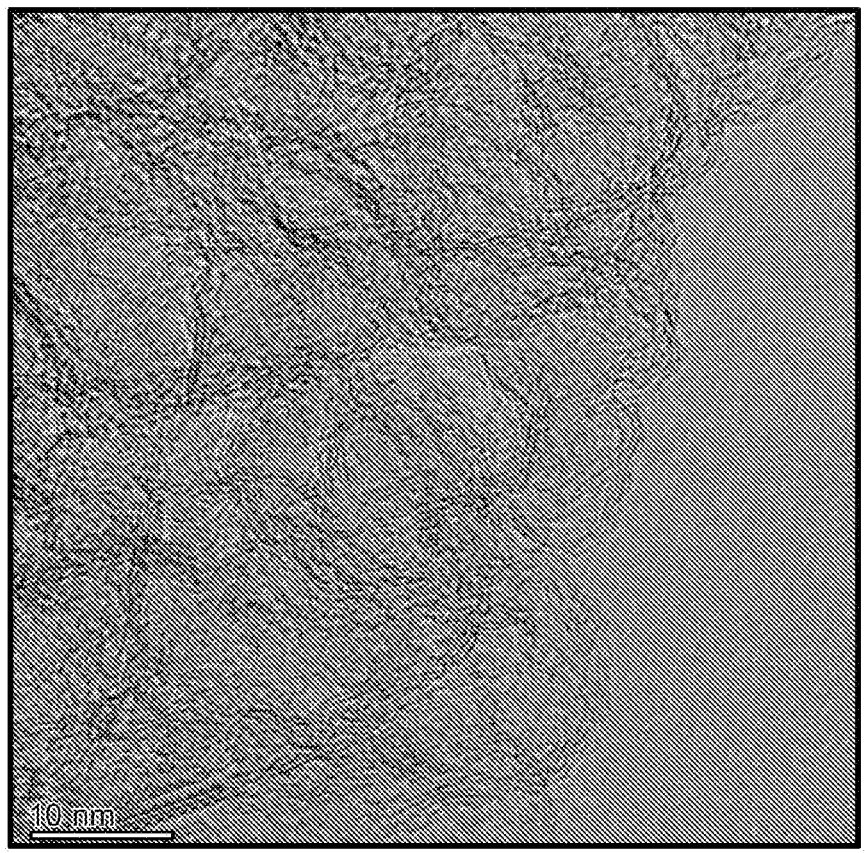
In FIG. 72B, the controlled mesoporous architecture of the perimorphic framework is shown, with a highly consistent perimorphic wall thickness.

A preferred variant of a helicoidal network is one that averages between 2 and 5 layers. FIG. 72A shows a helicoidal x-network comprising a perimorphic framework with an equiaxed, cuboidal morphology (synthesized from 1050° C. annealing of x-$sp^x$ frameworks formed via 580° C. pyrolysis of $C_3H_6$ over porous MgO template particles derived from precipitated magnesite template precursor particles). In FIG. 72B, the controlled mesoporous architecture of the perimorphic framework is shown, with a highly consistent perimorphic wall thickness. In FIG. 72B, the perimorphic wall is shown at higher magnification. It averages 2-3 layers and appears more kinked than thicker walls because of its increased flexibility. For some applications, a flexible anthracitic network may be preferred. This is an example of how synthetic anthracitic networks can be rationally engineered to have properties unavailable from natural anthracitic networks.

The various anthracitic networks described in the present disclosure share certain generic attributes as a function of their layered architecture and nematic alignment. First, they provide more interlayer coupling than non-layered architectures, and we expect system cohesion to benefit substantially from $\pi$-$\pi$ interactions. Compared to schwarzite or other non-layered geometries, we intuit that a denser, layered architecture at the nanometer-scale is preferred due to its combination of covalent and non-covalent modes of cohesion. Density reduction may be obtained by coupling this denser, layered architecture with mesoscale, density-reducing pore phases, following hierarchical design principles. Mesoporous and macroporous perimorphic morphologies constructed from helicoidal networks represent a way to obtain controllable density without sacrificing subnanometer-scale interlayer spacing.

Figure 73:
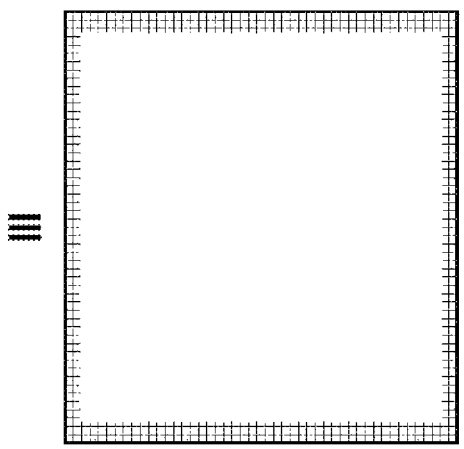
FIG. 73 is an illustration of three perimorphic frameworks demonstrating the concept of mesoscale crosslinking. The crosshatching of structures I, II, and III indicate that their molecular-scale crosslinking is the same. However, their mesoscale crosslinking varies, with I having the highest mesoscale crosslinking and III having the lowest.
Figure 73:
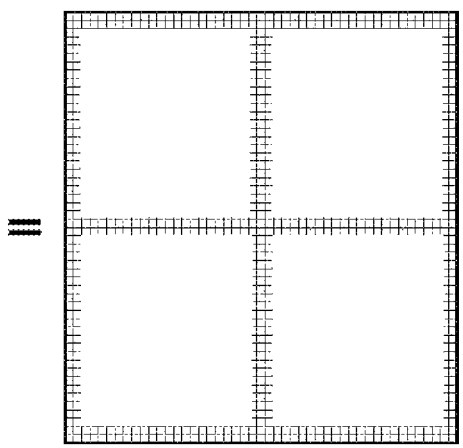
Figure 73:
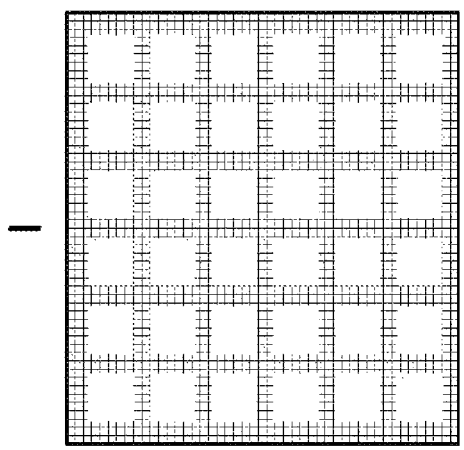

Analogous to the hierarchical approach to density reduction, a hierarchical approach to crosslinking density is also appealing. With respect to the perimorphic framework shown in FIG. 72A-72B, the system's crosslinking can be conceptualized as occurring at two distinct scales, both of which are engineerable. At the local scale, the crosslinking derives from dislocations. Local crosslinking is represented by the crosshatching in the diagram of FIG. 73. At this scale, crosslinking density is determined by dislocation density, which is in turn determined by the areal density of tectonic interfaces and linear density of interfacial zone transitions along the interfaces. However, the system also possesses mesoscale crosslinking deriving from the topology of the perimorphic wall and even more primordially from the templating surface, and its density may be modulated independently of the local crosslinking. Mesoscale crosslinking is diagrammed in FIG. 73, where mesoscale crosslinking density descends (i.e. I>II>III), while local crosslinking density is constant, as indicated in FIG. 73 by the crosshatching. The modulation of mesoscale crosslinking density (i.e. "compactness") is described in the '760 and '918 Applications.

Other benefits may be derived specifically from the helicoidal network geometry. The superelasticity and spring-like nature of graphenic helicoids has been established, with in silico studies showing a single helicoid sustaining tensile deformation of 1500% without fracture. Failure of a helicoidal network would most likely initially occur via covalent breakage of network locations, following by a plastic yielding and unravelling. The mesh-like architecture should offer good toughness properties.

Figure 74A:
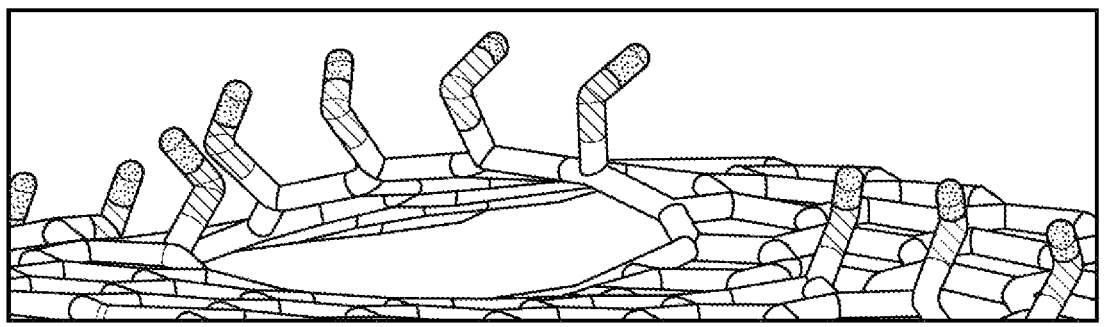
FIG. 74A is an illustration of a hydroxylated edge formed by the vertical terminus of two conjoined helicoids. The oxygen atoms are hashed, and the hydrogen atoms are dotted.

Helicoidal networks (and also $sp^x$ networks) contain numerous edges on the surface that may be easily chemically functionalized—a fundamental requirement in many applications. Both helicoidal networks and $sp^x$ networks are easily oxidized with mild oxidants (e.g. sodium hypochlorite, hydrogen peroxide) in line with the procedures described in the '580 Application. These surface edges represent the tops of the conjoined and interlocking helicoids. This is illustrated in FIG. 74A, which shows the hydroxylated edge formed by the vertical terminus of two conjoined helicoids. They hydroxyls consist of an oxygen atom (hatched in FIG. 74A) and a hydrogen atom (speckled in FIG. 74A). Additionally, $sp^x$ networks can be expected to have numerous edge sites on the surface, left behind when their higher-layer growth is terminated. Edge sites on anthracitic surfaces have the added benefit of promoting phenolic hydroxyl groups with increased thermal stability. Upon oxidation of these edges (as well as reactive basal plane sites) a rich variety of secondary phases may be applied to the surface of the anthracitic networks, including inorganic, preceramic oligomers and polymers.

Figure 74B:
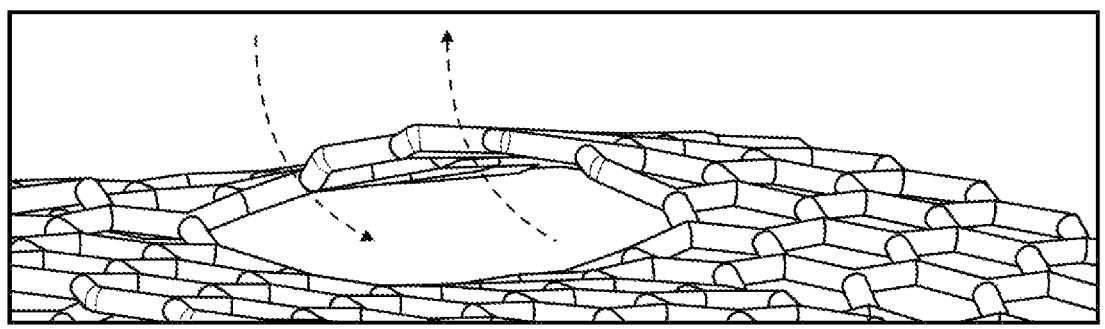
FIG. 74B is an illustration of a mouth, representing an entrance into the network's interlayer labyrinth. These mouths offer ubiquitous access points for infiltration or exfiltration of fluids, as indicated in FIG. 74B.

Another appealing surface feature of helicoidal networks is the ubiquitous presence of mouths representing entrances into the network's interlayer labyrinth. One such mouth is shown in FIG. 74B. These mouths offer ubiquitous access points for infiltration or exfiltration of fluids, as indicated in FIG. 74B. This make helicoidal networks an appealing architecture for electrodes where rapid mass transfer into and out of an interlayer pore space is desired for charging and discharging. Additionally, the expanded interlayer d-spacing observed in helicoidal networks should increase their storage capacity compared to graphitic electrodes. In particular, helicoidal networks should be highly appealing for high-rate, high-capacity battery electrodes.

In systems where the primordial level zones are longer (perhaps due to less lattice curvature), longer rows of xy-adjacent $sp^2$-$sp^2$ bonds are formed, increasing the number of xy-adjacent $sp^2$ rings between $sp^3$-grafted offset zones. This will increase the average distance between the helicoids, creating a less densely crosslinked helicoidal network. In systems where the primordial level zones are shorter (perhaps due to more lattice curvature and more frequent crisscrossing), shorter rows of xy-adjacent $sp^2$-$sp^2$ bonds are formed, decreasing the number of xy-adjacent $sp^2$ rings between $sp^3$-grafted offset zones. This will reduce the average distance between helicoids, creating a more densely crosslinked helicoidal network.

Figure 75A:
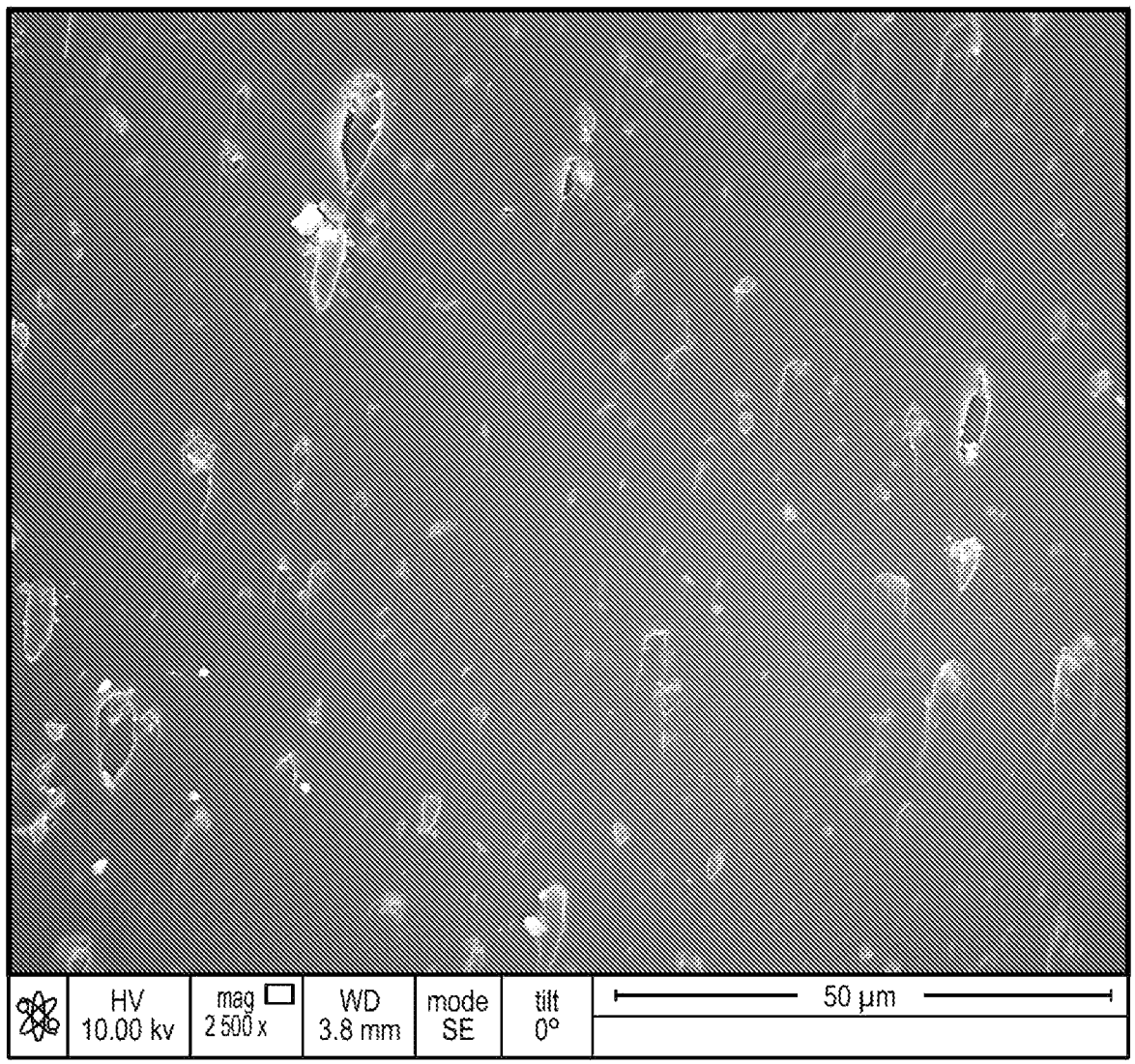
FIG. 75A is an SEM micrograph of an epoxy nanocomposite's fracture surface.

Helicoidal networks comprise the preferred variant of synthetic anthracitic frameworks. They generally exhibit superior mechanical properties compared to $sp^x$ networks. The difference is readily observed in applications. For example, FIG. 75A is the fracture surface of an epoxy specimen containing a 0.5% weight loading of an $sp^x$ network. Similar to Samples E1 and E3, each particle comprises a perimorphic framework with a sheet-of-cells morphology and an $sp^x$ network. The pyrolytic formation of these $sp^x$ networks was directed by the same hydromagnesite-derived MgO templates utilized in Samples E1 and E3. Pyrolysis of $C_3H_6$ was utilized to create a few-layer $sp^x$ network on the template particles. After extraction of the template, the singletons were lightly oxidized and dispersed into a DGEBA-type epoxy resin, which was then cured using an aliphatic amine.

Figure 75B:
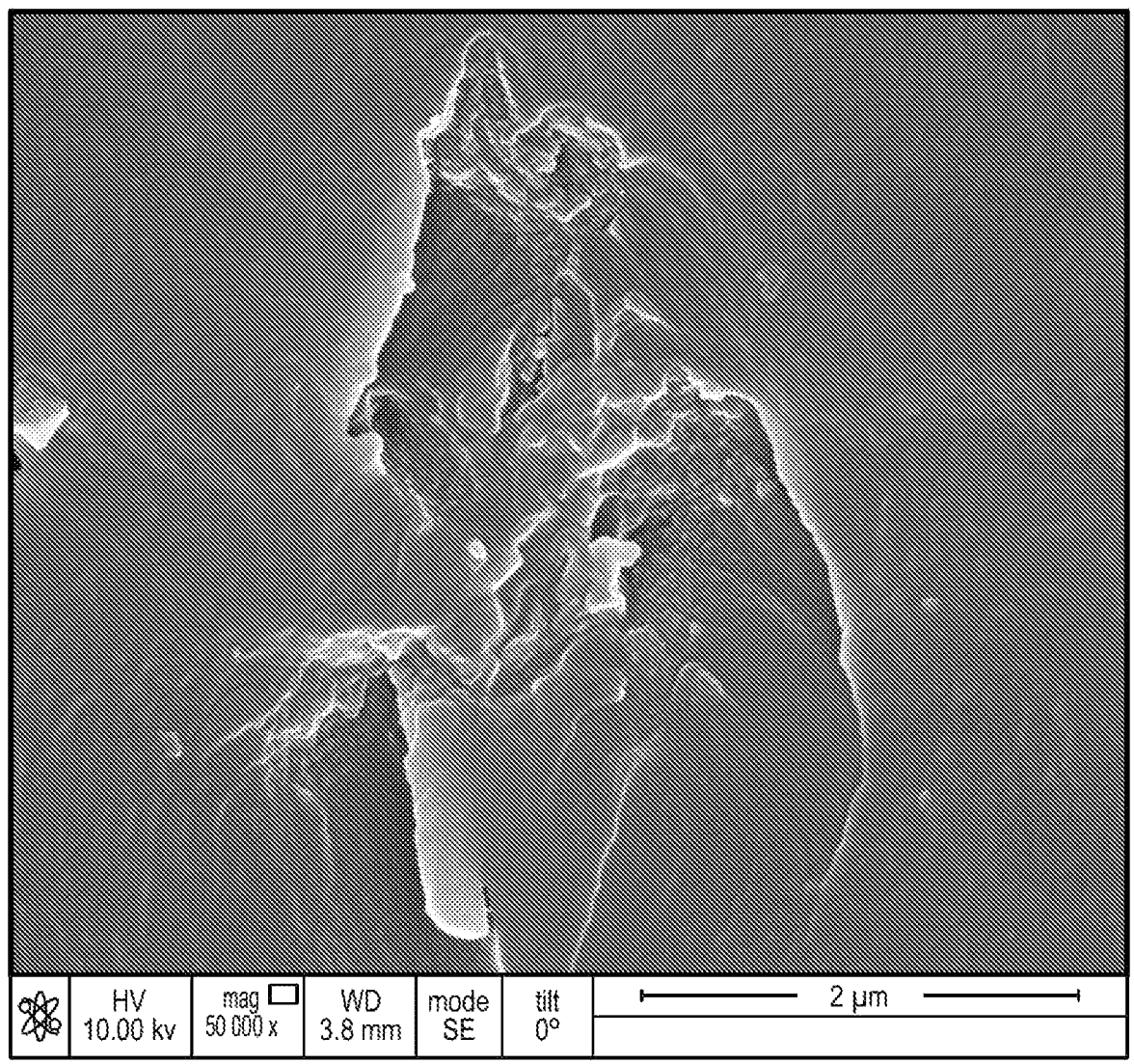
FIG. 75B is an SEM micrograph of perimorphic frameworks embedded in the epoxy fracture surface.
Figure 75C:
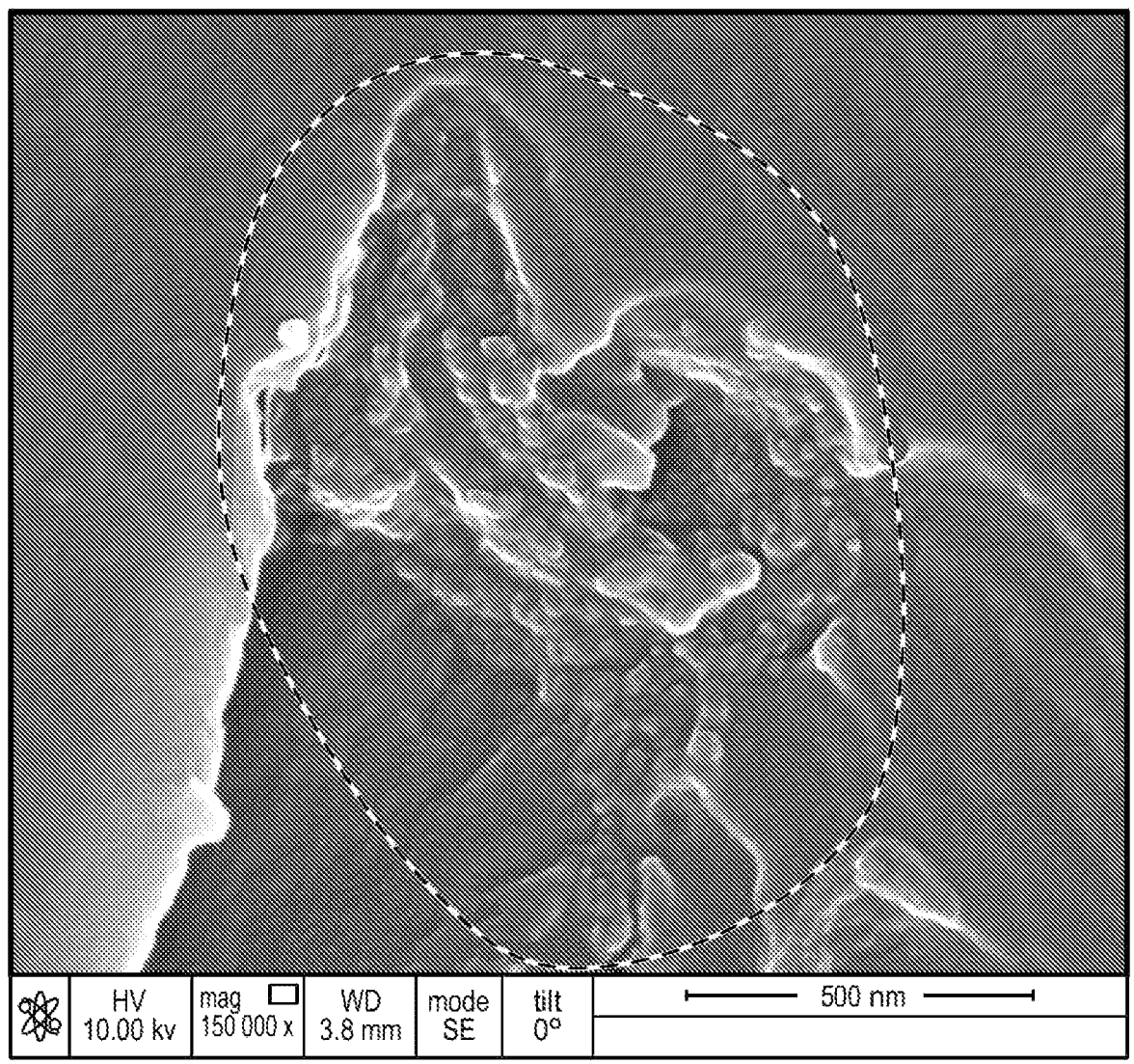
FIG. 75C is an SEM micrograph of a perimorphic framework (circled) with a sheet-of-cells morphology embedded in the epoxy fracture surface.

FIG. 75B and FIG. 75C are higher-resolution images of the same epoxy fracture surface. In FIG. 75C, a wavy cluster of sheet-like frameworks are embedded in the surrounding epoxy matrix. The cluster is circled in FIG. 75C. Close examination of the texture of the clusters reveals the nanocellular subunits within the sheet-of-nanocells particle morphology. The waviness indicates the sheets' flexibility. No significant epoxy debris was observed around the frameworks embedded throughout the fracture plane, and it appears that the fracture was at the interface between the epoxy and the frameworks.

Figure 76A:
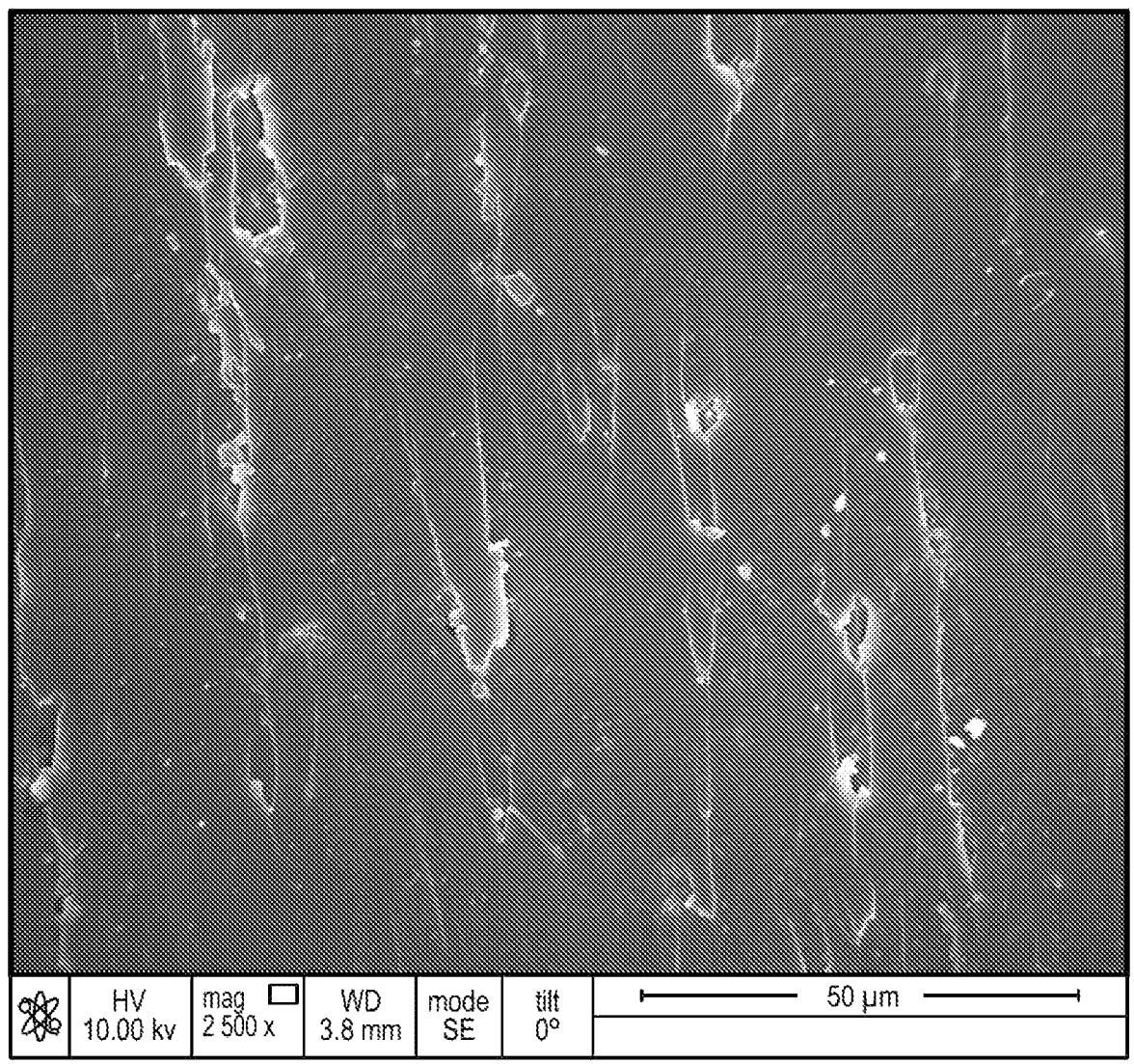
FIG. 76A is an SEM micrograph of an epoxy nanocomposite's fracture surface. The surface is covered with debris produced by explosive failure of the cured epoxy nanocomposite in the vicinity of the perimorphic frameworks.
Figure 76B:
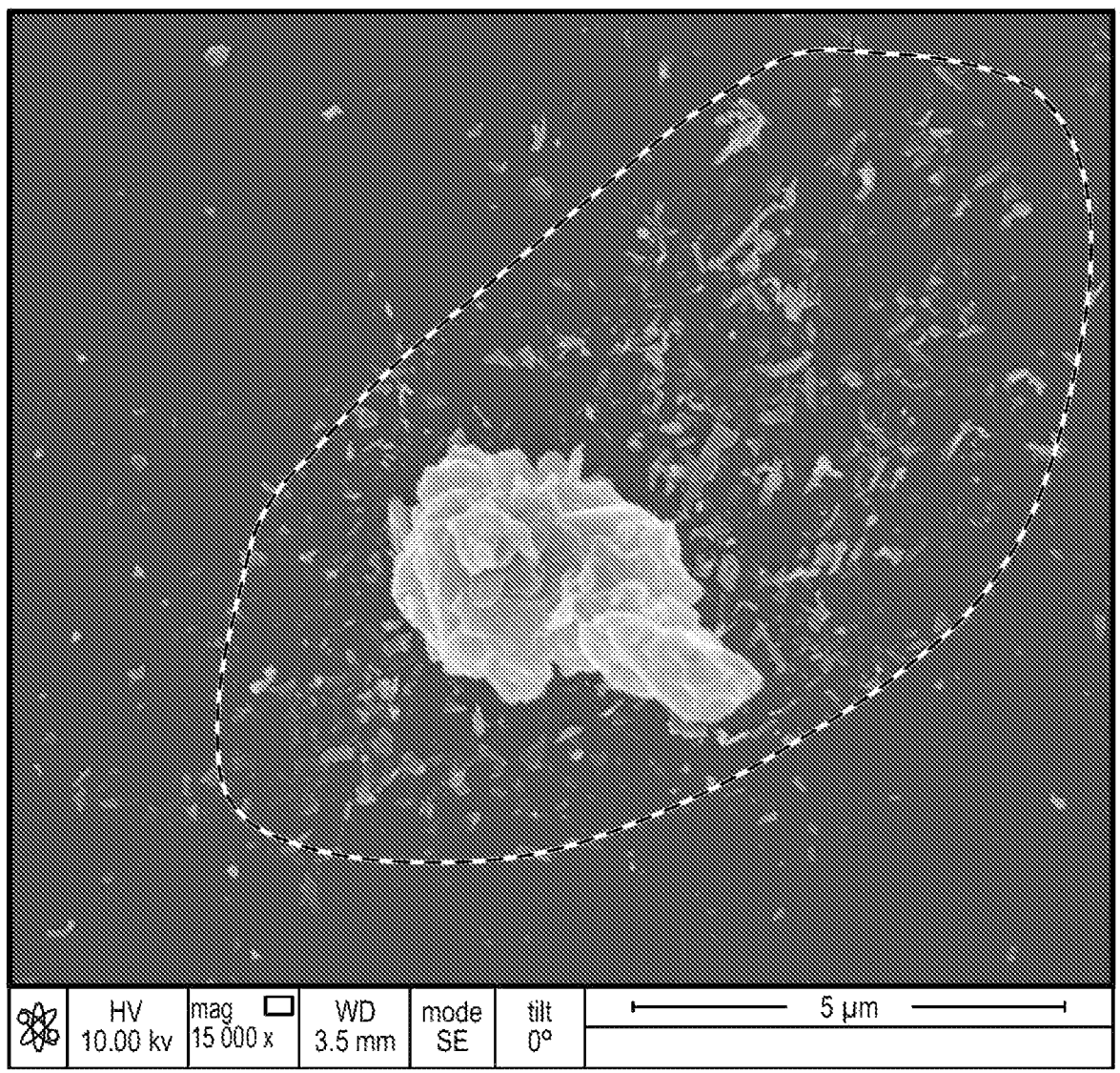
FIG. 76B is another SEM micrograph of the fracture surface in which the result of an explosive failure event is circled.
Figure 76C:
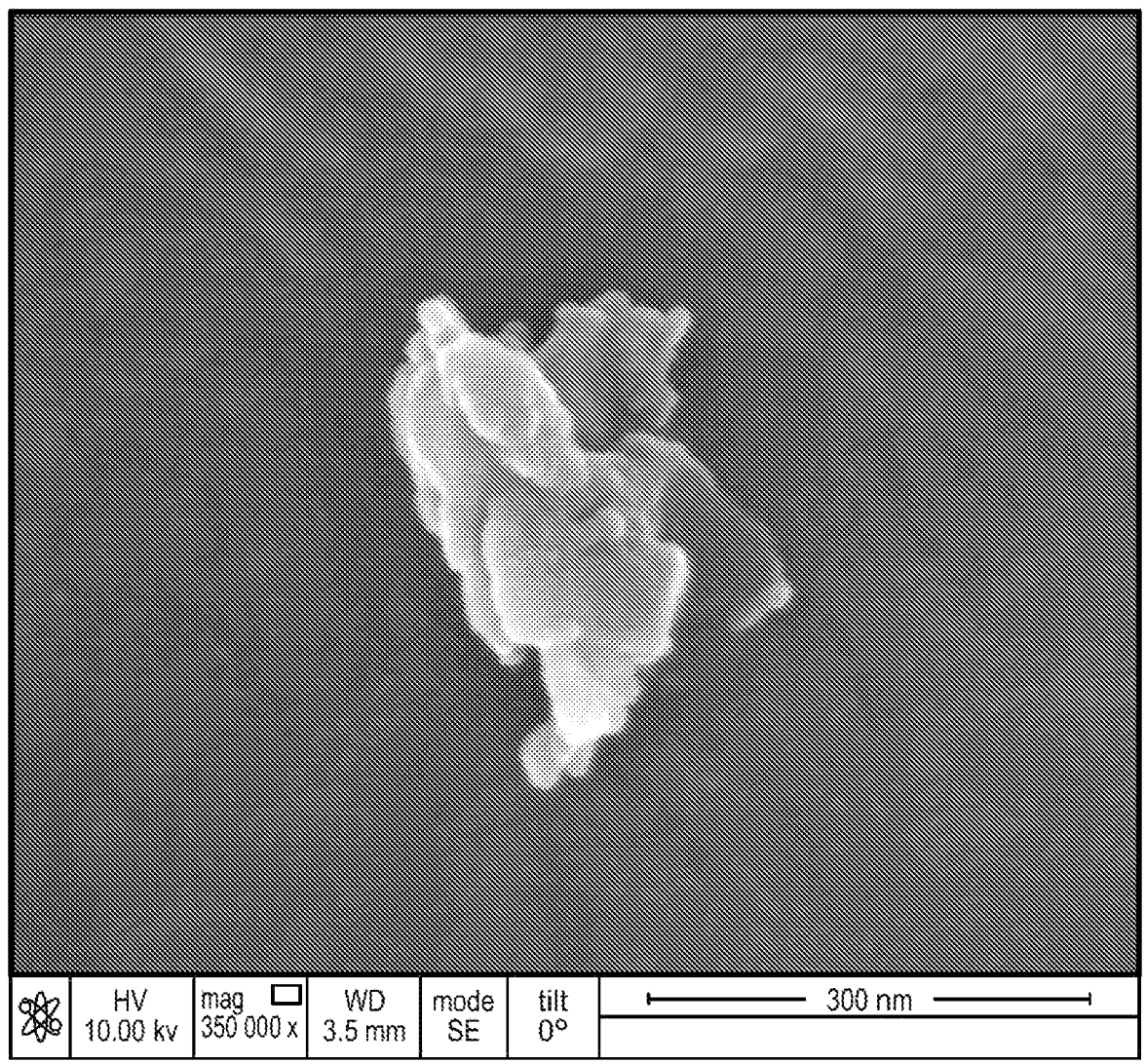
FIG. 76C is another SEM micrograph of the fracture surface, in which we can observe that the debris are fragments of epoxy, that are physically embedded in the surface.

By comparison, FIG. 76A is the fracture surface of an epoxy specimen containing a similar loading of perimorphic frameworks of the same derivation and morphology, but in this case the frameworks represent helicoidal networks, matured on the template. Unlike the clean fracture surface in FIG. 75A, the fracture surface in FIG. 76A appears to be covered with debris (the debris appears as bright spots scattered across the fracture surface). This debris was not removable from the fracture surface by any amount of cleaning with compressed air. Upon examination at higher magnification, we can deduce that the debris is produced by explosive failure of the cured epoxy nanocomposite in the vicinity of the perimorphic frameworks. In FIG. 76B, we can see the result of one such explosive failure. The perimorphic framework cannot be distinguished at the point of failure, which comprises a brightly charged composite structure, and it does not appear that the failure occurred at the interface. This point of failure and the surrounding debris field are circled in FIG. 76B. At yet higher magnification, as shown in FIG. 76C, we can observe that the fragments are fragments of epoxy, and that they are not just resting on the fracture surface but are physically embedded in the surface, explaining why they could not be removed. It was also confirmed that a corresponding debris field was present on the opposing fracture surface in the same location. This embedding of the epoxy fragments in the fracture surfaces suggests the force of these explosive failures.

This demonstrates the utility of synthetic anthracitic networks in composite applications. In the '473 Application and '843B2 Patent, the use of "cellular carbons" comprising perimorphic frameworks is shown to be advantageous compared to non-perimorphic morphologies. These applications are herein incorporated by reference. We observe in Study E that perimorphic frameworks comprising anthracitic networks may be especially advantageous in these nanocomposites.

XIII. Study F—Analysis

It was demonstrated in Experiments A through E that it is possible, via directed pyrolysis reactions, to synthesize arbitrarily large $sp^x$ and helicoidal networks. However, practical considerations might still restrict the size of the objects that could be made. To fabricate macroscopic anthracitic networks, it would be appealing to be able to fuse smaller, individual anthracitic networks. We now demonstrate how this may be done by creating a macroscopic preform comprising an assembly of distinct $sp^x$ networks (i.e. an "$sp^x$ preform"), then maturing the $sp^x$ preform to ring-connect the distinct $sp^x$ networks during maturation. In particular, we explore how static, non-native bilayers formed between the surfaces of adjacent $sp^x$ networks may become ring-connected during maturation, extending and enlarging the anthracitic network.

Figure 77:
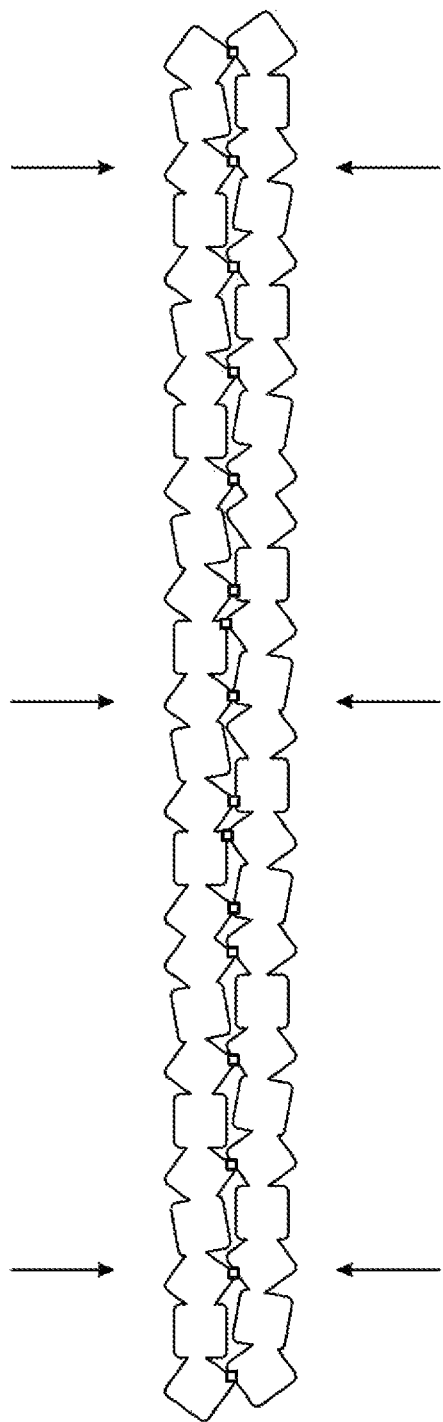
FIG. 77 is an illustration of two $sp^x$ networks being pressed together to form non-native bilayers that may be crosslinked during maturation.

We begin with two hypothetical $sp^x$ networks comprising graphenic singletons, designated $G_A$ and $G_B$. Each of these $sp^x$ networks comprises a microscopic $sp^x$ network, such as those demonstrated in Experiments A through E. We press $G_A$ and $G_B$ into contact with one another, such that some regions of their outermost surface layers are in static vdW contact. FIG. 77 is a cross-sectional representation of what this might look like for two perimorphic frameworks, like those described in Study E, possessing a sheet-of-cells morphology. Pressed together, these particles come into vdW contact at a number of sites comprising non-native bilayers (these contact sites are represented by small squares in FIG. 77). The more flexible the perimorphic walls are, and the more packable the frameworks' overall microscopic geometry, the more non-native bilayers may be created, and the more crosslinking may occur.

Figure 78:
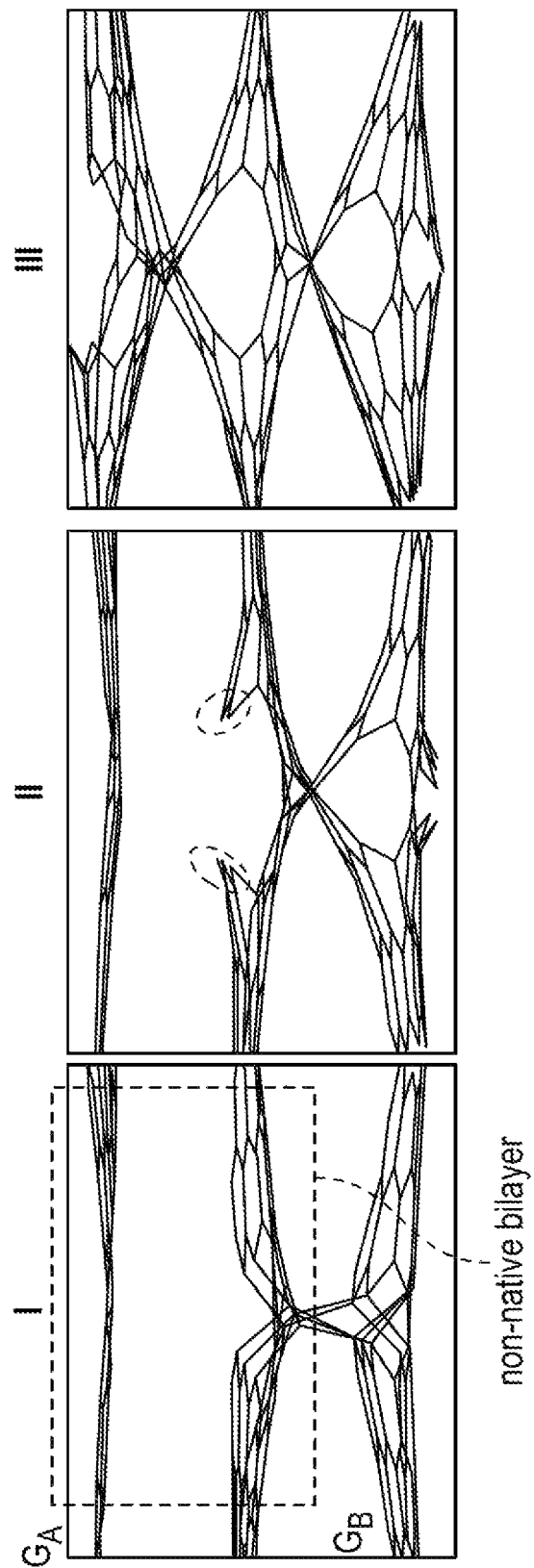
FIG. 78 is an illustration of a radical addition reaction between two $sp^x$ networks in static vdW contact, $G_A$ and $G_B$. This is represented in Frame I. The geometry of the underlying helicoids pushes $G_B$'s $sp^2$ radicals toward $G_A$, as illustrated in Frame II of FIG. 78, where the radicals are circled. A radical cascade reaction bonds $G_B$'s lines of $sp^2$ radicals with z-adjacent atoms in $G_A$, forming $sp^2$ rings. This reaction extends the helicoids across the non-native bilayer, as shown in Frame III of FIG. 78, and pushes radical-terminated edge dislocations to surfaces.

Next, we postulate an individual non-native bilayer between two $sp^x$ networks in static vdW contact, $G_A$ and $G_B$. This is represented in Frame I of FIG. 78. The outermost layer of the $sp^x$ precursor $G_A$ is represented (above in FIG. 78). This layer is in vdW contact with the outermost layer of the $sp^x$ precursor $G_B$ (below in FIG. 78). The non-native bilayer shown in Frame I includes two lines of $sp^3$ atoms in $G_B$. These $sp^3$ states, which represent the z-directional termini of diamondlike seams, are potential reaction sites during maturation.

While in static contact, the $sp^x$ networks $G_A$ and $G_B$ are heated and matured, during which the two lines of tertiary $sp^3$ atoms in $G_B$ are dehydrogenated and rehybridized, becoming $sp^2$ radicals as the underlying diamondlike seams are unzipped. The geometry of the underlying helicoids pushes $G_B$'s $sp^2$ radicals toward $G_A$, as we attempt to illustrate in Frame II of FIG. 78, where the radicals are circled. A radical cascade reaction bonds $G_B$'s lines of $sp^2$ radicals with z-adjacent atoms in $G_A$, forming $sp^2$ rings. This reaction extends the helicoids across the non-native bilayer, as shown in Frame III of FIG. 78, and pushes radical-terminated edge dislocations to surfaces.

In this way, an assembly-to-singleton or an assembly-to-assembly maturation occurs, depending on whether the $sp^x$ precursors disintegrate during maturation. However, in either scenario, a larger helicoidal network is formed that extends across the bilayer contacts of the $sp^x$ precursors. The non-native bilayers are cinched together by the helicoidal geometry. If this larger helicoidal network comprises a helicoidal assembly, its graphenic member structures are interlocked with one another in braidlike double helicoids.

Figure 79A:
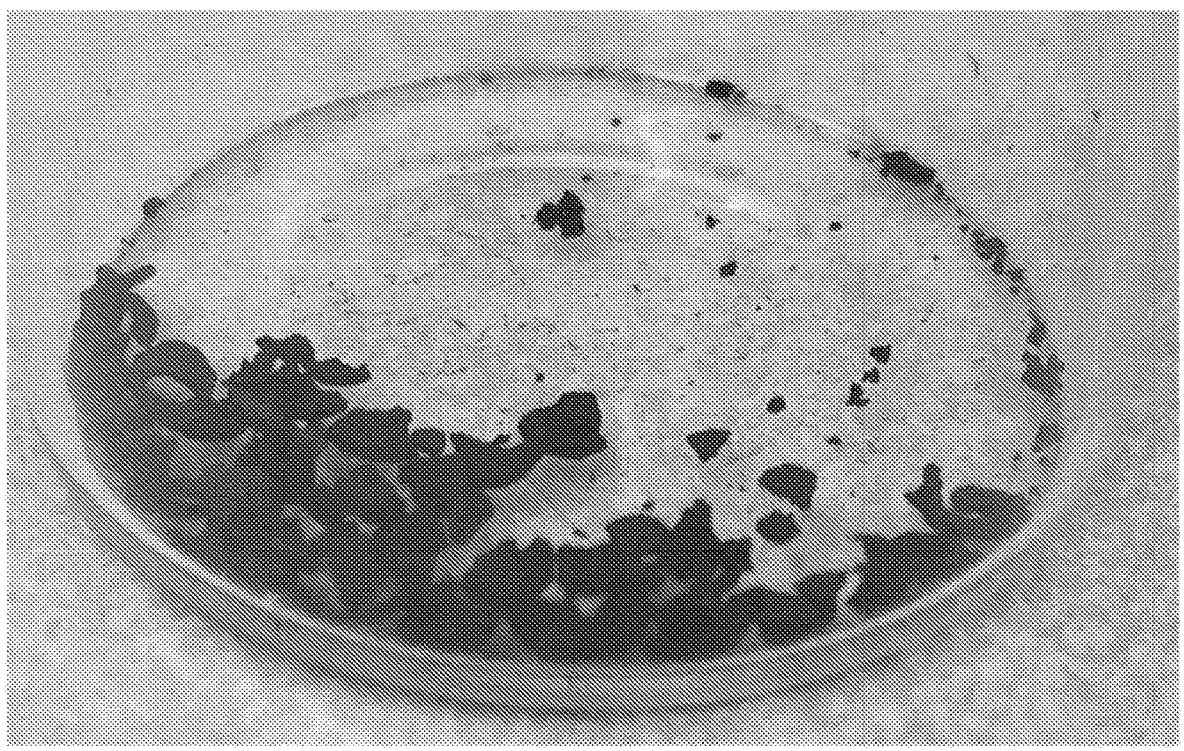
FIG. 79A is a photograph of the Sample F1 granules.

Sample F1 comprises perimorphic $x$-$sp^x$ networks with a sheet-of-cells morphology similar to the samples in Study E. As observed in Study E, these frameworks' combination of flexibility and flatness causes them to dry into hard, macroscopic granules after extraction of the template. These granules are shown in FIG. 79A. The BJH specific porosity of the Sample F1 granules (as measured during desorption) and BET surface area are shown in Table 10 below:

TABLE 10

| Sample ID | Step 1 | Step 2 | BET Surface Area (m²/g) | BJH Desorption Pore Volume (cm³/g) |
|---|---|---|---|---|
| F2 | — | — | 599 | 0.289 |
| F2 | Pressing | — | 451 | 0.079 |
| F3 | Pressing | Annealing | 233 | 0.028 |
| F4 | Annealing | Pressing | 473 | 0.248 |

Figure 80A:
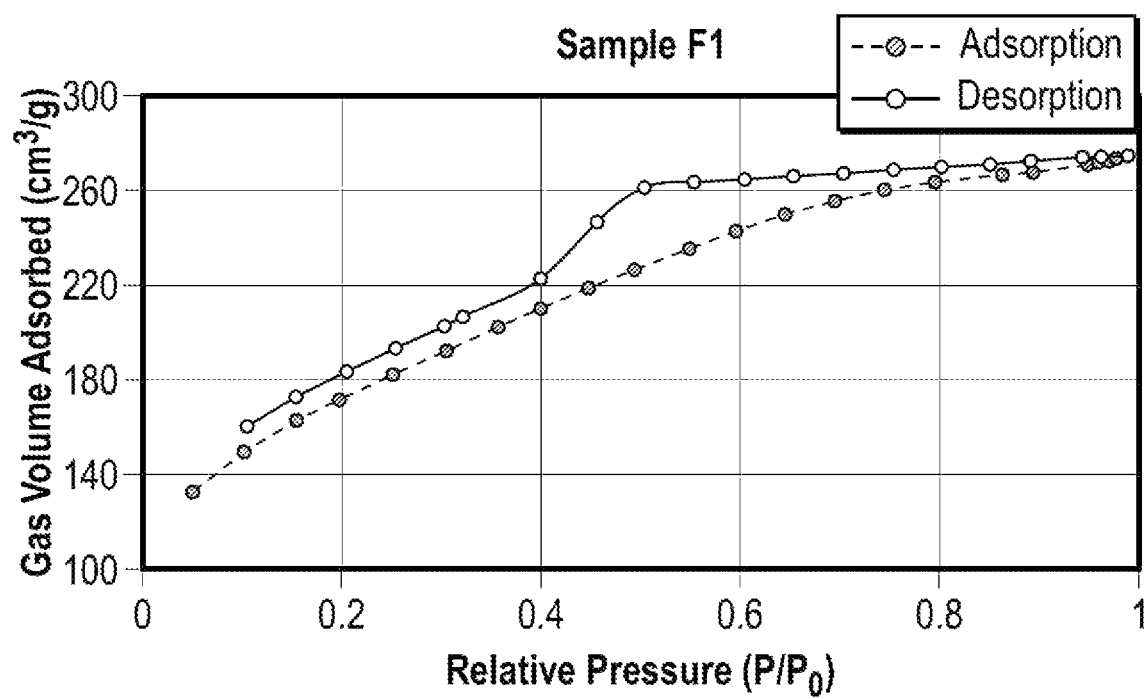
FIG. 80A is the $N_2$ adsorption-desorption isotherm for Samples F1.
Figure 81:
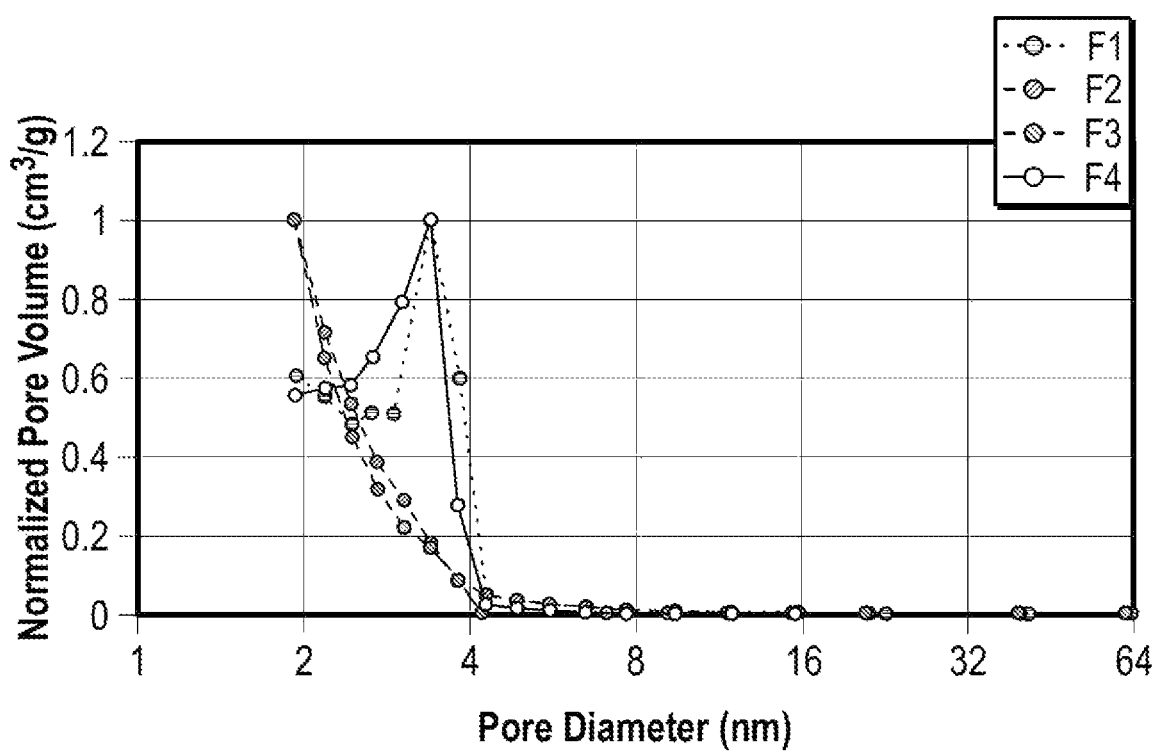
FIG. 81 is the pore distribution chart for Samples F1-F4.
Figure 82A:
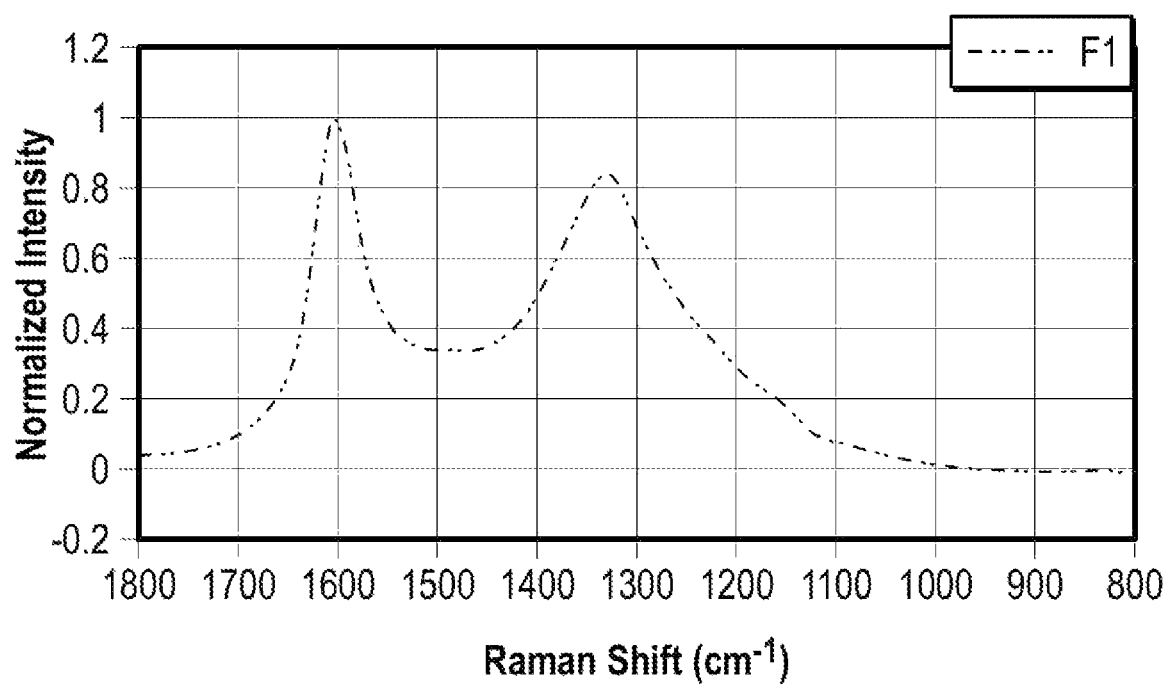
FIG. 82A is the Raman spectrum of Sample F1.
Figure 82B:
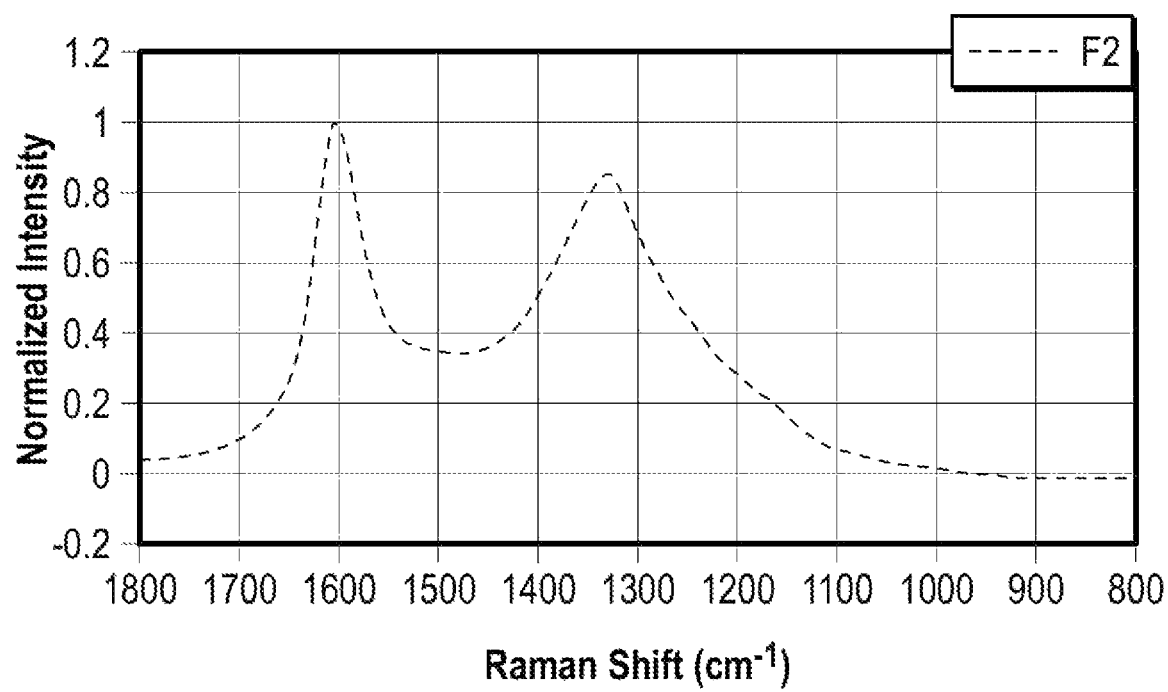
FIG. 82B is the Raman spectrum of Sample F2.
Figure 82C:
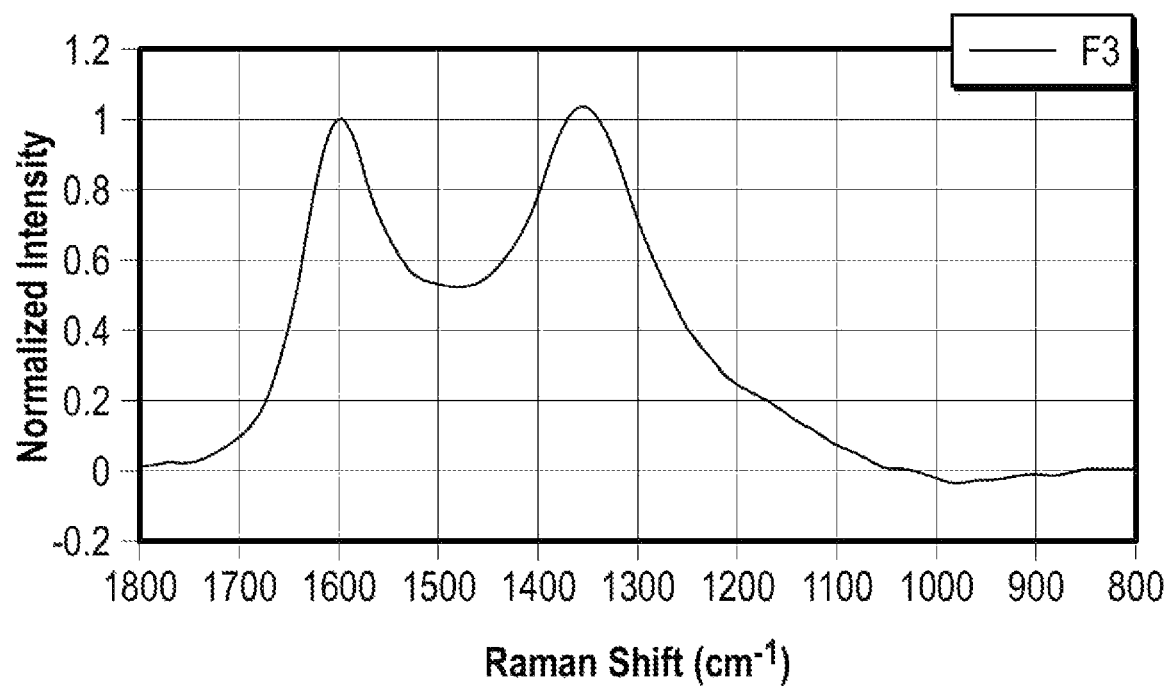
FIG. 82C is the Raman spectrum of Sample F3.
Figure 82D:
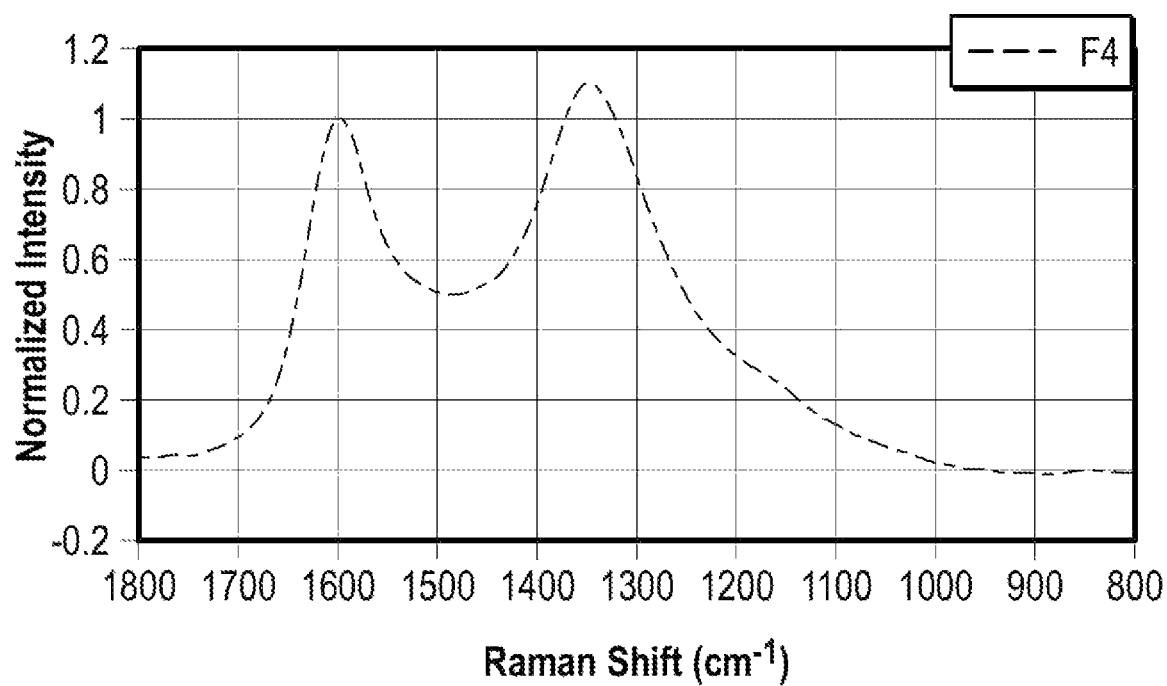
FIG. 82D is the Raman spectrum of Sample F4.

The BJH of Sample F1 was 0.289 cm³g⁻¹, and the BET specific surface area measured, also shown in Table 10, was 599 m²g⁻¹. The Sample F1 adsorption-desorption isotherm is shown in FIG. 80A, and the pore size distribution is shown in FIG. 81. The pore distribution chart shows a phase of mesopores in the size range of 3 to 4 nm, with a peak at 3.4 nm.

Figure 79B:
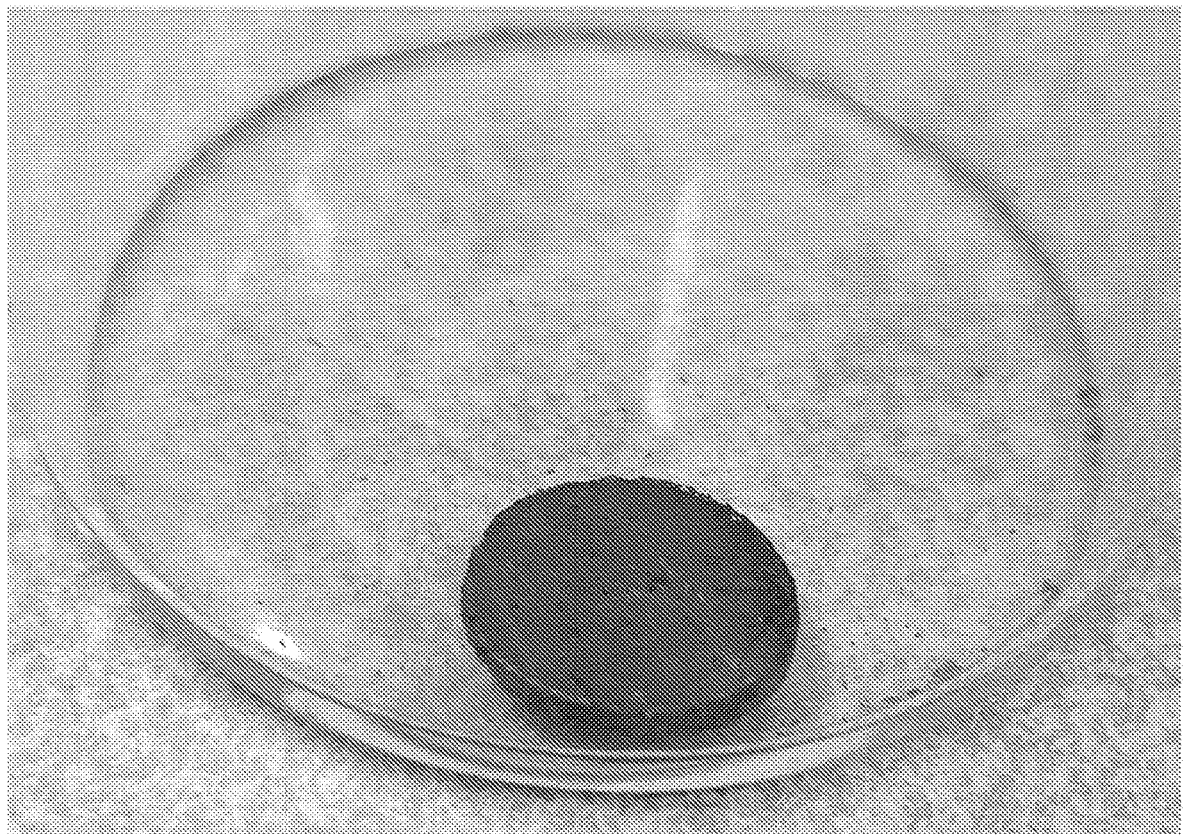
FIG. 79B is a photograph of the Sample F2 pellet.
Figure 80B:
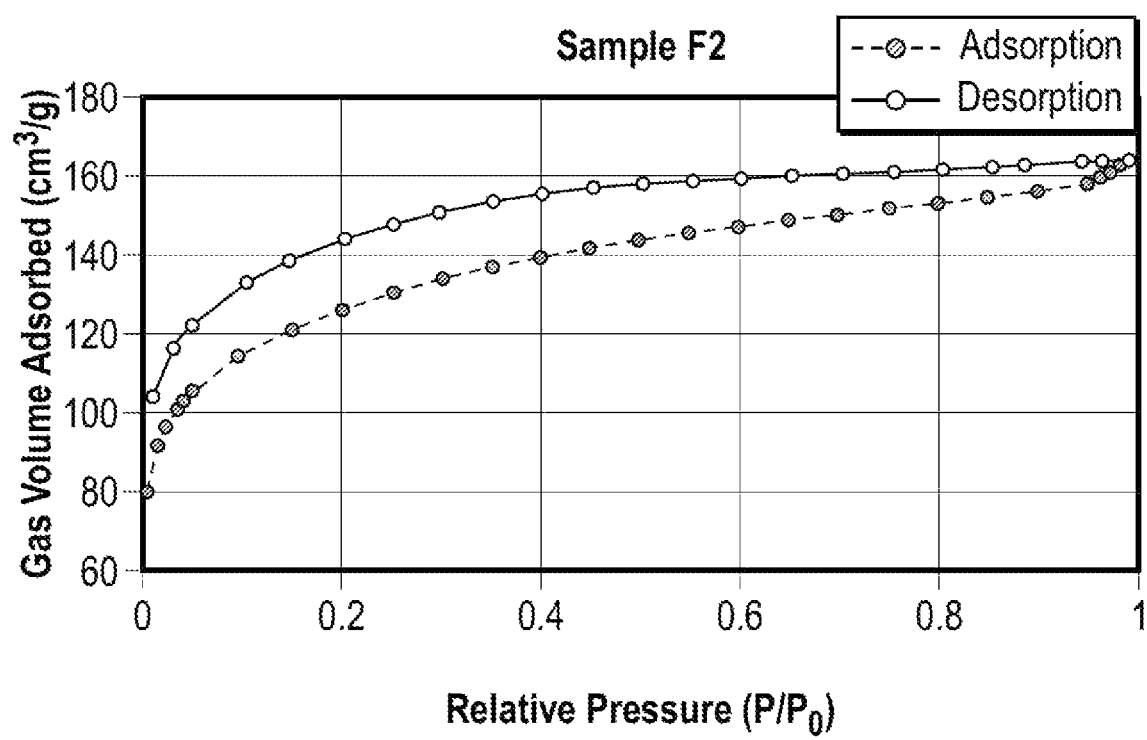
FIG. 80B is the $N_2$ adsorption-desorption isotherm for Sample F2.

Sample F2 comprises a pellet shown in FIG. 79B made from pressing the Sample F1 granules. Pressing these granules pushed the sheet-like frameworks further together, removing the majority of the interstitial pores between frameworks. This densification increases the alignment and contact area of the frameworks, creating a vdW assembly. The densification is reflected in Sample F2's reduced porosity of 0.079 cm$^3$g$^{-1}$ and surface area of 451 m$^2$g$^{-1}$, as shown in Table 10. The Sample F2 adsorption-desorption isotherm is shown in FIG. 80B, and the pore size distribution is shown in FIG. 81. The reduced specific porosity of Sample F2 is accompanied by an elimination of most of the mesopores in the range of 3 to 4 nm and an increase in the mesopores in the 2 to 2.5 nm, demonstrating compaction and deformation of the perimorphic walls of the cellular subunits. The increased formation of non-native bilayers, and associated vdW cohesion, causes pelletization, as observed in FIG. 79B. A 4-pt conductivity probe was used to measure the surface resistivity of the sample, which was 16 Ω/sq.

Figure 80C:
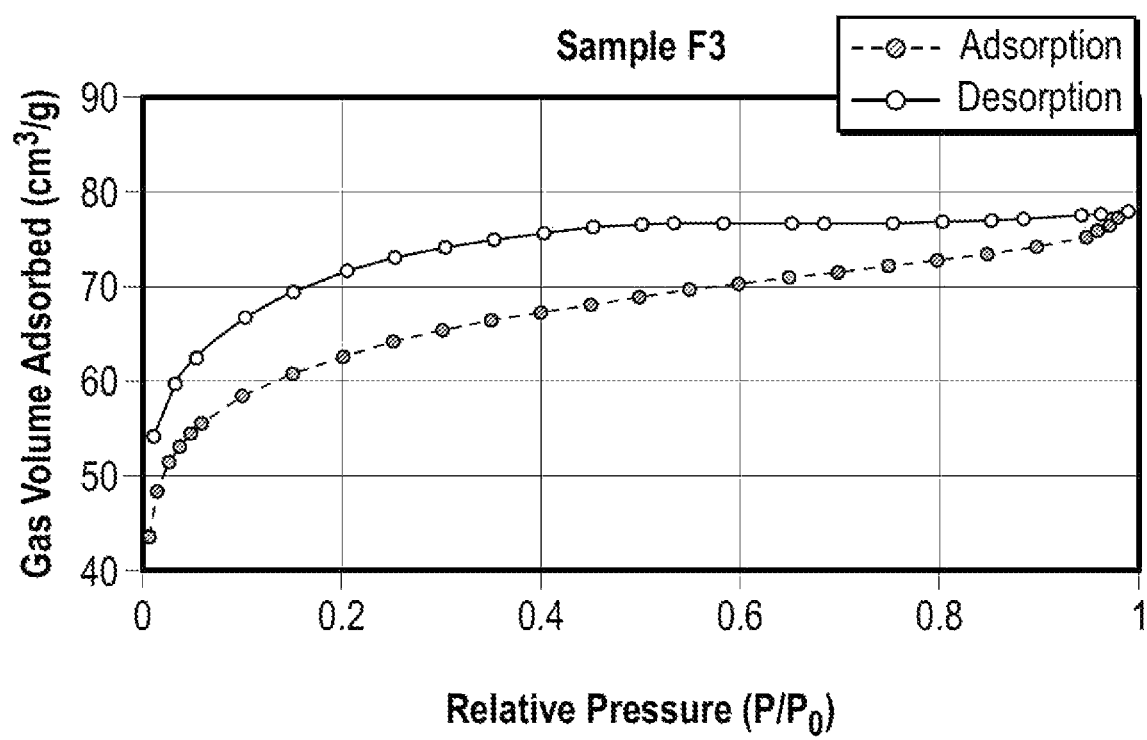
FIG. 80C is the $N_2$ adsorption-desorption isotherm for Sample F3.

Sample F3 comprises the Sample F2 pellet after being annealed at 1050° C. for 30 minutes. During annealing, the specific porosity and specific surface area is reduced to 0.028 cm$^3$g$^{-1}$ and 233 m$^2$g$^{-1}$, respectively, as shown in Table 10. This represents a 65% reduction in the pore volume. The pellet thickness is reduced by 6.7%. Assuming an isotropic reduction the pellet's overall shrinkage would only be 19%. Together, the 65% reduction in pore volume, as measured by N$_2$ adsorption, (FIG. 80C is the adsorption-desorption isotherm for Sample F3), and the pellet's shrinkage of only 19%, indicate that some of the pore structures have been sealed with respect to the N$_2$ gas during adsorption.

This indicates that, during maturation, the lines of sp$^2$ ring connections formed between the layers at bilayer contacts not only cinch the non-native bilayers together, but have a zipper-like effect, drawing together surrounding regions of the layers. This zipping effect occurs via the same mechanism at both inter-network and intra-network non-native bilayers. The zipped regions cause bottlenecking of a fraction of the mesopores (i.e. pores over 2 nm) behind micropores (i.e. pores under 2 nm), as shown in the pore distribution in FIG. 81. These mesopores become inaccessible to N$_2$. This indicates the formation of a macroscopic helicoidal x-network. This is corroborated by Sample F3's reduced surface resistivity of 0.06 Ω/sq—a 2 to 3 order of magnitude reduction from Sample F2. This reflects the sp$^3$-to-sp$^2$ rehybridization associated with maturation, an elimination of junction resistance (due to transport requiring interlayer tunneling) between microscopic anthracitic networks, and the associated formation of a macroscopic x-carbon.

Figure 80D:
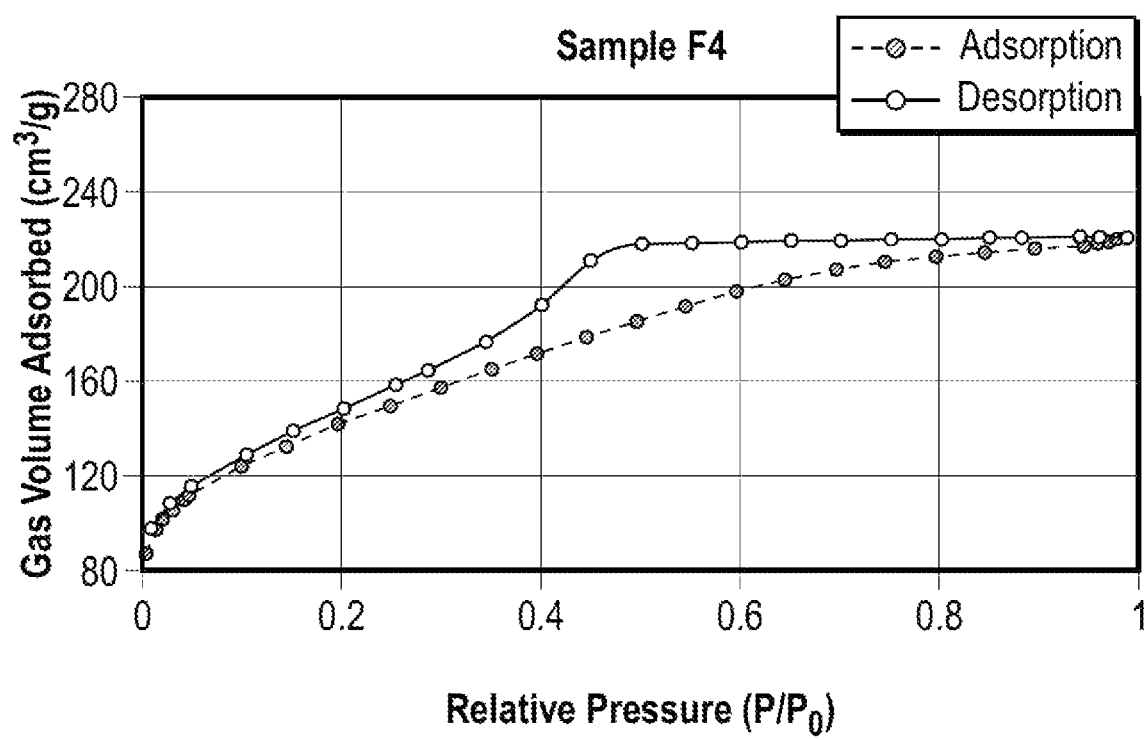
FIG. 80D is the $N_2$ adsorption-desorption isotherms for Sample F4.

Sample F4 comprises the Sample F1 granules after a two-step sequence of annealing and then pressing (in that sequence). Unlike Sample F2, Sample F4 did not comprise a pellet—despite having been pressed under the same conditions as Sample F3, the annealed granules would not form a pellet. The BJH specific porosity and BET specific surface area for Sample F4 was 0.249 cm$^3$g$^{-1}$ and 473 m$^2$g$^{-1}$, respectively, as shown in Table 10. The Sample F4 adsorption-desorption isotherm is shown in FIG. 80D, and the pore size distribution is shown in FIG. 81.

Sample F4 did not form a pellet because maturation caused the anthracitic networks to rigidify (as observed in Study E) prior to pressing them together. In other words, the annealed granules that were pressed in Procedure F4 had already matured into macroscopic, equiaxed helicoidal x-networks. The granules were densified and broken during pressing, so Sample F4 had a mixed granular-powdery consistency. However, the rigidified perimorphic walls could not obtain adequate vdW contact and cohesion, so the pressed system was not pelletized like Sample F2. Additionally, they were not collapsed to the same degree during pressing, as evidenced by the retention of the 3 to 4 nm mesopores of Sample F1.

Raman spectra of Samples F1, F2, F3 and F4 averaged over 16 points are shown in FIG. 82A, FIG. 82B, FIG. 82C, and FIG. 82D, respectively, for the range of the G$_u$ and D$_u$ peaks (no 2D peak feature was observed). The Raman spectra for the Sample F1 powder and Sample F2 pellet are very similar to each other, indicating that pelletization of the granules caused no changes in the bonding structure. The spectra for the Sample F3 pellet and the Sample F4 powder are also similar, although Sample F4 exhibits a somewhat higher I$_{D_u}$/I$_{G_u}$ peak intensity ratio. This is likely due to the breakage of the graphenic structures that must occur for the macroscopic anthracitic granules to be densified in the press. In other words, the failure of the helicoidal networks is associated with breakage of the graphenic sp$^2$ ring structure and conversion of sp$^2$ interior atoms to sp$^2$ edge atoms.

Figure 83:
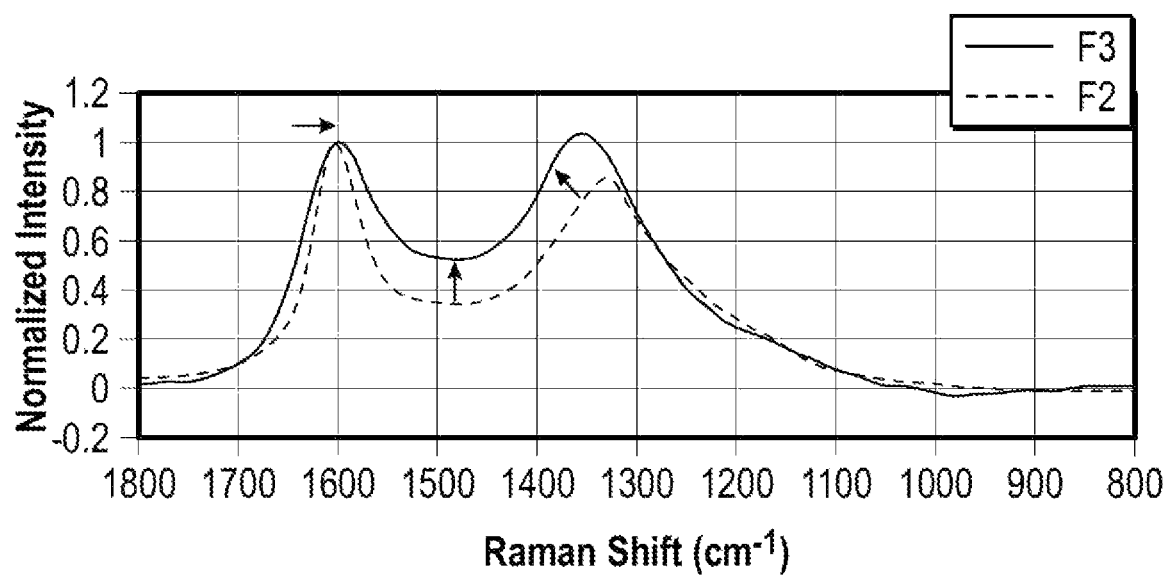
FIG. 83 illustrates the Raman spectral changes associated with maturation of the Sample F2 pellet into the Sample F3.

FIG. 83 shows the overlay of the Sample F2 and Sample F3 spectra. The spectral changes associated with maturation are indicated via black arrows. As we established in Study E, the D peak of mature, helicoidal networks produced from sp$^x$ precursors is deinterpolated by the proliferation of sp$^2$ edge states and the reduction in sp$^3$ edge states. The trough increases with the increased lattice distortion of the helicoidal networks. The interpolated D$_u$ peak positions in Samples F1 and F2 indicate the presence of sp$^3$ states associated with diamondlike seams. Based on the D$_u$ peak position of 1331 cm$^{-1}$, the frameworks from Sample F1 and Sample F2 comprise highly grafted x-sp$^x$ precursors. By comparison, the D$_u$ peak positions of Samples F3 and F4 are above 1348 cm$^{-1}$ and fall into the D band's normal range under 532 nm Raman excitation. As such, Sample F3 and F4 comprise highly mature, helicoidal x-networks.

Figure 84A:
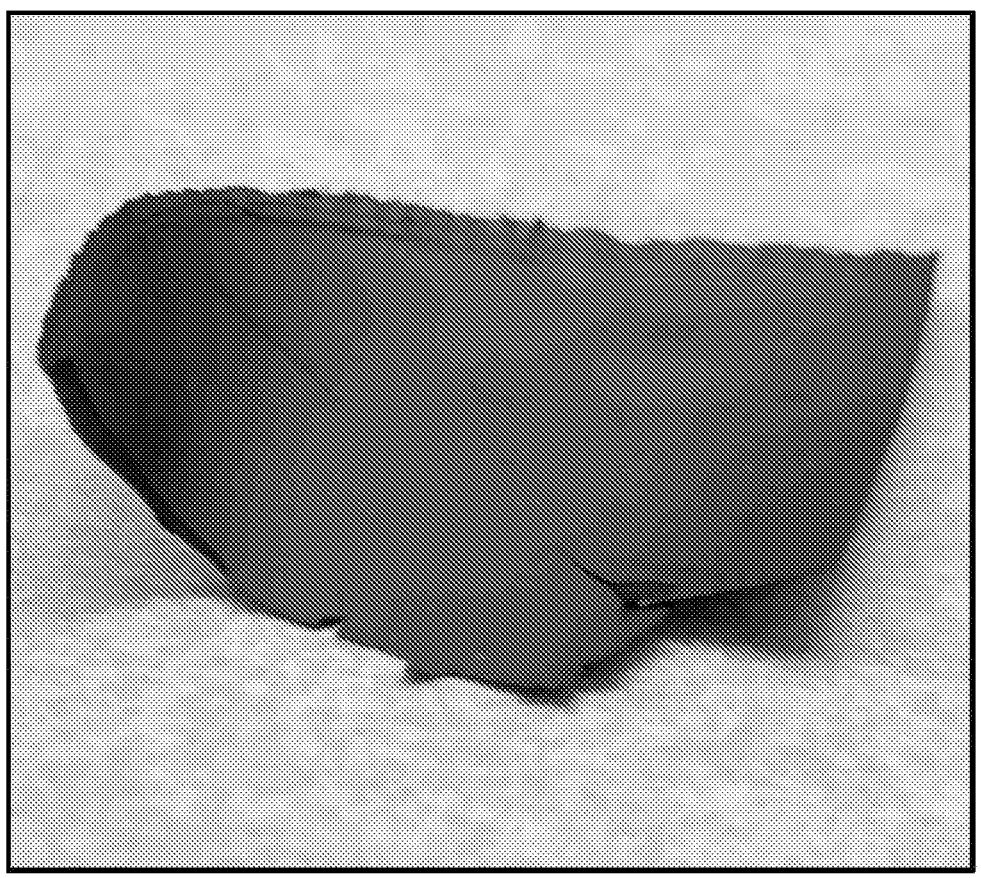
FIG. 84A is a photograph of a buckypaper.
Figure 85A:
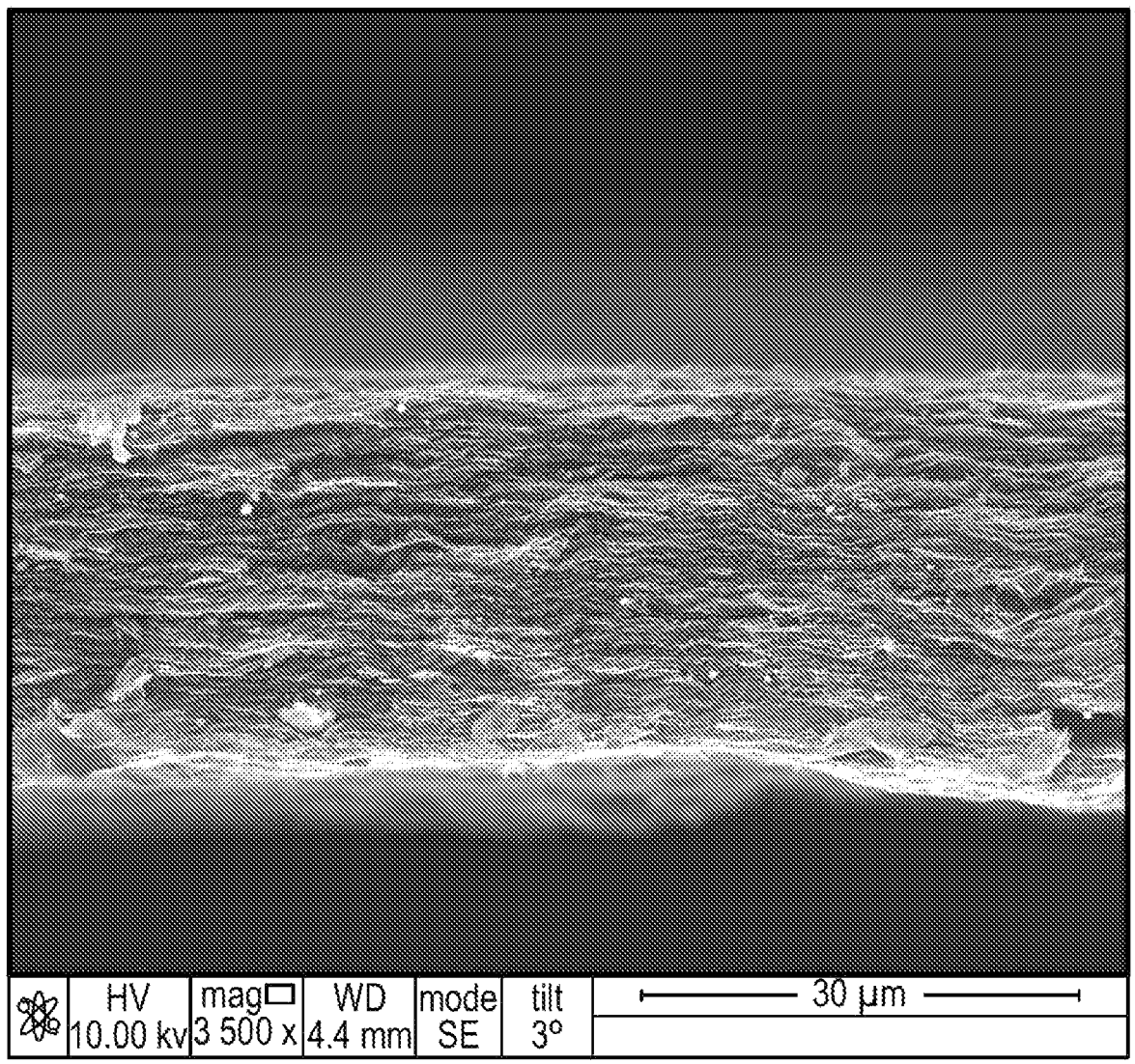
FIG. 85A is an SEM micrograph of the buckypaper's cross-section.
Figure 85B:
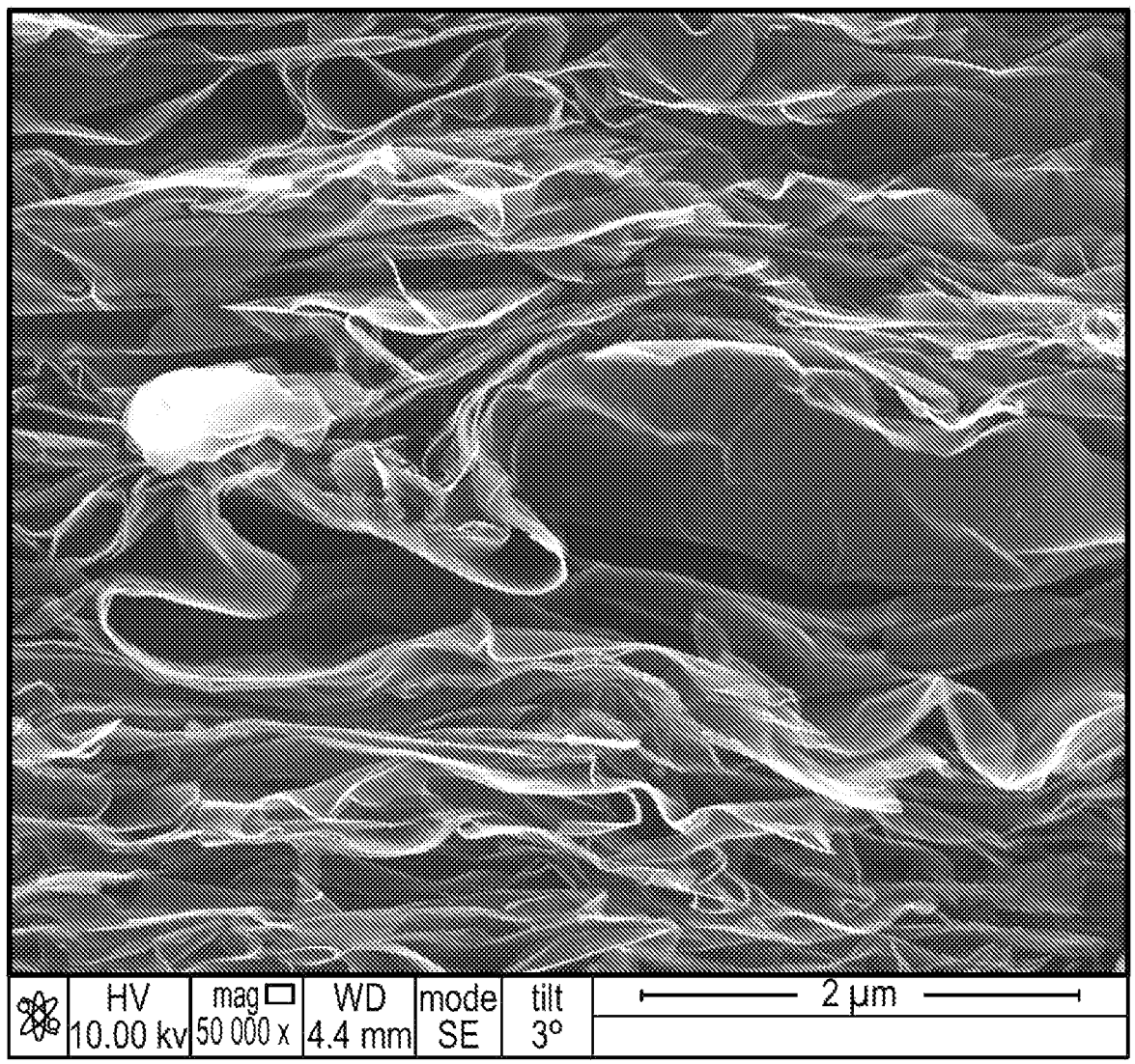
FIG. 85B is an SEM micrograph showings the collapsed perimorphic frameworks comprising the buckypaper.
Figure 85C:
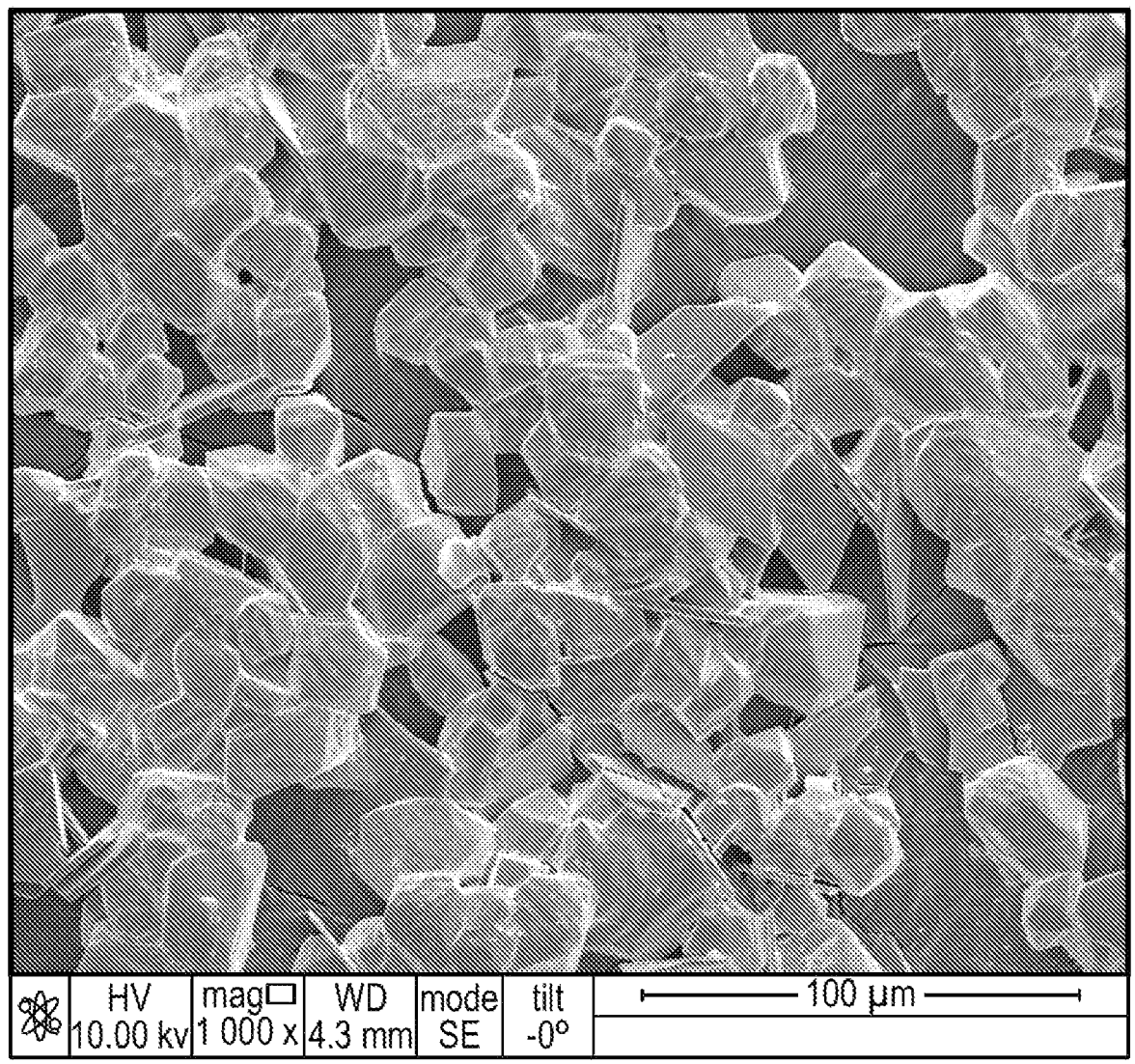
FIG. 85C is an SEM micrograph of the $K_2CO_3$ template.

Sample F5 is another example of a flat macroform, comprising a helicoidal network, being constructed from flat microforms. To fabricate Sample 5, non-compact perimorphic frameworks with hollow architectures similar to diagram III of FIG. 73 were vacuum-filtered. This collapsed the frameworks, creating a buckypaper of sp$^x$ networks. Buckypapers are thin, paper-like vdW assemblies made from filtration of flexible carbon nanomaterials like graphene nanoplatelets or nanotubes that may be useful in numerous applications, including energy storage, filtration, and structural composites. The sp$^x$ networks were grown on a powder comprising K$_2$CO$_3$ microcrystals with large, atomically flat facets. FIG. 84A is an image of the freestanding buckypaper macroform. FIG. 85A is an SEM micrograph of the entire cross-section of the macroform. FIG. 85B is a magnified SEM image showing the individual, collapsed frameworks comprising the microforms. FIG. 85C is an SEM micrograph of the K$_2$CO$_3$ microcrystals with large, atomically flat facets.

Figure 84B:
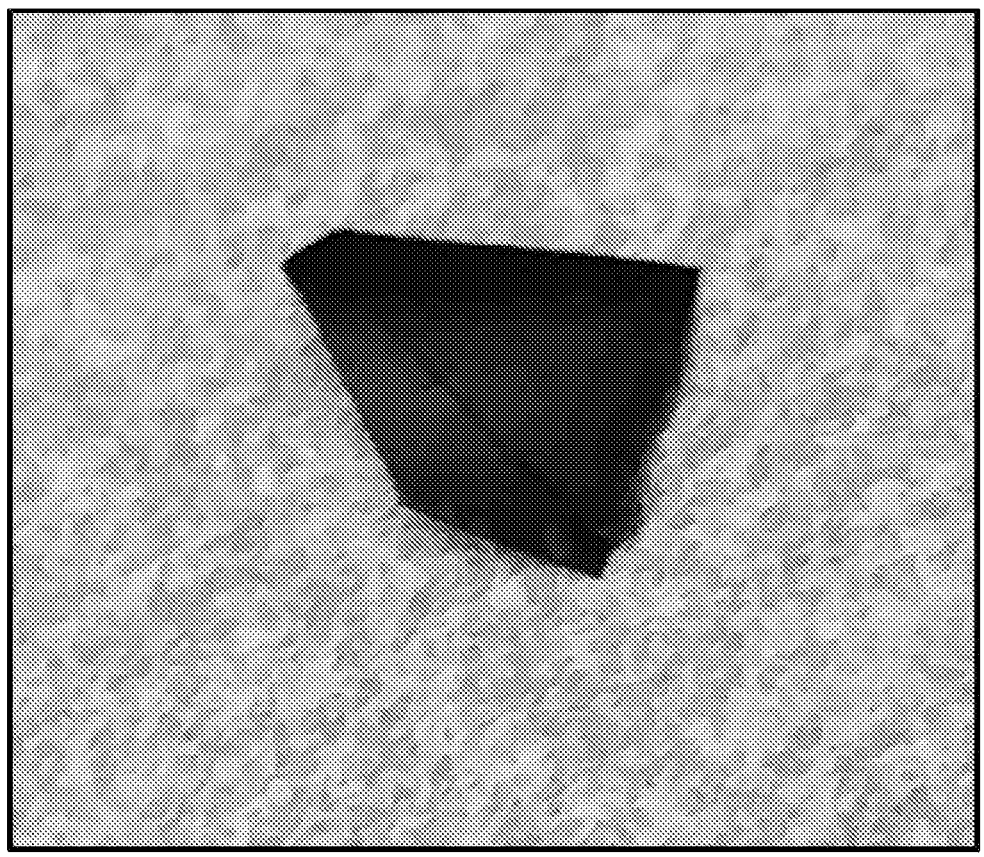
FIG. 84B is a photograph of a cutting of the buckypaper.
Figure 86A:
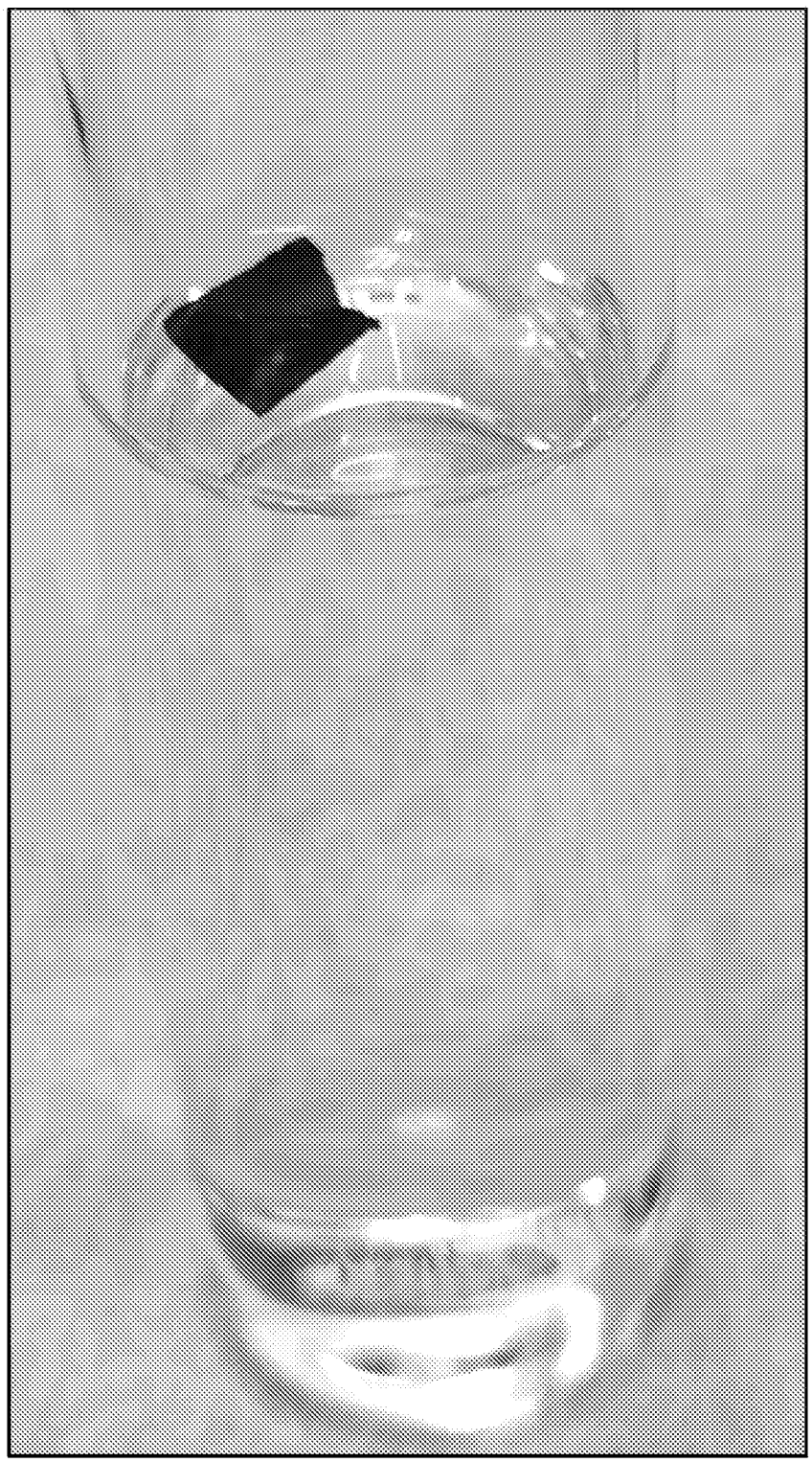
FIG. 86A is a photograph of an unannealed buckypaper immersed in solvent. The buckypaper is initially intact
Figure 86B:
FIG. 86B is a photograph of the unannealed buckypaper as it swells in the solvent.
Figure 86C:
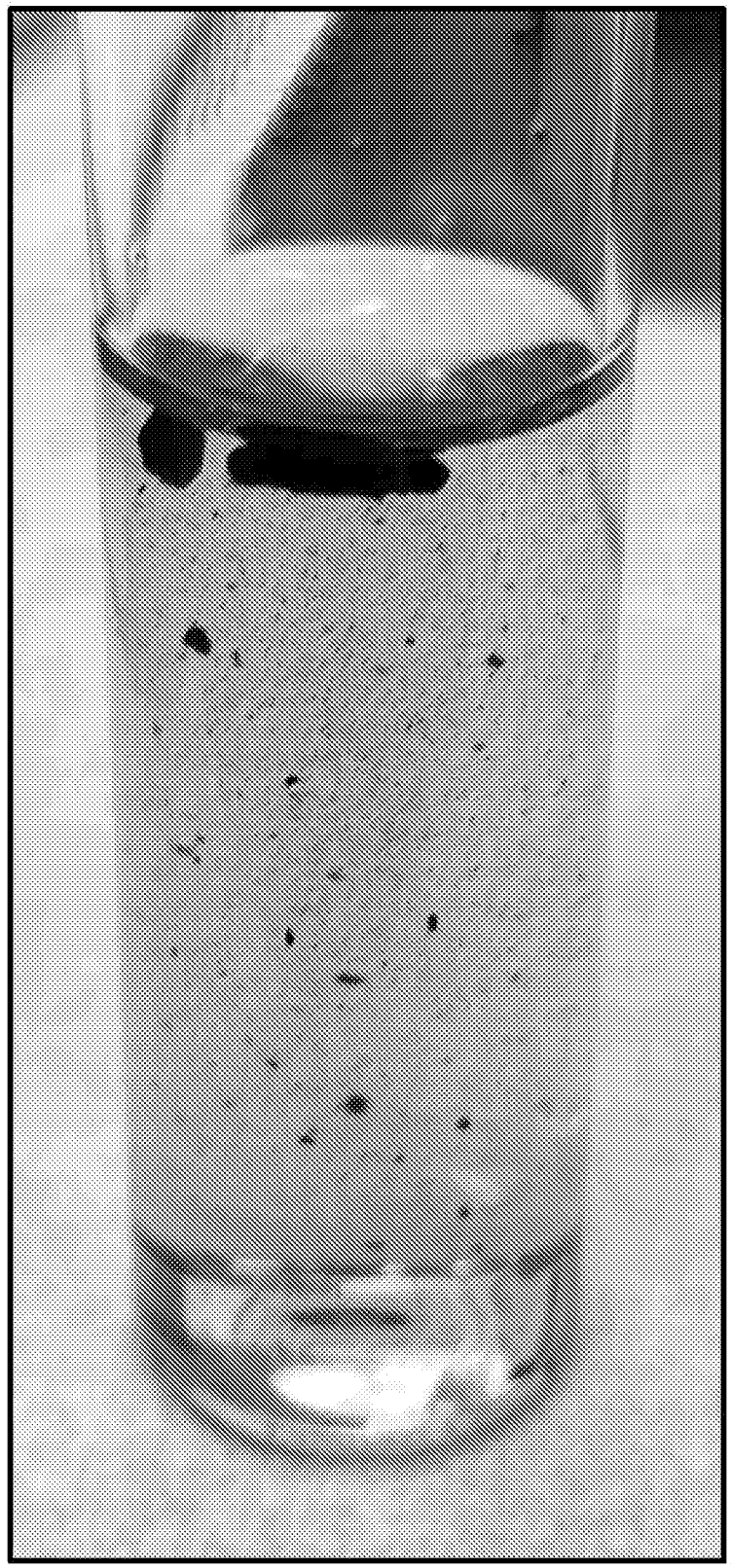
FIG. 86C is a photograph of the unannealed buckypaper disintegrating in solvent.
Figure 86D:
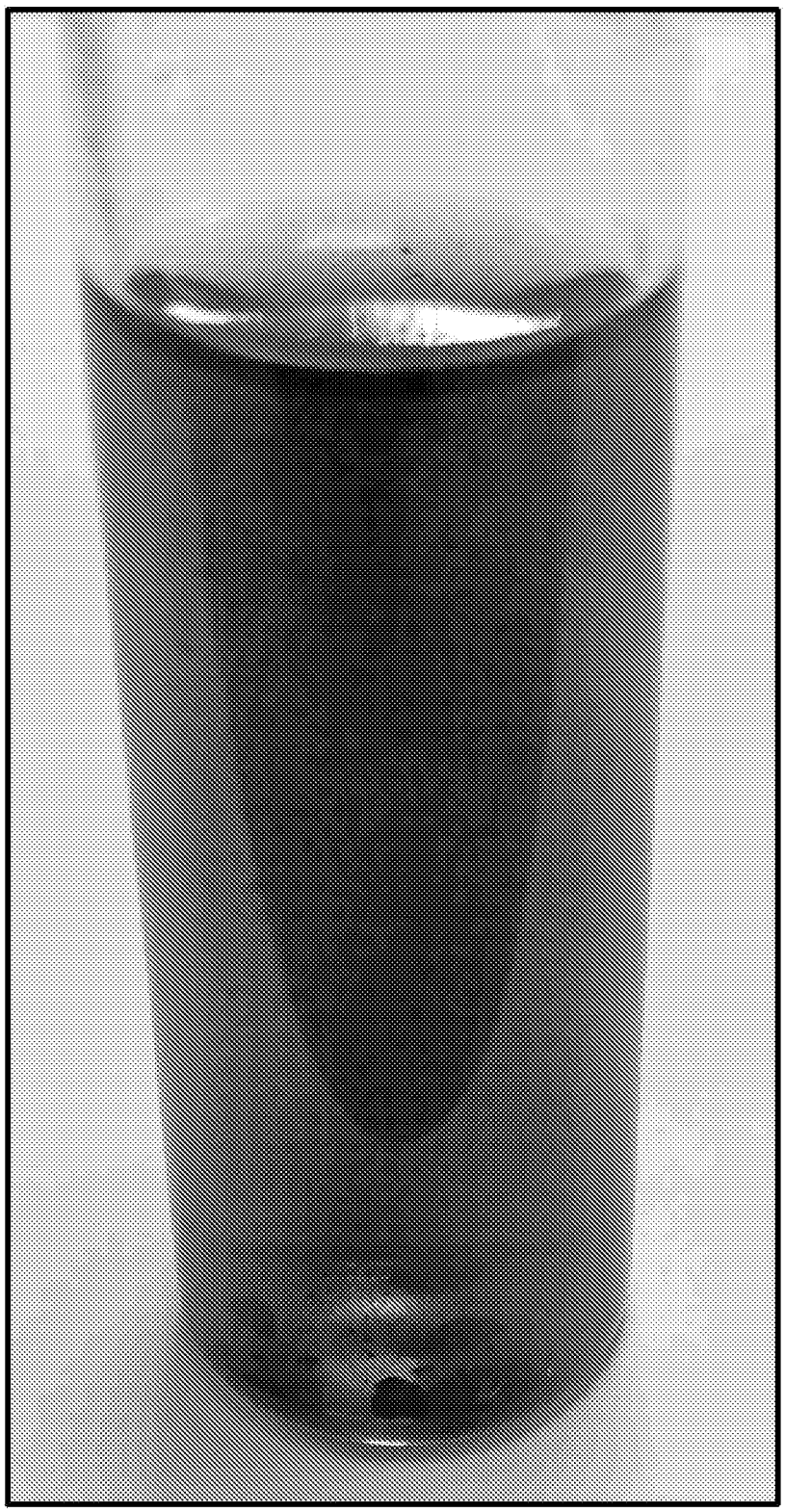
FIG. 86D is a photograph of the disintegrated buckypaper in solvent after agitation.

Sample F6 comprises a section of the Sample F5 macroform that was cut out and annealed at 1050° C. for 30 minutes. FIG. 84B is an image of Sample 5 after annealing. Visually, there was no apparent change before and after annealing. While mechanically handling sample F6 it was more brittle and less flexible than F5, indicating the integration of the microforms during maturation. Next, Samples F5 and F6 were immersed in isopropyl alcohol. As shown in FIG. 86A, when Sample F5 was immersed in solvent, the paper seemed stable and remained close to the surface of the solvent. After 2 minutes, it was observed to swell, increasing in thickness to over a millimeter, while continuing to stay close to the liquid surface. The increased thickness is indicated in FIG. 86B by the black arrow. After 15 minutes the paper started to disintegrate, and the debris started to sink to the bottom as shown in FIG. 86C. After leaving it overnight to soak, the vial was shaken by hand, and the paper seemed to have completely disintegrated, as shown by the dispersion of the $sp^x$ microforms in FIG. 86D. This degeneration confirmed that the Sample F5 macroform represented a vdW assembly, which the solvent intercalated and destabilized.

Figure 87A:
FIG. 87A is a photograph of an annealed buckypaper immersed in solvent.
Figure 87B:
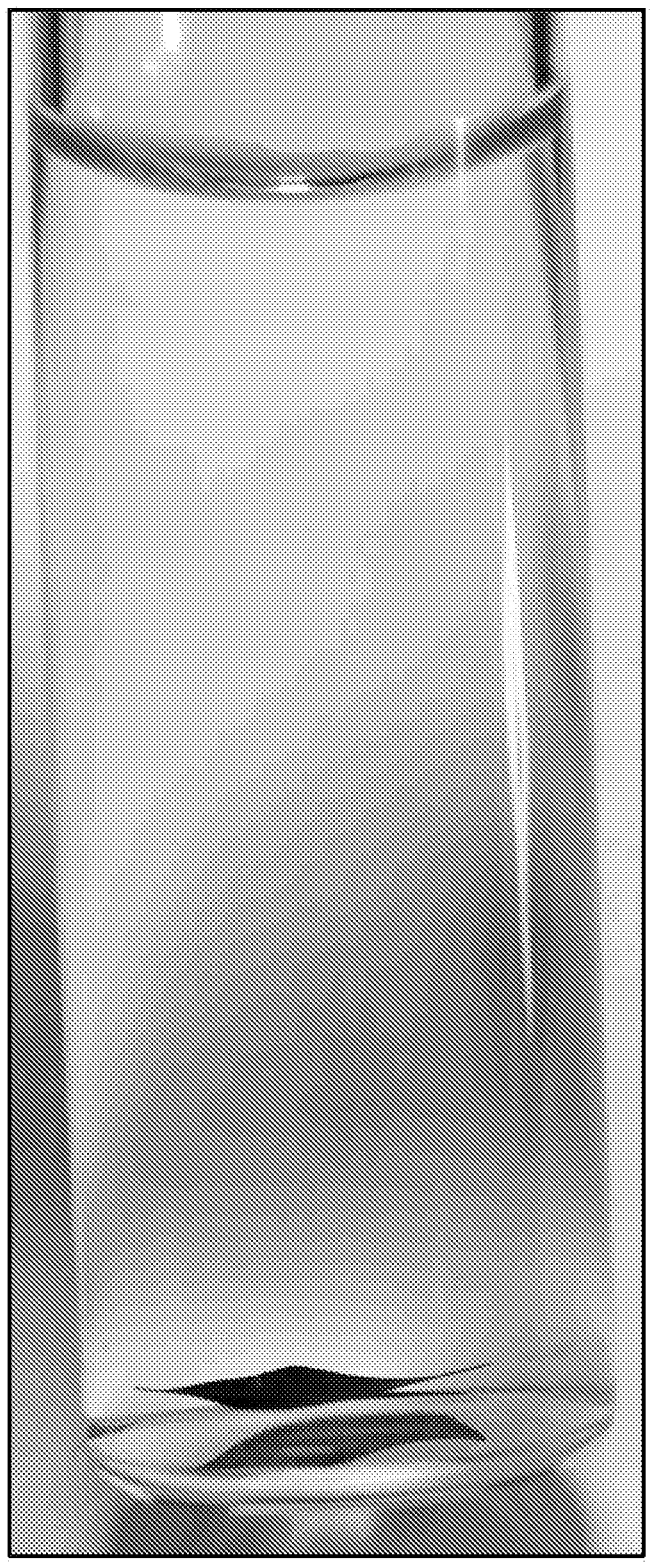
FIG. 87B is a photograph of the annealed buckypaper after sinking in the solvent.
Figure 87C:
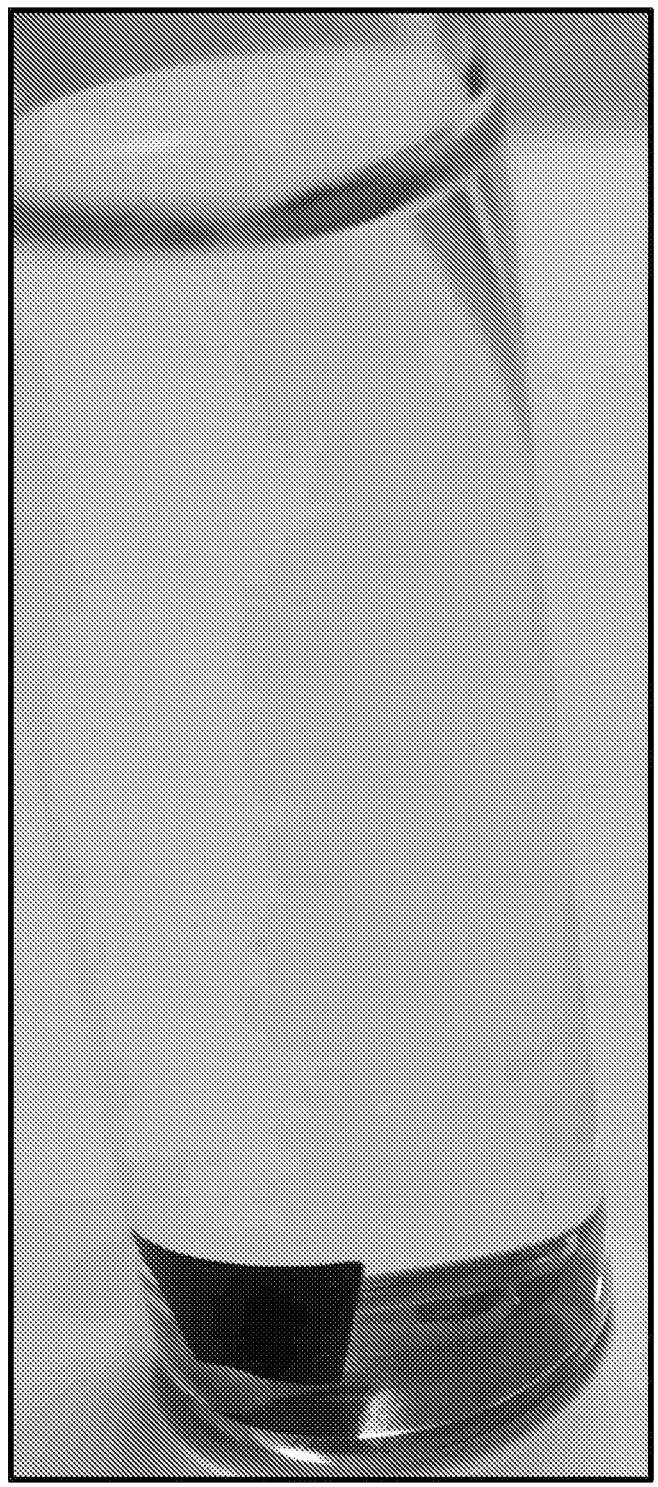
FIG. 87C is a photograph of the annealed buckypaper after agitation in solvent.
Figure 87D:
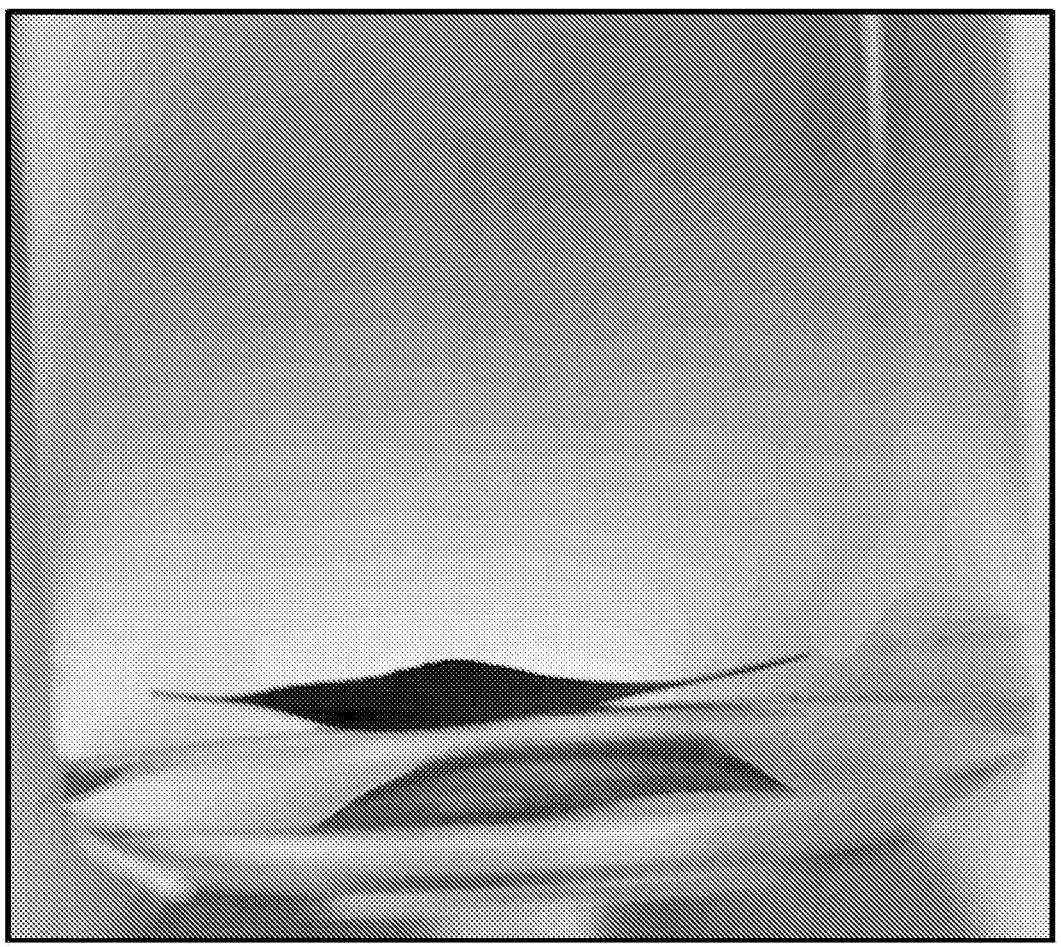
FIG. 87D is a higher-magnification photograph of the annealed buckypaper after agitation. The buckypaper remains intact and does not disintegrate.

A similar test was performed on Sample F6 by soaking a portion of it in isopropyl alcohol. As shown in FIG. 87A, the sample upon immersion seemed stable. Unlike Sample F5, it sank to the bottom. After 15 minutes there was no noticeable change and no indication of swelling, as shown in FIG. 87B. Shaking the vial by hand had no impact on the sample integrity. The sample was left immersed overnight, then shaken again the next morning, without any changes. This is shown in FIG. 87C. A higher magnification image was taken at this stage and is shown in FIG. 87D. The thickness appeared visually to be unchanged. The stability of Sample F6 is another indication that it has been crosslinked and comprises a macroscopic helicoidal network.

Figure 88A:
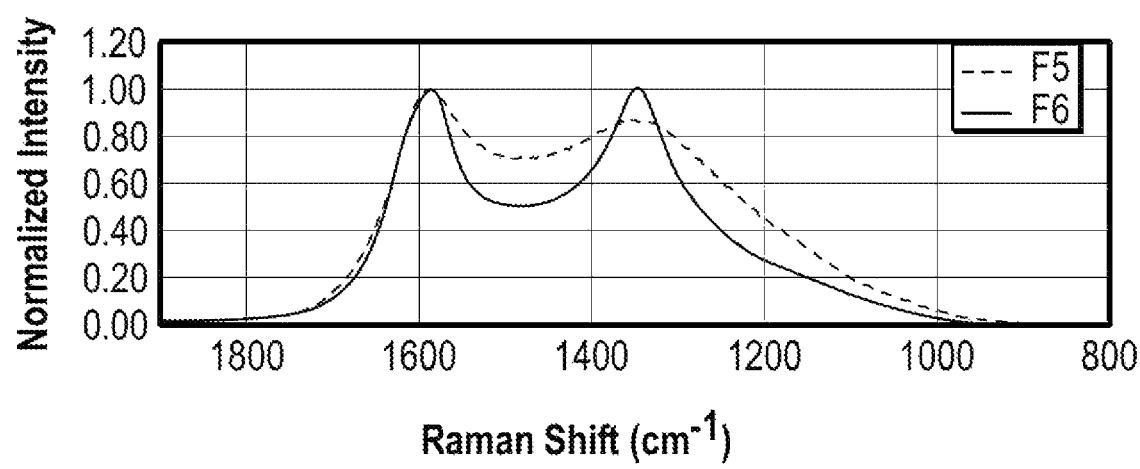
FIG. 88A is the Raman spectra of Samples F5 and F6 in the range of the D and G bands.
Figure 88B:
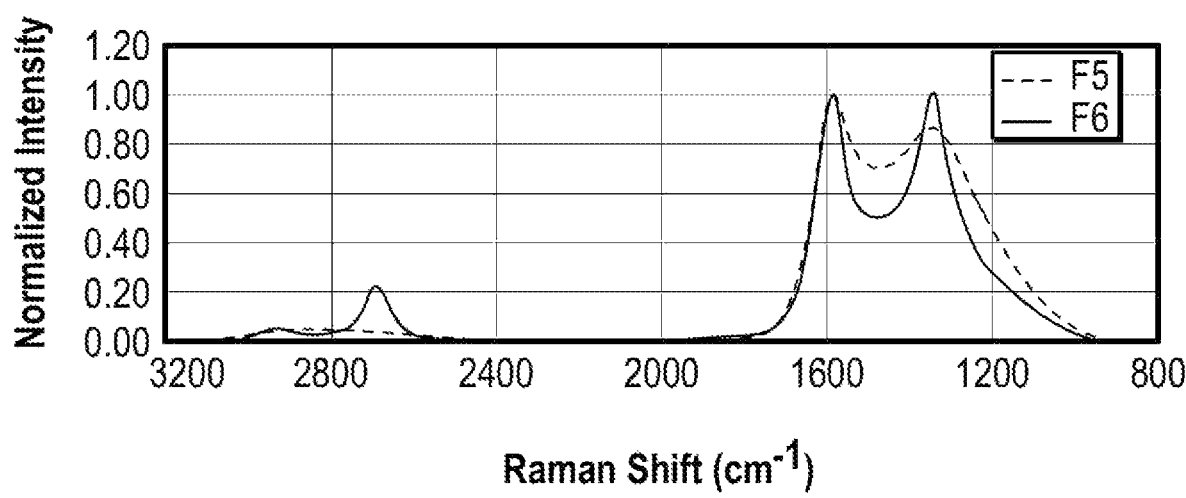
FIG. 88B is the full-range Raman spectra of Samples F5 and F6.
Figure 88C:
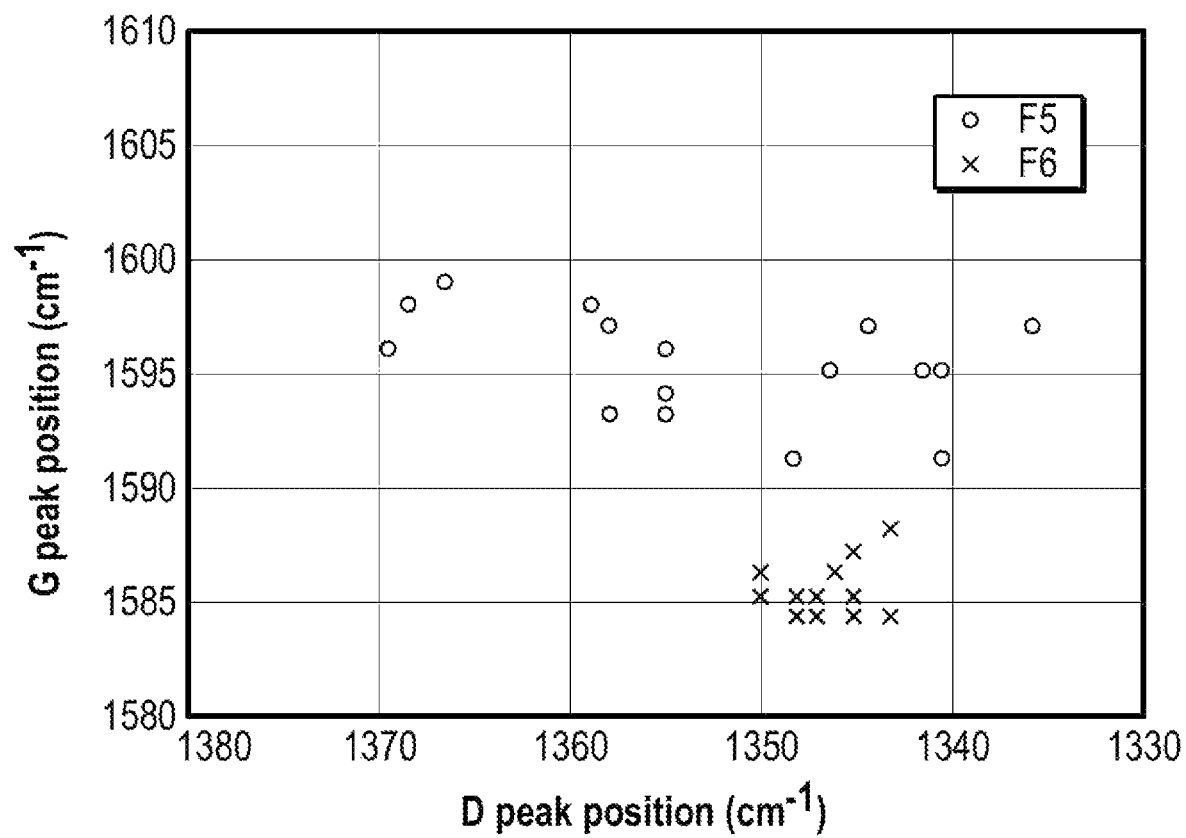
FIG. 88C is a chart of the $G_u$ and $D_u$ peak positions observed in a multipoint Raman spectral analysis of Samples F5 and F6.

This was confirmed via Raman analysis was performed (at 2 mW power). FIG. 88A shows the average spectra for Sample F4 and Sample F5 in the range of the $G_u$ and $D_u$ peaks. FIG. 88B shows the average spectra for the entire range. FIG. 88C shows the $G_u$ and $D_u$ peak positions for all 16 points individually.

Table 11 below summarizes the average $I_{D_u}/I_{G_u}$, $I_{Tr_u}/I_{G_u}$ and $I_{2D_u}/I_{G_u}$ peak intensity ratios, the average $G_u$ and $D_u$ peak positions, and the interval between the $G_u$ and $D_u$ peak positions:

| Sample | $D_u$ peak position | $G_u$ peak position | $I_{Du}/I_{Gu}$ | $I_{Tru}/I_{Gu}$ | $I_{2D}/I_G$ | Interpeak Interval |
|---|---|---|---|---|---|---|
| F5 | 1352 | 1596 | 0.88 | 0.68 | <0.10 | 243.0 |
| F6 | 1347 | 1586 | 1.00 | 0.49 | 0.40 | 239.0 |

Table 11

The average $D_u$ peak position for Sample F5 is 1352 cm$^{-1}$, and from this it is not immediately evident that Sample F5 comprises an $sp^x$ network. However, the point spectra shown in FIG. 88C reveal $D_u$ peak positions as low as 1336 cm$^{-1}$, which is indicative of localized $sp^3$ states and diamondlike seams. The localized D band interpolation is consistent with the microcrystalline $K_2CO_3$ template particles on which the perimorphic frameworks were grown. The atomically flat surfaces of these crystals minimize nucleation of primordial domains, which grow over the surfaces with few tectonic interactions. Because the formation of $sp^3$ states and diamondlike seams arise from tectonic interfaces, the RBM phonons in regions with few tectonic interfaces are predominately activated by $sp^2$ edge states—point defects within the basal plane. In these regions, there is no obvious interpolation in the $D_u$ peak. In other, more nucleated regions, tectonic activity creates the $sp^3$ states and diamondlike seams that cause interpolation of the D band. This explains the breadth of the scatter in $D_u$ peak positions in FIG. 88C. Additionally, it means that Sample F5 comprises an $sp^x$ network.

The presence of large regions with minimal tectonic activity also explains other spectral features. The high $I_{Tr_u}/I_{G_u}$ value of 0.68 in Sample F5 is indicative of ring disorder-induced lattice curvature, which seems to increase in the absence of diamondlike seams. This may be related to the lack of compressive stress created by $sp^3$ grafting at tectonic interfaces. Sample F5 exhibits a slightly red-shifted $G_u$ peak, as indicated by the scatter plot in FIG. 88C, which is consistent with ring-disorder. All of this is consistent with the previous observations that progressive D peak interpolation was accompanied by progressive reduction in the trough height and blue-shifting of the $G_u$ peak.

The lack of tectonic activity during the formation of Sample F5 explains why its $I_{Tr_u}/I_{G_u}$ value (0.68) is much higher than Sample B2's $I_{Tr_u}/I_{G_u}$ value (0.46), despite the pyrolysis temperature for these two samples being the same (640° C.). The most primordial cause is the substrate—defect-rich substrates cause dense nucleation, tectonic activity, and $sp^3$ formation, while defect-poor substrates suppress it.

The local absence of $sp^3$ states also explains the spectral changes that occur during maturation of Sample F5. Thus far, we have observed that maturation leads to increased lattice distortion and increased trough height. However, in Sample F6, the trough height is considerably reduced compared to Sample F5. This is because of the local absence of screw dislocations in the resulting helicoidal network—in other words, the helicoids are so large that the dominant spectral effect of maturation is the elimination of ring disorder, which reduces lattice distortion and therefore reduces the trough. The combination of the increased ring order and the absence of screw dislocations is also reflected by the emergence of a $2D_u$ peak in the Sample F6 spectra. The emergence of a 2D peak is indicative of longer-range, in-plane $sp^2$ crystallinity. Based on Sample F6's $I_{2D_u}/I_{G_u}$ peak intensity ratio, which is slightly higher than 0.40 Å, and its $D_u$ peak position of 1347 cm$^{-1}$, the Sample F6 macroform comprises an example of a minimally crosslinked, highly mature helicoidal z-network.

So far in Study F, we have demonstrated a process for creating macroscopic anthracitic networks. This involves creating a static, macroscopic vdW assembly from distinct, smaller-scale anthracitic networks (i.e. "microforms") and ring-connecting them to one another via an assembly-to-assembly or assembly-to-singleton maturation. We have demonstrated this process using flat microforms, which we have used to create both flat and equiaxed macroforms. This basic approach of cohering perimorphic microforms to create a macroform is described in the '308 Application, where the macroforms are described as "peritactic macroforms." Study F therefore demonstrates that a peritactic macroform can comprise a single anthracitic network.

However, these are only exemplary variants of the inventive concept, which can encompass different densification techniques (e.g. mechanical compaction, evaporative drying, etc.) and forming techniques (printing, 3-D printing, molding, extrusion, injection, drawing, spinning, etc.), without limitation. These and other techniques may be used to create a peritactic macroform of any arbitrary size, geometry and aspect ratio, including elongated, flat, and equiaxed shapes. In particular, we foresee the fabrication of continuous helicoidal networks in the form of yarns, ropes, sheets, and coatings. The only requirements are to bring the $sp^x$ microforms together into a vdW assembly of the desired geometry and to hold the assembly in a substantially static configuration during maturation. Maximum flexibility and contact between the sp$^x$ microforms are preferred for obtaining maximum interconnectivity in the final macroform. For this reason, natively few-layer sp$^x$ precursors are preferred.

The inventive concept also includes the use of microforms of different geometries. A large variety of potential microforms are described and envisioned in the '918 and '760 Applications, and these can be utilized to make different peritactic macroforms, as described in the '308 Application. These microforms may include perimorphic frameworks comprising elongated fibers, flat sheets, or equiaxed prisms, as well as more complex, hierarchical geometries (e.g. rosette-like structures). The rosette-like structures may be especially attractive due to their ability to flex and flatten into aligned plates during densification. This list of microform variants is not exhaustive—other variants may be readily envisioned. Microforms may also be used in combinations of different sizes and geometries.

Figure 89:
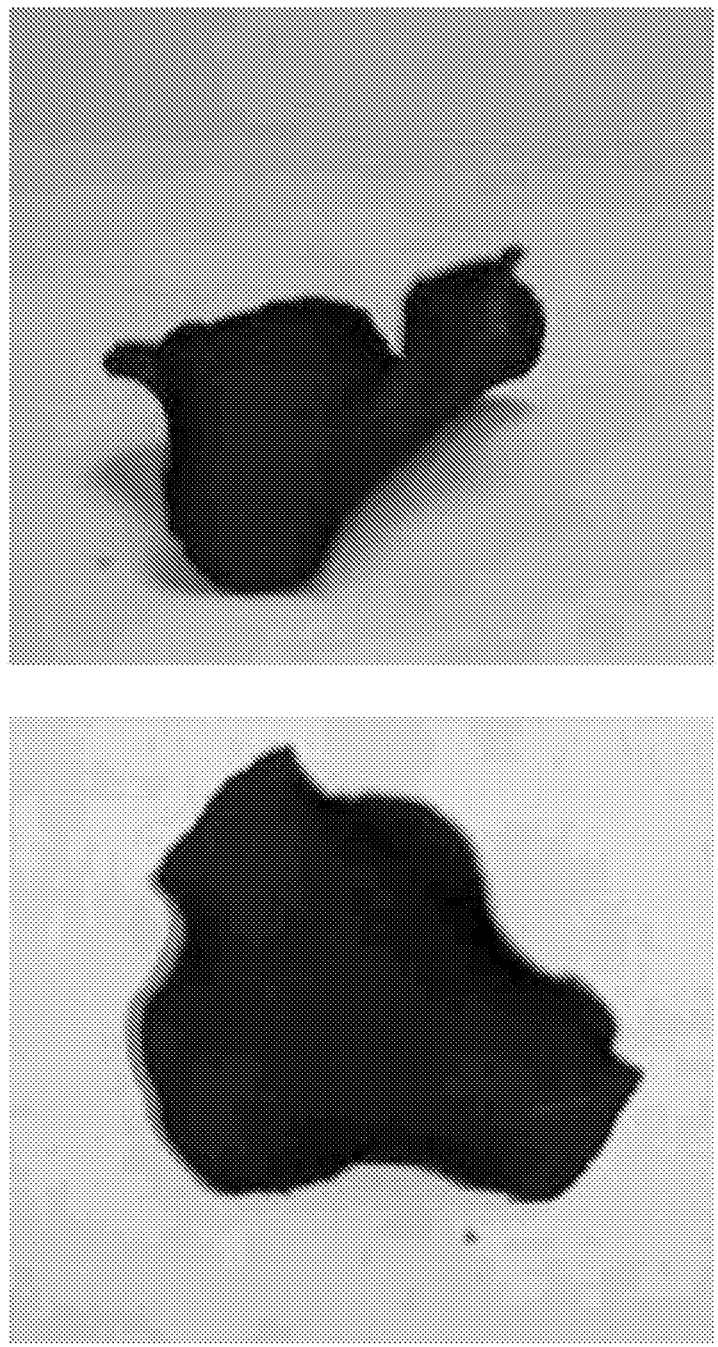
FIG. 89 is a photograph of a fibrous buckypaper made from elongated $sp^x$ microforms.
Figure 90A:
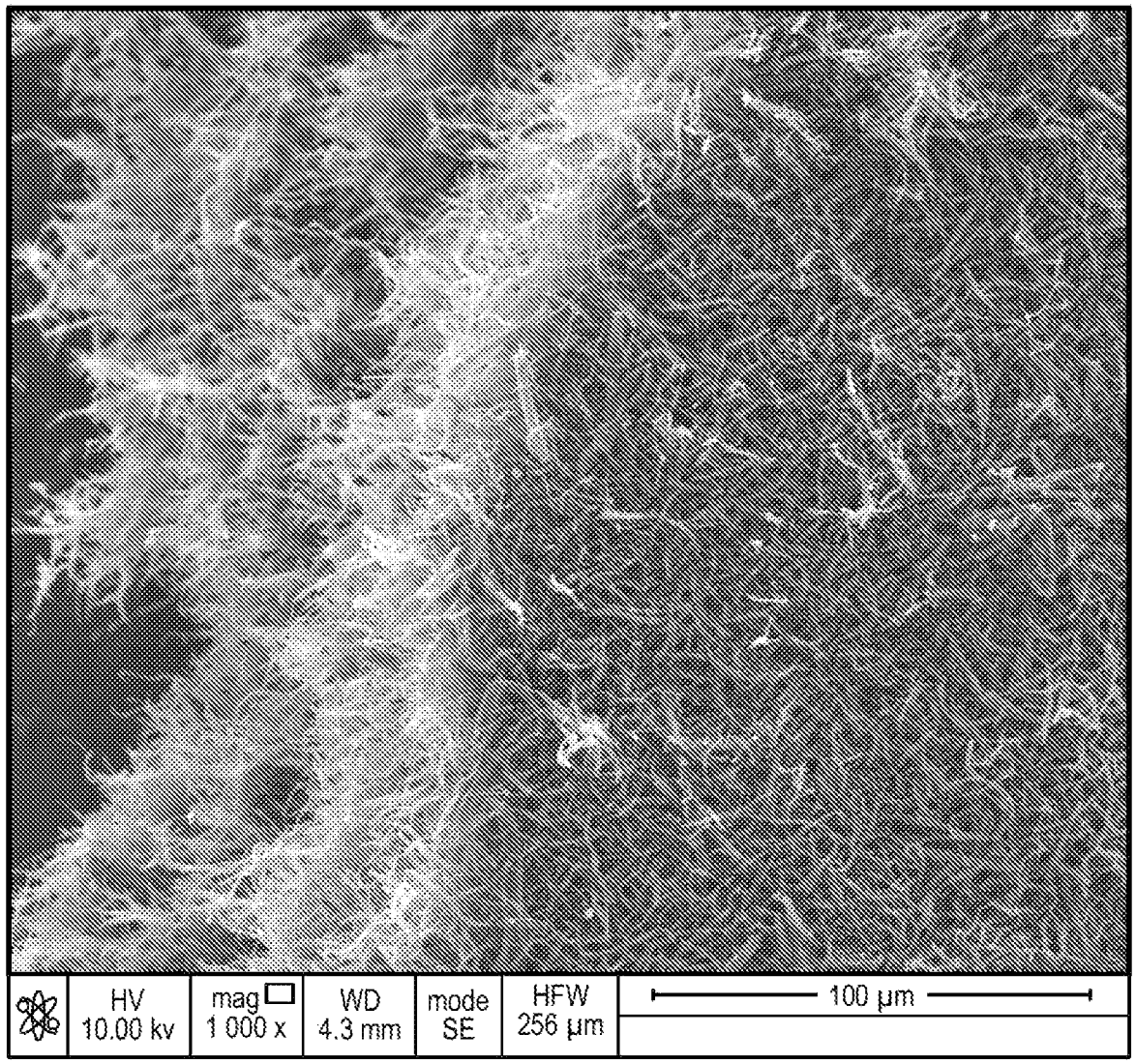
FIG. 90A is an SEM micrograph of the fibrous buckypaper.
Figure 90B:
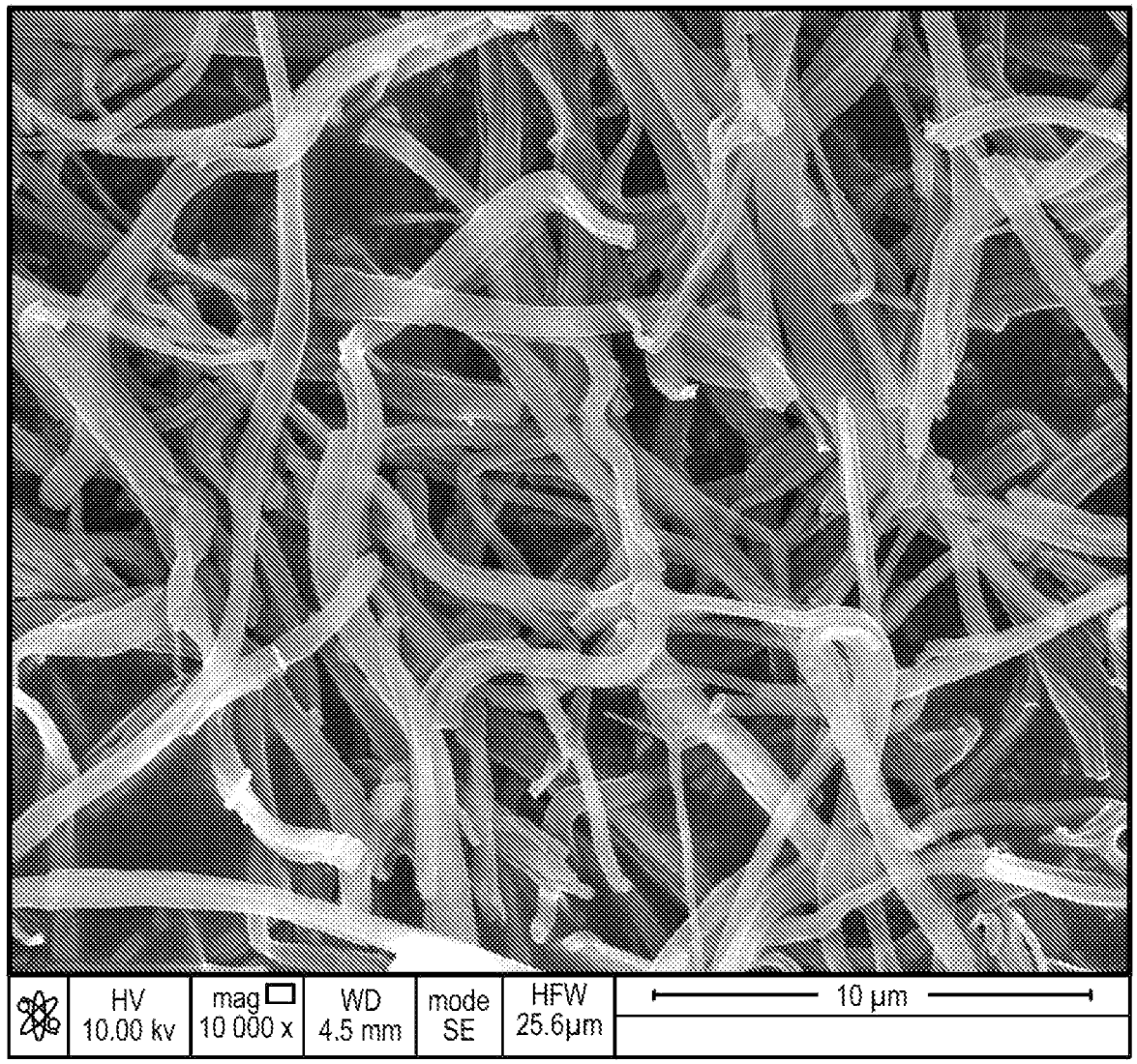
FIG. 90B is an SEM micrograph of the flexible, elongated $sp^x$ microforms.

As an example of one such variant, Sample F7, which is shown in FIG. 89, comprises a flat macroform constructed from elongated microforms. These microforms comprise flexible fibers with diameters ranging from submicron to micron-scale, with lengths ranging from 10 μm to 100 μm. These were chosen for their enhanced flexibility and ability to entangle with one another, creating a textile. A broken portion of the textile of these elongated microforms is shown in the SEM micrograph of FIG. 90A, and the entangled structure is shown in FIG. 90B. This textile was densified via drying but might be further densified using a roll press in order to increase the contact area between the microforms.

Figure 91A:
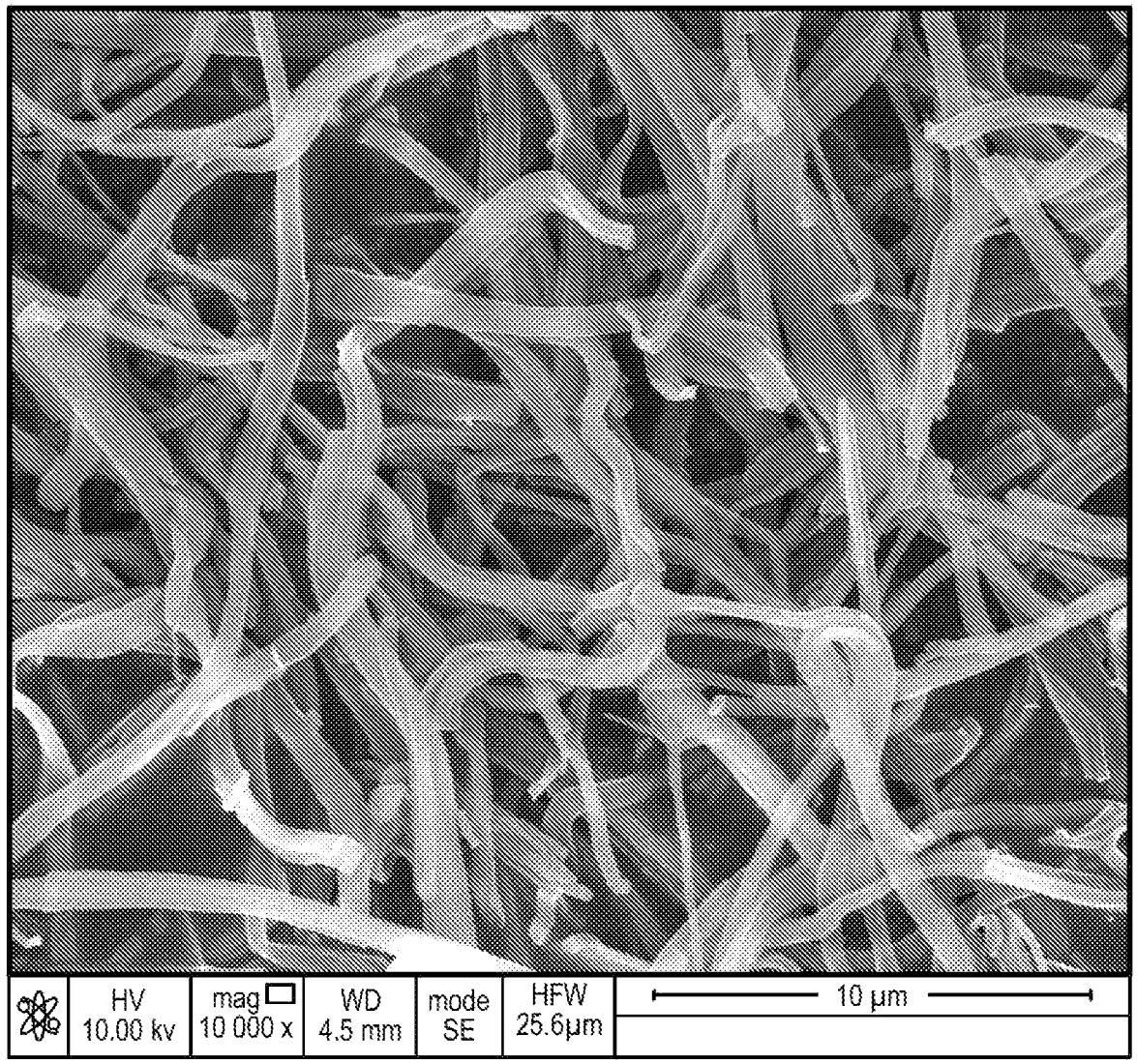
FIG. 91A is an SEM micrographs of flexible, elongated perimorphic frameworks with a fine substructure.
Figure 91B:
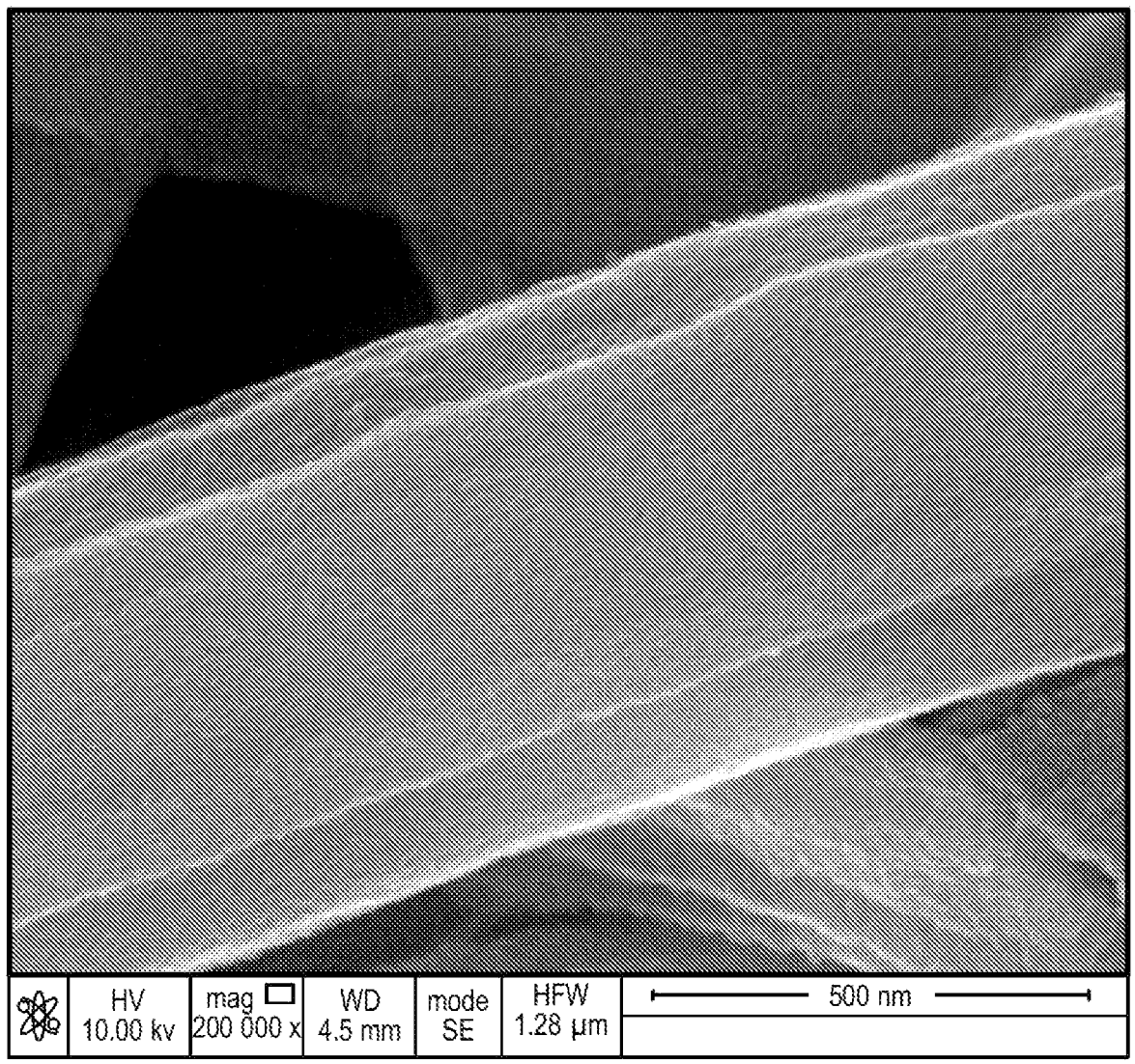
FIG. 91B is an SEM micrograph showing the indistinctness of the frameworks' substructural features at this scale of magnification after drying.
Figure 92A:
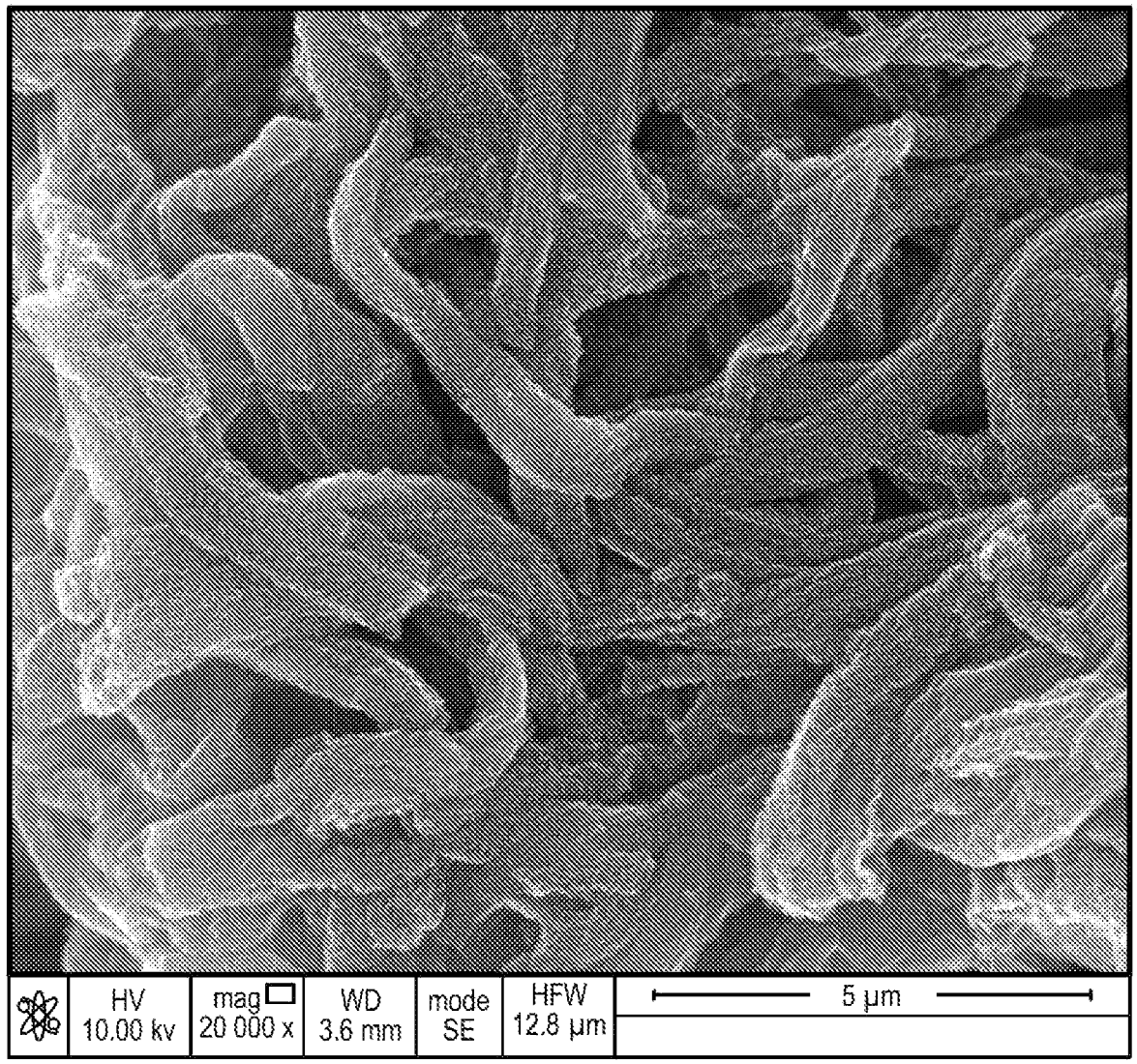
FIG. 92A is an SEM micrographs of flexible, elongated perimorphic frameworks with a coarser, less compact substructure than those shown in FIGS. 91A-91B.
Figure 92B:
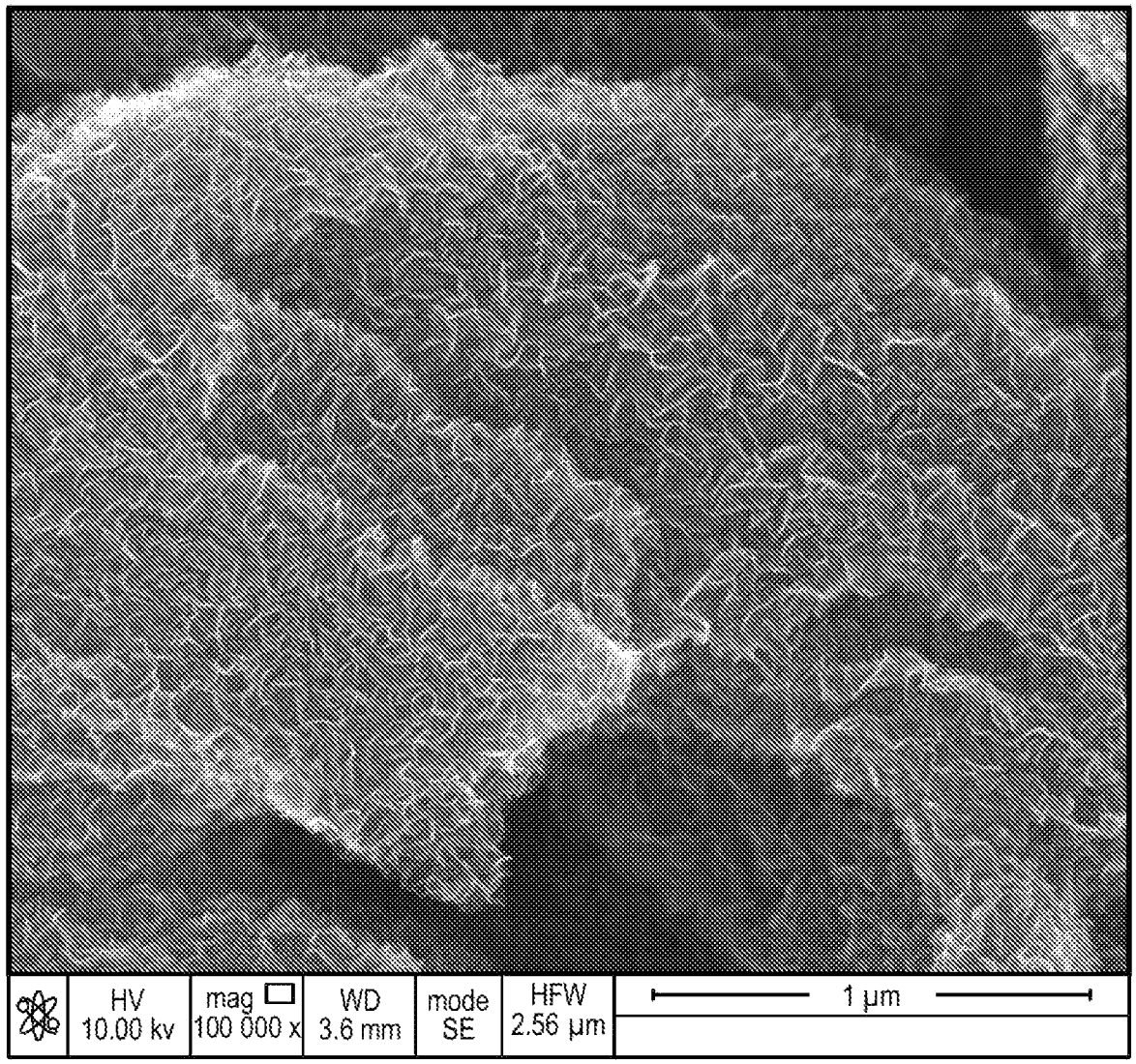
FIG. 92B is an SEM micrograph showing the folded, crumpled appearance of the frameworks' substructural features at this scale of magnification after drying.

Other perimorphic frameworks that might be used as microforms are detailed in this disclosure and in the '918 and '760 Applications. These microforms, in addition to varying based on their overall particle geometry, may vary based on their compactness—i.e. their mesoscale crosslinking. This can be seen in a comparison of the elongated microforms shown in FIGS. 91A and 92A. In FIGS. 91A and 91B, two magnifications of a sample of perimorphic frameworks are shown. These frameworks comprise comparatively dense mesoscale crosslinking—analogous to diagram I of FIG. 73. Accordingly, when these frameworks are dried, the crumpled cellular subunits create a smooth, indistinct surface, as can be observed in FIG. 91B. In FIGS. 92A and 92B, two magnifications of another sample of perimorphic frameworks, the frameworks comprise less dense mesoscale crosslinking—analogous to diagram II of FIG. 73. Accordingly, when these frameworks are dried, the crumpled cellular subunits have a more coarsely crumpled appearance, as shown in FIG. 92B.

Figure 93:
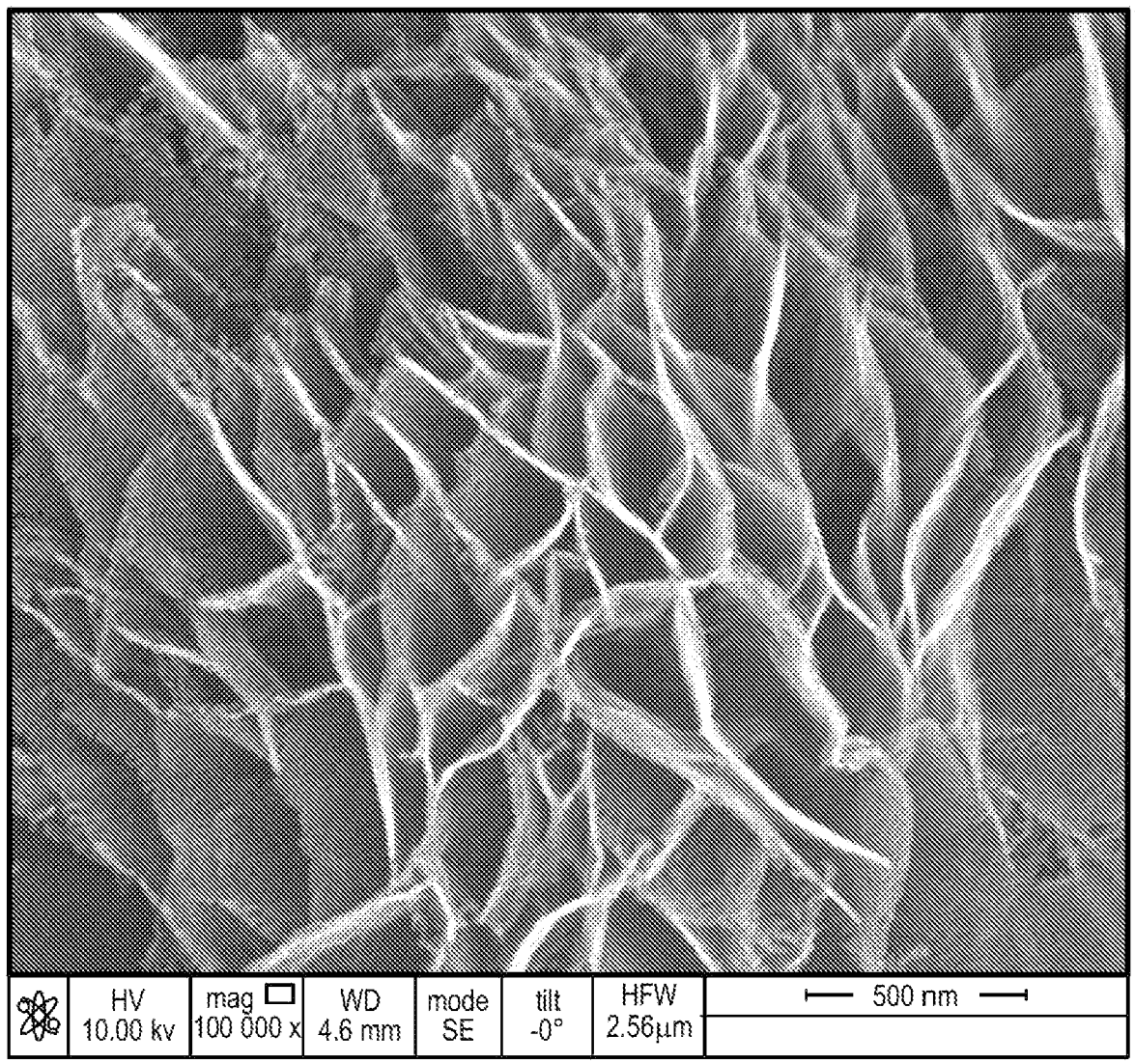
FIG. 93 is an SEM micrograph of a perimorphic framework with a hierarchical petaloid morphology.
Figure 94A:
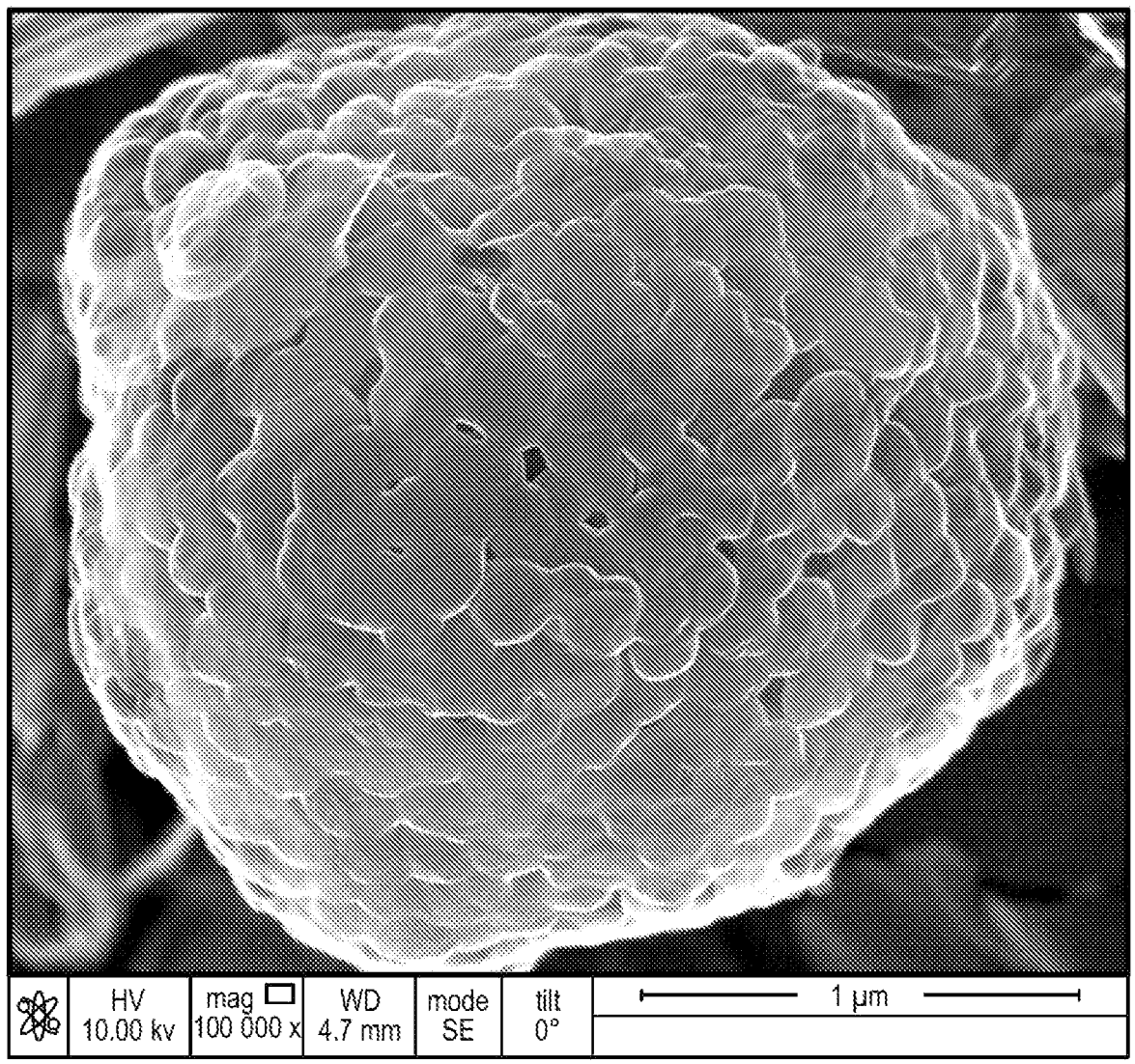
FIG. 94A is an SEM micrograph of a hollow, spheroidal perimorphic framework. The framework exhibits enough rigidity for its shell to retain its native morphology upon drying.
Figure 94B:
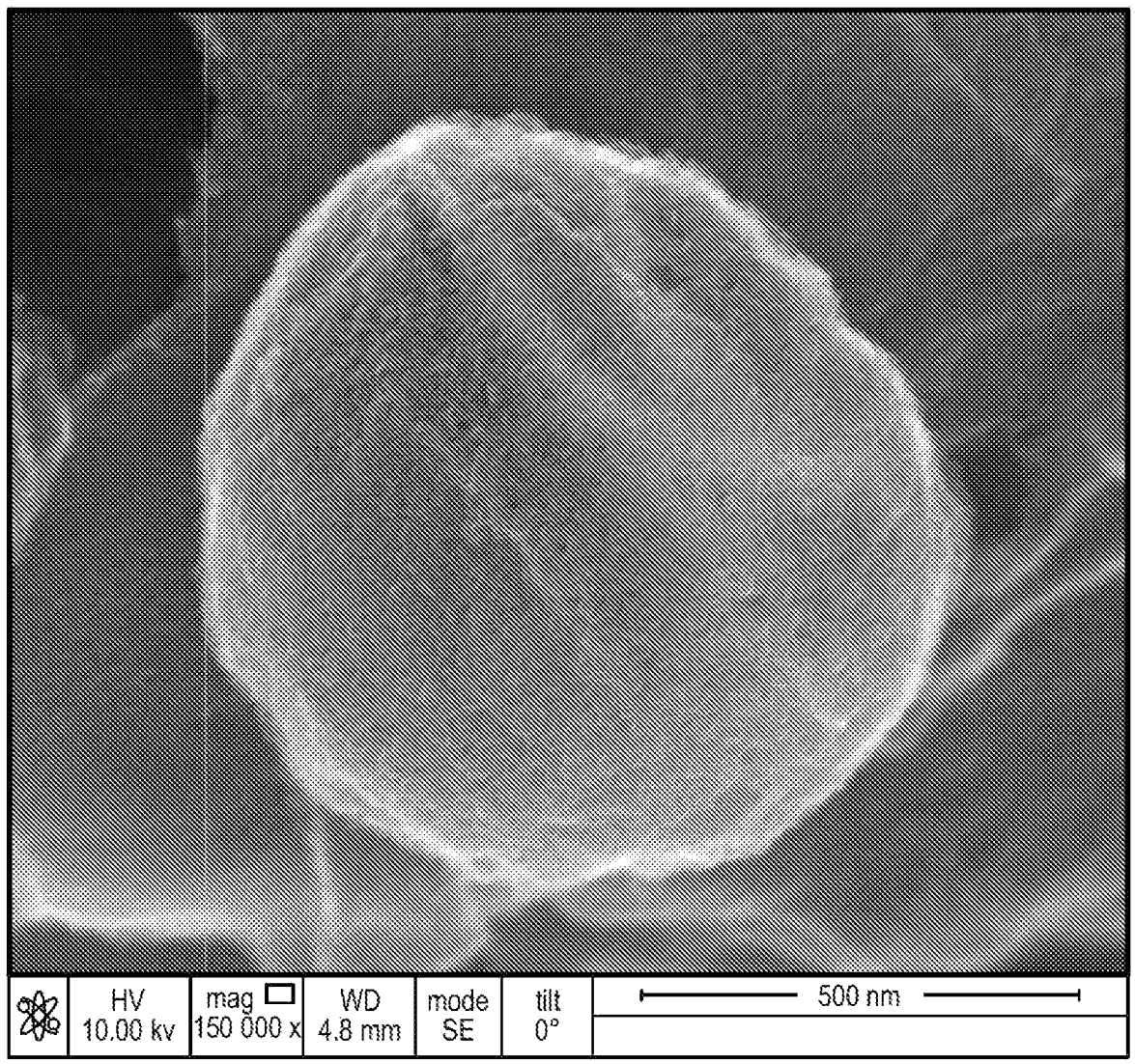
FIG. 94B is an SEM micrograph of a hollow, spheroidal perimorphic framework. The framework exhibits more flexibility and deformations of the spherical shell.

Other microform variants may comprise rosette-like sp$^x$ networks, like the one shown in FIG. 93, comprising petaloid arrangements of the sheets-of-cells morphology. These petals may be densified such that they stack upon each other, forming non-native bilayers and fusing into a lamellar stack during maturation. Lamellar stacking arrangements are also possible from collapsing and densifying flexible, hollow-spherical microforms. A rigid version of this type of structure is shown in FIG. 94A, and a flexible version is shown in FIG. 94B. These hollow-spherical microforms may be synthesized using spray-dried hollow spheroid templates, as described in the '760 and '918 Applications. The use of either natively flat perimorphic frameworks, or flat-upon-collapse petaloid or hollow frameworks, allows for a high degree of interconnectivity in the matured network due to the high intra-network and inter-network contact area in the lamellar macroform.

Figure 95A:
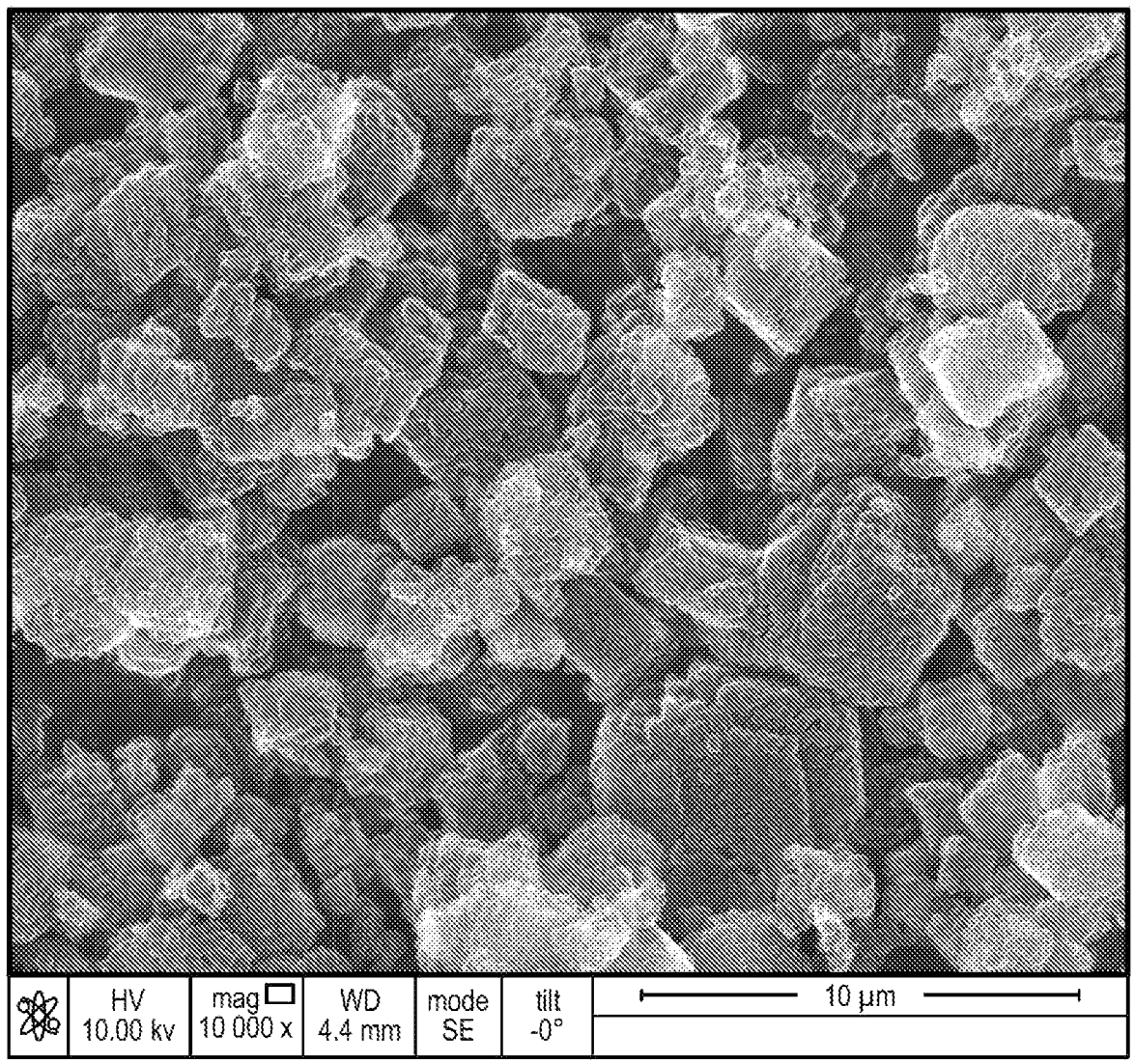
FIG. 95A is an SEM micrograph of equiaxed perimorphic frameworks.
Figure 95B:
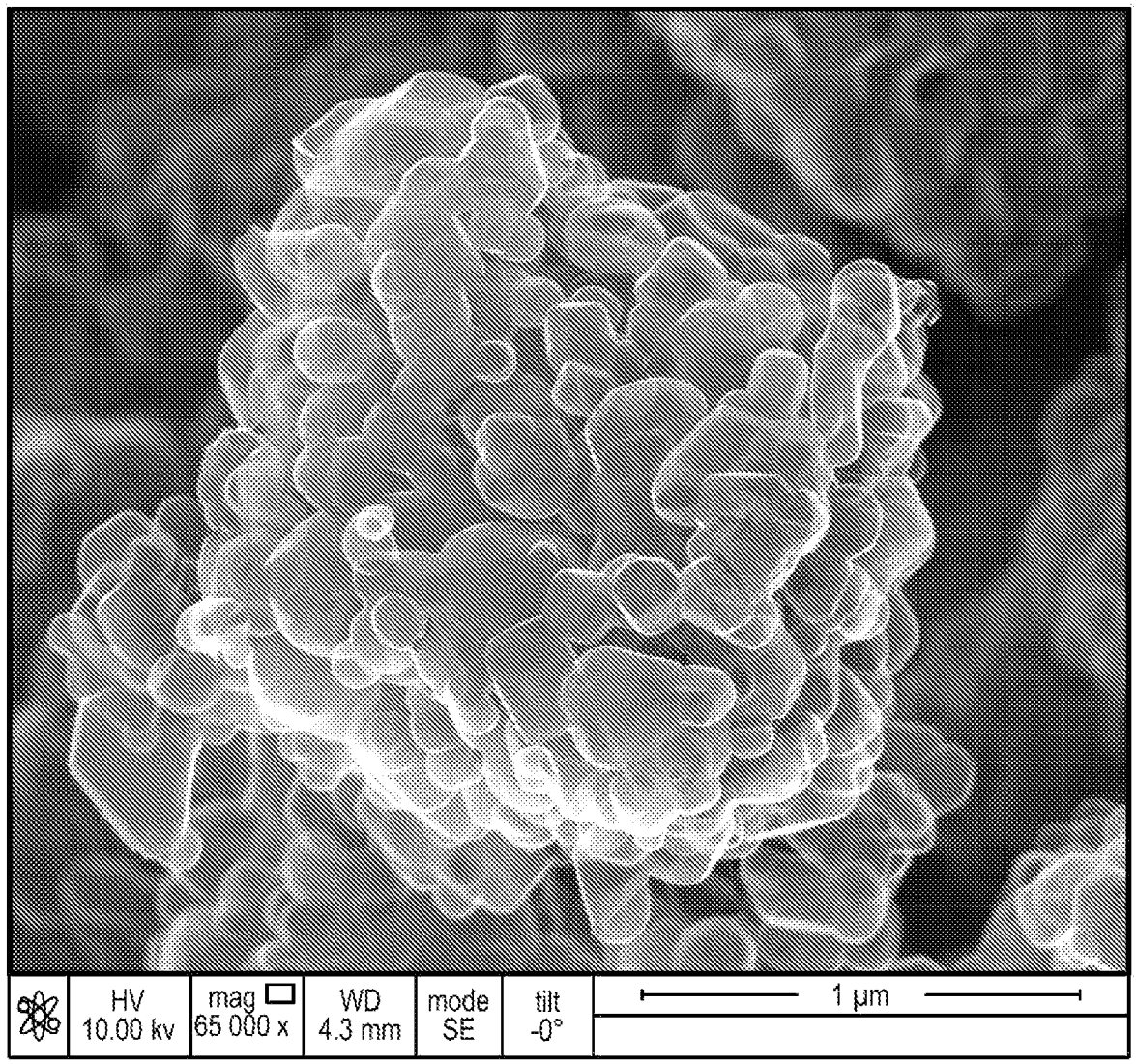
FIG. 95B is an SEM micrographs showing the polyhedral cellular subunits of these equiaxed frameworks.

Other microforms comprise equiaxed perimorphic frameworks. In one variant, the microforms may comprise hollow spheres. These may be especially useful if a low-density, macroporous anthracitic network is desired. In another variant, the microforms may comprise perimorphic frameworks with a prismatic or polyhedral superstructure, like those shown in FIG. 95A (at lower magnification) and FIG. 95B (at higher magnification). Where equiaxed perimorphic frameworks are utilized, the mature, macroscopic network may benefit from packing efficiency and flexibility.

XIV. Study G—Analysis

Study G was performed to ascertain whether microwave irradiation could be utilized as a rapid technique for maturing sp$^x$ precursors. It was hypothesized that a combination of high temperature, short annealing time, and rapid cooling was desired to mature the sp$^x$ network fully, while preserving a high density of dislocations. A rapid microwave treatment, it was theorized, would offer this combination.

Figure 8C:
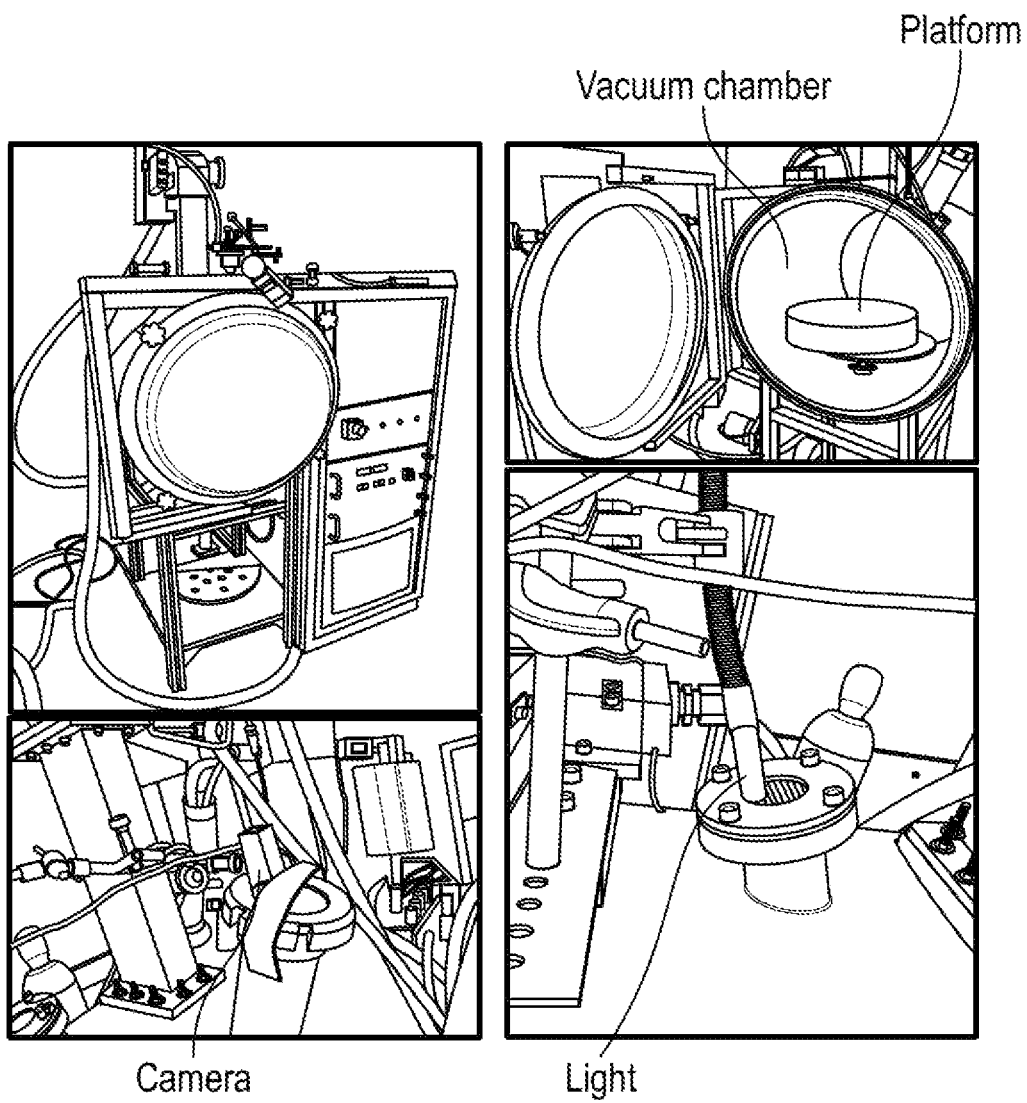
FIG. 8C includes drawings of a vacuum chamber equipped with a magnetron, a viewing glass with a light, and rotating internal platform.

In Test I of Study G, a Cober-Muegge microwave system was utilized to perform a microwave treatment on the G1 carbon sample. The system consisted of a 2.45 GHz magnetron, 3000 W power supply, steel vacuum chamber, and vacuum pump. The vacuum chamber was outfitted with a rotating platform to facilitate uniform sample exposure and a gas inlet/outlet. The rotating platform could be switched on or off. A quartz viewing window located near the top of the vacuum chamber allowed video observation of the sample during the microwave treatment. The microwave assembly is shown in FIG. 8C.

A 101.0 mg quantity of Sample G1 powder was placed in a medium quartz beaker ("A"). A 100.4 mg quantity of another carbon powder was placed in a small quartz beaker ("B"). The powder bed in each beaker was leveled to a uniform thickness. Beakers A and B were both then placed within a large quartz beaker in case the smaller beakers shattered from rapid heating during the microwave treatment. The large beaker was placed in the vacuum chamber in a centrally located position to maximize microwave exposure. The vacuum chamber was then sealed and vacuumed down to approximately 2 torr, at which point the chamber was refilled to ~710 torr with nitrogen gas. This was repeated two more times to remove any remaining oxygen in the nitrogen atmosphere.

Microwave irradiation was commenced at a power level of 2400 W. This condition was held for 2 minutes and then the magnetron was switched off. The samples were then permitted to cool back down to room temperature prior to opening the vacuum chamber. The mass of the carbon collected from Beaker A was 95.2 mg and the mass collected from Beaker B was 98.5 mg.

Figure 96:
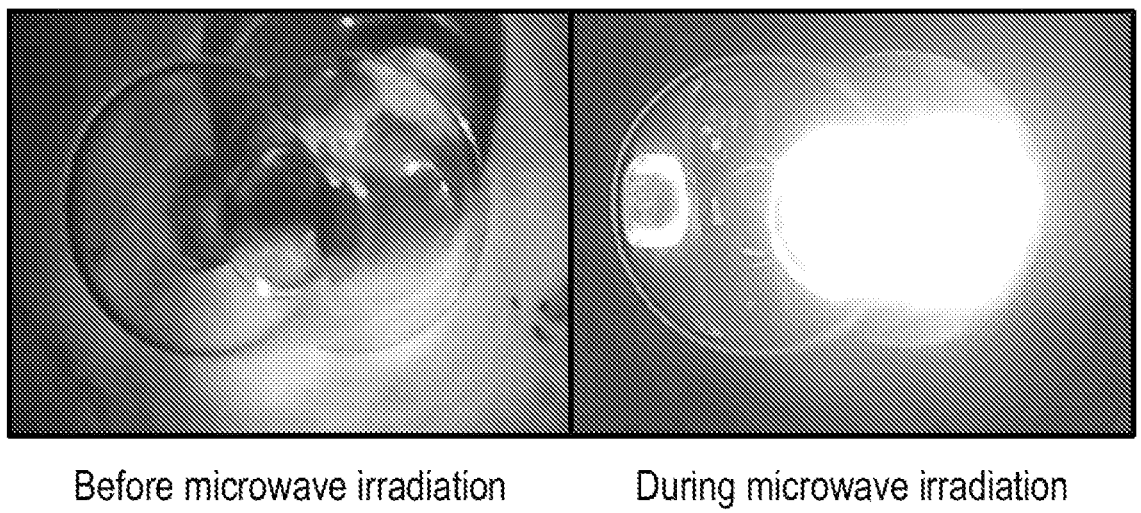
FIG. 96 is a photograph of Sample G1 undergoing resistive heating at 1 atm.

During the 2-minute microwave irradiation treatment, the samples were observed via a video feed. This treatment occurred at approximately 1 atm. Within a few seconds of the commencement of the microwave treatment, Sample G1 began to glow red, and within 10 seconds from commencement, the red glow became bright white. This was likely the period over which rehybridization was occurring. From this point, the brightness continued to grow in intensity, with the video camera auto-adjusting its brightness settings several times to accommodate the growing intensity of light. FIG. 96 shows a frame from the video feed during the treatment. Sample G1 is radiating such an intense white light that the sample cannot be discerned; the entire beaker appears bright white.

While temperature data was not gathered for this experiment, similarly intense white light was emitted in other treatments in which carbon sublimation and re-condensation above the sample as soot could be observed by video. This should only happen at temperatures significantly higher than 3,000° C. Some of the mass loss observed in Samples G1 and the other carbon powder can be attributed to vaporization of oxidized carbon sites (some oxidized sites are retained, despite the lack of an oxidation procedure, due to the nucleation of the carbon lattices on the template's oxygen anions) and adsorbed water. The increased mass loss in Sample G1 may be attributable to some sublimation occurring in this sample.

The remarkably intense Joule heating demonstrated by Sample G1 during microwave irradiation indicates the formation of high-density electrical currents in the carbon particles. Study G demonstrates that microwave heating may be utilized for annealing. It also demonstrates that helicoidal networks may be utilized for resistive heating applications.

In Test II of Study G, a new (i.e. not previously subjected to microwave irradiation) portion of the Sample G1 powder was subjected to microwave irradiation under a lower $N_2$ pressure and power level. The microwave system utilized was the same as the one utilized in Test I. As before, the experiment was performed at room temperature. The lower power setting was selected in order to avoid the formation of a sustained plasma inside the vacuum chamber during microwave irradiation. A small mound of 0.103 mg of Sample G1 carbon powder was placed centrally in a quartz boat, which was placed centrally on the platform. The vacuum chamber was then sealed and vacuumed down to approximately 2 torr, at which point the chamber was refilled to ~710 Torr with nitrogen gas. This was repeated two more times to remove any remaining oxygen in the nitrogen atmosphere. Finally, the chamber was vacuumed down to 32.5 Torr.

Microwave irradiation was commenced at a power level of 450 W. Surprisingly, the G1 carbon powder did not grow visibly hot, as it had in Test I, but instead remained black, exhibiting no signs of heating. Additionally, almost immediately upon commencement of irradiation, the carbon powder was observed to spread, adopting an extremely fine, smoky appearance that slowly filled the quartz boat. Throughout the irradiation, the powder never showed any signs of heating. Upon terminating the irradiation, the particles collapsed back into a pile at the bottom of the boat.

The absence of resistive heating, coupled with the spreading of the particles in a vacuum, may be explained by a strong diamagnetic response consistent with a resistanceless, superconducting state. Without resistance, Joule heating does not occur. The strong diamagnetic response in this superconducting state is a phenomenon known as the Meissner Effect. In a typical demonstration of the Meissner Effect, a permanent magnet is used to levitate a superconducting compound that has been cooled below its critical temperature ($T_c$). This occurs due to the formation of screening currents formed near the surface of the superconductor in the presence of an applied magnetic field.

In the case of Test II, we conclude that, under reduced pressure and at approximately 300K, Sample G1 enters a superconducting state, wherein microwave-induced supercurrents flow without resistance through the π electron cloud of electronically decoupled, graphenic monolayers. These supercurrents generate an opposing magnetic field, according to Lenz's law, causing the superconducting particles to repel one another and to spread out into a fine smoke. In effect, each particle becomes a superconducting magnet, and each particle repels the particles around it. This repulsion levitates particles and pushes them outward. Upon terminating the microwave irradiation, the particles stabilize back into a pile at the bottom of the boat.

While it is well-known that pyrolytic carbon is strongly diamagnetic, a diamagnetic response of this strength could not be observed at ambient pressure, nor does the diamagnetism of pyrolytic carbons explain the extraordinary lack of resistive heating under slightly reduced gas pressure. These combined phenomena demonstrate the formation of a resistanceless, superconducting state that is dependent upon gas pressure—in other words, dependent upon reduced gas-surface collisions. Test II occurred at approximately 300 K. Hence, Sample G1 comprises a demonstrated room-temperature superconductor, making it potentially the first among a theorized class of superconductors with $T_c$ of 300 K or higher.

Without being bound by theory, we propose the following explanation for the observed superconducting state. First, as we have already demonstrated, the diamondlike seams present in $sp^x$ networks force AA-stacking (and also bowing), increasing the <002> distance and reducing the electronic coupling between z-adjacent graphenic layers. It has been shown that at the atomic two-dimensional limit, correlation effects become more pronounced, and superconductivity may be achieved with far lower carrier density than in bilayers and bulk structures. Electronically decoupling the layers via AA stacking therefore enables a superconducting state with fewer charge carriers. Second, we propose that the $sp^3$ states within Sample G1 may act as dopants that increase carrier density. This concept of doping via $sp^3$ defects has been explored in connection with carbon nanotubes. Third, we propose that gas-surface collisions at ambient pressures lead to out-of-plane phonon perturbations that break the electronically decoupled state of the atomic monolayer superconductor. This is indicative of a phonon-electron coupling mechanism that, while integral to conventional BCS superconductivity, has not heretofore been conclusively determined for high-$T_c$ superconductors. At the atomic two-dimensional limit, we are able to observe the phonon-electron coupling mechanism experimentally. The superconducting state should be enhanced with further suppression of gas-surface collisions achieved at progressively lower pressures. It may also be enhanced with further doping.

Figure 97:
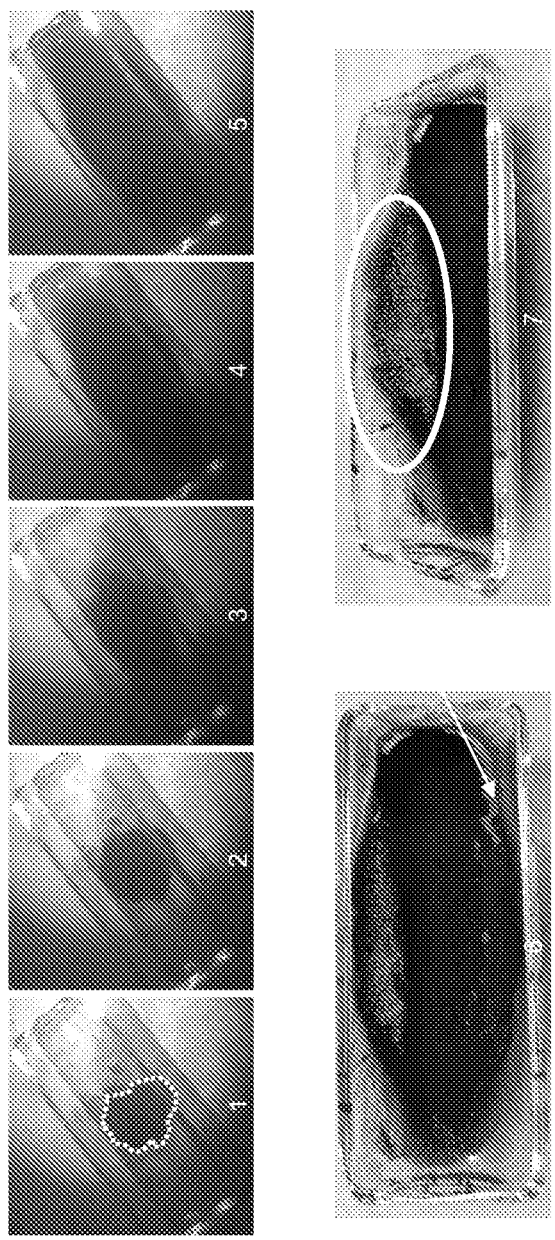
FIG. 97 is sequence of photograph showing Sample G1 exhibiting the Meissner Effect.

In Test III of Study G, the Sample G1 carbon powder was exposed to microwave irradiation at low pressure in order to demonstrate superconductivity. The microwave system utilized was the same as the one utilized in Tests I and II. As before, the experiment was performed at approximately 300 K. A small mound of 0.1027 mg of Sample G1 powder was placed in a quartz boat. The powder was pushed into a small pile located in the center of the boat, as shown Frame 1 of FIG. 97. An approximate outline of the pile is traced in Frame 1. The boat was then placed centrally in the vacuum chamber. The vacuum chamber was then sealed and vacuumed down to approximately 2 torr, at which point the chamber was refilled to ~710 torr with nitrogen gas. This was repeated two more times to remove any remaining oxygen in the nitrogen atmosphere. Finally, the vacuum chamber was vacuumed down to 32 torr.

Microwave irradiation was commenced at a 300 W power setting. Immediately (within 1 second of commencement) the pile of carbon powder began migrating outward, visible in the camera as a slight change in the outline of the pile. This migration was continued for a couple of seconds, whereupon the magnetron was switched off and the pile stopped moving. The G1 carbon powder remained black, exhibiting no signs of heating. The pile after this initial irradiation is shown in Frame 2 of FIG. 97. The movement was most visible in the upper-right and lower-left corners of the pile as it began migrating along the length of the boat.

At this point, irradiation was again commenced—this time at an increased power setting of 750 W. Again, within just 1-2 seconds of microwave exposure, the carbon powder was observed to levitate, this time migrating down the length of the boat as a black, particulate cloud. This migration, which occurred over a period of approximately 10 seconds, is shown in Frames 3 through 5 in FIG. 97. During this time, the powder both expanded along the length of the boat and pushed upward along its walls, especially at the center, where it nearly reached the lip of the boat, as indicated by the circle in Frame 7 of FIG. 97. The progress along the length of the boat appeared as the steady drift of a fine smoke, which is indicated by the orange arrow in Frame 4 at the upper-right end of the boat. After stabilizing in the configuration shown in Frame 5, the powder did not move at all. Throughout the procedure, it never showed any signs of heating, although a few occasional microplasmas were observed within the bed. In Frame 6 and 7 of FIG. 97, photographs of the boat upon removal from the microwave chamber reveal the final shape of the powder. The white arrow in Frame 6 indicates where, upon turning off the magnetron, the powder fell back down.

In Test IV of Study G, four commercial carbon powders were exposed to microwave irradiation at higher pressure. The multiwall carbon nanotube variant of the commercial carbon powder was Elicarb MW PR0940 (Thomas Swan) herein referred to as Sample G2. The multilayer graphene nanoplatelet variant was xGnP Grade C-750 (XG Sciences) herein referred to as Sample G3. The conductive carbon black variant was Vulcan XC72R (Cabot) herein referred to as Sample G4. The flake graphite variant was Microfyne (Asbury Carbons) herein referred to as Sample G5.

Figure 98A:
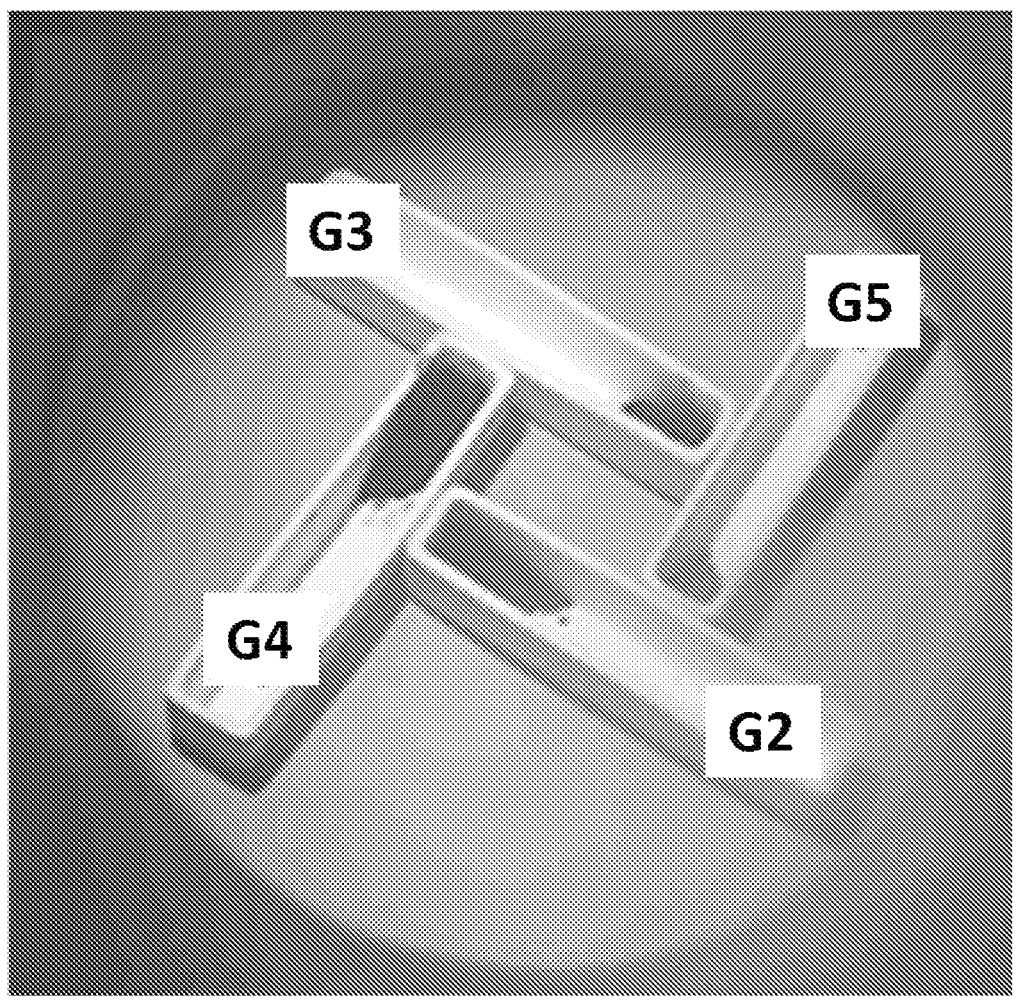
FIG. 98A is a photograph of samples G2-G5 placed in a microwave chamber.

The microwave system utilized was the same as the one utilized in Tests I, II, and III. As before, the experiment was performed at room temperature. Piles of 101 mg, 101 mg, 101 mg and 130 mg of Samples G2, G3, G4 and G5, respectively, were placed in separate ceramic boats. The powder was pushed into a small pile located in the corner of their respective boats as shown and labeled in FIG. 98A. The boats were then placed centrally in the vacuum chamber, which was sealed and vacuumed down to approximately 2 torr, at which point the chamber was refilled to ~750 torr with nitrogen gas. This was repeated two more times to remove any remaining oxygen in the nitrogen atmosphere, and the vessel was brought to a final $N_2$ pressure of ~720 Torr.

Figure 98B:
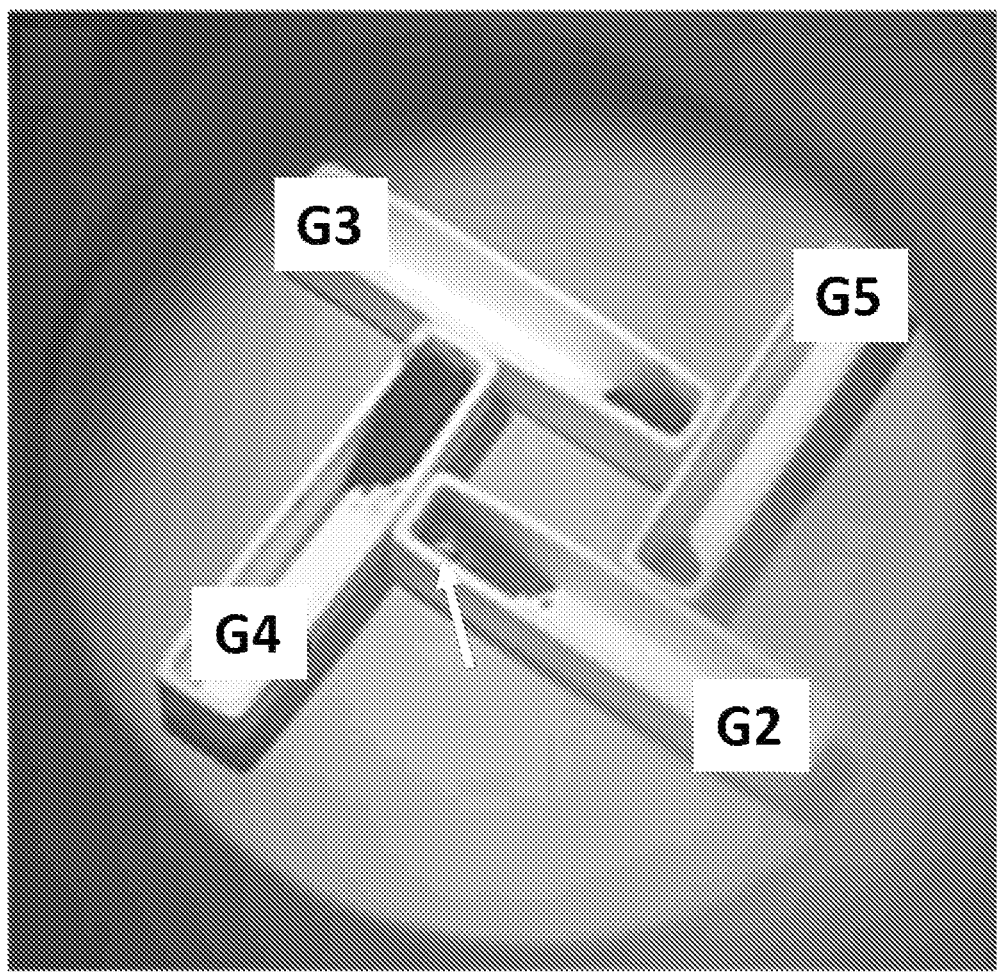
FIG. 98B is a photograph of the samples undergoing resistive heating at a 300 W microwave power setting.
Figure 98C:
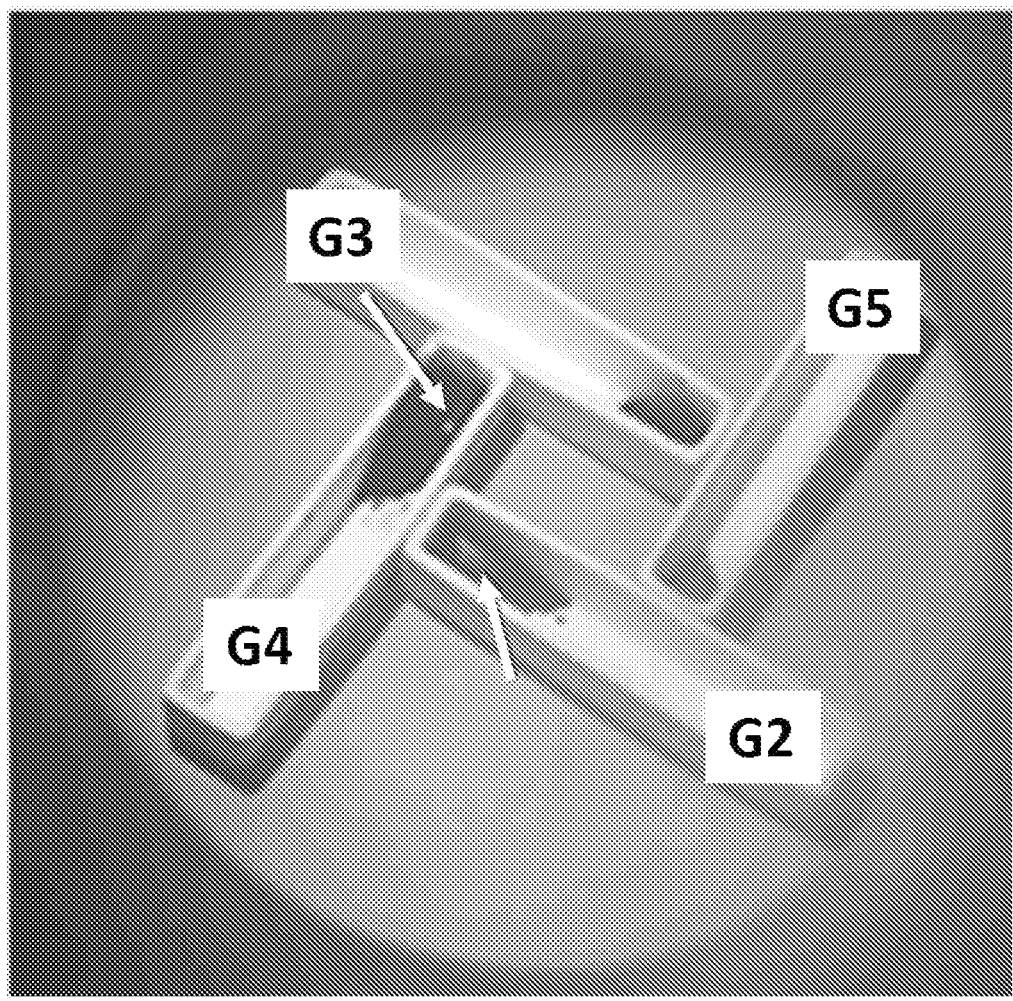
FIG. 98C is a photograph of the samples undergoing resistive heating at 600 W microwave power setting.

The initial power setting was at 300 W. Upon commencing microwave irradiation at this power setting, Sample G2 grew visibly hot, turning a dull orange, as seen in FIG. 98B, where the arrow points to the glowing region. This was accompanied by low-level microplasma formation of the powder. The other three samples G3, G4 and G5 did not grow visibly hot, but remained black, exhibiting no signs of heating. No physical movement of the particles for any sample was observed. The microwave power setting was then increased to 600 W. At this power setting, Samples G2 and G4 both grew visibly hot, turning a dull orange, as seen in FIG. 98C, where the arrows point to the glowing region. Sample G2 retained the low-level sparking phenomenon observed previously. Samples G3 and G5 exhibited no signs of heating.

Figure 98D:
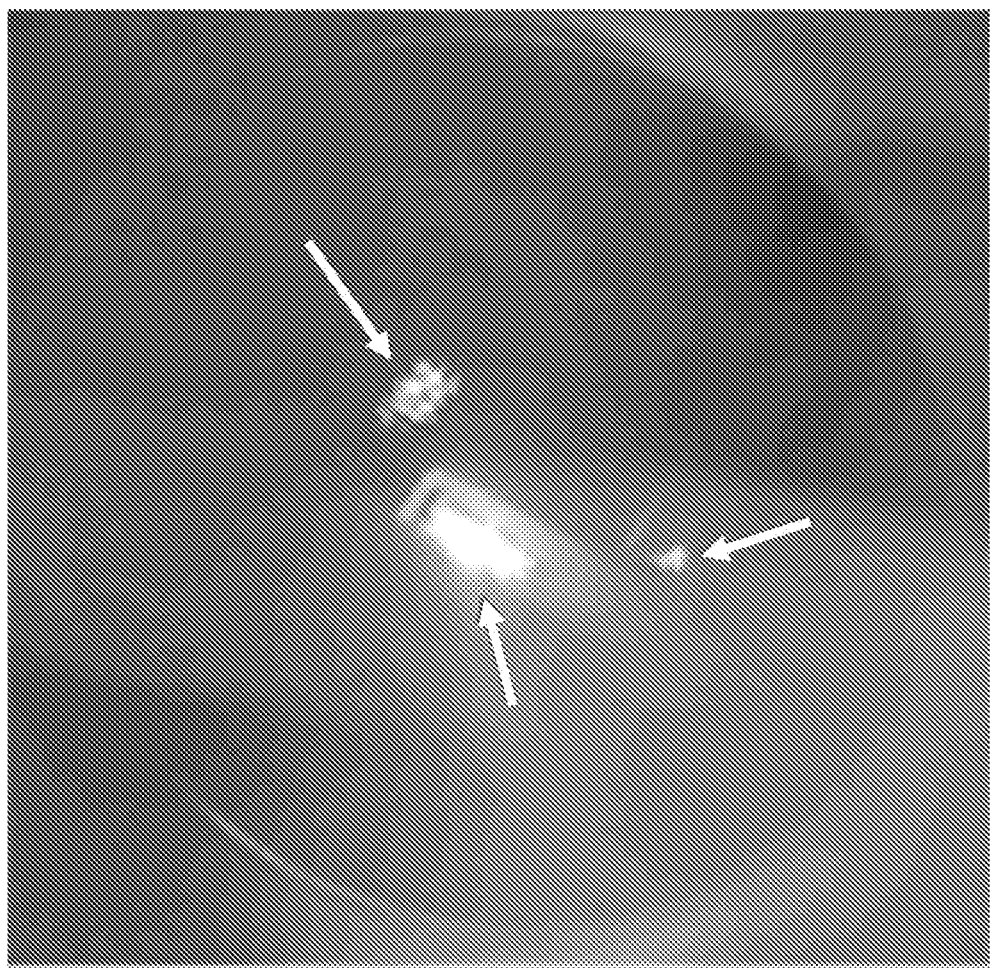
FIG. 98D is a photograph with illumination turned off, of the samples undergoing resistive heating at a 1500 W microwave power setting.

The microwave power setting was finally increased to 1500 W. At this power setting, Sample G2 was the hottest, displaying a bright orange-yellow glow as seen in FIG. 98D, as well as low-level sparking. Samples G4 and G5 both grew visibly hot, turning a dull orange as seen in FIG. 98D, where arrows point to the glowing regions. Sample G3 exhibited no signs of heating. External illumination was turned off for the image seen in FIG. 98D to have better visibility of the heated samples.

Figure 99A:
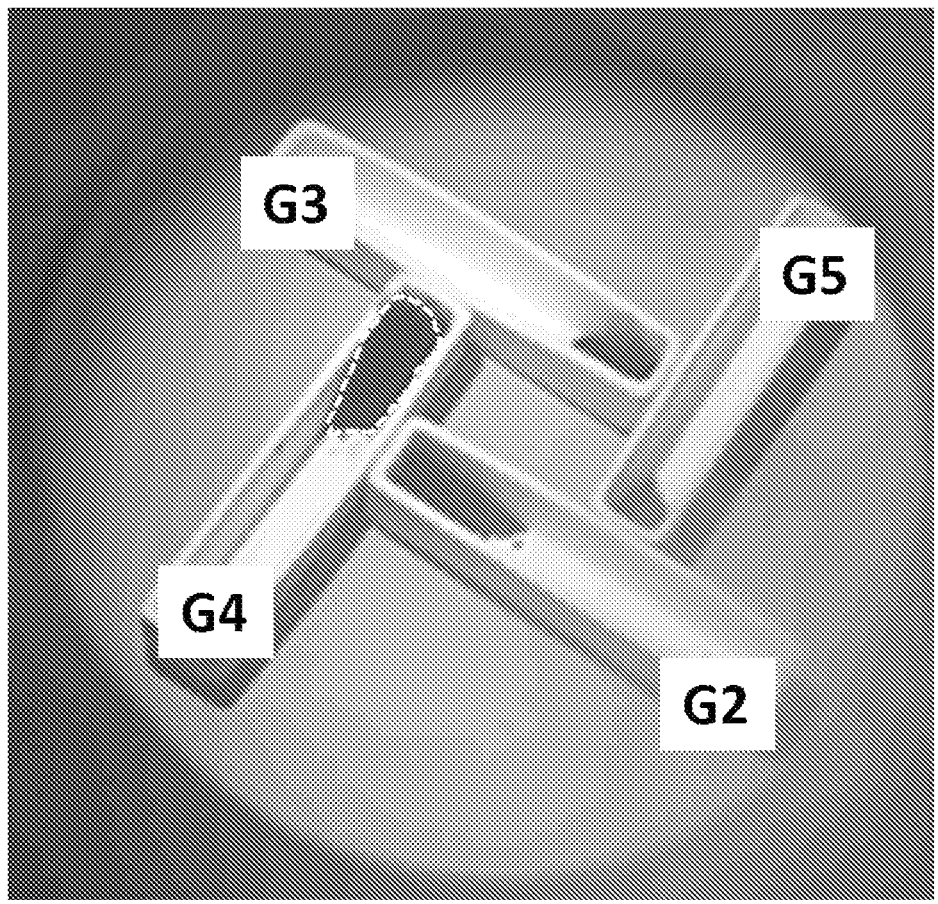
FIG. 99A is a photograph of samples G2-G5 placed in a microwave chamber. The outline of Sample G5 is the ceramic boat is highlighted.

In Test V, the response of Samples G2 through G5 to microwave irradiation under reduced gas pressure were investigated. The sample arrangement was unchanged—the chamber was simply pumped down to 32 torr. In Test V, Samples G2 through G5 powders were irradiated again but at 32 torr. The traced outline in FIG. 99A indicates the original shape of the pile for Sample G4. The vacuum chamber was vacuumed down to 32 torr.

Figure 99B:
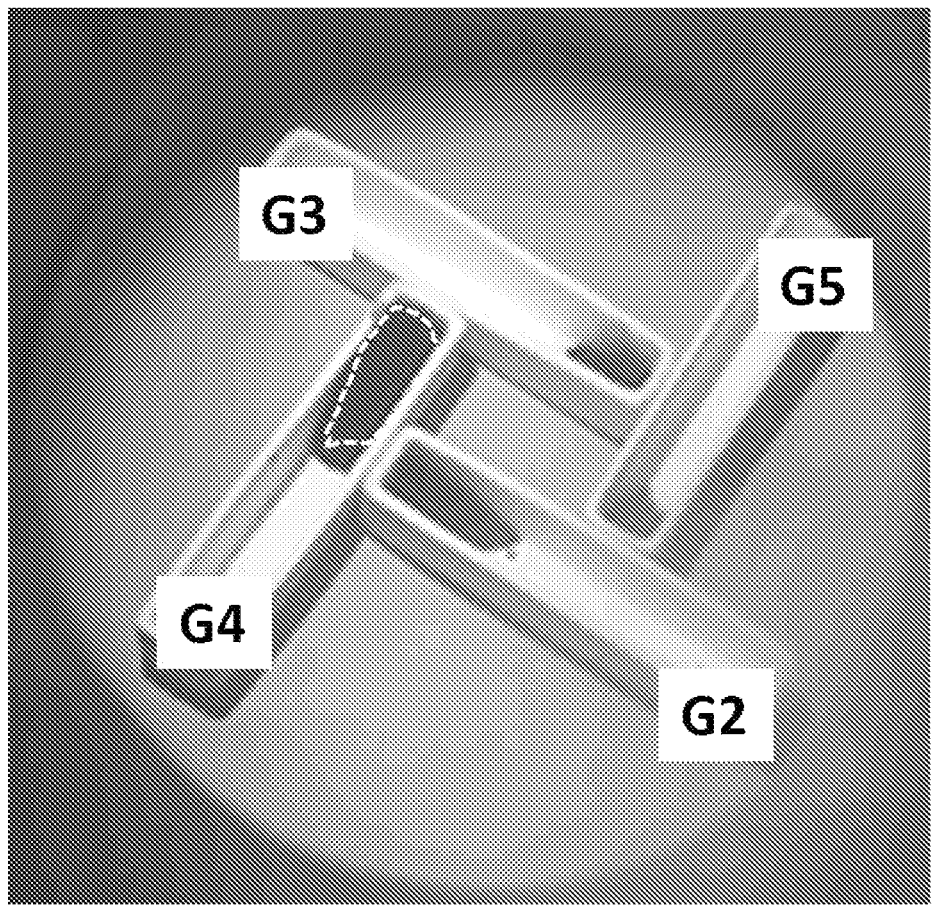
FIG. 99B is a photograph of the samples after microwave irradiation at reduced pressure. Sample G4 has undergone the Meissner Effect, resulting in an expansion of the powder beyond its initial position.

Microwave irradiation was commenced at a 300 W power setting. Immediately (within 1 second of commencement), Sample G4 migrated clearly, visible in the camera as a change in the outline of the pile. Minor migration also occurred in Sample G5, although it was barely distinguishable. After a couple of seconds of migration, the magnetron was switched off and all migration stopped. The samples after this initial irradiation are shown in FIG. 99B. Compared to the original shape of the Sample G4 pile, as indicated by the traced outline, the pile has extended along the length of the boat. None of the samples showed signs of heating.

Test V showed that a strong, pressure-dependent diamagnetic response was also observed in carbon black (Sample G4). This pyrolytic carbon also exhibits large <002> interlayer spacing, with an XRD report in the literature reporting the <002> peak position at $2\theta=25°$, equivalent to an interlayer d-spacing value of 3.56 Å. We suspect that the same dislocation structures that force AA stacking faults in $sp^x$ networks are adequately present in carbon black to force electronic decoupling, and that this electronic decoupling is again improved by reducing out-of-plane acoustic phonon perturbations.

Figure 100A:
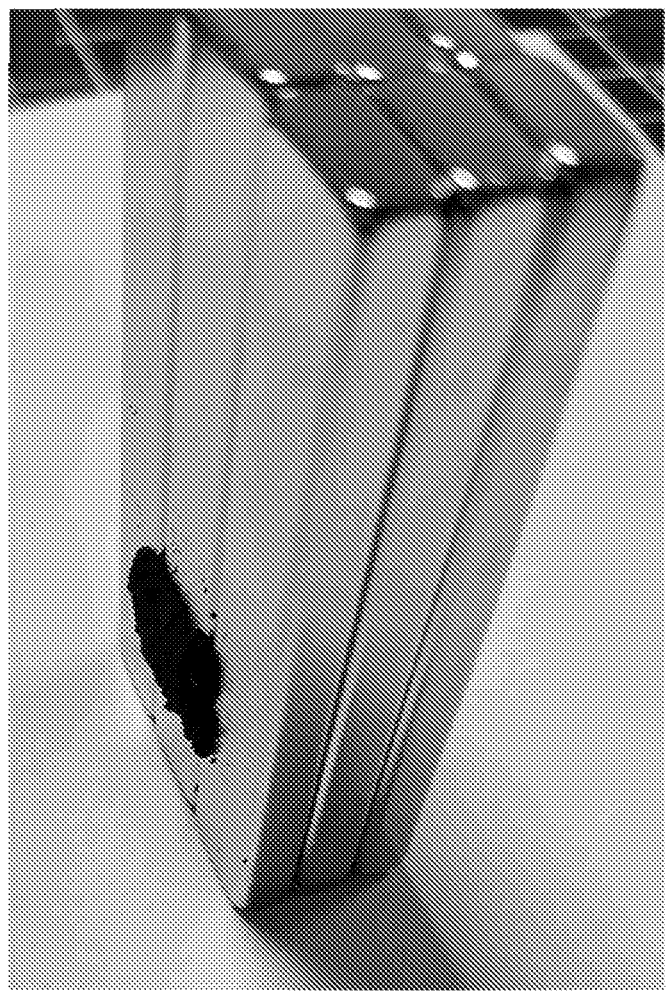
FIG. 100A is a photograph of a disordered carbon sample exhibiting flux pinning in the presence of neodymium magnets. The carbon powder is adhered to the side of the vertical magnets.
Figure 100B:
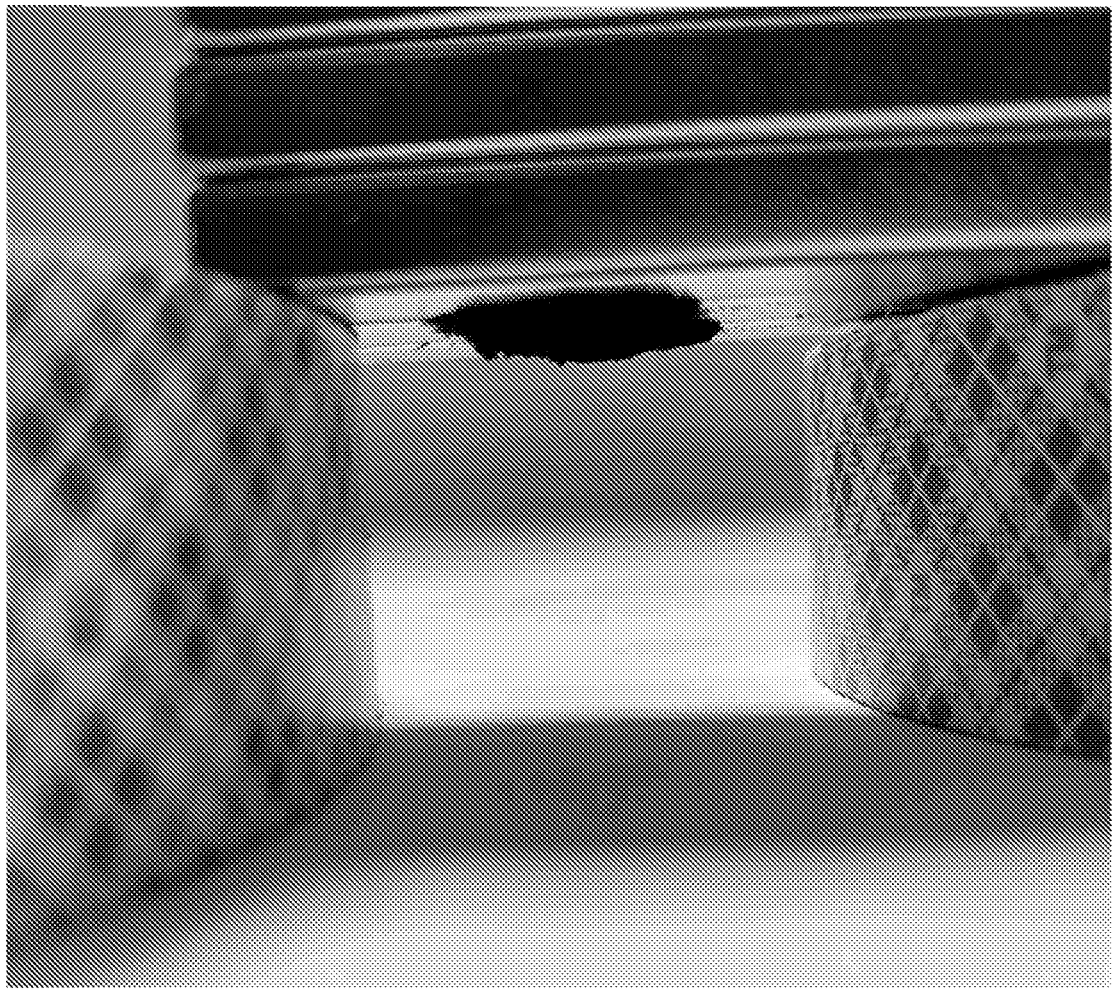
FIG. 100B is a photograph of the neodymium magnets turned on their side. The carbon powder is adhered to the bottom of the horizontal magnets.

In Test VI, the response of $sp^x$ networks to a strong neodymium magnet under low pressure conditions were investigated to demonstrate flux pinning A mound of powder of Sample G1 was placed on top of a "magnetic base" made from 9 neodymium bar magnets (N52 Grade with dimensions of each bar 60 mm×10 mm×5 mm). The 9 bars were arranged in a 3×3 formation to create the magnetic base. This magnetic base along with the sample was located centrally on the platform within the vacuum chamber of the microwave system. Microwave irradiation was not used in Test VI; the chamber was only used to achieve low pressure. The vacuum chamber was vacuumed down to 10 torr. After maintaining 10 torr with the sample on the magnetic base for 2 minutes the chamber was backfilled with air to gradually bring it up to atmospheric pressure. Once at atmospheric pressure, the chamber was opened, and the sample and magnetic base were taken out. On inclining the magnetic base to allow the sample to be collected it was observed the sample did not move. The magnetic base and powder were oriented vertically as shown in FIG. 100A and the sample remained in place. Then, the magnetic base and powder were oriented as shown in FIG. 100B with the sample completely unsupported and the sample continued to remain flux-pinned to the magnetic base. Even at approximately 1 atm and a temperature of approximately 300 K, flux pinning is observed. This indicates penetration of the magnetic field and Type II superconductivity under ambient conditions of temperature and pressure.

Figure 101A:
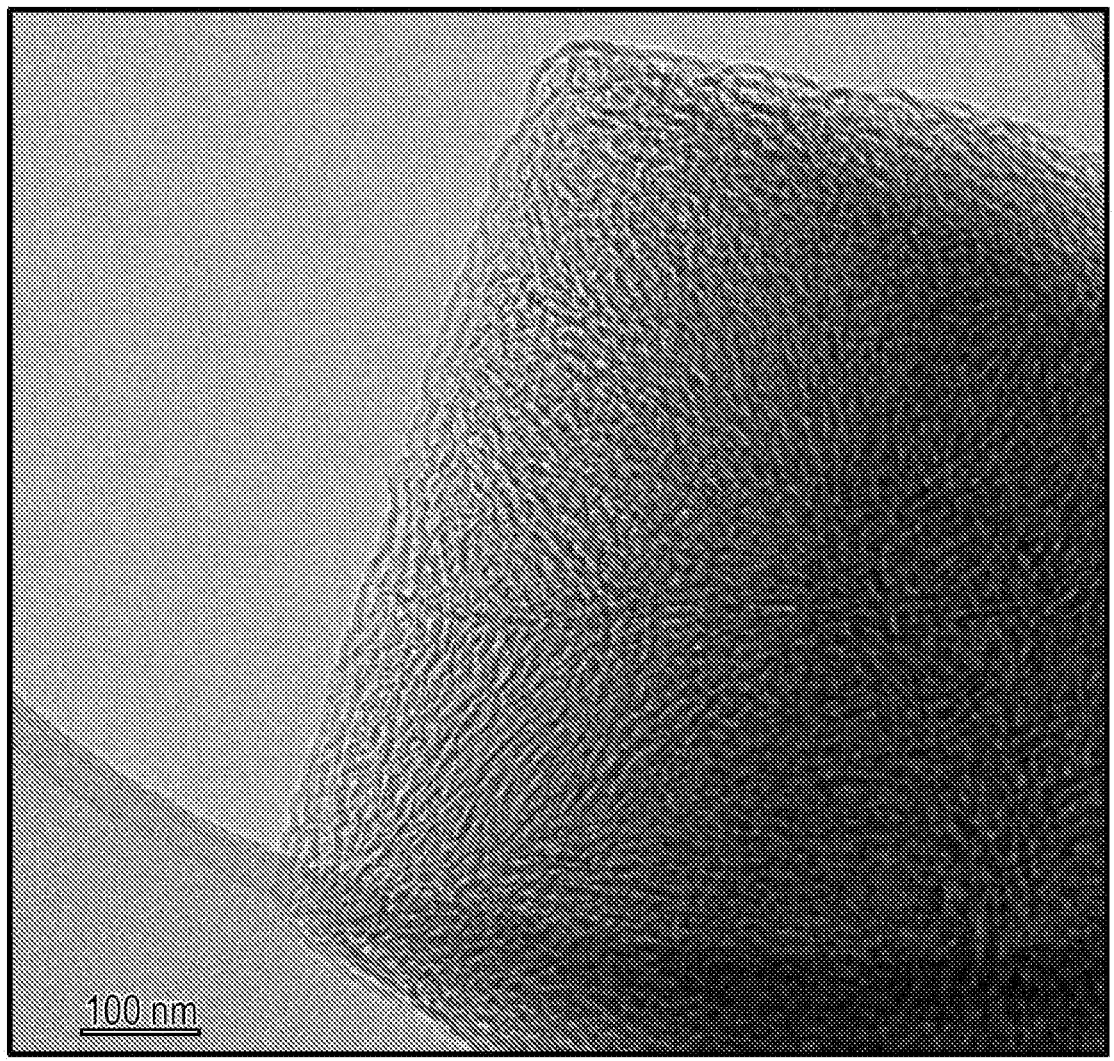
FIG. 101A is a TEM micrograph showing a typical perimorphic framework in Sample G1.
Figure 101B:
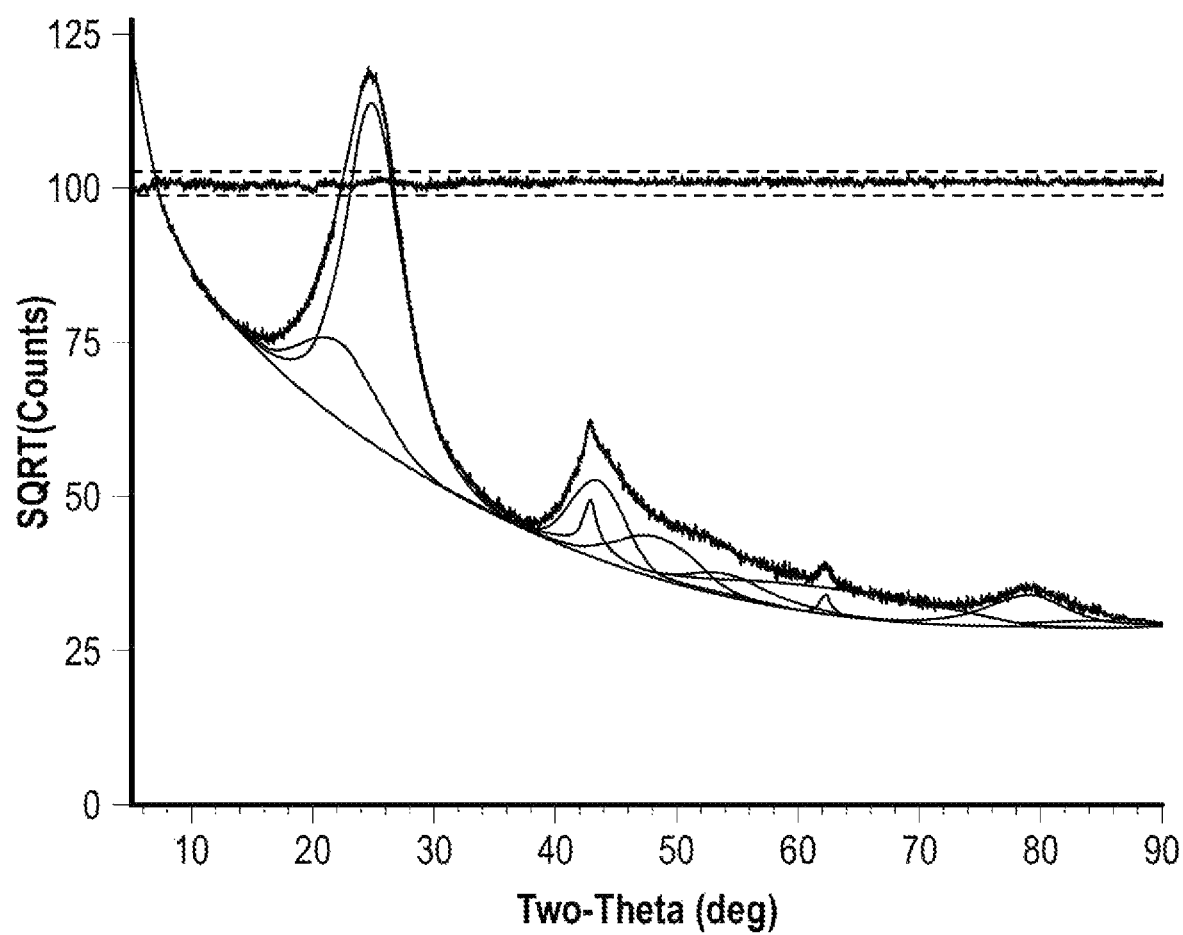
FIG. 101B is the XRD profile of Sample G1.

A TEM micrograph demonstrating a typical perimorphic framework from Sample G1 is shown in FIG. 101A. The multilayer walls were rigid, and the native mesoporous architecture was retained throughout processing. The XRD profile of Sample G1 is shown in FIG. 101B. Table 12 below contains the XRD peak angles, d-spacings, areas, area percentages (normalized to the area of the dominant peak at 2θ=24.829), and full-width half max values (without correction for instrument broadening):

TABLE 12

| Angle (°) | d(Å) | Height | Area (α1) | Area (α1)% | FWHM (°) |
|---|---|---|---|---|---|
| 21.893 | 4.0564 | 1156.9 | 8881.5 | 23.8 | 7.099 |
| 24.829 | 3.5831 | 6361.6 | 37281.2 | 100 | 4.84 |
| 42.745 | 2.1137 | 588.5 | 2280.1 | 6.1 | 1.309 |
| 43.364 | 2.085 | 799.3 | 4237 | 11.4 | 4.96 |
| 48.239 | 1.885 | 373.6 | 3065.9 | 8.2 | 7.679 |
| 53.927 | 1.6989 | 180.5 | 1686.9 | 4.5 | 7.721 |
| 61.288 | 1.5113 | 194.5 | 4096.7 | 11 | 19.621 |
| 62.16 | 1.4921 | 141.9 | 198.1 | 0.5 | 0.995 |

Like the other anthracitic networks we have described, Sample G1 exhibits nematically aligned layers. The main peak at 2θ=24.829° corresponds to a <002> interlayer d-spacing value of 3.58 Å. Additionally, we see a fitted peak at 2θ=21.893°, corresponding an expanded interlayer spacing of 4.06 Å. This is likely a result of slight bowing, given the indications of intralayer compression in the <100> peak position at 2θ=43.364°.

Figure 101C:
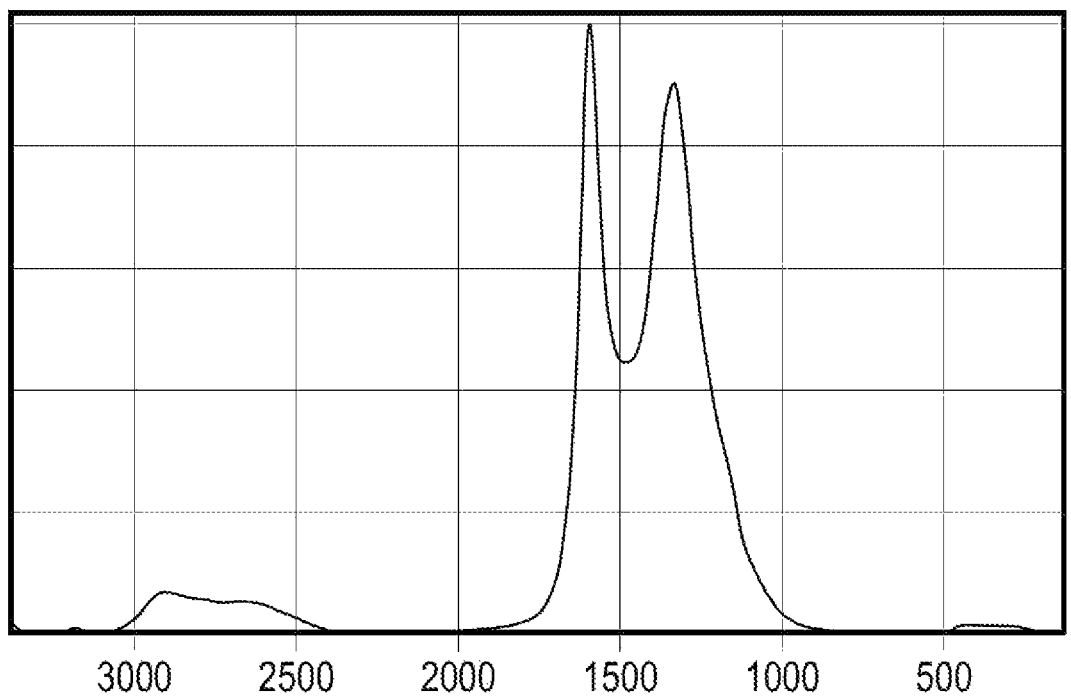
FIG. 101C is the Raman spectrum of Sample G1.

Intralayer compressive strain was also in the Sample G1's red-shifted $G_u$ peak position of 1594 cm$^{-1}$. Its average $D_u$ peak position was 1333 cm$^{-1}$, with point spectra exhibiting $D_u$ peaks as low as 1327 cm$^{-1}$, indicative of a highly grafted x-sp$^x$ network with predominately cubic diamondlike seams, from which we can conclude AA stacking. The average Raman spectrum is shown in FIG. 101C.

Hence, in Study G, we demonstrate ambient superconducting powders comprising pyrolytic carbons with electronically decoupled layers, and we demonstrate that the superconducting state at the atomic monolayer limit is disrupted under ambient conditions by gas-surface collisions. We theorize that the out-of-plane acoustic phonons created by these collisions disrupt the electronic decoupling of the atomic monolayers in these pyrolytic carbons, whereas this decoupling is otherwise obtained by AA stacking faults forced by the diamondlike crosslinks. The same crosslinks pin the layers together and enforce these high-energy stacking faults, which persist where otherwise they might be minimized upon relaxation of the bilayers.

In Study G, an ambient superconducting powder exhibits both diamagnetic and flux-pinning responses to magnetic fields, indicating a Type II superconductivity. Testing at different pressures ranging from 720 to 10 torr indicate a continuum of strengthened superconductivity as gas-surface collisions are reduced and superconducting pathways are lengthened. The persistence of flux-pinning responses upon returning the powders to ambient pressure indicates that the process of evacuation has modified the particles. In Study H, we observe a similar phenomenon, which is temporary and appears related to the persistence of an internally evacuated state in some nearly impermeable regions of the porous particles for some minutes after evacuation. Reduced permeability in some regions inside the particles and granules is to be expected especially in those samples in which template-directed CVD was utilized, the endomorphic templates were extracted, and carbon-catalyzed CVD growth was then performed again on the porous perimorphic frameworks. We expect that this would begin to close many of the framework's internal pores.

XV. Study H—Analysis

Figure 102:
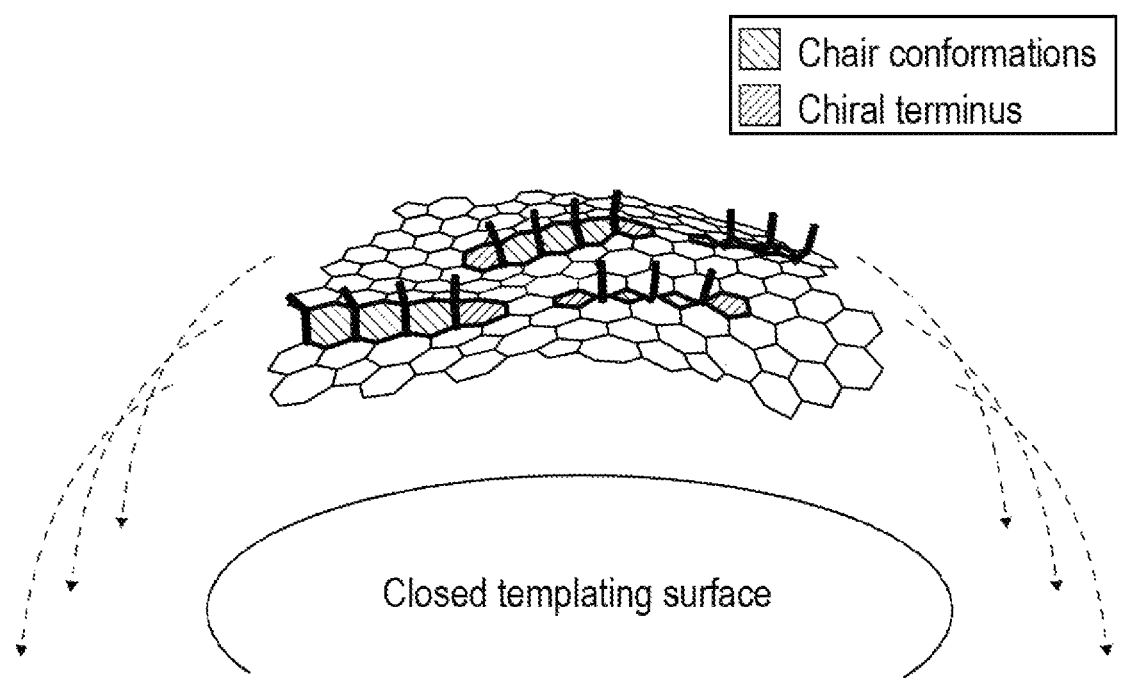
FIG. 102 is a model illustrating an $sp^x$ layer within an $sp^x$ network that has been grown to completion around an underlying templating surface. This can be thought of as a lateral cross-section of an $sp^x$ network.

Study H was performed to demonstrate that practical, macroscopic ambient superconductors could be made. Guiding Study H was our hypothesis that the size of superconducting grains in pyrolytic carbons was correlated with the size of their sp$^2$ ring-connected regions. In Study G, the sp$^2$ ring-connected graphenic regions of the microscopic particles in Sample G1 were likely on the same size scale as the particles themselves. In other words, the templating surface of a microscopic template being a closed surface, the sp$^x$ network formed around that templating surface should comprise a ring-connected network with sp$^x$ layers that would be similarly closed and sp$^2$ ring-connected with respect to themselves. FIG. 102 is a model of the lateral cross-section of a hypothetical sp$^x$ network. We have hatched the sp$^x$ rings as indicated in FIG. 102 while leaving the sp$^2$ rings white. As shown in this model, if growth of an sp$^x$ layer around the templating surface is completed, the layer will be laterally crosslinked around the whole templating surface and will itself represent a closed surface.

Figure 103A:
FIG. 103A is a drawing of the pelletized MgO template utilized in Study H.
Figure 103B:
FIG. 103B is a photograph of the porous perimorphic composite formed on the MgO pellet.

In Study H, our objective was to generate a macroform approximating a single ring-connected sp$^x$ network, with each completed sp$^x$ layer of this network exhibiting sp$^2$ ring-connectedness with respect to itself over macroscopic lengths. Complicating this was the possibility of fracturing the macroscopic sp$^x$ network after its creation, which would introduce sp$^2$ edge states in the sp$^x$ layers. Based on concerns that this might happen during template extraction, we did not extract the endomorphic MgO, but simply created the mesoporous perimorphic composite according to Procedure H and then tested it. The endomorphic MgO pellet is shown in FIG. 103A, while the associated perimorphic composite is shown in FIG. 103B.

Figure 104:
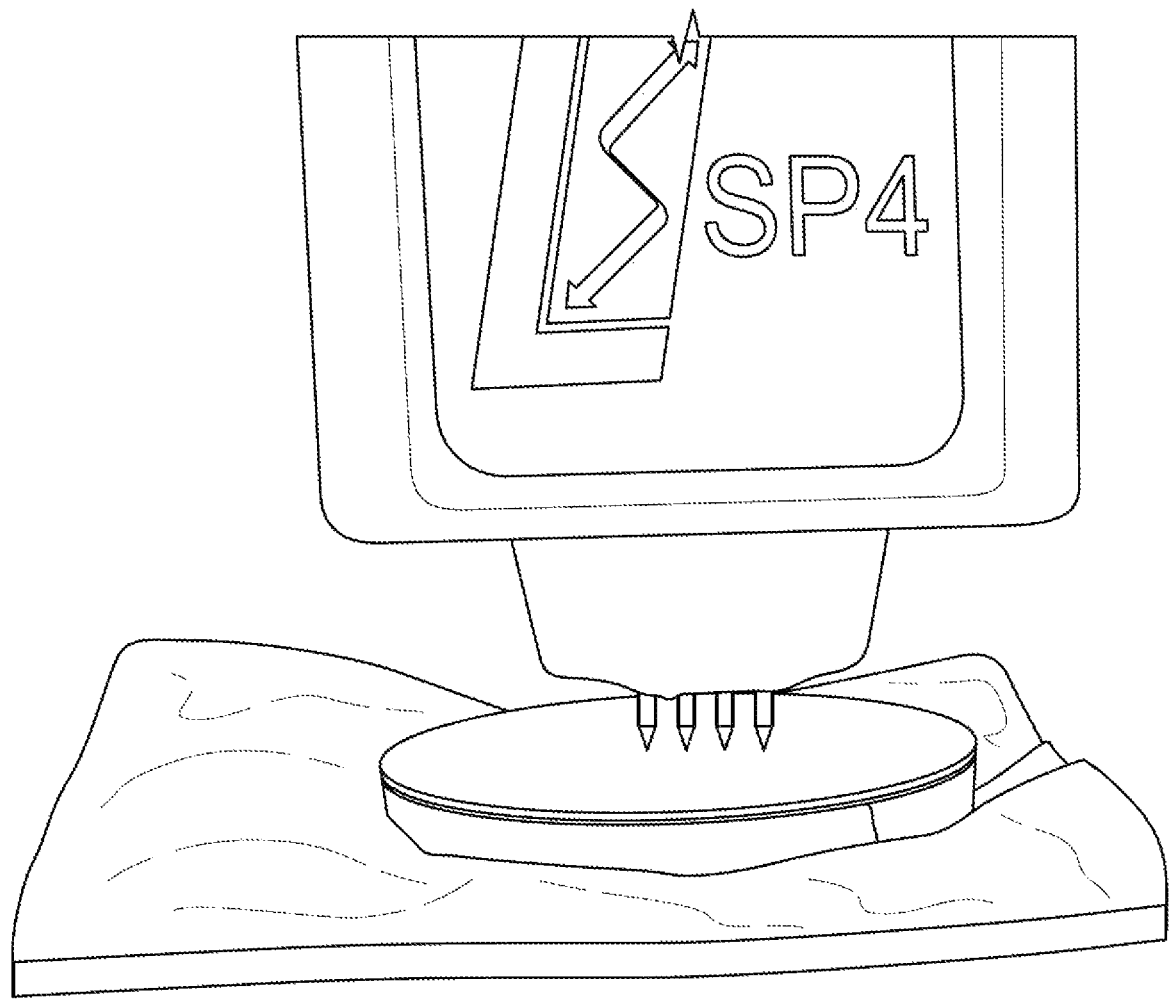
FIG. 104 is a drawing of the contact made between the 4-point probe and the perimorphic composite material in Study H.
Figure 105:
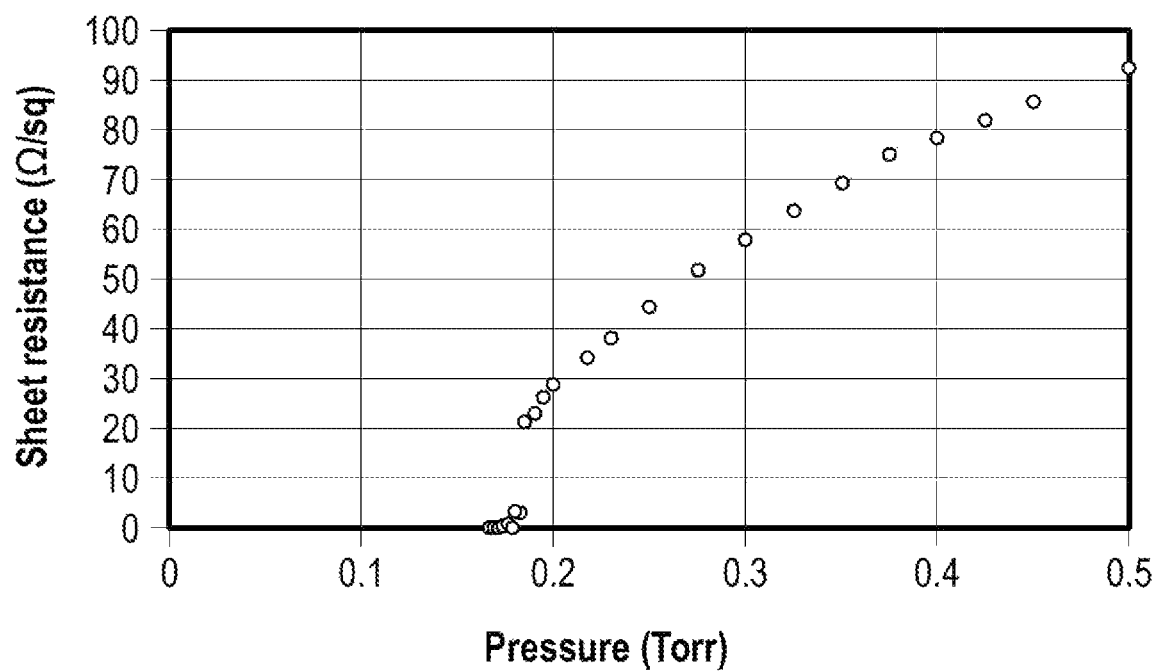
FIG. 105 is a chart of the sample sheet resistance vs. chamber pressure in Study H.

In Test I of Study H, the macroform's initial sheet resistance upon stabilizing the 4-point probe measurement was 157 Ω/sq. The basic setup of the 4-point probe with a sample and a non-conducting pad beneath the sample is illustrated in FIG. 104. The temperature in the laboratory was approximately 17° C. and the relative humidity was 38%. The vacuum chamber was then sealed and evacuated to a final pressure of 167 mTorr, with continuous monitoring of the sample's sheet resistance. It was observed that the sample's sheet resistance fell according to the natural logarithm of the chamber pressure. At several points, instantaneous, large drops in resistance were observed, including a drop from 21 Ω/sq to approximately 3 Ω/sq between 185 and 183 mTorr, followed by another sudden drop from 3 Ω/sq to approximately 0.004 Ω/sq at 178 mTorr. This may indicate the growth and percolation of superconducting grains, or it may have been triggered by the Sourcemeter automatically increasing the current as the measured resistance fell below 20 Ω/sq. The pressure vs. resistivity data and the natural logarithm function fitting the data are shown in FIG. 105. The sheet resistivity stabilized temporarily at 0.004 Ω/sq before rising back to approximately 0.20 Ω/sq and fluctuating between 0.20 Ω/sq and 0.22 Ω/sq. During repressurization of the vacuum chamber to 1 atm, which occurred over a period of several minutes, the sheet resistance remained stable at 0.22 Ω/sq.

Figure 106:
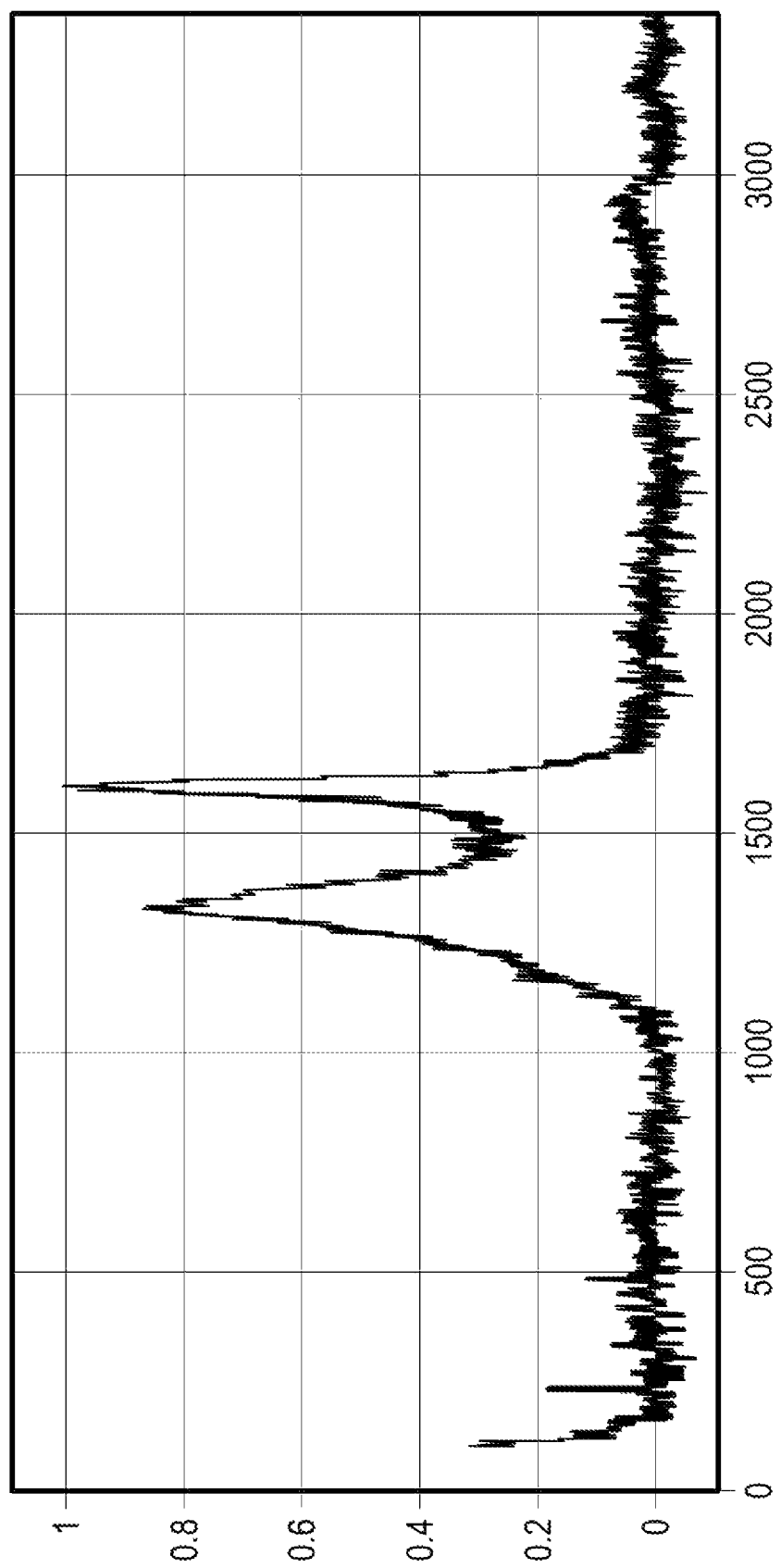
FIG. 106 is the Raman spectrum of the sample used in Study H. The Raman spectrum was unchanged after the tests performed in Study H.

Following this, the door of the chamber was opened, and the 4-point probe was removed from the sample. Upon removal of contact, the multimeter showed an "Overflow" reading. The 4-point probe was then placed back into contact with the sample, and the reading was again 0.22 Ω/sq. Next, the sample was left for 20 to 30 minutes, after which the sheet resistance measured via the 4-point probe had returned to 157 Ω/sq. This indicates a temporal dependence of the sheet resistance. Raman spectral analysis of the sample revealed no changes from prior to the test. The Raman spectrum is shown in FIG. 106. The $D_u$ peak position of 1326 cm$^{-1}$ indicates an x-sp$^x$ network with diamondlike seams crosslinking the layers.

Performing a number of tests like this on different macroforms, we found that the sheet resistance consistently decreased according to the natural logarithm of the pressure. However, we expect that the sheet resistance's dependency was actually on the pump-down time, which was unmeasured. During pump-down of the vacuum chamber, any diffusion constraints on the outgassing of the porous macroform would be expected to create a temporal dependence of the sheet resistance. This temporal dependence was verified other in experiments by pausing the pump-down and observing that sheet resistance continued to fall even with constant or increasing vessel pressure. This is strong evidence that, for a mesoporous pyrolytic carbon or anthracitic network, the room-temperature ability to form a Bose-Einstein condensate is determined by the pressure inside the particles' pores—i.e. the collision frequency of gas molecules with surfaces inside the macroform.

When growing pyrolytic carbons on an MgO template—and especially when growing on a macroscopic template, as we did in Study H—the differential contractions of the perimorphic carbon and endomorphic MgO phases during cooling can lead to mechanical stresses and either nanoscopic or microscopic fracturing of the sp$^x$ network. Indeed, it is likely that fine fractures from cooling of perimorphic composites synthesized at high temperatures may be what facilitates endomorphic extraction for template-directed CVD processes in general. Performing a second deposition procedure appears to mend any fractures originating from the first cooling. Damaged sites in the sp$^x$ network with sp$^2$ edge states become the nuclei for new FRC growth and are healed via sp$^2$ and sp$^3$ re-grafting of these regions, or "mending." Other possible ways to reduce the present of fractures from cooling is to grow a thicker perimorphic phase and to cool the macroscopic perimorphic composite slowly and uniformly.

Utilizing this "mending" technique, other types of pyrolytic carbon particles—most notably carbon black particles, glassy carbons derived from organic precursors, anthracite, coal, activated carbon, or some combination thereof—could similarly be grafted to one another to create sp$^x$ macroforms. These disordered seeds act as nuclei for FRC growth, which leads to the ring-disordered lattice formation, tectonic encounters and associated grafting structures that have been demonstrated throughout the present disclosure. This mending technique should eliminate sp$^2$ edge states and ring-connect the individual pyrolytic carbon particles or networks, causing them to coalesce. Mending these particles or networks at reduced pressure with no inert carrier gases may minimize any trapped gas left behind in sealed-off pores.

Figure 107:
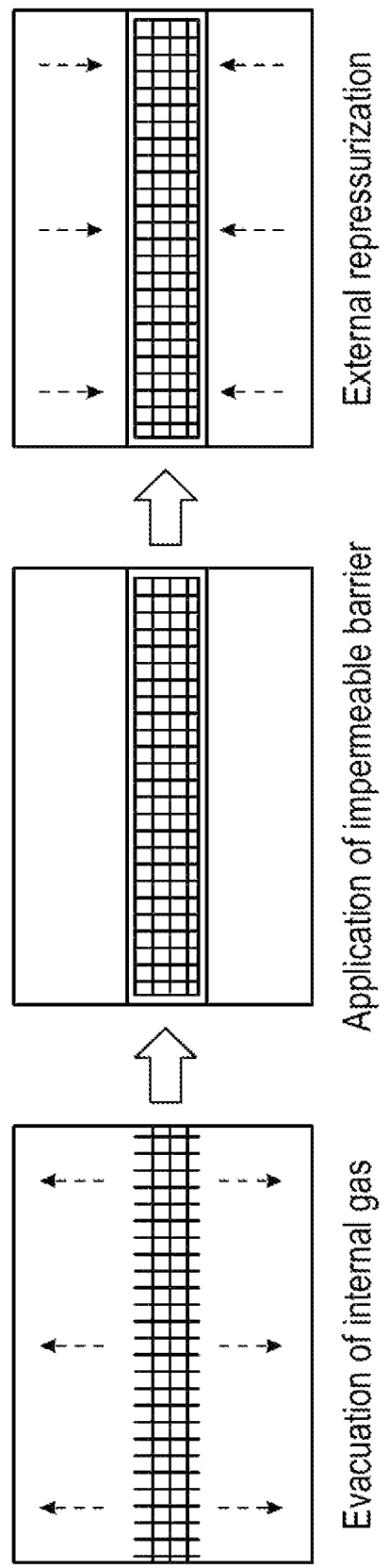
FIG. 107 is a schematic representing an approach to forming an ambient superconducting article, such as a filament, by evacuating internal gas, applying an impermeable barrier phase, and then returning the article to ambient external pressure.

Having established the importance of evacuating any internal gases, and the ability of an internally evacuated sample to form a Bose-Einstein condensate at ambient temperature and pressure, a barrier phase may be applied to the outside of the evacuated macroform in order to prevent reentry of gas molecules. Utilizing an approach like this, ambient superconducting articles of arbitrary macroscopic length, such as filaments, may be fabricated. FIG. 107 demonstrates the basic approach to producing such an article, which can be divided into three stages. First, a porous article (FIG. 107 represents a filament-type article) is generated via a pyrolysis procedure. Next, any gas present within the porous article is outgassed. Lastly, while still in the evacuated state, the article can be sealed via application of an impermeable barrier phase. The barrier phase may be applied via deposition, spray-coating, or some other conventional method. The evacuated and sealed article can then be utilized at ambient external pressure and temperature. This capability is demonstrated in Study H by the persistent superconducting state of the temporarily evacuated article even after opening the vacuum chamber.

Figure 108:
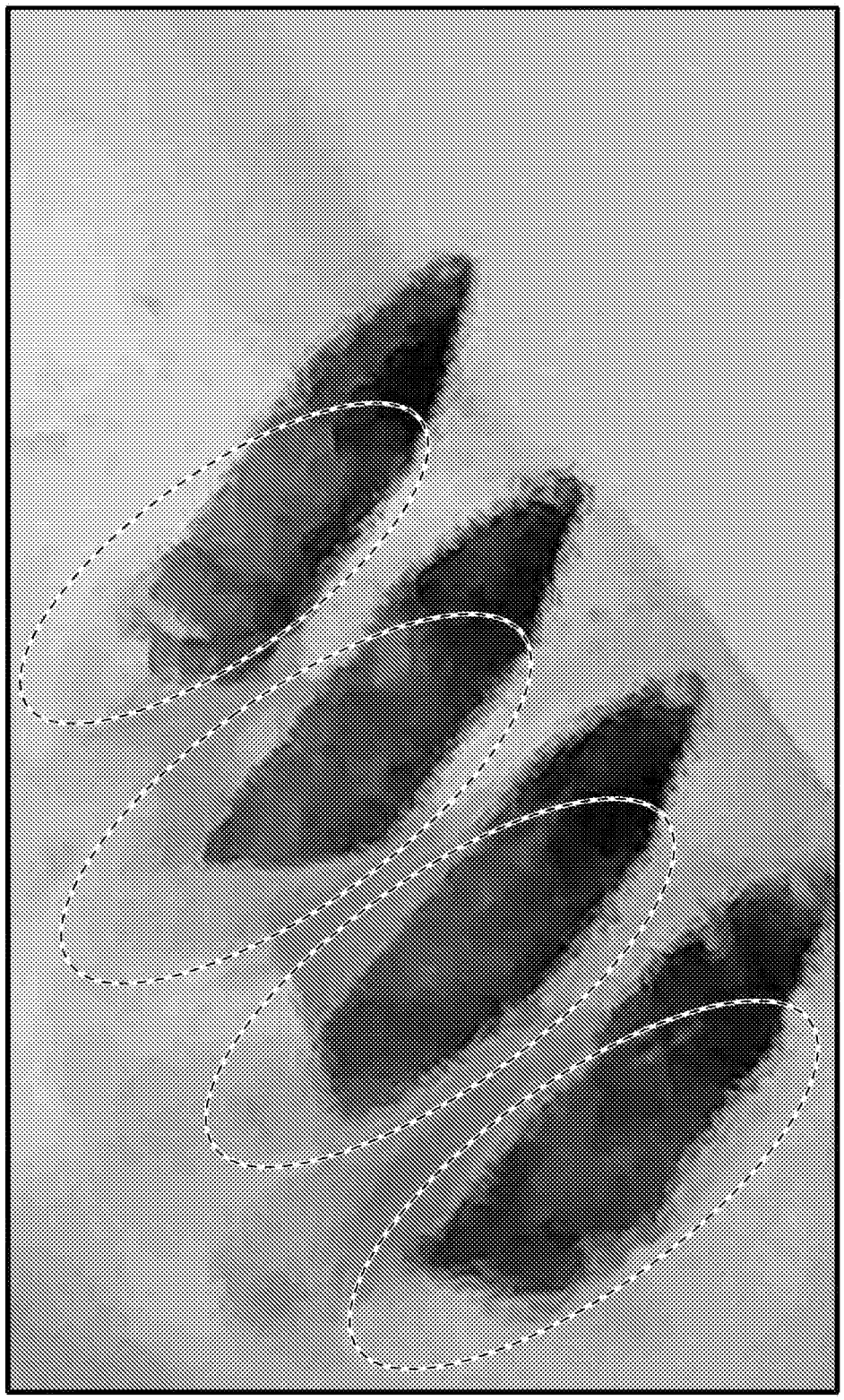
FIG. 108 is a photograph of the probe tip showing the melted areas of the plastic housing where probe tip heating occurred. The melted areas are circled.

Study H corroborated the observations in Study G, wherein particle-scale, ambient superconductivity was achieved. However, in Study H we were able to measure directly the decline in resistance with reducing pressure, directly corroborating the Meissner Effect and flux-pinning observed in the pyrolytic carbons of Study G. Moreover, Study H showed that at room temperature, it is possible for a porous, ambient superconductor to remain superconducting at ambient temperature and pressure conditions, so long as its pores are evacuated. We strongly suspect that the measured resistance of 0.004 Ω/sq and then subsequently 0.22 Ω/sq may not have actually been attributable to the sample as produced but may have instead been related to massive heating of the probe tips, thereby heating the contact region of the sample above its critical temperature. Other signs of heating caused by the probe tips were observed, including melting of the plastic housing (FIG. 108, with observed melted areas near the probe tips circled in yellow) next to the tips. This heating might have resulted from the increasing current being supplied by the Sourcemeter as the sheet resistance of the sample fell. Joule heating in the probe tips under vacuum appears to have led to extreme heating precisely at the point of resistance measurement.

Further improvements to the material should be readily achieved via techniques known to those skilled in the art. For example, doping the material to increase the charge carrier density should be readily achievable. Using an organic precursor, such as a polymeric binder, to bind the individual graphenic networks to one another, followed by pyrolyzing the binder and "mending" the networks may improve the ring-connectedness of macroforms. Importantly, the fabrication of infinite, sheet-like or filament-like ambient superconducting articles using roll-to-roll techniques should be possible via the basic approach of evacuated and then sealing the articles with a barrier phase, as we have described.

XVII. Other Anthracitic Networks

In the '760 Application we demonstrated the formation of perimorphic frameworks comprising graphenic structures such as hexagonal BN and BC$_x$N. HR-TEM analysis of these networks reveals that they comprise anthracitic networks that are cohered via crosslinking dislocations, including Y-dislocations, screw-dislocations, and mixed dislocations. These materials, which are formed in a way analogous to the FRC growth of carbon, undergo the same mechanics of tectonic encounters and grafting, which in turn lead to the same anthracitic networks.

Figure 109A:
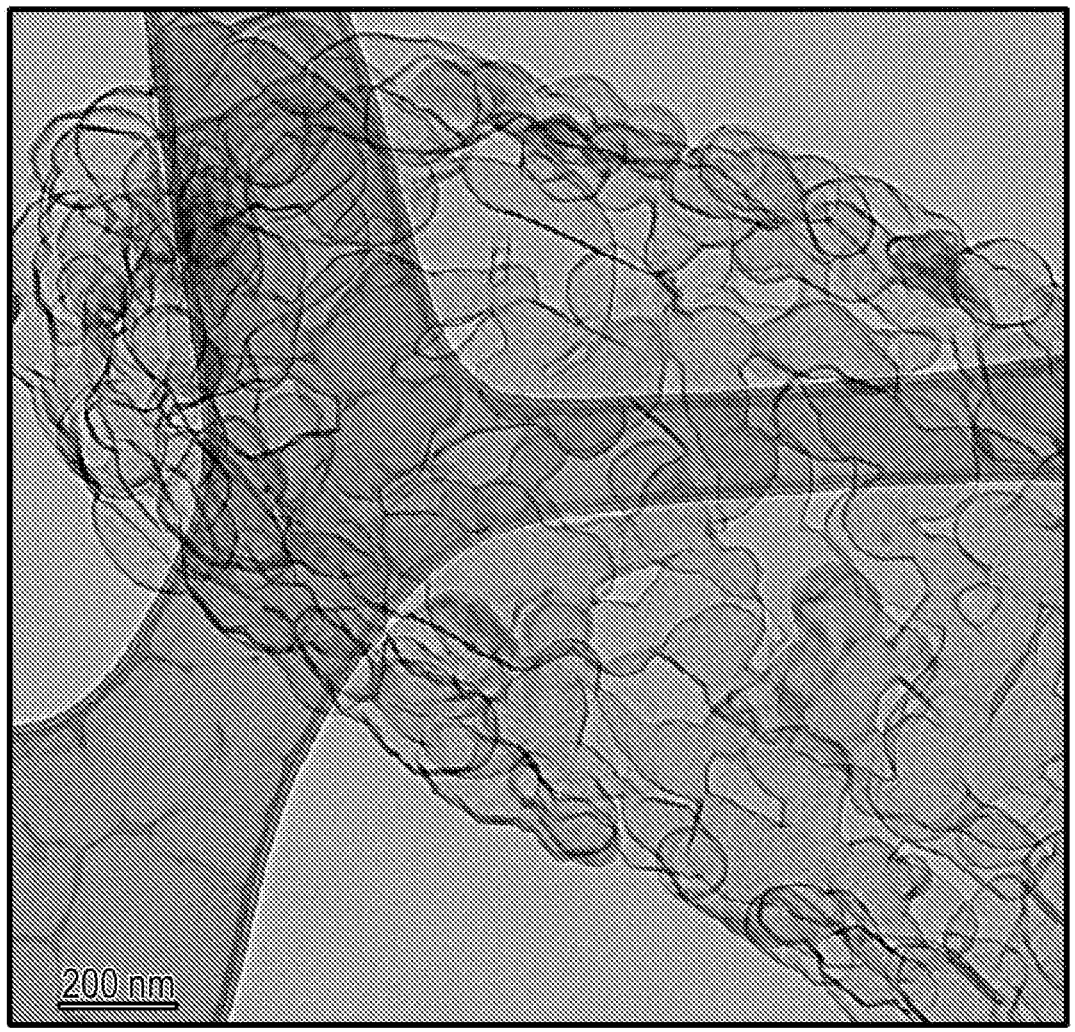
FIG. 109A is a TEM micrograph of a perimorphic framework comprising BN.
Figure 109B:
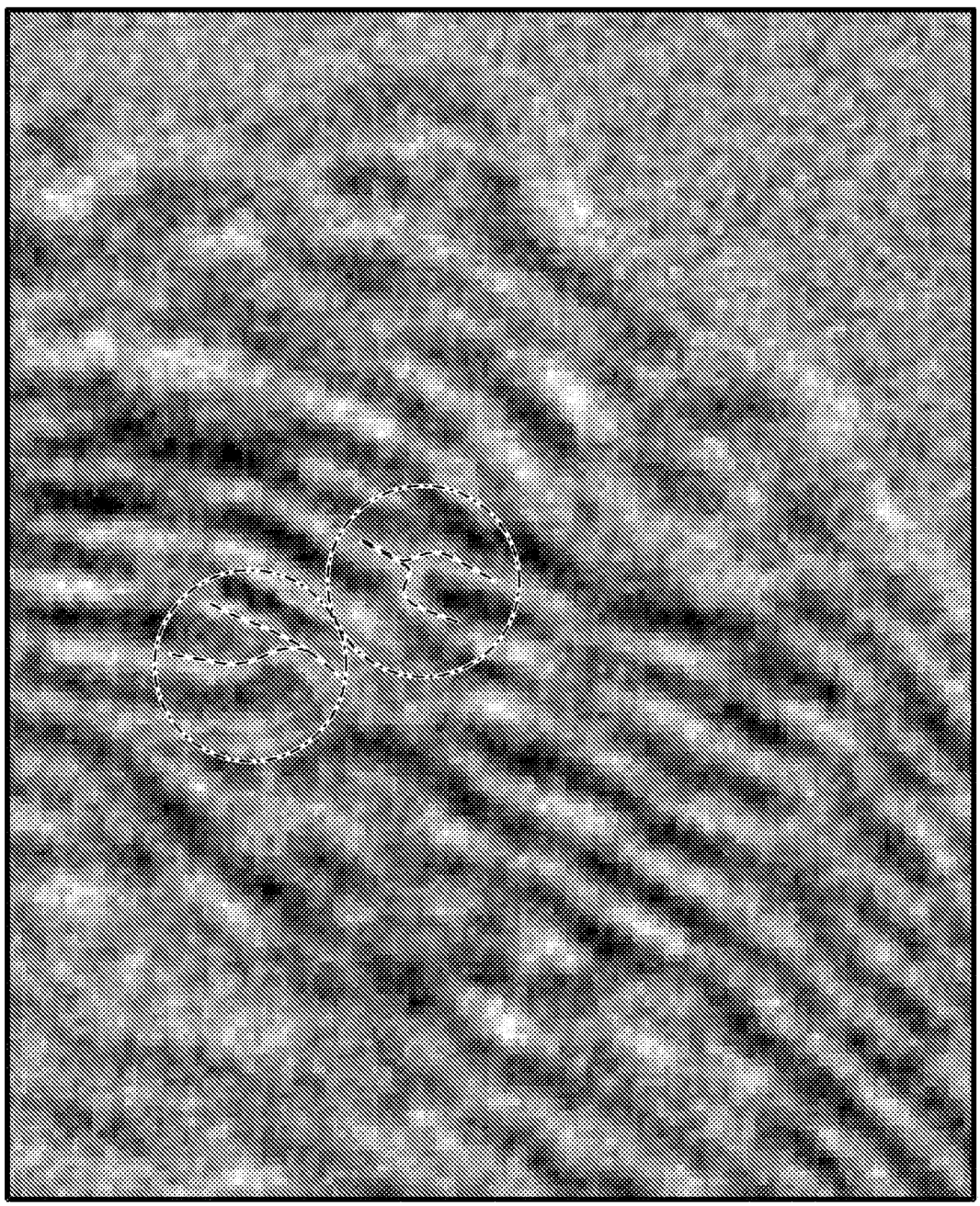
FIG. 109B is a TEM micrograph that shows Y-dislocations (exemplary Y-dislocations are traced and circled) present throughout the perimorphic wall.
Figure 109C:
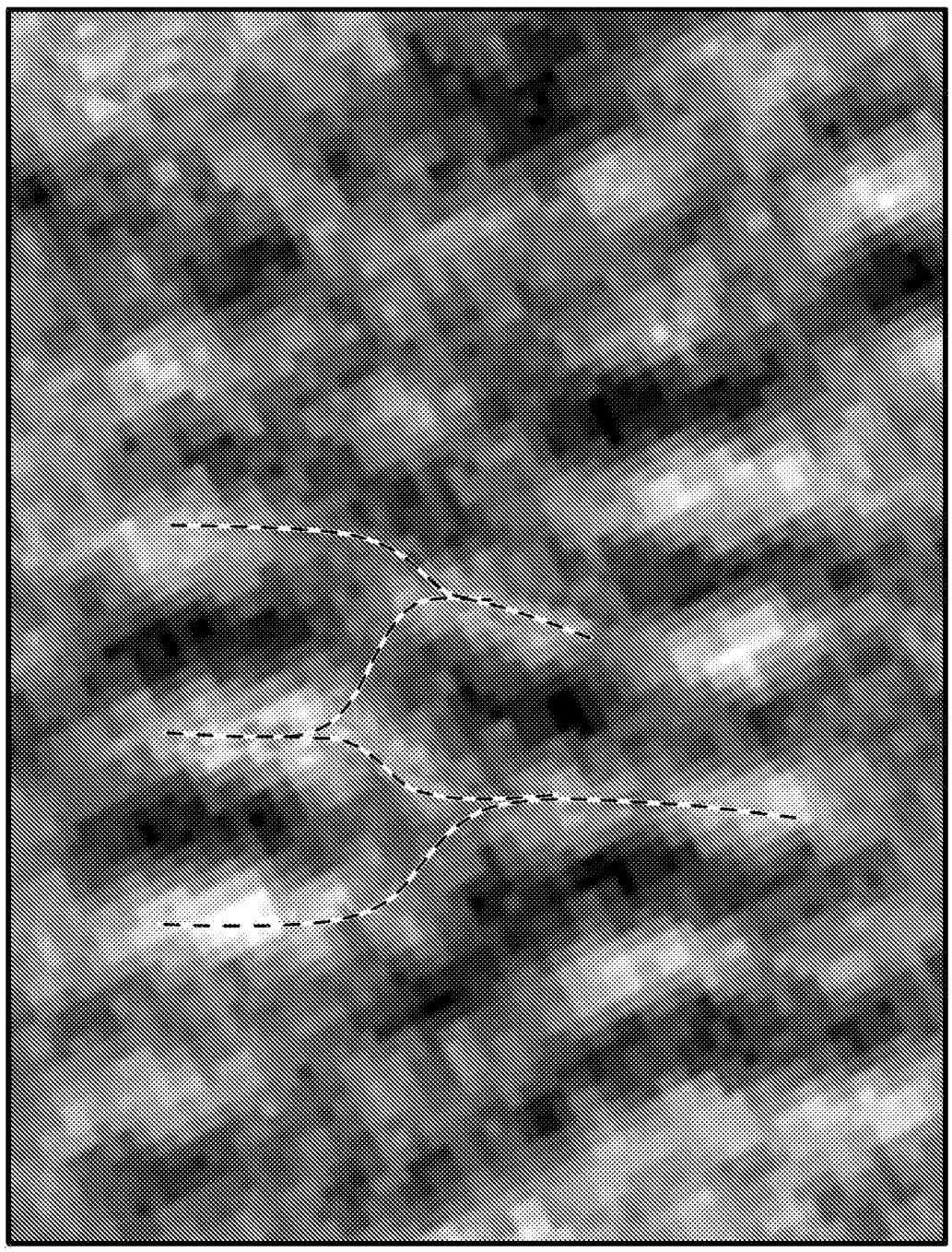
FIG. 109C is a TEM micrograph that shows screw dislocations (traced) also present throughout the perimorphic wall.

FIG. 109A is an HR-TEM image of a perimorphic framework comprising BN, which was produced according to a procedure described in the '760 Application. The close retention of the templated morphology after extraction of the endomorphic MgO template indicates good structural integrity of the perimorphic wall. At closer magnifications, we are able to observe the individual graphenic layers. Y-dislocations are present, as shown in the HR-TEM image in FIG. 109B. The Y-dislocations are circled and traced. In FIG. 109C, we can observe a screw dislocation, which has been traced. The presence of these $sp^x$ Y-dislocations and $sp^2$ screw dislocations indicates that the BN comprises an anthracitic network in an intermediate state of maturation, where screw dislocations have formed from some of the less stable Y-dislocations. The structural similarities between the BN anthracitic network shown here and the carbon anthracitic networks shown elsewhere in the present disclosure demonstrate the generality of the methods and materials described herein.

The invention claimed is:

1. A process for forming perimorphic frameworks, the process comprising:
   I. Forming a perimorphic wall around each template particle in a population of template particles, the forming of the perimorphic wall comprising:
      over a templating surface of a template particle, in the presence of a vapor comprising radicals, at a first temperature of at least 400° C.:
      growing graphenic structures via radical addition at edges of the graphenic structures; and
      at interfaces between the edges of graphenic structures, grafting the edges covalently by forming $sp^2$-$sp^2$ and $sp^3$-$sp^3$ bonds between them, the grafting of the graphenic structures coalescing them into a larger, coalesced graphenic layer generally encapsulating the templating surface and comprising both $sp^2$- and $sp^3$-hybridized states; and
      nucleating higher-layer graphenic regions above the coalesced graphenic layer, the higher-layer graphenic regions nematically aligned with the coalesced graphenic layer and growing via radical addition at their edges, the coalesced graphenic layer and higher-layer graphenic regions covalently connected and together comprising the perimorphic wall, the perimorphic wall rendering the template particle endomorphic and together with it comprising a perimorphic composite particle; and
   II. Heating the perimorphic composite particles to a second temperature, the second temperature higher than the first temperature and at least 800° C., to induce $sp^3$-to-$sp^2$ rehybridization in the perimorphic wall; and
   III. Exposing the perimorphic composite particles to a liquid to remove the endomorphic template particles from the perimorphic walls, the removing of the template particles forming perimorphic frameworks having a BET specific surface of at most 2,300 $m^2g^{-1}$ and an X-ray diffraction pattern with an unfitted peak in the 2θ range of 20° to 28°, each of the perimorphic frameworks having a templated pore-and-wall architecture.

2. The process of claim 1, wherein:
   the graphenic structures, coalesced graphenic layer, higher-layer graphenic regions, and perimorphic wall formed over the templating surface of each template particle comprise carbon; and
   a powder of the perimorphic composite particles before being heated to the second temperature comprises a first 532-nm Raman spectrum having:
      an unfitted D peak between 1300 $cm^{-1}$ and 1332 $cm^{-1}$; and
      an unfitted G peak between 1580 $cm^{-1}$ and 1612 $cm^{-1}$; and
      an interpeak interval between the unfitted D and G peaks of at least 260 $cm^{-1}$; and
      a peak intensity ratio $I_D/I_G$ of at most 1.5; and
      a peak intensity ratio $I_{2D}/I_G$ is at most 0.2; and
   a powder of the perimorphic composite particles after being heated to the second temperature comprises a second 532-nm Raman spectrum having:
      an unfitted D peak between 1340 $cm^{-1}$ and 1375 $cm^{-1}$ and at least 8 $cm^{-1}$ higher than the unfitted D peak of the first 532-nm Raman spectrum; and
      an unfitted G peak between 1580 $cm^{-1}$ and 1612 $cm^{-1}$; and
      an interpeak interval between the unfitted D and G peaks of at most 250 $cm^{-1}$; and
      a peak intensity ratio $I_D/I_G$ of at most 1.5; and
      a peak intensity ratio $I_{2D}/I_G$ is at most 0.2; and
   the first and second 532-nm Raman spectra are each an average spectrum, where each average spectrum is produced by averaging 16 point spectra generated by raster scanning under 532 nm excitation.

3. The process of claim 1, wherein the graphenic structures, coalesced graphenic layer, higher-layer graphenic regions, and perimorphic wall formed over the templating surface of each template particle comprise at least one of boron nitride and boron carbonitride.

4. The process of claim 1, wherein:
   the forming of the perimorphic wall around each template particle comprises chemical vapor deposition; and
   the pore-and-wall architecture of the perimorphic frameworks comprises an endocellular pore structure generally enclosed by the perimorphic wall; and
   the perimorphic wall and endocellular pore structure comprise conjoined cellular subunits, the cellular subunits having an internal diameter of at most 1,000 nm.

5. The process of claim 1, wherein the first temperature is at most 700° C. and the second temperature is at least 1,000° C.

6. The process of claim 1, wherein the first temperature is at most 600° C. and the second temperature is at least 900° C.

7. The process of claim 1, wherein the process further comprises:
   drying the perimorphic frameworks, the drying comprising at least one of:
      a collapsing of cellular subunits of the perimorphic frameworks; and
      an elastic deformation of the perimorphic frameworks; and
      a reversible shrinking of the perimorphic frameworks.

8. The process of claim 1, wherein the coalesced graphenic layer and higher-layer graphenic regions comprise a synthetic anthracitic network covalently connected by structural dislocations comprising at least one Y-dislocations, screw dislocations, and mixed dislocations.

9. The process of claim 1, wherein each of the perimorphic walls, after being heated to the second temperature, comprises a helicoidal network.

10. The process of claim 1, wherein the process further comprises:
    decomposing a powder of template precursor particles to form a powder of template particles, each template particle comprising:

an inorganic compound comprising metal cations and at least one of oxygen anions and oxyanions; and a porous substructure comprising conjoined subunits and pores, the pores comprising at least one of mesopores and macropores.

11. A process for forming perimorphic frameworks, the process comprising:
   I. Forming a perimorphic wall around each template particle in a population of template particles, the forming of the perimorphic wall comprising:
      over a templating surface of a template particle, in the presence of a vapor comprising radicals, at a first temperature of at least 400° C.:
      growing graphenic structures via radical addition at edges of the graphenic structures; and
      at interfaces between the edges of graphenic structures, grafting the edges covalently by forming $sp^2$-$sp^2$ and $sp^3$-$sp^3$ bonds between them, the grafting of the graphenic structures coalescing them into a larger, coalesced graphenic layer generally encapsulating the templating surface and comprising both $sp^2$- and $sp^3$-hybridized states; and
      nucleating higher-layer graphenic regions above the coalesced graphenic layer, the higher-layer graphenic regions nematically aligned with the coalesced graphenic layer and growing via radical addition at their edges, the coalesced graphenic layer and higher-layer graphenic regions covalently connected and together comprising the perimorphic wall, the perimorphic wall rendering the template particle endomorphic and together with it comprising a perimorphic composite particle; and
   II. Exposing the perimorphic composite particles to a liquid to remove the endomorphic template particles from the perimorphic walls, the removing of the template particles forming perimorphic frameworks having a BET specific surface of at most 2,300 $m^2g^{-1}$ and an X-ray diffraction pattern with an unfitted peak in the 2θ range of 20° to 28°, each of the perimorphic frameworks a particle having a templated pore-and-wall architecture; and
   III. Heating the perimorphic frameworks to a second temperature, the second temperature higher than the first temperature and at least 800° C., to induce $sp^3$-to-$sp^2$ rehybridization in the perimorphic wall.

12. The process of claim 11, wherein:
the graphenic structures, coalesced graphenic layer, higher-layer graphenic regions, and perimorphic wall formed over the templating surface of each template particle comprise carbon; and
a powder of the perimorphic composite particles comprises a first 532-nm Raman spectrum having:
   an unfitted D peak between 1300 $cm^{-1}$ and 1332 $cm^{-1}$; and
   an unfitted G peak between 1580 $cm^{-1}$ and 1612 $cm^{-1}$; and
   an interpeak interval between the unfitted D and G peaks of at least 260 $cm^{-1}$; and
   a peak intensity ratio $I_D/I_G$ of at most 1.5; and
   a peak intensity ratio $I_{2D}/I_G$ is at most 0.2; and
the perimorphic frameworks after being heated to the second temperature comprise a second 532-nm Raman spectrum having:
   an unfitted D peak between 1340 $cm^{-1}$ and 1375 $cm^{-1}$ and at least 8 $cm^{-1}$ higher than the unfitted D peak of the first 532-nm Raman spectrum; and
   an unfitted G peak between 1580 $cm^{-1}$ and 1612 $cm^{-1}$; and
   an interpeak interval between the unfitted D and G peaks of at most 250 $cm^{-1}$; and
   a peak intensity ratio $I_D/I_G$ of at most 1.5; and
   a peak intensity ratio $I_{2D}/I_G$ is at most 0.2; and
the first and second 532-nm Raman spectra are each an average spectrum, where each average spectrum is produced by averaging 16 point spectra generated by raster scanning under 532 nm excitation.

13. The process of claim 11, wherein the graphenic structures, coalesced graphenic layer, higher-layer graphenic regions, and perimorphic wall formed over the templating surface of each template particle comprise at least one of boron nitride and boron carbonitride.

14. The process of claim 11, wherein:
the forming of the perimorphic wall around each template particle comprises chemical vapor deposition; and
the pore-and-wall architecture of the perimorphic frameworks comprises an endocellular pore structure generally enclosed by the perimorphic wall; and
the perimorphic wall and endocellular pore structure comprise conjoined cellular subunits, the cellular subunits having an internal diameter of at most 1,000 nm.

15. The process of claim 11, wherein the first temperature is at most 700° C. and the second temperature is at least 1,000° C.

16. The process of claim 11, wherein the first temperature is at most 600° C. and the second temperature is at least 900° C.

17. The process of claim 11, wherein the process further comprises:
drying the perimorphic frameworks, the drying comprising at least one of:
   a collapsing of cellular subunits of the perimorphic frameworks; and
   an elastic deformation of the perimorphic frameworks; and
   a reversible shrinking of the perimorphic frameworks.

18. The process of claim 11, wherein the coalesced graphenic layer and higher-layer graphenic regions comprise a synthetic anthracitic network covalently connected by structural dislocations comprising at least one Y-dislocations, screw dislocations, and mixed dislocations.

19. The process of claim 11, wherein each of the perimorphic walls, after being heated to the second temperature, comprises a helicoidal network.

20. The process of claim 11, wherein the process further comprises:
decomposing a powder of template precursor particles to form a powder of template particles, each template particle comprising:
an inorganic compound comprising metal cations and at least one of oxygen anions and oxyanions; and
a porous substructure comprising conjoined subunits and pores, the pores comprising at least one of mesopores and macropores.

* * * * *